US012679857B2

(12) United States Patent
Moon et al.

(10) Patent No.: US 12,679,857 B2
(45) Date of Patent: Jul. 14, 2026

(54) ORGANIC METAL COMPOUND, ORGANIC LIGHT EMITTING DIODE AND ORGANIC LIGHT EMITTING DEVICE HAVING THE COMPOUND

(71) Applicant: LG DISPLAY CO., LTD., Seoul (KR)

(72) Inventors: Jae-Min Moon, Paju-si (KR); Sung-Jin Park, Paju-si (KR); Hye-Seung Kang, Paju-si (KR); Yoo-Jeong Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1303 days.

(21) Appl. No.: 17/505,865

(22) Filed: Oct. 20, 2021

(65) Prior Publication Data

US 2022/0127288 A1 Apr. 28, 2022

(30) Foreign Application Priority Data

Oct. 23, 2020 (KR) ........................ 10-2020-0138457

(51) Int. Cl.
*C07F 15/00* (2006.01)
*H01L 51/00* (2006.01)
(Continued)

(52) U.S. Cl.
CPC ....... *C07F 15/0033* (2013.01); *H10K 85/342* (2023.02); *H10K 50/11* (2023.02);
(Continued)

(58) Field of Classification Search
None
See application file for complete search history.

(56) References Cited

U.S. PATENT DOCUMENTS

| | | | |
|---|---|---|---|
| 2011/0108818 A1 | 5/2011 | Kaiser et al. |
| 2014/0217376 A1 | 8/2014 | Steudel |
| 2017/0012223 A1 | 1/2017 | Boudreault et al. |

FOREIGN PATENT DOCUMENTS

| | | | |
|---|---|---|---|
| CN | 110698518 A | 1/2020 |
| CN | 110790797 A | 2/2020 |

(Continued)

OTHER PUBLICATIONS

Machine English translation of Wang et al. (CN 110790797 A). Feb. 25, 2026.*

(Continued)

*Primary Examiner* — Jay Yang
(74) *Attorney, Agent, or Firm* — Morgan, Lewis & Bockius LLP

(57) ABSTRACT

The present disclosure relates to an organic metal compound having the following structure of Formula 1, an organic light emitting diode (OLED) and an organic light emitting device that includes the organic metal compound. The OLED and the organic light emitting device including the organic metal compound can improve their luminous efficiency, luminous color purity and lifespan.

[Formula 1]

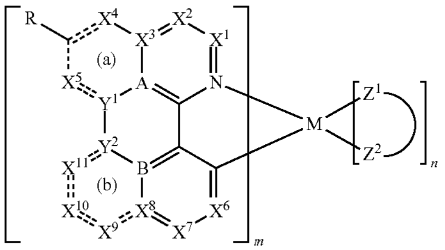

20 Claims, 7 Drawing Sheets

(51) Int. Cl.

| | |
|---|---|
| ***H10K 85/30*** | (2023.01) |
| *H10K 50/11* | (2023.01) |
| *H10K 101/10* | (2023.01) |
| *H10K 101/30* | (2023.01) |
| *H10K 101/40* | (2023.01) |

(52) U.S. Cl.
CPC ..... *H10K 2101/10* (2023.02); *H10K 2101/30* (2023.02); *H10K 2101/40* (2023.02)

(56) References Cited

FOREIGN PATENT DOCUMENTS

| | | | |
|---|---|---|---|
| CN | 114437134 | A | 5/2022 |
| JP | 2007-254540 | A | 10/2007 |
| JP | 2014-519702 | A | 8/2014 |
| KR | 10-2011-0108240 | A | 10/2011 |
| KR | 10-2021-0134517 | A | 11/2021 |
| TW | 202021962 | A | 6/2020 |

OTHER PUBLICATIONS

First Office Action issued in corresponding Korean Patent Application No. 10-2020-0138457, dated Feb. 8, 2021.
Second Office Action issued in corresponding Korean Patent Application No. 10-2020-0138457 dated Jun. 28, 2021.
Extended European Search Report issued in corresponding European Patent Application No. 21204162.8 dated Mar. 24, 2022.
First Office Action dated Mar. 27, 2024 issued in corresponding China National Intellectual Property Administration 202111228407.6.
Office Action issued in corresponding Korean Patent Application No. 10-2022-0004559, dated Jan. 28, 2022.

* cited by examiner

ORGANIC METAL COMPOUND, ORGANIC LIGHT EMITTING DIODE AND ORGANIC LIGHT EMITTING DEVICE HAVING THE COMPOUND

CROSS-REFERENCE TO RELATED APPLICATIONS

This application claims the priority benefit under 35 U.S.C. § 119(a) of Korean Patent Application No. 10-2020-0138457, filed in the Republic of Korea on Oct. 23, 2020, which is expressly incorporated hereby in its entirety into the present application.

BACKGROUND

Technical Field

The present disclosure relates to an organic metal compound, and more specifically, to an organic metal compound having excellent luminous efficiency and luminous lifespan, an organic light emitting diode and an organic light emitting device including the organic metal compound.

Discussion of the Related Art

An organic light emitting diode (OLED) among a flat display device used widely has come into the spotlight as a display device replacing rapidly a liquid crystal display device (LCD). The OLED can be formed as a thin organic film less than 2000 Å and can implement unidirectional or bidirectional images by electrode configurations. Also, the OLED can be formed even on a flexible transparent substrate such as a plastic substrate so that a flexible or a foldable display device can be realized with ease using the OLED. In addition, the OLED can be driven at a lower voltage and the OLED has excellent high color purity compared to the LCD.

Since fluorescent material uses only singlet exciton energy in the luminous process, the related art fluorescent material shows low luminous efficiency. On the contrary, phosphorescent material can show high luminous efficiency since it uses triplet exciton energy as well as singlet exciton energy in the luminous process. However, metal complex, representative phosphorescent material, has short luminous lifespan for commercial use. Therefore, there remains a need to develop a new compound that can enhance luminous efficiency and luminous lifespan.

SUMMARY

Accordingly, embodiments of the present disclosure are directed to an organic light emitting device that substantially obviates one or more of the problems due to the limitations and disadvantages of the related art.

An aspect of the present disclosure is to provide an organic metal compound having excellent luminous efficiency and luminous lifespan, an organic light emitting diode and an organic light emitting device including the compound.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concepts, as embodied and broadly described, in one aspect, the present disclosure provides an organic metal compound having the following structure of Formula 1:

[Formula 1]

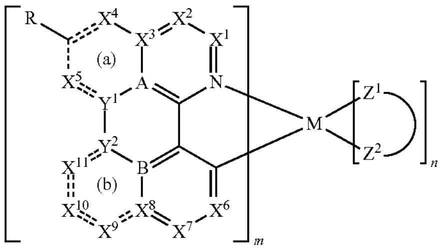

wherein

M is molybdenum (Mo), tungsten (W), rhenium (Re), osmium (Os), rhodium (Rh), iridium (Ir), palladium (Pd), platinum (Pt) or silver (Ag);

each of A and B is a carbon atom;

R is an unsubstituted or substituted $C_1$-$C_{20}$ alkyl group, an unsubstituted or substituted $C_1$-$C_{20}$ alkyl silyl group, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group; each of $X^1$ to $X^{11}$ is independently a carbon atom, $CR^1$ or N;

only one of: a ring (a) with $X^3$-$X^5$, $Y^1$ and A; or a ring (b) with and $X^8$-$X^{11}$, $Y^2$ and B, is formed; and if the ring (a) is formed, each of $X^3$ and $Y^1$ is a carbon atom, $X^6$ and $X^7$ or $X^7$ and $X^8$ forms an unsubstituted or substituted $C_4$-$C_{30}$ alicyclic ring, the unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^2$ is $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$ wherein $R^a$ is an unsubstituted or substituted $C_1$-$C_{20}$ alkyl group or an unsubstituted or substituted $C_6$-$C_{30}$ aromatic group;

if the ring (b) is forms, each of $X^8$ and $Y^2$ is a carbon atom, $X^1$ and $X^2$ or $X^2$ and $X^3$ forms an unsubstituted or substituted $C_4$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^1$ is $BR^2$, $CR^2R^3$, C═O, $SiR^2R^3$, $GeR^2R^3$, $PR^2$, P═O, O, S, $SO_2$, Se, $SeO_2$, Te $TeO_2$, or $NR^a$ wherein $R^a$ is an unsubstituted or substituted $C_1$-$C_{20}$ alkyl group or an unsubstituted or substituted $C_6$-$C_{30}$ aromatic group, each of $R^1$ to $R^3$ is independently protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent carbons to which $R^1$ is attached, and/or $R^2$ and $R^3$ form an unsubstituted or substituted $C_4$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring;

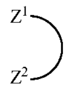

is an auxiliary ligand;

m is an integer of 1 to 3, n is an integer of 0 to 2, and m+n is an oxidation number of M.

In another aspect, the present disclosure provides an organic light emitting diode comprises a first electrode; a second electrode facing the first electrode; and an emissive layer disposed between the first and second electrodes and including at least one emitting material layer, wherein the at least one emitting material layer includes the organic metal compound.

As an example, the organic metal compound may be comprised as dopant in the at least one emitting material layer.

The emissive layer may have single emitting part or multiple emitting parts to form a tandem structure.

In still another aspect, the present disclosure provides an organic light emitting device, for example, an organic light emitting display device or an organic light emitting illumination device, comprises a substrate and the organic light emitting diode over the substrate.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Figure 1:
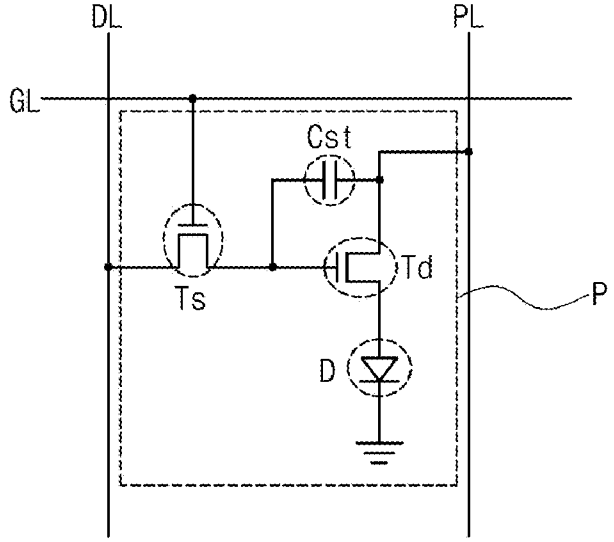
FIG. 1 is a schematic circuit diagram illustrating an organic light emitting display device in accordance with the present disclosure.

Reference will now be made in detail to aspects of the disclosure, examples of which are illustrated in the accompanying drawings.

[Organic Metal Compound]

Prior art phosphorescent material showed low color purity and low quantum efficiency because it has wide photoluminescence spectra in case of emitting light. An organic metal compound of the present disclosure has a rigid chemical conformation so that it can enhance luminous efficiency and luminous lifespan. The organic metal compound of the present disclosure may have the following structure of Formula 1:

[Formula 1]

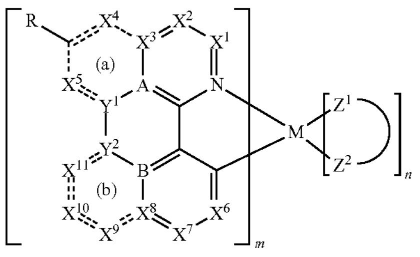

wherein

M is molybdenum (Mo), tungsten (W), rhenium (Re), osmium (Os), rhodium (Rh), iridium (Ir), palladium (Pd), platinum (Pt) or silver (Ag);

each of A and B is a carbon atom;

R is an unsubstituted or substituted $C_1$-$C_{20}$ alkyl group, an unsubstituted or substituted $C_1$-$C_{20}$ alkyl silyl group, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

each of $X^1$ to $X^{11}$ is independently a carbon atom, $CR^1$ or N;

only one of: a ring (a) with $X^3$-$X^5$, $Y^1$ and A; or a ring (b) with and $X^8$-$X^{11}$, $Y^2$ and B, is formed; and if the ring (a) is formed, each of $X^3$ and $Y^1$ is a carbon atom, $X^6$ and $X^7$ or $X^7$ and $X^8$ forms an unsubstituted or substituted $C_4$-$C_{30}$ alicyclic ring, the unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^2$ is $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$ wherein $R^a$ is an unsubstituted or substituted $C_1$-$C_{20}$ alkyl group or an unsubstituted or substituted $C_6$-$C_{30}$ aromatic group;

if the ring (b) is forms, each of $X^8$ and $Y^2$ is a carbon atom, $X^1$ and $X^2$ or $X^2$ and $X^3$ forms an unsubstituted or substituted $C_4$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^1$ is $BR^2$, $CR^2R^3$, C═O, $SiR^2R^3$, $GeR^2R^3$, $PR^2$, P═O, O, S, $SO_2$, Se, $SeO_2$, Te $TeO_2$, or $NR^a$ wherein $R^a$ is an unsubstituted or substituted $C_1$-$C_{20}$ alkyl group or an unsubstituted or substituted $C_6$-$C_{30}$ aromatic group, each of $R^1$ to $R^3$ is independently protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent carbons to which $R^1$ is attached, and/or $R^2$ and $R^3$ form an unsubstituted or substituted $C_4$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring;

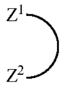

is an auxiliary ligand;

m is an integer of 1 to 3; and n is an integer of 0 to 2; and m+n is an oxidation number of M.

As used herein, the term "unsubstituted" means that the specified group bears no substituents, and hydrogen is linked. In this case, hydrogen comprises protium, deuterium and tritium.

As used herein, substituent in the term "substituted" comprises, but is not limited to, unsubstituted or halogen-substituted $C_1$-$C_{20}$ alkyl, unsubstituted or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{10}$ alkyl silyl group, a $C_6$-$C_{30}$ aryl silyl group and a $C_3$-$C_{30}$ hetero aryl silyl group.

As used herein, the term "alkyl" refers to a branched or unbranched saturated hydrocarbon group of 1 to 20 carbon atoms, such as methyl, ethyl, 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, and the like.

As used herein, the term "alkenyl" is a hydrocarbon group of 2 to 20 carbon atoms containing at least one carbon-carbon double bond. The alkenyl group can be substituted with one or more substituents.

As used herein, the term "alicyclic" or "cycloalkyl" refers to non-aromatic carbon-based ring composed of at least three carbon atoms. Examples of alicyclic groups include, but are not limited to, cyclopropyl, cyclobutyl, cyclopentyl, cyclohexyl, norbornyl, and the like. The alicyclic group can be substituted with one or more substituents.

As used herein, the term "alkoxy" refers to a branched or unbranched alkyl bonded through an ether linkage represented by the formula —O(-alkyl) where alkyl is defined herein. Examples of alkoxy include methoxy, ethoxy, n-propoxy, isopropoxy, butoxy, and tert-butoxy, and the like.

As used herein, the term "alkyl amino" refers to a group represented by the formula —NH(-alkyl) or —N(-alkyl)$_2$ where alkyl is defined herein. Examples of alkyl amino represented by the formula —NH(-alkyl) include, but not limited to, methylamino group, ethylamino group, propylamino group, isopropylamino group, butylamino group, isobutylamino group, (sec-butyl)amino group, (tert-butyl) amino group, pentylamino group, isopentylamino group, (tert-pentyl)amino group, hexylamino group, and the like. Examples of alkyl amino represented by the formula —N(-alkyl)$_2$ include, but not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl) amino group, dihexylamino group, N-ethyl-N-methylamino group, N-methyl-N-propylamino group, N ethyl-N-propylamino group and the like.

As used herein, the term "aromatic" or "aryl" is well known in the art. The term includes monocyclic rings linked covalently or fused-ring polycyclic groups. An aromatic group can be unsubstituted or substituted. Examples of aromatic or aryl include phenyl, 1-naphthyl, 2-naphthyl, 4-biphenyl, anthracenyl, and phenanthracenyl and the like. Substituents for each of the above noted aryl ring systems are acceptable substituents are defined herein.

As used herein, the term "alkyl silyl group" refers to any linear or branched, saturated or unsaturated acyclic or acyclic alkyl, and the alkyl has 1 to 20 carbon atoms. Examples of the alkyl silyl group include a trimethyl silyl group, a trimethylsilyl group, a t-butyldimethylsilyl group, a vinyldimethylsilyl group, a propyldimethylsilyl group, a triphenyl silyl group, a diphenyl silyl group, and a phenyl silyl group.

As used herein, the term "halogen" refers to fluorine, chlorine, bromine or iodine atom.

As used herein, the term "hetero" in such as "a hetero aromatic ring", "a hetero cyclo alkylene group", "a hetero arylene group", "a hetero aryl alkylene group", "a hetero aryl oxylene group", "a hetero cyclo alkyl group", "a hetero aryl group", "a hetero aryl alkyl group", "a hetero aryloxyl group", "a hetero aryl amino group" means that at least one carbon atom, for example 1-5 carbons atoms, constituting an aromatic ring or an alicyclic ring is substituted with at least one hetero atom selected from the group consisting of N, O, S, P and combination thereof.

As used herein, the term "hetero aromatic" or "hetero aryl" refers to a heterocycles including hetero atoms selected from N, O and S in a ring where the ring system is an aromatic ring. The term includes monocyclic rings linked covalently or fused-ring polycyclic groups. A hetero aromatic group can be unsubstituted or substituted. Examples of hetero aromatic or hetero aryl include pyridyl, pyrrolyl, pyrazinyl, pyrimidinyl, thienyl (alternatively referred to as thiophenyl), thiazolyl, furanyl, imidazolyl, pyrazolyl, triazolyl, tetrazolyl, oxazolyl, oxadiazolyl, thiazolyl, and thiadiazolyl.

As used herein, the term "hetero aryl oxy" refers to a group represented by the formula —O-(hetero aryl) where hetero aryl is defined herein.

For example, when each of R, $R^1$ to $R^3$ in Formula 1 is independently a $C_6$-$C_{30}$ aromatic group, each of R, $R^1$ to $R^3$ is independently may be, but is not limited to, a $C_6$-$C_{30}$ aryl group, a $C_7$-$C_{30}$ aryl alkyl group, a $C_6$-$C_{30}$ aryl oxy group and a $C_6$-$C_{30}$ aryl amino group. As an example, when each of R, $R^1$ to $R^3$ is independently a $C_6$-$C_{30}$ aryl group, each of R, $R^1$ to $R^3$ may independently comprise, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl and spiro-fluorenyl.

Alternatively, when each of R, $R^1$ to $R^3$ in Formula 1 is independently a $C_3$-$C_{30}$ hetero aromatic group, each of R, $R^1$ to $R^3$ is independently may be, but is not limited to, a $C_3$-$C_{30}$ hetero aryl group, a $C_4$-$C_{30}$ hetero aryl alkyl group, a $C_3$-$C_{30}$ hetero aryl oxy group and a $C_3$-$C_{30}$ hetero aryl amino group. As an example, when each of R, $R^1$ to $R^3$ is independently a $C_3$-$C_{30}$ hetero aryl group, each of R, $R^1$ to $R^3$ may independently comprise, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzofuro-dibenzo-furanyl, benzothieno-benzo-thiophenyl, benzothieno-dibenzo-thiophenyl, benzo-thieno-benzo-furanyl, benzothieno-dibenzo-furanyl, xanthene-linked spiro acridinyl, dihydroacridinyl substituted with at least one $C_1$-$C_{10}$ alkyl and N-substituted spiro fluorenyl.

As an example, each of the aromatic group or the hetero aromatic group of R, $R^1$ to $R^3$ may consist of one to three aromatic or hetero aromatic rings. When the number of the aromatic or hetero aromatic rings of R, $R^1$ to $R^3$ is more than three, conjugated structure among the within the whole molecule becomes too long, thus, the organic metal compound may have too narrow energy bandgap. For example, each of the aryl group or the hetero aryl group of R, $R^1$ to $R^3$ may comprise independently, but is not limited to, phenyl, biphenyl, naphthyl, anthracenyl, pyrrolyl, triazinyl, imidazolyl, pyrazolyl, pyridinyl, pyrazinyl, pyrimidinyl, pyridazinyl, furanyl, benzo-furanyl, dibenzo-furanyl, thiophenyl, benzo-thiophenyl, dibenzo-thiophenyl, carbazolyl, acridinyl, carbolinyl, phenazinyl, phenoxazinyl and/or phenothiazinyl.

Alternatively, two adjacent carbons to which $R^1$ is attached and/or $R^2$ and $R^3$ may form an unsubstituted or substituted $C_4$-$C_{30}$ alicyclic ring (e.g., a $C_5$-$C_{10}$ alicyclic ring), an unsubstituted or substituted $C_3$-$C_{30}$ hetero alicyclic ring (e.g. a $C_3$-$C_{10}$ hetero alicyclic ring), an unsubstituted or substituted $C_6$-$C_{30}$ aromatic ring (e.g. a $C_6$-$C_{20}$ aromatic ring) or an unsubstituted or substituted $C_3$-$C_{30}$ hetero aromatic ring (e.g. a $C_3$-$C_{20}$ hetero aromatic ring). The alicyclic ring, the hetero alicyclic ring, the aromatic ring and the hetero aromatic ring formed by: two adjacent carbon atoms to which $R^1$ is attached; or $R^2$ and $R^3$, are not limited to specific rings. For example, the aromatic ring or the hetero aromatic ring formed by those groups may comprise, but is not limited to, a benzene ring, a pyridine ring, an indole ring, a pyran ring, a fluorine ring unsubstituted or substituted with at least one $C_1$-$C_{10}$ alkyl group.

The organic metal compound having the structure of Formula 1 has a ligand with fused with multiple aromatic and/or hetero aromatic rings, thus it has narrow full-width at half maximum (FWHM) in photoluminescence spectrum. Particularly, since the organic metal compound has a rigid chemical conformation, so that its conformation is not rotated in the luminous process, therefore, and it can maintain good luminous lifespan. The organic metal compound has specific ranges of photoluminescence emissions, so that its color purity can be improved.

In addition, the organic metal compound may be a heteropletic metal complex including two different bidentate ligands coordinated to the central metal atom. The photoluminescence color purity and emission colors of the organic metal compound can be controlled with ease by combining two different bidentate ligands. Moreover, it is possible to control the color purity and emission peaks of the organic metal compound by introducing various substituents to each of the ligands. For example, the organic metal compound having the structure of Formula 1 may emit yellow to red colors and can improve luminous efficiency of an organic light emitting diode.

In one exemplary aspect, the organic metal compound may have the ring (a) with $X^3$-$X^5$, $Y^1$ and A as an example of the organic metal compound having the structure of Formula 1. Such an organic metal compound may have the following structure of Formula 2:

[Formula 2]

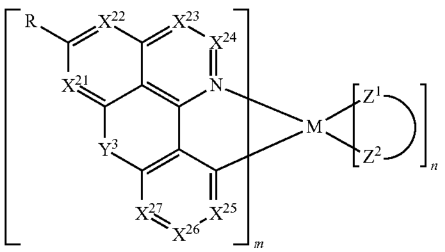

wherein each of M, R,

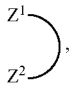

m and n are the same as defined in Formula 1; each of $X^{21}$ to $X^{27}$ is independently $CR^1$ or N; $Y^3$ is $BR^2$, $CH_2$, $CR^2R^3$, C═O, $SiR^2R^3$, $GeR^2R^3$, $PR^2$, P═O, O, S, $SO_2$, Se, $SeO_2$, Te or $TeO_2$; each of $R^1$ to $R^3$ is a same as defined in Formula 1.

In an alternative aspect, the organic metal compound may have the ring (b) with and $X^8$-$X^{11}$, $Y^2$ and B as an example of the organic metal compound having the structure of Formula 1. Such an organic metal compound may have the following structure of Formula 3:

[Formula 3]

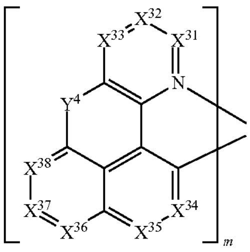

wherein each of M,

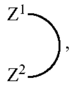

m and n is a same as defined in Formula 1; each of $X^{31}$ to $X^{38}$ is independently $CR^1$ or N; $Y^4$ is $BR^2$, $CH_2$, $CR^2R^3$, C═O, $SiR^2R^3$, $GeR^2R^3$, $PR^2$, P═O, O, S, $SO_2$, Se, $SeO_2$, Te or $TeO_2$; each of $R^1$ to $R^3$ is a same as defined in Formula 1.

More particularly, an organic metal compound including the aromatic or hetero aromatic ring formed with $X^{25}$ and $X^{26}$ among the organic metal compound having the structure of Formula 2 may have the following structure of Formula 4 and an organic metal compound including the aromatic or hetero aromatic ring formed with $X^{26}$ and $X^{27}$ among the organic metal compound having the structure of Formula 2 may have the following structure of Formula 5:

[Formula 4]

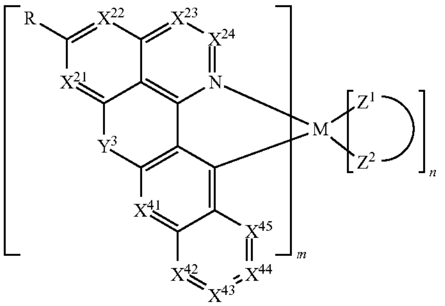

-continued

[Formula 5]

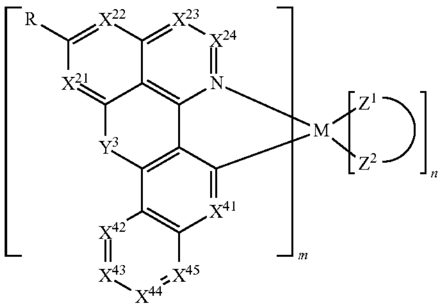

wherein each of M, R,

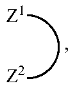

m, n, $X^{21}$ to $X^{24}$ and $Y^3$ is a same as defined in Formula 2; each of $X^{41}$ to $X^{45}$ is independently $CR^1$ or N; each of $R^1$ to $R^3$ is a same as defined in Formula 1.

Alternatively, an organic metal compound including the aromatic or hetero aromatic ring formed with $X^{31}$ and $X^{32}$ among the organic metal compound having the structure of Formula 3 may have the following structure of Formula 6 and an organic metal compound including the aromatic or hetero aromatic ring formed with $X^{32}$ and $X^{33}$ among the organic metal compound having the structure of Formula 3 may have the following structure of Formula 7:

[Formula 6]

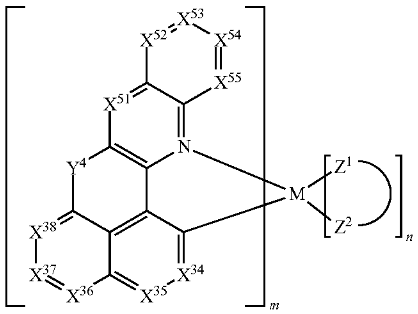

[Formula 7]

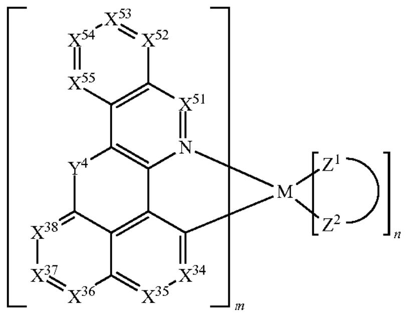

wherein M,

m, n, $X^{34}$ to $X^{38}$ and $Y^4$ is a same as defined in Formula 3; each of $X^{51}$ to $X^{55}$ is independently $CR^1$ or N; each of $R^1$ to $R^3$ is a same as defined in Formula 1.

The auxiliary ligand

may be a bidentate ligand wherein $Z^1$ and $Z^2$ are independently selected from the group consisting of an oxygen atom, a nitrogen atom, and a phosphorus atom. The bidentate ligand may be acetylacetonate-based ligand, or N,N'- or N,O-bidentate anionic ligand.

As an example, the center coordination metal may be iridium and the auxiliary ligand

may be an acetylacetonate-based ligand. Such an organic metal compound may have anyone of the flowing structures of Formula 8 to Formula 11:

[Formula 8]

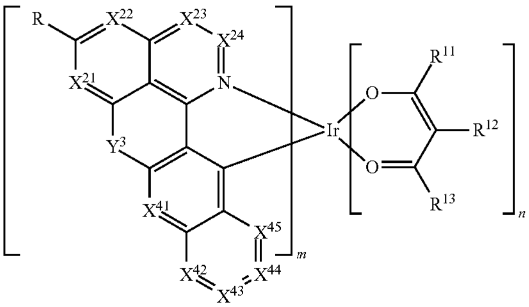

[Formula 9]

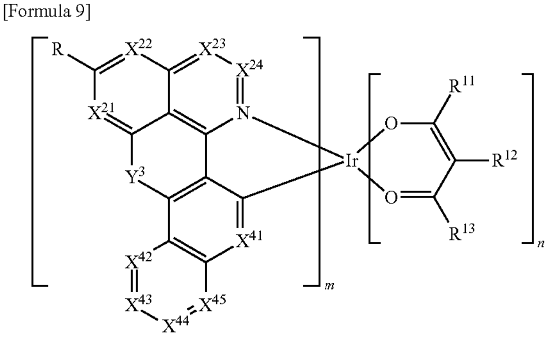

-continued

[Formula 10]

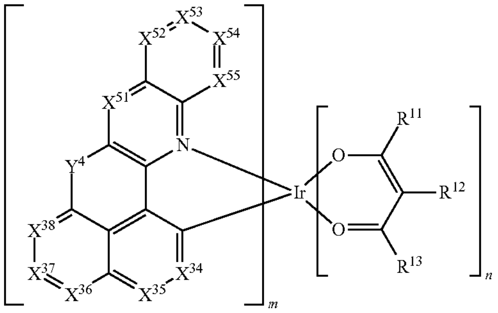

[Formula 11]

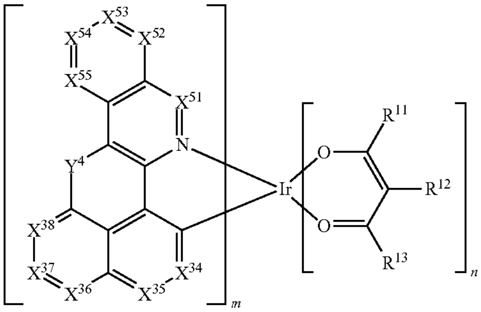

wherein R is a same as defined in Formula 1; each of $X^{21}$ to $X^{24}$, $X^{34}$ to $X^{38}$, $X^{41}$ to $X^{45}$ and $X^{51}$ to $X^{55}$ is independently $CR^1$ or N; each of $Y^3$ and $Y^4$ is independently $BR^2$, $CH_2$, $CR^2R^3$, C=O, $SiR^2R^3$, $GeR^2R^3$, $PR^2$, P=O, O, S, $SO_2$, Se, $SeO_2$, Te or $TeO_2$; each of $R^1$ to $R^3$ is a same as defined in Formula 1; each of $R^{11}$ to $R^{13}$ is independently protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group; m is an integer of 1 to 3, n is an integer of 0 to 2, wherein m+n is 3.

As an example, an organic metal compound having the structure of Formula 8 may include the following compounds 1-180 of Formula 12:

[Formula 12]
1
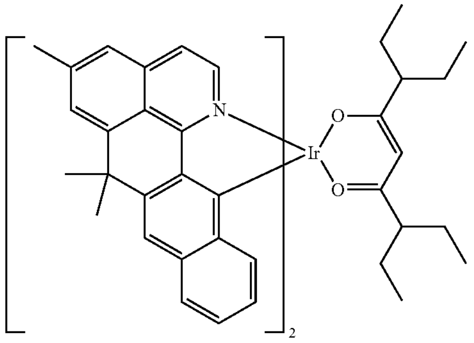
2
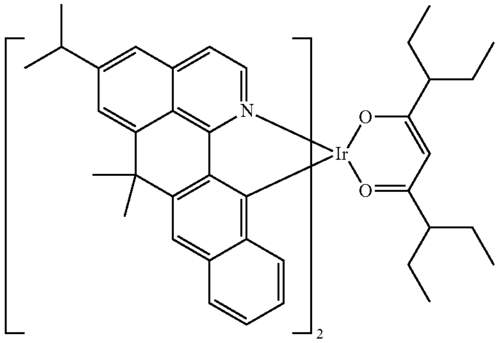
3
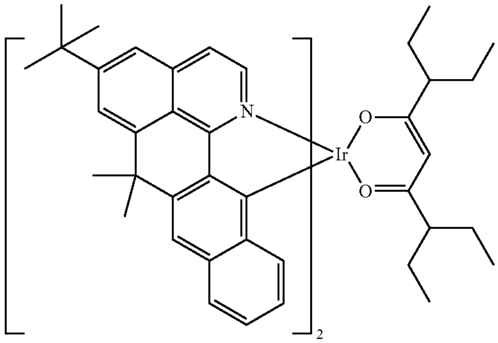
4
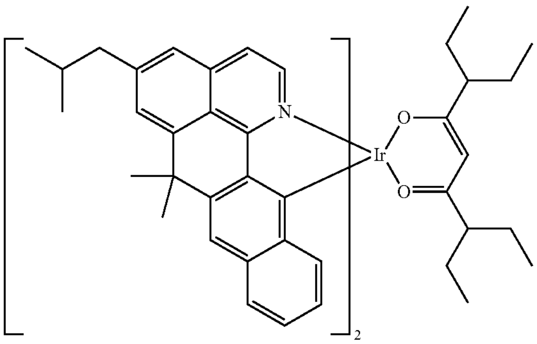
-continued
5
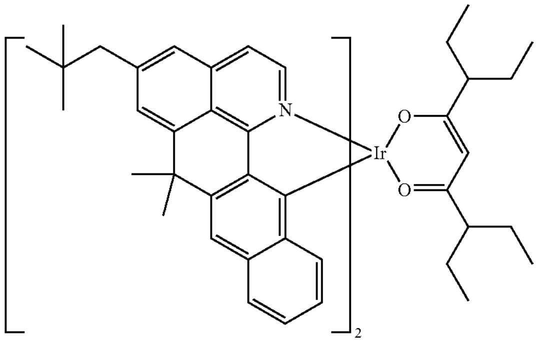
6
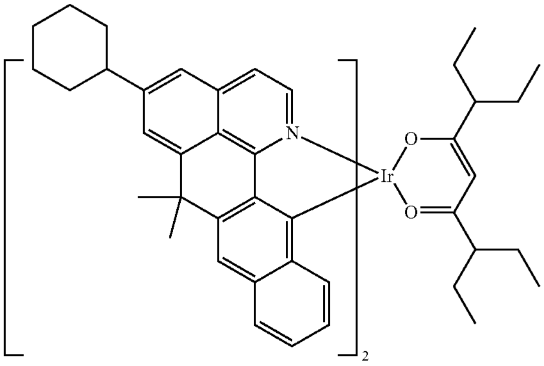
7
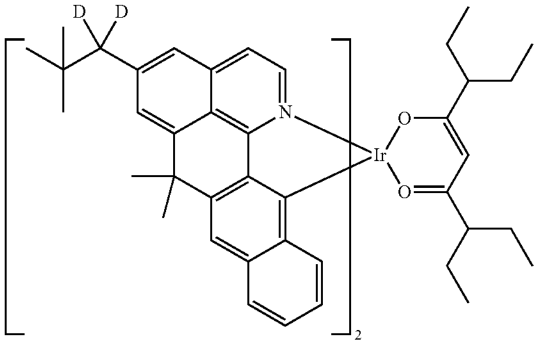
8
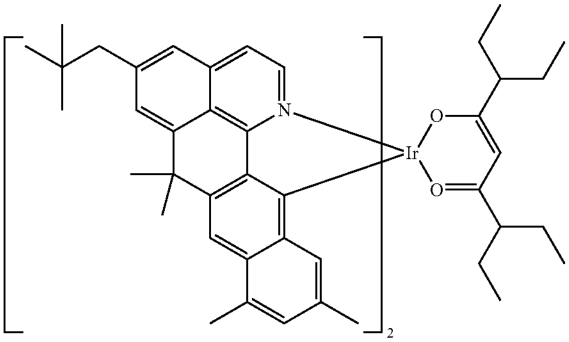

-continued
9
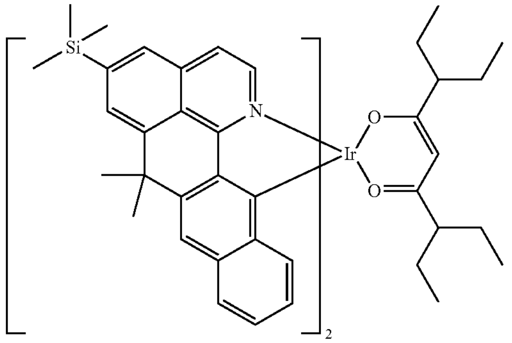
10
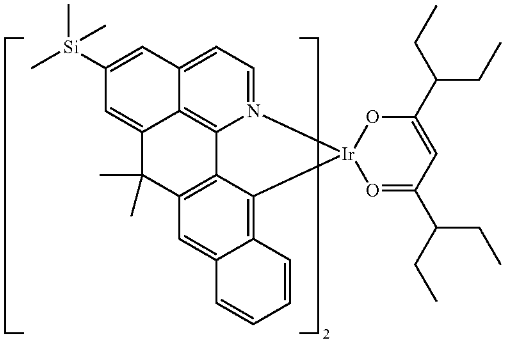
11
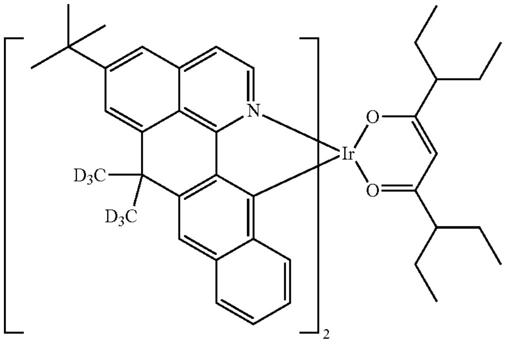
12
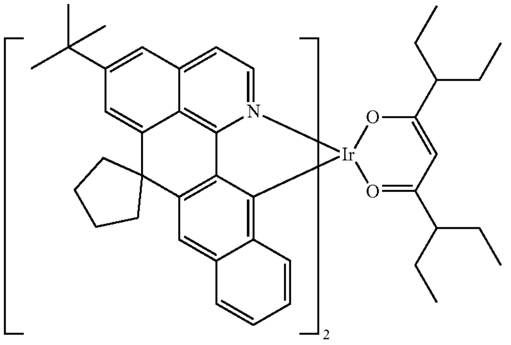
-continued
13
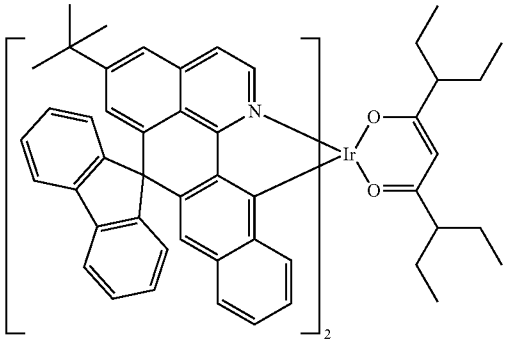
14
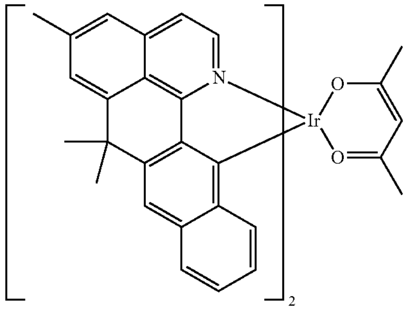
15
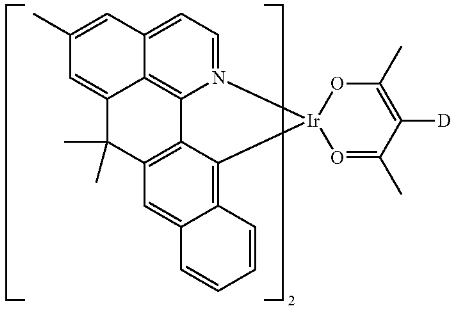
16
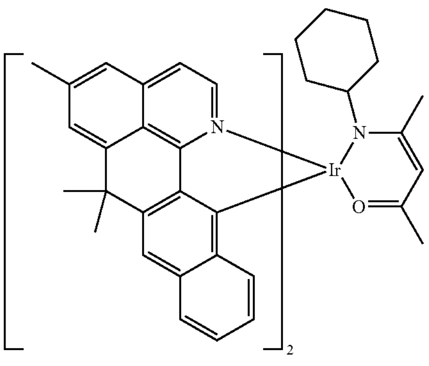

-continued
17
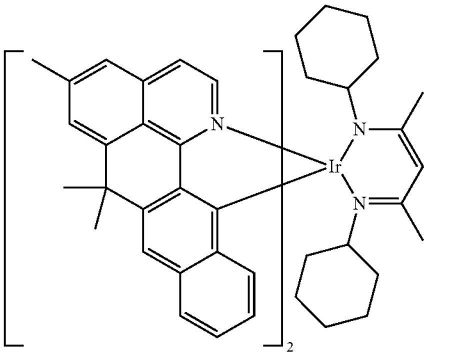
18
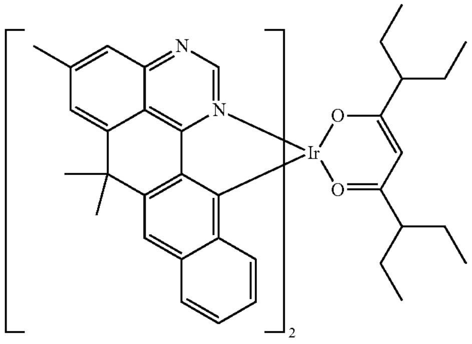
19
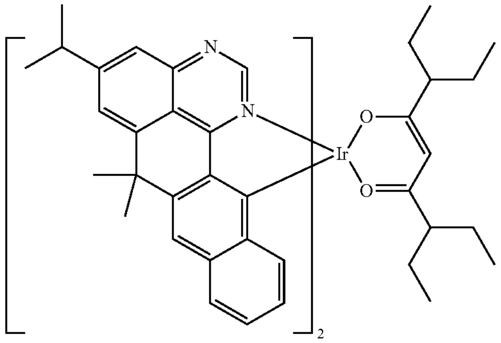
20
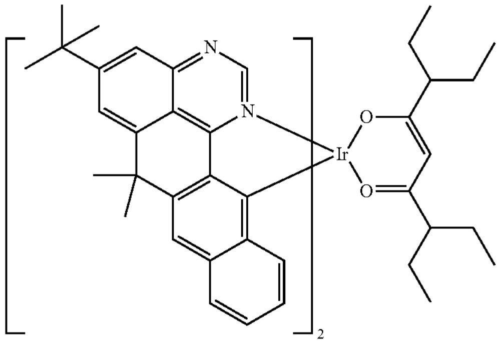
-continued
21
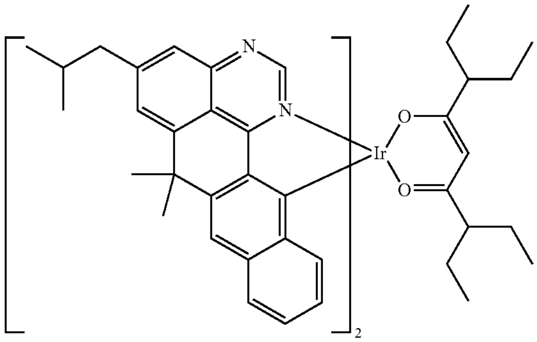
22
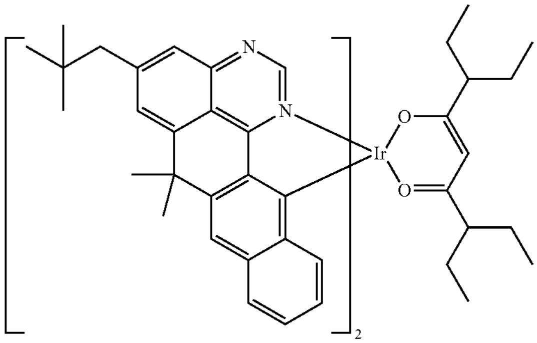
23
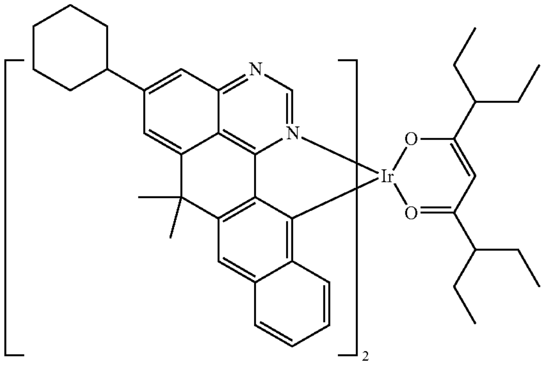
24
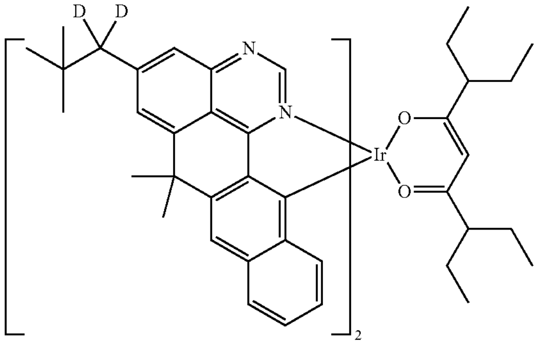

-continued
25
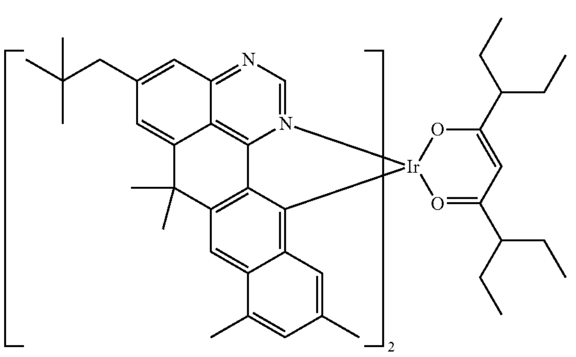
26
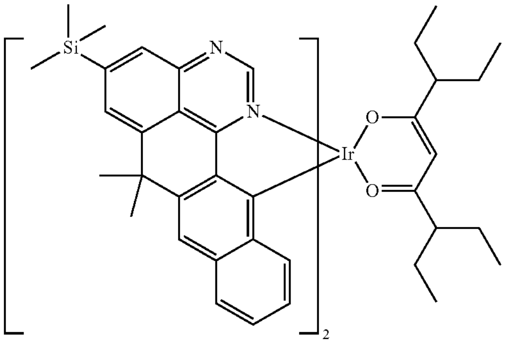
27
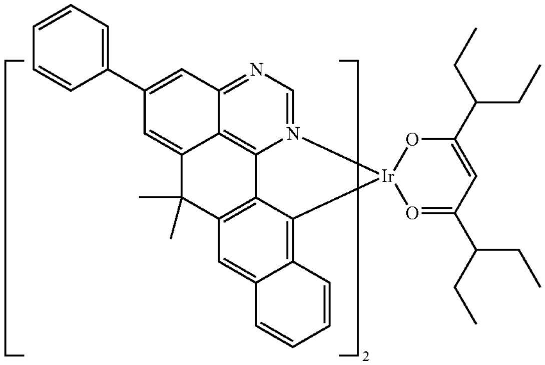
28
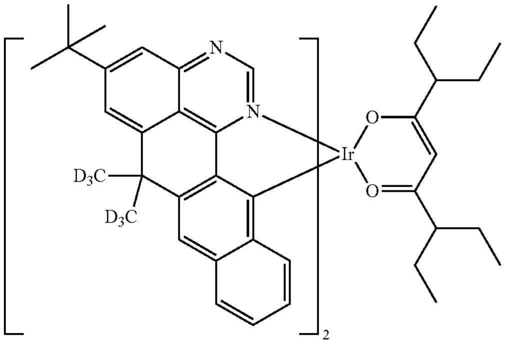
-continued
29
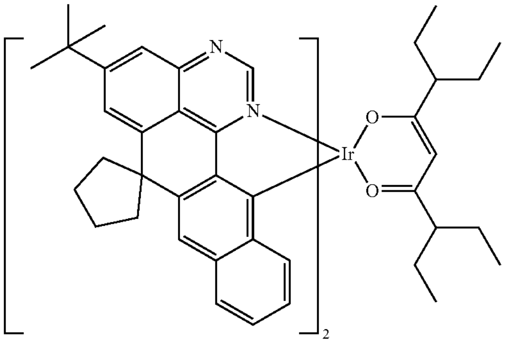
30
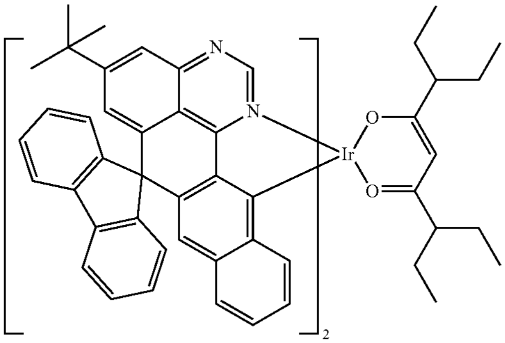
31
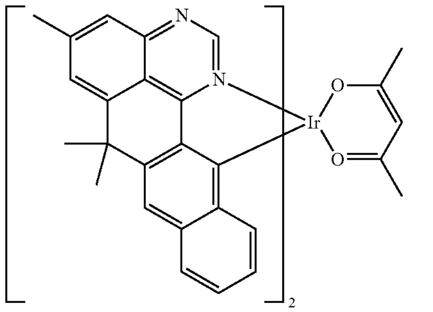
32
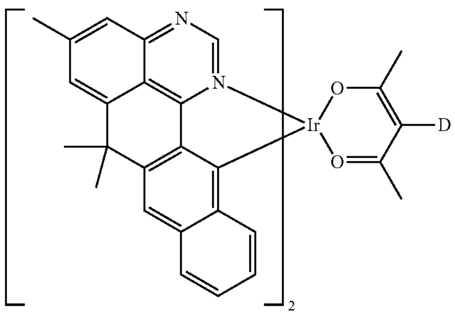

-continued
33
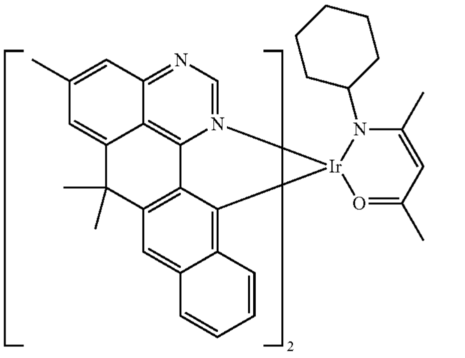
34
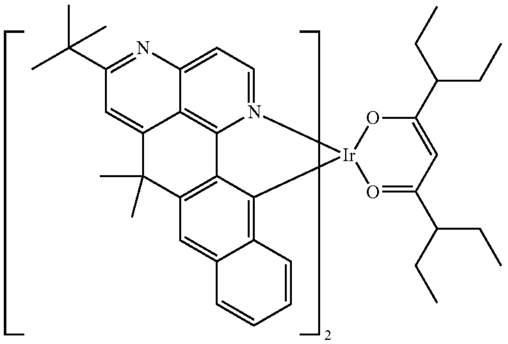
35
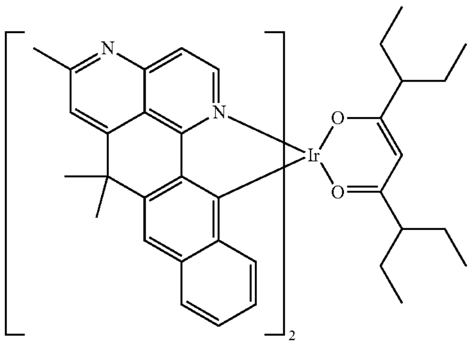
36
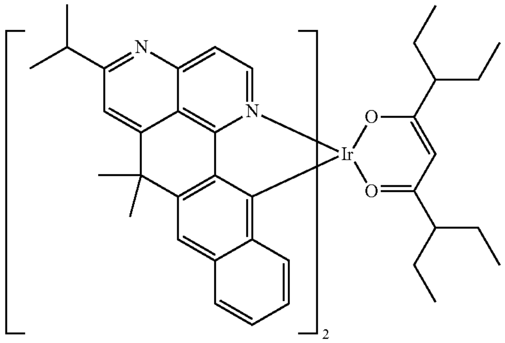
-continued
37
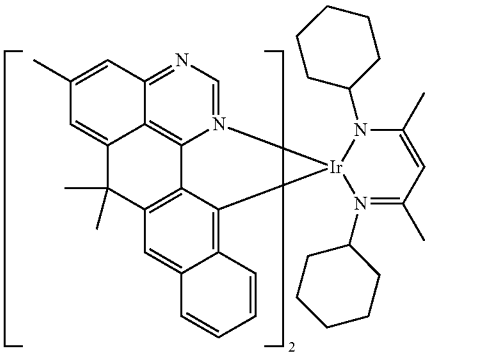
38
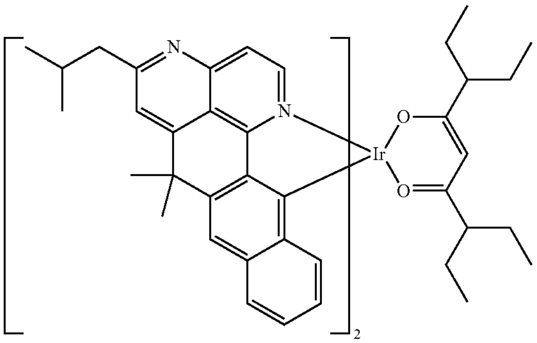
39
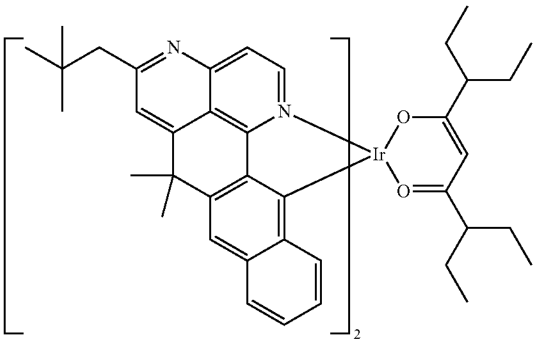
40
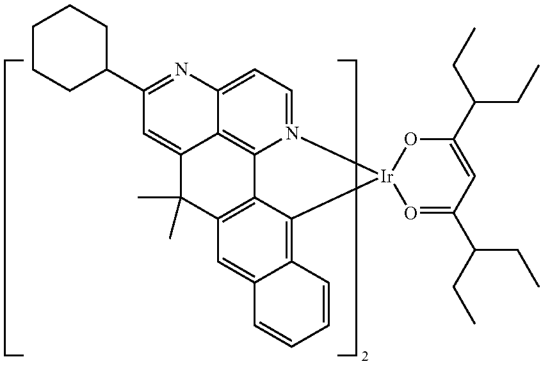

-continued
41
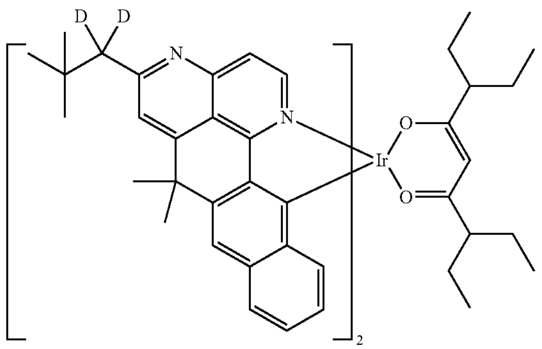
42
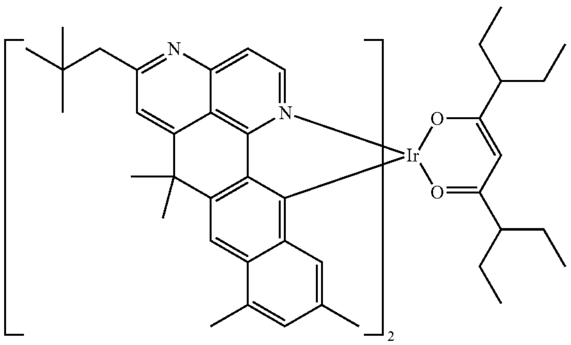
43
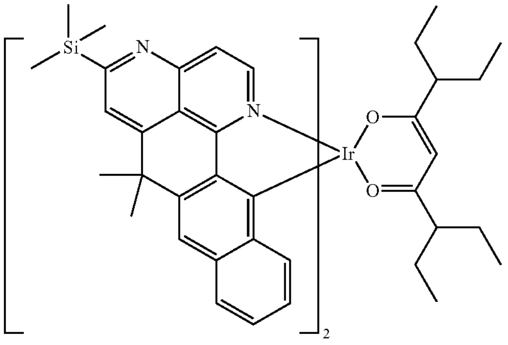
44
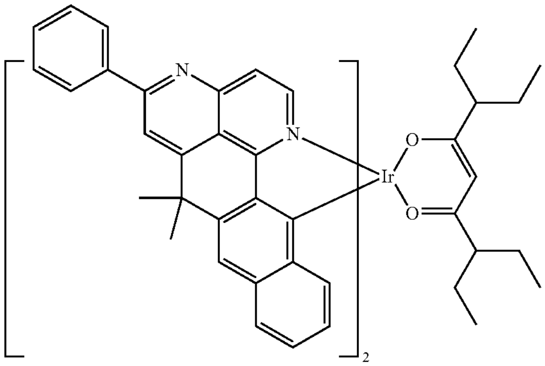
-continued
45
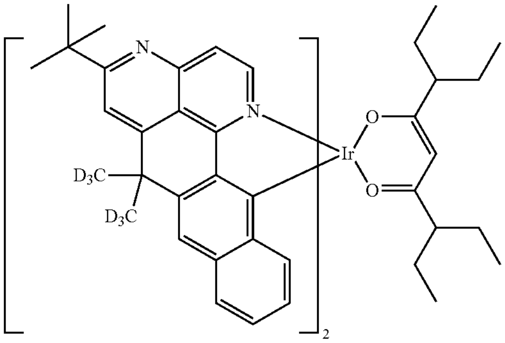
46
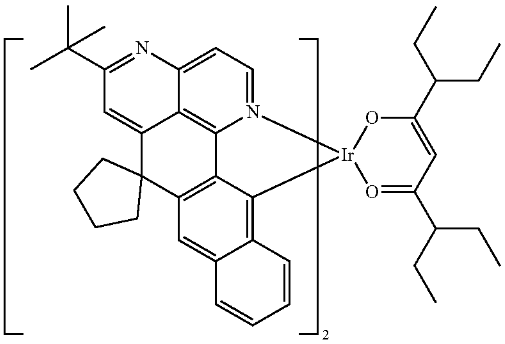
47
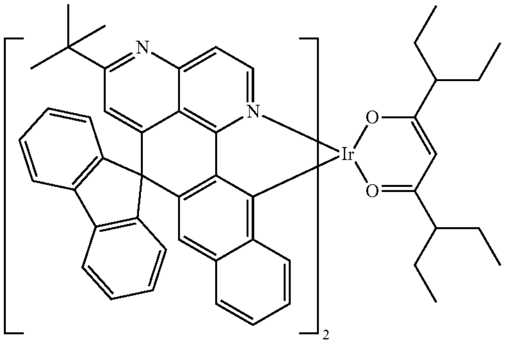
48
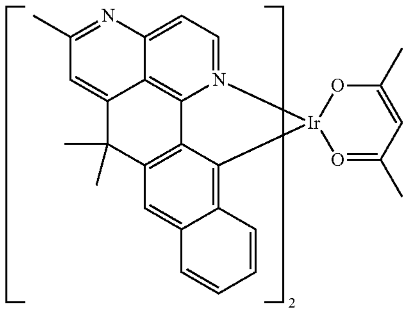

-continued
49
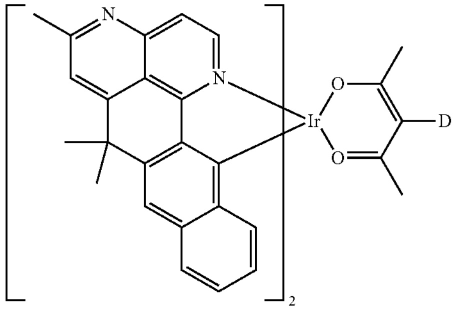
50
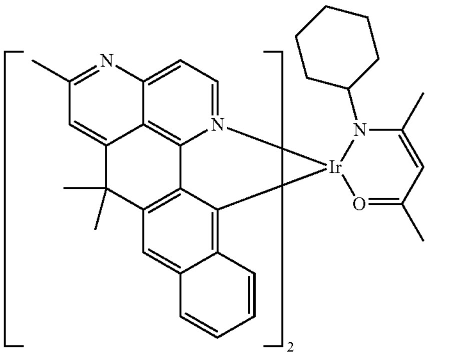
51
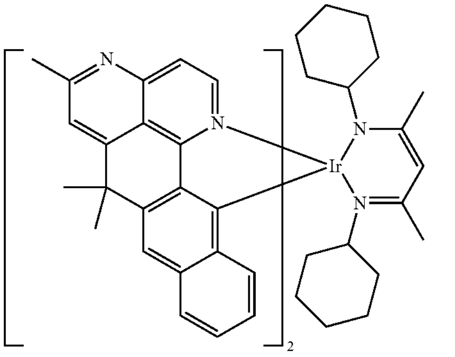
52
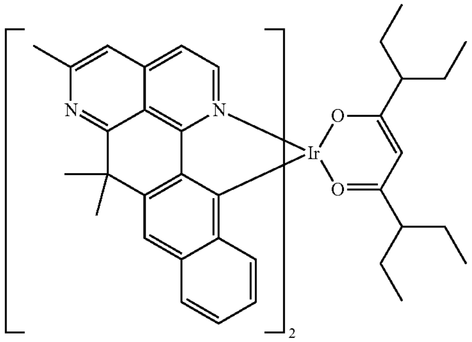
-continued
53
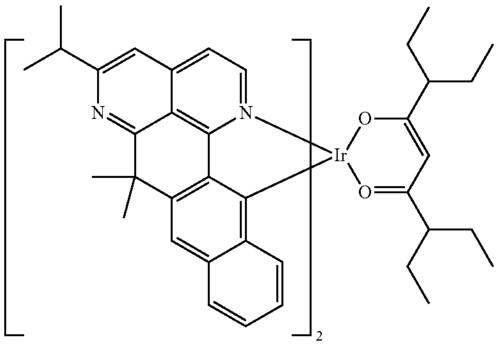
54
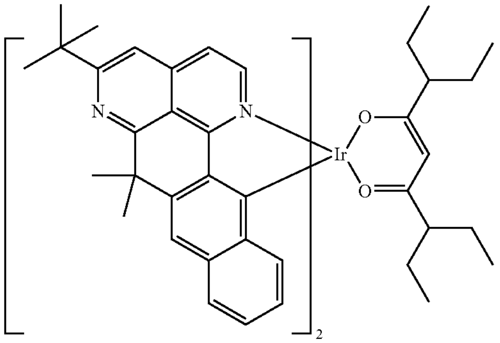
55
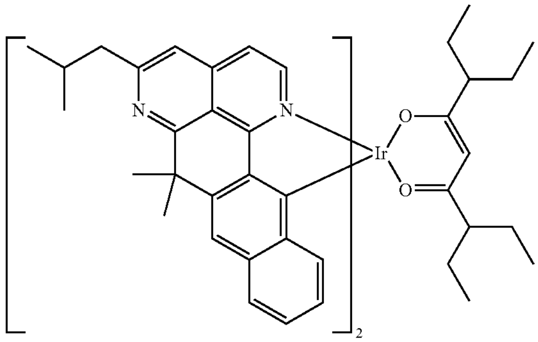
56
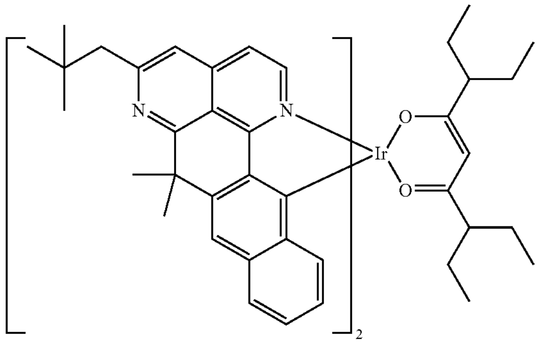

57
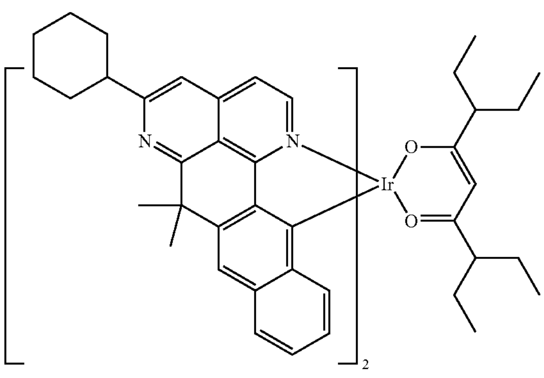
58
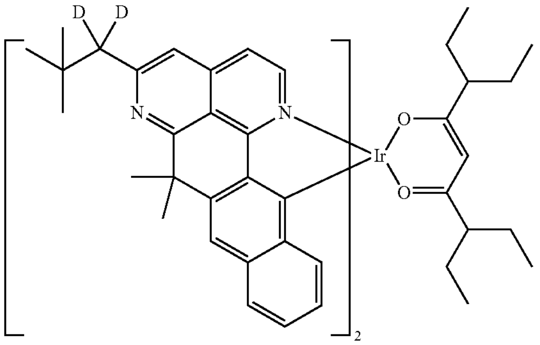
59
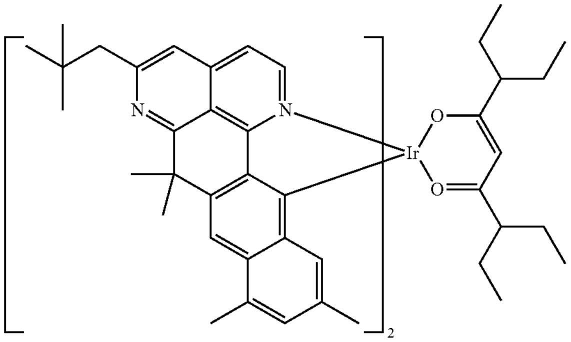
60
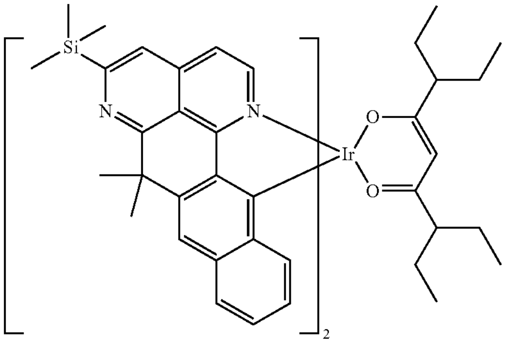
61
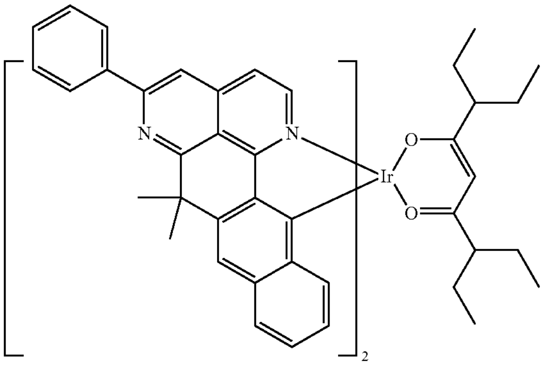
62
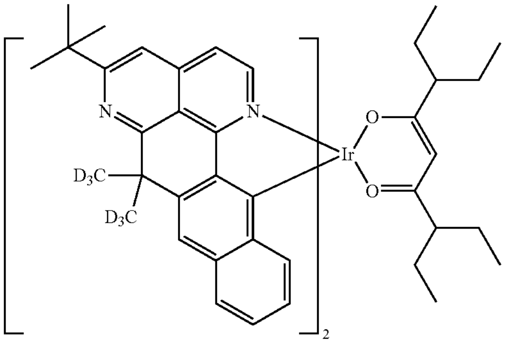
63
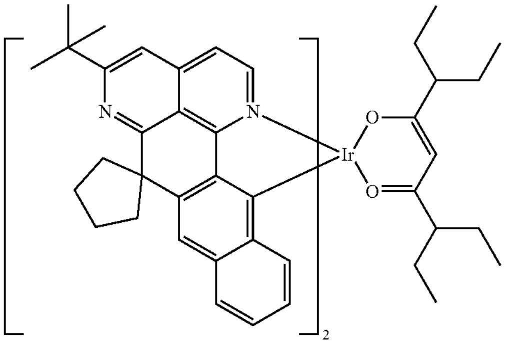
64
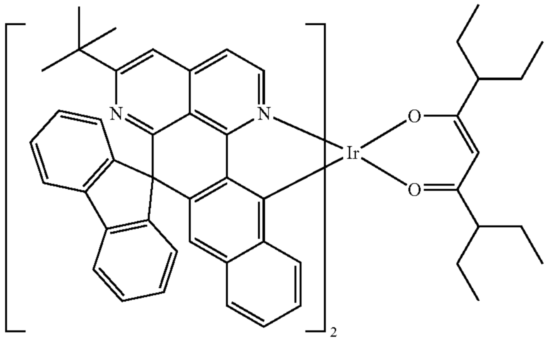

-continued
65
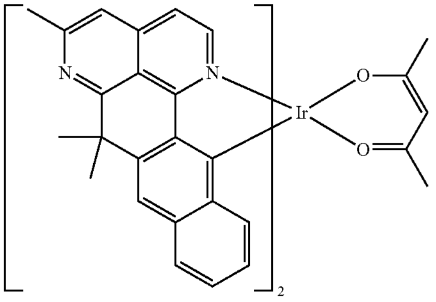
66
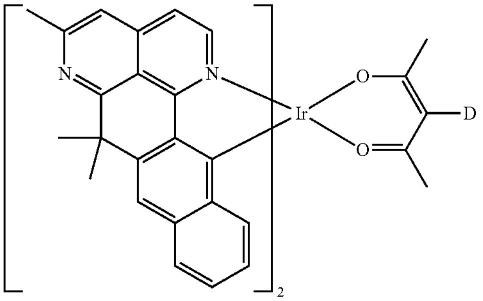
67
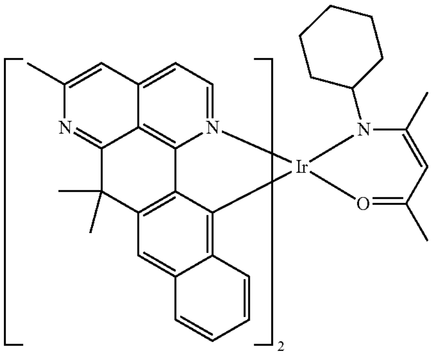
68
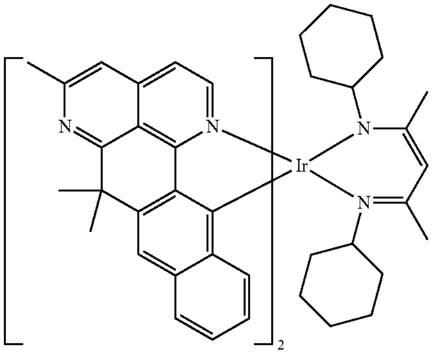
-continued
69
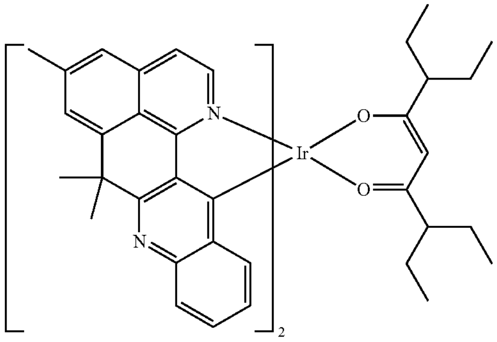
70
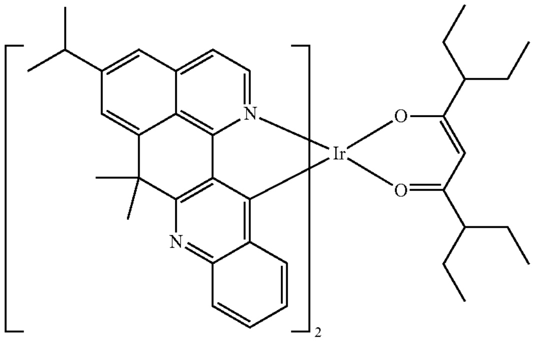
71
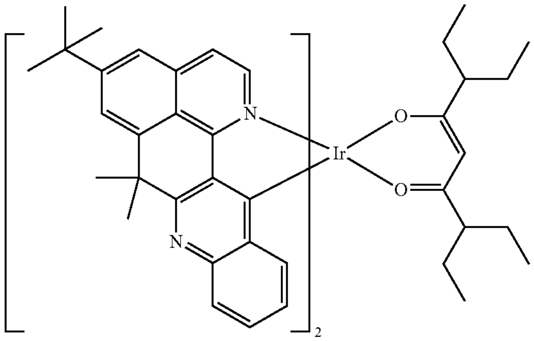
72
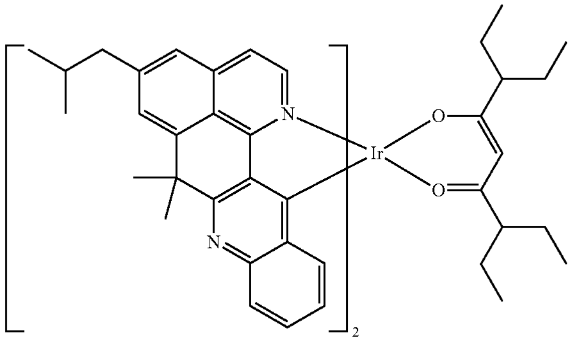

-continued
73
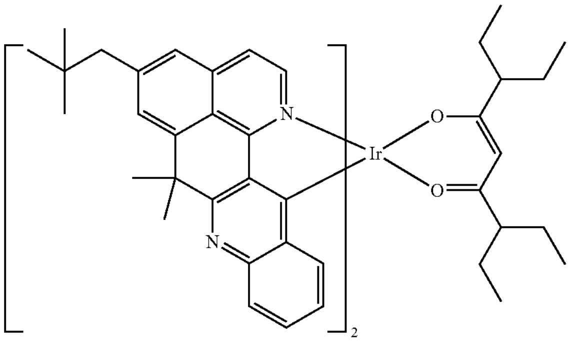
74
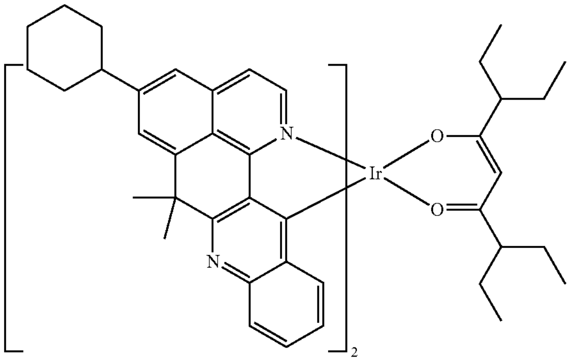
75
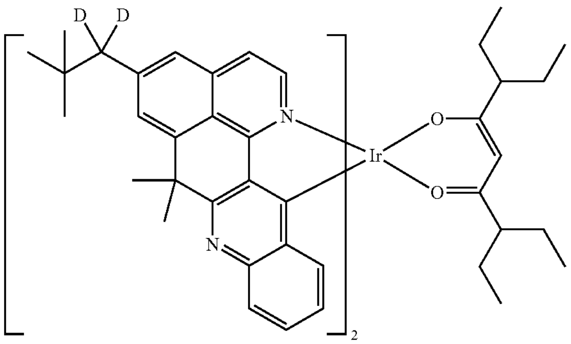
76
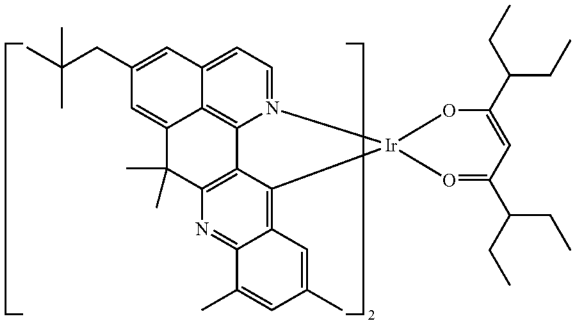
-continued
77
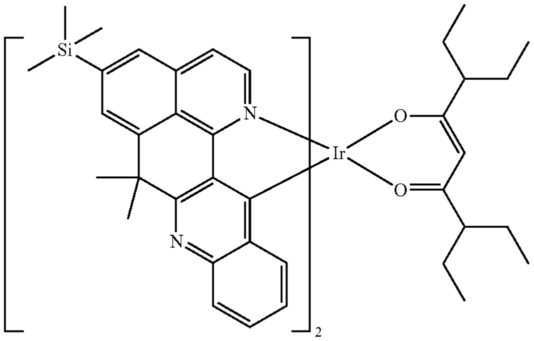
78
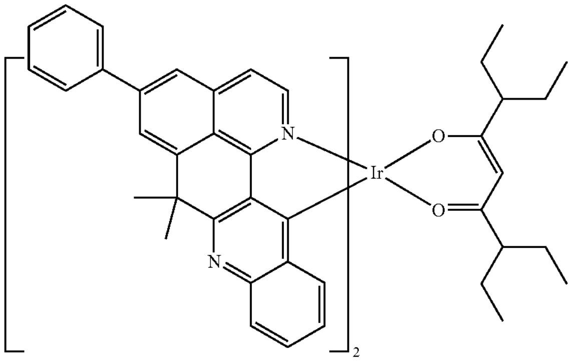
79
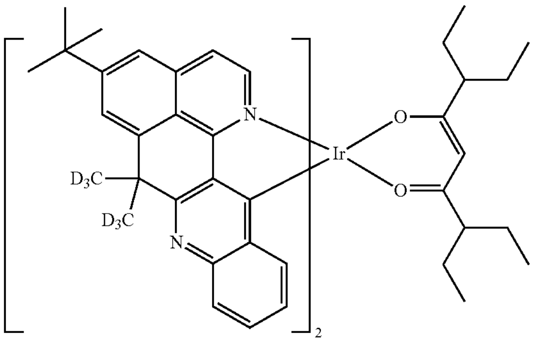
80
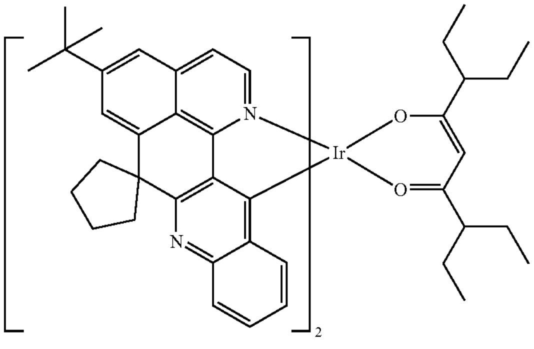

-continued
81
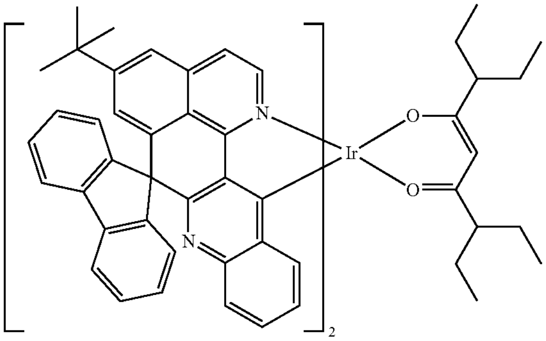
85
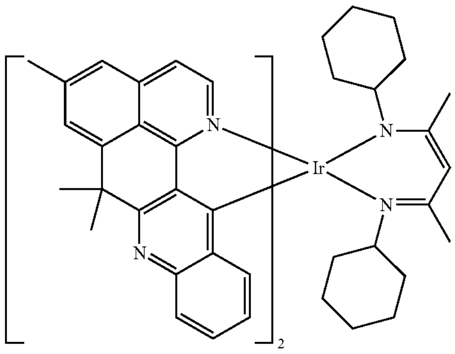
82
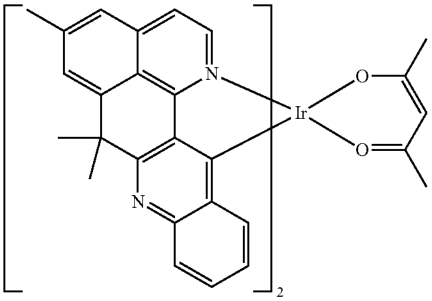
86
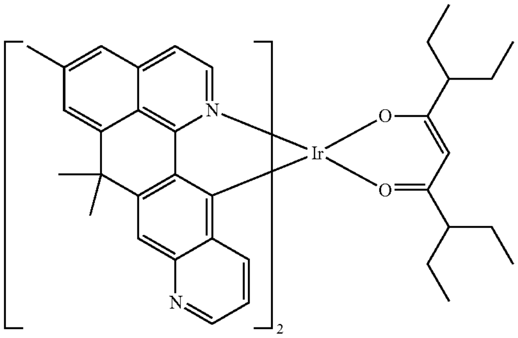
83
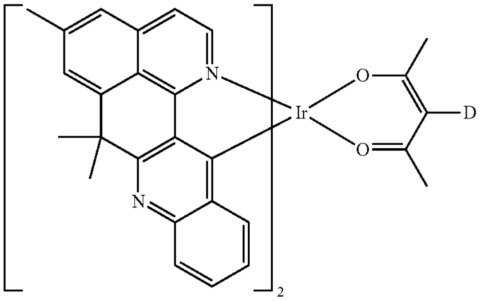
87
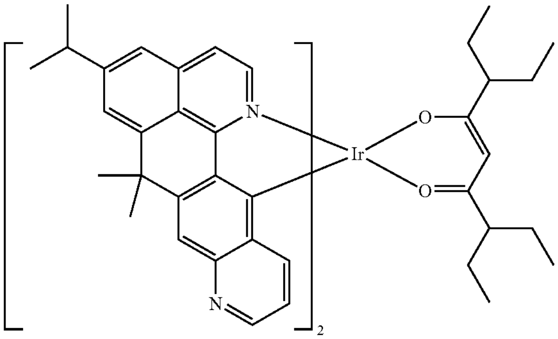
84
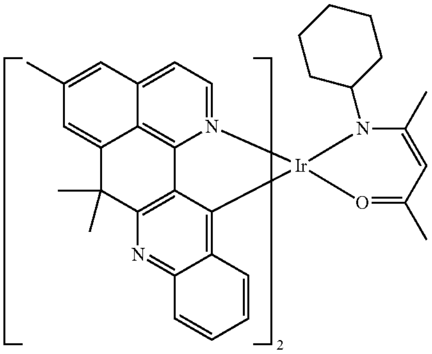
88
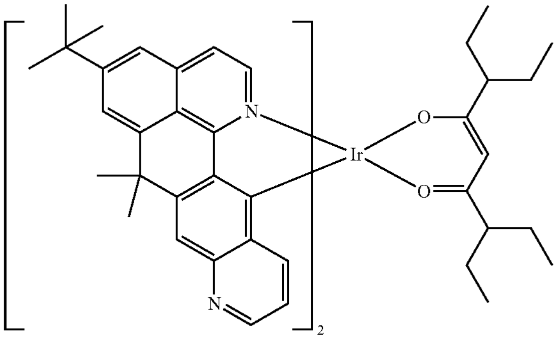

-continued
89
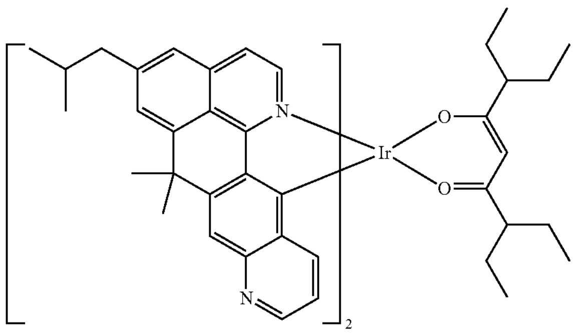
90
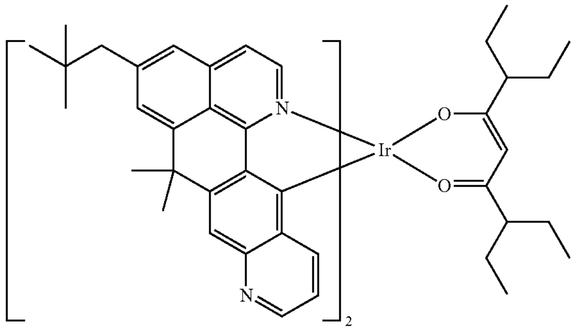
91
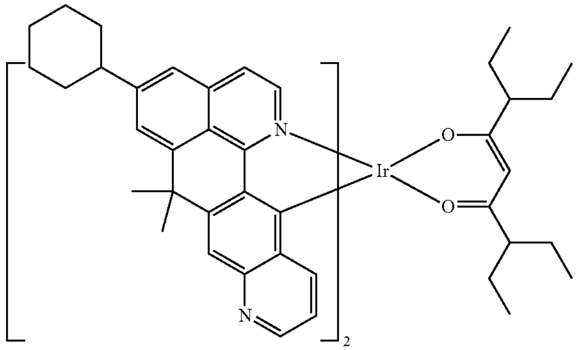
92
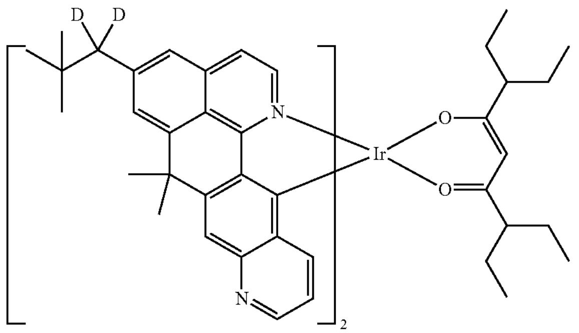
-continued
93
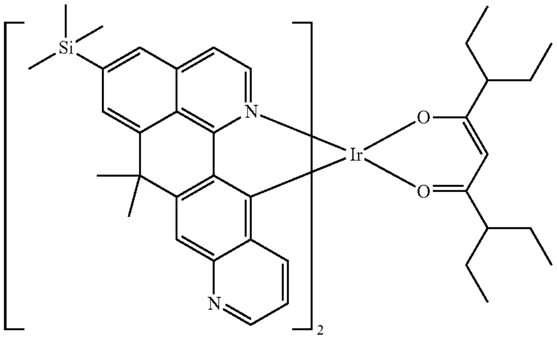
94
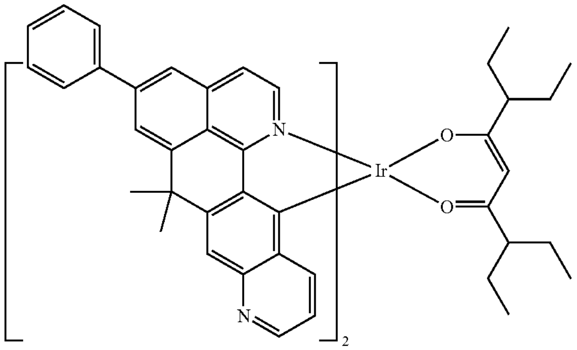
95
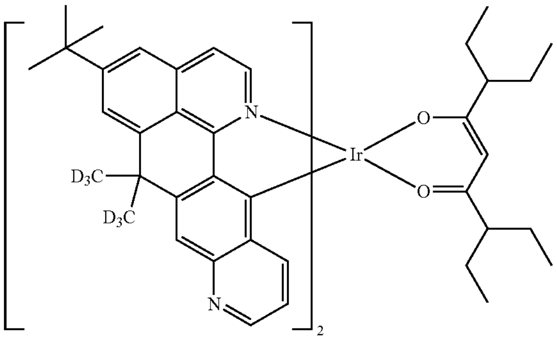
96
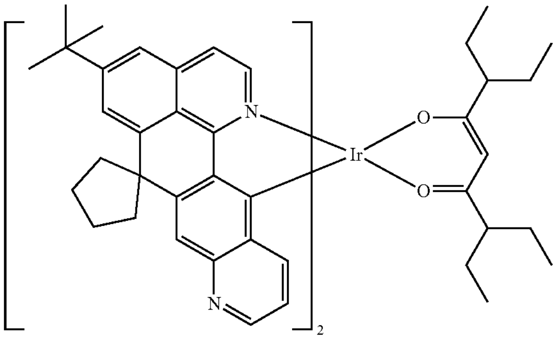

-continued
97
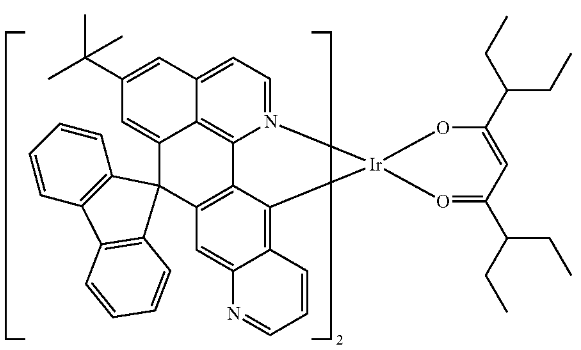
98
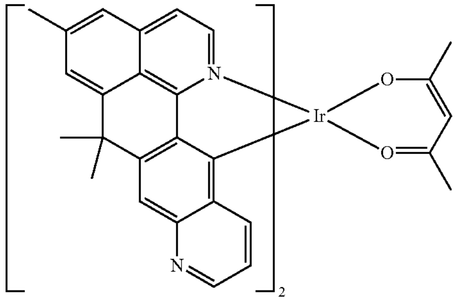
99
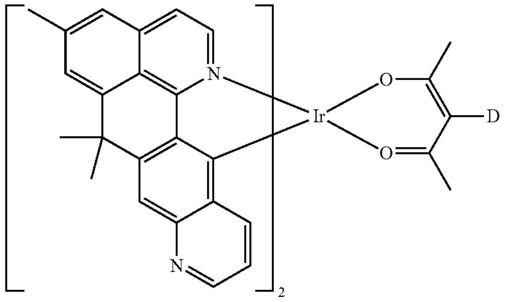
100
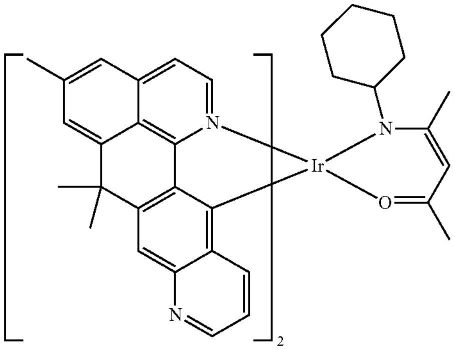
-continued
101
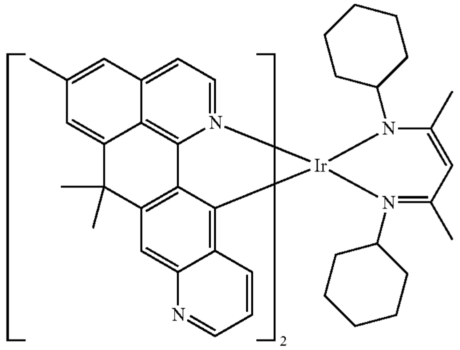
102
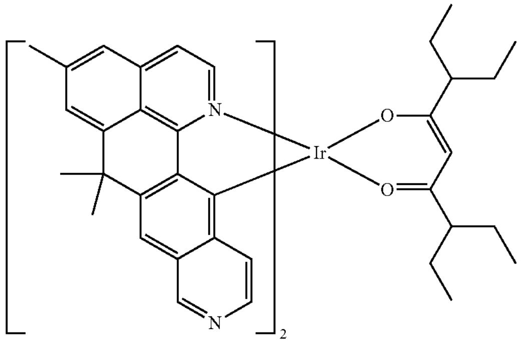
103
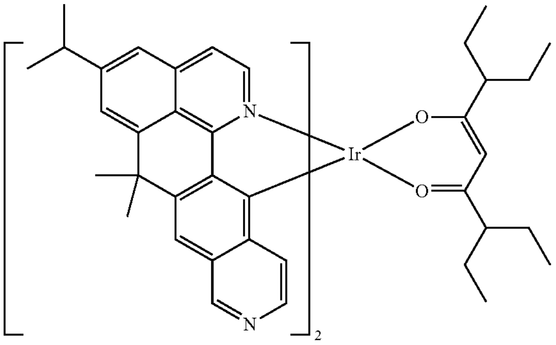
104
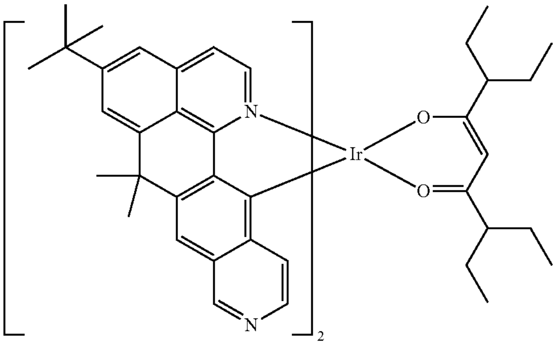

-continued
105
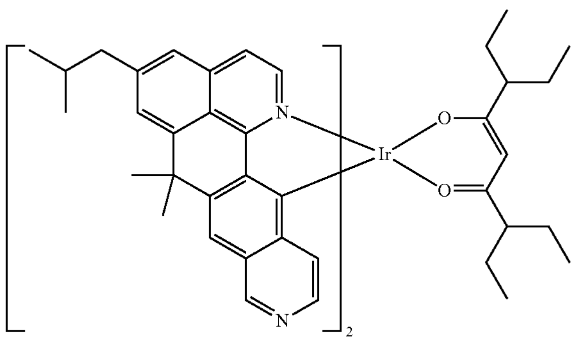
106
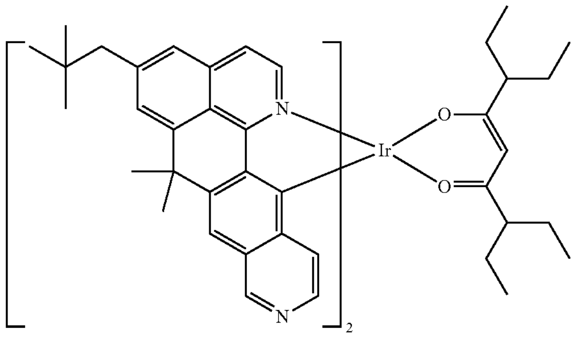
107
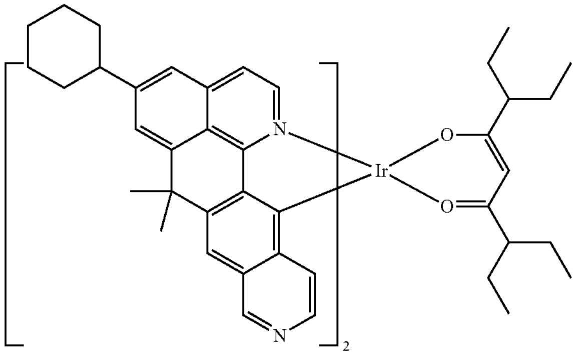
108
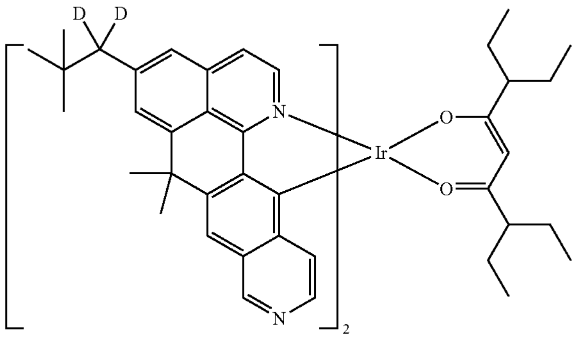
-continued
109
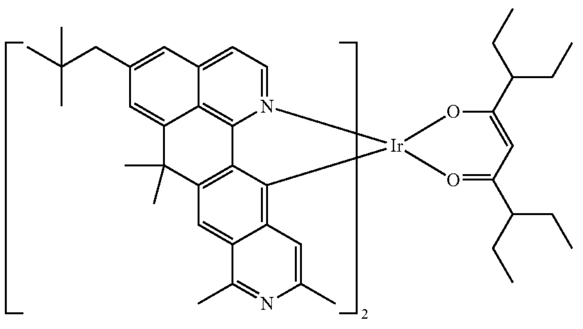
110
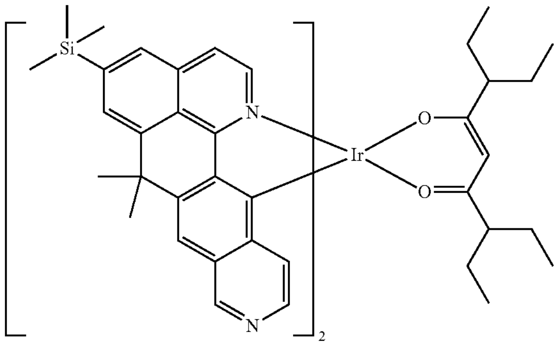
111
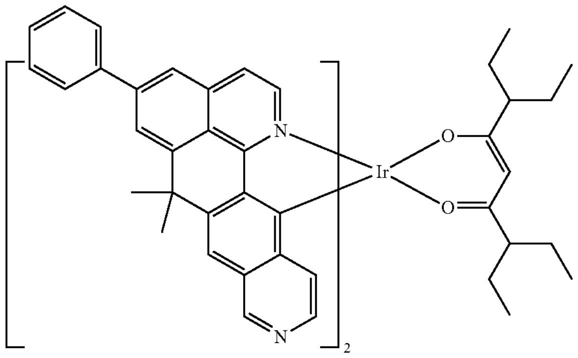
112
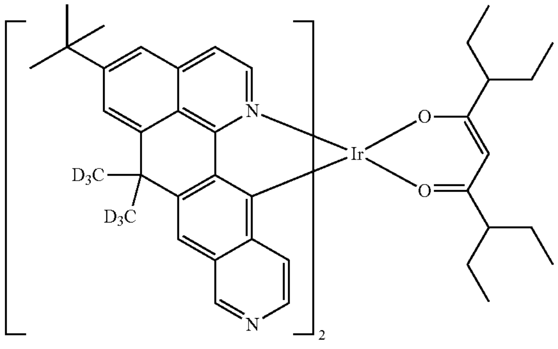

-continued
113
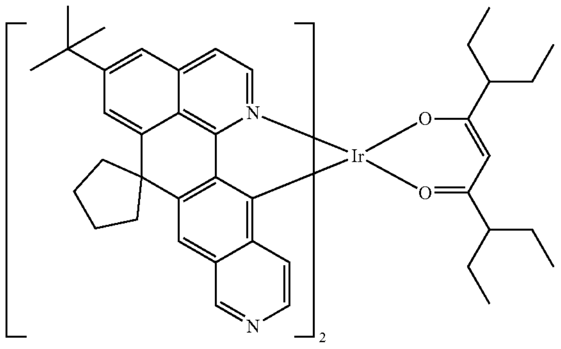
114
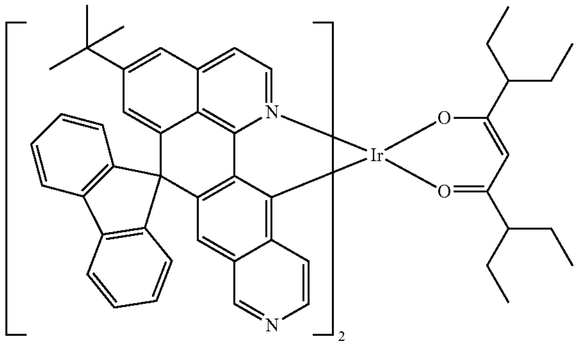
115
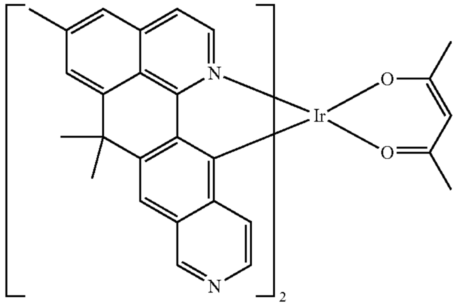
116
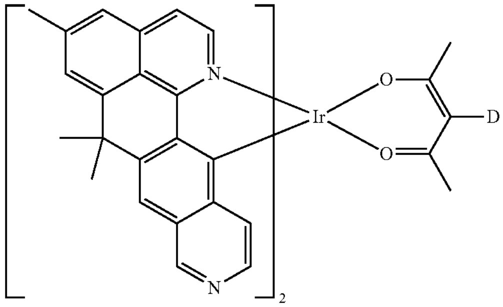
-continued
117
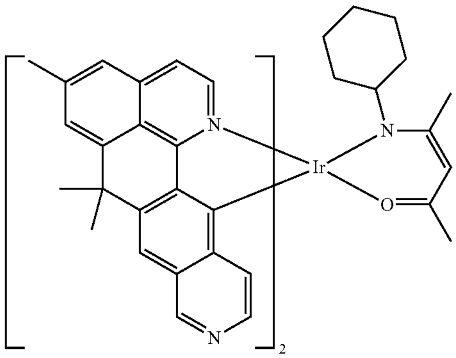
118
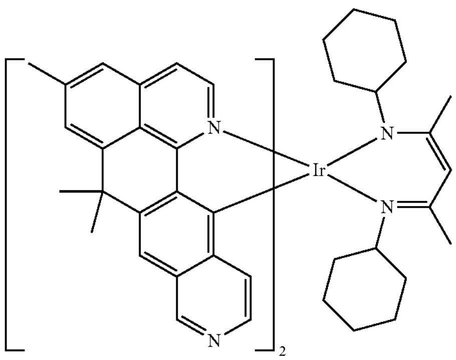
119
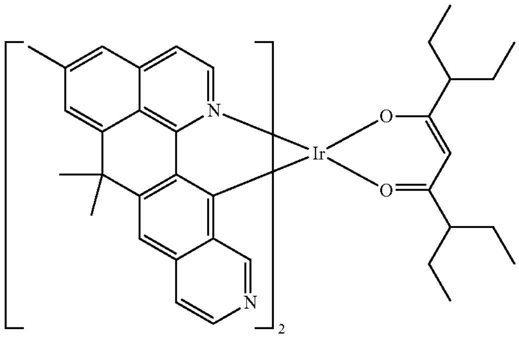
120
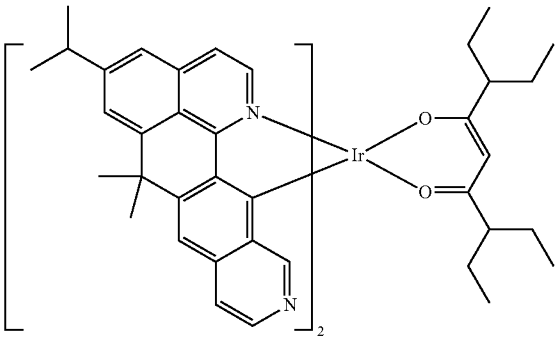

-continued
121
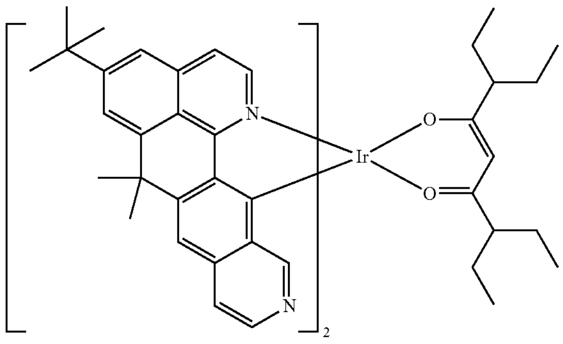
122
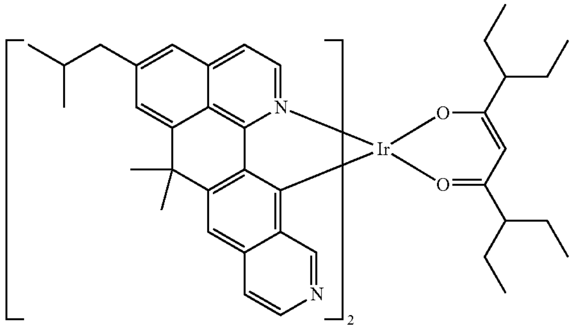
123
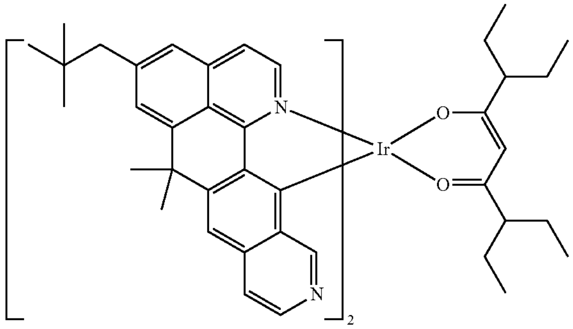
124
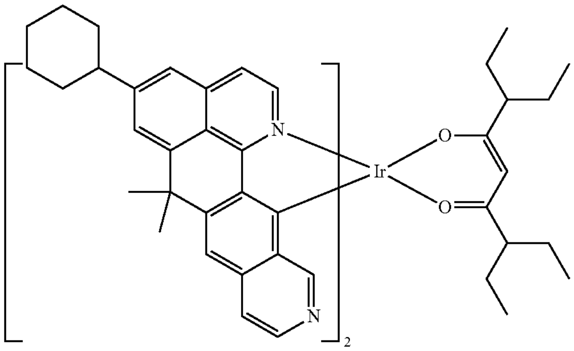
-continued
125
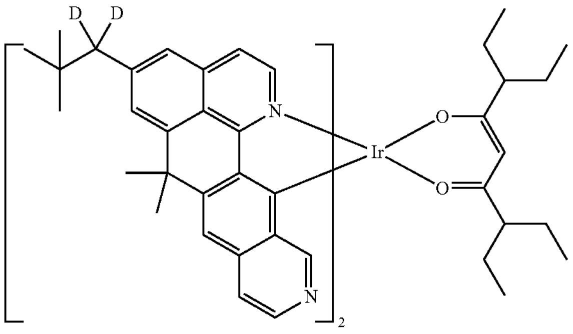
126
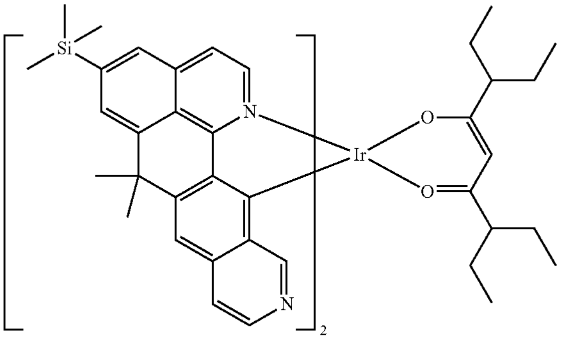
127
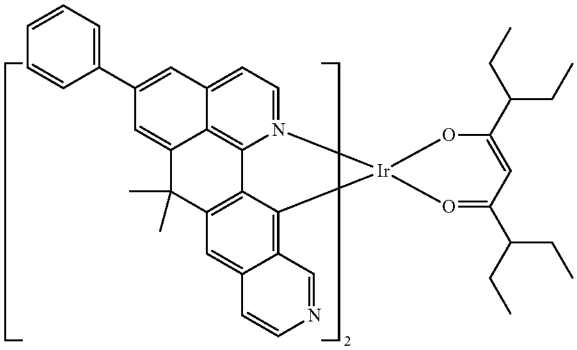
128
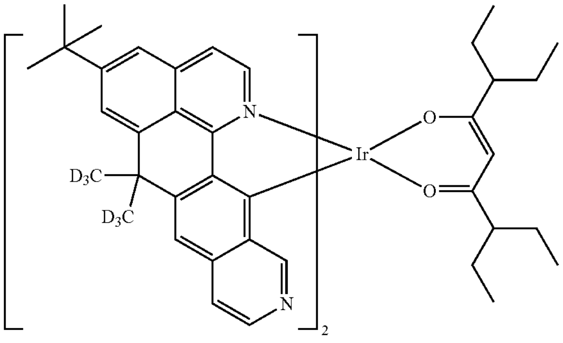

129
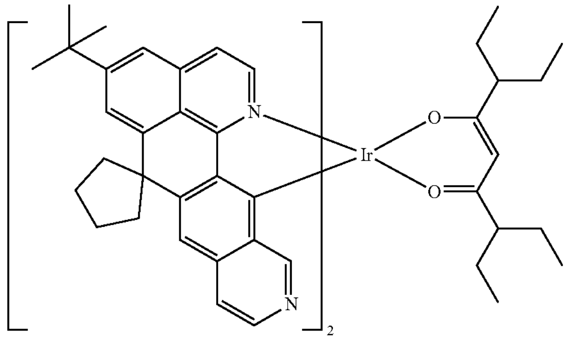
130
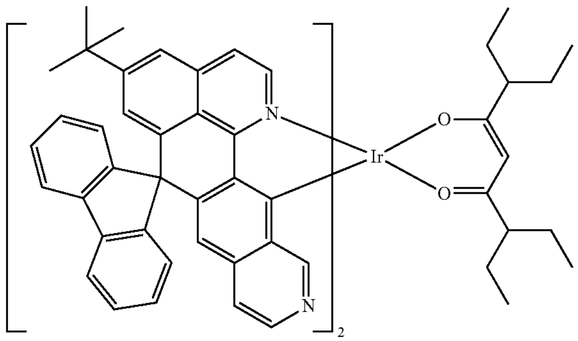
131
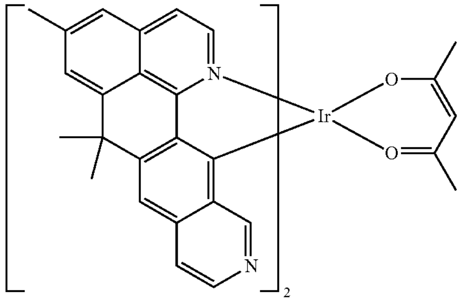
132
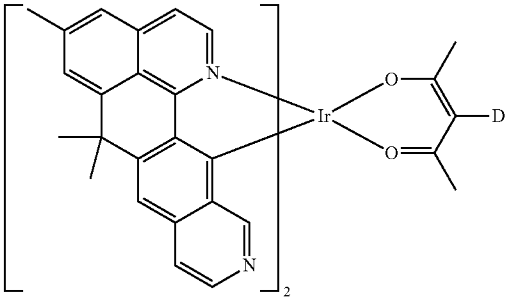
133
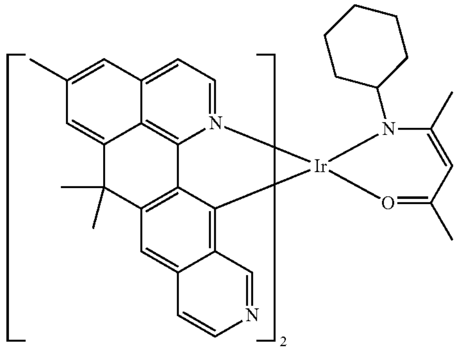
134
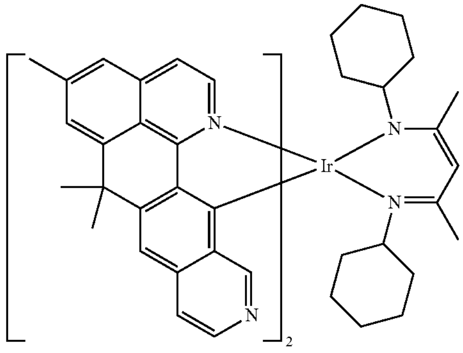
135
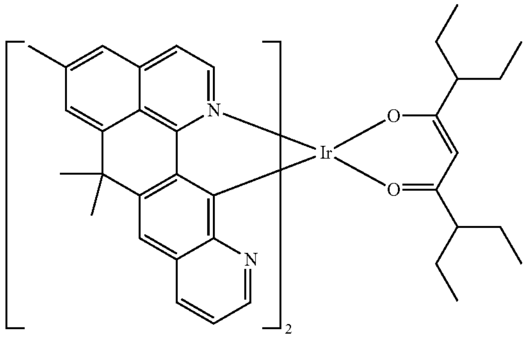
136
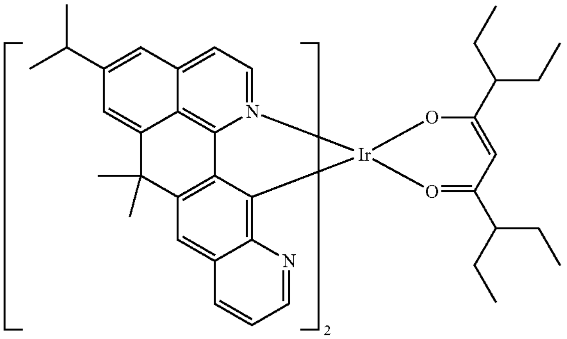

-continued
137
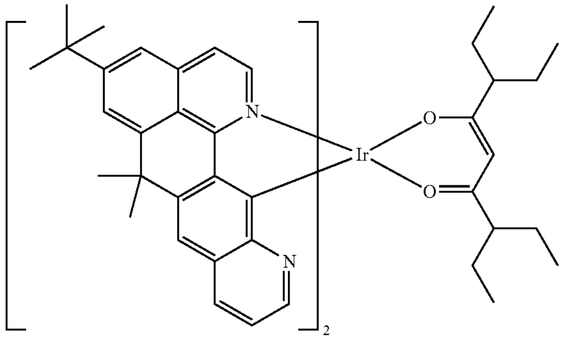
138
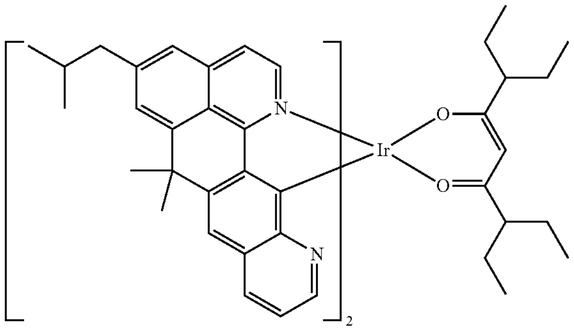
139
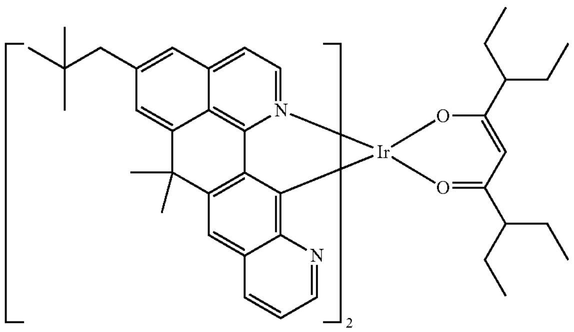
140
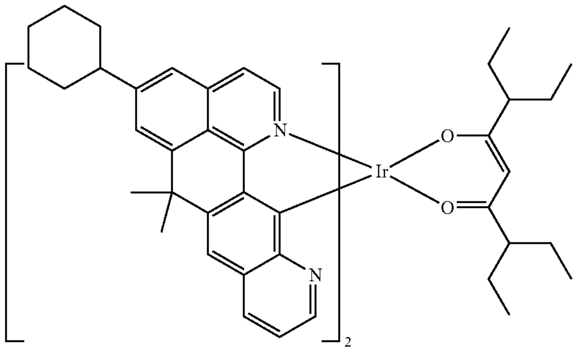
-continued
141
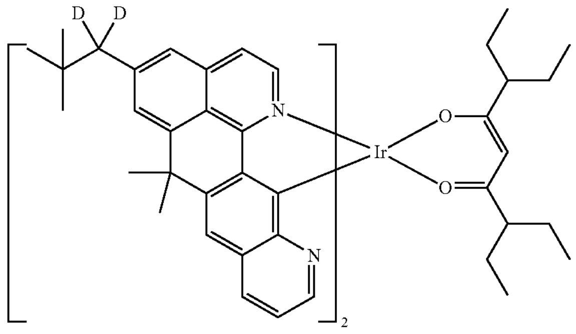
142
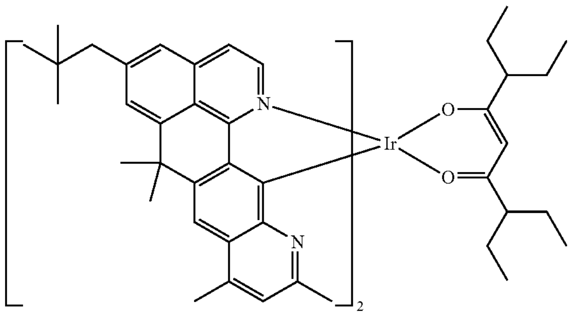
143
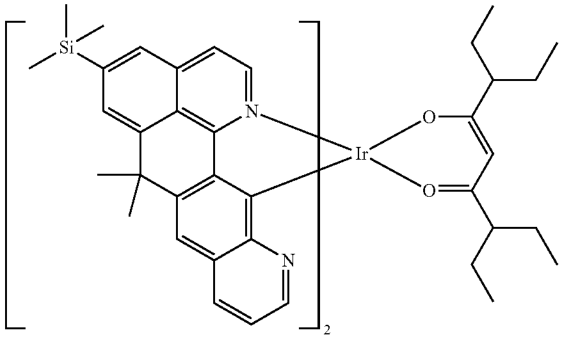
144
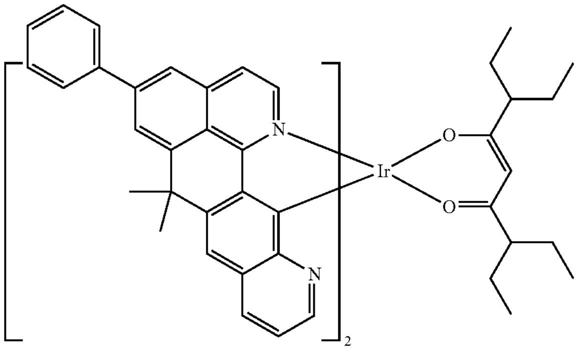

-continued
145
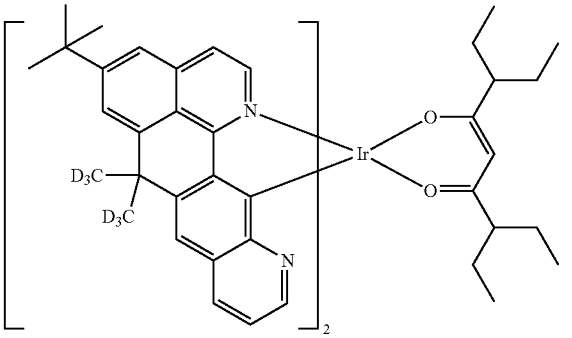
146
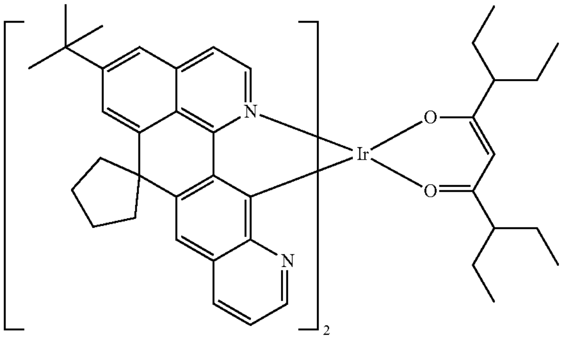
147
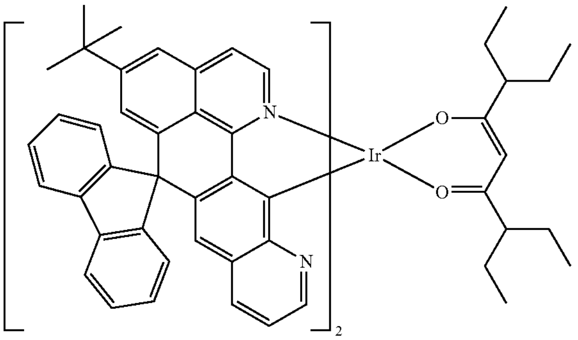
148
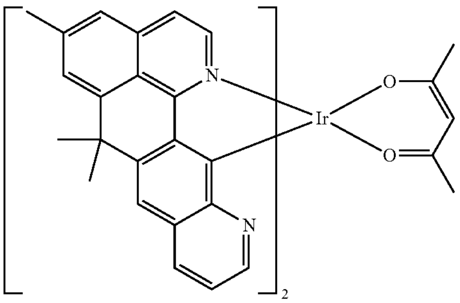
-continued
149
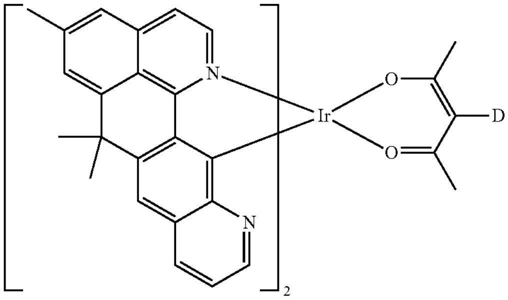
150
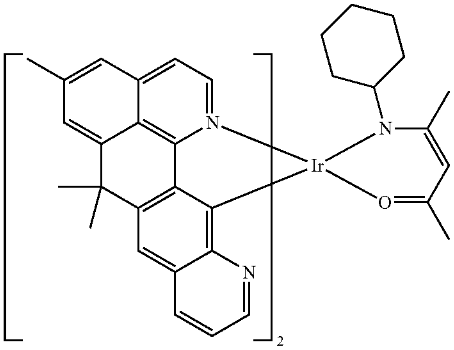
151
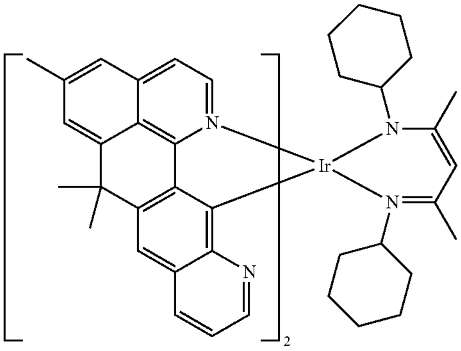
152
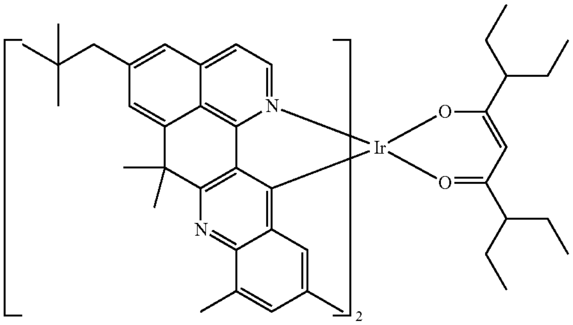

-continued
153
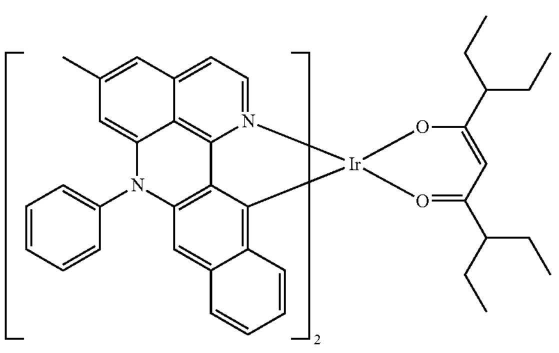
154
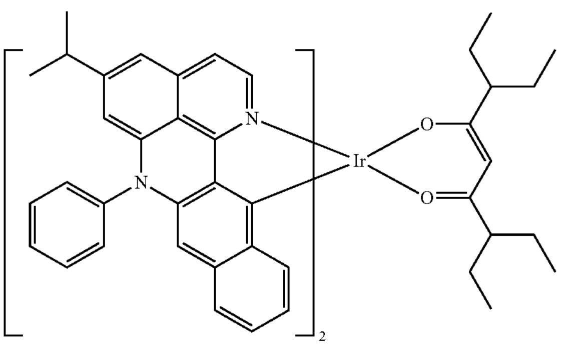
155
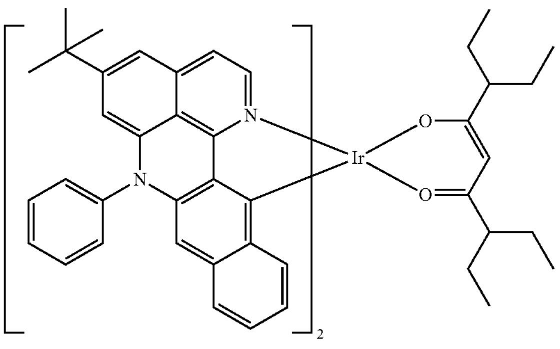
156
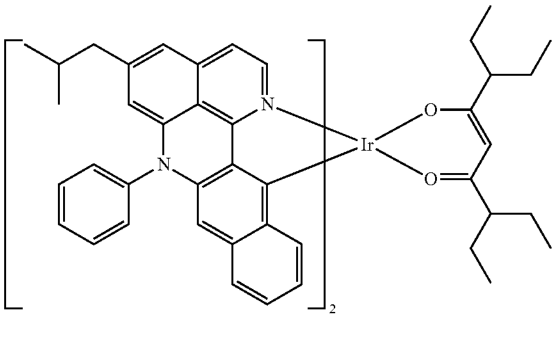
-continued
157
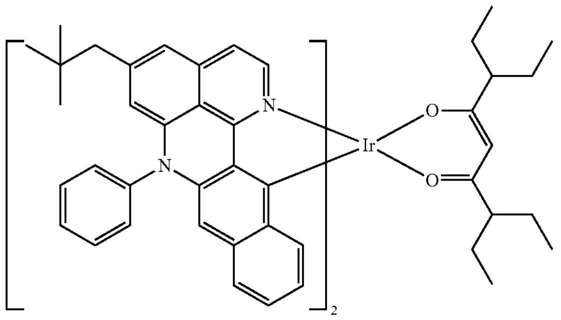
158
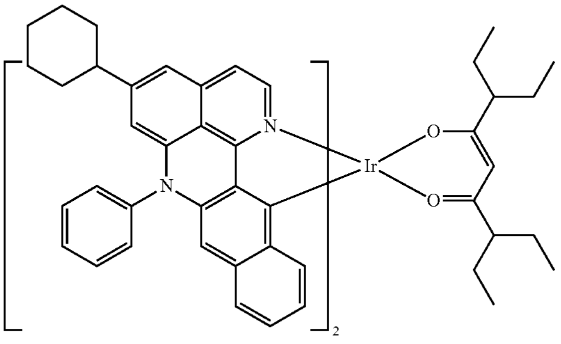
159
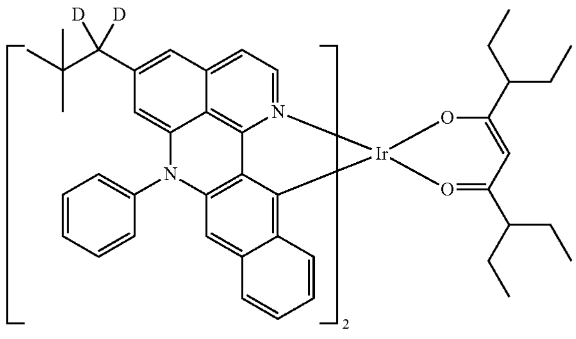
160
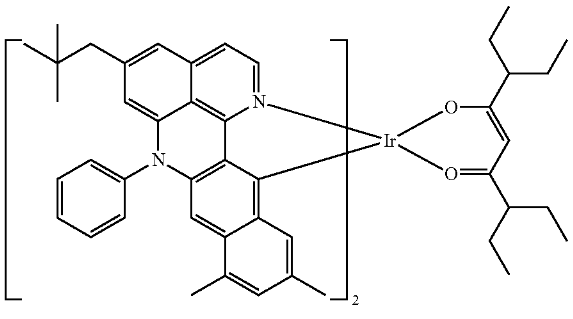

-continued
161
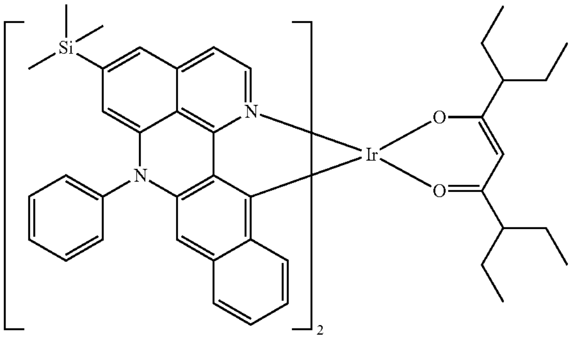
162
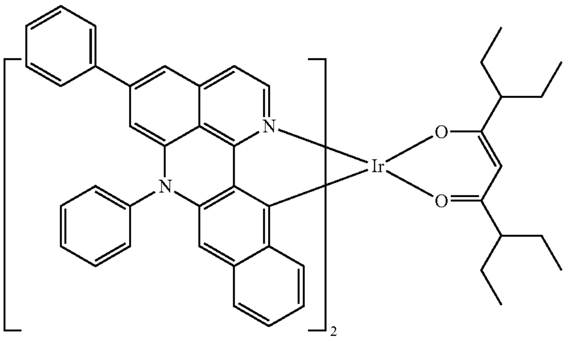
163
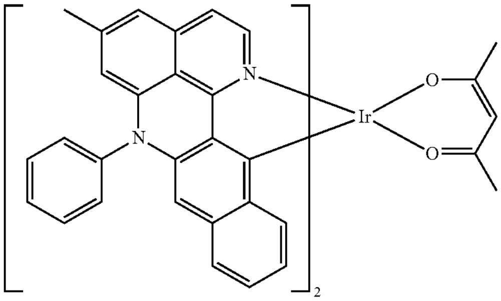
164
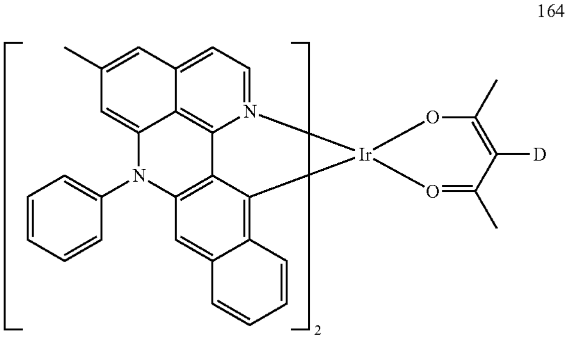
-continued
165
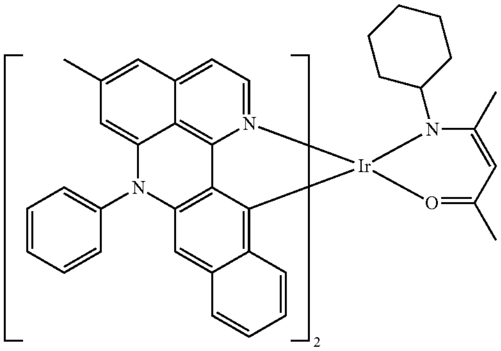
166
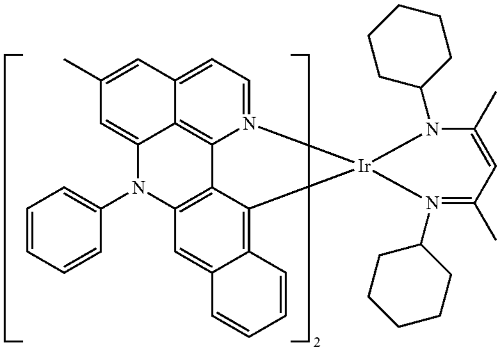
167
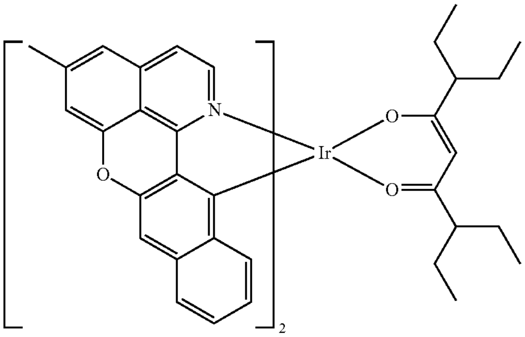
168
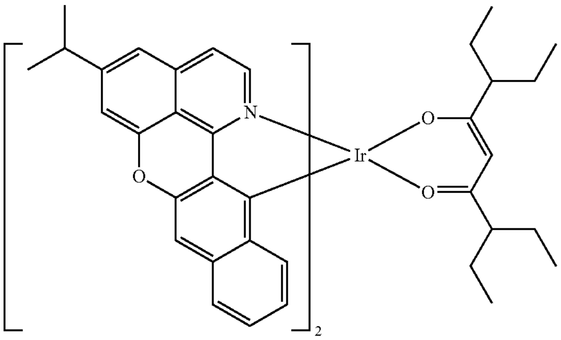

-continued
169
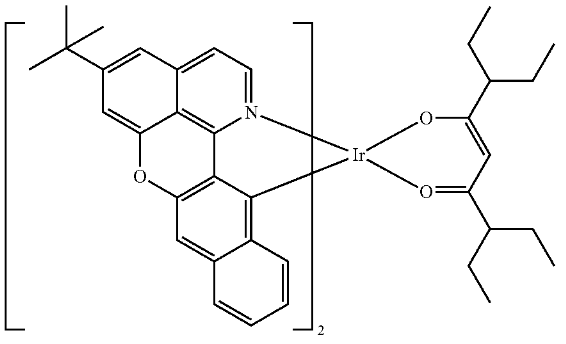
170
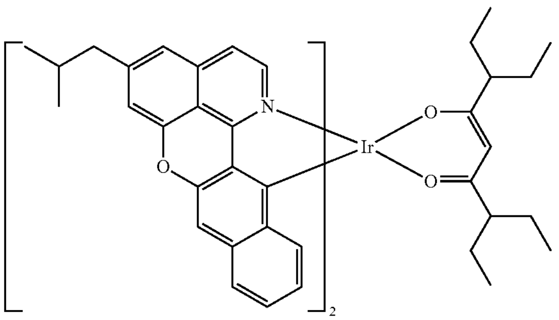
171
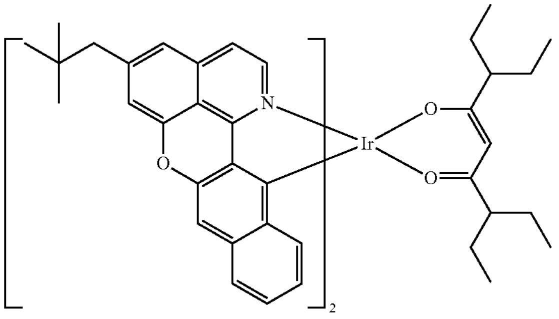
172
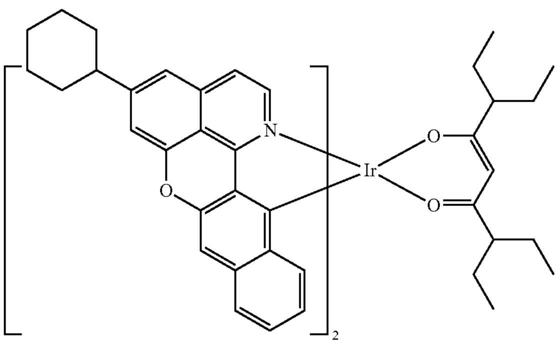
-continued
173
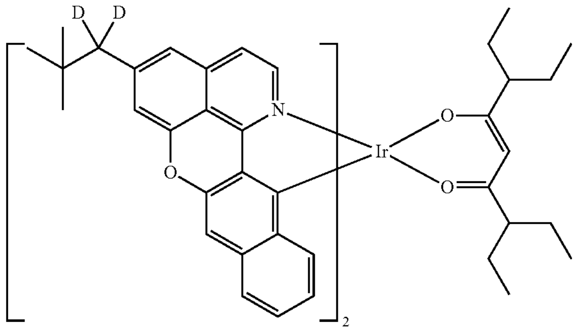
174
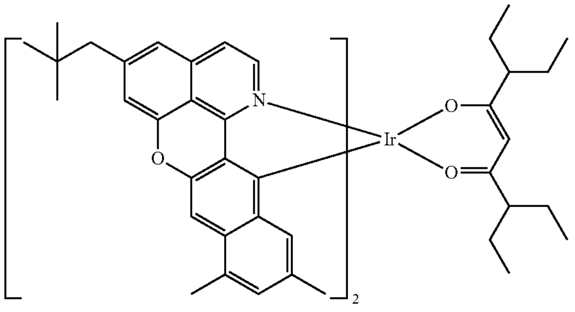
175
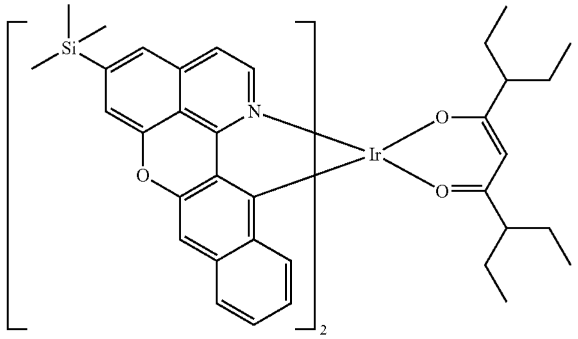
176
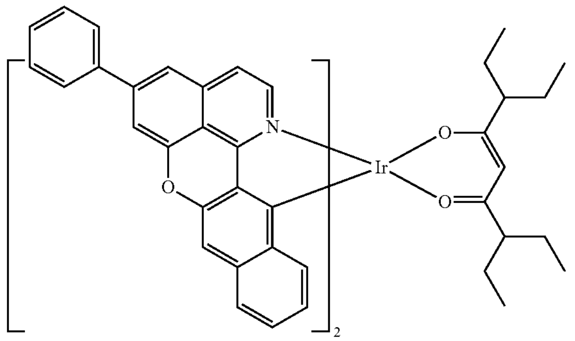

-continued
177
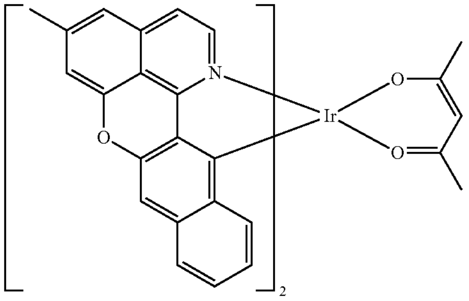
178
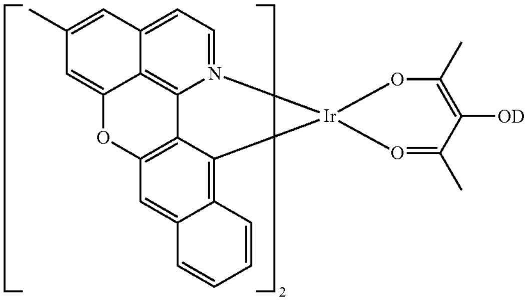
179
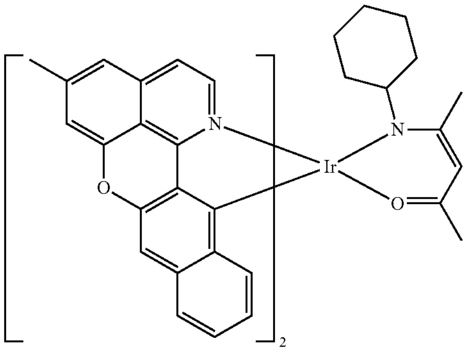
180
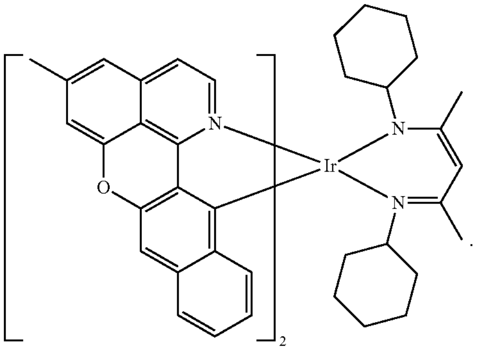
An organic metal compound having the structure of Formula 9 may include the following compounds 181-360 of Formula 13:
[Formula 13]
181
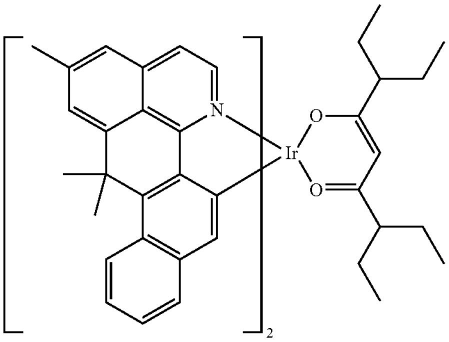
182
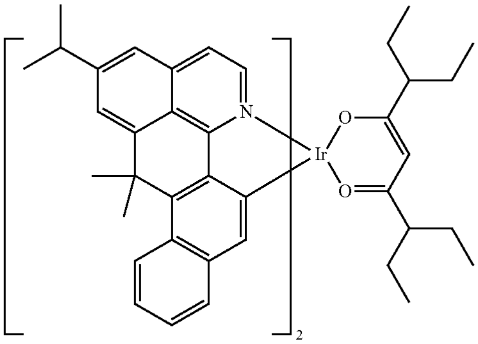
183
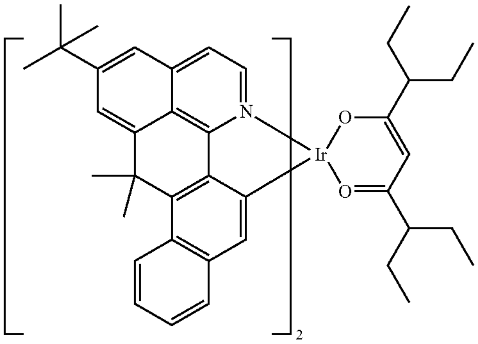
184
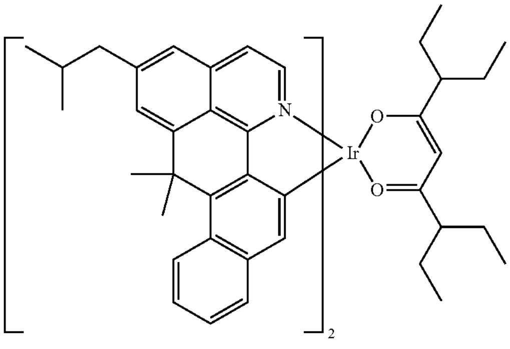

-continued
185
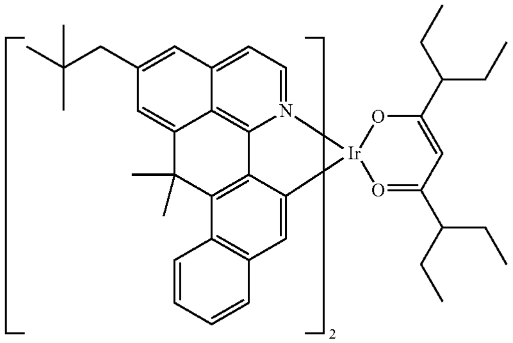
186
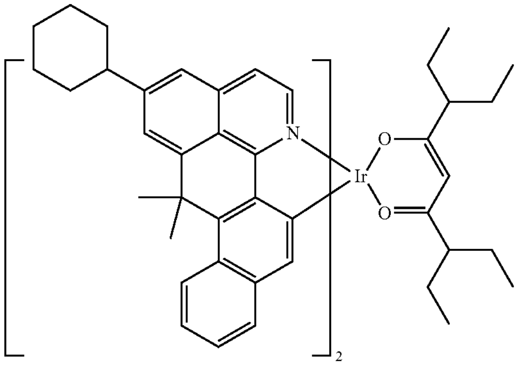
187
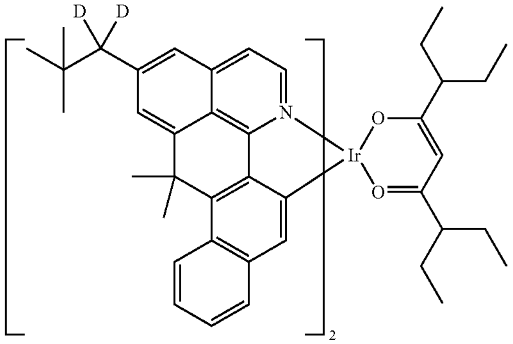
188
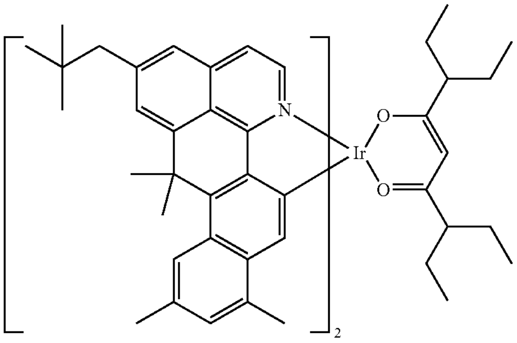
-continued
189
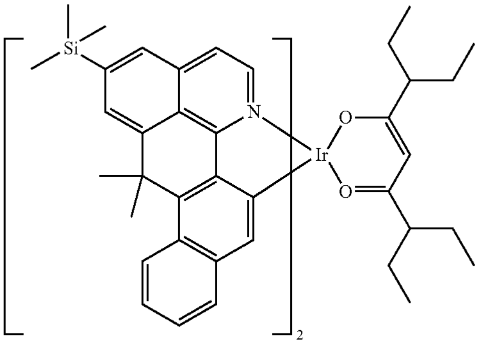
190
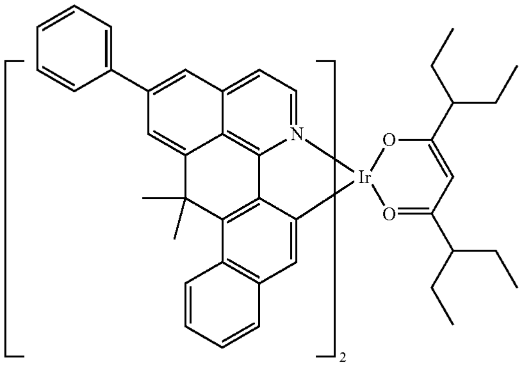
191
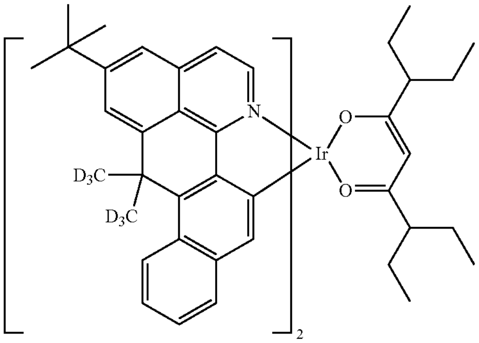
192
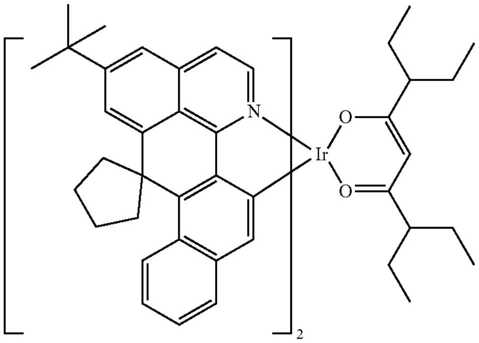

-continued
193
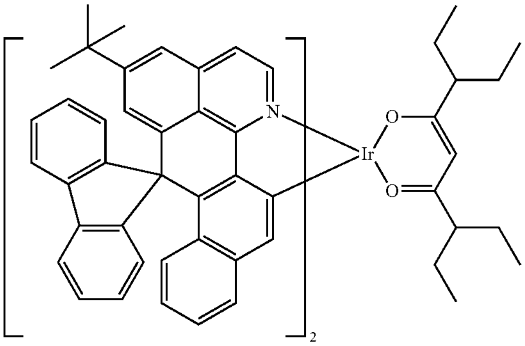
194
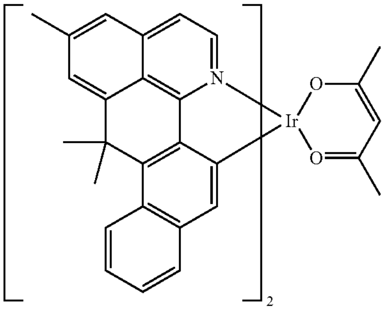
195
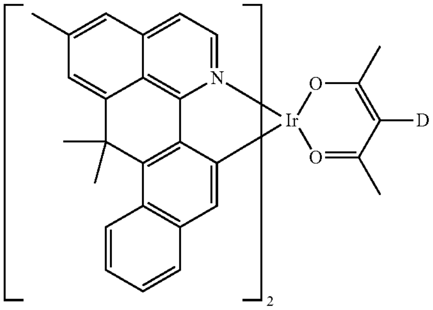
196
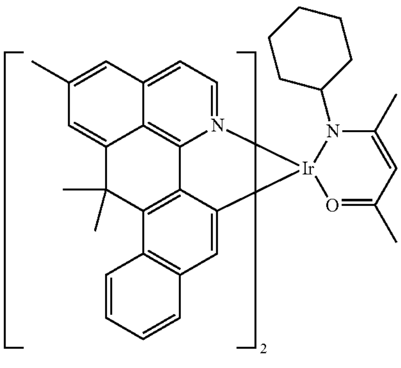
-continued
197
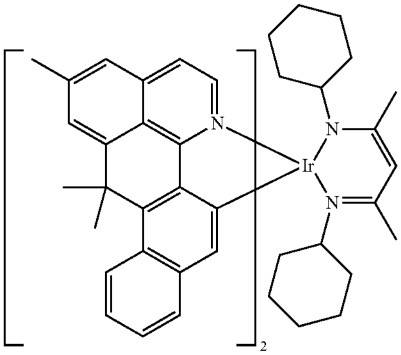
198
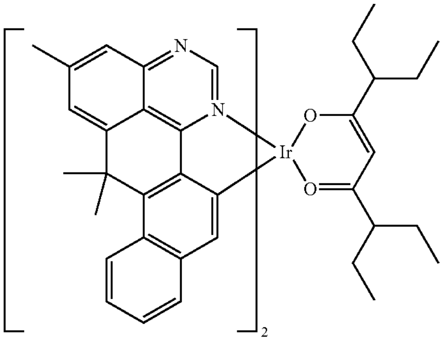
199
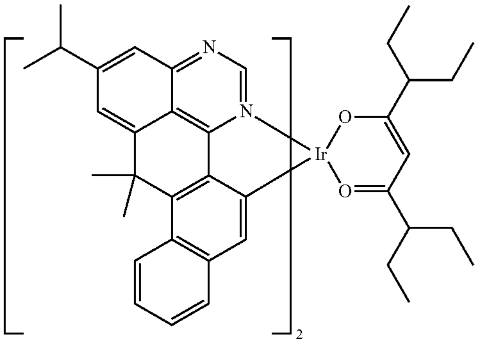
200
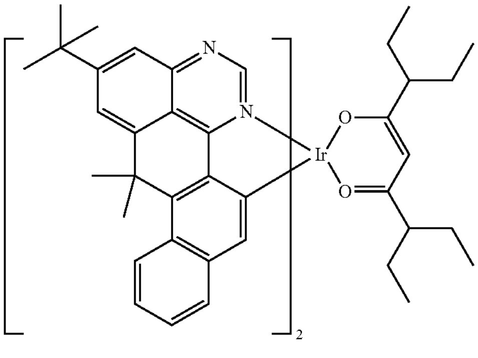

-continued
201
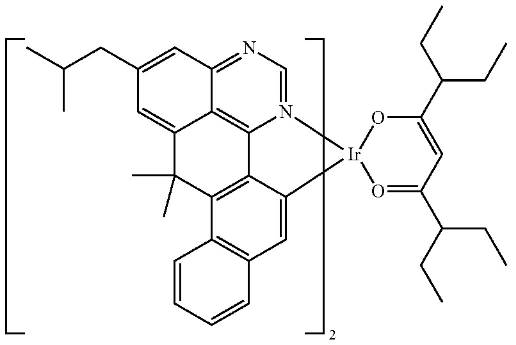
202
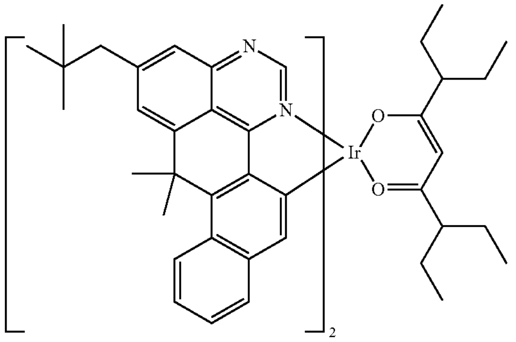
203
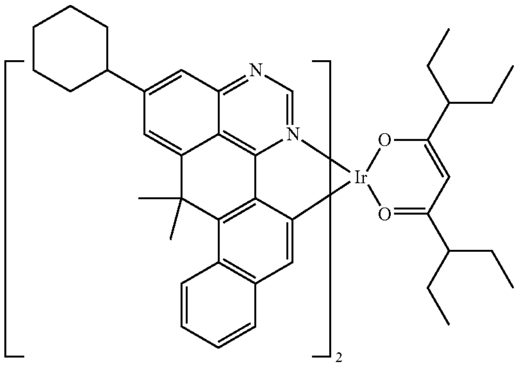
204
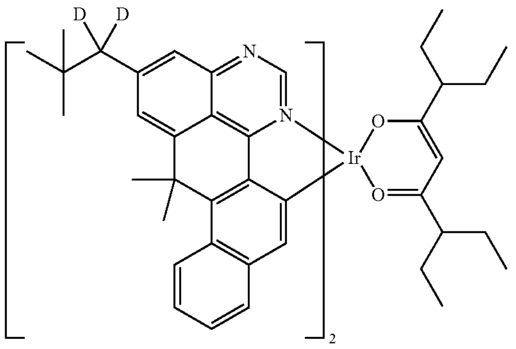
-continued
205
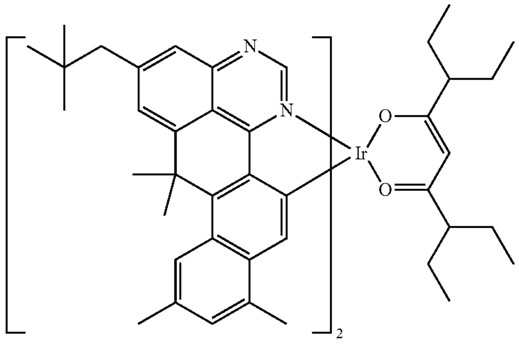
206
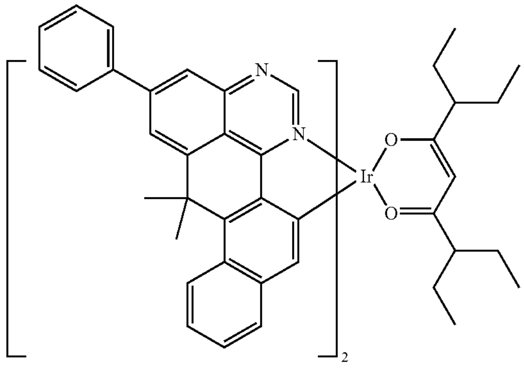
207
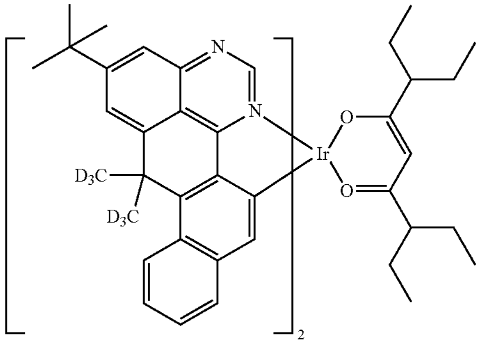
208
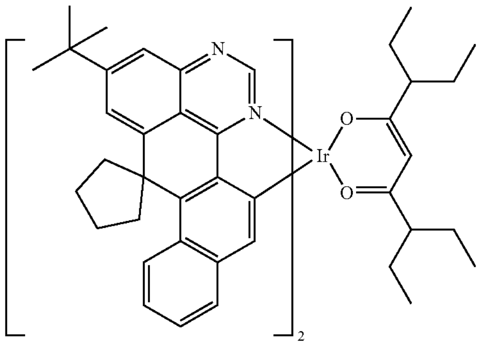

-continued
209
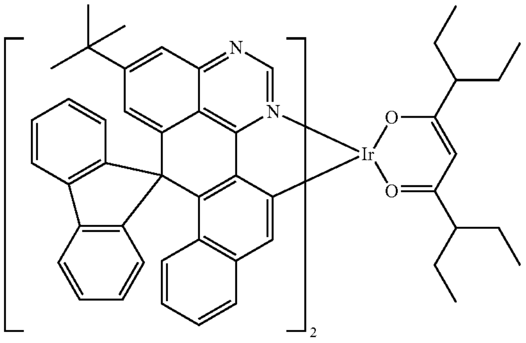
210
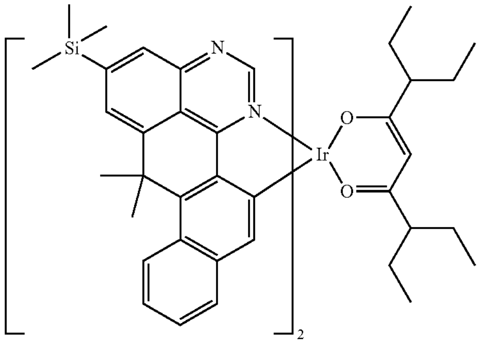
211
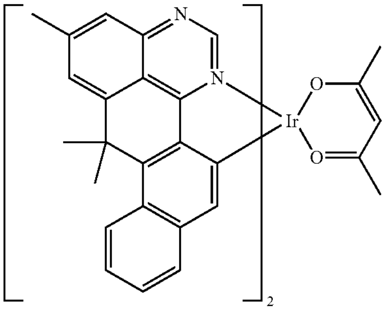
212
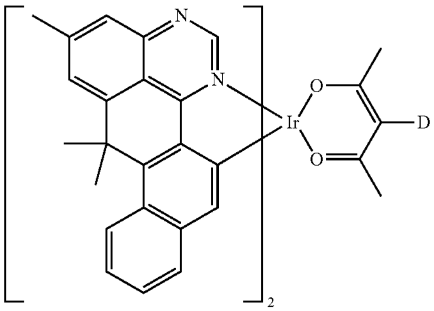
-continued
213
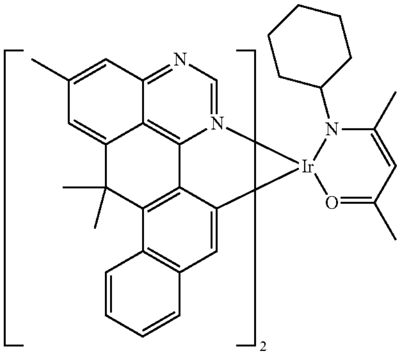
214
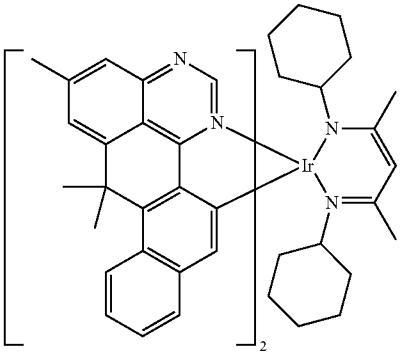
215
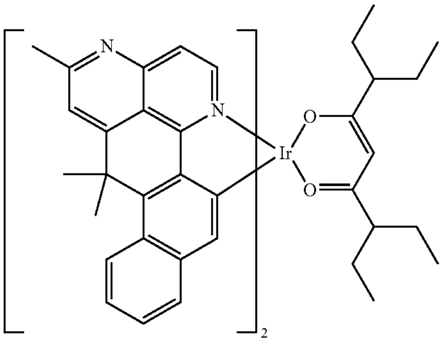
216
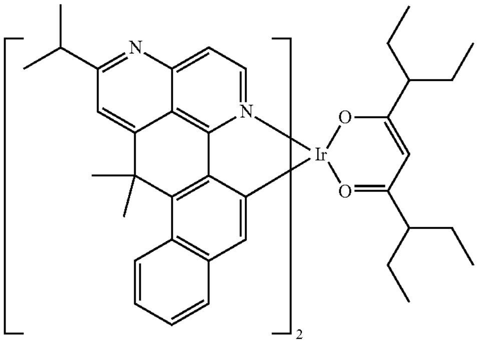

-continued
217
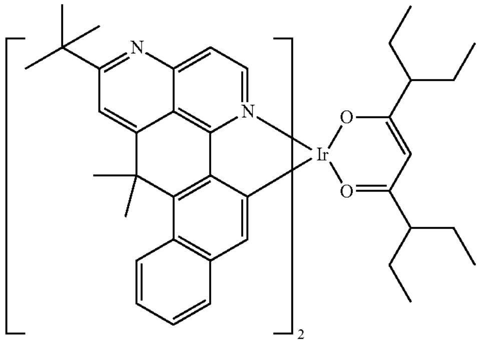
218
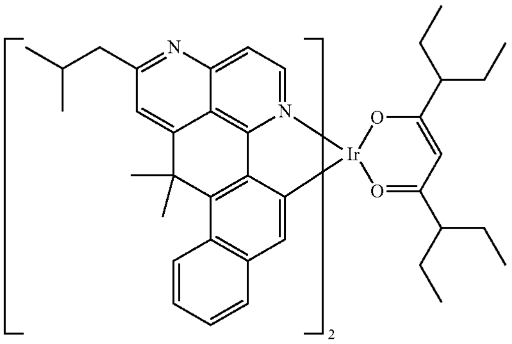
219
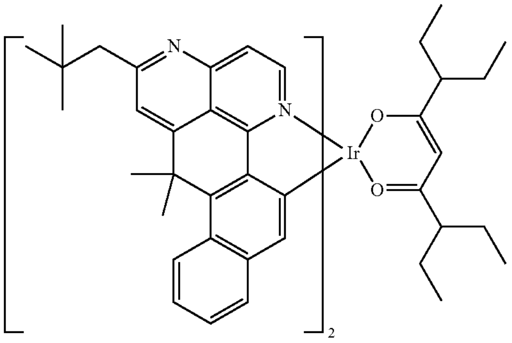
220
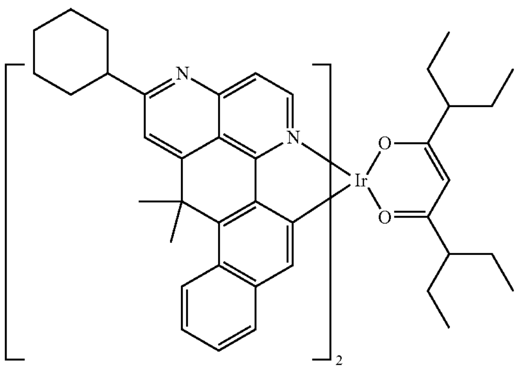
-continued
221
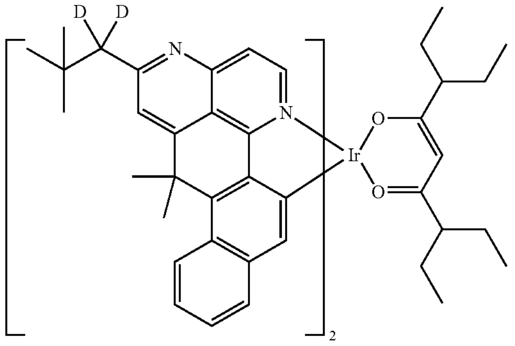
222
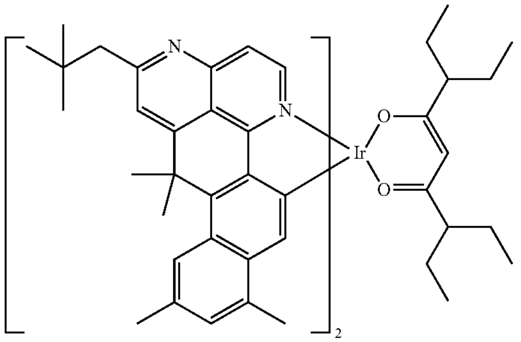
223
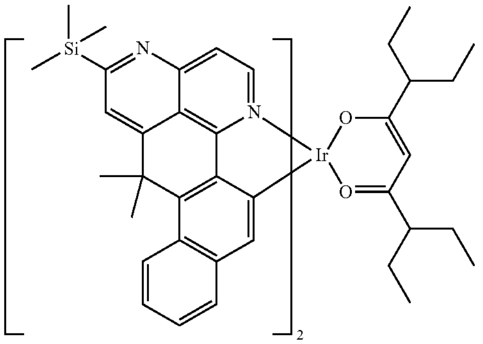
224
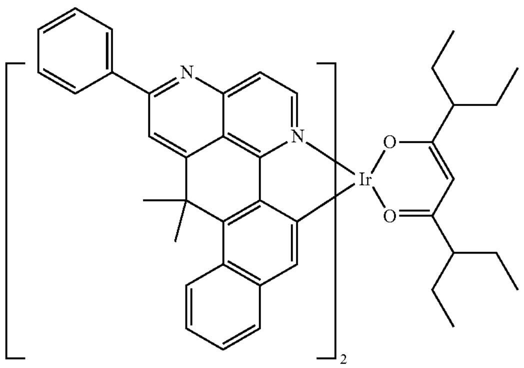

-continued
225
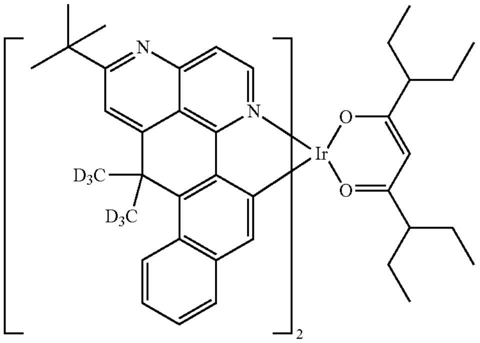
226
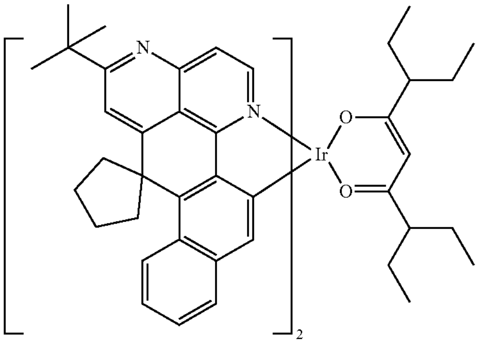
227
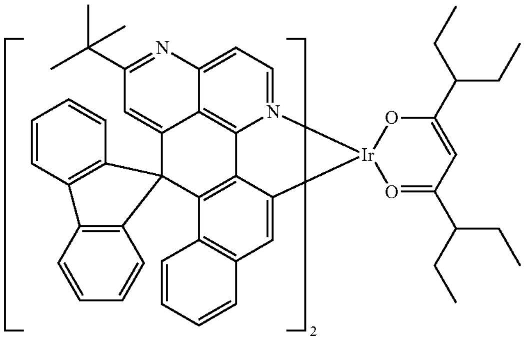
228
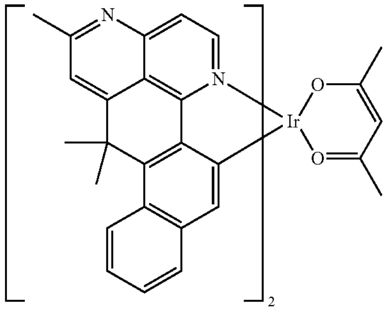
-continued
229
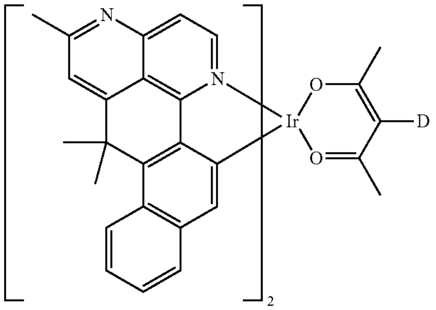
230
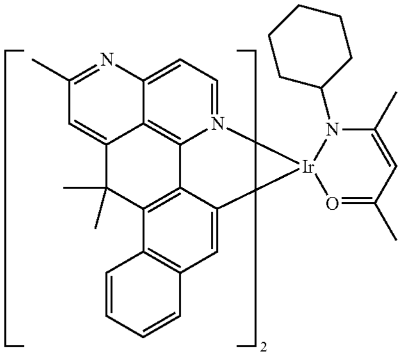
231
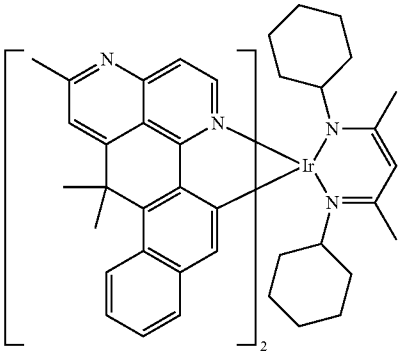
232
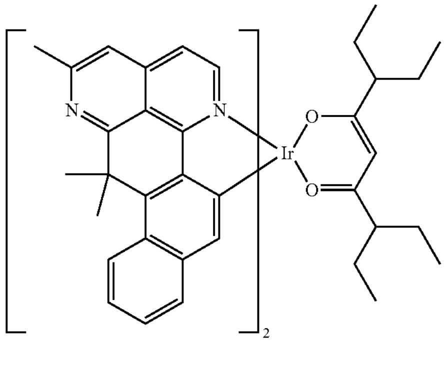

-continued
233
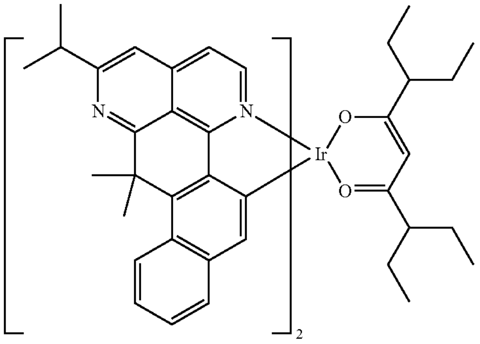
234
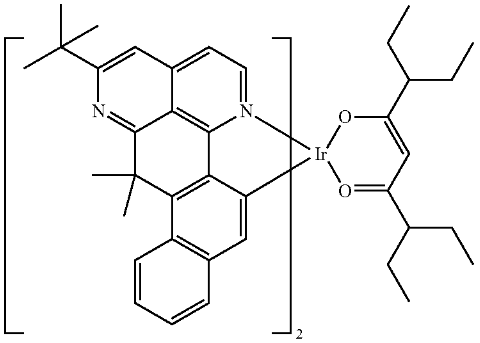
235
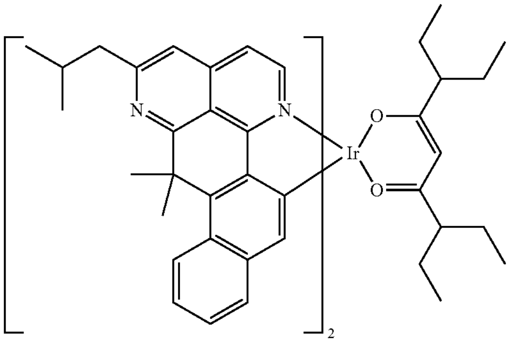
236
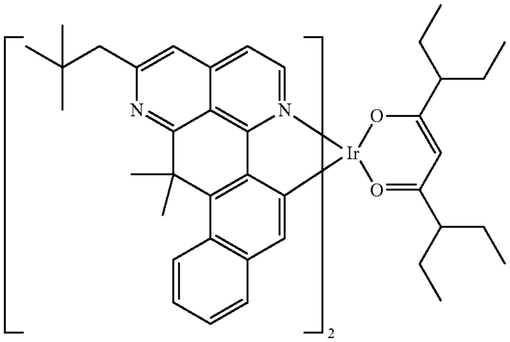
-continued
237
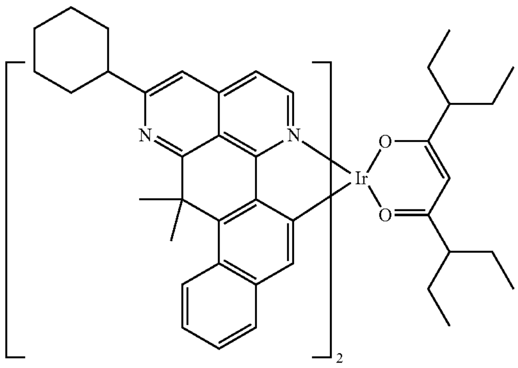
238
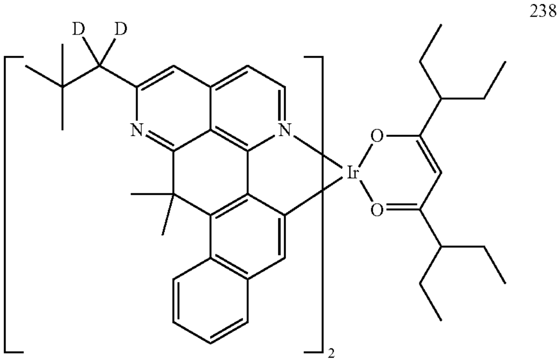
239
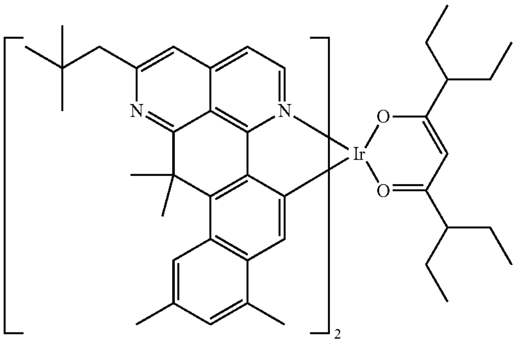
240
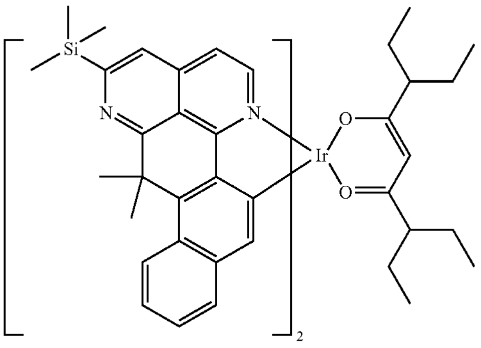

-continued
241
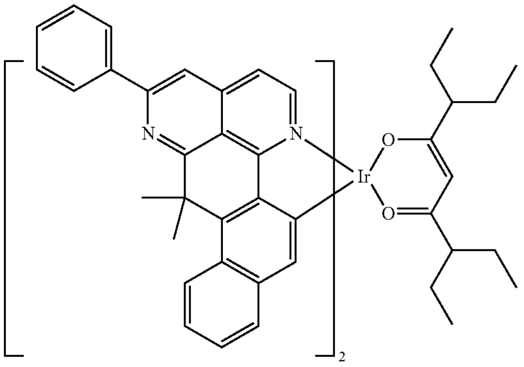
242
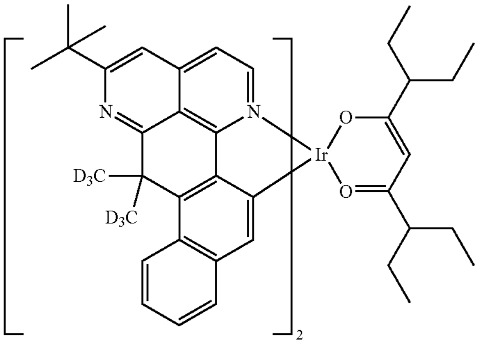
243
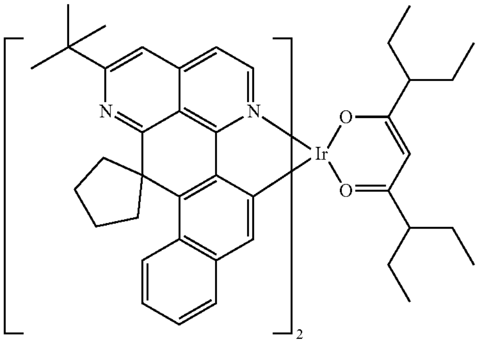
244
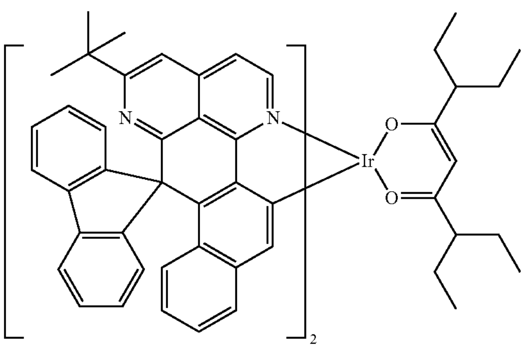
-continued
245
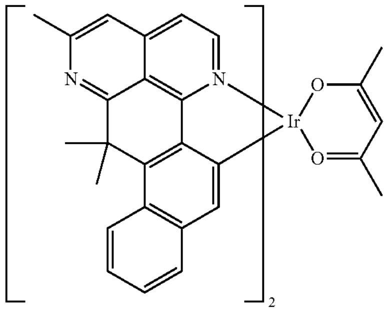
246
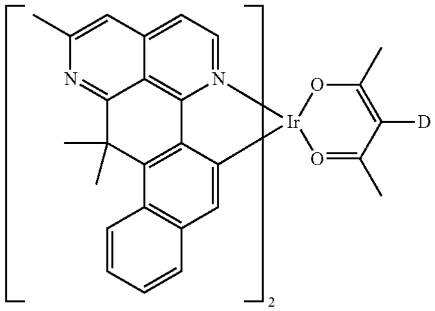
247
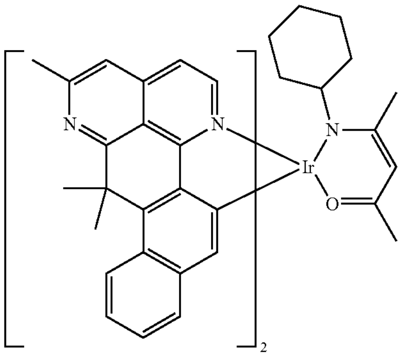
248
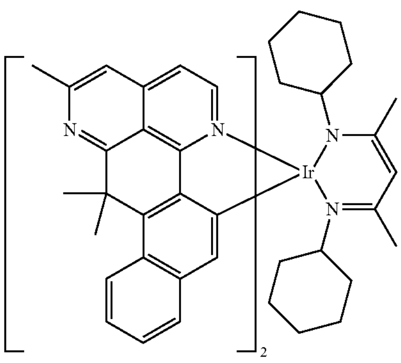

-continued
249
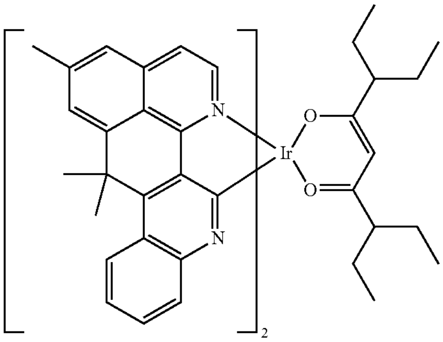
250
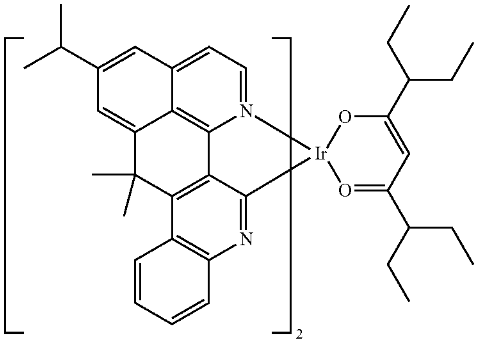
251
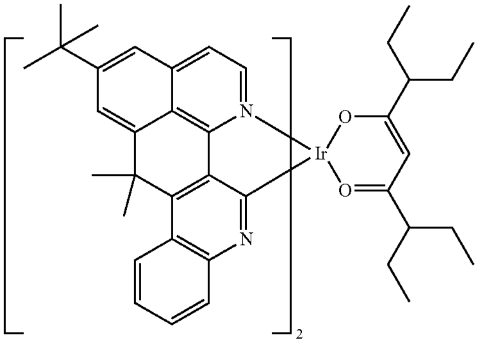
252
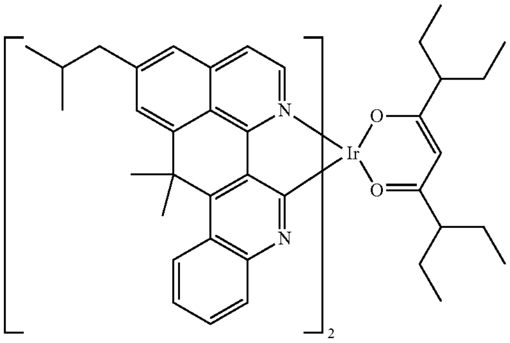
-continued
253
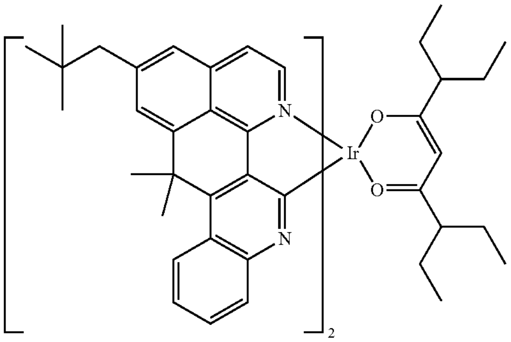
254
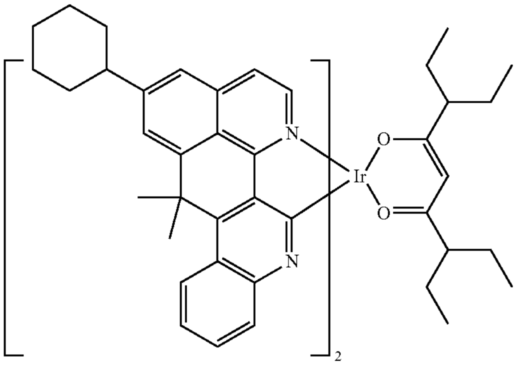
255
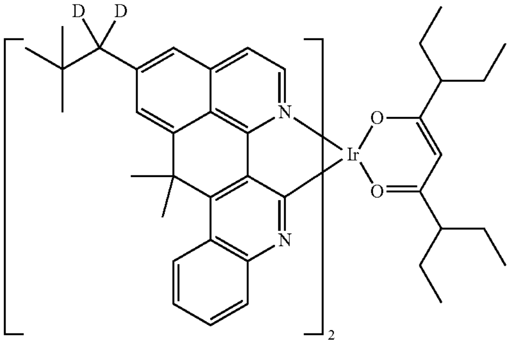
256
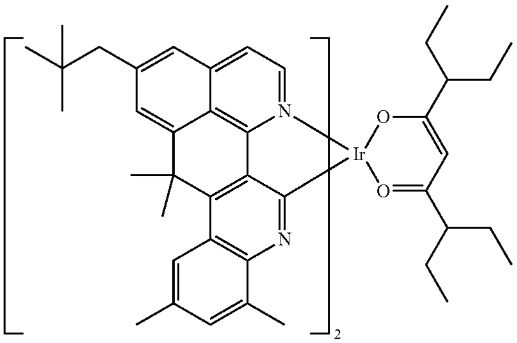

-continued
257
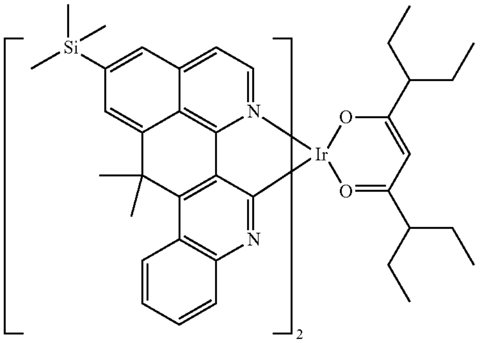
258
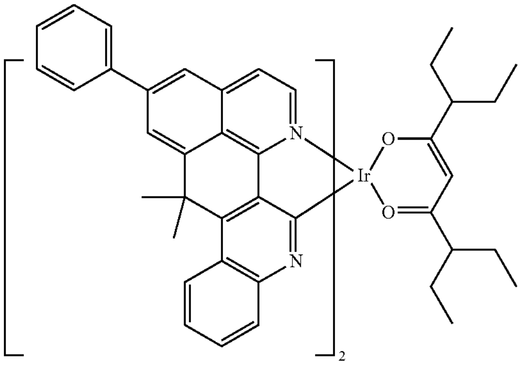
259
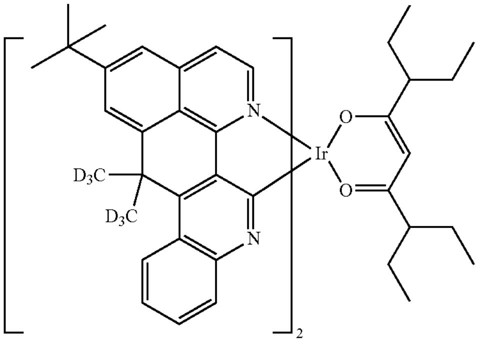
260
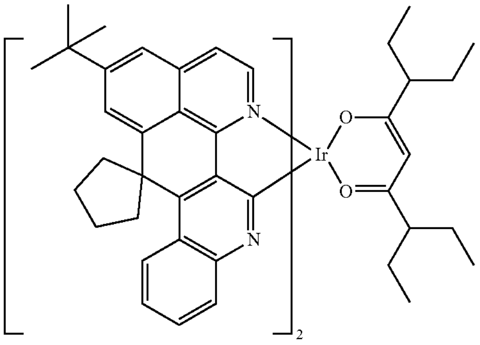
-continued
261
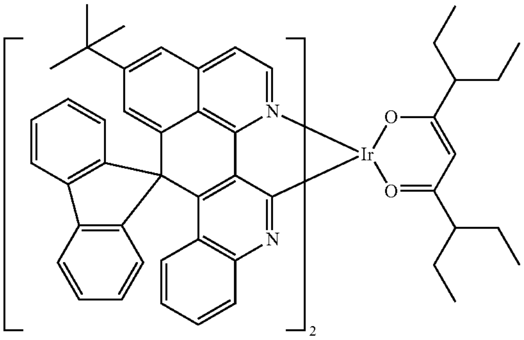
262
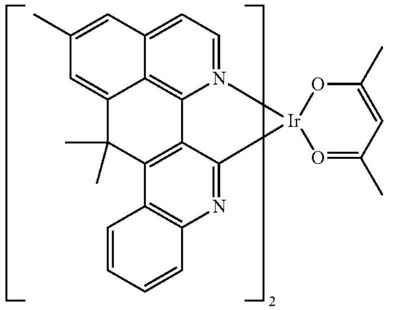
263
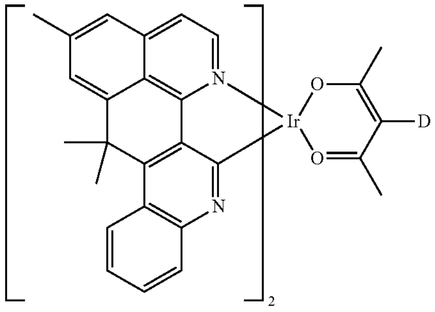
264
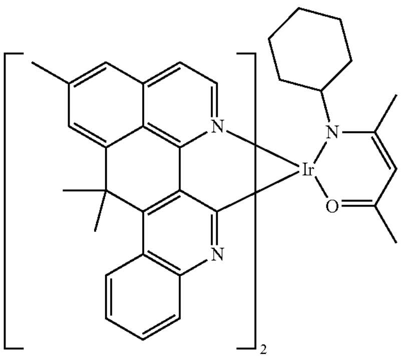

-continued
265
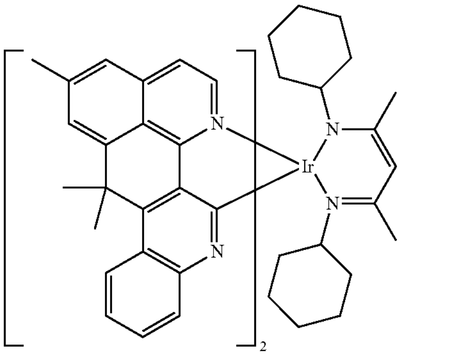
266
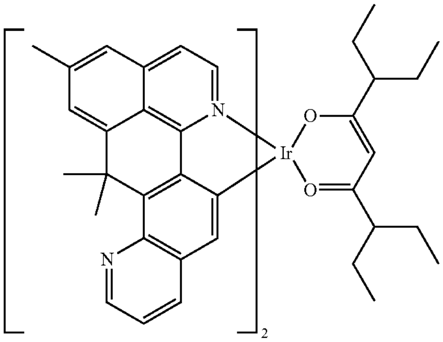
267
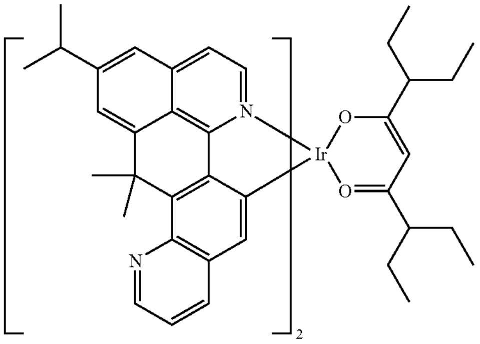
268
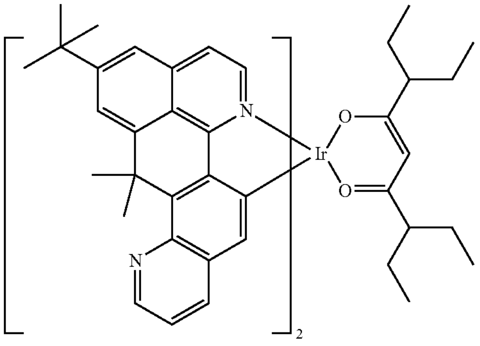
-continued
269
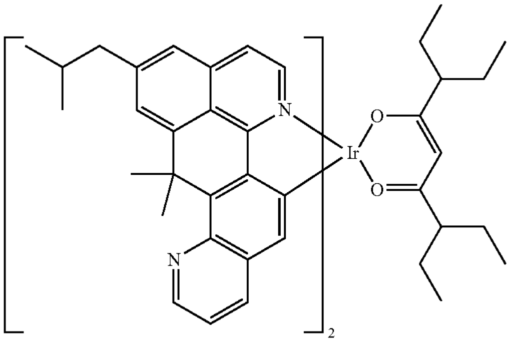
270
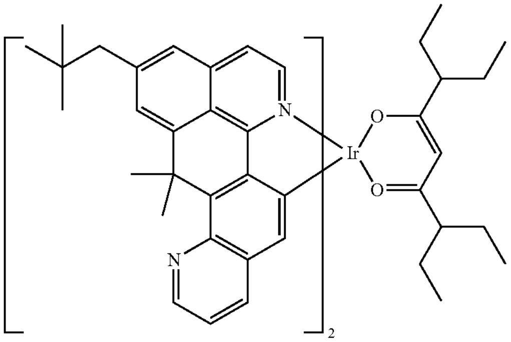
271
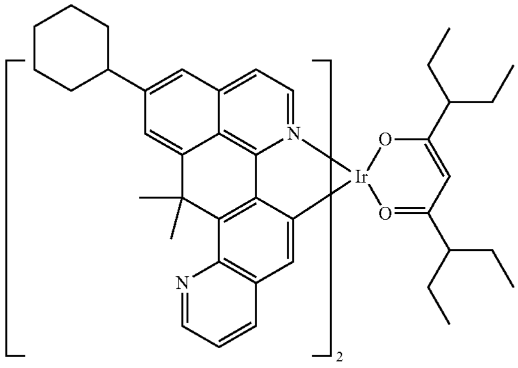
272
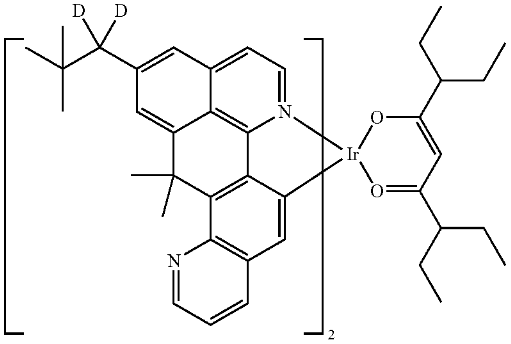

-continued
273
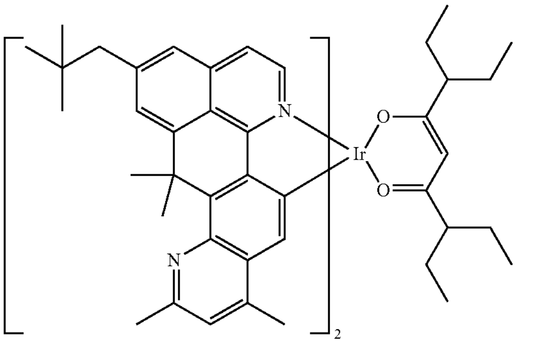
274
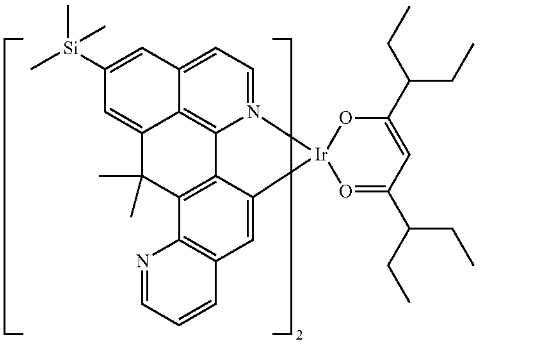
275
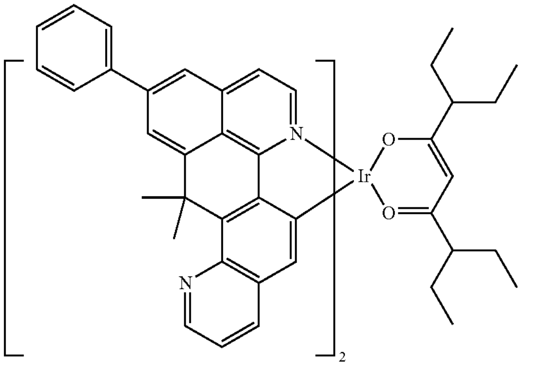
276
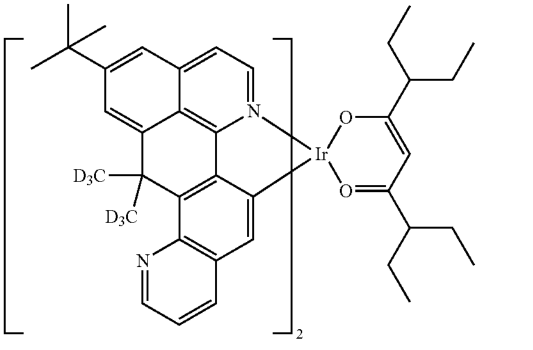
-continued
277
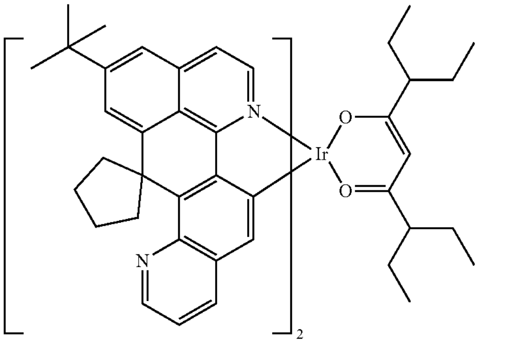
278
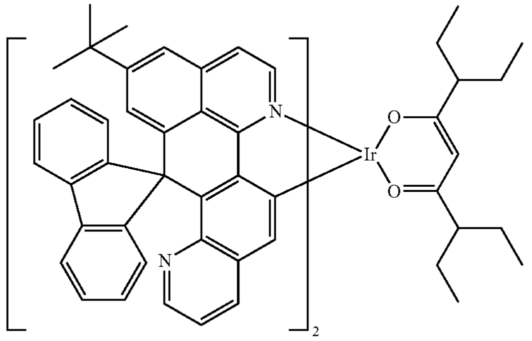
279
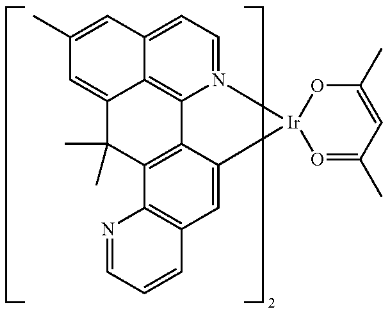
280
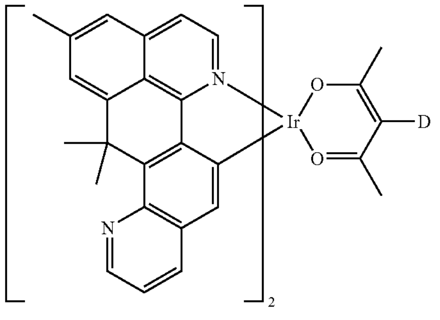

-continued
281
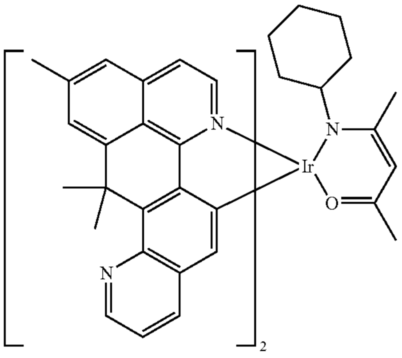
282
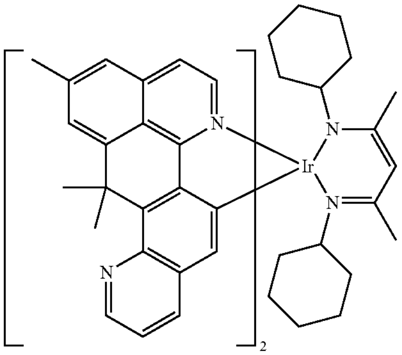
283
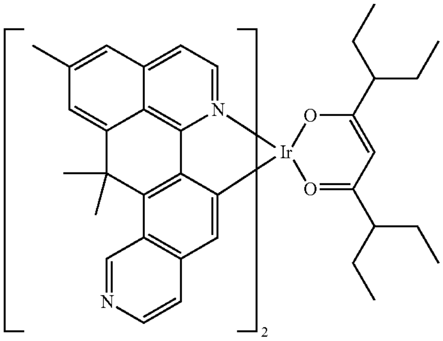
284
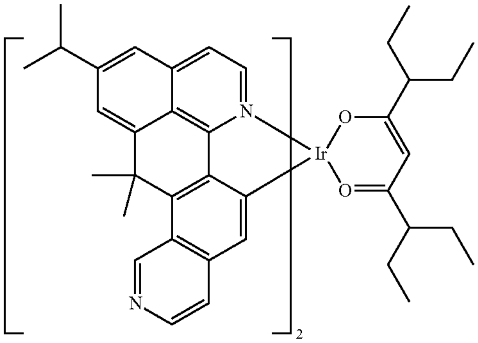
-continued
285
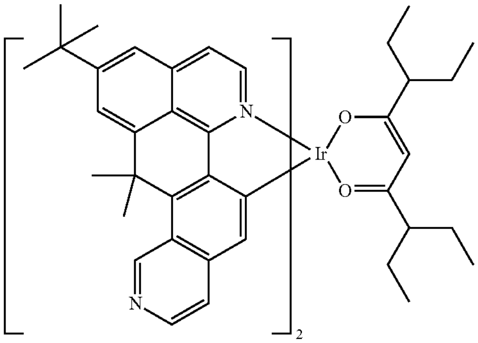
286
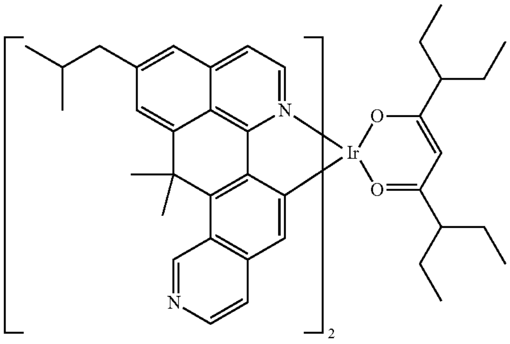
287
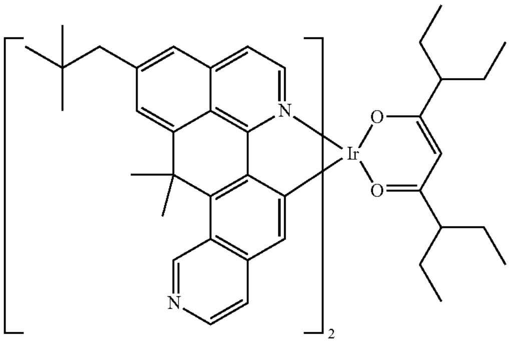
288
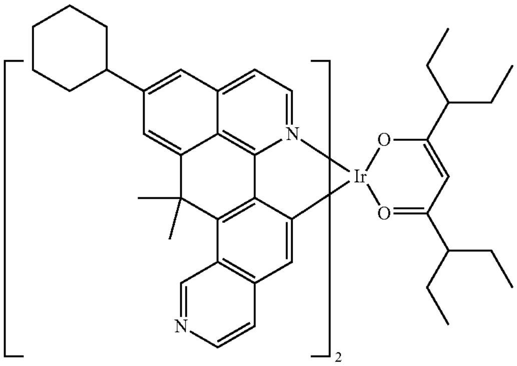

-continued
277
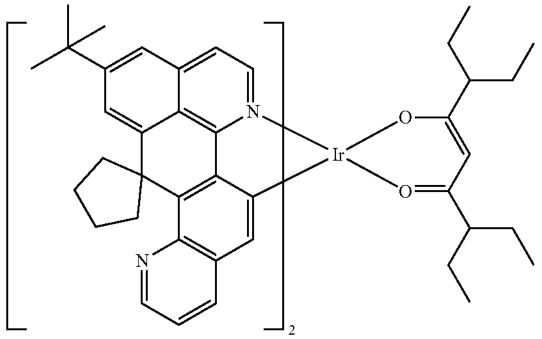
278
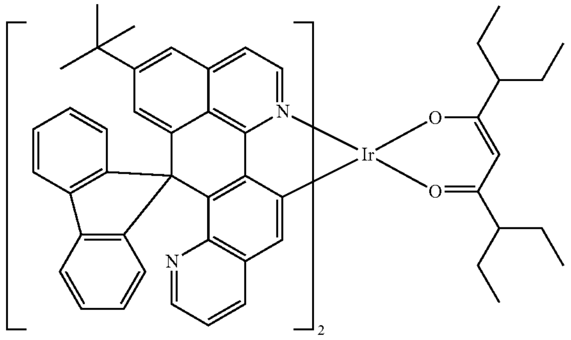
279
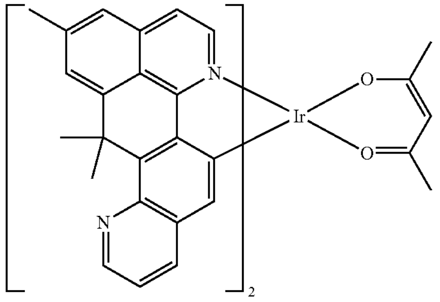
280
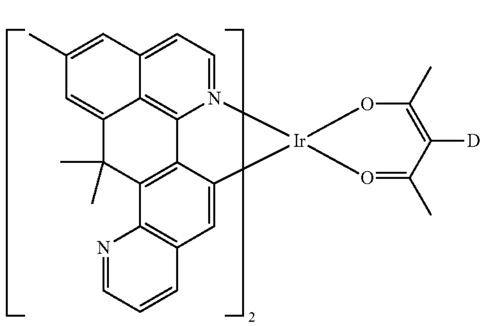
281
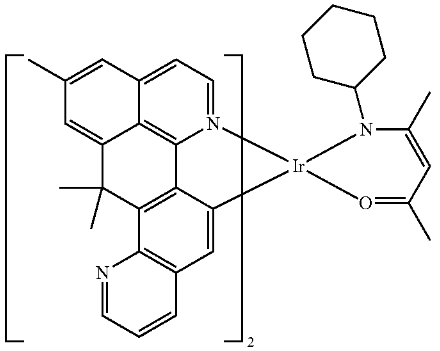
282
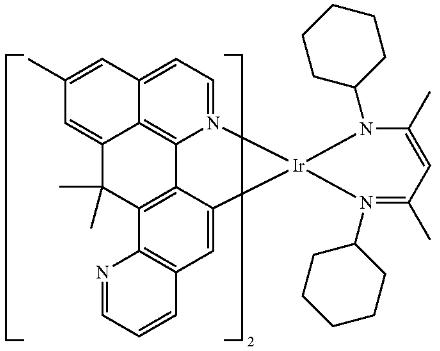
283
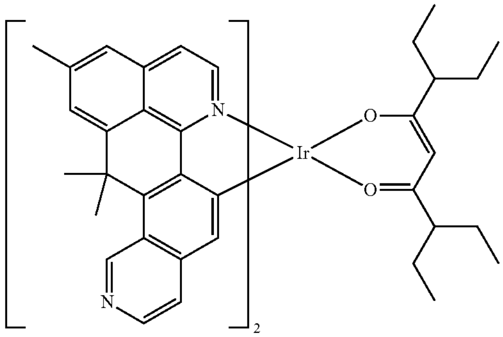
284
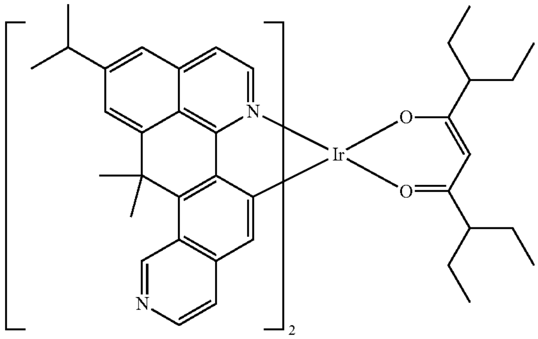

-continued
285
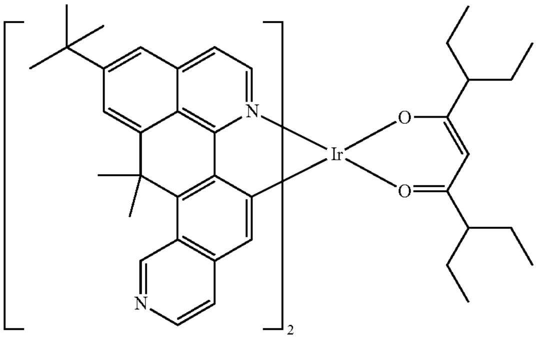
286
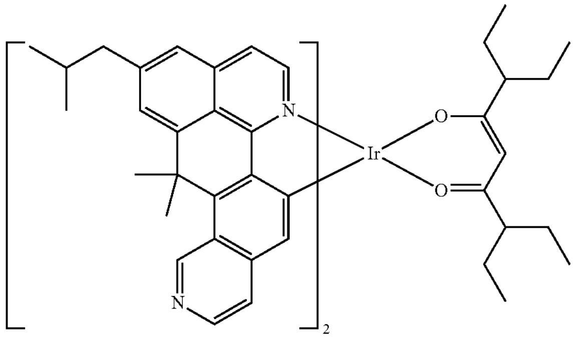
287
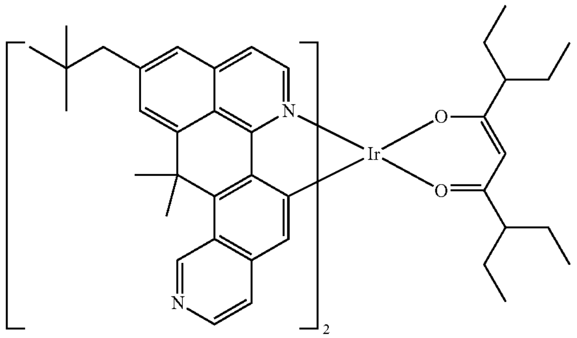
288
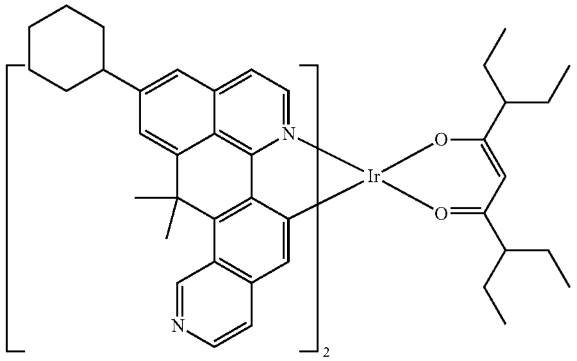
-continued
289
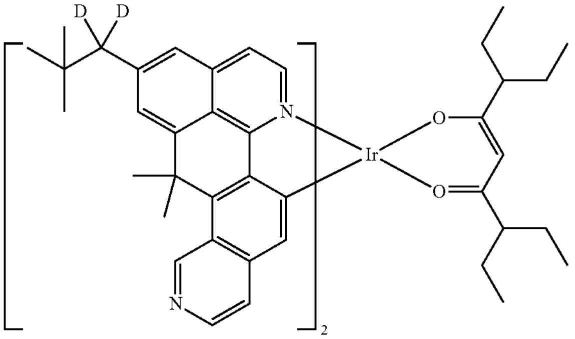
290
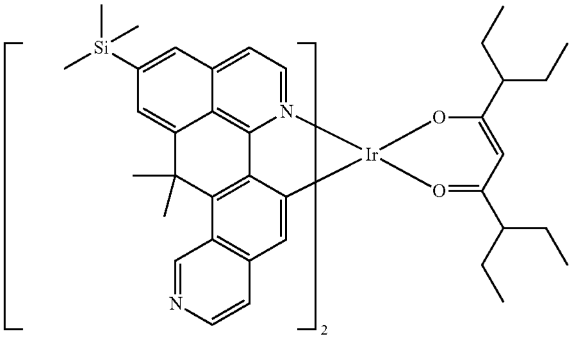
291
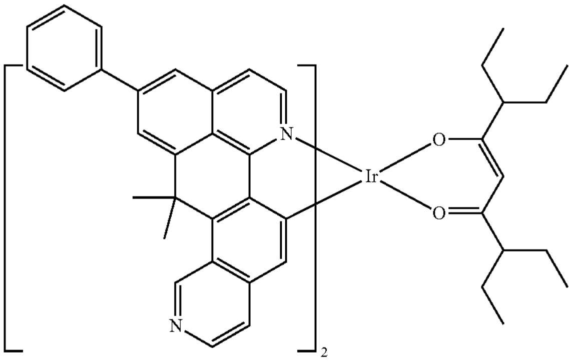
292
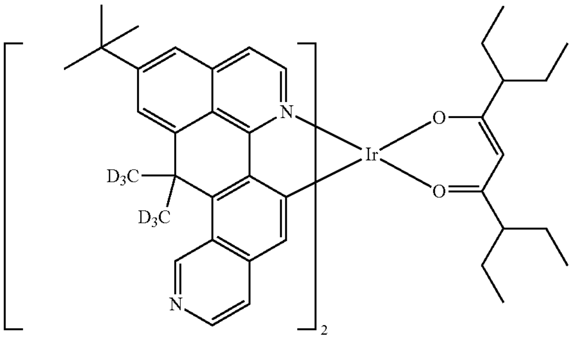

293
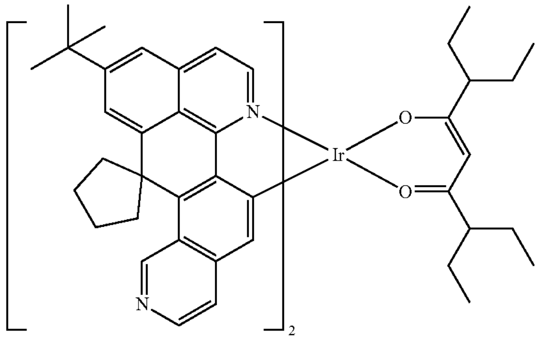
294
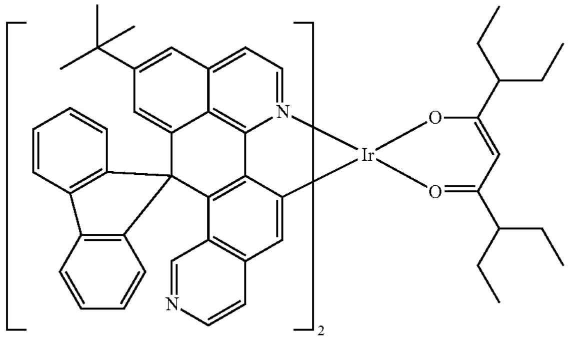
295
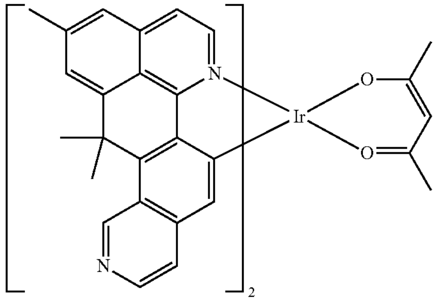
296
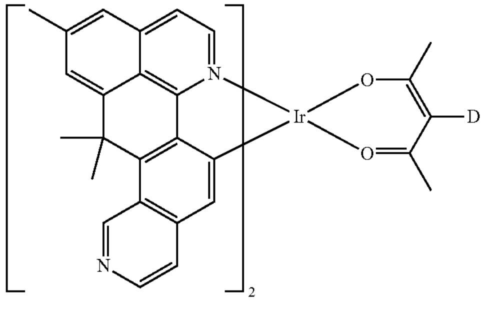
297
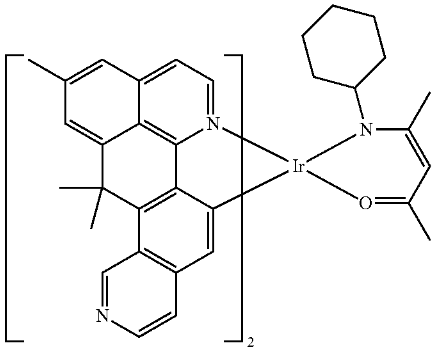
298
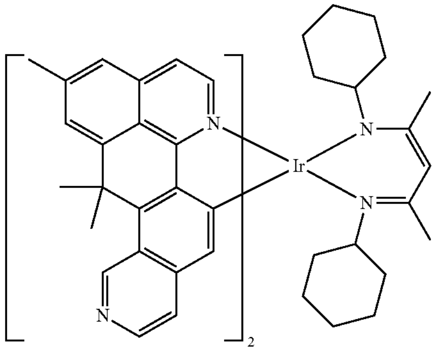
299
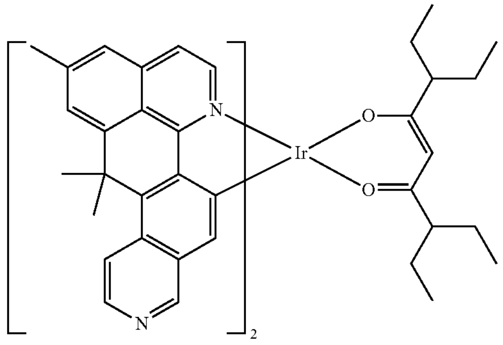
300
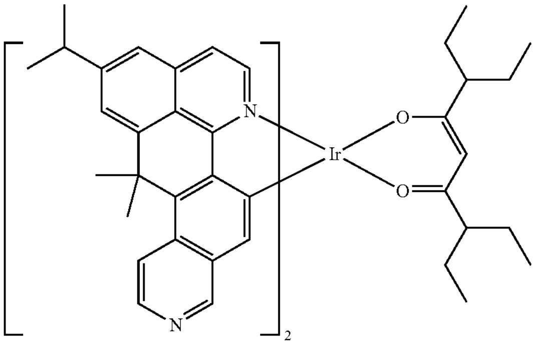

301
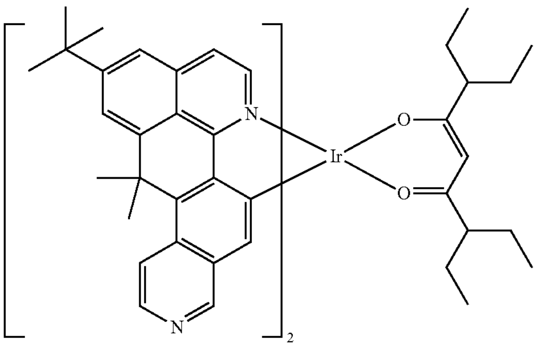
302
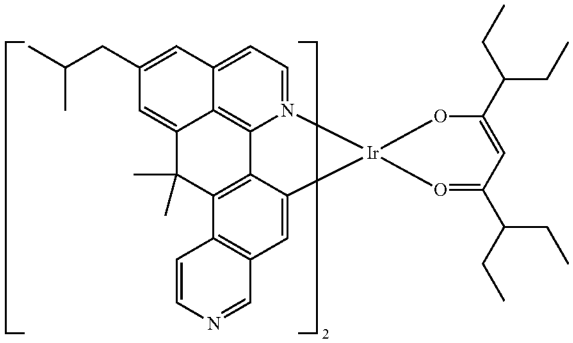
303
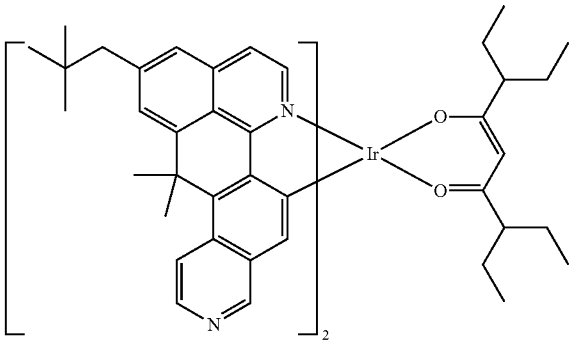
304
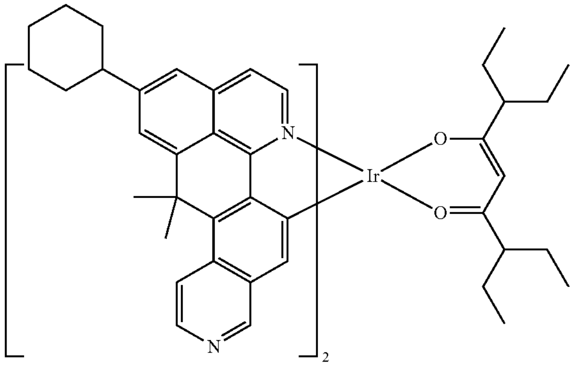
305
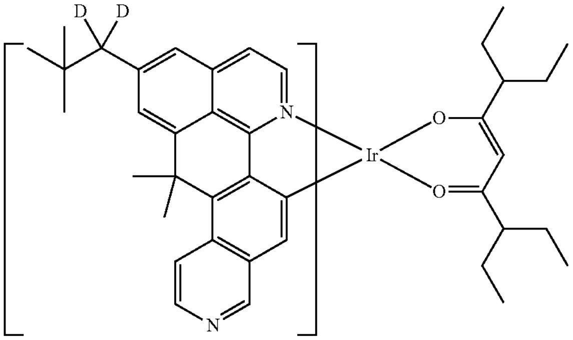
306
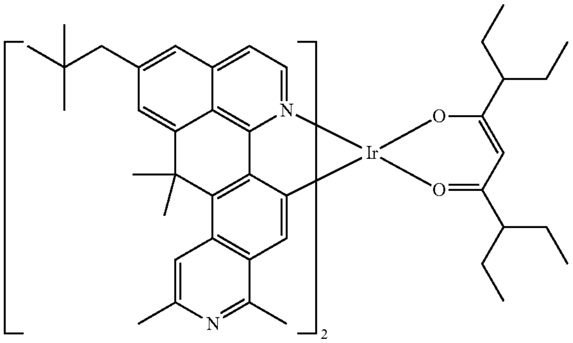
307
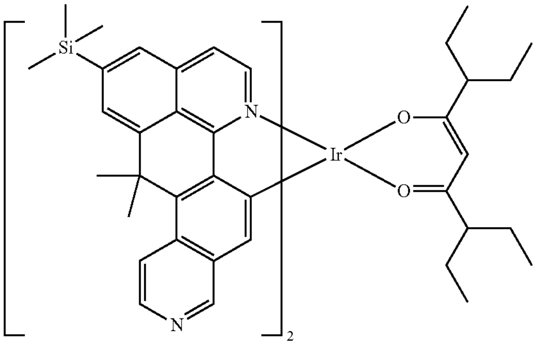
308
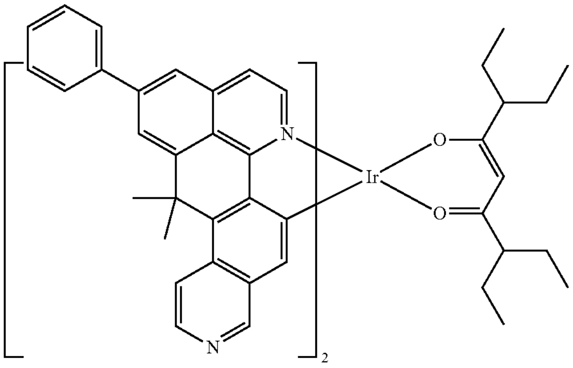

-continued
309
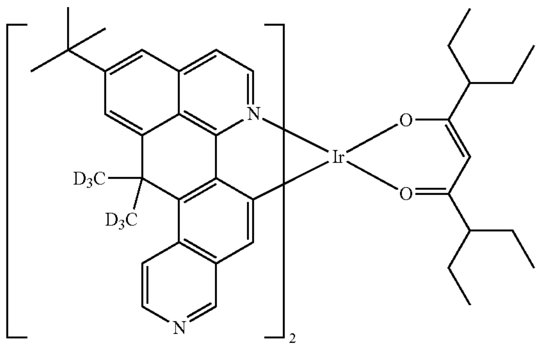
310
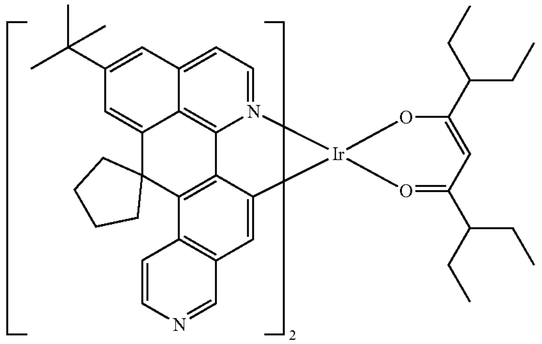
311
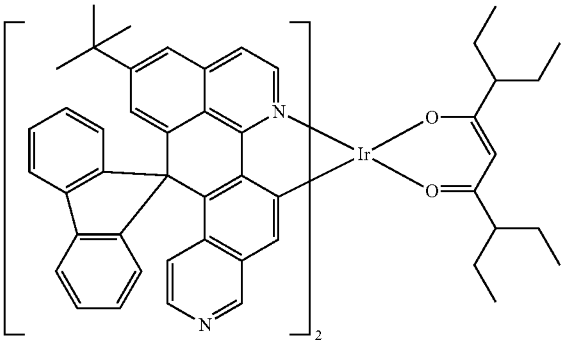
312
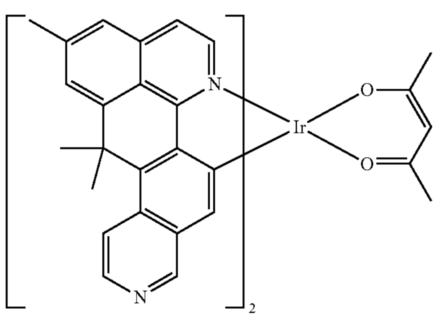
-continued
313
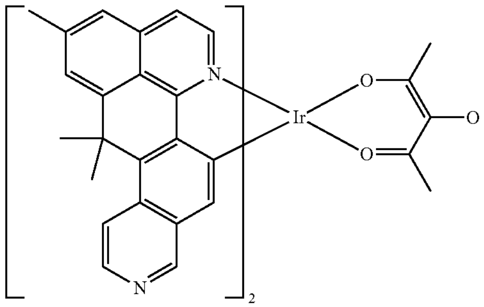
314
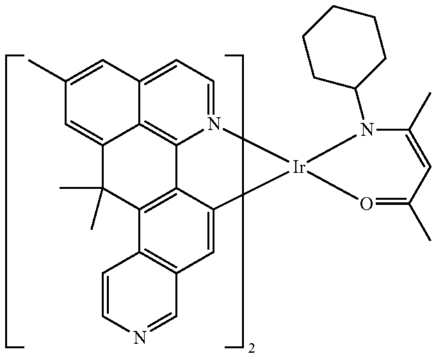
315
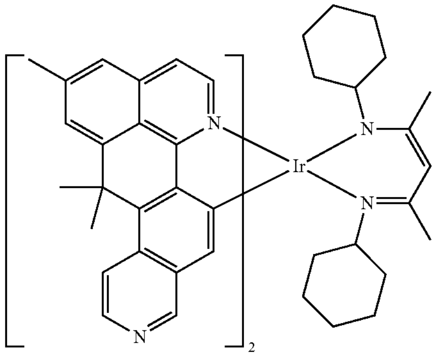
316
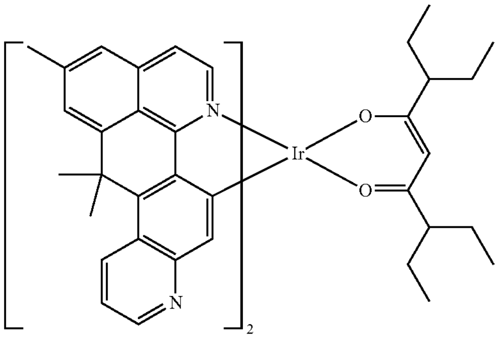

-continued
317
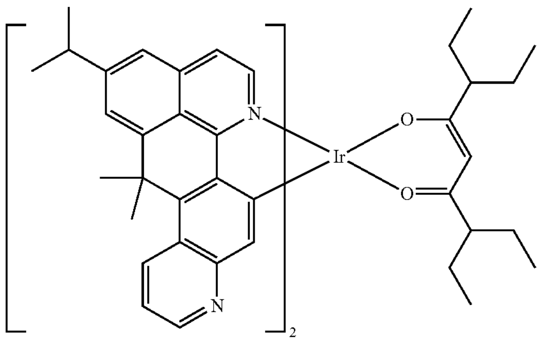
318
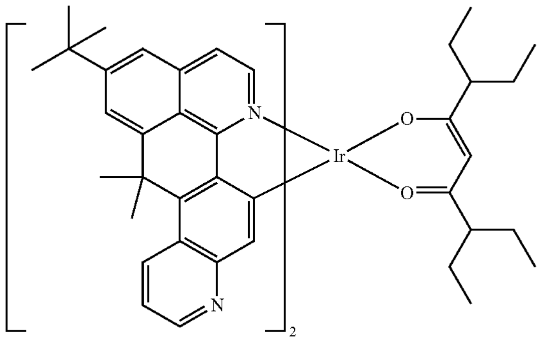
319
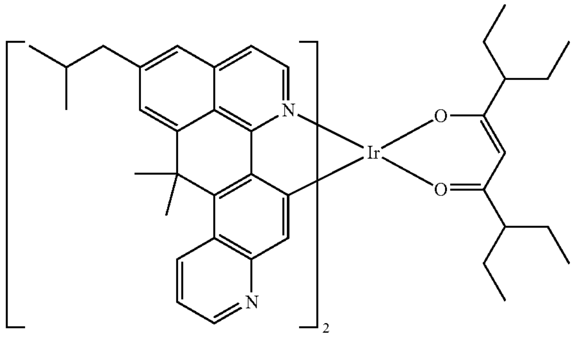
320
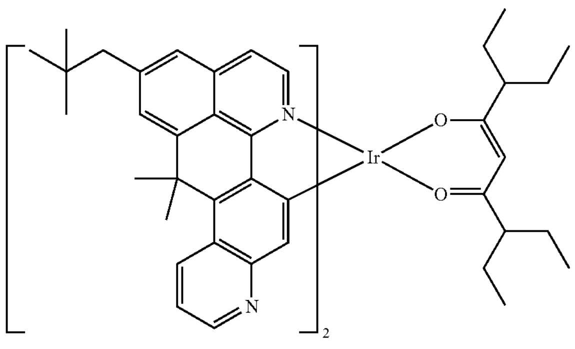
-continued
321
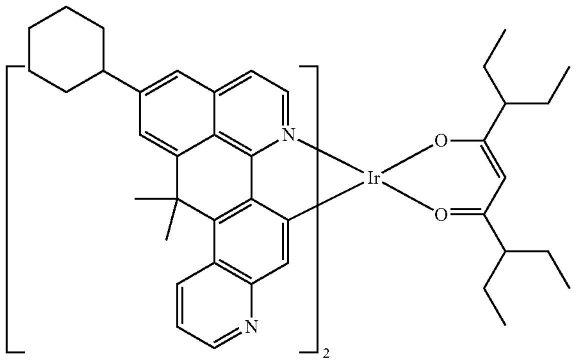
322
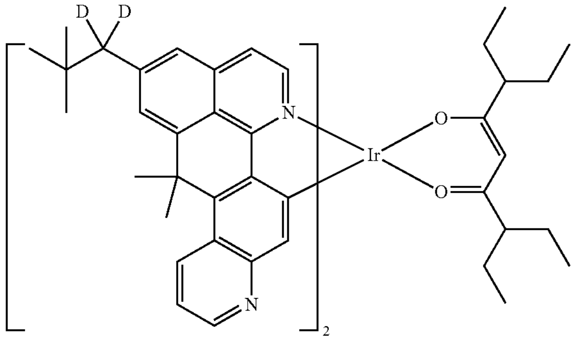
323
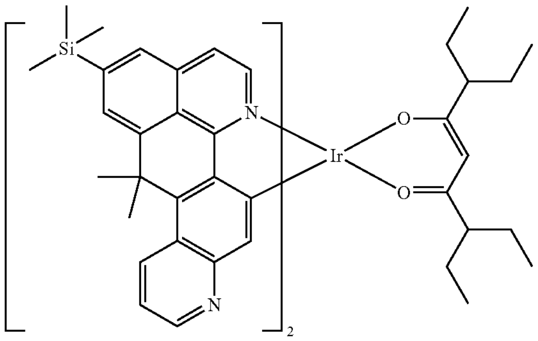
324
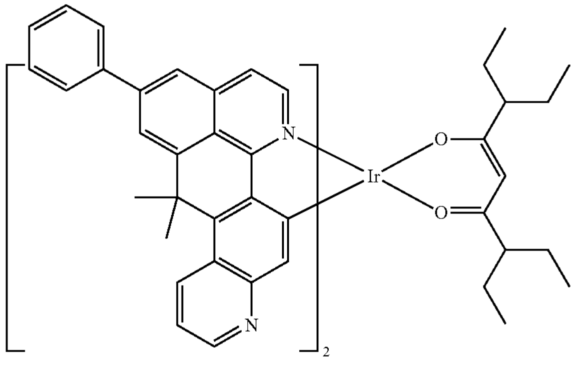

-continued
325
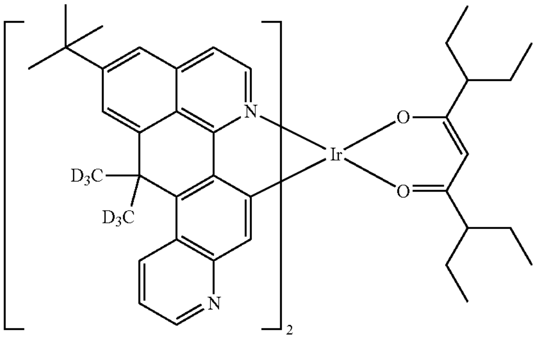
326
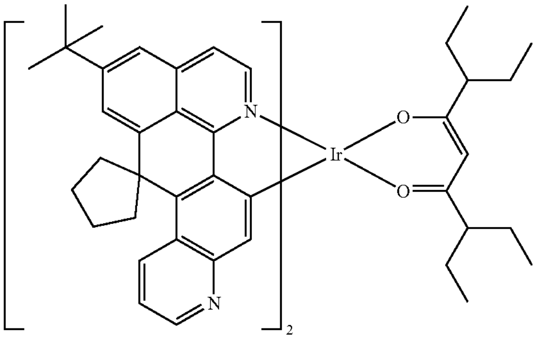
327
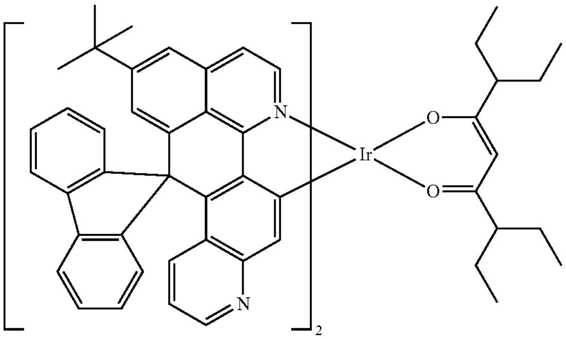
328
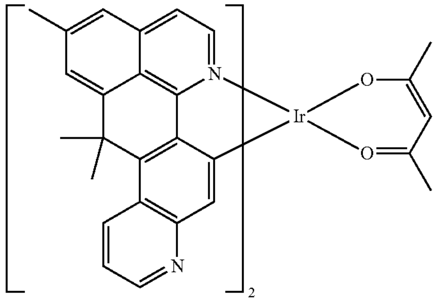
-continued
329
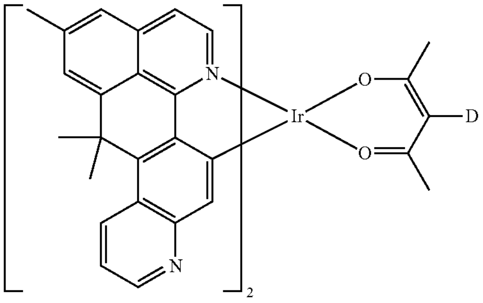
330
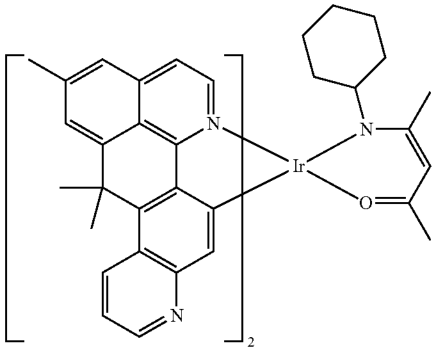
331
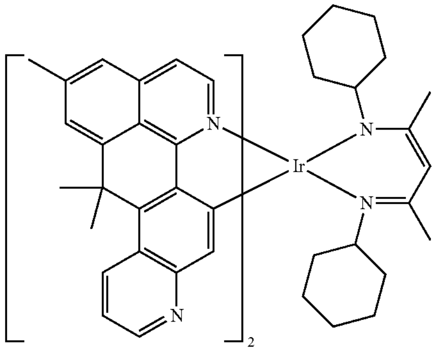
332
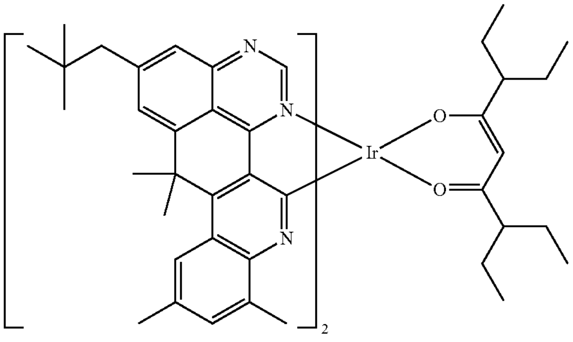

-continued
333
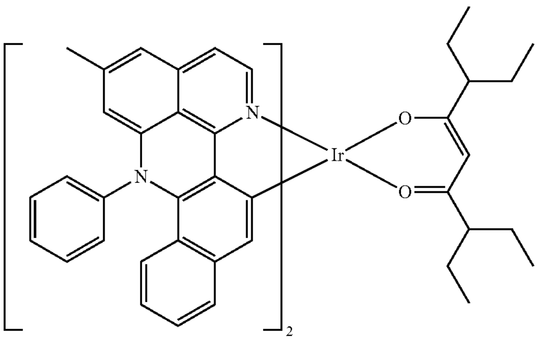
334
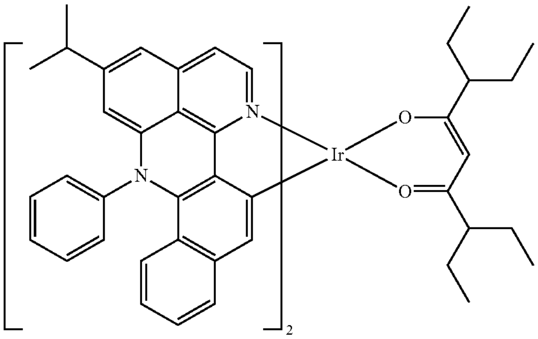
335
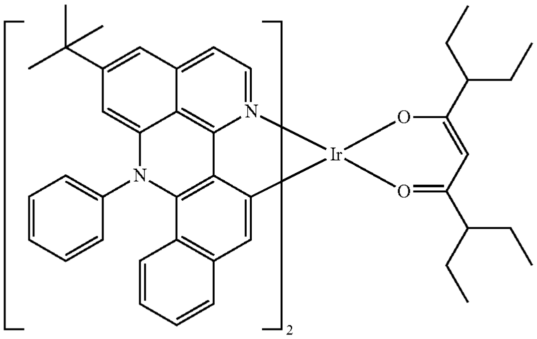
336
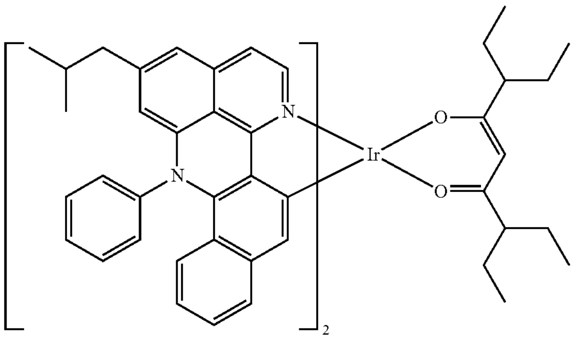
-continued
337
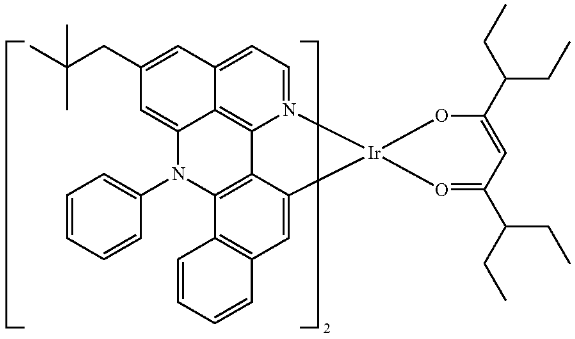
338
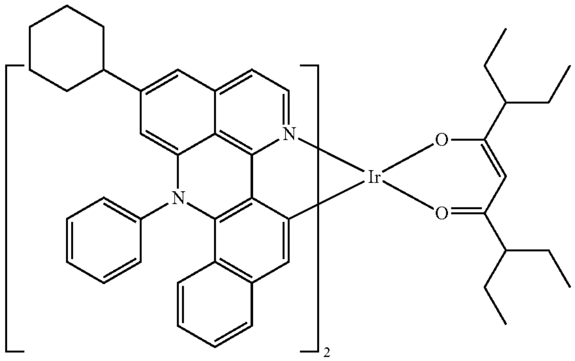
339
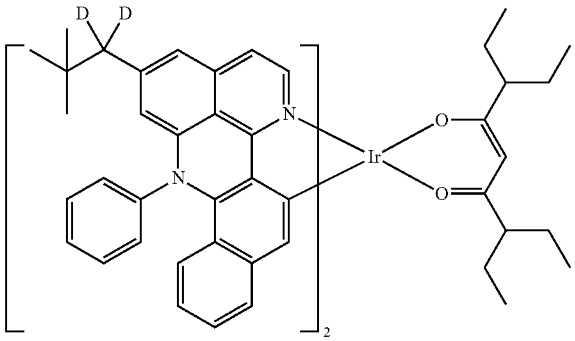
340
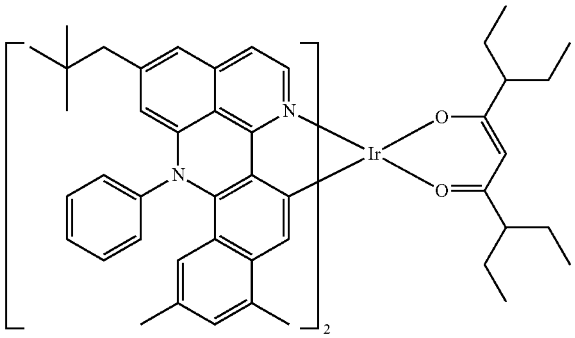

341
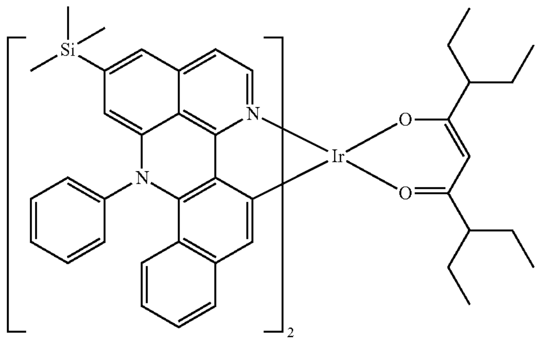
342
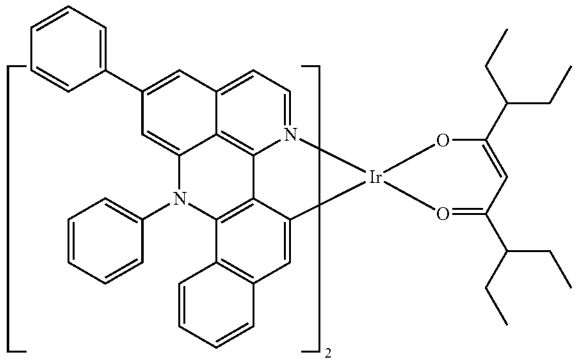
343
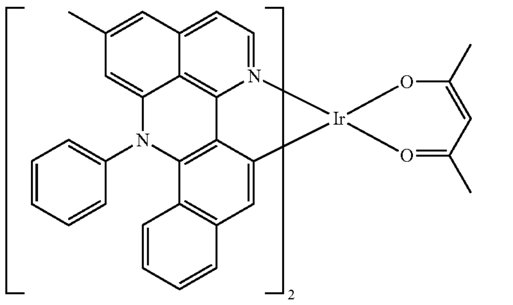
344
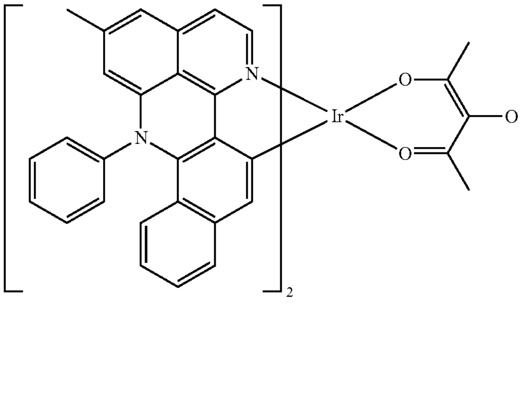
345
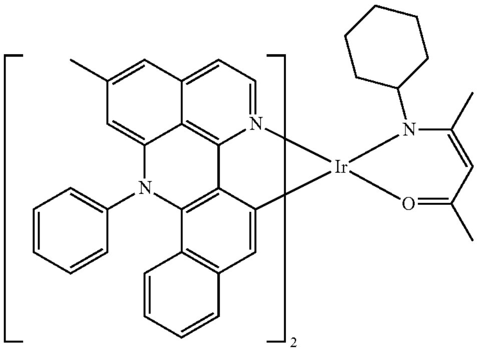
346
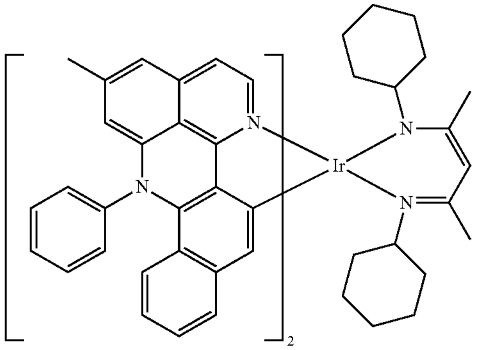
347
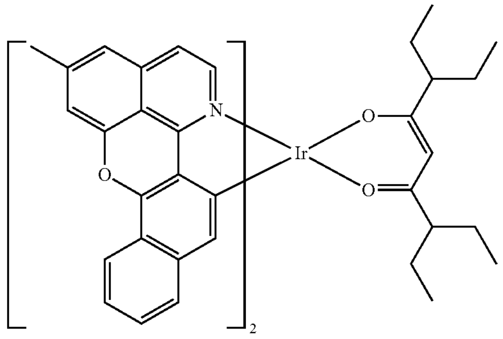
348
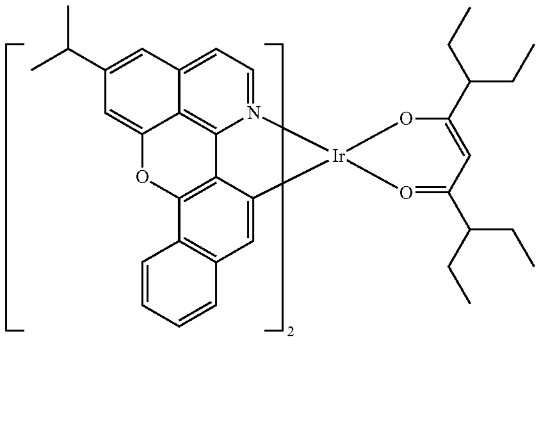

-continued
349
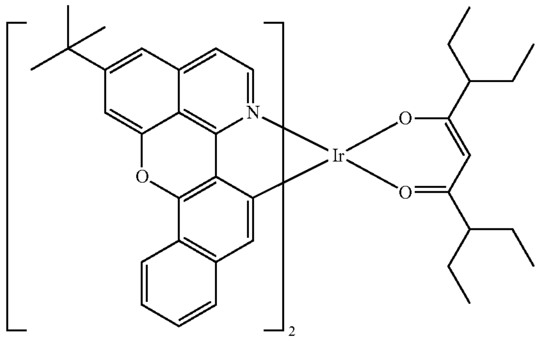
350
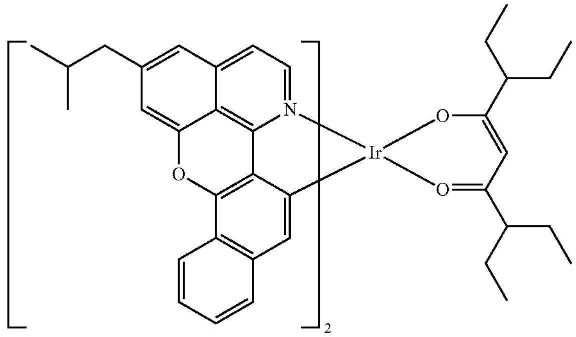
351
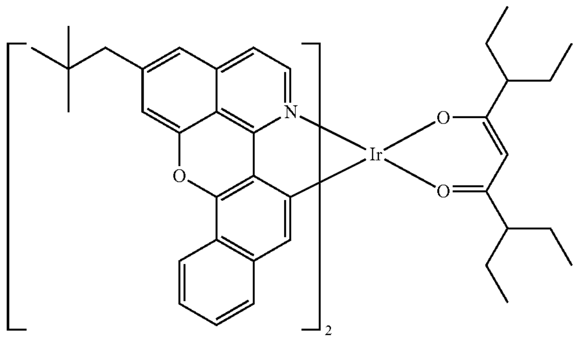
352
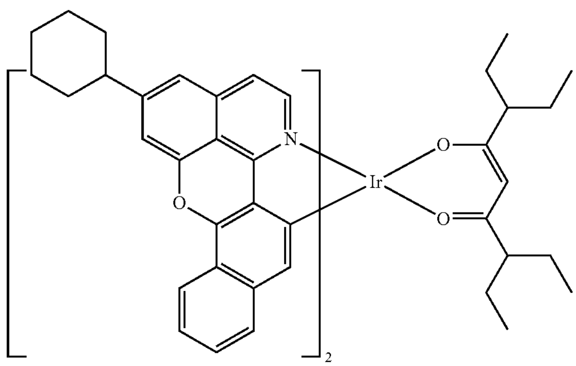
-continued
353
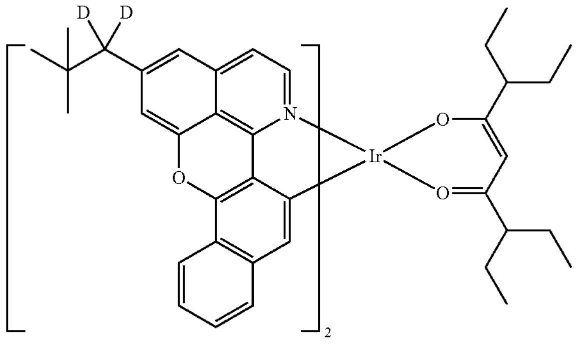
354
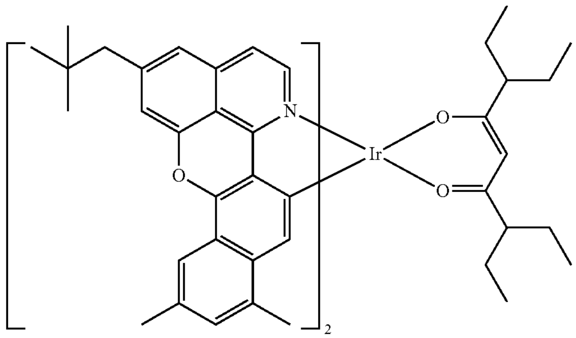
355
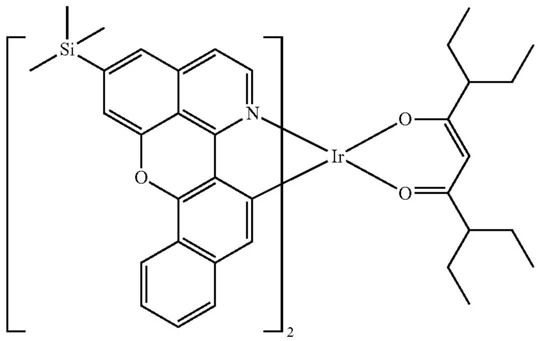
356
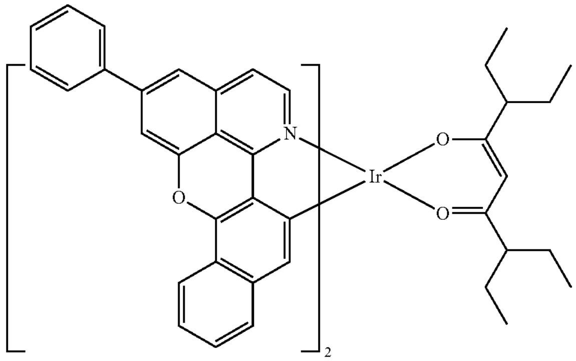

-continued
357
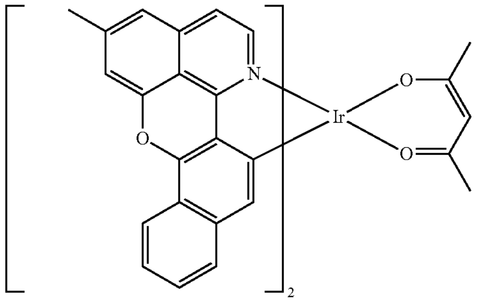
358
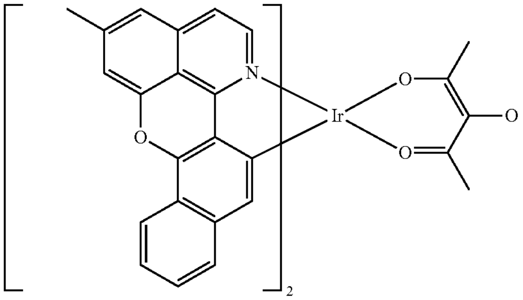
359
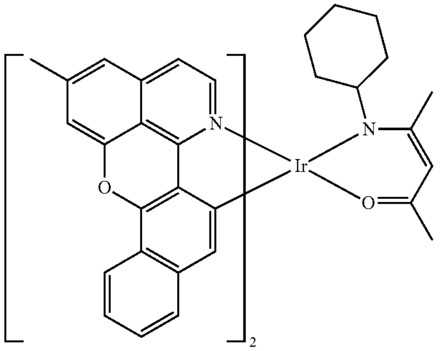
360
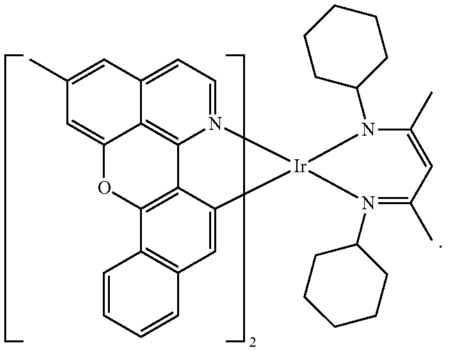
In addition, an organic metal compound having the structure of Formula 10 may include the following compounds 361-494 of Formula 14:
[Formula 14]
361
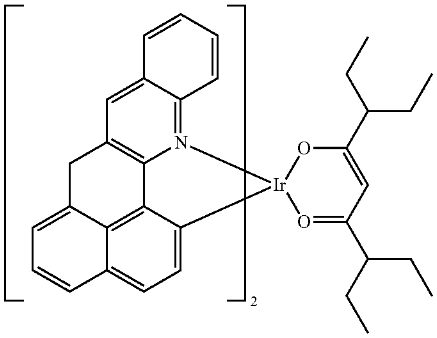
362
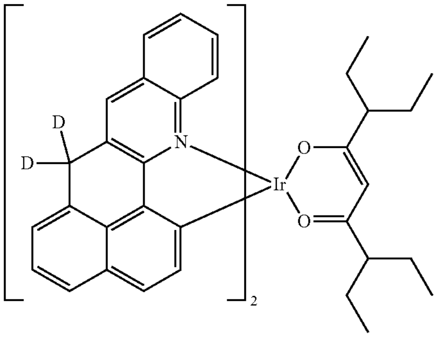
363
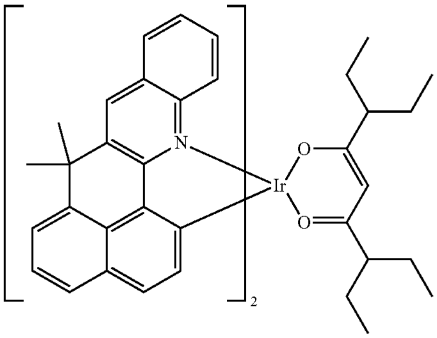
364
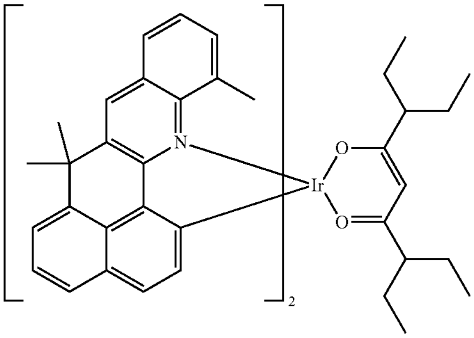

-continued
365
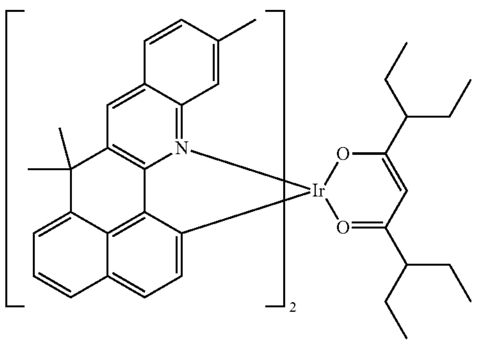
366
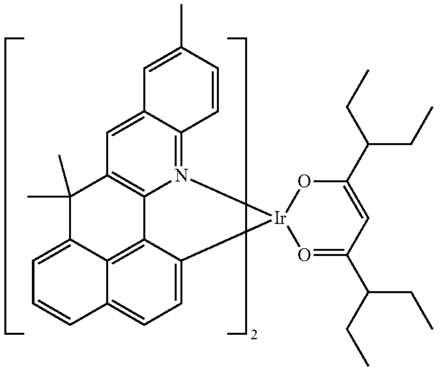
367
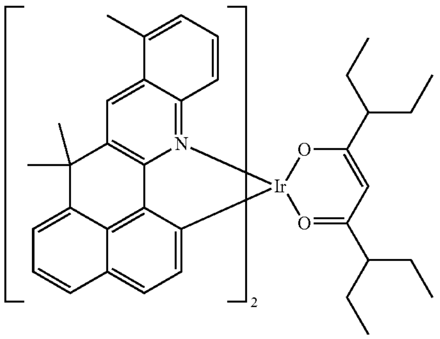
368
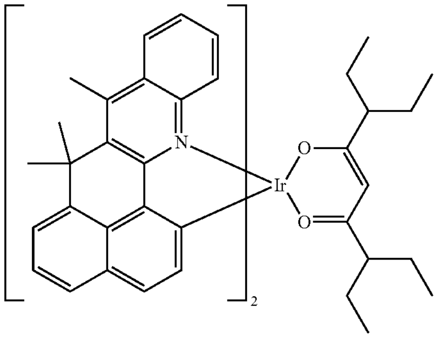
-continued
369
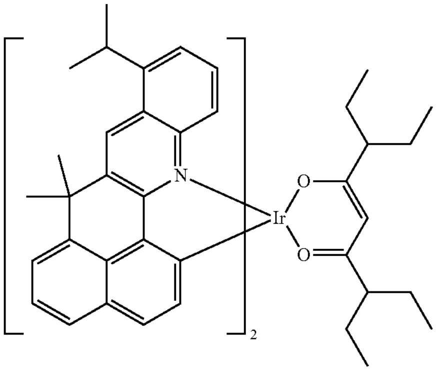
370
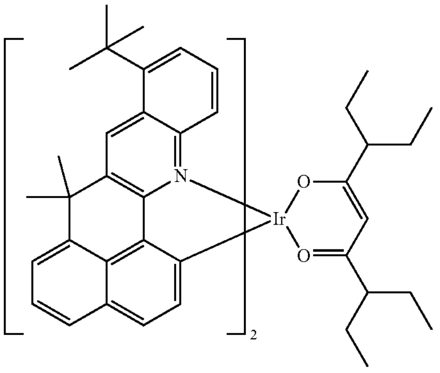
371
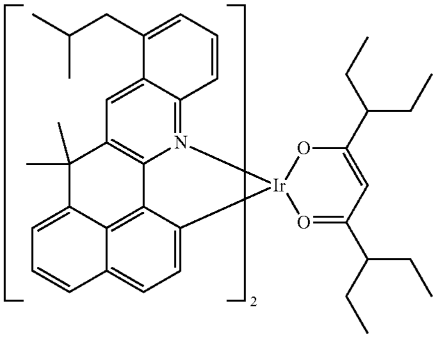
372
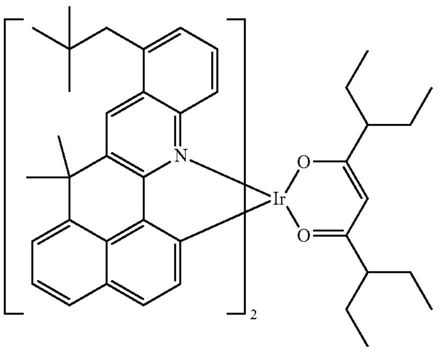

-continued
373
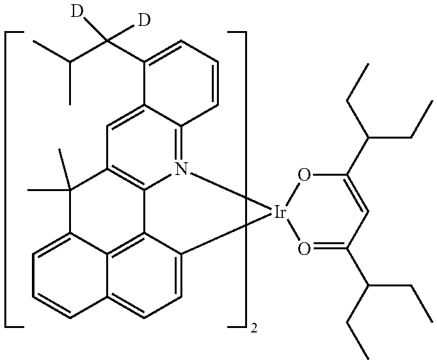
374
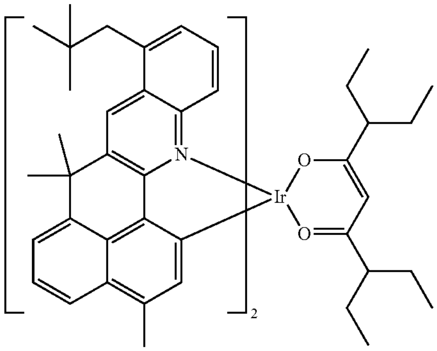
375
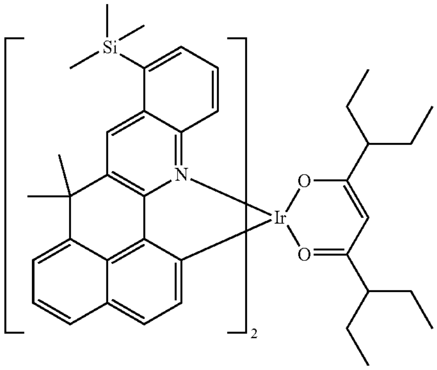
376
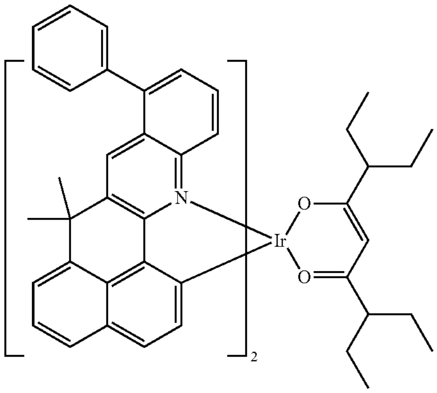
377
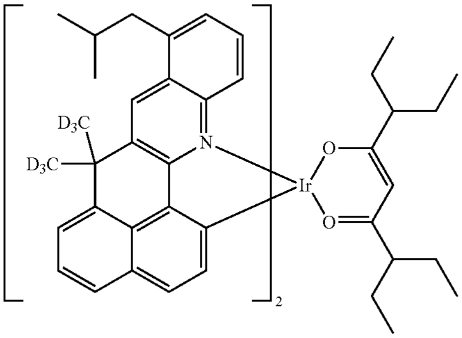
378
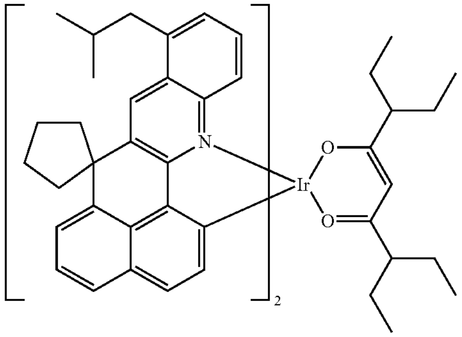
379
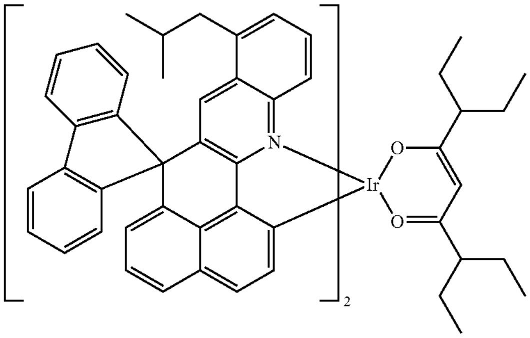
380
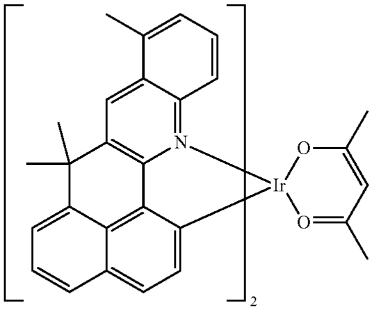

-continued
381
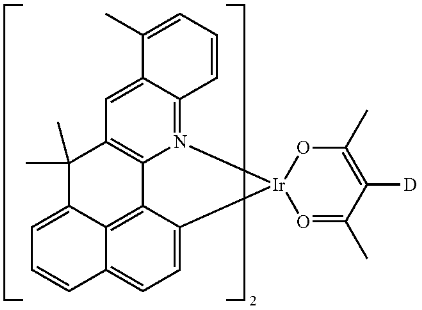
382
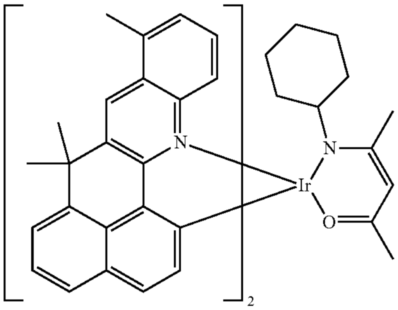
383
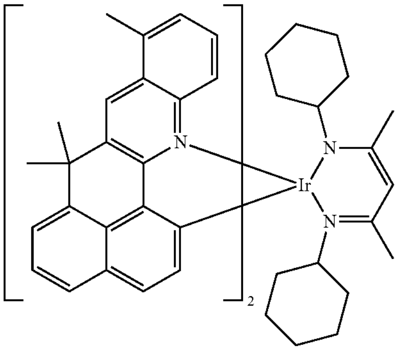
384
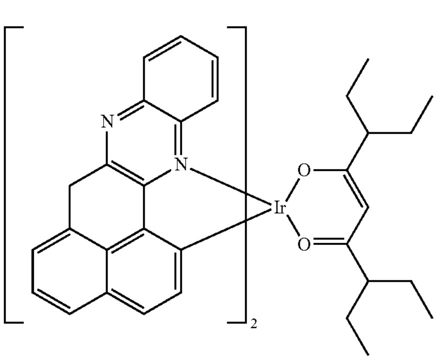
-continued
385
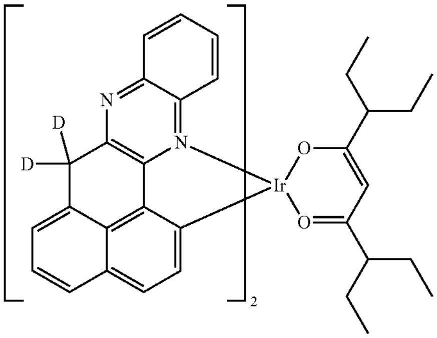
386
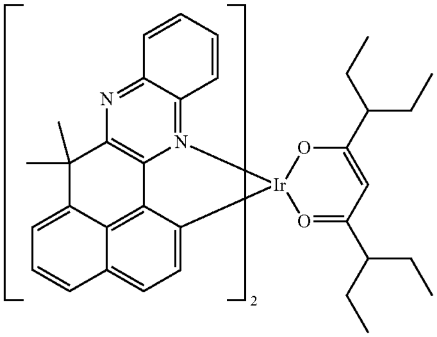
387
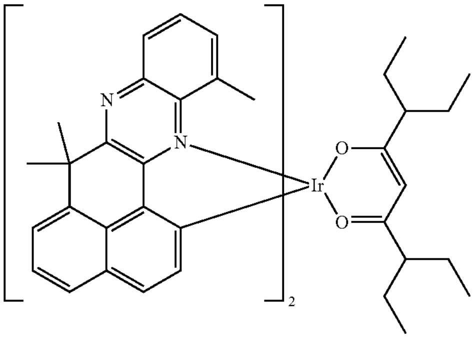
388
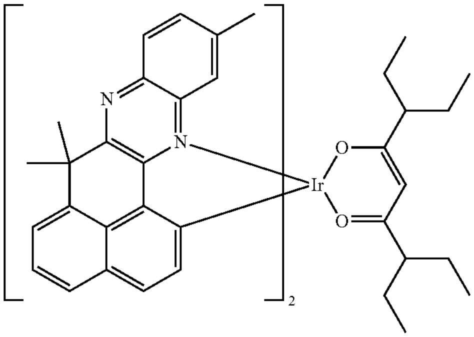

-continued
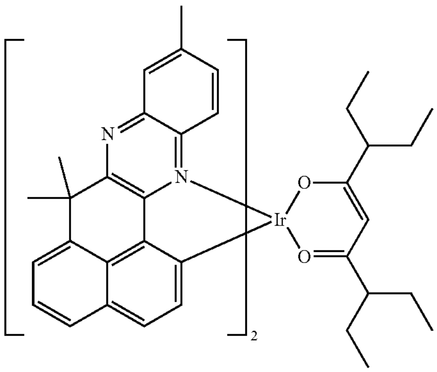
389
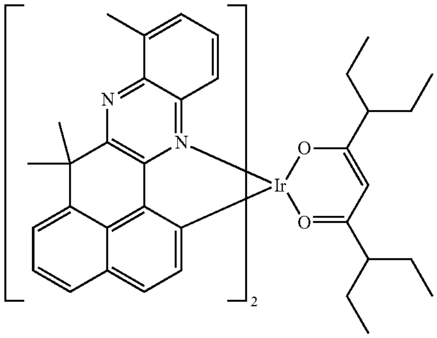
390
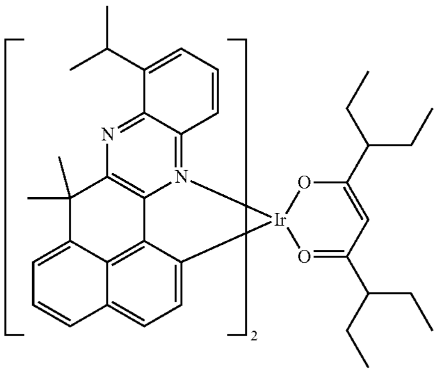
391
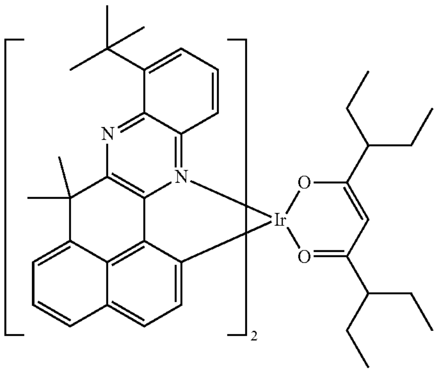
392
-continued
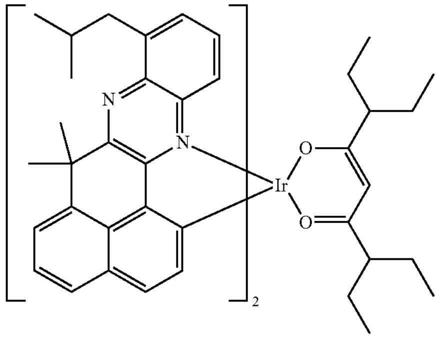
393
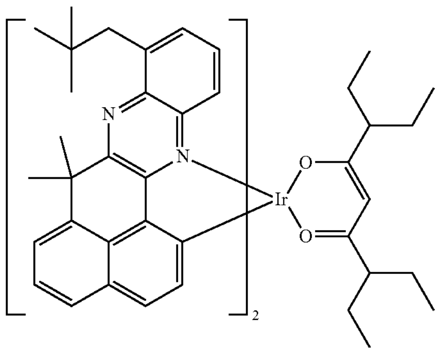
394
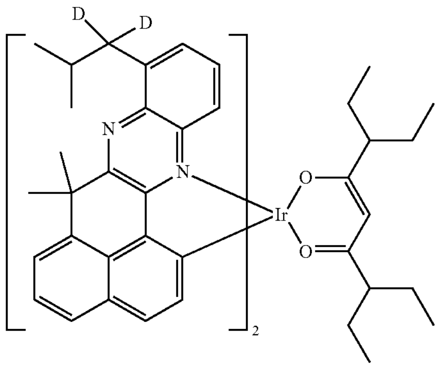
395
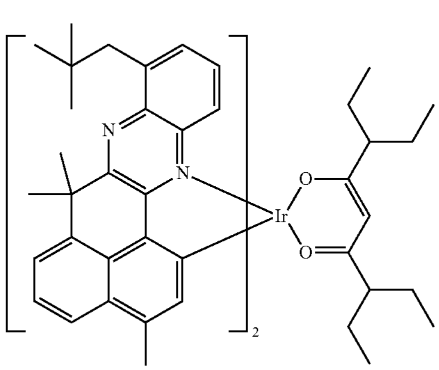
396

-continued
397
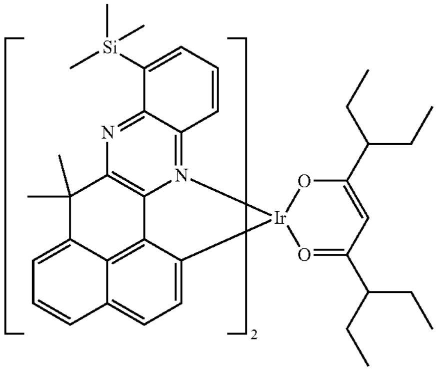
398
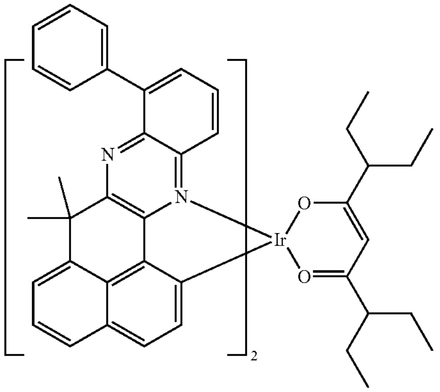
399
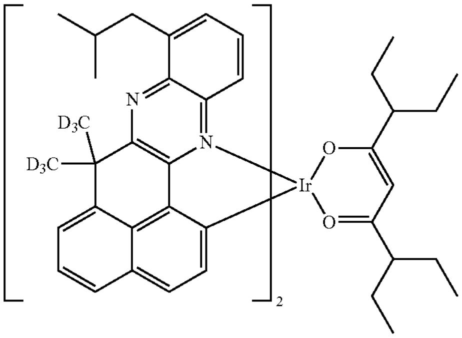
400
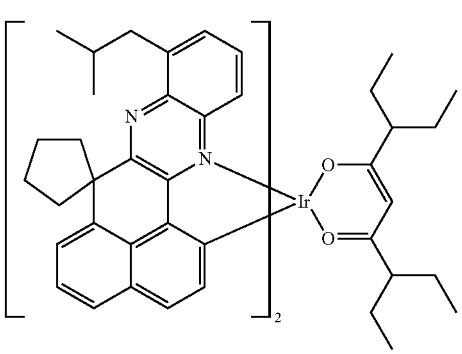
-continued
401
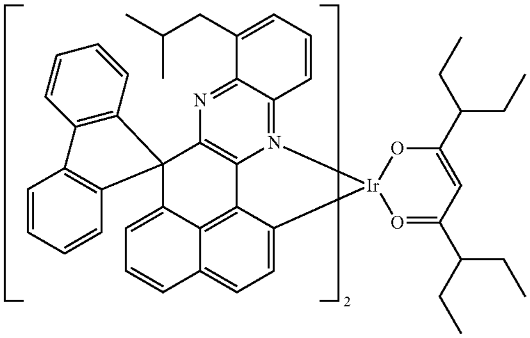
402
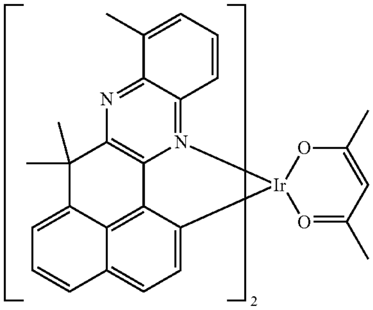
403
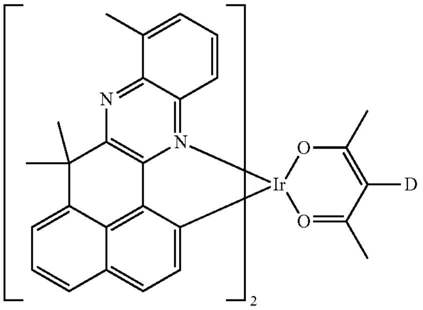
404
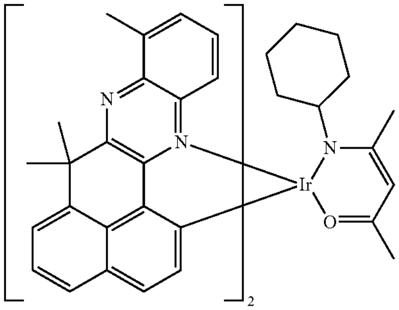

-continued
405
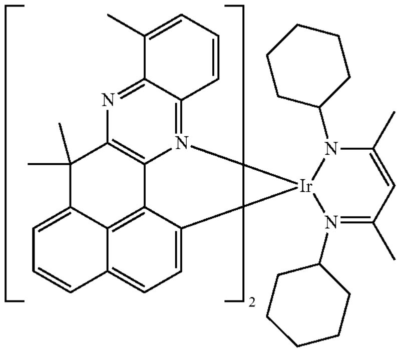
406
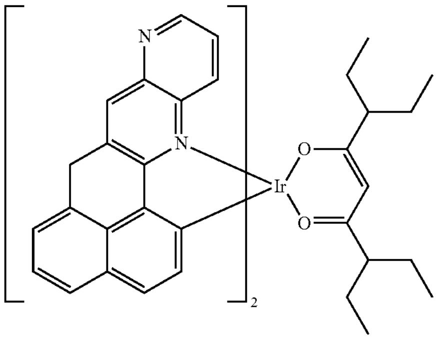
407
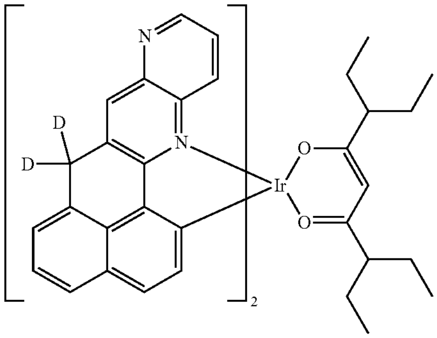
408
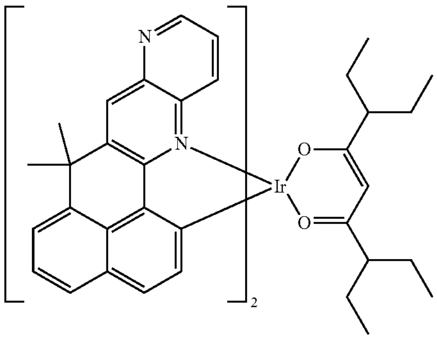
-continued
409
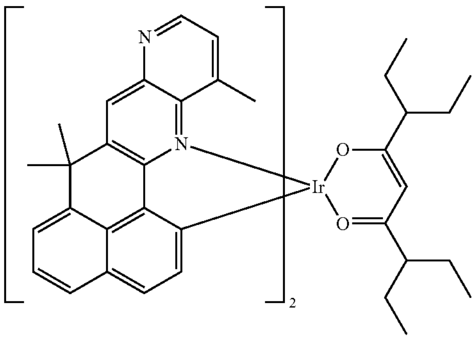
410
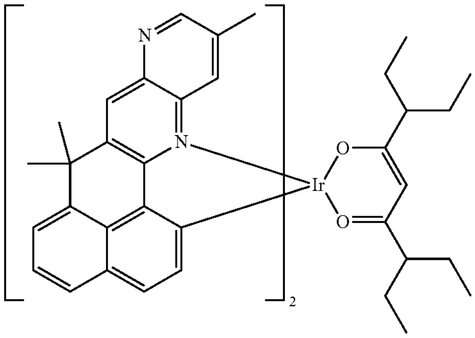
411
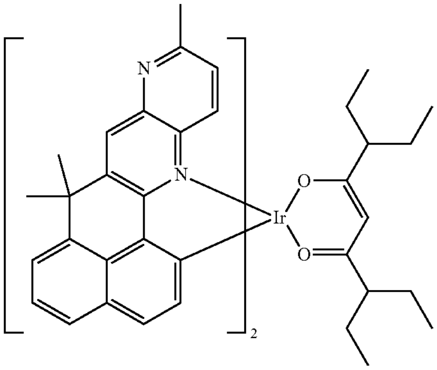
412
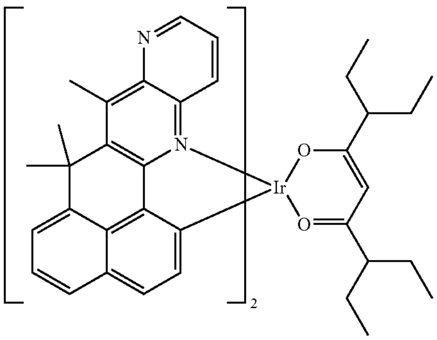

-continued
413
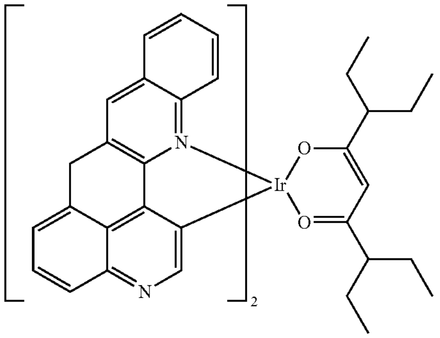
414
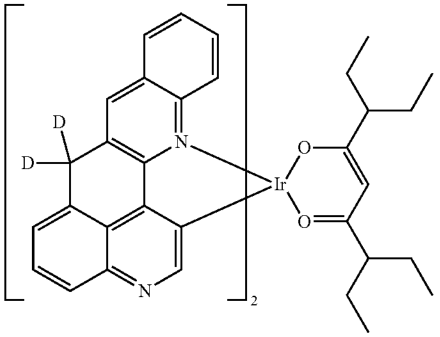
415
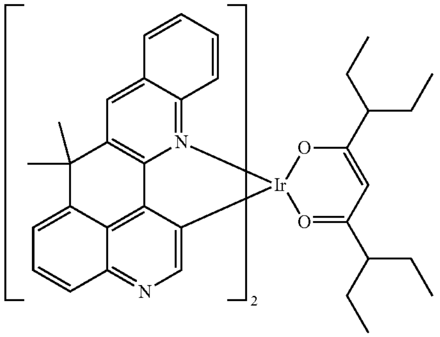
416
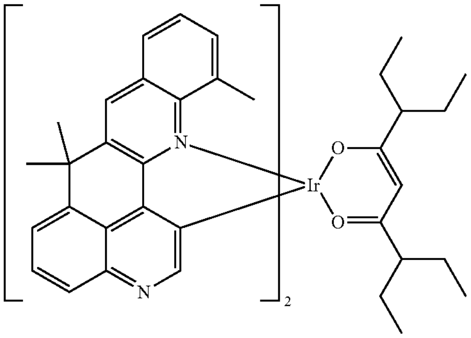
-continued
417
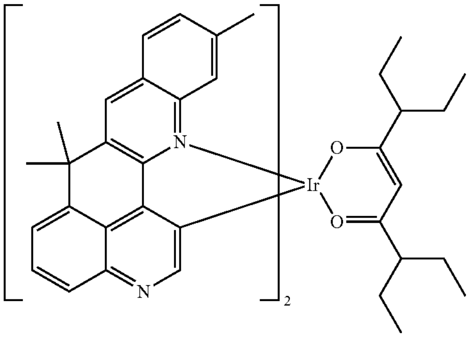
418
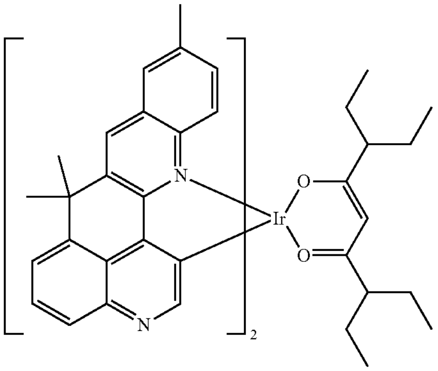
419
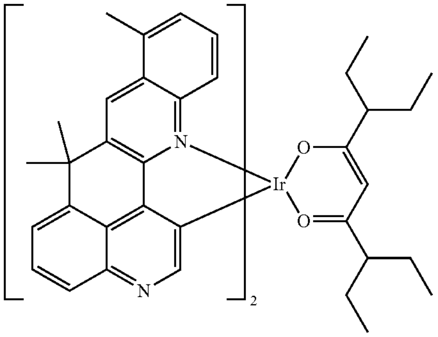
420
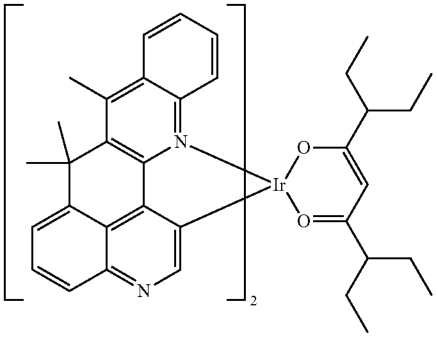

-continued
421
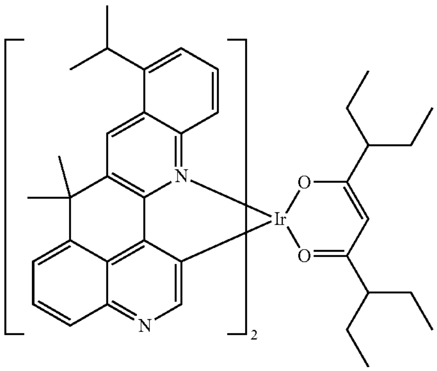
422
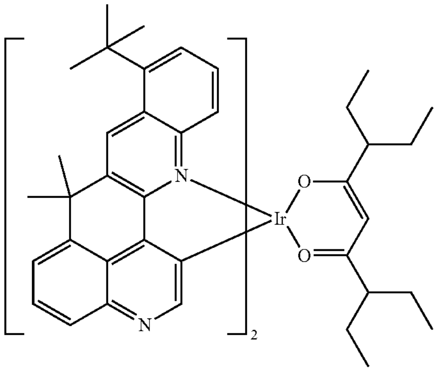
423
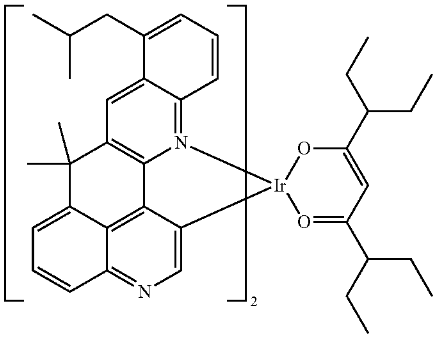
424
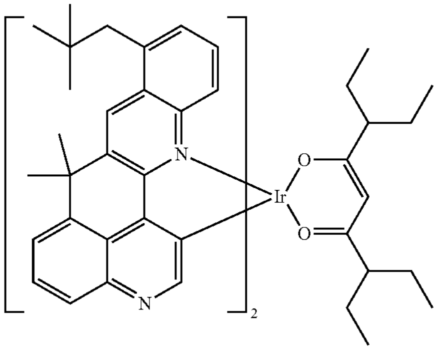
425
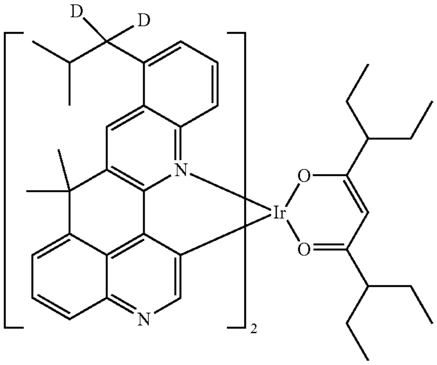
426
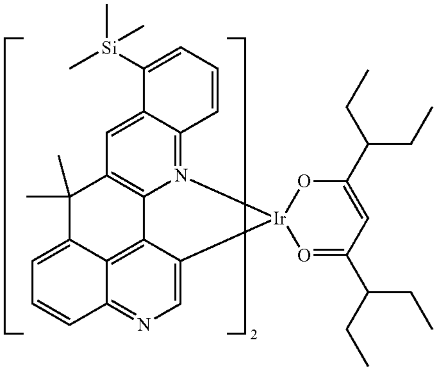
427
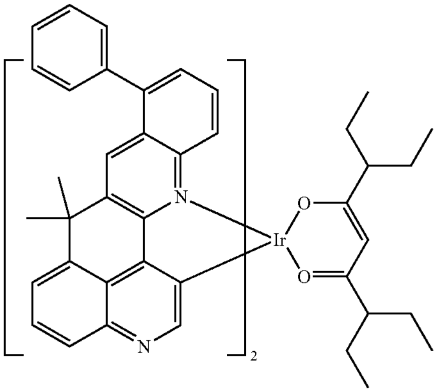
428
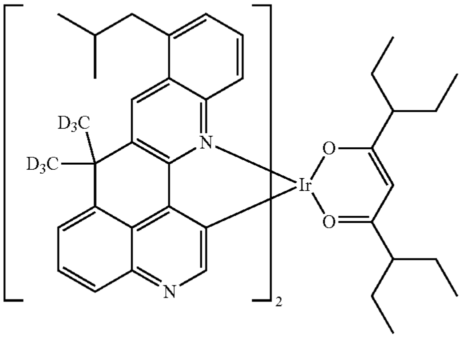

-continued
429
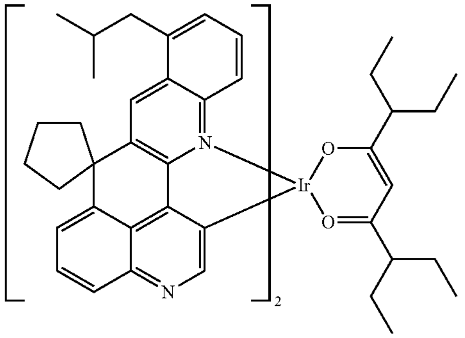
430
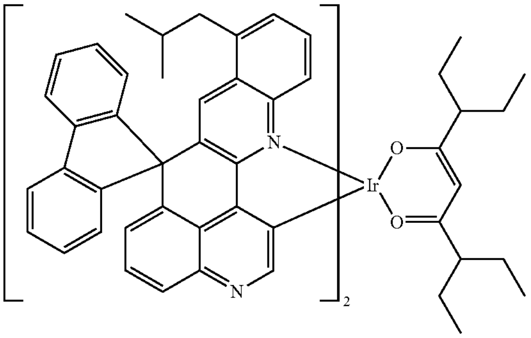
431
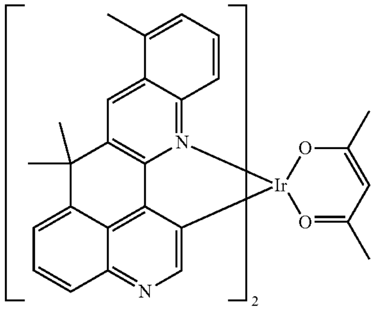
432
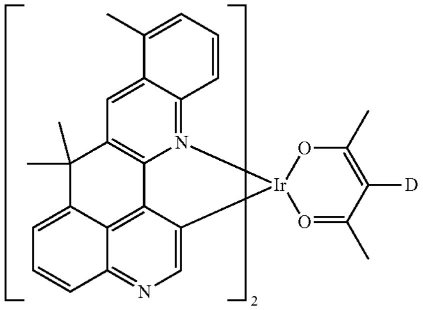
433
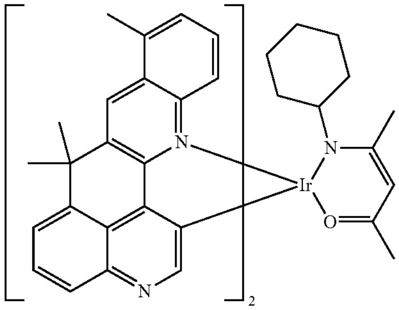
-continued
434
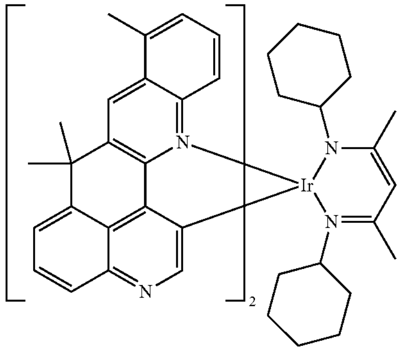
435
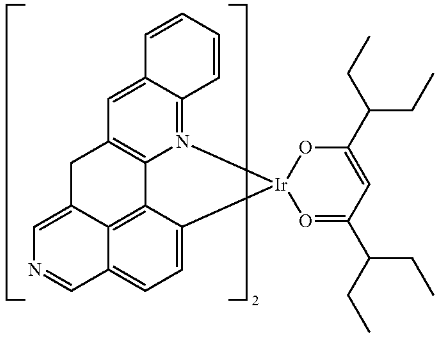
436
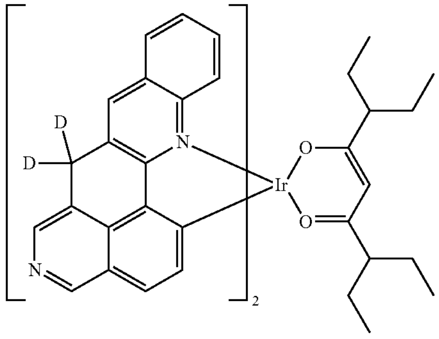
437
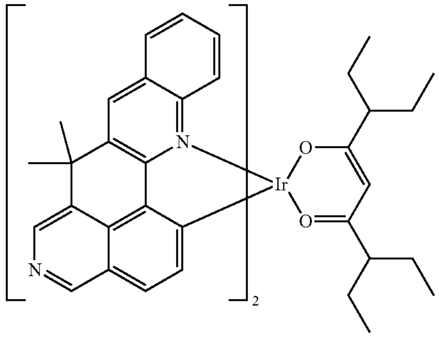

-continued
438
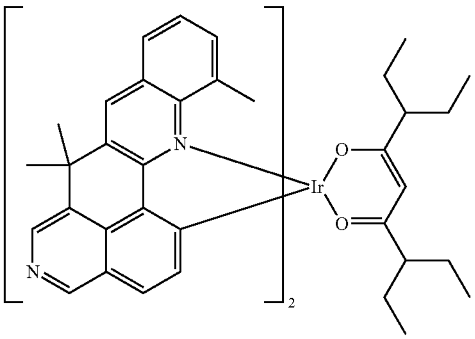
439
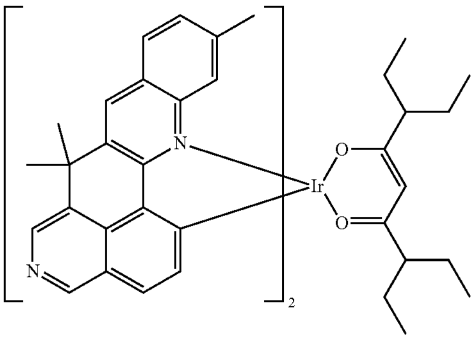
440
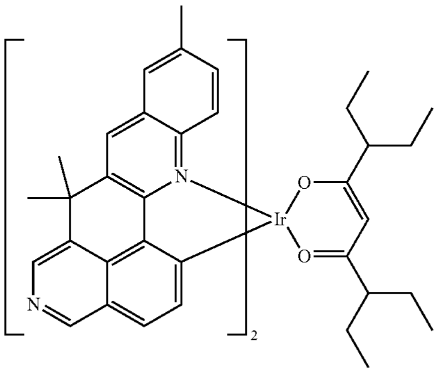
441
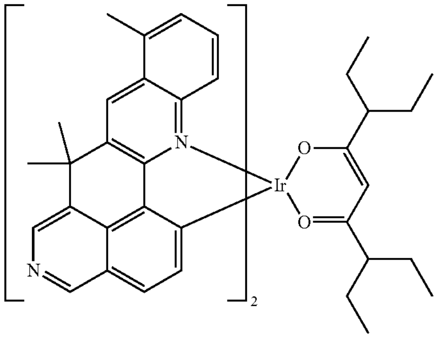
-continued
442
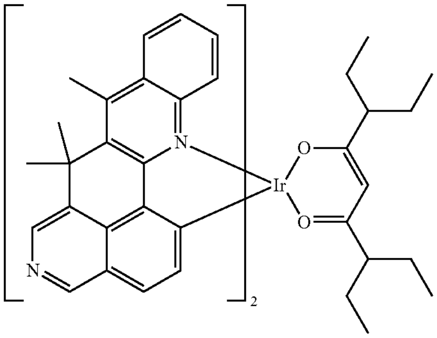
443
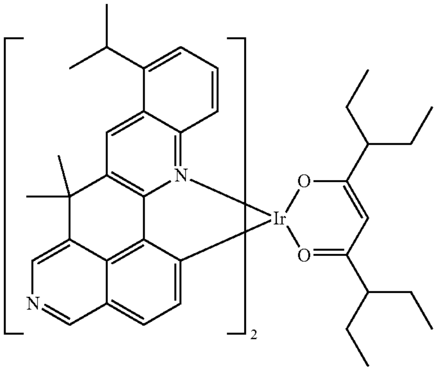
444
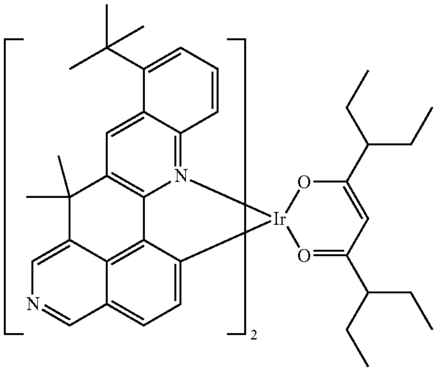
437
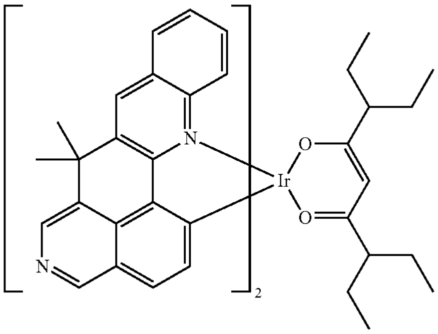

-continued
438
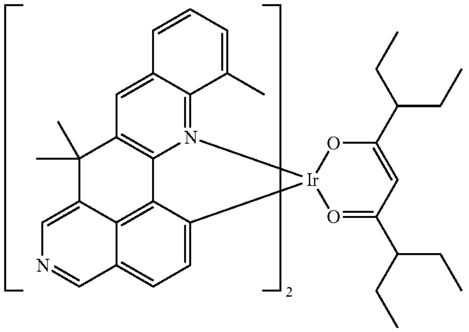
439
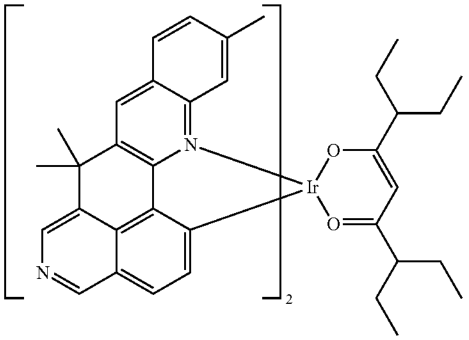
440
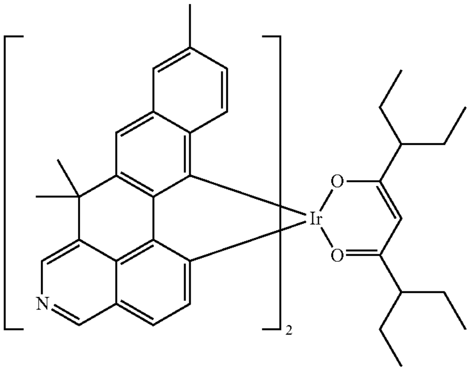
441
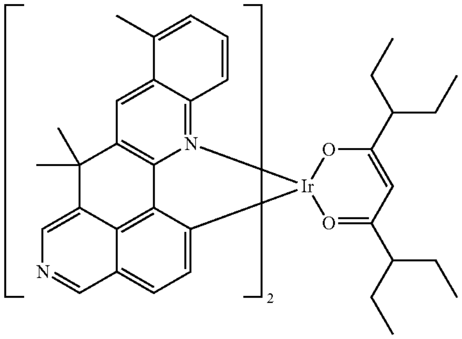
-continued
442
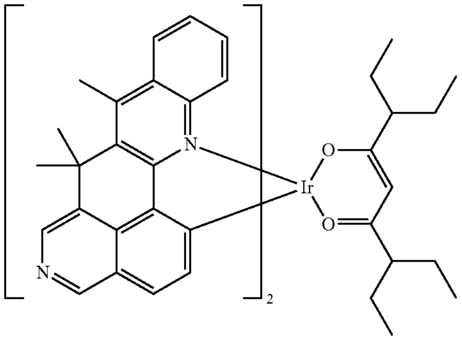
443
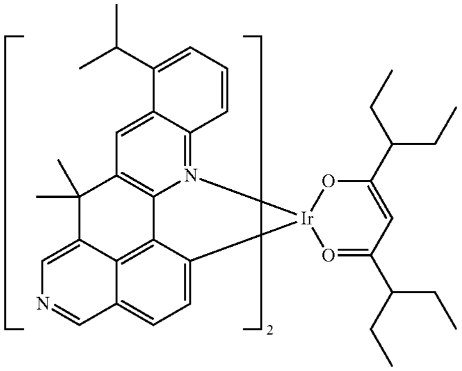
444
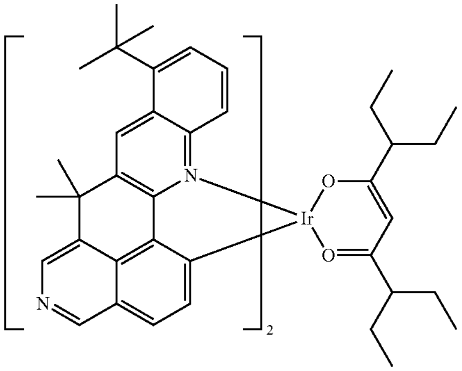
445
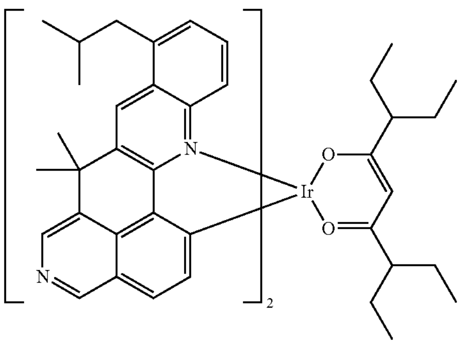

-continued
446
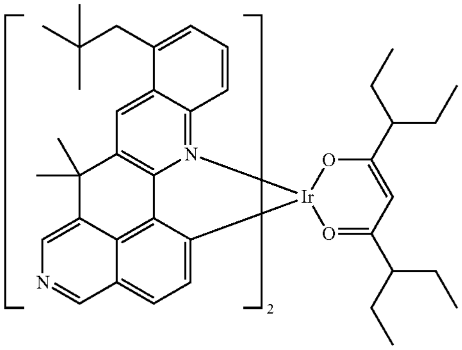
447
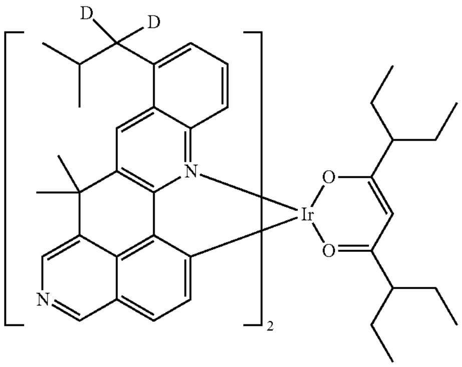
448
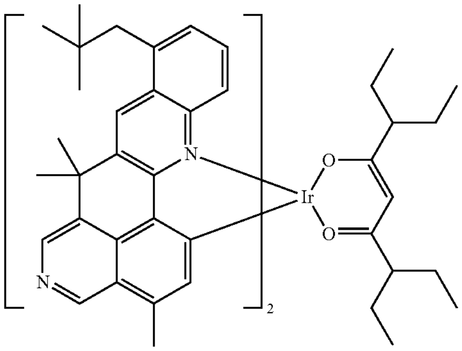
449
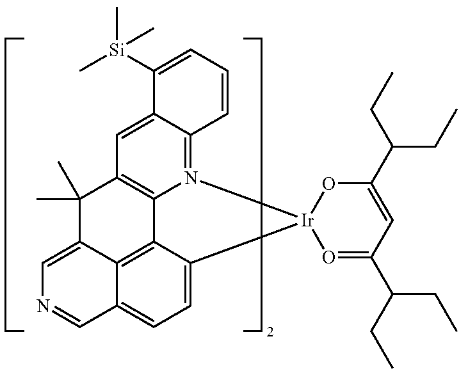
-continued
450
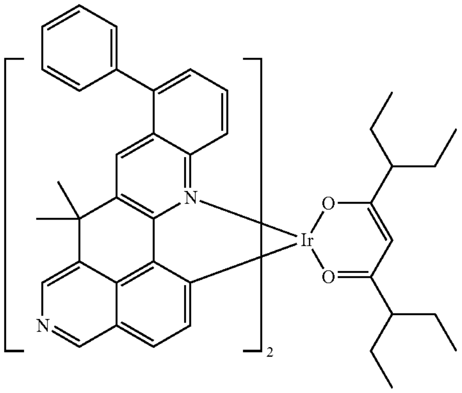
451
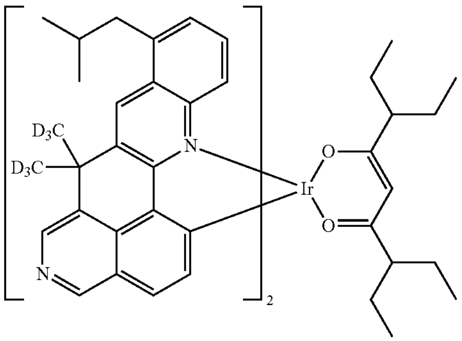
452
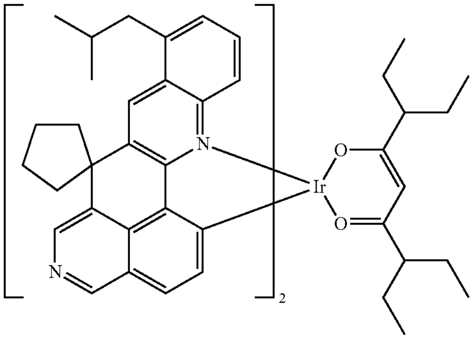
453
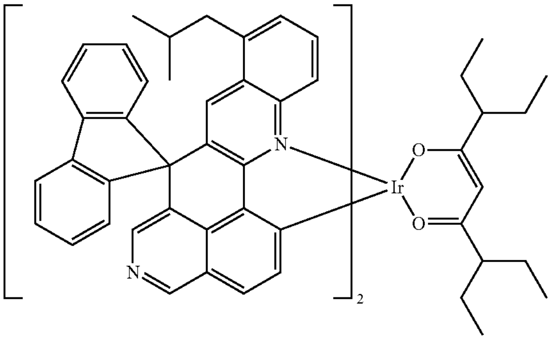

-continued
454
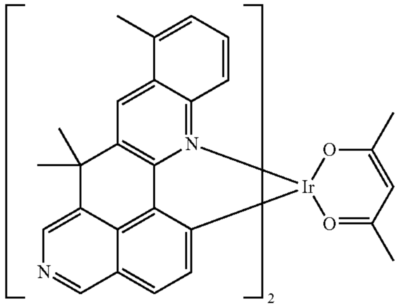
455
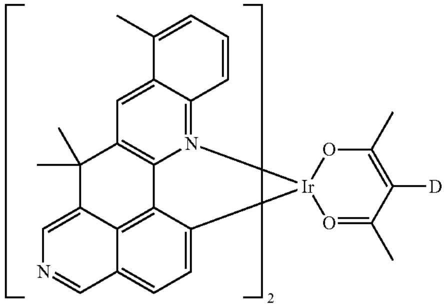
456
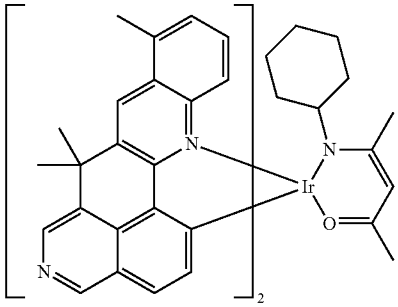
457
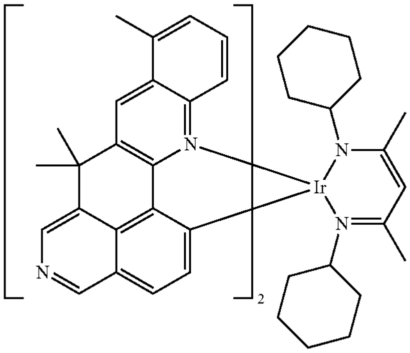
458
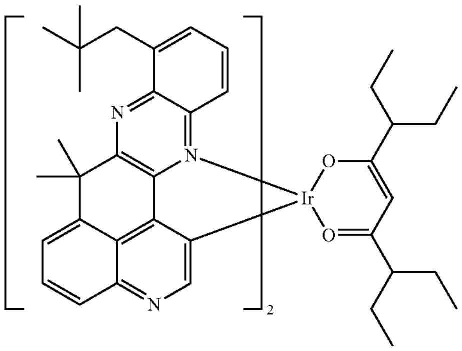
-continued
459
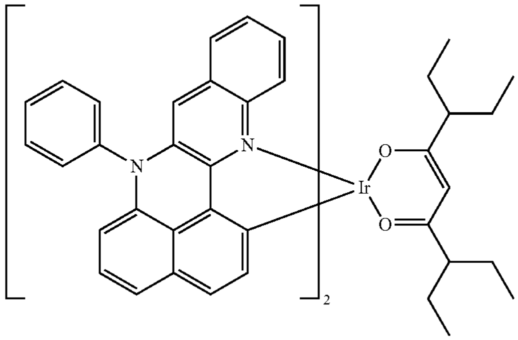
460
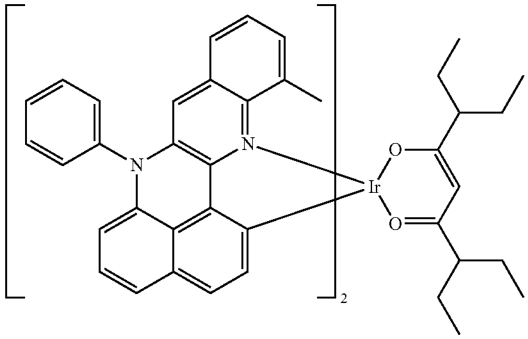
461
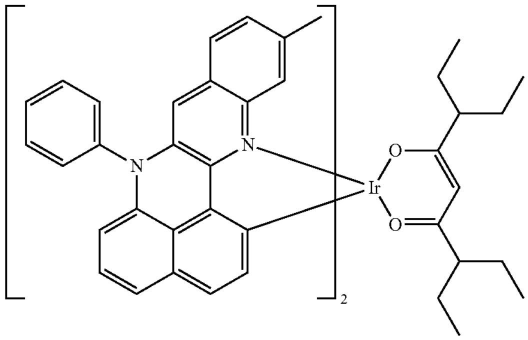
462
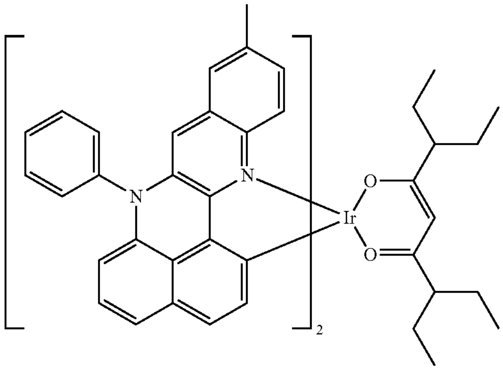

-continued
463
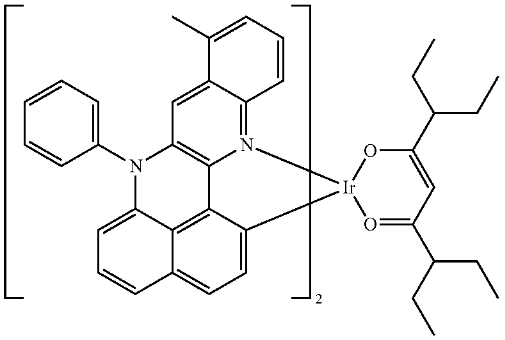
464
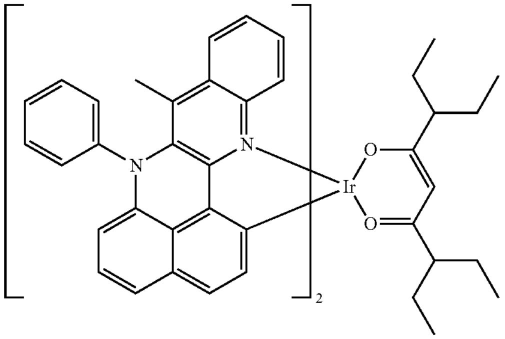
465
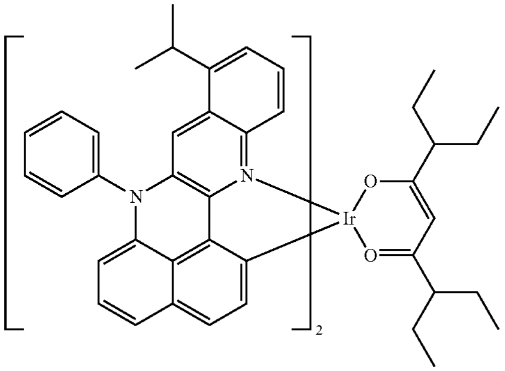
466
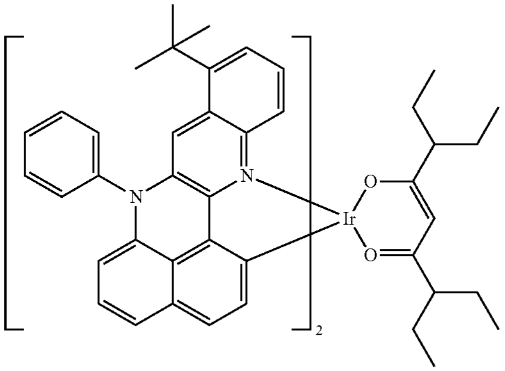
-continued
467
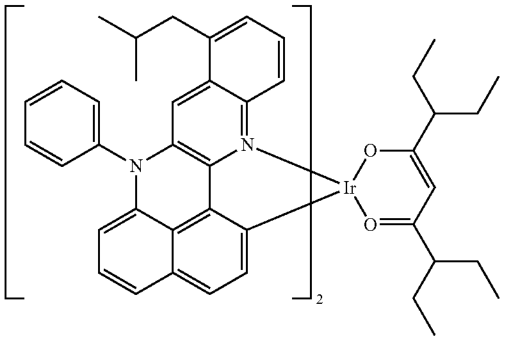
468
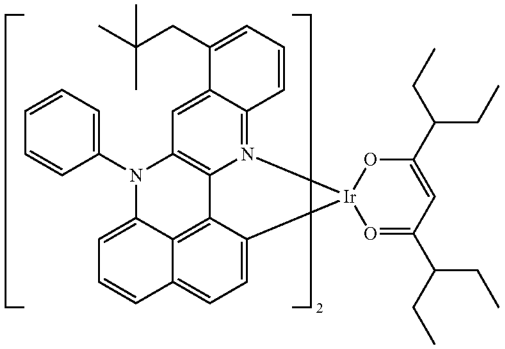
469
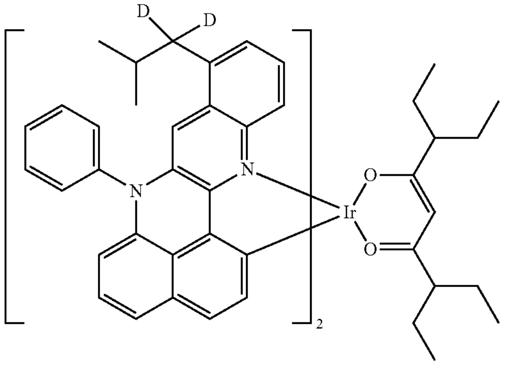
470
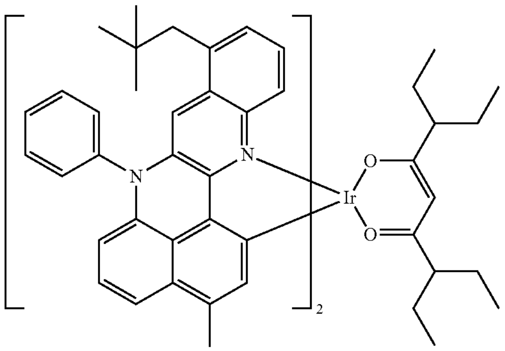

-continued
471
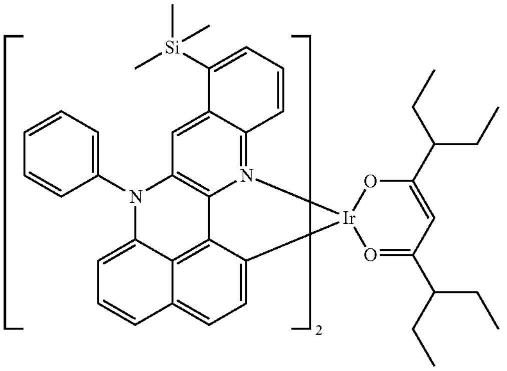
472
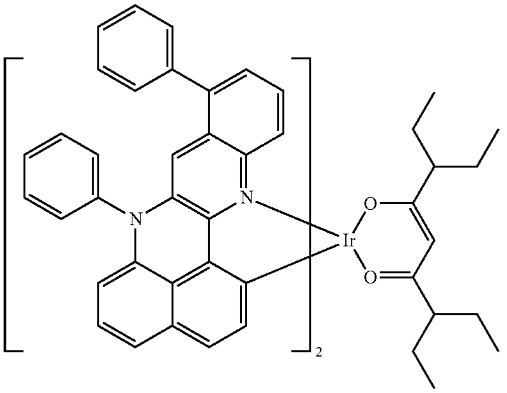
473
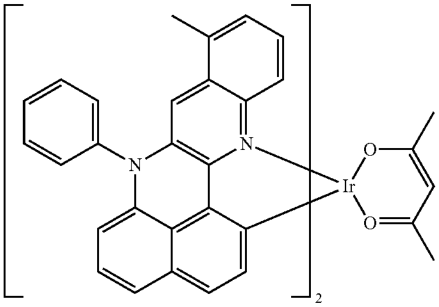
474
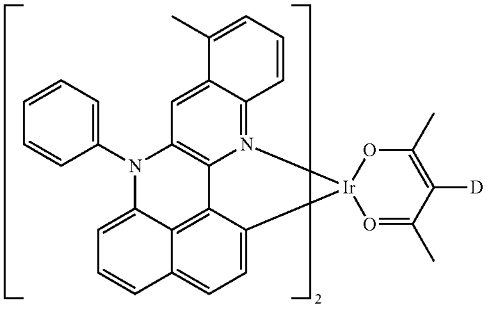
-continued
475
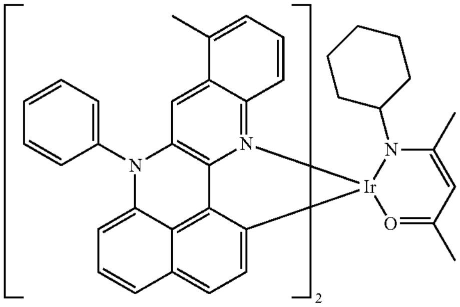
476
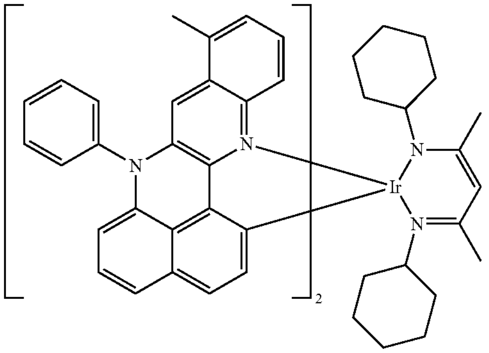
477
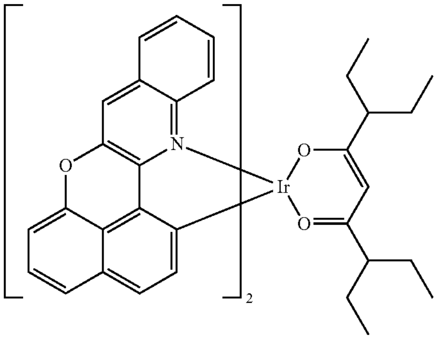
478
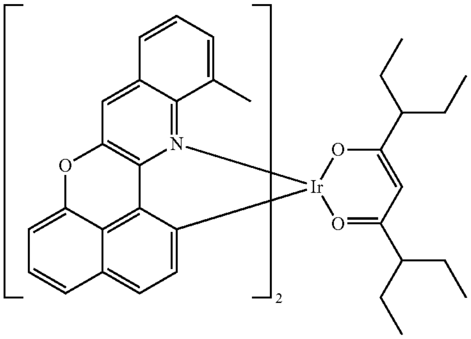

-continued
479
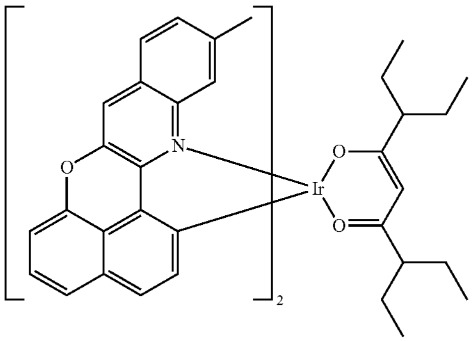
480
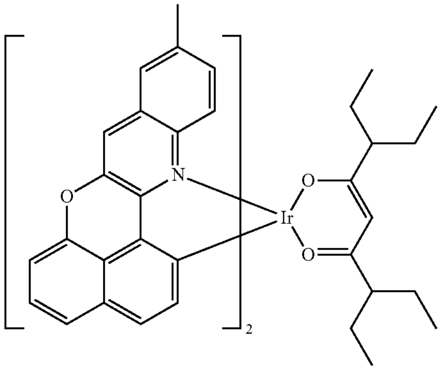
481
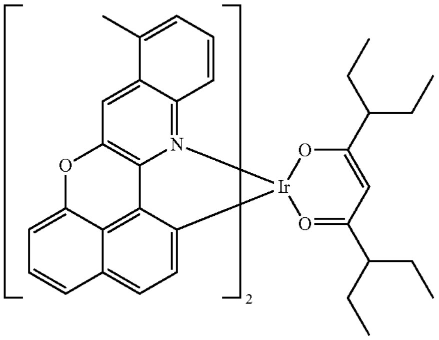
482
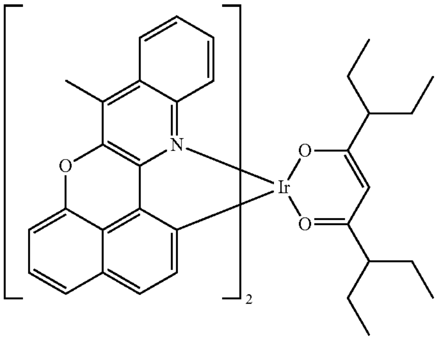
-continued
483
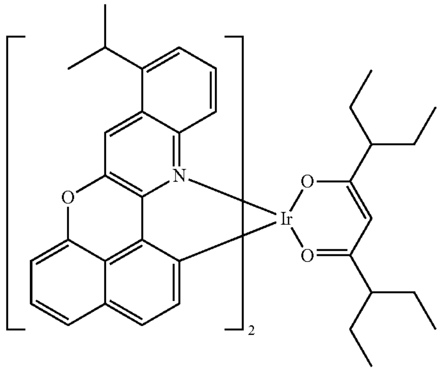
484
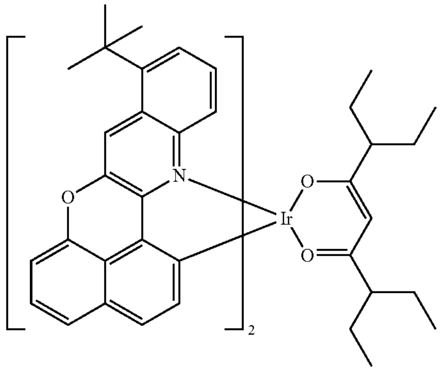
485
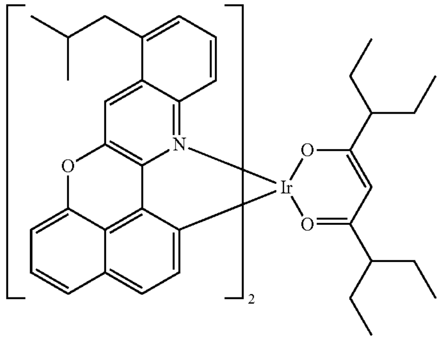
486
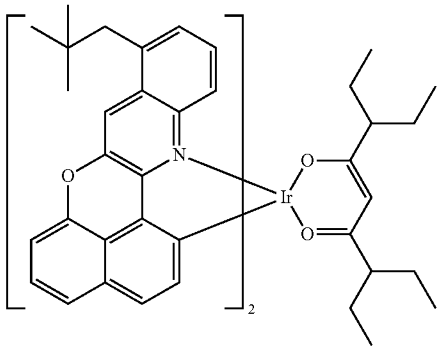

-continued
487
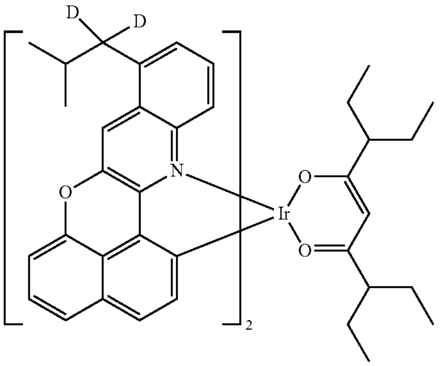
488
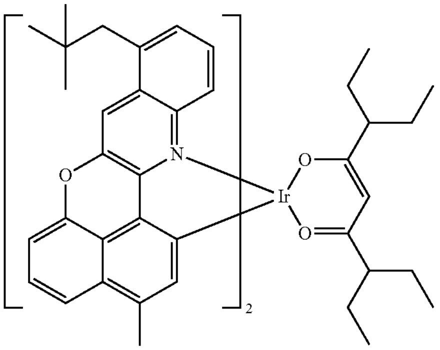
489
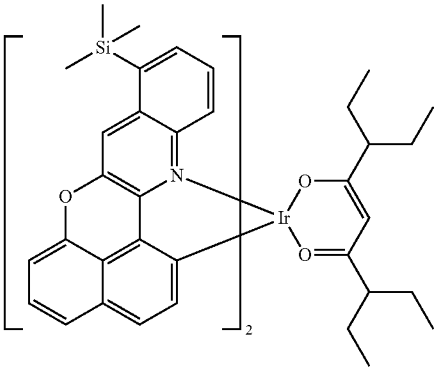
490
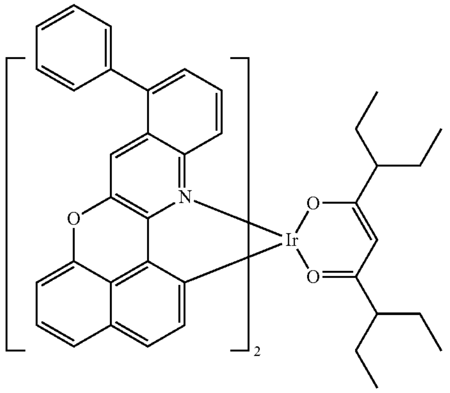
-continued
491
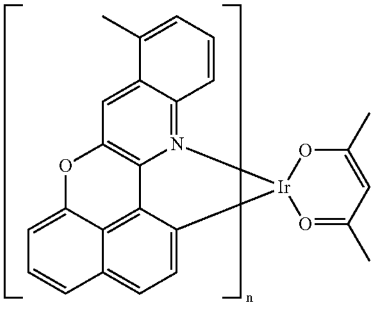
492
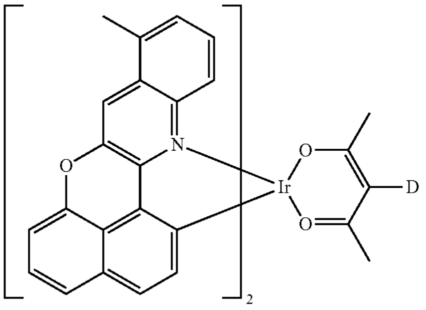
493
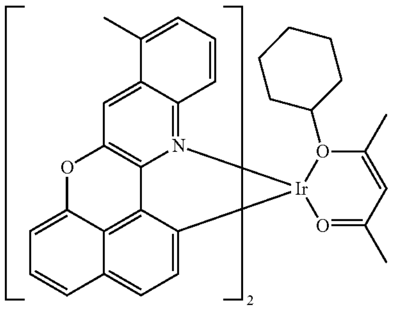
494
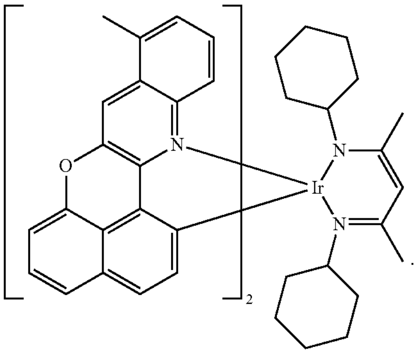
An organic metal compound in which $Y^4$ is an unsubstituted or substituted carbon atom among the organic metal compound having the structure of Formula 11 may include the following compounds 495-577 of Formula 15:

[Formula 15]
495
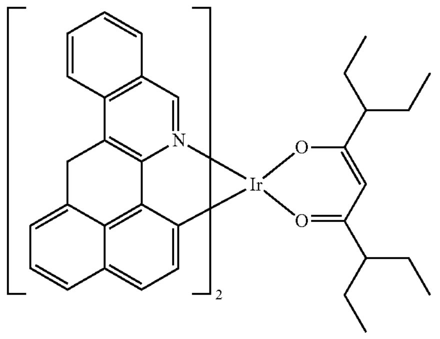
496
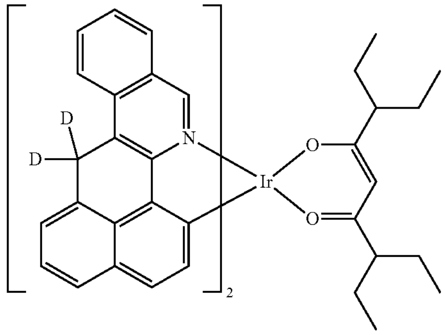
497
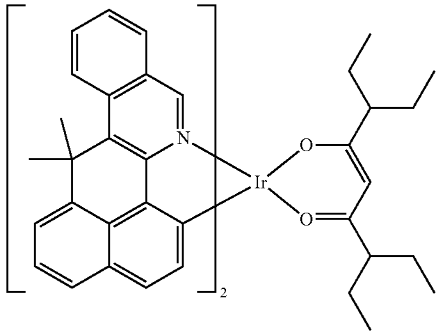
498
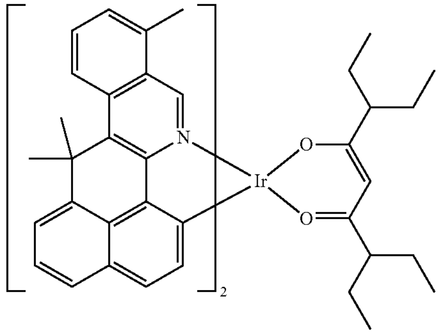
-continued
499
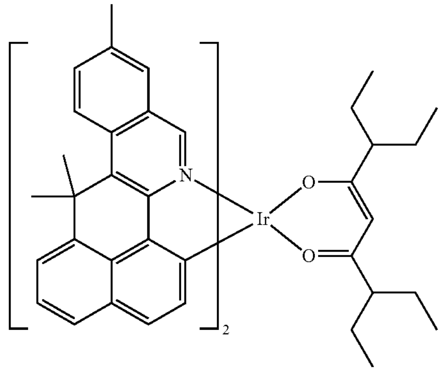
500
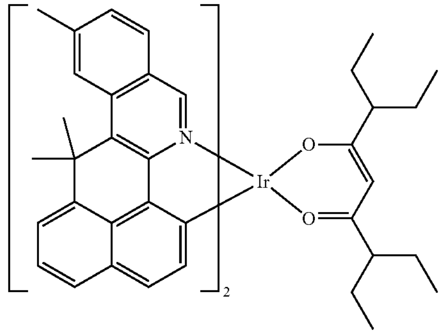
501
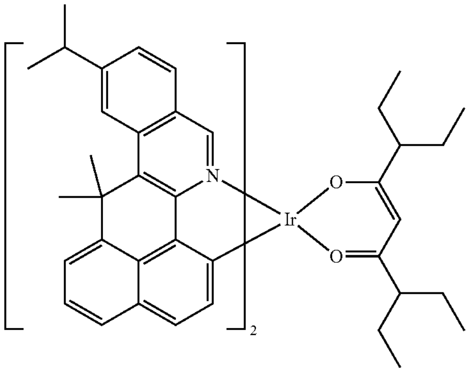
502
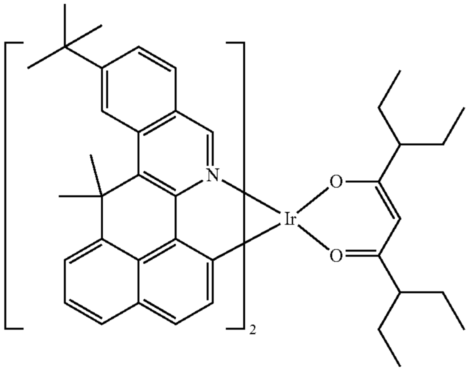

-continued
503
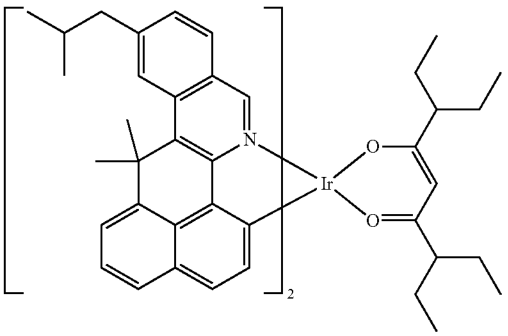
504
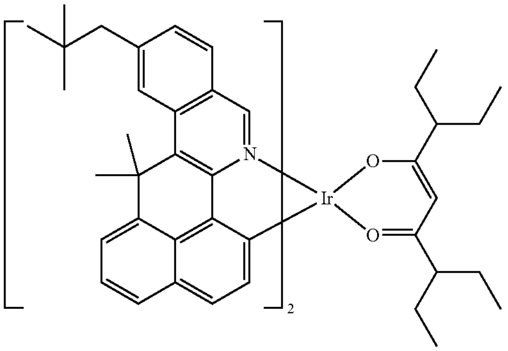
505
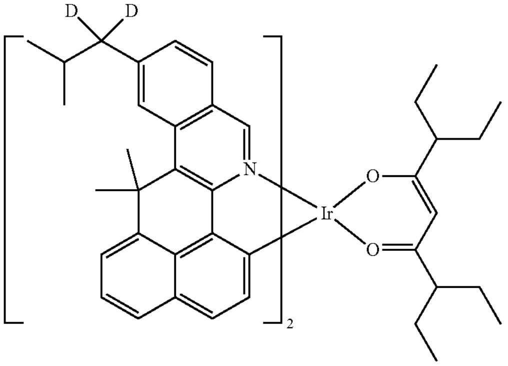
506
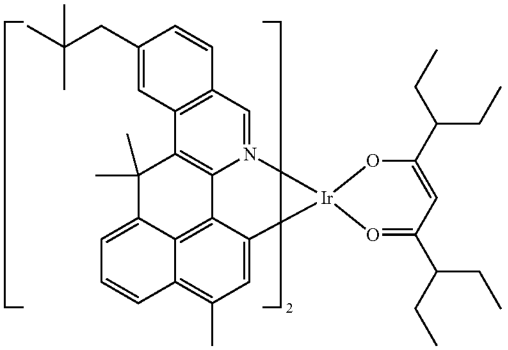
-continued
507
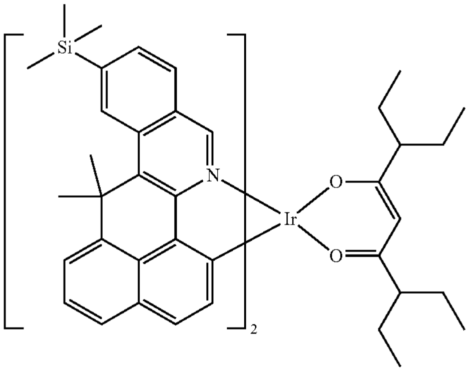
508
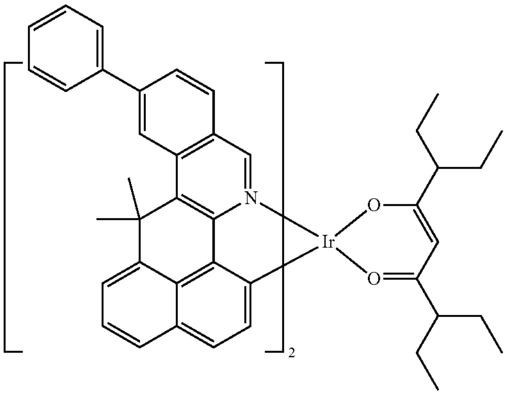
509
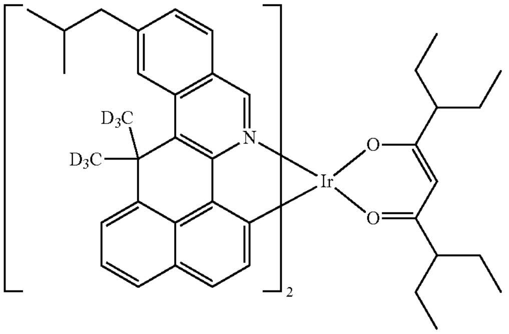
510
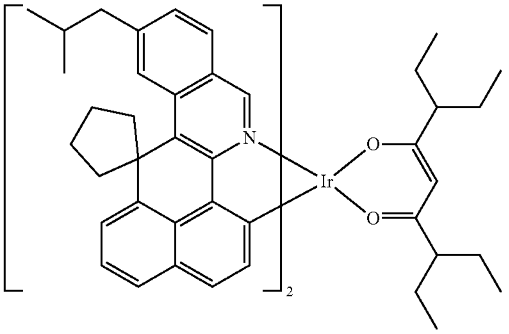

-continued
511
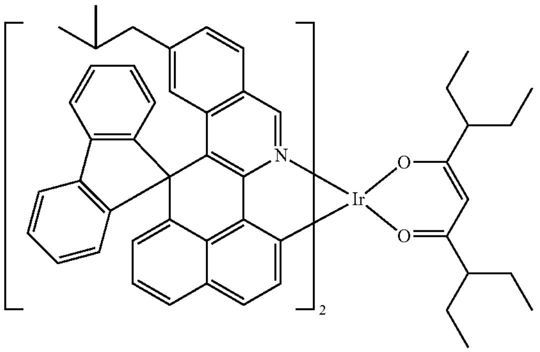
512
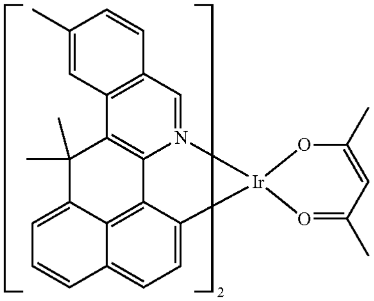
513
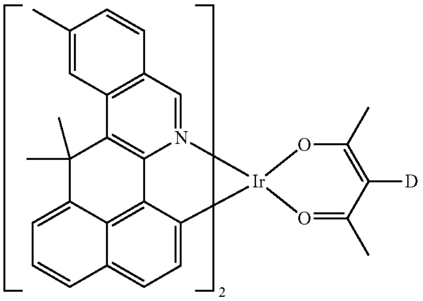
514
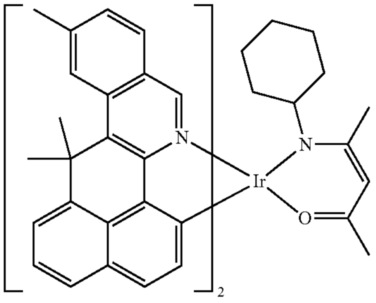
515
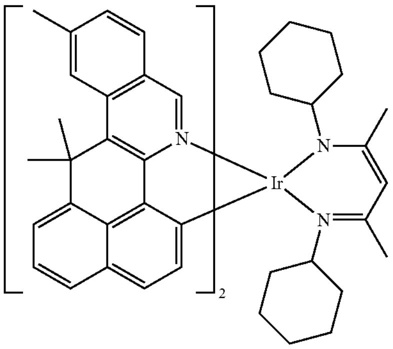
-continued
516
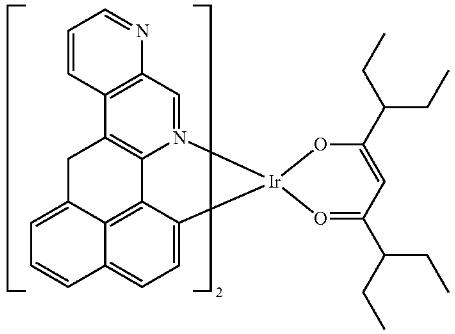
517
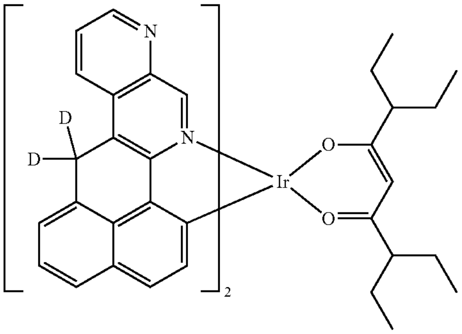
518
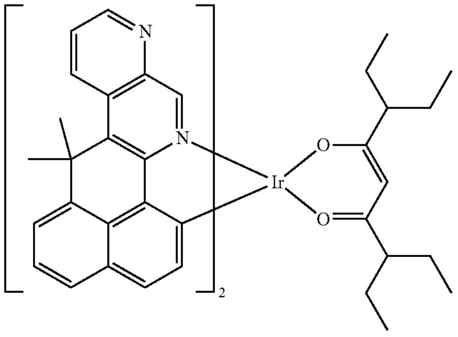
519
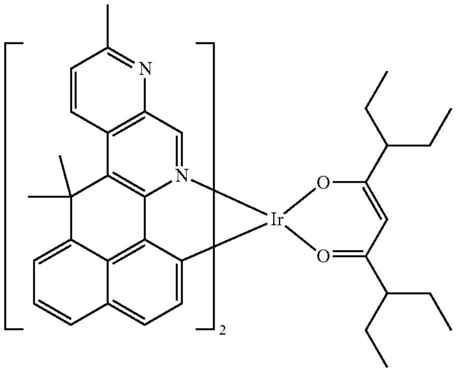

-continued
520
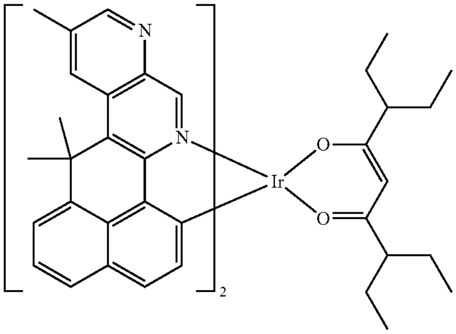
521
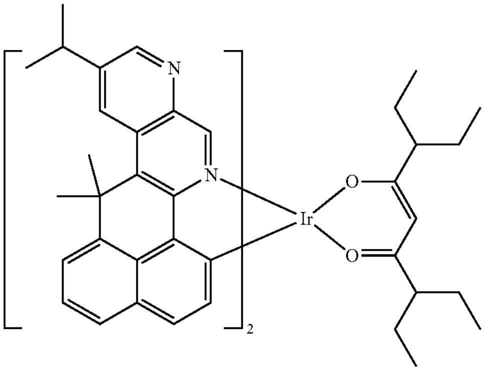
522
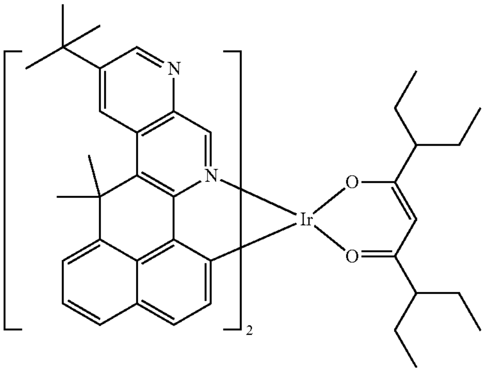
523
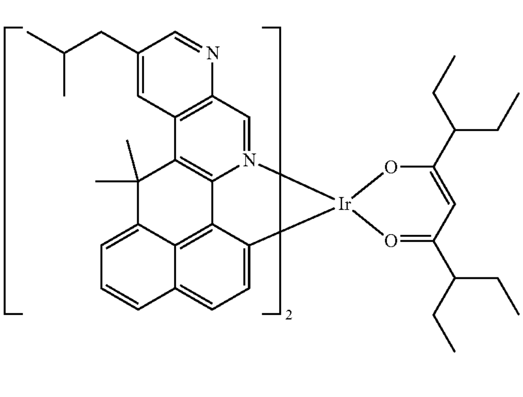
-continued
524
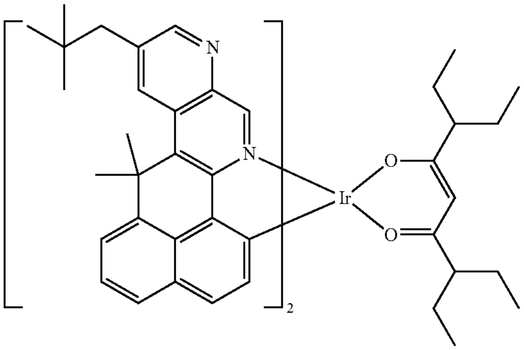
525
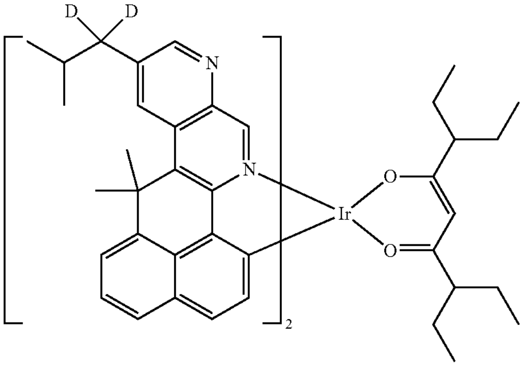
526
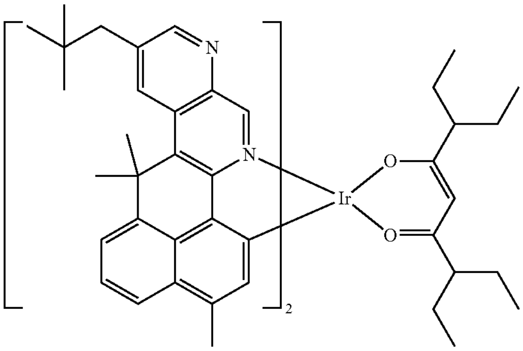
527
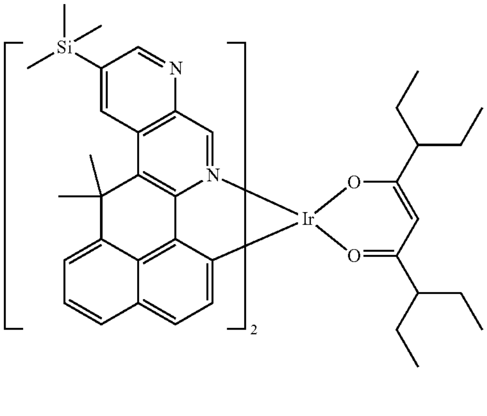

-continued
528
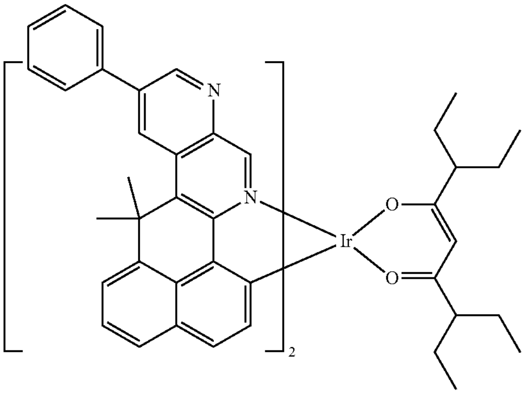
529
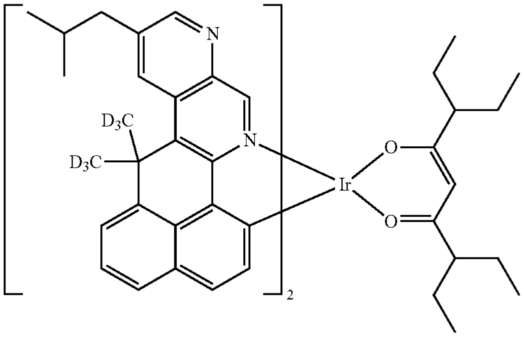
530
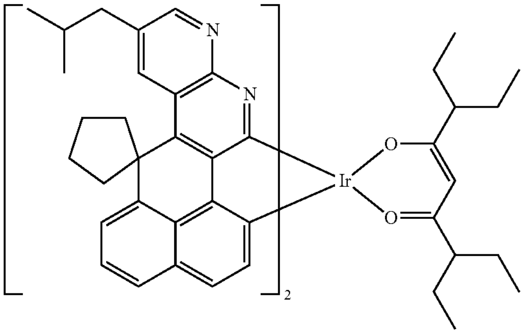
531
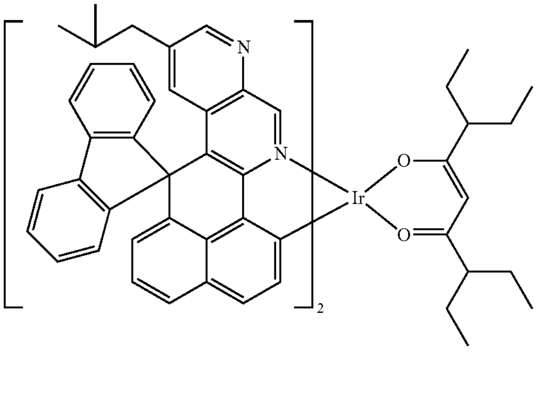
-continued
532
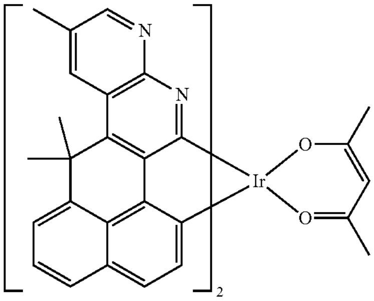
533
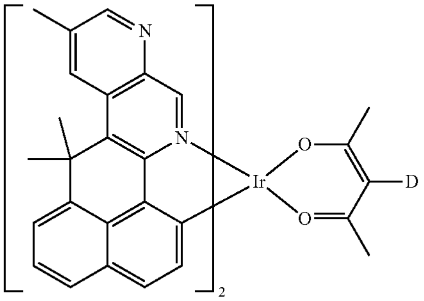
534
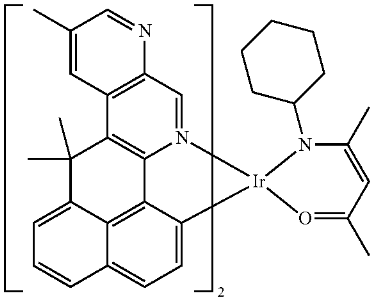
535
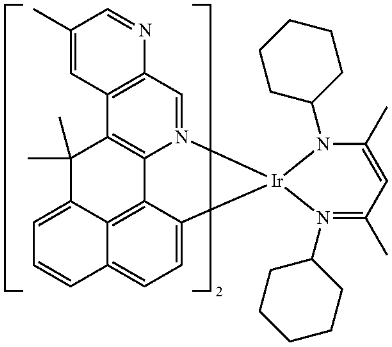
536
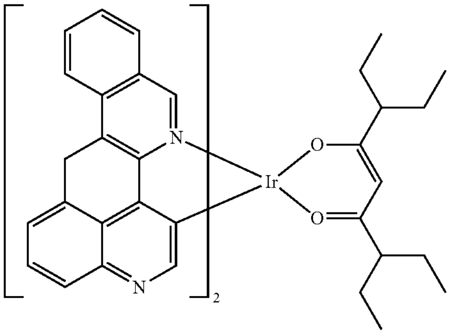

-continued
537
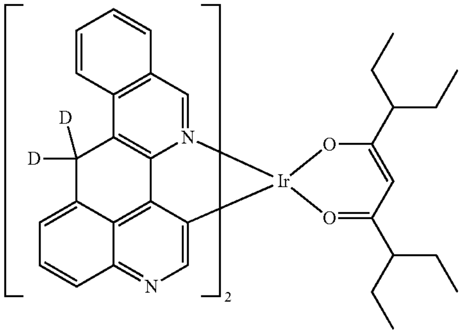
538
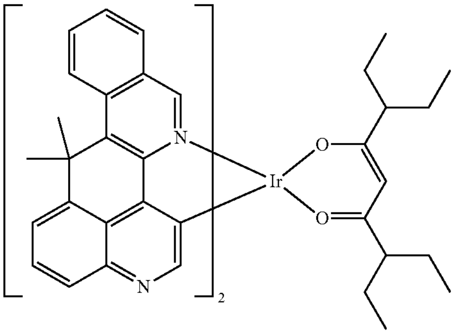
539
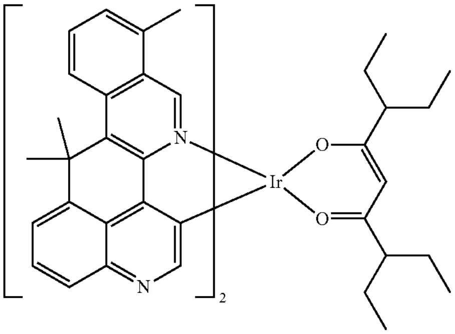
540
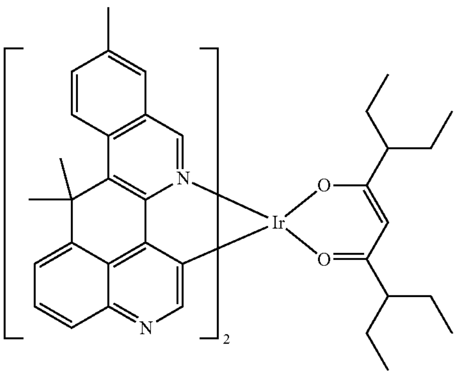
-continued
541
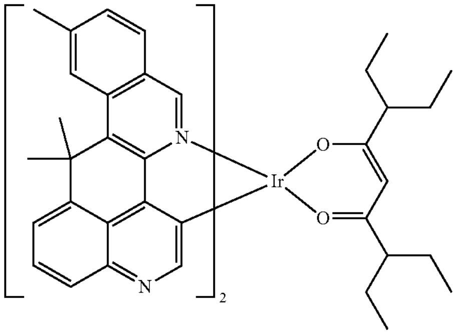
542
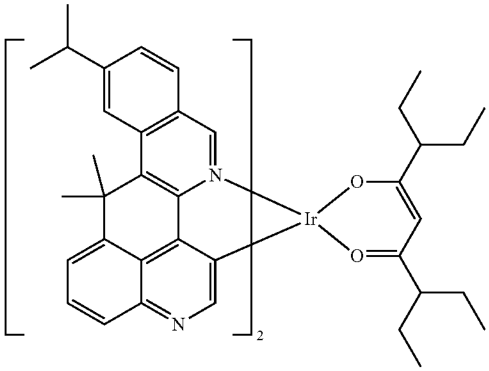
543
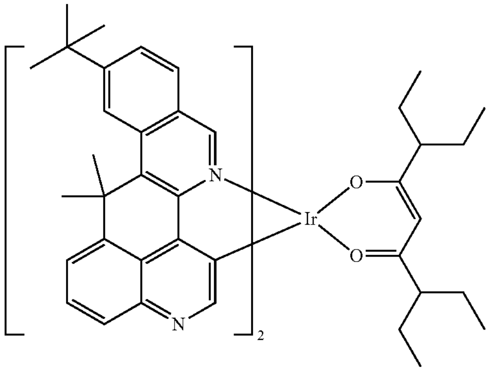
544
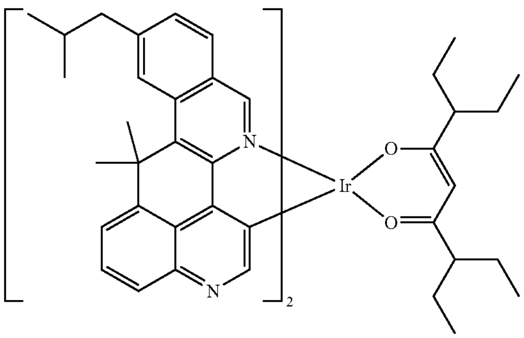

545
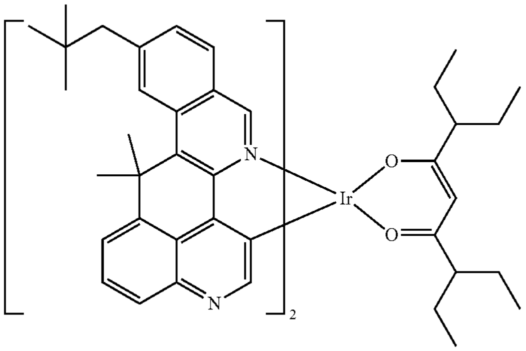
546
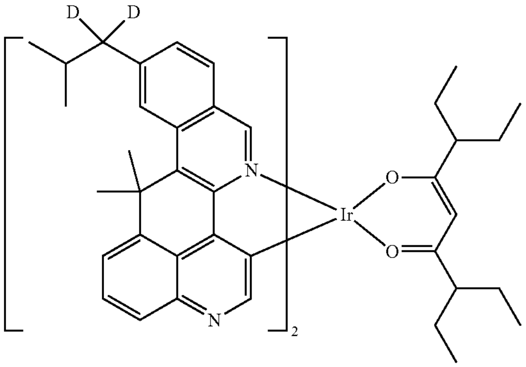
547
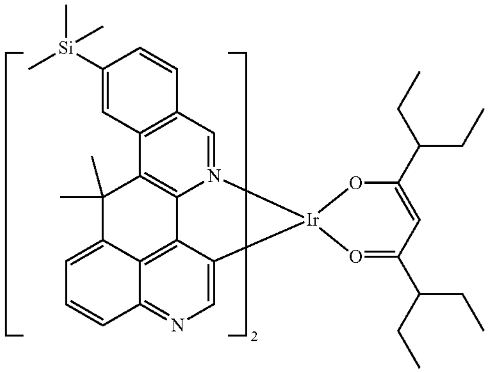
548
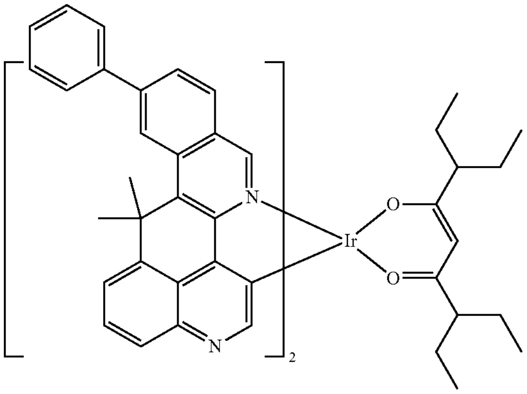
549
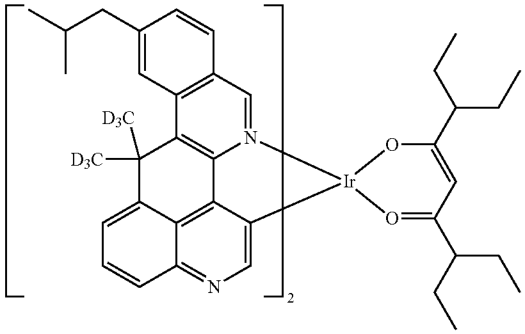
550
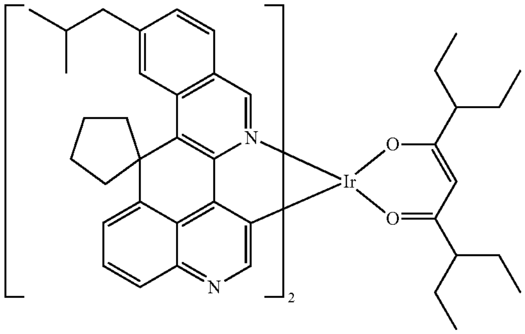
551
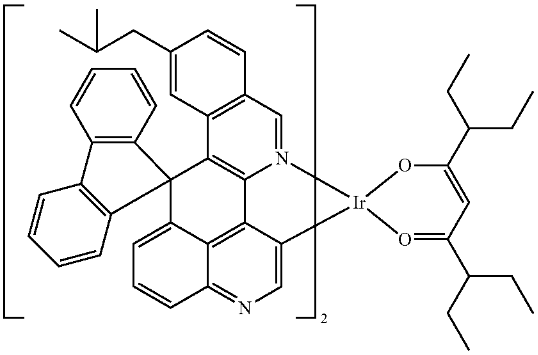
552
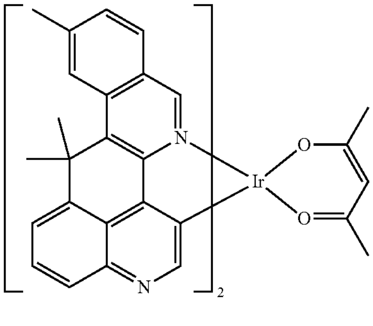

-continued
553
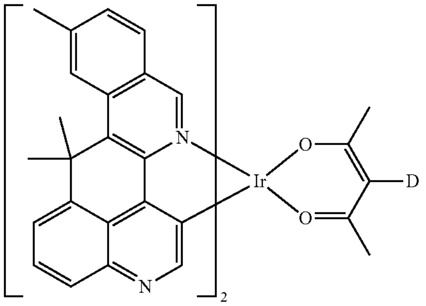
554
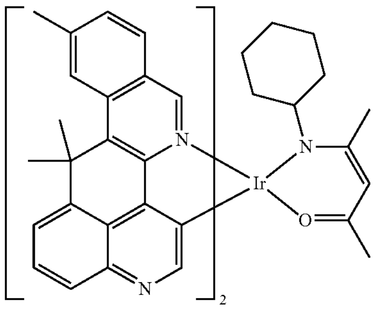
555
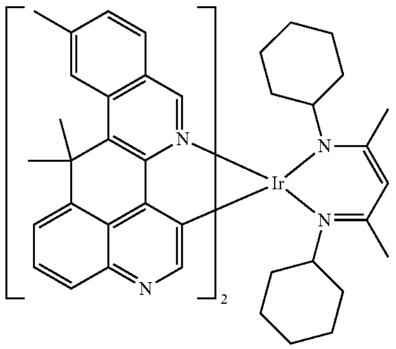
556
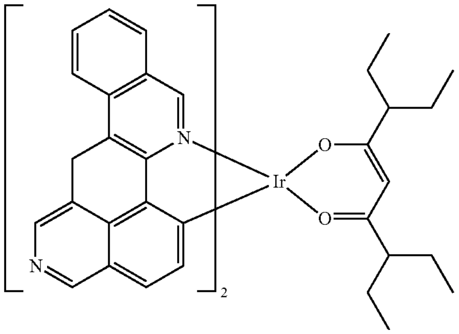
557
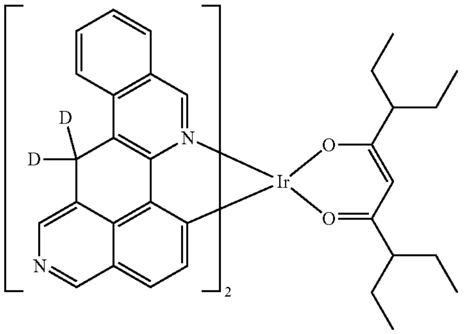
-continued
558
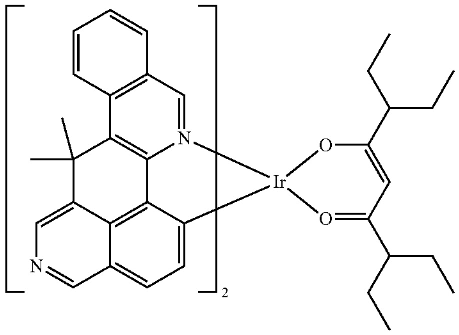
559
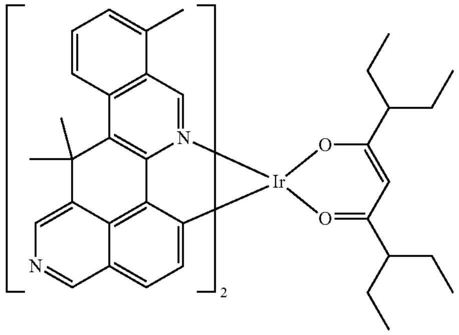
560
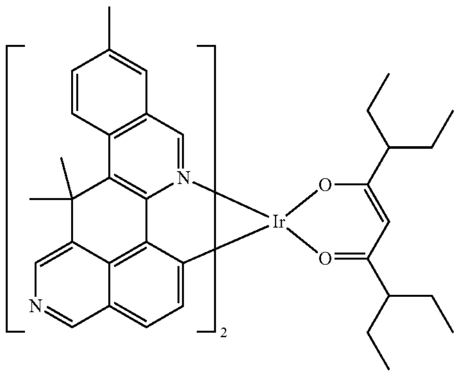
561
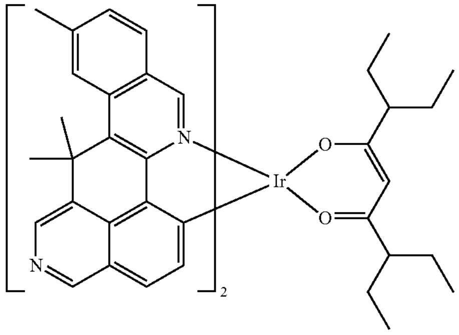

562
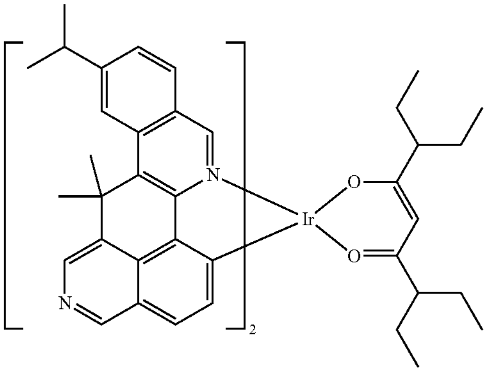
563
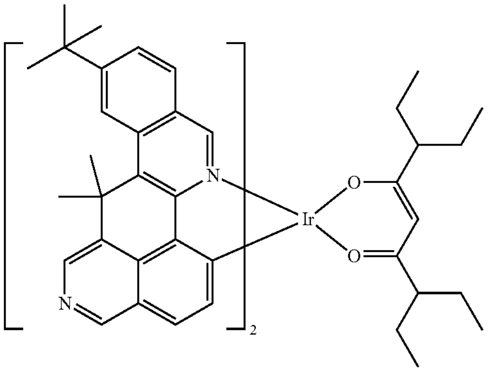
564
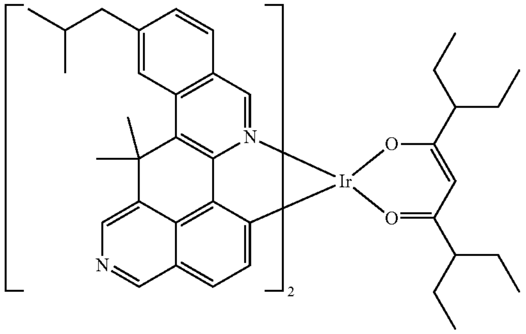
565
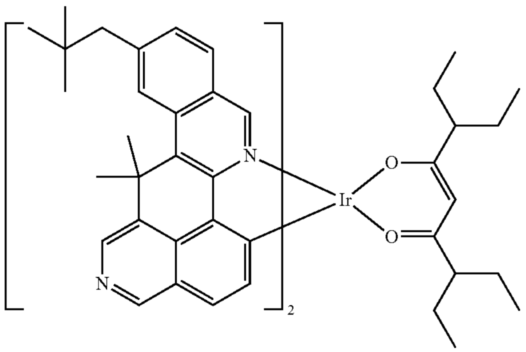
566
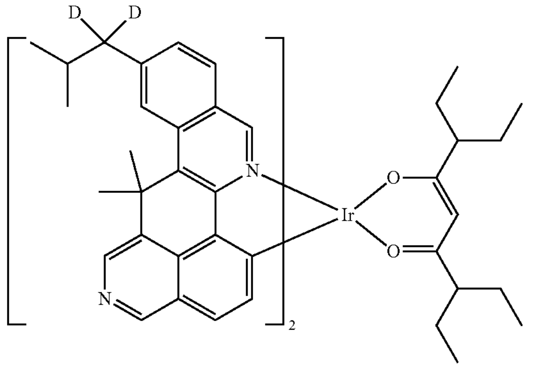
567
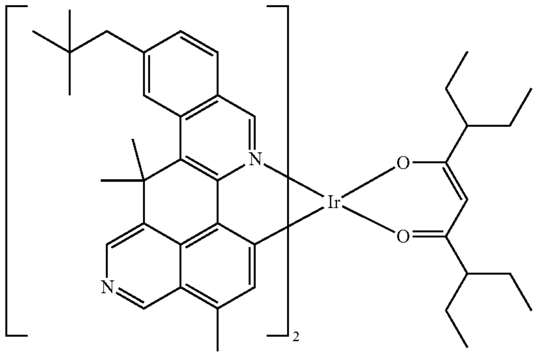
568
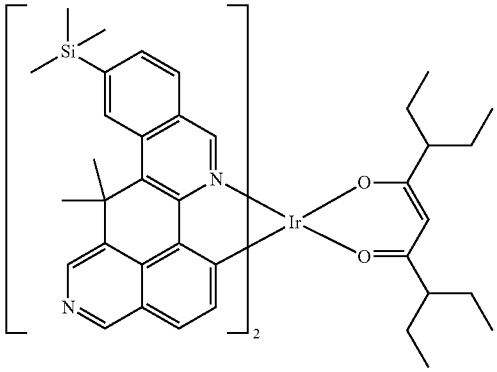
569
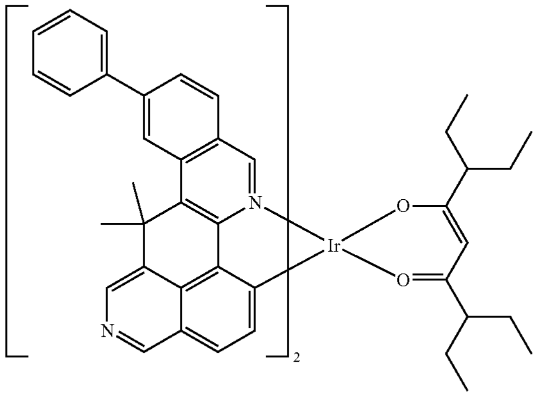

-continued
570
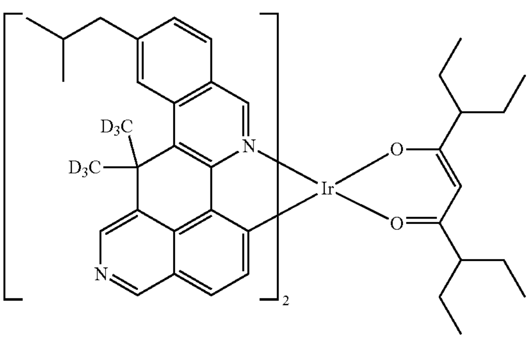
571
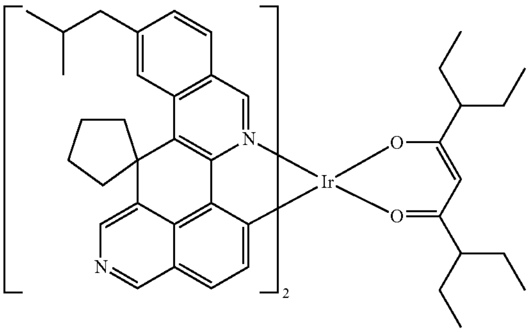
572
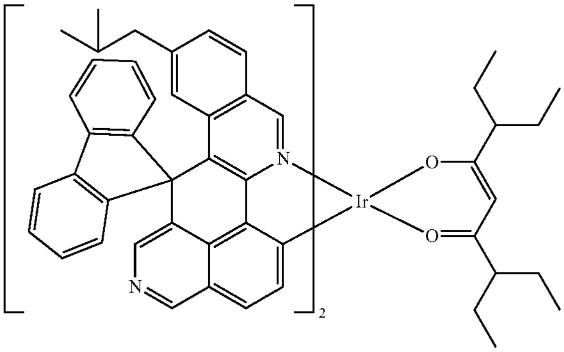
573
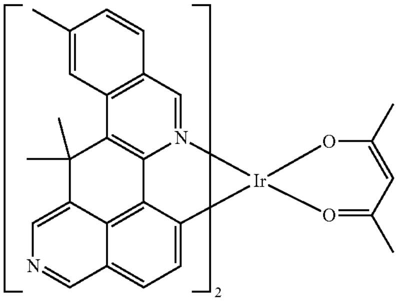
-continued
574
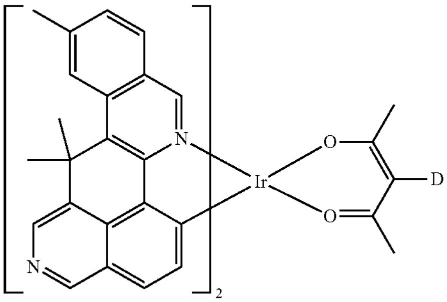
575
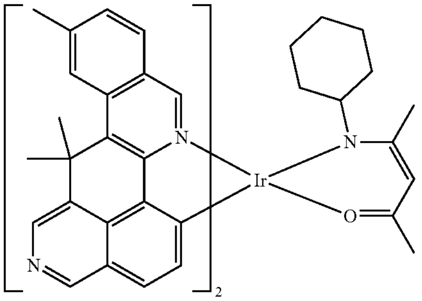
576
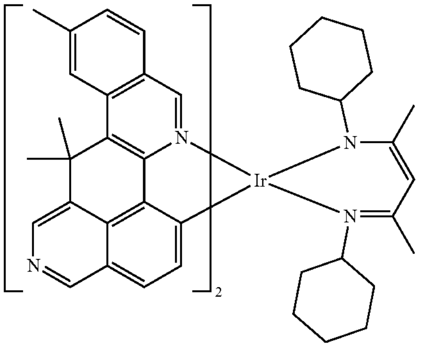
577
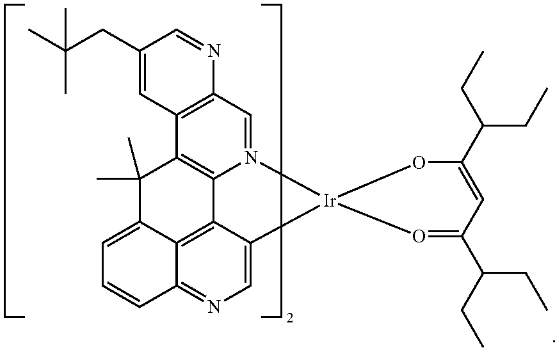
Alternatively, an organic metal compound in which $Y^4$ is unsubstituted or substituted hetero atom among the organic metal compound having the structure of Formula 11 may include the following compounds 578-609 of Formula 16:

-continued
[Formula 16]
578
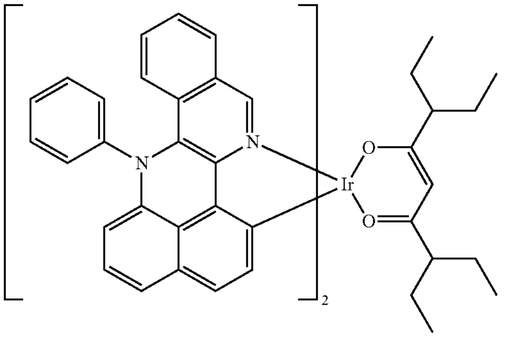
579
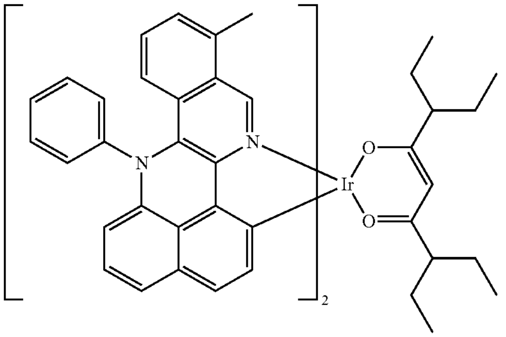
580
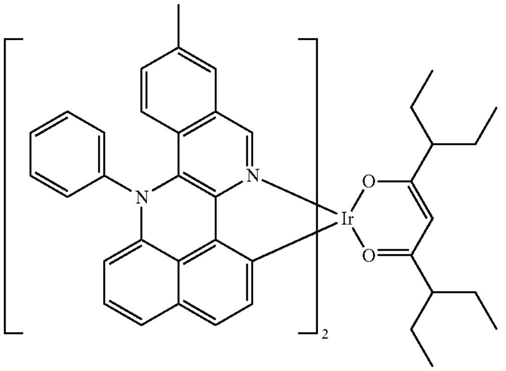
581
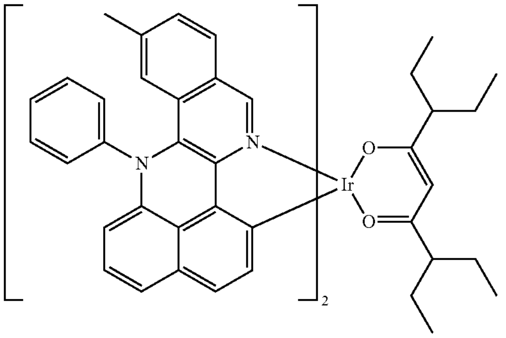
582
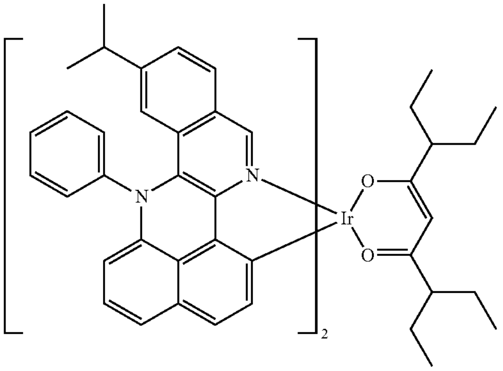
583
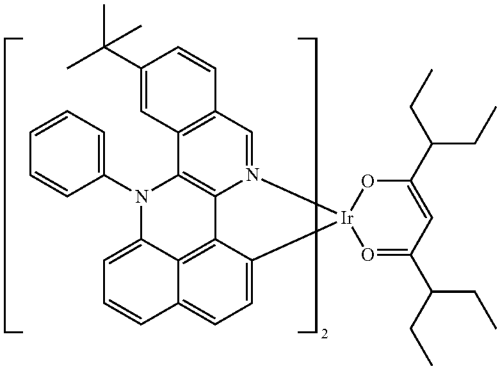
584
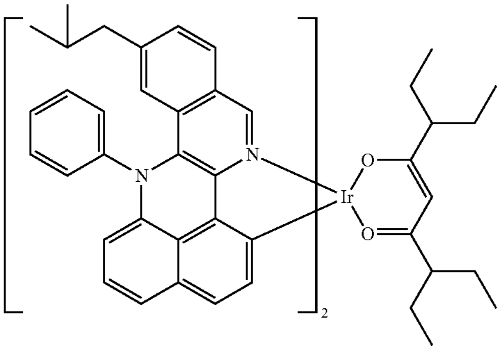
585
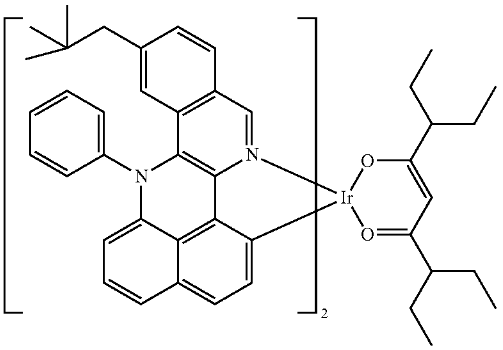

586
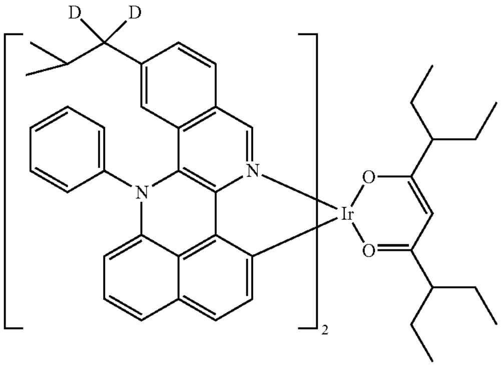
587
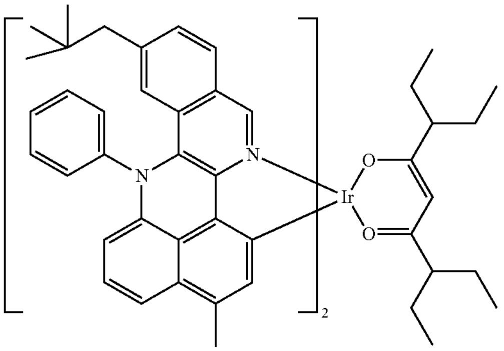
588
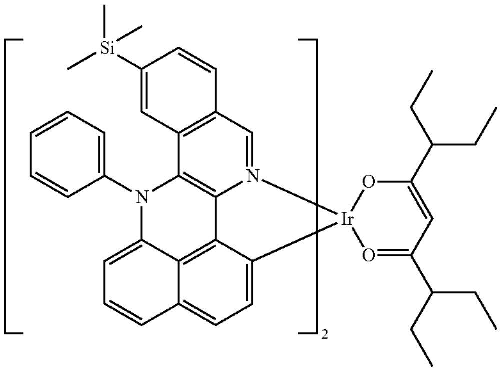
589
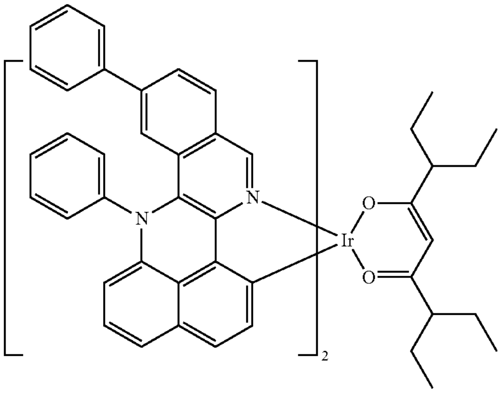
590
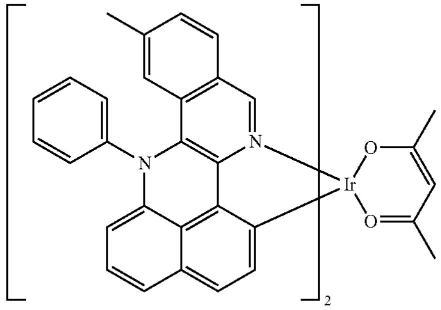
591
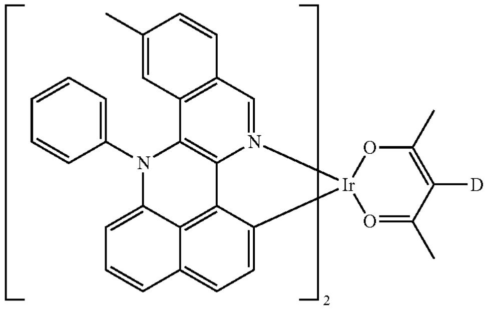
592
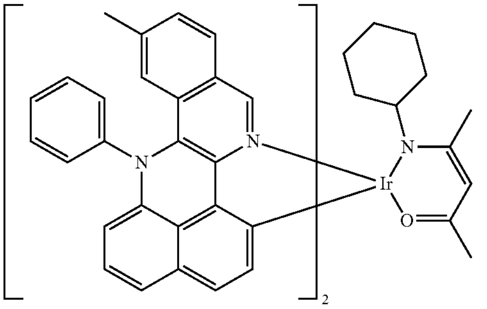
593
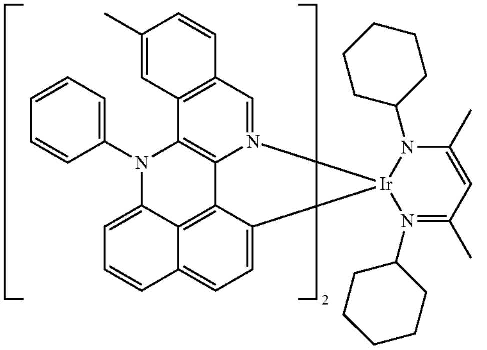
594
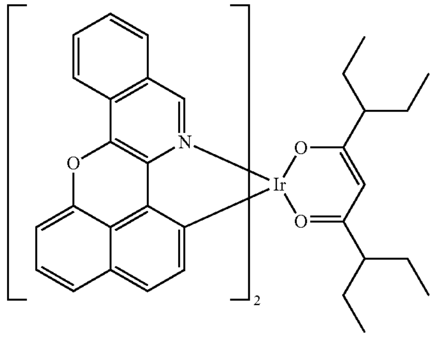

-continued
595
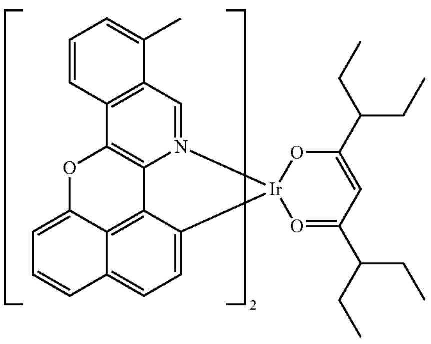
596
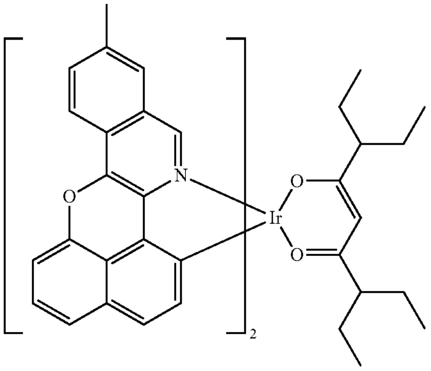
597
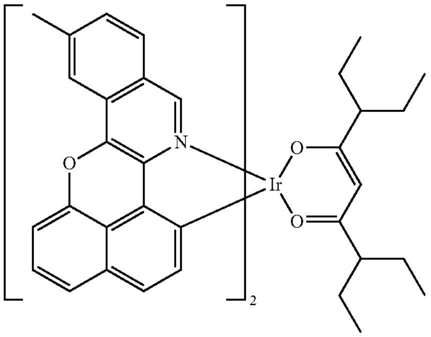
598
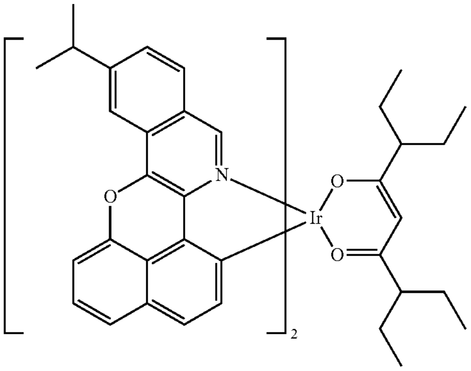
-continued
599
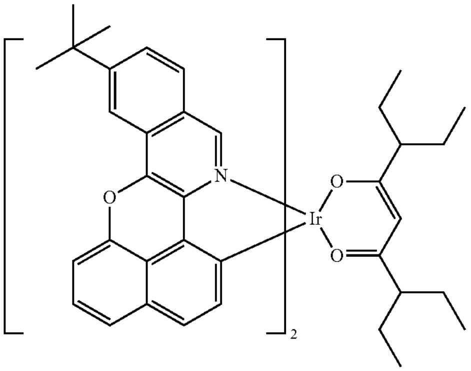
600
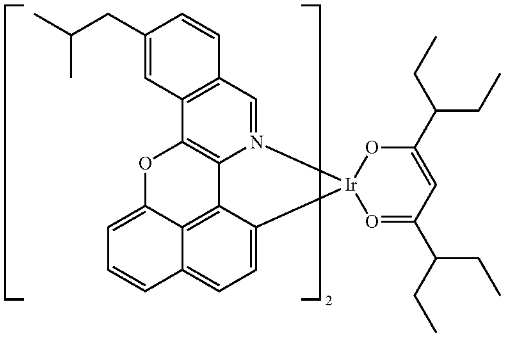
601
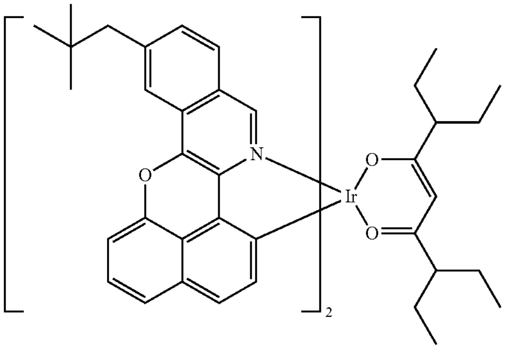
602
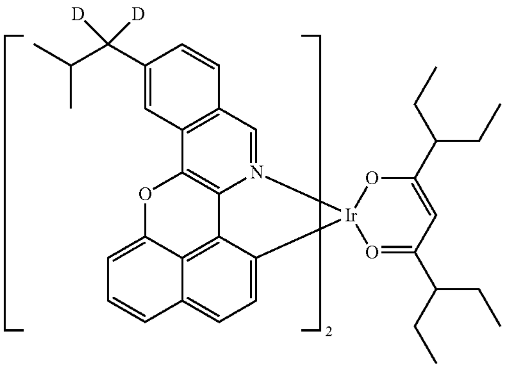

-continued

603

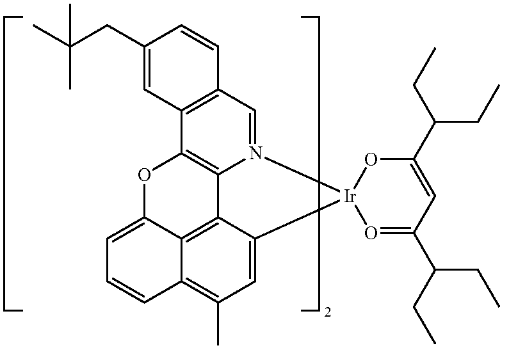

604

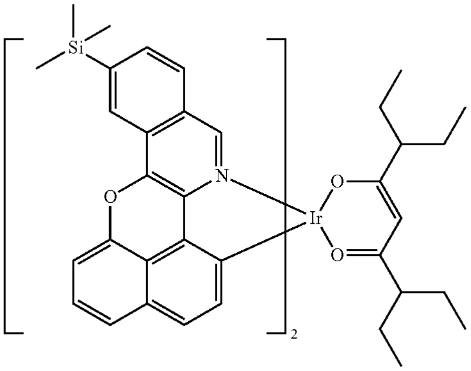

605

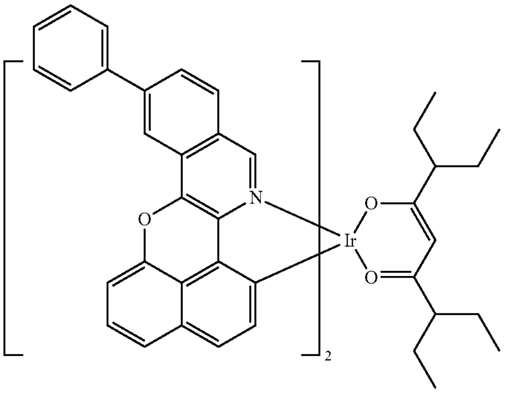

606

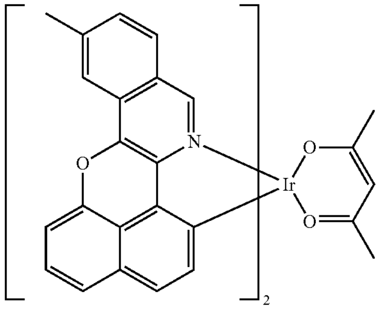

-continued

607

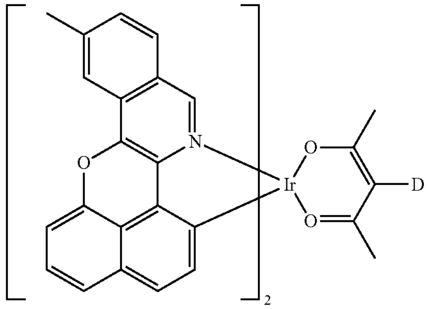

608

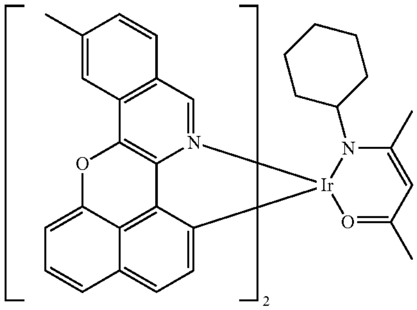

609

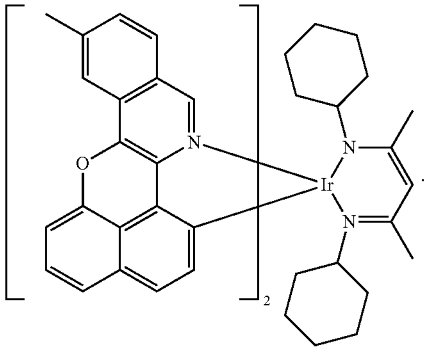

The organic metal compound having anyone of the structures of Formula 2 to Formula 12 includes a ligand consisting of multiple fused aromatic or hetero aromatic rings, so it has a rigid chemical conformation. The organic metal compound has narrow FWHM and can improve its color purity and luminous lifespan because it can maintain its stable chemical conformation in the emission process. In addition, since the organic metal compound is a metal complex with bidentate ligands, it is possible to control the emission color purity and emission colors with ease. Accordingly, an organic light emitting diode having excellent luminous efficiency by applying at least one of the organic metal compounds having the structure of Formulae 1 to 16 into an emissive layer.

[Organic Light Emitting Device and Organic Light Emitting Diode]

It is possible to realize an OLED having excellent luminous efficiency and improved luminous lifespan by applying the organic compound having the structure of either one of Formulae 1 to 16 into an emissive layer, for example an emitting material layer of the OLED. The OLED of the present disclosure may be applied to an organic light emitting device such as an organic light emitting display device or an organic light emitting illumination device. An organic light emitting display device including the OLED will be explained.

FIG. 1 is a schematic circuit diagram illustrating an organic light emitting display device in accordance with an exemplary aspect of the present disclosure. As illustrated in FIG. 1, a gate line GL, a data line DL and power line PL, each of which cross each other to define a pixel region P, in the organic light display device. A switching thin film transistor Ts, a driving thin film transistor Td, a storage capacitor Cst and an organic light emitting diode D are formed within the pixel region P. The pixel region P may include a red (R) pixel region, a green (G) pixel region and a blue (B) pixel region.

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied into the gate line GL, a data signal applied into the data line DL is applied into a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

Figure 2:
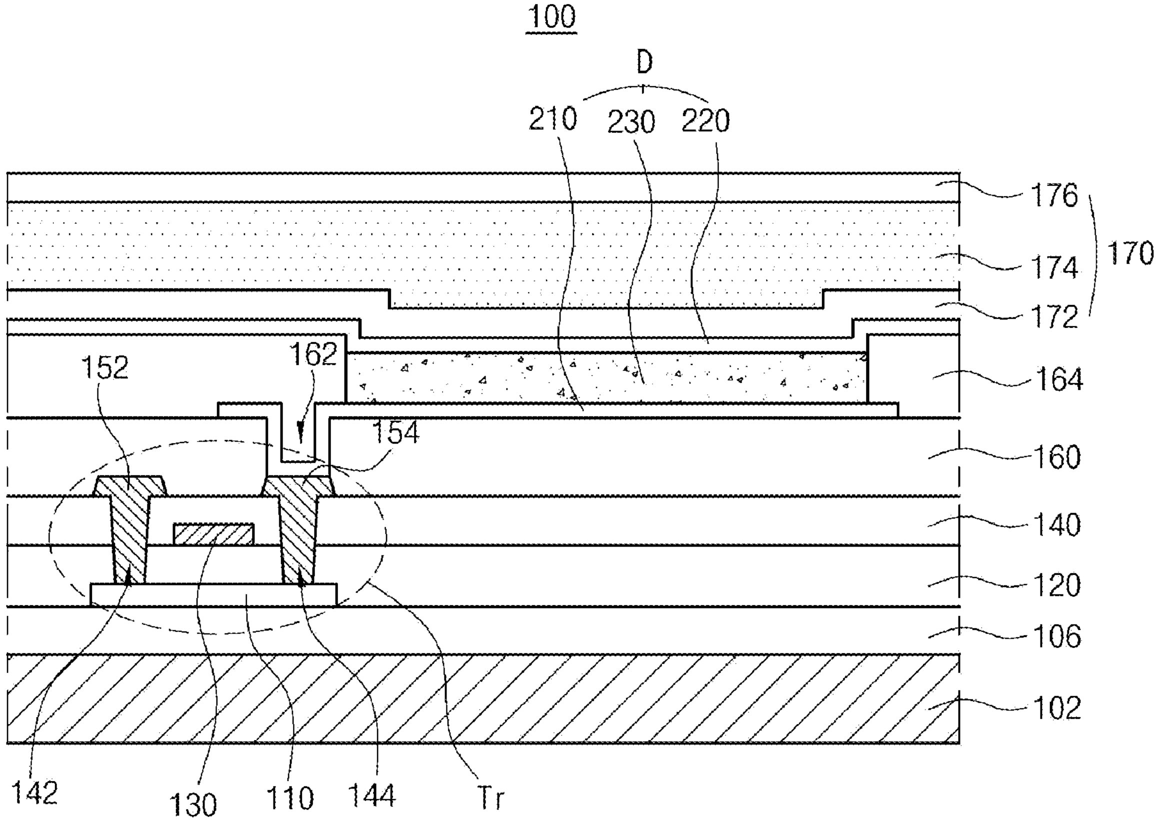
FIG. 2 is a cross-sectional view illustrating an organic light emitting display device as an example of an organic light emitting device in accordance with an exemplary aspect of the present disclosure.

FIG. 2 is a schematic cross-sectional view illustrating an organic light emitting display device in accordance with an exemplary aspect of the present disclosure. As illustrated in FIG. 2, the organic light emitting display device 100 comprises a substrate 102, a thin-film transistor Tr over the substrate 102, and an organic light emitting diode D connected to the thin film transistor Tr. As an example, the substrate 102 defines a red pixel, a green pixel and a blue pixel and the organic light emitting diode D is located in each pixel. In other words, the organic light emitting diode D, each of which emits red, green or blue light, is located correspondingly in the red pixel, the green pixel and the blue pixel.

The substrate 102 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 102, over which the thin film transistor Tr and the organic light emitting diode D are arranged, forms an array substrate.

A buffer layer 106 may be disposed over the substrate 102, and the thin film transistor Tr is disposed over the buffer layer 106. The buffer layer 106 may be omitted.

A semiconductor layer 110 is disposed over the buffer layer 106. In one exemplary aspect, the semiconductor layer 110 may include, but is not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light. Alternatively, the semiconductor layer 110 may include polycrystalline silicon. In this case, opposite edges of the semiconductor layer 110 may be doped with impurities.

A gate insulating layer 120 including an insulating material is disposed on the semiconductor layer 110. The gate insulating layer 120 may include, but is not limited to, an inorganic insulating material such as silicon oxide ($SiO_x$) or silicon nitride ($SiN_x$).

A gate electrode 130 made of a conductive material such as a metal is disposed over the gate insulating layer 120 so as to correspond to a center of the semiconductor layer 110. While the gate insulating layer 120 is disposed over a whole area of the substrate 102 in FIG. 2, the gate insulating layer 120 may be patterned identically as the gate electrode 130.

An interlayer insulating layer 140 including an insulating material is disposed on the gate electrode 130 with covering over an entire surface of the substrate 102. The interlayer insulating layer 140 may include an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 with spacing apart from the gate electrode 130. The first and second semiconductor layer contact holes 142 and 144 are formed within the gate insulating layer 120 as illustrated in FIG. 2. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and drain electrodes are disposed over the semiconductor layer. In this case, the semiconductor layer may include amorphous silicon.

Although not shown in FIG. 2, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 160 is disposed on the source and drain electrodes 152 and 154 with covering the thin film transistor Tr over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 144, it may be spaced apart from the second semiconductor layer contact hole 144.

The organic light emitting diode D (OLED D) includes a first electrode 210 that is disposed on the passivation layer 160 and connected to the drain electrode 154 of the thin film transistor Tr. The organic light emitting diode D further includes an emissive layer 230 and a second electrode 220 each of which is disposed sequentially on the first electrode 210.

The first electrode 210 is disposed in each pixel region. The first electrode 210 may be an anode and include conductive material having relatively high work function value. For example, the first electrode 210 may include, but is not limited to, a transparent conductive oxide (TCO) such as indium tin oxide (ITO), indium zinc oxide (IZO), indium tin zinc oxide (ITZO), SnO, ZnO, indium cerium oxide (ICO), aluminum doped zinc oxide (AZO), and the like.

In one exemplary aspect, when the organic light emitting display device 100 is a bottom-emission type, the first electrode 201 may have a single-layered structure of the TCO. Alternatively, when the organic light emitting display device 100 is a top-emission type, a reflective electrode or a reflective layer may be disposed under the first electrode 210. For example, the reflective electrode or the reflective layer may include, but are not limited to, silver (Ag) or aluminum-palladium-copper (APC) alloy. In the OLED D of the top-emission type, the first electrode 210 may have a triple-layered structure of ITO/Ag/ITO or ITO/APC/ITO.

In addition, a bank layer 164 is disposed on the passivation layer 160 in order to cover edges of the first electrode 210. The bank layer 164 exposes a center of the first electrode 210 corresponding to each pixel region. The bank layer 164 may be omitted.

An emissive layer 230 is disposed on the first electrode 210. In one exemplary aspect, the emissive layer 230 may have a single-layered structure of an emitting material layer (EML). Alternatively, the emissive layer 230 may have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see, FIGS. 3 and 5-8). In one aspect, the emissive layer 230 may have single emitting part. Alternatively, the emissive layer 230 may have multiple emitting parts to form a tandem structure.

The emissive layer 230 may comprise the organic metal compound having the structure of Formulae 1 to 16. The emissive layer 230 including the organic metal compound enables the OLED D and the organic light emitting device 100 to improve their luminous efficiency and luminous lifespan considerably.

The second electrode 220 is disposed over the substrate 102 above which the emissive layer 230 is disposed. The second electrode 220 may be disposed over a whole display area, and may include a conductive material with a relatively low work function value compared to the first electrode 210, and may be a cathode. For example, the second electrode 220 may include, but is not limited to, aluminum (Al), magnesium (Mg), calcium (Ca), silver (Ag), alloy thereof or combination thereof such as aluminum-magnesium alloy (Al—Mg). When the organic light emitting display device 100 is a top-emission type, the second electrode 220 is thin so as to have light-transmissive (semi-transmissive) property.

In addition, an encapsulation film 170 may be disposed over the second electrode 220 in order to prevent outer moisture from penetrating into the OLED D. The encapsulation film 170 may have, but is not limited to, a laminated structure of a first inorganic insulating film 172, an organic insulating film 174 and a second inorganic insulating film 176. The encapsulation film 170 may be omitted.

A polarizing plate may be attached onto the encapsulation film 170 to reduce reflection of external light. For example, the polarizing plate may be a circular polarizing plate. When the organic light emitting display device 100 is a bottom-emission type, the polarizer may be disposed under the substrate 100. Alternatively, when the organic light emitting display device 100 is a top-emission type, the polarizer may be disposed over the encapsulation film 170. In addition, a cover window may be attached to the encapsulation film 170 or the polarizer. In this case, the substrate 110 and the cover window may have a flexible property, thus the organic light emitting display device 100 may be a flexible display device.

Figure 3:
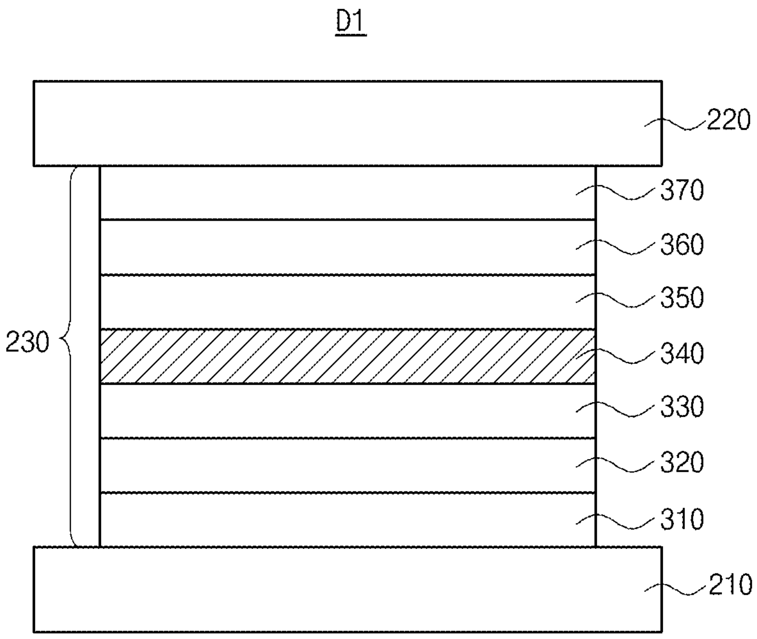
FIG. 3 is a cross-sectional view illustrating an organic light emitting diode having single emitting part in accordance with an exemplary aspect of the present disclosure.

Next, we will describe the OLED D including the organic metal compound in more detail. FIG. 3 is a schematic cross-sectional view illustrating an organic light emitting diode having a single emitting part in accordance with an exemplary embodiment of the present disclosure. As illustrated in FIG. 3, the organic light emitting diode D1 (OLED D1) in accordance with the present disclosure includes first and second electrodes 210 and 220 facing each other and an emissive layer 230 disposed between the first and second electrodes 210 and 220. The organic light emitting display device 100 includes a red pixel region, a green pixel region and a blue pixel region, and the OLED D1 may be disposed in the green or red pixel region.

In an exemplary embodiment, the emissive layer 230 includes an emitting material layer (EML) 340 disposed between the first and second electrodes 210 and 220. Also, the emissive layer 230 may comprise at least one of an HTL 320 disposed between the first electrode 210 and the EML 340 and an ETL 360 disposed between the second electrode 220 and the EML 340. Also, the emissive layer 230 may further comprise at least one of an HIL 310 disposed between the first electrode 210 and the HTL 320 and an EIL 370 disposed between the second electrode 220 and the ETL 360. Alternatively, the emissive layer 320 may further comprise a first exciton blocking layer, i.e. an EBL 330 disposed between the HTL 320 and the EML 340 and/or a second exciton blocking layer, i.e. a HBL 350 disposed between the EML 340 and the ETL 360.

The first electrode 210 may be an anode that provides a hole into the EML 340. The first electrode 210 may include a conductive material having a relatively high work function value, for example, a transparent conductive oxide (TCO). In an exemplary embodiment, the first electrode 210 may include, but is not limited to, ITO, IZO, ITZO, SnO, ZnO, ICO, AZO, and the like.

The second electrode 220 may be a cathode that provides an electron into the EML 340. The second electrode 220 may include a conductive material having a relatively low work function values, i.e., a highly reflective material such as Al, Mg, Ca, Ag, alloy thereof or combination thereof such as Al—Mg.

The HIL 310 is disposed between the first electrode 210 and the HTL 320 and improves an interface property between the inorganic first electrode 210 and the organic HTL 320. In one exemplary embodiment, the HIL 310 may include, but is not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; (HAT-CN), 1,3,5-tris[4-(diphenylamino)phenyl] benzene (TDAPB), poly(3,4-ethylenedioxythiphene)polystyrene sulfonate (PEDOT/PSS), 2,3,5,6-tetrafluoro-7,7,8,8-tetracyanoquinodimethane (F4TCNQ), N-(biphenyl-4-yl)-9,9-dimethyl-N-(4-(9-phenyl-9H-carbazol-3-yl)phenyl)-9H-fluoren-2-amine, N,N'-diphenyl-N,N'-di[4-(N,N'-diphenyl-amino)phenyl]benzidine (NPNPB) and combination thereof. The HIL 310 may be omitted in compliance of the OLED D1 property.

The HTL 320 is disposed adjacently to the EML 340 between the first electrode 210 and the EML 340. In one exemplary embodiment, the HTL 320 may include, but is not limited to, N,N'-Diphenyl-N,N'-bis(3-methylphenyl-1,1'-biphenyl-4,4'-diamine (TPD), N,N'-Di(1-naphthyl)-N,N'-diphenyl-(1,1'-biphenyl)-4,4'-diamine (NPB or NPD), N,N'-bis[4-[bis(3-methylphenyl)amino]phenyl]-N,N'-diphenyl-[1,1'-biphenyl]-4,4'-diamine (DNTPD), 4,4'-bis(N-carbazolyl)-1,1'-biphenyl (CBP), Poly[N,N'-bis(4-butylphenyl)-N,N'-bis(phenyl)-benzidine](Poly-TPD), Poly[(9,9-dioctylfluorenyl-2,7-diyl)-co-(4,4'-(N-(4-sec-butylphenyl)diphenylamine))] (TFB), 1,1-bis(4-(N,N'-di(p-tolyl)amino)phenyl)cyclohexane (TAPC), 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine and combination thereof.

The EML 340 may comprise a host (first host) and a dopant (first dopant) in which substantial emission is occurred. As an example, the EML 340 may emit yellow to red colors. For example, the organic metal compounds having the structure of Formulae 1 to 16 may be used as the dopant in the EML 340.

The ETL 360 and the EIL 370 may be laminated sequentially between the EML 340 and the second electrode 220. The ETL 360 includes a material having high electron mobility so as to provide electrons stably with the EML 340 by fast electron transportation.

In one exemplary aspect, the ETL 360 may comprise, but is not limited to, at least one of oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 360 may comprise, but is not limited to, tris-(8-hydroxyquinoline aluminum ($Alq_3$), Bis (2-methyl-8-quinolinolato-N1,O8)-(1,1'-biphenyl-4-olato) aluminum (BAlq), lithium quinolate (Liq), 2-biphenyl-4-yl-5-(4-t-butylphenyl)-1,3,4-oxadiazole (PBD), spiro-PBD, 1,3,5-Tris(N-phenylbenzimidazol-2-yl)benzene (TPBi), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), diphenyl-4-triphenysilyl-phenylphosphine oxide (TSPO1), 2-[4-(9,10-di-2-naphthalen-2-yl-2-anthracen-2-yl)phenyl]1-phenyl-1H-benzimidazole (ZADN) and combination thereof.

The EIL 370 is disposed between the second electrode 220 and the ETL 360, and can improve physical properties of the second electrode 220 and therefore, can enhance the lifetime of the OLED D1. In one exemplary aspect, the EIL 370 may comprise, but is not limited to, an alkali metal halide or an alkaline earth metal halide such as LiF, CsF, NaF, $BaF_2$ and the like, and/or an organic metal compound such as Liq, lithium benzoate, sodium stearate, and the like.

When holes are transferred to the second electrode 220 via the EML 340 and/or electrons are transferred to the first electrode 210 via the EML 340, the OLED D1 may have short lifetime and reduced luminous efficiency. In order to prevent these phenomena, the OLED D1 in accordance with this aspect of the present disclosure may have at least one exciton blocking layer adjacent to the EML 340.

For example, the OLED D1 may include the EBL 330 between the HTL 320 and the EML 340 so as to control and prevent electron transfers. In one exemplary aspect, the EBL 330 may comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1,3-bis(carbazol-9-yl) benzene (mCP), 3,3'-bis(N-carbazolyl)-1,1'-biphenyl (mCBP), CuPc, N,N'-bis[4-(bis(3-methylphenyl)amino) phenyl]-N,N'-diphenyl-[1,1'-biphenyl]-4,4'-diamine (DNTPD), TDAPB, DCDPA, 2,8-bis(9-phenyl-9H-carbazol-3-yl)dibenzo[b,d]thiophene and combination thereof.

In addition, the OLED D1 may further include the HBL 350 as a second exciton blocking layer between the EML 340 and the ETL 360 so that holes cannot be transferred from the EML 340 to the ETL 360. In one exemplary aspect, the HBL 350 may comprise, but is not limited to, at least one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 360.

For example, the HBL 350 may comprise a compound having a relatively low HOMO energy level compared to the luminescent materials in EML 340. The HBL 350 may comprise, but is not limited to, $Alq_3$, BAlq, Liq, PBD, spiro-PBD, BCP, bis-4,5-(3,5-di-3-pyridylphenyl)-2-methylpyrimidine (B3PYMPM), bis[2-(diphenylphosphino)phenyl]ether oxide (DPEPO), 9-(6-(9H-carbazol-9-yl)pyridine-3-yl)-9H-3,9'-bicarbazole, Diphenyl[4-(triphenylsilyl) phenyl]phosphine oxide (TSPO1) and combination thereof.

As described above, the EML 340 may comprise the host and the dopant. The dopant may comprise the organic metal compound having the structure of Formulae 1 to 16.

The host used with the dopant may comprise, but is not limited to, 9-(3-(9H-carbazol-9-yl)phenyl)-9H-carbazole-3-carbonitrile (mCP-CN), CBP, mCBP, mCP, DPEPO, 2,8-bis (diphenlphosphoryl)dibenzothiphene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-bipheyl]-3,5-dicarbonitrile (DCzTPA), 4'-(9H-carbazol-9-yl)biphenyl-3,5-dicarbonitrile(4'-(9H-carbazol-9-yl) biphenyl-3,5-dicarbonitrile (pCzB-2CN), 3'-(9H-carbazol- 9-yl)biphenyl-3,5-dicarbonitrile (mCzB-2CN), TSPO1, 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, 9,9'-Diphenyl-9H,9'H-3,3'-bicarbazole (BCzPh), 1,3,5-Tris(carbazole-9-yl) benzene (TCP), TCTA, 4,4'-Bis(carbazole-9-yl)-2,2'-dimethylbipheyl (CDBP), 2,7-Bis(carbazole-9-yl)-9,9-dimethylfluorene (DMFL-CBP), 2,2',7,7'-Tetrakis (carbazole-9-yl)-9,9-spiorofluorene (Spiro-CBP), 3,6-Bis (carbazole-9-yl)-9-(2-ethyl-hexyl)-9H-carbazole (TCzl) and combination thereof. For example, the contents of the dopant in the EML 340 may be between about 1 wt % to about 50 wt %, for example, about 1 wt % and about 30 wt %.

As described above, since the organic metal compounds having the structure of Formulae 1 to 16 have narrow FWHM and a rigid chemical conformation, it can show excellent color purity and luminous lifespan with maintaining its stable chemical conformation in the luminous process. Changing the structure of the bidentate ligands and substituents to the ligand allows the organic metal compound to control its luminescent color. Accordingly, the OLED D1 can improve its luminous efficiency and luminous lifespan.

Figure 4:
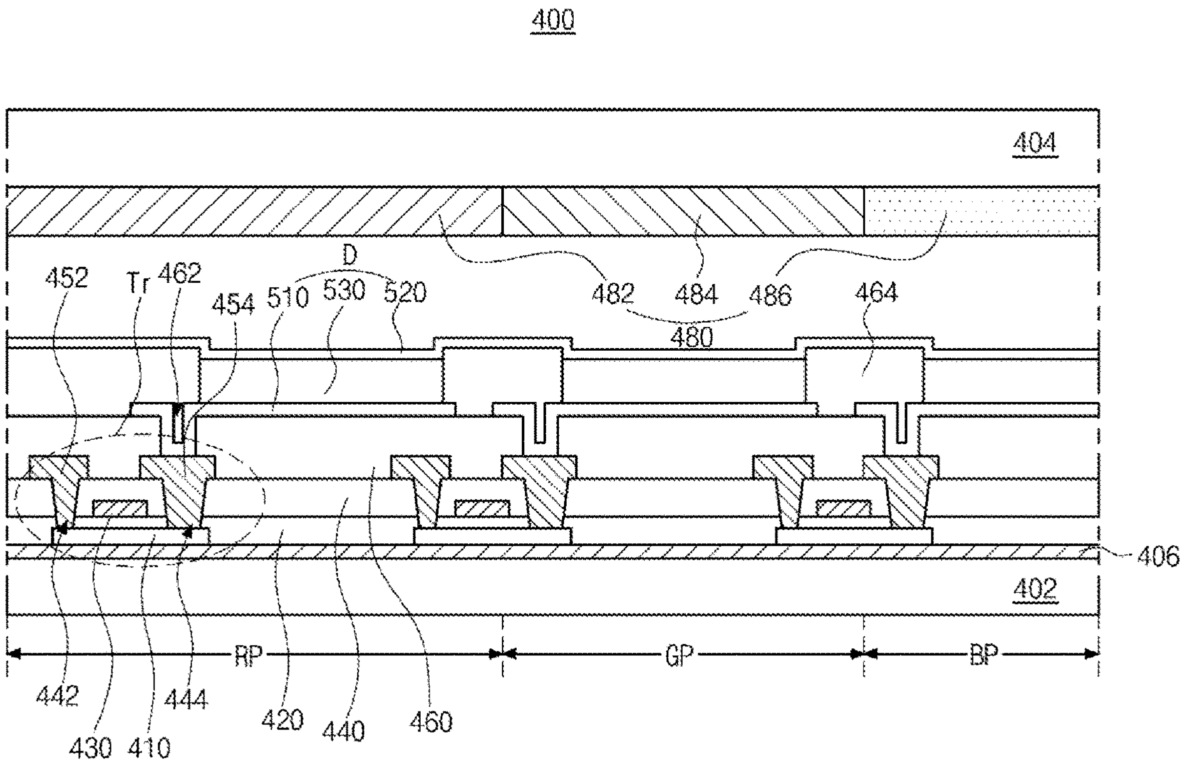
FIG. 4 is a cross-sectional view illustrating an organic light emitting display device in accordance with another exemplary aspect of the present disclosure.

In the above exemplary first aspect, the OLED and the organic light emitting display device include single emitting part emitting yellow to red colors. Unlikely, an organic light emitting display device can implement full-color including white color. FIG. 4 is a schematic cross-sectional view illustrating an organic light emitting display device in accordance with another exemplary aspect of the present disclosure.

As illustrated in FIG. 4, the organic light emitting display device 400 comprises a first substrate 402 that defines each of a red pixel RP, a green pixel GP and a blue pixel BP, a second substrate 404 facing the first substrate 402, a thin film transistor Tr over the first substrate 402, an organic light emitting diode D disposed between the first and second substrates 402 and 404 and emitting white (W) light and a color filter layer 480 disposed between the organic light emitting diode D and the second substrate 404.

Each of the first and second substrates 402 and 404 may include, but is not limited to, glass, flexible material and/or polymer plastics. For example, each of the first and second substrates 402 and 404 may be made of PI, PES, PEN, PET, PC and combination thereof. The first substrate 402, over which a thin film transistor Tr and an organic light emitting diode D are arranged, forms an array substrate.

A buffer layer 406 may be disposed over the first substrate 402, and the thin film transistor Tr is disposed over the buffer layer 406 correspondingly to each of the red pixel RP, the green pixel GP and the blue pixel BP. The buffer layer 406 may be omitted.

A semiconductor layer 410 is disposed over the buffer layer 406. The semiconductor layer 410 may be made of oxide semiconductor material or poly crystalline silicon.

A gate insulating layer 420 including an insulating material, for example, inorganic insulating material such as silicon oxide ($SiO_x$, wherein 0≤x≤2) or silicon nitride ($SiN_x$, wherein 0≤x≤2) is disposed on the semiconductor layer 410.

A gate electrode 430 made of a conductive material such as a metal is disposed over the gate insulating layer 420 so as to correspond to a center of the semiconductor layer 410. An interlayer insulting layer 440 including an insulating material, for example, inorganic insulating material such as $SiO_x$ or $SiN_x$, or an organic insulating material such as benzocyclobutene or photo-acryl, is disposed on the gate electrode 430.

The interlayer insulating layer 440 has first and second semiconductor layer contact holes 442 and 444 that expose both sides of the semiconductor layer 410. The first and second semiconductor layer contact holes 442 and 444 are disposed over opposite sides of the gate electrode 430 with spacing apart from the gate electrode 430.

A source electrode 452 and a drain electrode 454, which are made of a conductive material such as a metal, are disposed on the interlayer insulating layer 440. The source electrode 452 and the drain electrode 454 are spaced apart from each other with respect to the gate electrode 430, and contact both sides of the semiconductor layer 410 through the first and second semiconductor layer contact holes 442 and 444, respectively.

The semiconductor layer 410, the gate electrode 430, the source electrode 452 and the drain electrode 454 constitute the thin film transistor Tr, which acts as a driving element.

Although not shown in FIG. 4, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 460 is disposed on the source and drain electrodes 452 and 454 with covering the thin film transistor Tr over the whole first substrate 402. The passivation layer 460 has a drain contact hole 462 that exposes the drain electrode 454 of the thin film transistor Tr.

The OLED D is located over the passivation layer 460. The OLED D includes a first electrode 510 that is connected to the drain electrode 454 of the thin film transistor Tr, a second electrode 520 facing from the first electrode 510 and an emissive layer 530 disposed between the first and second electrodes 510 and 520.

The first electrode 510 formed for each pixel region may be an anode and may include a conductive material having relatively high work function value. For example, the first electrode 510 may include, ITO, IZO, ITZO, SnO, ZnO, ICO, AZO, and the like. Alternatively, a reflective electrode or a reflective layer may be disposed under the first electrode 510. For example, the reflective electrode or the reflective layer may include, but is not limited to, Ag or APC alloy.

A bank layer 464 is disposed on the passivation layer 460 in order to cover edges of the first electrode 510. The bank layer 464 exposes a center of the first electrode 510 corresponding to each of the red pixel RP, the green pixel GP and the blue pixel BP. The bank layer 464 may be omitted.

Figure 5:
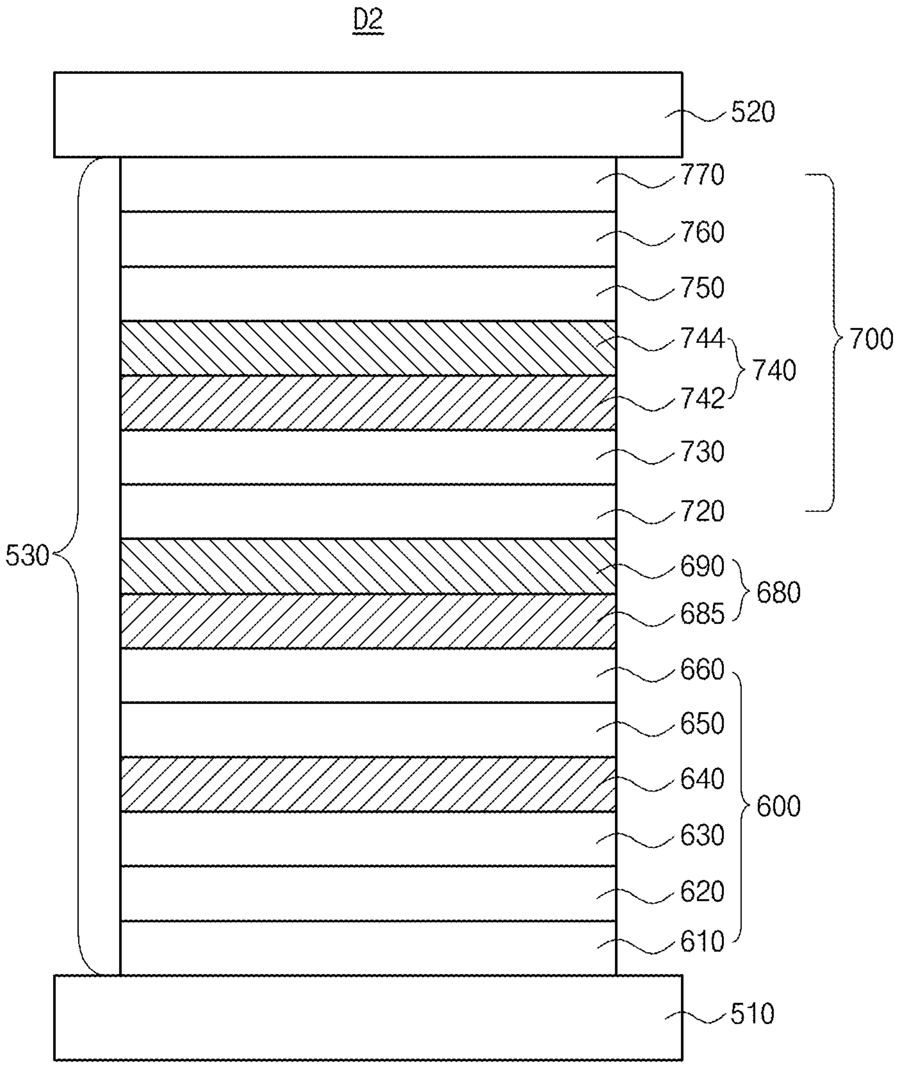
FIG. 5 is a cross-sectional view illustrating an organic light emitting diode having a double-stack structure in accordance with still another exemplary aspect of the present disclosure.
Figure 6:
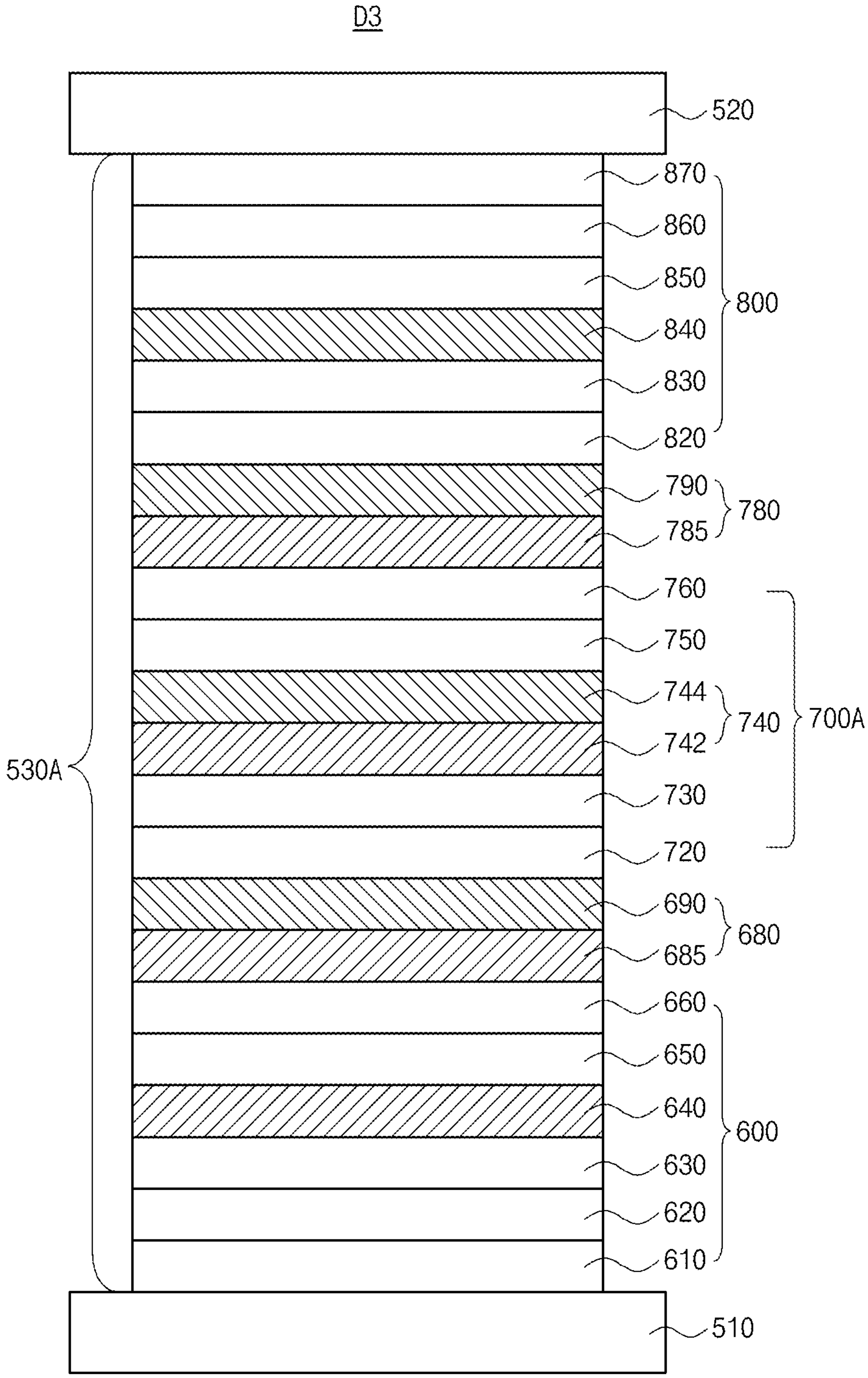
FIG. 6 is a cross-sectional view illustrating an organic light emitting diode having a triple-stack structure in accordance with still further another exemplary aspect of the present disclosure.

An emissive layer 530 that may include emitting parts is disposed on the first electrode 510. As illustrated in FIGS. 5 and 6, the emissive layer 530 may include multiple emitting parts 600, 700, 700A and 800 and at least one charge generation layer 680 and 780. Each of the emitting parts 600, 700, 700A and 800 includes an emitting material layer and may further include a hole injection layer, a hole transport layer, an electron blocking layer, a hole blocking layer, an electron transport layer and/or an electron injection layer.

The second electrode 520 is disposed over the first substrate 402 above which the emissive layer 530 is disposed. The second electrode 520 may be disposed over a whole display area, and may include a conductive material with a relatively low work function value compared to the first electrode 510, and may be a cathode. For example, the second electrode 520 may include, but is not limited to, Al, Mg, Ca, Ag, alloy thereof or combination thereof such as Al—Mg.

Since the light emitted from the emissive layer 530 is incident to the color filter layer 480 through the second electrode 520 in the organic light emitting display device 400 in accordance with the second embodiment of the present disclosure, the second electrode 520 has a thin thickness so that the light can be transmitted.

The color filter layer 480 is disposed over the OLED D and includes a red color filter 482, a green color filter 484 and a blue color filter 486 each of which is disposed correspondingly to the red pixel RP, the green pixel GP and the blue pixel BP, respectively. Although not shown in FIG. 4, the color filter layer 480 may be attached to the OLED D through an adhesive layer. Alternatively, the color filter layer 480 may be disposed directly on the OLED D.

In addition, an encapsulation film may be disposed over the second electrode 520 in order to prevent outer moisture from penetrating into the OLED D. The encapsulation film may have, but is not limited to, a laminated structure of a first inorganic insulating film, an organic insulating film and a second inorganic insulating film (see, 170 in FIG. 2). In addition, a polarizing plate may be attached onto the second substrate 404 to reduce reflection of external light. For example, the polarizing plate may be a circular polarizing plate.

In FIG. 4, the light emitted from the OLED D is transmitted through the second electrode 520 and the color filter layer 480 is disposed over the OLED D. Alternatively, the light emitted from the OLED D is transmitted through the first electrode 510 and the color filter layer 480 may be disposed between the OLED D and the first substrate 402. In addition, a color conversion layer may be formed between the OLED D and the color filter layer 480. The color conversion layer may include a red color conversion layer, a green color conversion layer and a blue color conversion layer each of which is disposed correspondingly to each pixel (RP, GP and BP), respectively, so as to covert the white (W) color light to each of a red, green and blue color lights, respectively. Alternatively, the organic light emitting display device 400 may comprise the color conversion film instead of the color filter layer 480.

As described above, the white (W) color light emitted from the OLED D is transmitted through the red color filter 482, the green color filter 484 and the blue color filter 486 each of which is disposed correspondingly to the red pixel RP, the green pixel GP and the blue pixel BP, respectively, so that red, green and blue color lights are displayed in the red pixel RP, the green pixel GP and the blue pixel BP.

FIG. 5 is a schematic cross-sectional view illustrating an organic light emitting diode having a tandem structure of two emitting parts. As illustrated in FIG. 5, the organic light emitting diode D2 (OLED D2) in accordance with the exemplary embodiment of includes first and second electrodes 510 and 520 and an emissive layer 530 disposed between the first and second electrodes 510 and 520. The emissive layer 530 includes a first emitting part 600 disposed between the first and second electrodes 510 and 520, a second emitting part 700 disposed between the first emitting part 600 and the second electrode 520 and a charge generation layer (CGL) 680 disposed between the first and second emitting parts 600 and 700.

The first electrode 510 may be an anode and may include a conductive material having relatively high work function value. For example, the first electrode 510 may include, ITO, IZO, ITZO, SnO, ZnO, ICO, AZO, and the like. The second electrode 520 may be a cathode and may include a conductive material with a relatively low work function value. For example, the second electrode 520 may include, but is not limited to, Al, Mg, Ca, Ag, alloy thereof or combination thereof such as Al—Mg.

The first emitting part 600 comprise a first EML (EML1) 640. The first emitting part 600 may further comprise at least one of an HIL 610 disposed between the first electrode 510 and the EML1 640, a first HTL (HTL1) 620 disposed between the HU. 610 and the EML1 640, a first ETL (ETL1) 660 disposed between the EML1 640 and the CGL 680. Alternatively, the first emitting part 600 may further comprise a first EBL (EBL1) 630 disposed between the HTL1 620 and the EML1 640 and/or a first HBL (HBL1) 650 disposed between the EML1 640 and the ETL1 660.

The second emitting part 700 comprise a second EML (EML2) 740. The second emitting part 700 may further comprise at least one of a second HTL (HTL2) 720, a second ETL (ETL2) 760 disposed between the second electrode 520 and the EML2 740 and an EIL 770 disposed between the second electrode 520 and the ETL2 760. Alternatively, the second emitting part 700 may further comprise a second EBL (EBL2) 730 disposed between the HTL2 720 and the EML2 740 and/or a second HBL (HBL2) 750 disposed between the EML2 740 and the ETL2 760.

At least one of the EML1 640 and the EML2 740 may comprise the organic metal compound having the structure of either one of Formulae 1 to 16 to emit yellow to red colors. The other of the EML1 640 and the EML2 740 may emit a blue color so that the OLED D2 can realize white (W) emission. Hereinafter, the OLED D2 where the EML2 740 includes the organic metal compound having the structure of either one of Formulae 1 to 16 will be described in detail.

The HIL 610 is disposed between the first electrode 510 and the HTL1 620 and improves an interface property between the inorganic first electrode 510 and the organic HTL1 620. In one exemplary embodiment, the HU. 610 may include, but is not limited to, MTDATA, NATA, 1T-NATA, 2T-NATA, CuPc, TCTA, NPB (NPD), HAT-CN, TDAPB, PEDOT/PSS, F4TCNQ, N-(biphenyl-4-yl)-9,9-dimethyl-N-(4-(9-phenyl-9H-carbazol-3-yl)phenyl)-9H-fluoren-2-amine, NPNPB and combination thereof. The HU. 610 may be omitted in compliance of the OLED D2 property.

Each of the HTL1 620 and the HTL2 720 may comprise, but is not limited to, TPD, NPB (NPD), DNTPD, CBP, Poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine and combination thereof, respectively.

Each of the ETL1 660 and the ETL2 760 facilitates electron transportation in each of the first emitting part 600 and the second emitting part 700, respectively. As an example, each of the ETL1 660 and the ETL2 760 may independently comprise, but is not limited to, at least one of oxadiazole-based compounds, triazole-based compounds, phenanthroline-based compounds, benzoxazole-based compounds, benzothiazole-based compounds, benzimidazole-based compounds, triazine-based compounds, and the like. For example, each of the ETL1 660 and the ETL2 770 may comprise, but is not limited to, $Alq_3$, BAlq, Liq, PBD, spiro-PBD, TPBi, Bphen, NBphen, BCP, TAZ, NTAZ, TpPyPB, TmPPPyTz, PFNBr, TPQ, TSPO1, ZADN and combination thereof, respectively.

The EIL 770 is disposed between the second electrode 520 and the ETL2 760, and can improve physical properties of the second electrode 520 and therefore, can enhance the lifetime of the OLED D2. In one exemplary aspect, the EIL 770 may comprise, but is not limited to, an alkali metal halide or an alkaline earth metal halide such as LiF, CsF, NaF, $BaF_2$ and the like, and/or an organic metal compound such as Liq, lithium benzoate, sodium stearate, and the like.

Each of the EBL1 630 and the EBL2 730 may independently comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB, DCDPA, 2,8-bis(9-phenyl-9H-carbazol-3-yl) dibenzo[b,d]thiophene and combination thereof, respectively.

Each of the HBL1 650 and the HBL2 750 may comprise, but is not limited to, at least one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL1 660 and the ETL2 760. For example, each of the HBL1 650 and the HBL2 75 may independently comprise, but is not limited to, $Alq_3$, BAlq, Liq, PBD, spiro-PBD, BCP, B3PYMPM, DPEPO, 9-(6-(9H-carbazol-9-yl)pyridine-3-yl)-9H-3,9'-bicarbazole, TSPO1 and combination thereof, respectively.

The CGL 680 is disposed between the first emitting part 600 and the second emitting part 700. The CGL 680 includes an N-type CGL (N-CGL) 685 disposed adjacently to the first emitting part 600 and a P-type CGL (P-CGL) 690 disposed adjacently to the second emitting part 700. The N-CGL 685 transports electrons to the EML1 640 of the first emitting part 600 and the P-CGL 690 transport holes to the EML2 740 of the second emitting part 700.

The N-CGL 685 may be an organic layer doped with an alkali metal such as Li, Na, K and Cs and/or an alkaline earth metal such as Mg, Sr, Ba and Ra. The host in the N-CGL 685 may comprise, but is not limited to, Bphen and MTDATA. The contents of the alkali metal or the alkaline earth metal in the N-CGL 685 may be between about 0.01 wt % and about 30 wt %.

The P-CGL 690 may comprise, but is not limited to, inorganic material selected from the group consisting of tungsten oxide ($WO_x$, $2\leq x\leq 3$), molybdenum oxide ($MoO_x$, $2\leq x\leq 3$), $V_2O_5$ and combination thereof and/or organic material selected from the group consisting of NPD, HAT-CN, F4TCNQ, TPD, N,N,N',N'-tetranaphthalenyl-benzidine (TNB), TCTA, N,N'-dioctyl-3,4,9,10-perylenedicarboximide (PTCDI-C8) and combination thereof.

The EML2 740 may comprise a lower EML 742 disposed between the EBL2 730 and the HBL2 750 and an upper EML 744 disposed between the lower EML 742 and the HBL2 750. One of the lower EML 742 and the upper EML 744 may emit yellow to red colors and the other of the lower EML 742 and the upper EML 744 may emit green color. Hereinafter, the EML2 740 where the lower EML 742 emits green color and the upper EML 744 emits red color will be described in detail.

The lower EML 742 includes a host and a green dopant. The host may be identical to the first host and green dopant may include at least one of green phosphorescent material, green fluorescent material and green delayed fluorescent material.

The upper EML 744 may include a first host and a first dopant. As an example, the first dopant includes the organic metal compound having the structure of either one of Formulae 1 to 16 to emit yellow to red colors. The first host may comprise, but is not limited to, mCP-CN, CBP, mCBP, mCP, DPEPO, PPT, TmPyPB, PYD-2Cz, DCzDBT, DCzTPA, pCzB-2CN), mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP, TCzl and combination thereof. For example, the contents of the dopant in the upper EML 742 may be between about 1 wt % to about 50 wt %, for example, about 1 wt % and about 30 wt %.

The EML1 640 may be a blue EML. In this case, the EML1 640 may be a blue EML, a sky-blue EML or a deep-blue EML. The EML1 640 may include a host and a blue dopant. The host may be identical to the first host and the blue dopant may comprise at least one of blue phosphorescent material, blue fluorescent material and blue delayed fluorescent material.

The OLED D2 in accordance with this aspect has a tandem structure and includes at least one of the organic metal compounds having the structure of Formulae 1 to 16. The OLED D2 including the organic metal compound with excellent thermal property, a rigid chemical conformation and adjustable luminescent colors can improve its luminous efficiency and luminous lifespan.

The OLED may have three or more emitting parts to form a tandem structure. FIG. 6 is a schematic cross-sectional view illustrating an organic light emitting diode in accordance with still another exemplary aspect of the present disclosure. As illustrated in FIG. 6, the organic light emitting diode D3 (OLED D3) includes first and second electrodes 510 and 520 facing each other and an emissive layer 530A disposed between the first and second electrodes 510 and 520. The emissive layer 530A includes a first emitting part 600 disposed between the first and second electrodes 510 and 520, a second emitting part 700A disposed between the first emitting part 600 and the second electrode 520, a third emitting part 800 disposed between the second emitting part 700A and the second electrode 520, a first charge generation layer (CGL1) 680 disposed between the first and second emitting parts 600 and 700A, and a second charge generation layer (CGL2) 780 disposed between the second and third emitting parts 700A and 800.

The first emitting part 600 comprise a first EML (EML1) 640. The first emitting part 600 may further comprise at least one of an HIL 610 disposed between the first electrode 510 and the EML1 640, a first HTL (HTL1) 620 disposed between the HU. 610 and the EML1 640, a first ETL (ETL1) 660 disposed between the EML1 640 and the CGL 680. Alternatively, the first emitting part 600 may further comprise a first EBL (EBL1) 630 disposed between the HTL1 620 and the EML1 640 and/or a first HBL (HBL1) 650 disposed between the EML1 640 and the ETL1 660.

The second emitting part 700A comprise a second EML (EML2) 740. The second emitting part 700A may further comprise at least one of a second HTL (HTL2) 720, a second ETL (ETL2) 760 disposed between the second electrode 520 and the EML2 740. Alternatively, the second emitting part 700A may further comprise a second EBL (EBL2) 730 disposed between the HTL2 720 and the EML2 740 and/or a second HBL (HBL2) 750 disposed between the EML2 740 and the ETL2 760.

The third emitting part 800 comprise a third EML (EML2) 840. The third emitting part 800 may further comprise at least one of a third HTL (HTL3) 820, a third ETL (ETL3)

860 disposed between the second electrode 520 and the EML3 840 and an EIL 870 disposed between the second electrode 520 and the ETL3 860. Alternatively, the third emitting part 800 may further comprise a third EBL (EBL3) 830 disposed between the HTL3 820 and the EML3 840 and/or a third HBL (HBL3) 850 disposed between the EML3 840 and the ETL3 860.

At least one of the EML1 640, the EML2 740 and the EML3 840 may comprise the organic metal compound having the structure of Formulae 1 to 16. For example, one of the EML1 640, the EML2 740 and the EML3 840 may emit red to green colors. In addition, another of the EML1 640, the EML2 740 and the EML3 840 emit a blue color so that the OLED D3 can realize white emission. Hereinafter, the OLED where the EML2 740 includes the organic metal compound having the structure of either one of Formulae 1 to 16 to emit red to green colors and each of the EML1 640 and the EML3 840 emits a blue light will be described in detail.

The CGL1 680 is disposed between the first emitting part 600 and the second emitting part 700A and the CGL2 780 is disposed between the second emitting part 700A and the third emitting part 800. The CGL1 680 includes a first N-type CGL (N-CGL1) 685 disposed adjacently to the first emitting part 600 and a first P-type CGL (P-CGL1) 690 disposed adjacently to the second emitting part 700A. The CGL2 780 includes a second N-type CGL (N-CGL2) 785 disposed adjacently to the second emitting part 700A and a second P-type CGL (P-CGL2) 790 disposed adjacently to the third emitting part 800. Each of the N-CGL1 685 and the N-CGL2 785 transports electrons to the EML1 640 of the first emitting part 600 and the EML2 740 of the second emitting part 700A, respectively, and each of the P-CGL1 690 and the P-CGL2 790 transport holes to the EML2 740 of the second emitting part 700A and the EML3 840 of the third emitting part 800, respectively.

The EML2 740 may comprise a lower EML 740A disposed between the EBL2 730 and the HBL2 750 and an upper EML 740B disposed between the lower EML 740A and the HBL2 750. One of the lower EML 740A and the upper EML 740B may emit yellow to red colors and the other of the lower EML 740A and the upper EML 740B may emit green color. Hereinafter, the EML2 740 where the lower EML 742 emits green color and the upper EML 740B emits red color will be described in detail.

The lower EML 740A includes a host and a green dopant. The host may be identical to the first host and green dopant may include at least one of green phosphorescent material, green fluorescent material and green delayed fluorescent material.

The upper EML 740B may include a first host and a first dopant. As an example, the first dopant includes the organic metal compound having the structure of either one of Formulae 1 to 16 to emit yellow to red colors. For example, the contents of the dopant in the upper EML 740B may be between about 1 wt % to about 50 wt %, for example, about 1 wt % and about 30 wt %.

Each of the EML1 640 and the EML3 840 may be independently a blue EML. In this case, the each of the EML1 640 and the EML3 840 may be independently a blue EML, a sky-blue EML or a deep-blue EML. Each of the EML1 640 and the EML3 840 may include independently a host and a blue dopant. The host may be identical to the first host and the blue dopant may comprise at least one of blue phosphorescent material, blue fluorescent material and blue delayed fluorescent material The OLED D3 in accordance with this aspect includes the organic metal compound having the structure of either one of Formulae 1 to 16 in at least one emitting material layer. The organic metal compound has narrow FWHM and can maintain its stable chemical conformations in the luminescent process. The OLED including the organic metal compound and having three emitting parts can realize white luminescence with improved luminous efficiency, color purity and luminous lifespan.

Synthesis Example 1: Synthesis of Compound 369

(1) Synthesis of Intermediate B-1

[Reaction Formula 1-1]

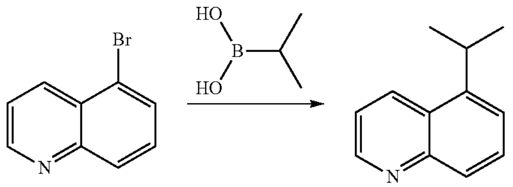

A-1

B-1

Compound A-1 (5-bromoquinoline, 50.0 g, 240.33 mmol), propan-2-ylboronic acid (42.25 g, 480.65 mmol), $Pd_2(dba)_3$ (Tris(dibenzylideneacetone)dipalladium (0), 6.6 g, 3 mol %), SPhos (2-dicyclichexhylphosphino-2',6'-dimethoxybiphenyl, 9.9 g, 24.03 mmol), potassium phosphate monohydrate (276.71 g, 1.2 mol) and toluene (1000 mL) were put into a reaction vessel, and then the solution was stirred at 120° C. for 12 hours. After the reaction was complete, the solution was cooled down to a room temperature and the solution was extracted with ethyl acetate to remove the solvent. A crude product was purified with column chromatography (eluent: ethyl acetate and hexane) to give the Intermediate B-1 (5-isopropylquinoline, 35.4 g, yield: 86%).

MS (m/z); 171.10

(2) Synthesis of Intermediate C-1

[Reaction Formula 1-2]

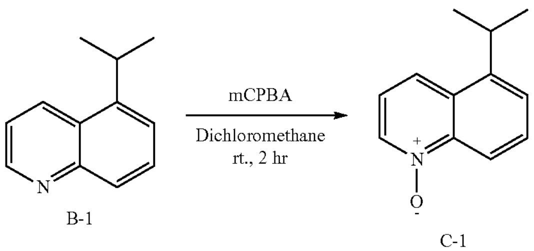

B-1

C-1

The Intermediate B-1 (5-isopropylquinoline, 35.4 g, 206.73 mmol), mCBPA (3-chloroperbenzoic acid, 53.5 g, 310.09 mmol) and dichloromethane (500 mL) were put into a reaction vessel, and then the solution was stirred at room temperature for 3 hours. Sodium sulfite (80 g) was added into the solution, the organic layer was washed with water and then placed under reduced pressure to give the Intermediate C-1 (27.5 g, yield: 71%).

MS (m/z); 187.10

(3) Synthesis of Intermediate D1

[Reaction Formula 1-3]

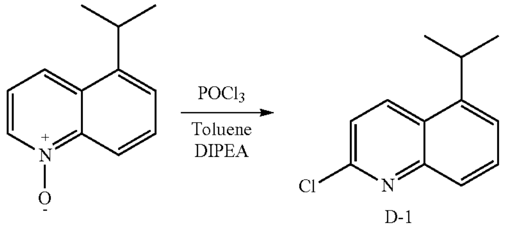

C-1 D-1

The Intermediate C-1 (27.5 g, 146.87 mmol) dissolved in toluene (500 mL) was put into a reaction vessel, phosphoryl trichloride (POCh, 45.0 g, 293.74 mmol) and diisopropylethylamine (DIPEA, 38.0 g, 293.74 mmol) were added into the vessel, and then the solution was stirred at 120° C. for 4 hours. The reactants ware placed under reduced pressure to remove the solvent and extracted with dichloromethane, and then the organic layer was washed with water. Water was removed with $MgSO_4$, the crude product was filtered and then the solvent was removed. The crude product was purified with column chromatography to give the Intermediate D-1 (2-chloro-5-isopropylquinoline, 11.8 g, yield: 39%).

MS (m/z); 205.07

(4) Synthesis of Intermediate F-1

[Reaction Formula 1-4]

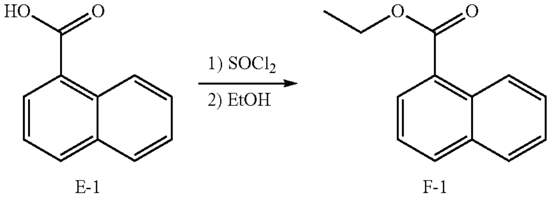

E-1 F-1

The compound E-1 (1-naphthoic acid, 50 g, 290.30 mmol) and $SOCl_2$ (200 mL) were put into a reaction vessel, the solution was refluxed for 4 hours, $SOCl_2$ was removed, ethanol (200) mL was added, and then the solution was stirred at 70° C. for 7 hours. Water was added, the organic layer was extracted with ether, water was removed with $MgSO_4$ and then the solution was filtered. The solution was placed under reduced pressure to remove the solvent and to give the Intermediate F-1 (ethyl-1-naphthoate, 53.2 g, yield: 90%).

MS (m/z); 200.08

(5) Synthesis of Intermediate G-1

[Reaction Formula 1-5]

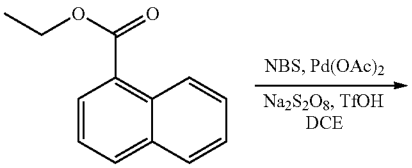

F-1

-continued

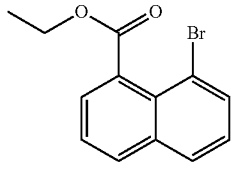

G-1

The Intermediate F-1 (ethyl-1-naphthoate, 52.3 g, 261.20 mmol), NBS (N-bromosuccinimide, 51.14 g, 287.32 mmol), $Pd(OAc)_2$ (palladium(II)acetate, 0.6 g, 2.61 mmol), $Na_2S_2O_8$ (124.4 g, 522.40 mmol) and dichloromethane (500 mL) were put into a reaction vessel, TfOH (Trifluoromethanesulfonic acid, 19.6 g, 130.60 mmol) was added into the reaction vessel, and then the solution was stirred at 70° C. for 1 hour. The reactants were cooled to room temperature, the reaction was complete using $NaHCO_3$, and then was extracted with dichloromethane. Water in the organic layer was removed with $MgSO_4$, the solvent was removed, and then the crude product was purified with column chromatography (eluent: petroleum ether and ethyl acetate) to give the Intermediated G-1 (ethyl-8-bromonaphthalene-1-carboxylate, 54.0 g, yield: 74%).

MS (m/z); 277.99

(6) Synthesis of Intermediate H-1

[Reaction Formula 1-6]

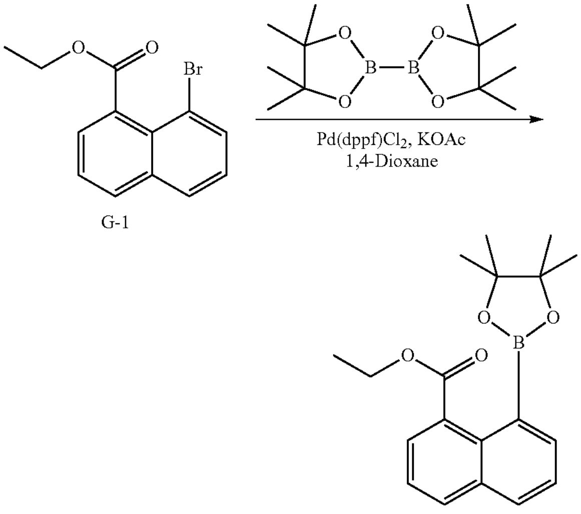

G-1

H-1

The Intermediate G-1 (ethyl-8-bromonaphthalene-1-carboxylate, 54.0 g, 193.46 mmol), bis(pinacolato)diboron (58.6 g, 232.15 mmol), $Pd(dppf)Cl_2$ ([1,1'-bis(diphenylphosphino)ferrocene]dichloropalladium(II), 7.1 g, 9.67 mmol), KOAc (potassium acetate, 57.0 g, 580.37 mmol) and 1,4-dioxane (500 mL) were put into a reaction vessel, and then the solution was stirred at 100° C. for 4 hours. The reactants were cooled to room temperature, extracted with ethyl acetate, then water in the organic layer was removed with $MgSO_4$, and then the solution was filtered and placed under reduced pressure to remove the solvent. The crude product was purified with column chromatography (eluent: hexane and ethyl acetate) to give the Intermediate H-1 (ethyl 8-(4,4,5,5-tetramethyl-1,3,2-dioxanborolan-2-yl)naphthalene-1-carboxylate, 54.3 g, yield: 86%).

MS (m/z); 326.17

(7) Synthesis of Intermediate I-1

[Reaction Formula 1-7]

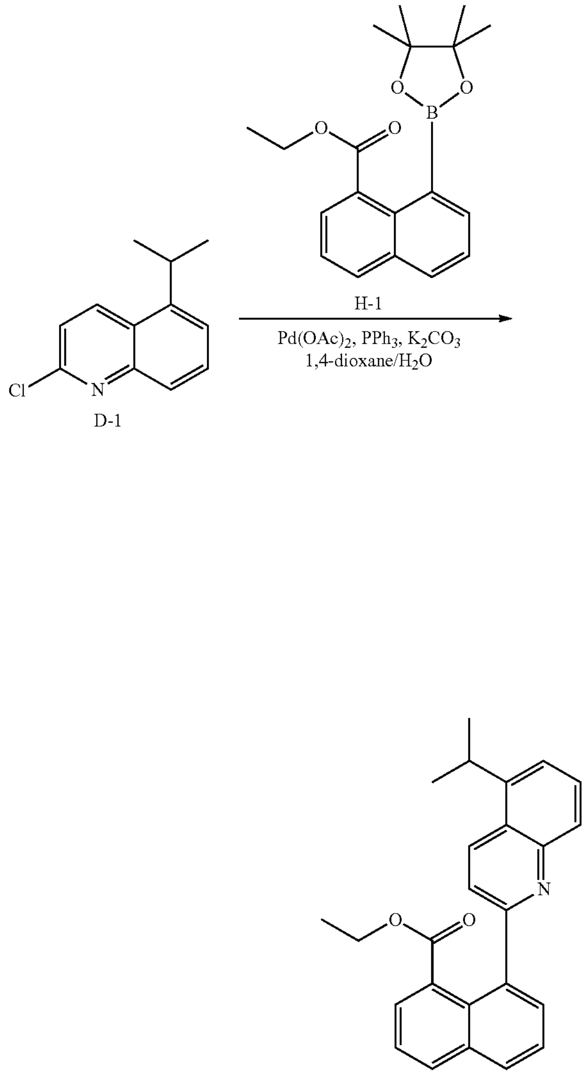

D-1

I-1

The Intermediate D-1 (2-chloro-5-isopropylquinoline, 10 g, 48.62 mmol), the Intermediate H-1 (ethyl 8-(4,4,5,5-tetramethyl-1,3,2-dioxaborolan-2-yl)naphthalene-1-carboxylate, 17.45 g, 53.48 mmol), $Pd(OAc)_2$ (0.5 g, 2.43 mmol), $PPh_3$ (chloro(triphenylphosphine)[2-(2'-amino-1,1'-biphenyl)]palladium(II), 2.6 g, 9.72 mmol), $K_2CO_3$ (20.2 g, 145.86 mmol), 1,4-dioxane (100 mL) and water (100 mL) were put into a reaction vessel, and then the solution was stirred at 100° C. for 12 hours. The reactants ware cooled to room temperature and extracted with ethyl acetate, water in the organic layer was removed with $MgSO_4$, and then the solution was filtered and placed under reduced pressure to remove the solvent. The crude product was purified with column chromatography (eluent: hexane and ethyl acetate) to give the Intermediate I-1 (ethyl 8-(5-isopropylquinolin-2-yl)naphthalene-1-carboxylate, 13.5 g, yield: 75%).

MS (m/z); 369.17

(8) Synthesis of Intermediate J-1

[Reaction Formula 1-8]

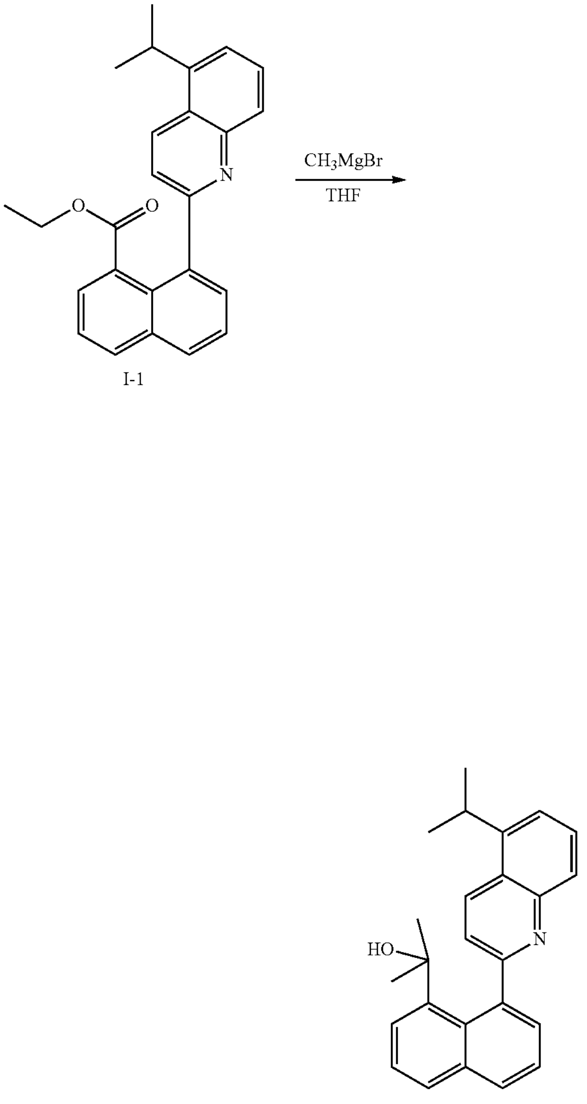

J-1

The Intermediate I-1 (ethyl 8-(5-isopropylquinolin-2-yl)naphthalene-1-carboxylate, 13.5 g, 36.6 mmol) and THF (100 mL) were put into a reaction vessel and then $CH_3MgBr$ (21.8 g, 182.70 mmol) was added dropwise into the reaction vessel at 0° C. The solution was raised to room temperature, the reaction was complete after 12 hours, was extracted with ethyl acetate, water in the organic layer was removed with $MgSO_4$, and then the solution was filtered and placed under reduced pressure to remove the solvent. The crude product was purified with column chromatography (eluent: hexane and ethyl acetate) to give the Intermediate J-1 (2-(1-(5-isopropylquinolin-2-yl)naphthalene-8-yl)propan-2-ol, 6.9 g, yield: 53%).

MS (m/z); 355.19

(9) Synthesis of Intermediate K-1

[Reaction Formula 1-9]

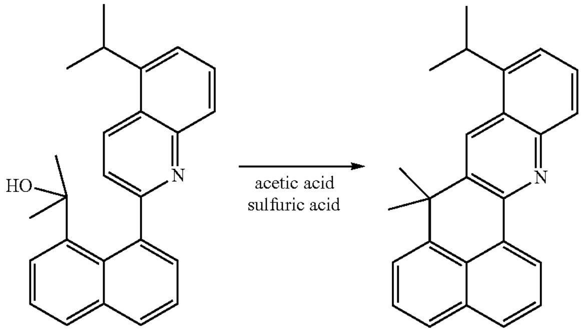

J-1 K-1

The Intermediate J-1 (2-(1-(5-isopropylquinolin-2-yl) naphthalene-8-yl)propan-2-ol, 20 g, 56.26 mmol) and a mixed aqueous solution (200 mL) of acetic acid and sulfuric acid were put into a reaction vessel, and then the solution was refluxed for 16 hours. After the reaction was complete, the solution was cooled to room temperature, and then the reactants were added dropwise into sodium hydroxide aqueous solution with ice. The organic layer was extracted with dichloromethane and water was removed with $MgSO_4$. The solvent was removed and then the crude product was recrystallized with toluene and ethanol to give the Intermediate K-1 (9-isopropyl-7,7-dimethyl-7H-naphtho[1,8-bc]acridine, 10.25 g, yield: 54%) of yellow solid.

MS (m/z); 337.18

(10) Synthesis of Intermediate L-1

[Reaction Formula 1-10]

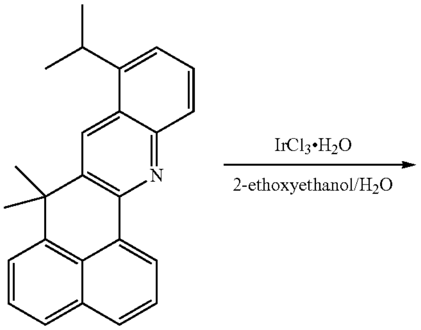

K-1

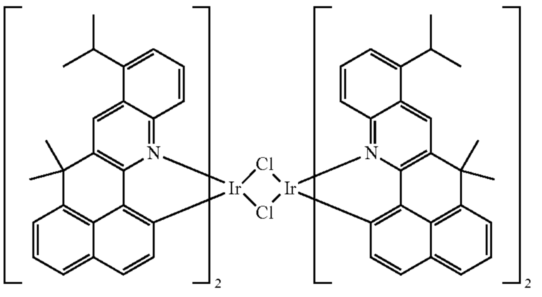

L-1

The Intermediate K-1 (10.25 g, 30.37 mmol), 2-ethoxyethanol (200 mL) and distilled water (50 mL) were put into a reaction vessel, the solution was bubbled with nitrogen for 1 hour, $IrCl_3 \cdot H_2O$ (4.4 g, 13.81 mmol) was added into the reaction vessel, and then the solution was refluxed for 2 days. After the reaction was complete, the solution was cooled to room temperature, and then the obtained solid was filtered. The solid was washed with hexane and water and dried to give the Intermediate L-1 (4.0 g, yield: 32%).

(11) Synthesis of Compound 369

[Reaction Formula 1-11]

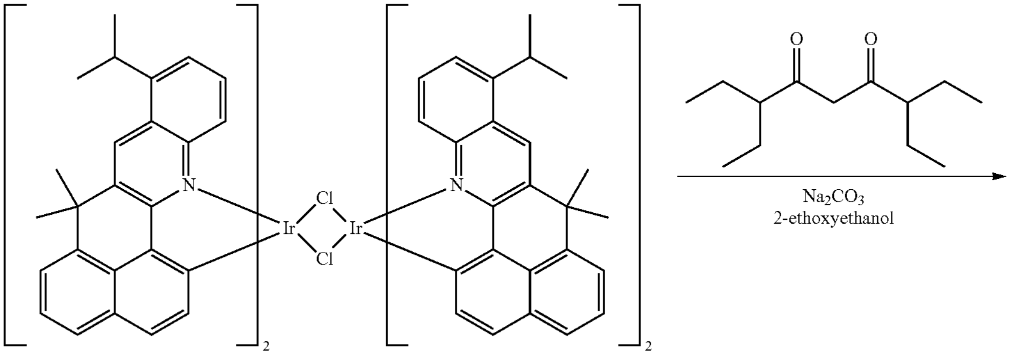

L-1

-continued

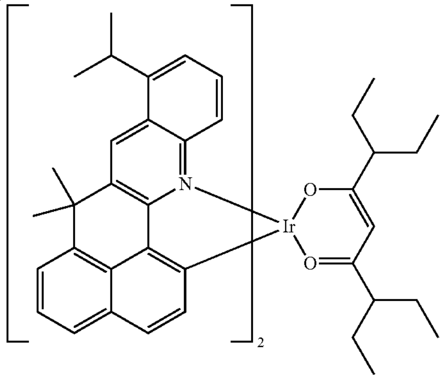

369

The Intermediate L-1 (4.0 g, 2.21 mmol), 3,7-diethyl-nonane-4,6-dione (4.7 g, 22.09 mmol), $Na_2CO_3$ (4.7 g, 441.8 mmol) and 2-ethoxyethanol (100 mL) were put into a reaction vessel, and then the solution was stirred slowly for 24 hours. After the reaction was complete, dichloromethane was added into the reactants to dissolve product, and then the solution was filtered with celite. The solvent was removed, the solid was filtered using filter paper, then the filtered solid was put into isopropanol, and then the solution was stirred. The solution was filtered to remove isopropanol, and the solution was dried and recrystallized with dichloromethane and isopropanol. High purity of Compound 369 (2.5 g, yield: 53%) was obtained using a sublimation purification instrument.

MS (m/z); 1076.48

Synthesis Example 2: Synthesis of Compound 2

(1) Synthesis of Intermediate C-2

[Reaction Formula 2-1]

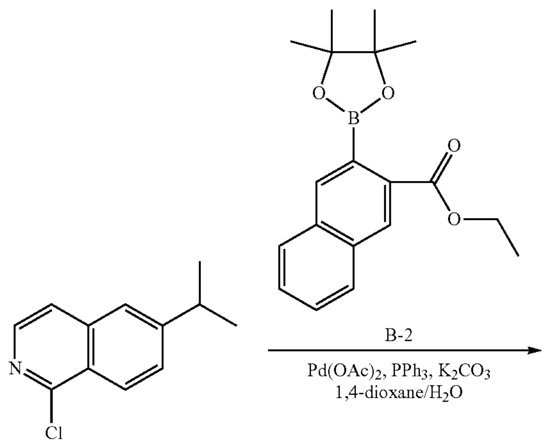

A-2

-continued

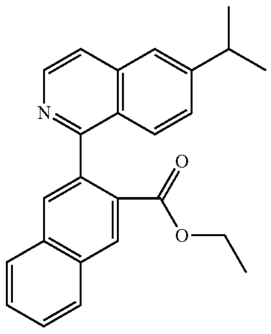

C-2

The Intermediate C-2 (ethyl 3-6-(isopropylisoqunolin-1-yl)-naphthoate (14.4 g, yield: 80%) was obtained by repeating the synthesis process of the Intermediate I-1 except that the compound A-2 (l-chloro-6-isopropylisoquinoline, 10 g, 48.62 mmol) and compound B-2 (ethyl 3-(4,4,5,5-tetramethyl-1,3,2-dioxaborolan-2-yl)-2-naphthoate (17.45 g, 53.50 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carboxylate, respectively.

MS (m/z); 369.17

(2) Synthesis of Intermediate D-2

[Reaction Formula 2-2]

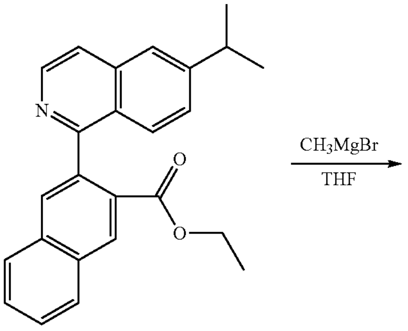

C-2

-continued

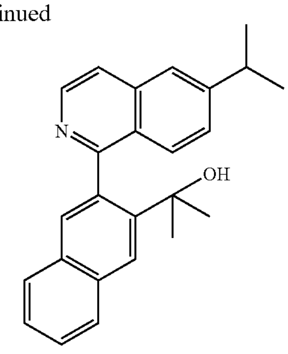

D-2

The Intermediate D-2 (2-(3-(6-isopropylisoquinolin-1-yl)naphthalen-2-yl)propan-2-ol, 6.9 g, yield: 50%) was obtained by repeating the synthesis process of the Intermediate J-1 except that the Intermediate C-2 (ethyl 3-(6-isopropylisoquinolin-1-yl)-2-naphthoate, 14.4 g, 39.0 mmol) was used instead of the Intermediate I-1 (ethyl 8-(5-isopropylquinolin-2-yl)naphthalene-1-carboxylate, 13.5 g, 36.5 mmol).

MS (m/z); 355.19

(3) Synthesis of Intermediate E-2

[Reaction Formula 2-3]

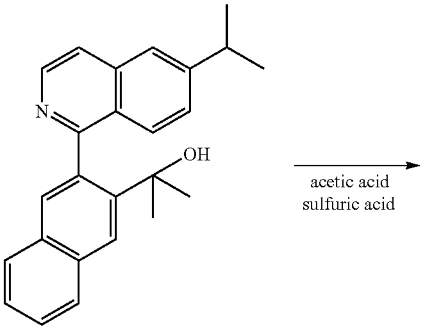

D-2

-continued

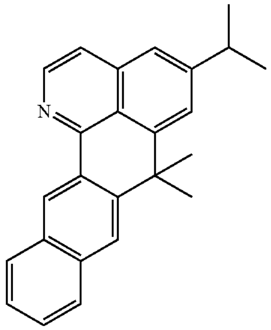

E-2

The Intermediate E-2 (5-isopropyl-7,7-dimethyl-7H-benzo[de]naphtha[2,3-h]quinolone, 11.39 g, yield: 60%) was obtained by repeating the synthesis process of the Intermediate K-1 except that the Intermediate D-2 (2-(3-(6-isopropylisoquinolin-1-yl)naphthalen-2-yl)propan-2-ol, 20 g, 56.26 mmol) was used instead of the Intermediate J-1 (2-(1-(5-isopropylquinolin-2-yl)naphthalene-8-yl)propan-2-ol, 20 g, 56.26 mmol).

MS (m/z); 337.18

(4) Synthesis of Intermediate F-2

[Reaction Formula 2-4]

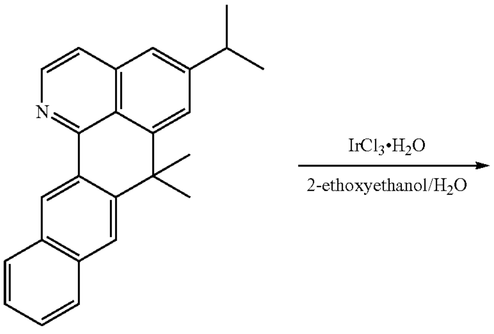

E-2

-continued

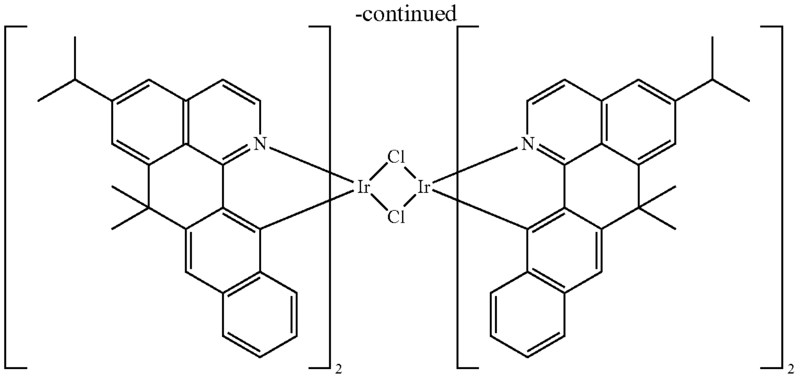

F-2

The Intermediate F-2 (4.7 g, yield: 34%) was obtained by repeating the synthesis process of the Intermediate L-1 except that the Intermediate E-2 (11.39 g, 33.76 mmol) was used instead of the Intermediate K-1 (10.25 g, 30.37 mmol).

(5) Synthesis of Compound 2

[Reaction Formula 2-5]

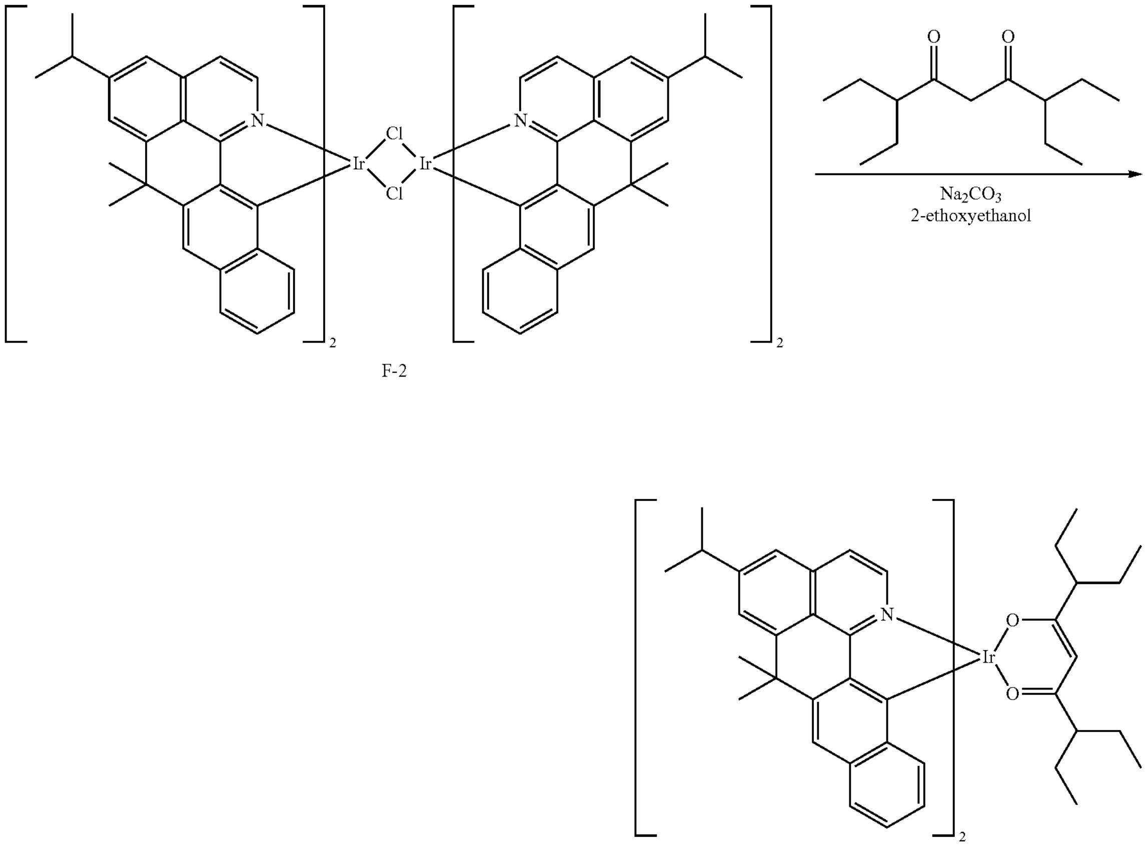

F-2

2

Compound 2 (3.2 g, yield: 57%) was obtained by repeating the synthesis process of Compound 369 except that the Intermediate F-2 (4.7 g, 2.61 mmol) was used instead of the Intermediate L-1 (4.0 g, 2.21 mmol).

MS (m/z); 1076.48

Synthesis Example 3: Synthesis of Compound 501

(1) Synthesis of Intermediate C-3

[Reaction Formula 3-1]

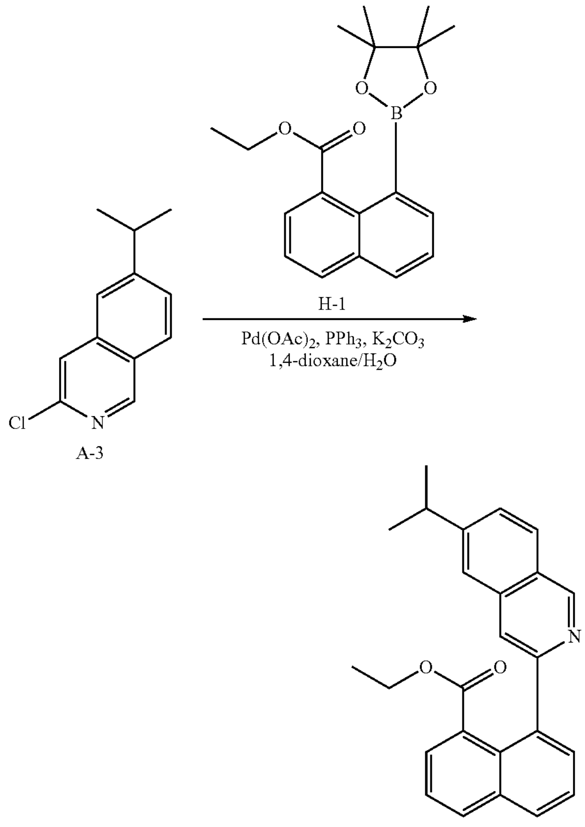

H-1

A-3

C-3

The Intermediate C-3 (ethyl 8-6-(isopropylisoqunolin-3-yl)-naphthoate, 12.6 g, yield: 70%) was obtained by repeating the synthesis process of the Intermediate I-1 except that the compound A-3 (3-chloro-6-isopropylisoquinoline, 10 g, 48.62 mmol) was used instead of the Intermediate D-1 (2-chloro-5-isopropylquinoline, 10 g, 48.62 mmol).

MS (m/z); 369.17

(2) Synthesis of Intermediate D-3

[Reaction Formula 3-2]

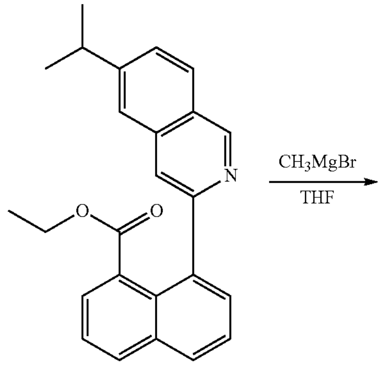

C-3

-continued

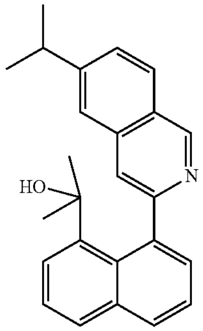

D-3

The Intermediate D-3 (2-(8-(6-isopropylisoquinolin-3-yl) naphthalen-1-yl)propan-2-ol, 7.3 g, yield: 60%) was obtained by repeating the synthesis process of the Intermediate J-1 except that the Intermediate C-3 (ethyl 8-(6-isopropylisoquinolin-3-yl)naphthoate, 12.6 g, 34.0 mmol) was used instead of the Intermediate I-1 (ethyl 8-(5-isopropylquinolin-2-yl)naphthalene-1-carboxylate, 13.5 g, 36.5 mmol).

MS (m/z); 355.19

(3) Synthesis of Intermediate E-3

[Reaction Formula 3-3]

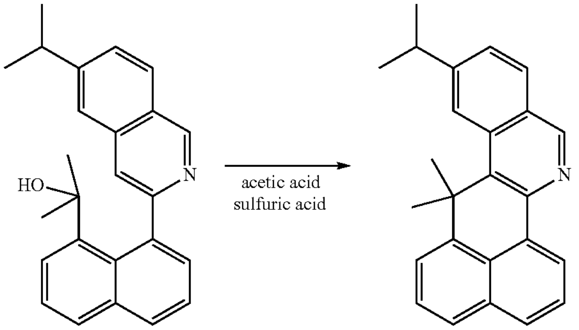

D-3

E-3

The Intermediate E-3 (2-isopropyl-13,13-dimethyl-13H-naphtho[1,8-bc]phenanthridine, 4.3 g, yield: 62%) was obtained by repeating the synthesis process of the Intermediate K-1 except that the Intermediate D-3 (2-(8-(6-isopropylisoquinolin-3-yl)naphthalen-1-yl)propan-2-ol, 7.3 g, 20.4 mmol) was used instead of the Intermediate J-1 (2-(1-(5-isopropylquinolin-2-yl)naphthalene-8-yl)propan-2-ol, 20 g, 56.26 mmol).

MS (m/z); 337.18

(4) Synthesis of Intermediate F-3
[Reaction Formula 3-4]
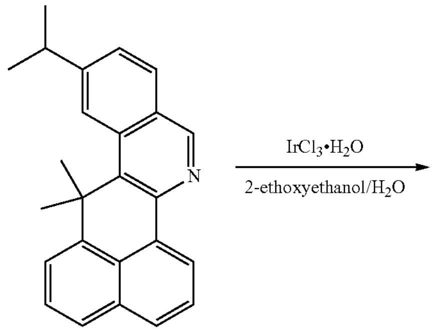
E-3
-continued
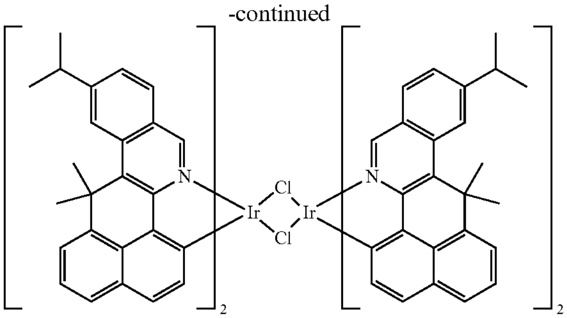
F-3
The Intermediate F-3 (1.9 g, yield: 37%) was obtained by repeating the synthesis process of the Intermediate L-1 except that the Intermediate E-3 (2-isopropyl-13,13-dimethyl-13H-naphtho[1,8-bc]phenanthridine, 4.3 g, 12.6 mmol) was used instead of the Intermediate K-1 (10.25 g, 30.37 mmol).
(5) Synthesis of Compound 501
[Reaction Formula 3-5]
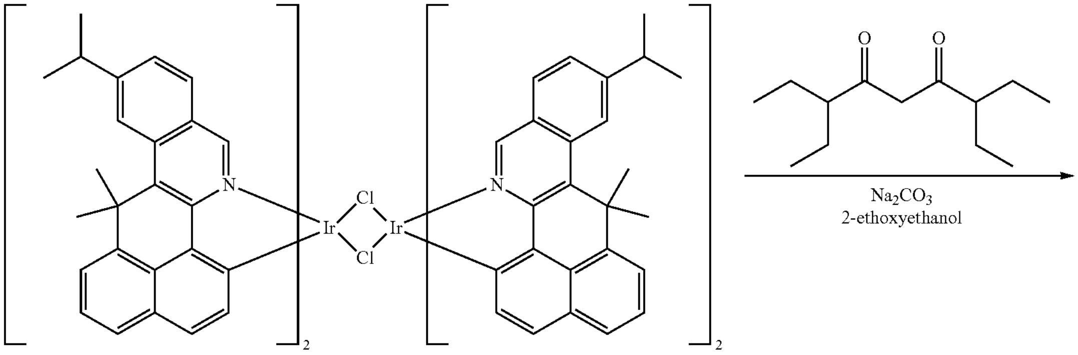
F-3
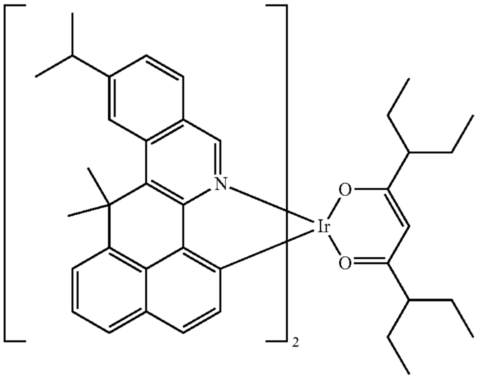
501

Compound 501 (1.4 g, yield: 60%) was obtained by repeating the synthesis process of Compound 369 except that the Intermediate F-3 (1.9 g, 1.07 mmol) was used instead of the Intermediate L-1 (4.0 g, 2.21 mmol).

MS (m/z); 1076.48

Synthesis Example 4: Synthesis of Compound 182

(1) Synthesis of Intermediate C-4

[Reaction Formula 4-1]

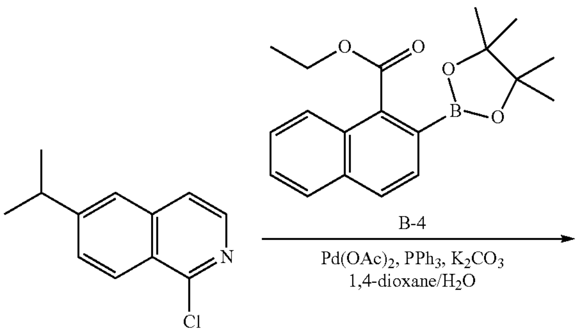

A-4

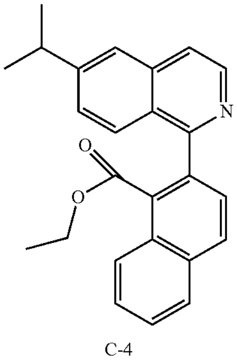

C-4

The Intermediate C-4 (12.2 g, yield: 68%) was obtained by repeating the synthesis process of the Intermediate I-1 except that the compound A-4 (10 g, 48.62 mmol) and the compound B-4 (17.45 g, 53.48 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carbozylte (17.45 g, 53.48 mmol), respectively.

MS (m/z); 369.17

(2) Synthesis of Intermediate D-4

[Reaction Formula 4-2]

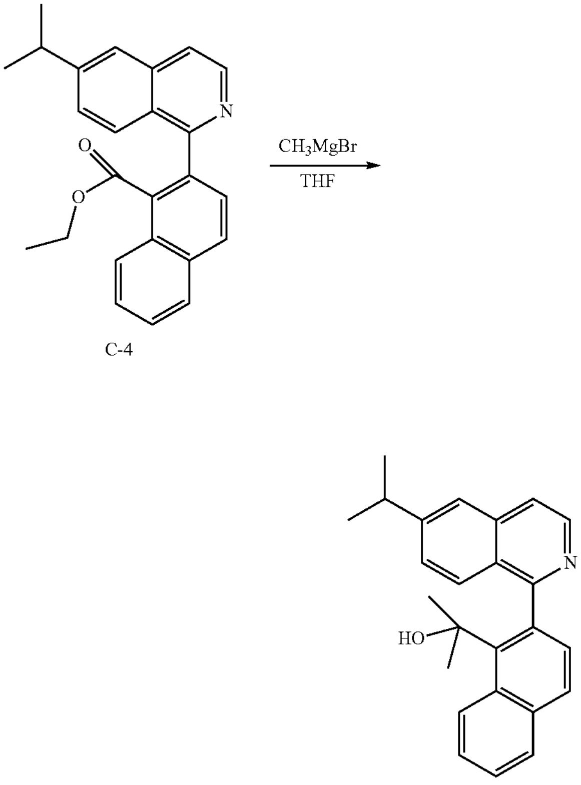

D-4

The Intermediate D-4 (6.8 g, yield: 58%) was obtained by repeating the synthesis process of the Intermediate J-1 except that the Intermediate C-4 (12.2 g, 33.02 mmol) was used instead of the Intermediate I-1 (ethyl 8-(5-isopropylquinolin-2-yl)naphthalene-1-carboxylate, 13.5 g, 36.5 mmol).

MS (m/z); 355.19

(3) Synthesis of Intermediate E-4

[Reaction Formula 4-3]

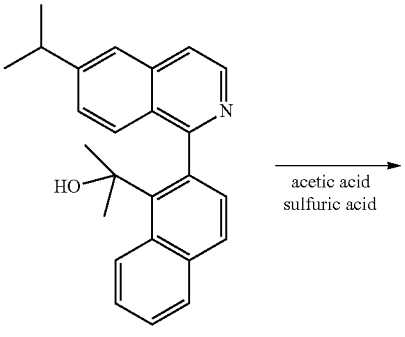

D-4

-continued

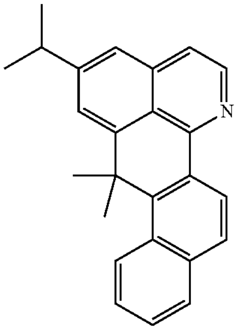

E-4

The Intermediate E-4 (4.1 g, yield: 63%) was obtained by repeating the synthesis process of the Intermediate K-1 except that the Intermediate D-4 (6.8 g, 19.15 mmol) was used instead of the Intermediate J-1 (2-(1-(5-isopropylquinolin-2-yl)naphthalene-8-yl)propan-2-ol, 20 g, 56.26 mmol).

MS (m/z); 337.78

(4) Synthesis of Intermediate F-4

[Reaction Formula 4-4]

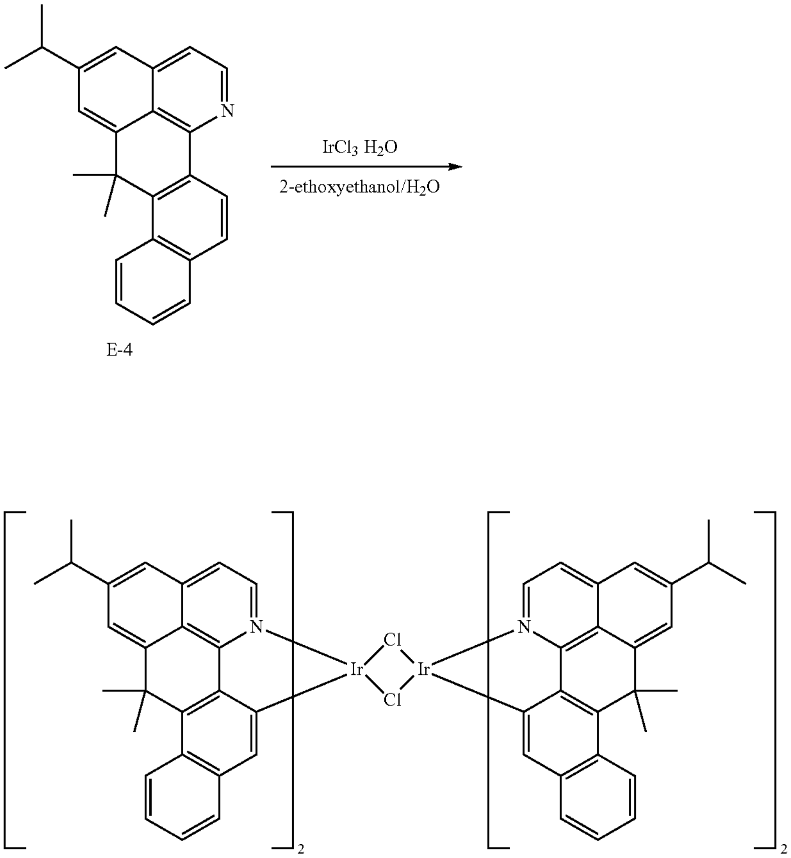

E-4

F-4

The Intermediate F-4 (2.1 g, yield: 42%) was obtained by repeating the synthesis process of the Intermediate L-1 except that the Intermediate E-4 (4.1 g, 12.15 mmol) was used instead of the Intermediate K-1 (10.25 g, 30.37 mmol).

(5) Synthesis of Compound 182

[Reaction Formula 4-5]

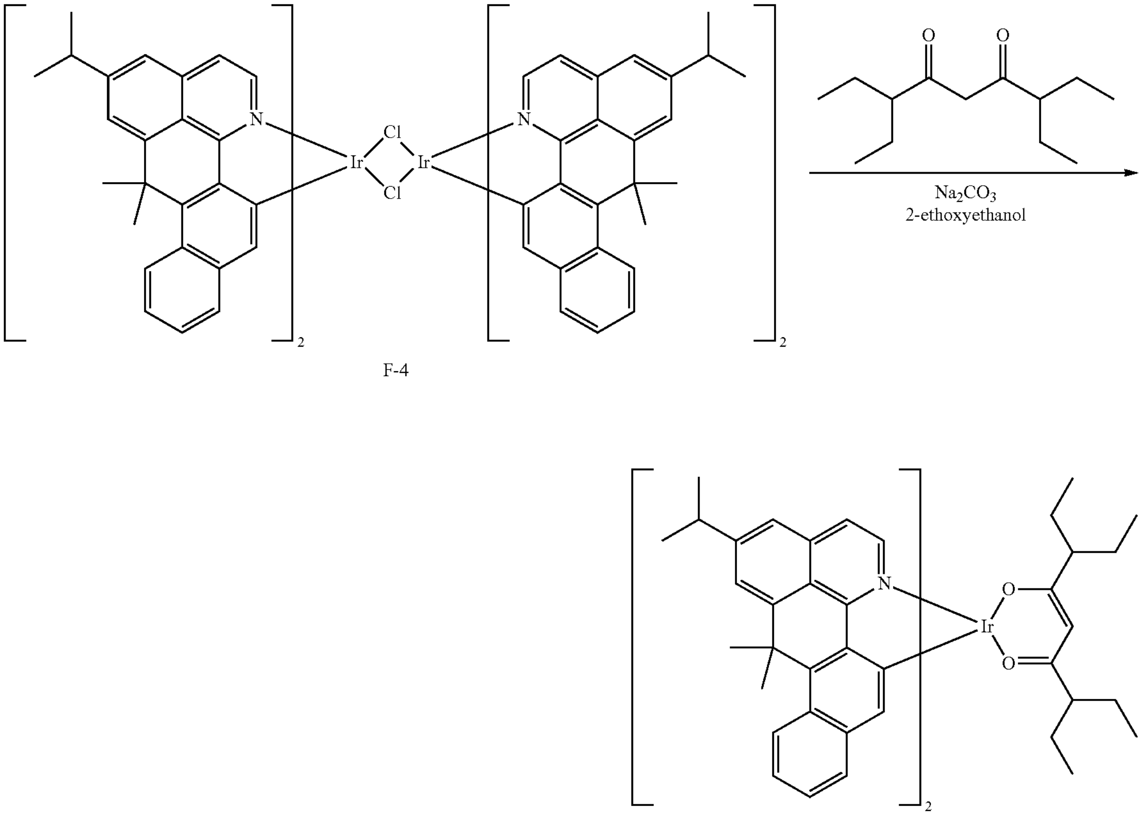

F-4

182

Compound 182 (1.1 g, yield: 57%) was obtained by repeating the synthesis process of Compound 369 except that the Intermediate F-4 (2.1 g, 1.17 mmol) was used instead of the Intermediate L-1 (4.0 g, 2.21 mmol).

MS (m/z); 1076.48

Synthesis Example 5: Synthesis of Compound 154

(1) Synthesis of Intermediate C-5

[Reaction Formula 5-1]

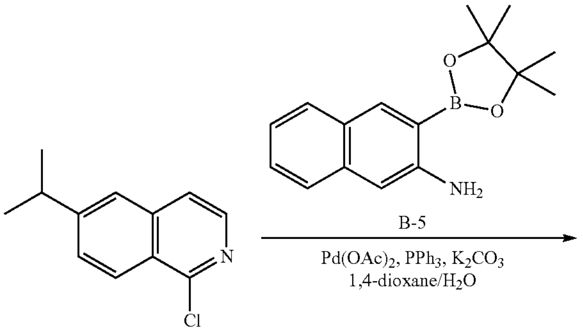

A-5

-continued

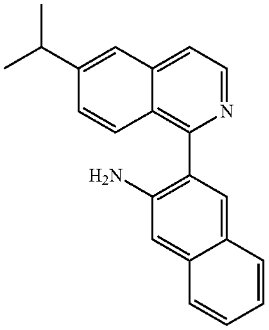

C-5

The Intermediate C-5 (11.8 g, yield: 78%) was obtained by repeating the synthesis process of the Intermediate I-1 except that the compound A-5 (10 g, 48.62 mmol) and the compound B-45 (14.4 g, 53.48 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carbozylte (17.45 g, 53.48 mmol), respectively.

MS (m z); 312.16

(2) Synthesis of Intermediate D-5

[Reaction Formula 5-2]

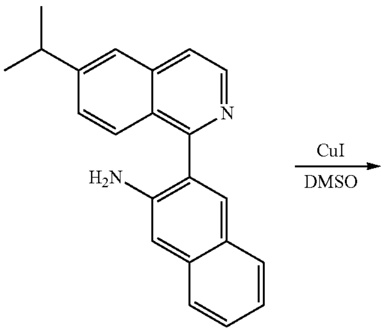

C-5

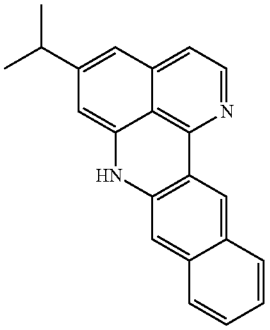

D-5

The Intermediate C-5 (11.8 g, 37.75) and dimethylsulfoxide (DMSO) (200 mL) were put into a reaction vessel, then CuI (10.8 g, 56.66 mmol) was added into the reaction vessel, and then the solution was refluxed at 150° C. for 12 hours. After the reaction was complete, the solution was filtered, extracted with ethyl acetate, water in the organic layer was removed with $MgSO_4$, and then the solution was filtered and placed under reduced pressure to remove the solvent. The crude product was purified with column chromatography (eluent: hexane and ethyl acetate) to give the Intermediate D-5 (4.6 g, yield: 39%).

MS (m z); 310.15

(3) Synthesis of Intermediate E-5

[Reaction Formula 5-3]

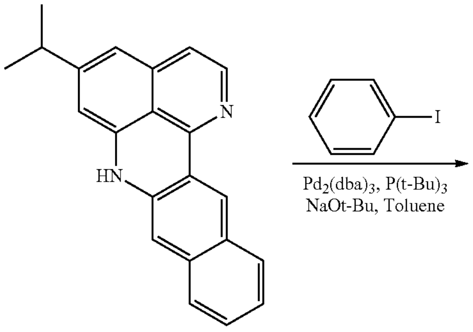

D-5

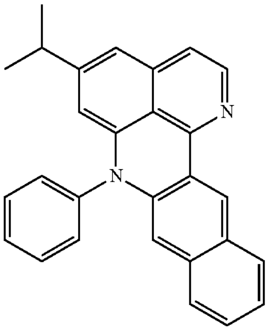

E-5

The Intermediate D-5 (4.6 g, 14.82 mmol), 1-iodobenzene (3.3 g, 16.30 mmol) and toluene (200 mL) were put into a reaction vessel, then $Pd_2(dba)_3$ (0.7 g, 0.74 mmol), $P(t\text{-}Bu)_3$ (Tri-tert-butylphosphine, 0.3 g, 1.48 mmol) and NaOt-Bu (sodium tert-butoxide, 2.8 g, 29.64 mmol) were added into the reaction vessel, and then the solution was refluxed at 100° C. for 24 hours. After the reaction was complete, the solution was extracted with ethyl acetate, water in the organic layer was removed with $MgSO_4$, and then the solution was filtered and placed under reduced pressure to remove the solvent. The crude product was purified with column chromatography (eluent: hexane and ethyl acetate) to give the Intermediate E-5 (4.6 g, yield: 81%).

MS (m/z); 386.18

(4) Synthesis of Intermediate F-5

[Reaction Formula 5-4]

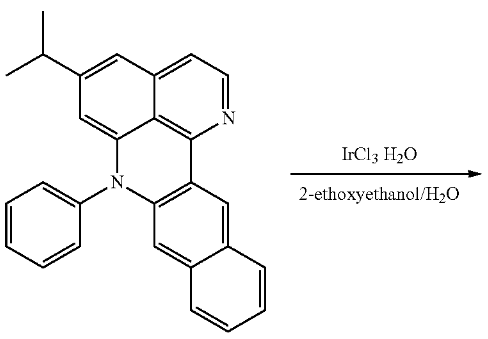

E-5

-continued

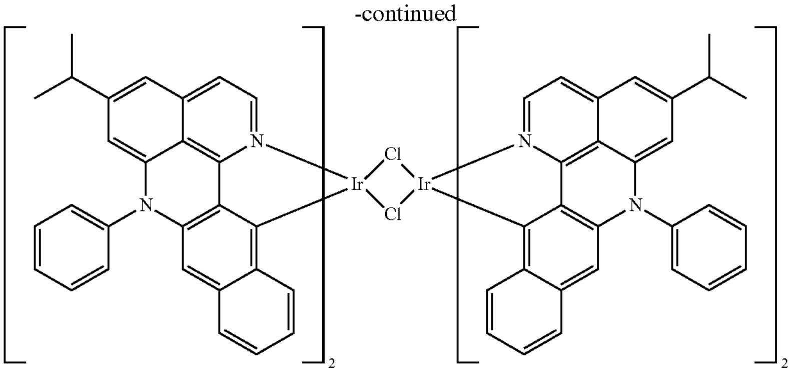

F-5

The Intermediate F-5 (2.5 g, yield: 47%) was obtained by repeating the synthesis process of the Intermediate L-1 except that the Intermediate E-5 (4.6 g, 11.90 mmol) was used instead of the Intermediate K-1 (10.25 g, 30.37 mmol).

(5) Synthesis of Compound 154

[Reaction Formula 5-5]

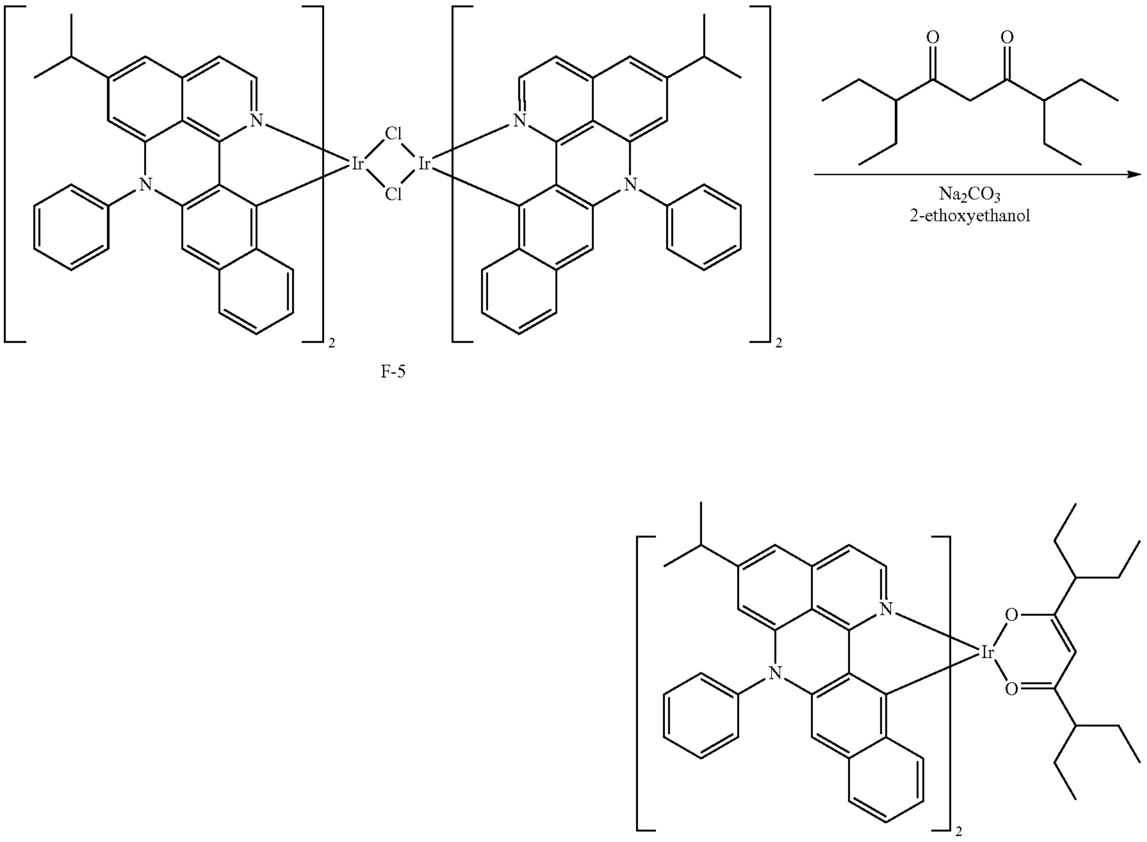

F-5

154

Compound 154 (1.4 g, yield: 46%) was obtained by repeating the synthesis process of Compound 369 except that the Intermediate F-5 (2.5 g, 1.25 mmol) was used instead of the Intermediate L-1 (4.0 g, 2.21 mmol).

MS (m/z); 1174.47

Synthesis Example 6: Synthesis of Compound 334

(1) Synthesis of Intermediate C-6

[Reaction Formula 6-1]

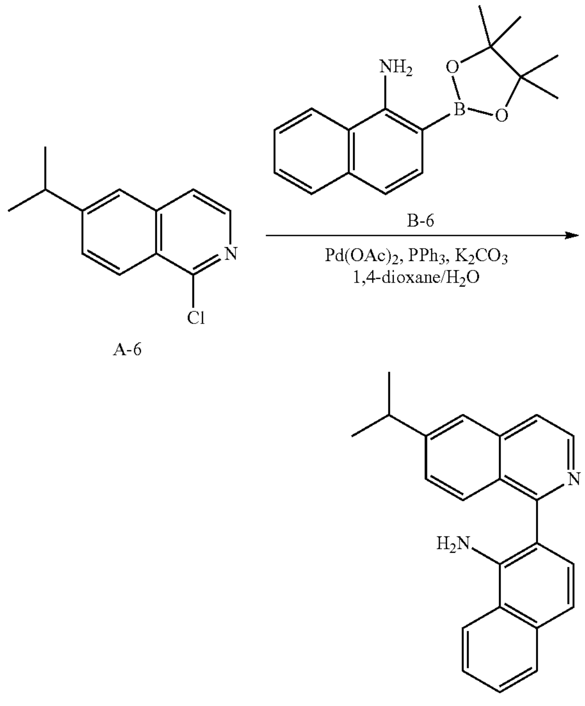

A-6

B-6

C-6

The Intermediate C-6 (11.4 g, yield: 75%) was obtained by repeating the synthesis process of the Intermediate I-1 except that the compound A-6 (10 g, 48.62 mmol) and the compound B-6 (14.4 g, 53.48 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carbozylte (17.45 g, 53.48 mmol), respectively.

MS (m/z); 312.16

(2) Synthesis of Intermediate D-6

[Reaction Formula 6-2]

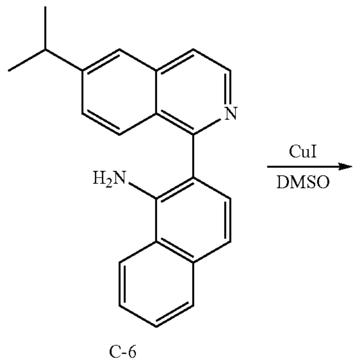

C-6

-continued

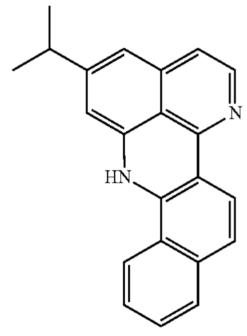

D-6

The Intermediate D-6 (6.8 g, yield: 58%) was obtained by repeating the synthesis process of the Intermediate D5 except that the Intermediate C-6 (11.4 g, 35.49 mmol) was used instead of the Intermediate C-5 (11.8 g, 37.77 mmol).

MS (m/z); 310.15

(3) Synthesis of Intermediate E-6

[Reaction Formula 6-3]

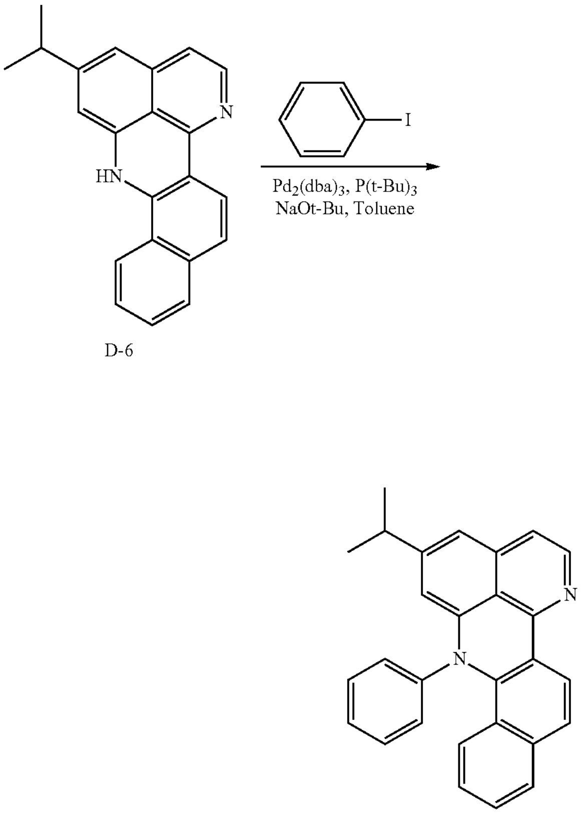

D-6

E-6

The Intermediate E-6 (5.6 g, yield: 78%) was obtained by repeating the synthesis process of the Intermediate E-5 except that the Intermediate D-6 (5.8 g, 18.61 mmol) was used instead of the Intermediate D-5 (4.6 g, 14.82 mmol).

MS (m/z); 386.18

(4) Synthesis of Intermediate F-6
[Reaction Formula 6-4]
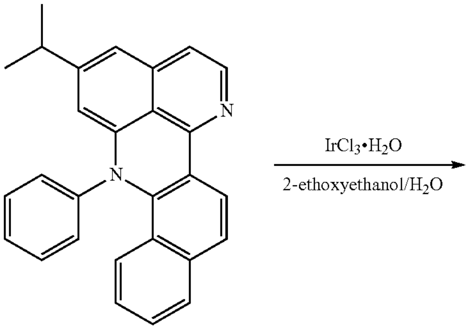
E-6
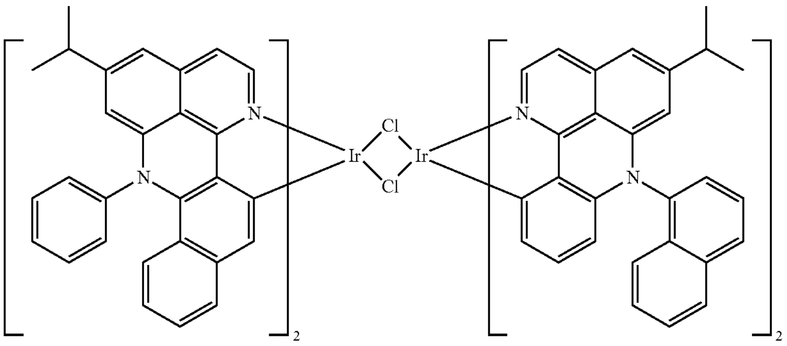
F-6
The Intermediate F-6 (2.8 g, yield: 42%) was obtained by repeating the synthesis process of the Intermediate L-1 except that the Intermediate E-6 (5.6 g, 14.49 mmol) was used instead of the Intermediate K-1 (10.25 g, 30.37 mmol).
(5) Synthesis of Compound 334
[Reaction Formula 6-5]
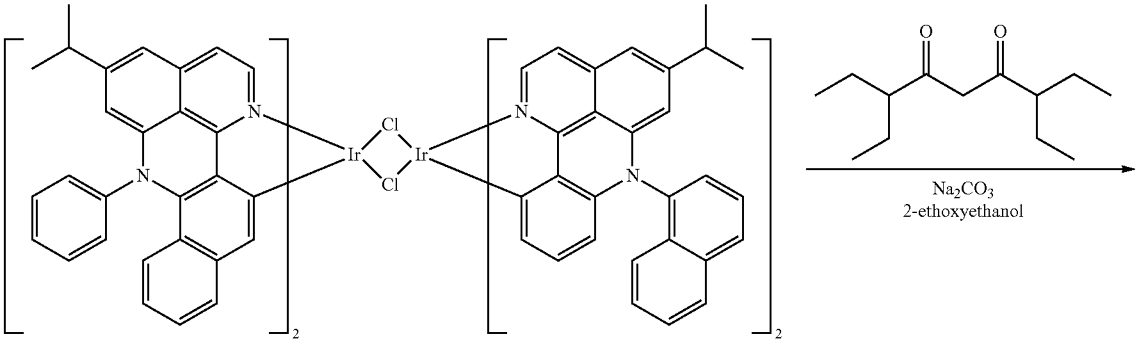
F-6

-continued

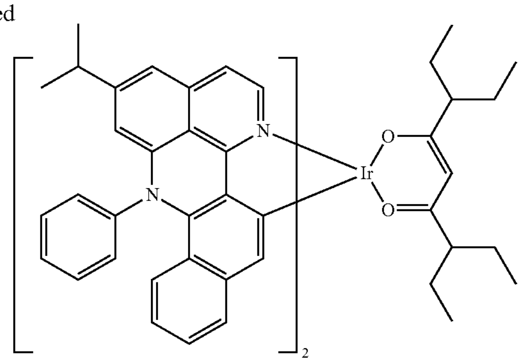

334

Compound 334 (2.0 g, yield: 61%) was obtained by repeating the synthesis process of Compound 369 except that the Intermediate F-6 (2.8 g, 1.38 mmol) was used instead of the Intermediate L-1 (4.0 g, 2.21 mmol).

MS (m/z); 1174.47

Synthesis Example 7: Synthesis of Compound 465

(1) Synthesis of Intermediate C-7

[Reaction Formula 7-1]

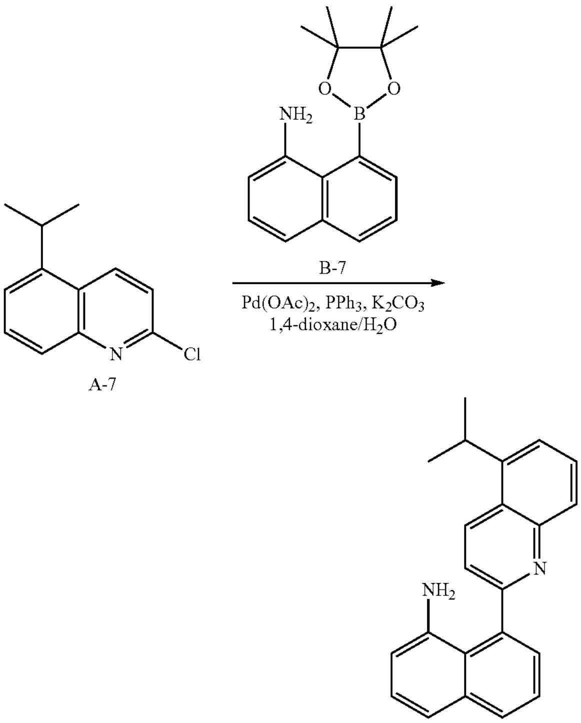

C-7

The Intermediate C-7 (9.0 g, yield: 50%) was obtained by repeating the synthesis process of the Intermediate I-1 except that the compound A-7 (10 g, 48.62 mmol) and the compound B-7 (14.4 g, 53.48 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carbozylte (17.45 g, 53.48 mmol), respectively.

MS (m/z); 312.16

(2) Synthesis of Intermediate D-7

[Reaction Formula 7-2]

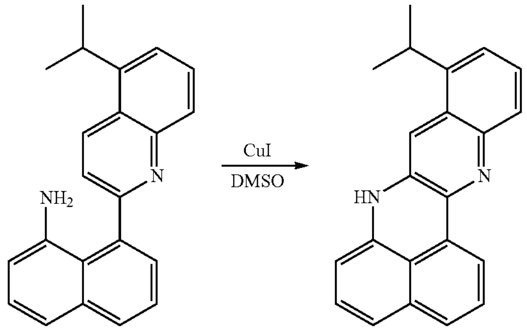

C-7 D-7

The Intermediate D-7 (7.4 g, yield: 55%) was obtained by repeating the synthesis process of the Intermediate D5 except that the Intermediate C-7 (9.0 g, 28.69 mmol) was used instead of the Intermediate C-5 (11.8 g, 37.77 mmol).

MS (m/z); 310.15

(3) Synthesis of Intermediate E-7

[Reaction Formula 7-3]

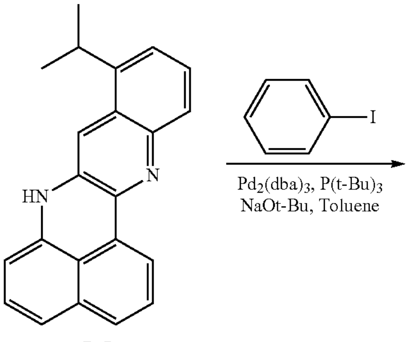

D-7

-continued

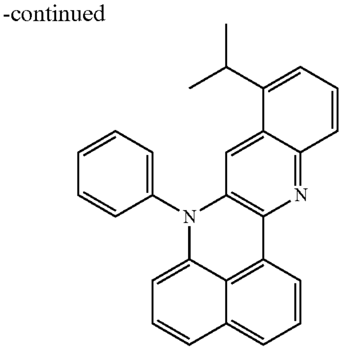

E-7

The Intermediate E-7 (4.7 g, yield: 77%) was obtained by repeating the synthesis process of the Intermediate E-5 except that the Intermediate D-7 (4.9 g, 15.78 mmol) was used instead of the Intermediate D-5 (4.6 g, 14.82 mmol).

MS (m/z); 386.18

(4) Synthesis of Intermediate F-7

[Reaction Formula 7-4]

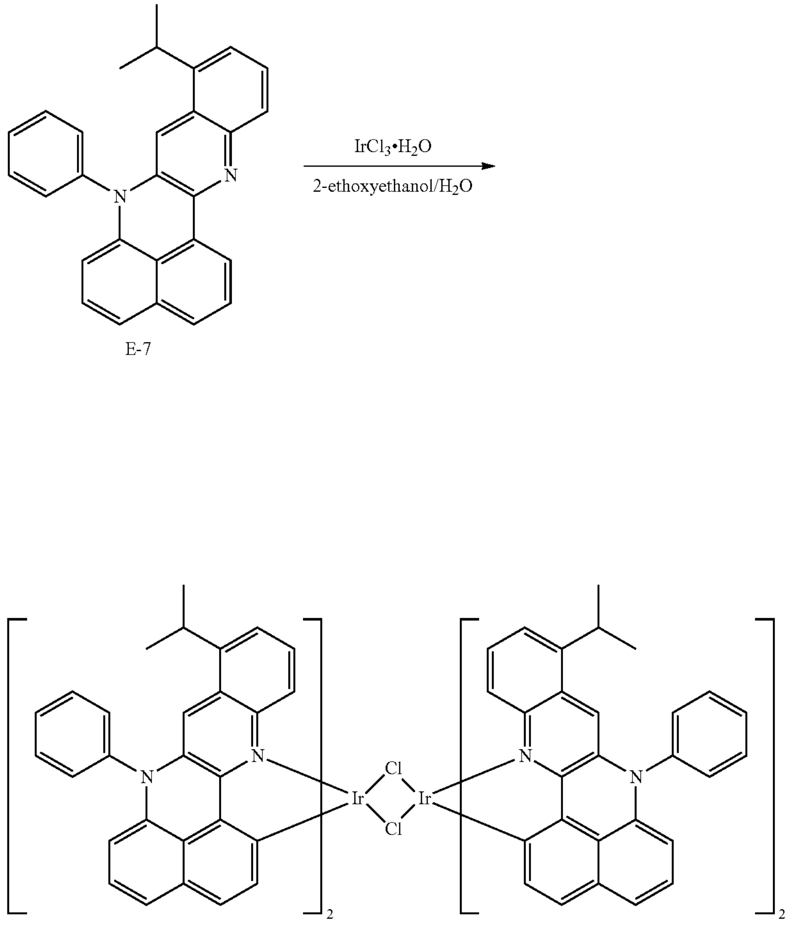

E-7

F-7

The Intermediate F-7 (2.6 g, yield: 48%) was obtained by repeating the synthesis process of the Intermediate L-1 except that the Intermediate E-7 (4.7 g, 12.16 mmol) was used instead of the Intermediate K-1 (10.25 g, 30.37 mmol).

(5) Synthesis of Compound 465

[Reaction Formula 7-5]

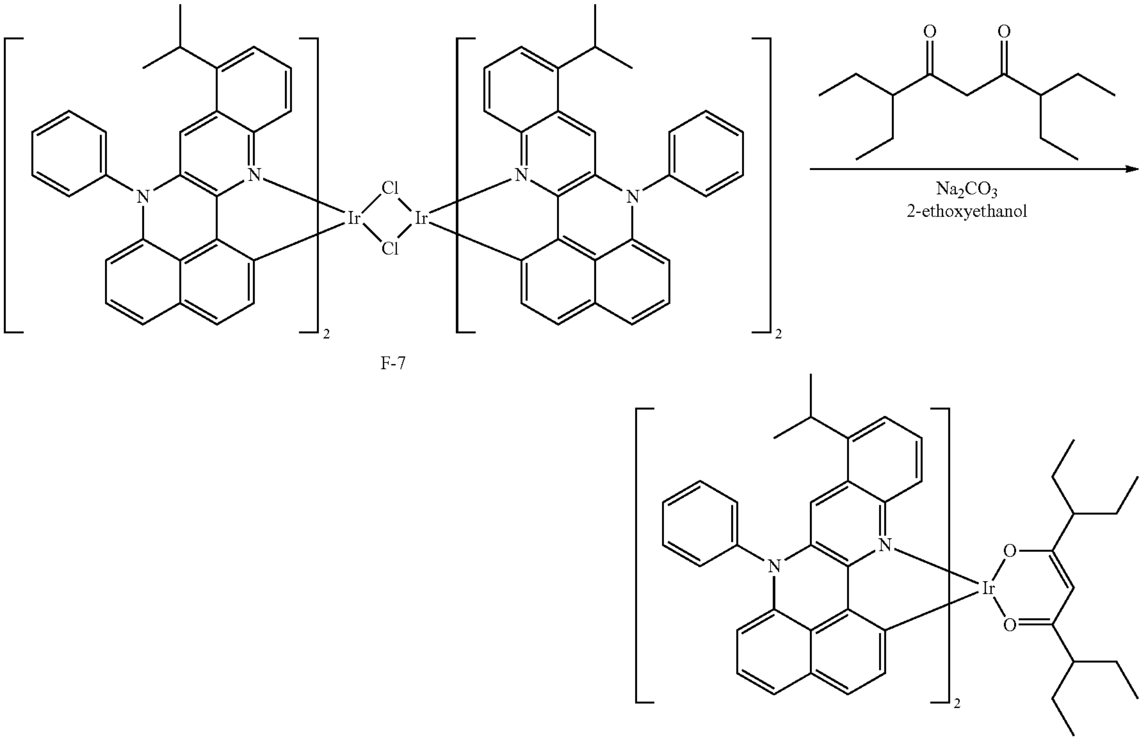

F-7

465

Compound 465 (2.0 g, yield: 64%) was obtained by repeating the synthesis process of Compound 369 except that the Intermediate F-7 (2.6 g, 1.33 mmol) was used instead of the Intermediate L-1 (4.0 g, 2.21 mmol).

MS (m/z); 1174.47

Synthesis Example 8: Synthesis of Compound 582

(1) Synthesis of Intermediate C-8

[Reaction Formula 8-1]

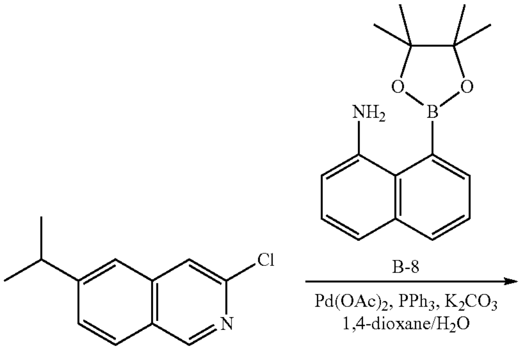

A-8

-continued

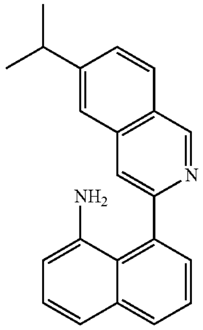

C-8

The Intermediate C-8 (9.0 g, yield: 50%) was obtained by repeating the synthesis process of the Intermediate I-1 except that the compound A-8 (10 g, 48.62 mmol) the compound B-8 (14.4 g, 53.48 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carbozylte (17.45 g, 53.48 mmol), respectively.

MS (m/z); 312.16

(2) Synthesis of Intermediate D-8

[Reaction Formula 8-2]

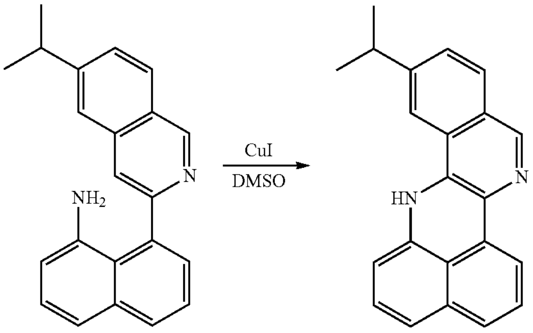

C-8 D-8

The Intermediate D-8 (7.4 g, yield: 55%) was obtained by repeating the synthesis process of the Intermediate D5 except that the Intermediate C-8 (10.0 g, 35.01 mmol) was used instead of the Intermediate C-5 (11.8 g, 37.77 mmol).

MS (m/z); 310.15

(3) Synthesis of Intermediate E-8

[Reaction Formula 8-3]

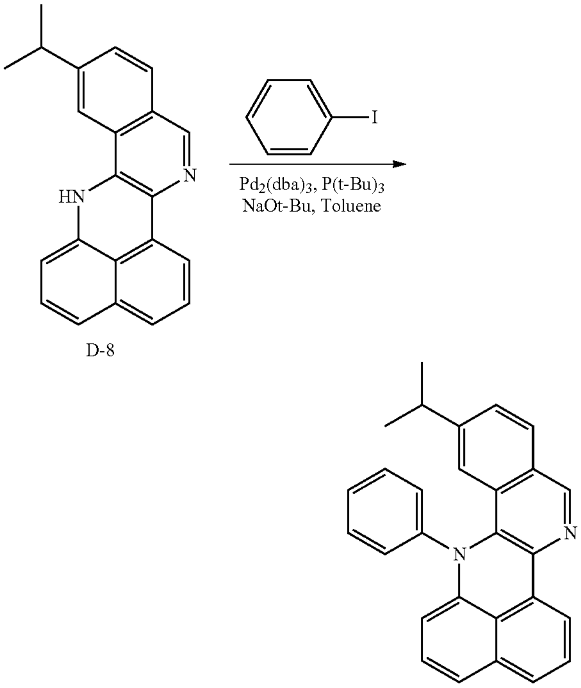

D-8

E-8

The Intermediate E-8 (5.3 g, yield: 83%) was obtained by repeating the synthesis process of the Intermediate E-5 except that the Intermediate D-8 (5.1 g, 15.45 mmol) was used instead of the Intermediate D-5 (4.6 g, 14.82 mmol).

MS (m/z); 386.18

(4) Synthesis of Intermediate F-8

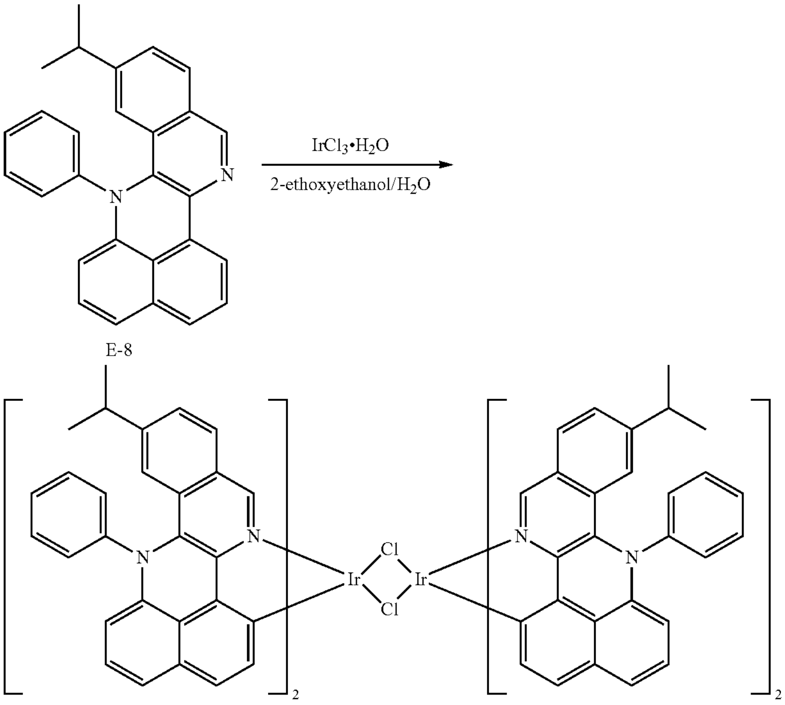

E-8

F-8

The Intermediate F-8 (2.4 g, yield: 39%) was obtained by repeating the synthesis process of the Intermediate L-1 except that the Intermediate E-8 (5.3 g, 13.66 mmol) was used instead of the Intermediate K-1 (10.25 g, 30.37 mmol).

(5) Synthesis of Compound 582

[Reaction Formula 8-5]

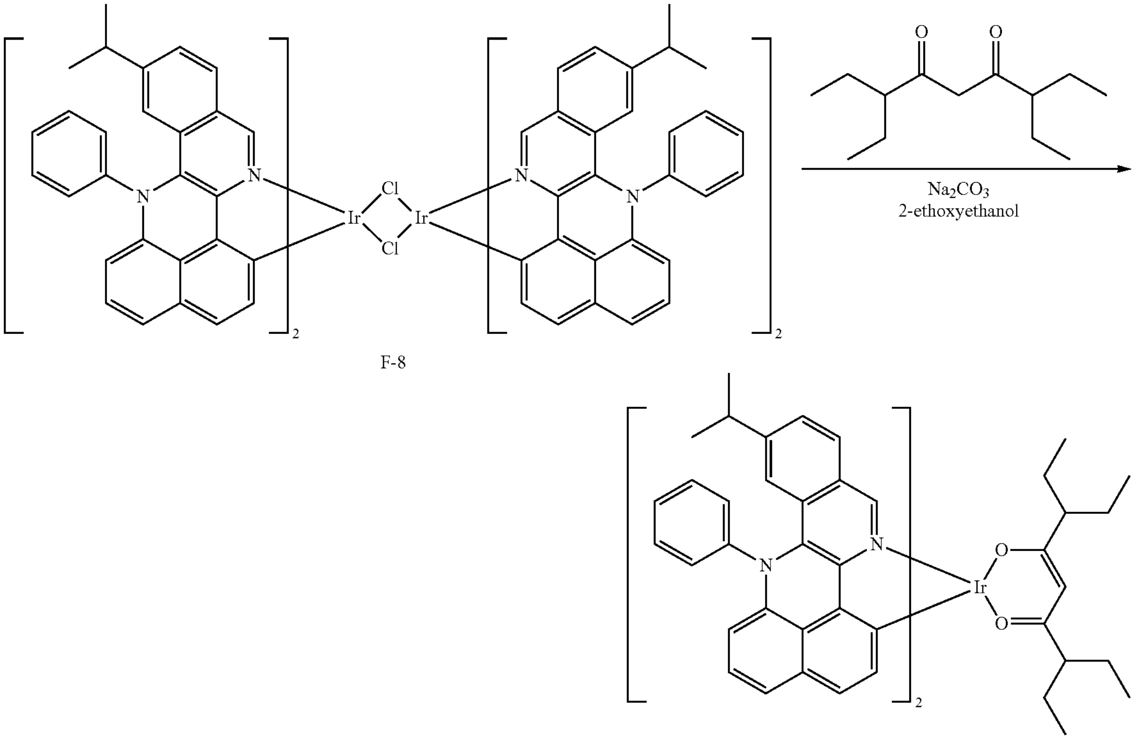

F-8

582

Compound 582 (1.8 g, yield: 64%) was obtained by repeating the synthesis process of Compound 369 except that the Intermediate F-8 (2.4 g, 1.1 mmol) was used instead of the Intermediate L-1 (4.0 g, 2.21 mmol).

MS (m/z); 1174.47

Synthesis Example 9: Synthesis of Compound 168

(1) Synthesis of Intermediate C-9

[Reaction Formula 9-1]

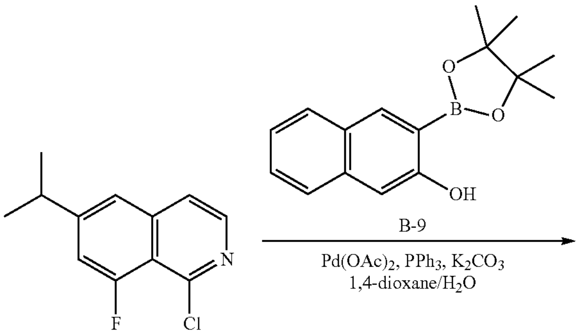

B-9

A-9

-continued

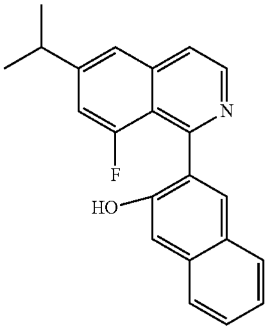

C-9

The Intermediate C-9 (9.9 g, yield: 67%) was obtained by repeating the synthesis process of the Intermediate I-1 except that the compound A-9 (10 g, 44.71 mmol) the compound B-9 (13.3 g, 49.18 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carbozylte (17.45 g, 53.48 mmol), respectively.

MS (m/z); 331.14

(2) Synthesis of Intermediate D-9

[Reaction Formula 9-2]

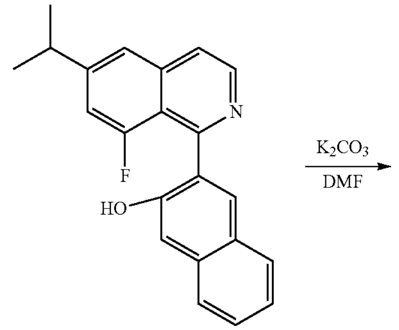

C-9

-continued

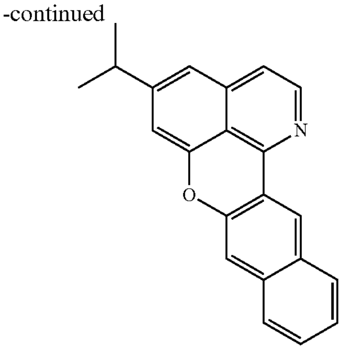

D-9

The Intermediate C-9 (9.9 g, 29.88 mmol) and DMF (100 mL) were put into a reaction vessel, and the Intermediate C-9 was dissolved in DMF, K2CO3 (12.4 g, 89.62 mmol) was added into the reaction vessel, and then the solution was stirred at 100° C. for 1 hour. After the reaction was complete, the solution was cooled to room temperature and then ethanol (100 mL) was added into the reaction vessel. After the mixture was distilled under reduced pressure, the reactants were recrystallized with chloroform/ethyl acetate to give the Intermediate D-9 (4.9 g, yield: 53%).

MS (m/z); 377.73

(3) Synthesis of Intermediate E-9

[Reaction Formula 9-3]

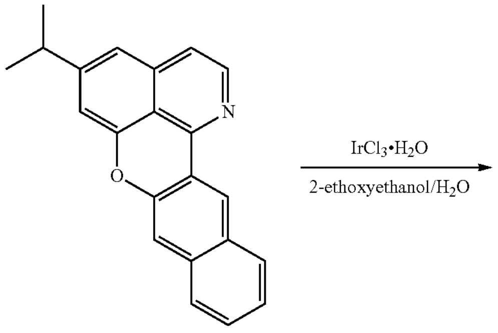

D-9

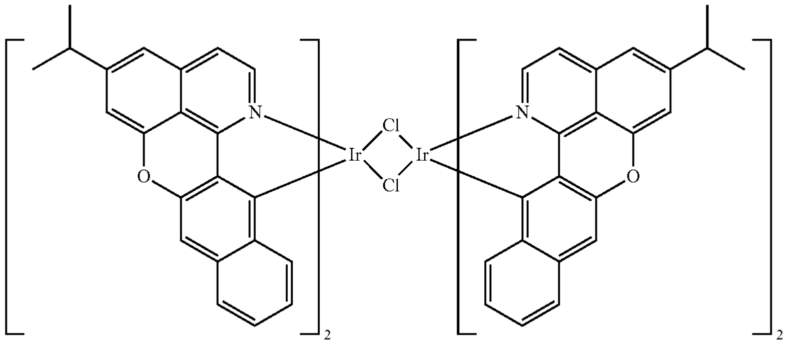

E-9

The Intermediate E-9 (3.1 g, yield: 50%) was obtained by repeating the synthesis process of the Intermediate L-1 except that the Intermediate D-9 (4.9 g, 15.83 mmol) was used instead of the Intermediate K-1 (10.25 g, 30.37 mmol).

(4) Synthesis of Compound 168

[Reaction Formula 9-4]

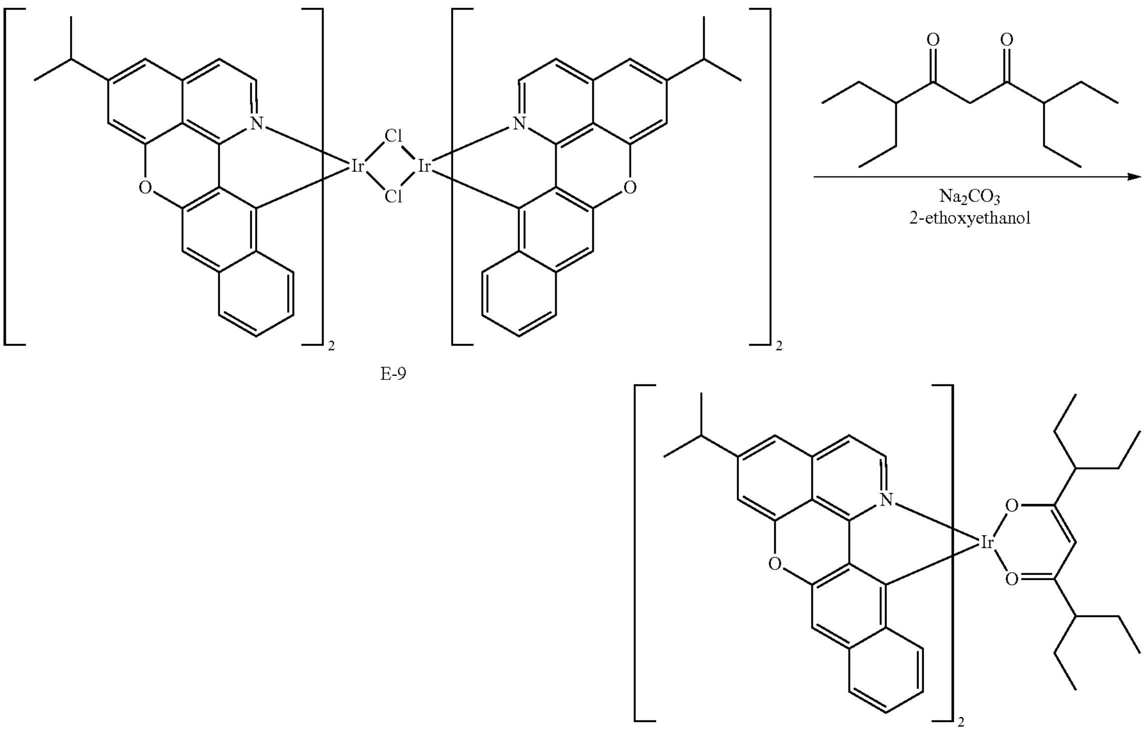

E-9

168

Compound 168 (2.0 g, yield: 54%) was obtained by repeating the synthesis process of Compound 369 except that the Intermediate E-9 (3.1 g, 1.80 mmol) was used instead of the Intermediate L-1 (4.0 g, 2.21 mmol).

MS (m/z); 1024.38

Synthesis Example 10: Synthesis of Compound 348

(1) Synthesis of Intermediate C-10

[Reaction Formula 10-1]

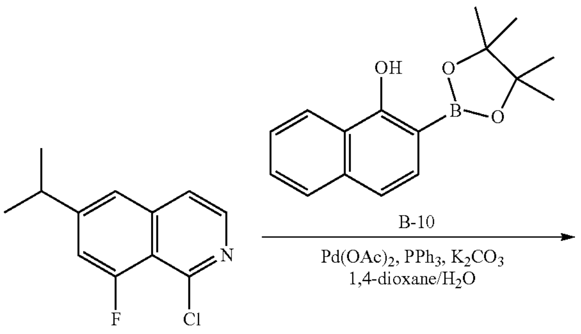

B-10

A-10

-continued

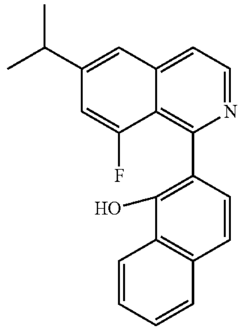

C-10

The Intermediate C-10 (9.0 g, yield: 64%) was obtained by repeating the synthesis process of the Intermediate I-1 except that the compound A-10 (10 g, 44.71 mmol) the compound B-10 (13.3 g, 49.18 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carbozylte (17.45 g, 53.48 mmol), respectively.

MS (m/z); 331.14

(2) Synthesis of Intermediate D-10
[Reaction Formula 10-2]
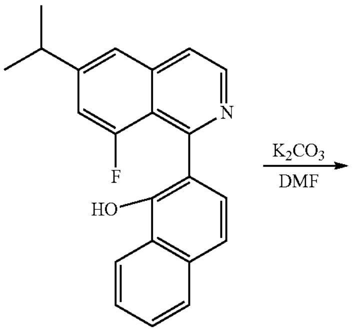
C-10
-continued
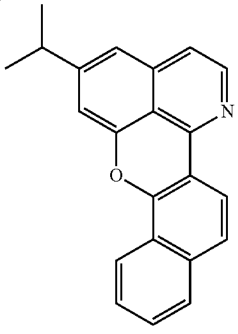
D-10
The Intermediate D-10 (5.0 g, yield: 55%) was obtained by repeating the synthesis process of the Intermediate D-9 except that the Intermediate C-10 (9.6 g, 29.06 mmol) was used instead of the Intermediate C-9 (9.9 g, 28.88 mmol). MS (m/z); 577.75
(3) Synthesis of Intermediate E-10
[Reaction Formula 10-3]
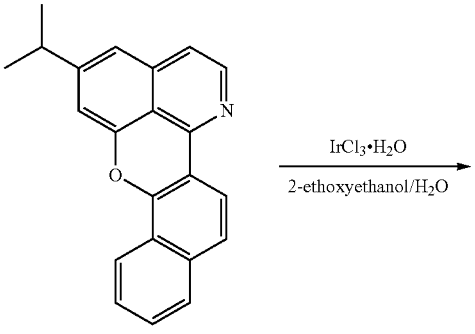
D-10
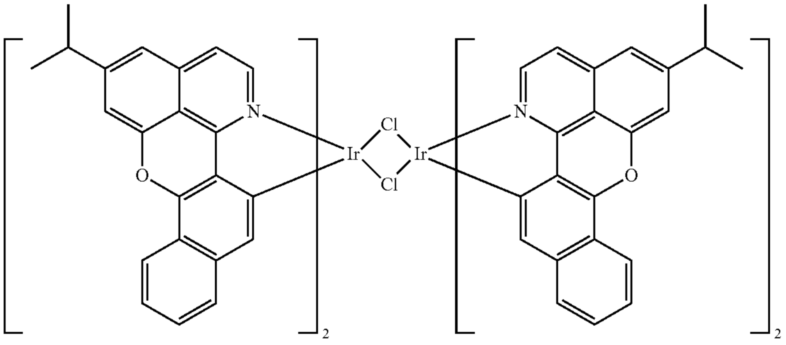
E-10

The Intermediate E-10 (3.5 g, yield: 57%) was obtained by repeating the synthesis process of the Intermediate L-1 except that the Intermediate D-10 (5.0 g, 15.98 mmol) was used instead of the Intermediate K-1 (10.25 g, 30.37 mmol).

(4) Synthesis of Compound 348

[Reaction Formula 10-4]

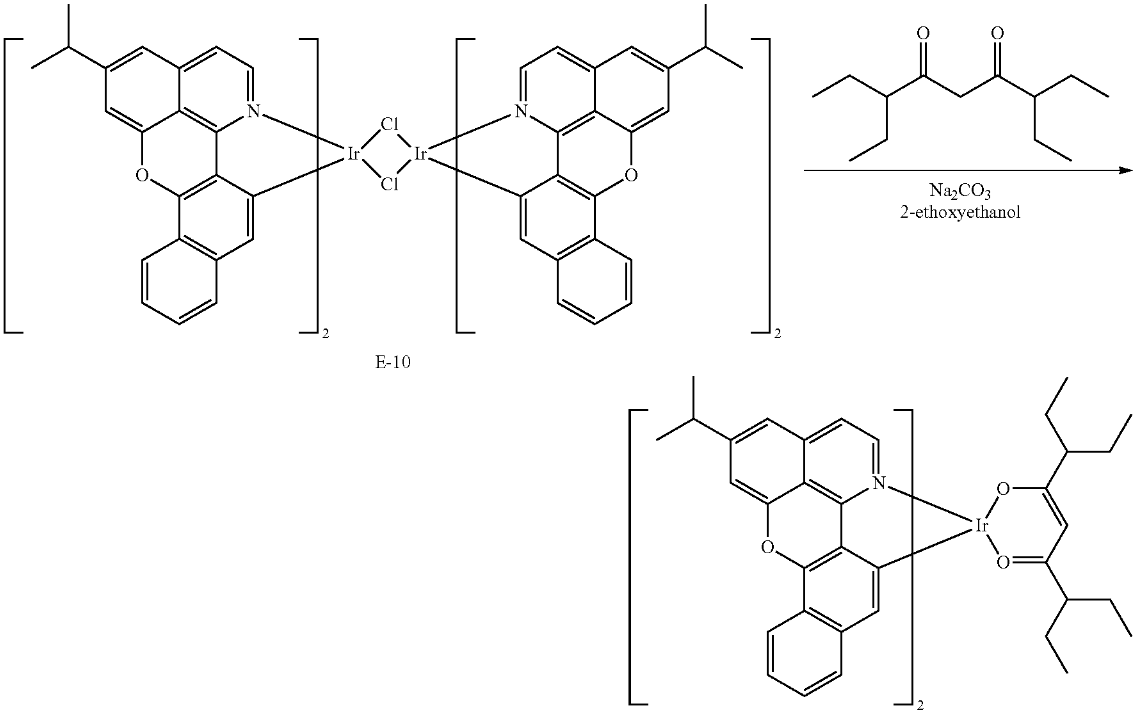

E-10

348

Compound 348 (1.8 g, yield: 43%) was obtained by repeating the synthesis process of Compound 369 except that the Intermediate E-10 (3.5 g, 2.07 mmol) was used instead of the Intermediate L-1 (4.0 g, 2.21 mmol).

MS (m/z); 1024.38

Synthesis Example 11: Synthesis of Compound 483

(1) Synthesis of Intermediate C-11

[Reaction Formula 11-1]

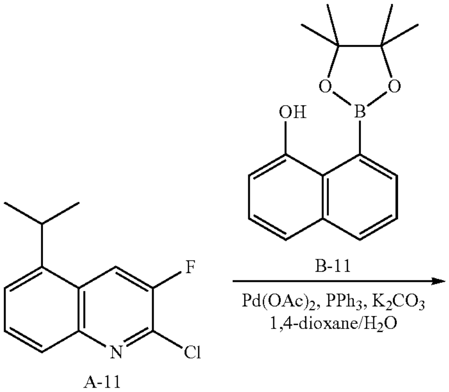

B-11

A-11

-continued

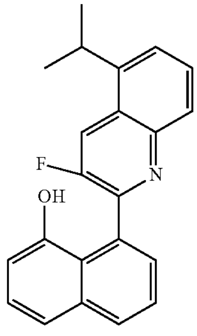

C-11

The Intermediate C-11 (7.9 g, yield: 53%) was obtained by repeating the synthesis process of the Intermediate I-1 except that the compound A-11 (10 g, 44.71 mmol) the compound B-11 (13.3 g, 49.18 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carbozylte (17.45 g, 53.48 mmol), respectively.

MS (m/z); 331.14

(2) Synthesis of Intermediate D-11

[Reaction Formula 11-2]

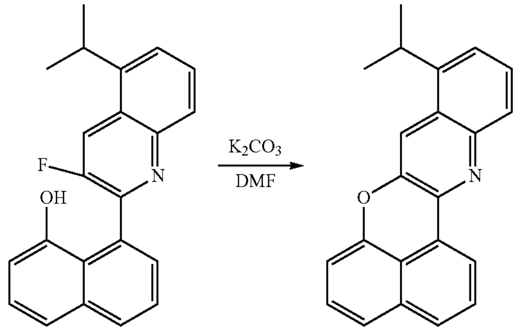

C-11 D-11

The Intermediate D-11 (3.8 g, yield: 51%) was obtained by repeating the synthesis process of the Intermediate D-9 except that the Intermediate C-11 (7.9 g, 23.07 mmol) was used instead of the Intermediate C-9 (9.9 g, 28.88 mmol).

MS (m/z); 377.73

(3) Synthesis of Intermediate E-11

[Reaction Formula 11-3]

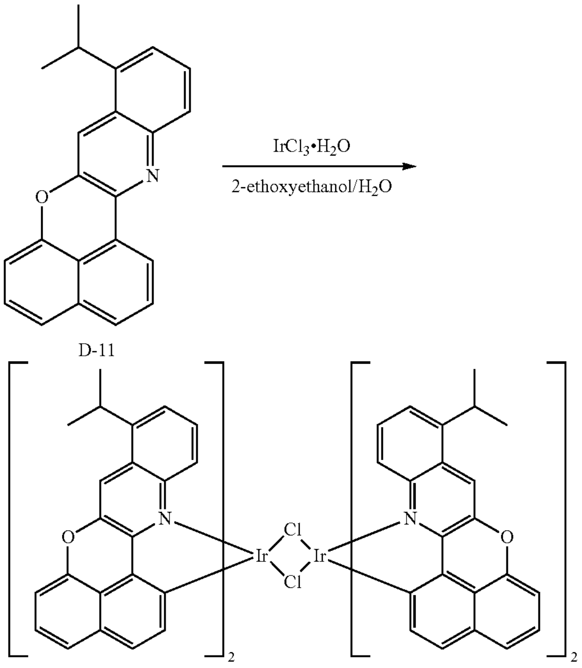

D-11

E-11

The Intermediate E-11 (3.0 g, yield: 63%) was obtained by repeating the synthesis process of the Intermediate L-1 except that the Intermediate D-11 (3.8 g, 12.20 mmol) was used instead of the Intermediate K-1 (10.25 g, 30.37 mmol).

(4) Synthesis of Compound 483

[Reaction Formula 11-4]

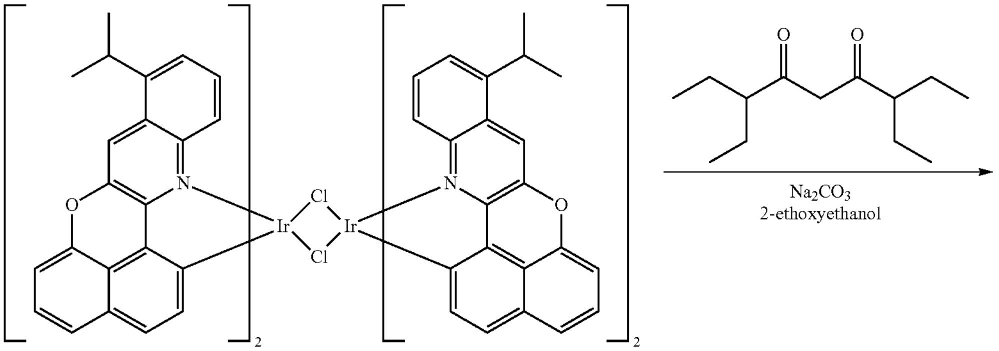

E-11

-continued

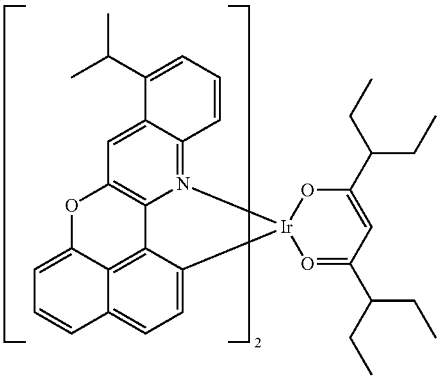

483

Compound 483 (1.6 g, yield: 44%) was obtained by repeating the synthesis process of Compound 369 except that the Intermediate E-11 (3.0 g, 1.75 mmol) was used instead of the Intermediate L-1 (4.0 g, 2.21 mmol).

MS (m/z); 1024.38

Synthesis Example 12: Synthesis of Compound 598

(1) Synthesis of Intermediate C-12

[Reaction Formula 12-1]

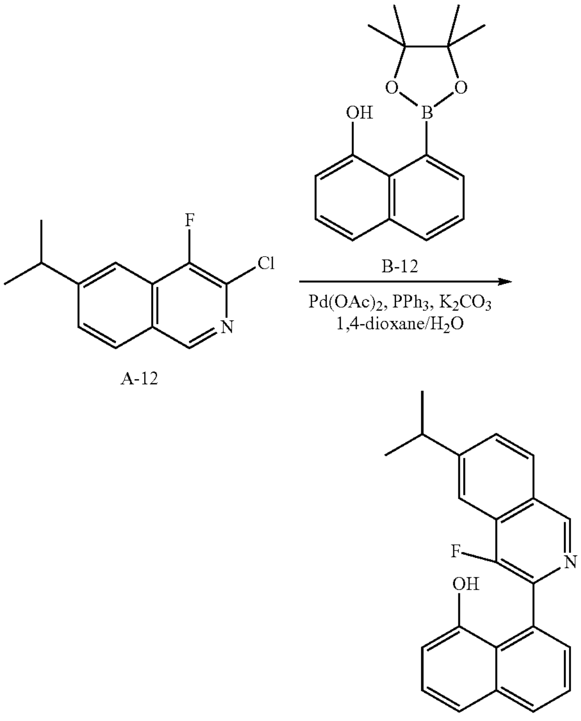

The Intermediate C-12 (9.8 g, yield: 66%) was obtained by repeating the synthesis process of the Intermediate I-1 except that the compound A-12 (10 g, 44.71 mmol) the compound B-12 (13.3 g, 49.18 mmol) were used instead of the Intermediate D-1 (2-chloro-5-isopropylquinoline, 10 g, 48.62 mmol) and the Intermediate H-1 (ethyl 8-(4,4,5,5-tetramethyl-1,3,2-dioxaborolan-2-yl)naphthalene-1-carbozylte (17.45 g, 53.48 mmol), respectively.

MS (m/z); 331.14

(2) Synthesis of Intermediate D-12

[Reaction Formula 12-2]

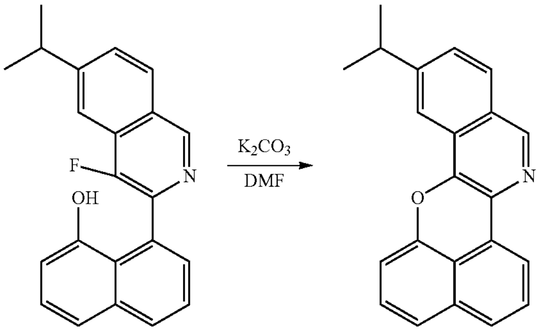

C-12 D-12

The Intermediate D-12 (5.0 g, yield: 54%) was obtained by repeating the synthesis process of the Intermediate D-9 except that the Intermediate C-12 (9.8 g, 29.51 mmol) was used instead of the Intermediate C-9 (9.9 g, 28.88 mmol).

MS (m/z); 377.73

(3) Synthesis of Intermediate E-12

[Reaction Formula 12-3]

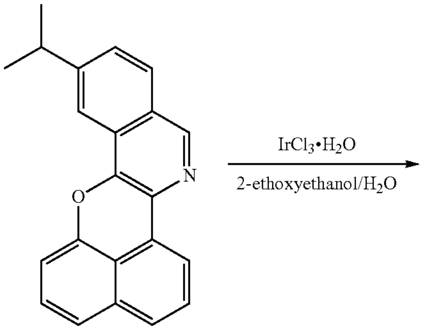

D-12

-continued

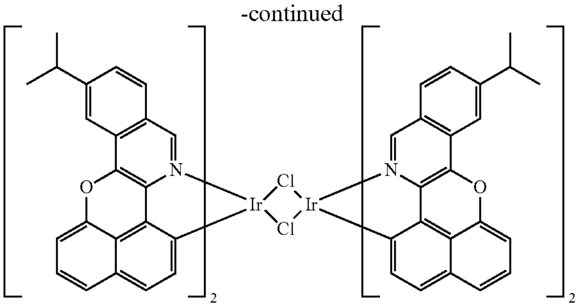

E-12

The Intermediate E-12 (3.4 g, yield: 55%) was obtained by repeating the synthesis process of the Intermediate L-1 except that the Intermediate D-12 (5.0 g, 15.93 mmol) was used instead of the Intermediate K-1 (10.25 g, 30.37 mmol).

(4) Synthesis of Compound 598

[Reaction Formula 12-4]

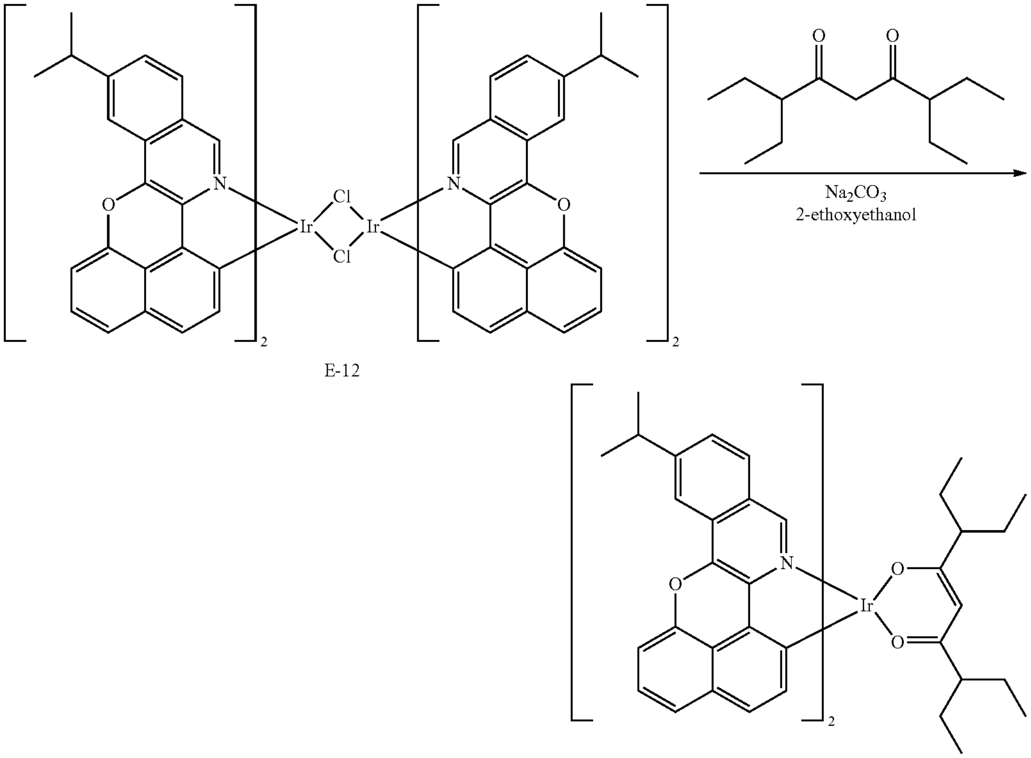

Compound 598 (1.6 g, yield: 39%) was obtained by repeating the synthesis process of Compound 369 except that the Intermediate E-12 (3.4 g, 1.99 mmol) was used instead of the Intermediate L-1 (4.0 g, 2.21 mmol).

MS (m/z); 1024.38

Experimental Example 1: Measurement PL Spectrum

Figure 7:
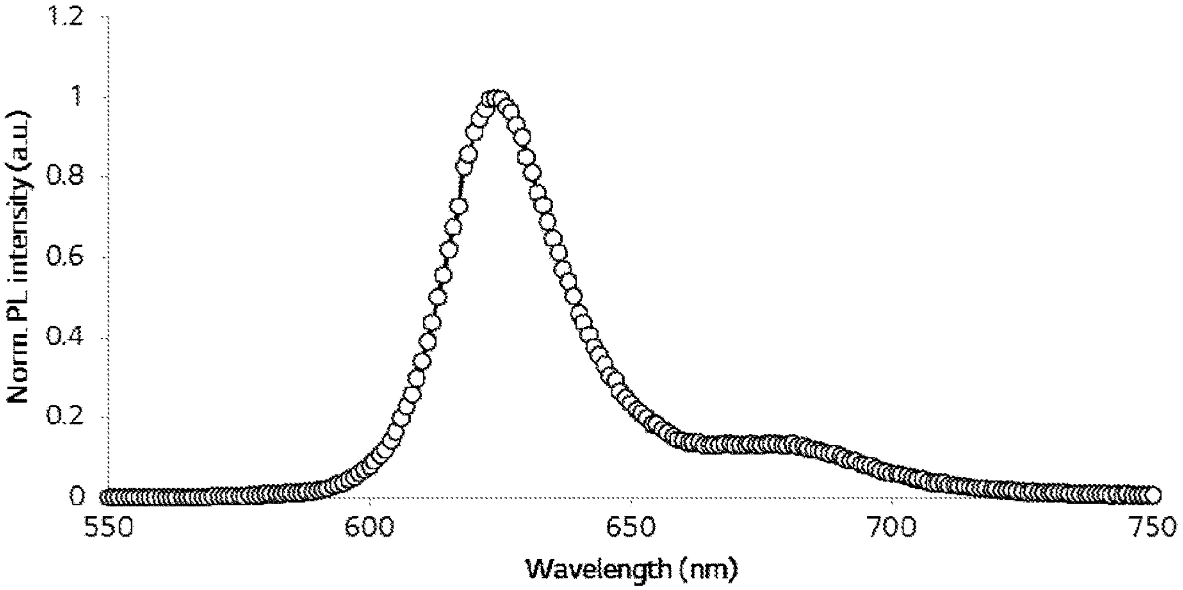
FIG. 7 is a graph illustrating a photoluminescence (PL) intensity of an organic metal compound synthesized in one Example of the present disclosure.

The photoluminescence (PL) spectrum for the Compound 2 obtained in Synthesis Example 2 was measured under dichloromethane solvent at room temperature with F25 spectrofluorometer (Edinburgh Instruments). FIG. 7 illustrates the PL spectrum for the Compound 2. The Compound 2 emits light in red color ranges.

Example 1 (Ex. 1): Fabrication of OLED

An organic light emitting diode was fabricated applying Compound 360 obtained in Synthesis Example 1 as dopant into an emitting material layer (EML). A glass substrate onto which ITO (100 nm) was coated as a thin film was washed and ultrasonically cleaned by solvent such as isopropyl alcohol, acetone and dried at 100° C. oven. The substrate was transferred to a vacuum chamber for depositing emissive layer. Subsequently, an emissive layer and a cathode were deposited by evaporation from a heating boat under about 5~7 $10^{-7}$ Torr with setting deposition rate of 1 Å/s as the following order:

A hole injection layer (HIL) (following HI-1 (NPNPB), 60 nm thickness); a hole transport layer (HTL) (NPB, 80 nm), an EML (Host (following PH, 95 wt %), Dopant (Compound 369, 5 wt %), 30 nm); an ETL-EIL (following ET (2-[4-(9,10-Di-2-naphthalenyl-2-anthracenyl)phenyl]-1-phenyl-1H-benzimidazole, ZADN, 50 wt %), Liq (50 wt %), 30 nm thickness); and a cathode (Al, 100 nm thickness).

And then, capping layer (CPL) was deposited over the cathode and the device was encapsulated by glass. After deposition of emissive layer and the cathode, the OLED was transferred from the deposition chamber to a dry box for film formation, followed by encapsulation using UV-curable epoxy and moisture getter. The HIL material, the Host in the EML and the ETL material is illustrated in the following:

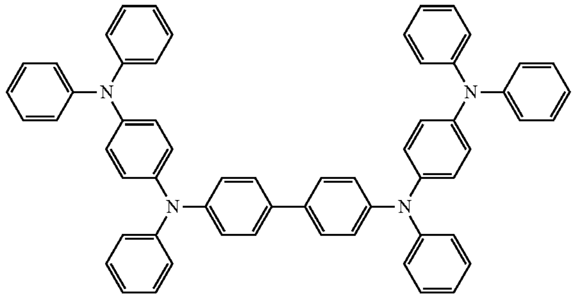

HI

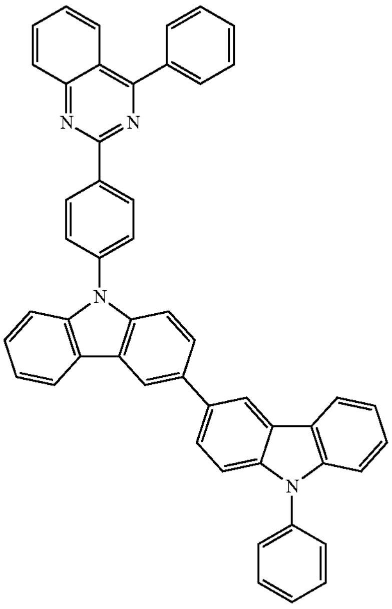

PH

-continued

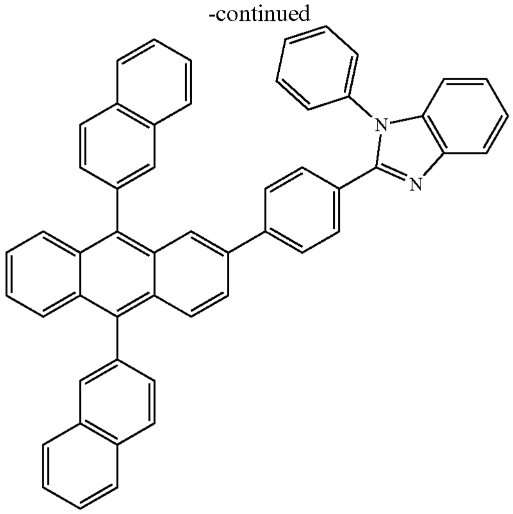

ET

Examples 2-12 (Ex, 2-12): Fabrication of OLEDs

An OLED was fabricated using the same procedure and the same material as in Example 1, except that Compound 501 (Ex. 2), Compound 2 (Ex. 3), Compound 182 (Ex. 4), Compound 154 (Ex. 5), Compound 334 (Ex. 6), Compound 465 (Ex. 7), Compound 582 (Ex. 8), Compound 168 (Ex. 9), Compound 348 (Ex. 10), Compound 483 (Ex. 11) and Compound 598 (Ex. 12), respectively, were used as the dopant in the EML instead of Compound 369

Comparative Example (Ref): Fabrication of OLEDs

An OLED was fabricated using the same procedure and the same material as in Example 1, except that the following PD was used as the dopant in the EML instead of Compound 369.

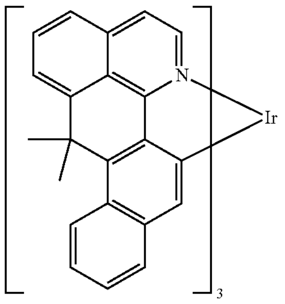

PD

Experimental Example 2: Measurement of Luminous Properties of OLEDs

Each of the OLEDs, having 9 $mm^2$ of emission area, fabricated in Examples 1 to 12 and Comparative Example was connected to an external power source and then luminous properties for all the OLEDs were evaluated using a constant current source (KEITHLEY) and a photometer PR650 at room temperature. In particular, driving voltage (V), External quantum efficiency (EQE, relative value) and time period ($T_{95}$, relative value) at which the luminance was reduced to 95% from initial luminance was measured at current density 10 mA/$cm^2$. The measurement results are indicated in the following Table 1.

TABLE 1

| Luminous Properties of OLED | | | | |
|---|---|---|---|---|
| Sample | Dopant | (V) | EQE (%, relative) | $T_{95}$ (%, relative) |
| Ref. | PD | 4.22 | 100 | 100 |
| Ex. 1 | 369 | 3.94 | 112 | 120 |
| Ex. 2 | 501 | 3.98 | 114 | 137 |
| Ex. 3 | 2 | 4.02 | 117 | 152 |
| Ex. 4 | 182 | 4.05 | 115 | 148 |
| Ex. 5 | 154 | 3.92 | 103 | 106 |
| Ex. 6 | 334 | 3.98 | 102 | 105 |
| Ex. 7 | 465 | 3.81 | 100 | 101 |
| Ex. 8 | 582 | 3.83 | 101 | 103 |
| Ex. 9 | 168 | 3.95 | 110 | 115 |
| Ex. 10 | 348 | 3.92 | 108 | 109 |
| Ex. 11 | 483 | 3.87 | 105 | 106 |
| Ex. 12 | 598 | 3.90 | 106 | 107 |

As indicated in Table 1, the OLED fabricated in Comparative Example, the OLED into which the organic metal compound in accordance with the present disclosure as the dopant decreased its driving voltage up to 9.7%, and improved its external quantum efficiency (EQE) and $T_{95}$ up to 17% and 52%, respectively. Such results indicate that OLED can reduce its driving voltage and increase significantly its luminous efficiency and luminous lifespan by applying the organic metal compound of the present disclosure into an EML.

It will be apparent to those skilled in the art that various modifications and variations can be made in the present disclosure without departing from the scope of the invention. Thus, it is intended that the present disclosure cover the modifications and variations of the present disclosure provided they come within the scope of the appended claims.

What is claimed is:

1. An organic metal compound having the following structure of Formula 1:

[Formula 1]

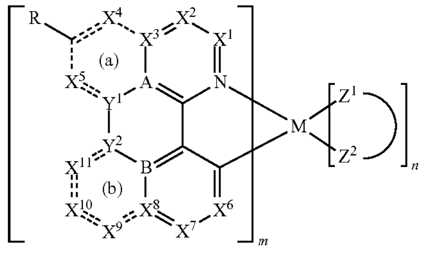

wherein

M is molybdenum (Mo), tungsten (W), rhenium (Re), osmium (Os), rhodium (Rh), iridium (Ir), palladium (Pd), platinum (Pt) or silver (Ag);

each of A and B is a carbon atom;

R is an unsubstituted or substituted $C_1$-$C_{20}$ alkyl group, an unsubstituted or substituted $C_1$-$C_{20}$ alkyl silyl group, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

each of $X^1$ to $X^2$, $X^4$, $X^5$, $X^6$, $X^7$ and $X^9$ to $X^{11}$ is independently $CR^1$ or N;

only one of: a ring (a) with $X^3$-$X^5$, $Y^1$ and A; or a ring (b) with and $X^8$-$X^{11}$, $Y^2$ and B is formed; and if the ring (a) is formed, each of $X^3$ and $Y^1$ is a carbon atom, $X^8$ is $CR^1$ or N, $X^6$ and $X^7$ or $X^7$ and $X^8$ forms an unsubstituted or substituted $C_4$-$C_{30}$ alicyclic ring, the unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^2$ is $BR^2$, $CR^2R^3$, C═O, $SiR^2R^3$, $GeR^2R^3$, $PR^2$, P═O, O, S, $SO_2$, Se, $SeO_2$, Te or $TeO_2$, or $NR^a$ wherein $R^a$ is an unsubstituted or substituted $C_1$-$C_{20}$ alkyl group or an unsubstituted or substituted $C_6$-$C_{30}$ aromatic group;

if the ring (b) is formed, each of $X^8$ and $Y^2$ is a carbon atom, $X^3$ is $CR^1$ or N, $X^1$ and $X^2$ or $X^2$ and $X^3$ forms an unsubstituted or substituted $C_4$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring; and $Y^1$ is $BR^2$, $CR^2R^3$, C═O, $SiR^2R^3$, $GeR^2R^3$, $PR^2$, P═O, O, S, $SO_2$, Se, $SeO_2$, Te $TeO_2$, or $NR^a$ wherein $R^a$ is an unsubstituted or substituted $C_1$-$C_{20}$ alkyl group or an unsubstituted or substituted $C_6$-$C_{30}$ aromatic group, each of $R^1$ to $R^3$ is independently protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent carbons to which $R^1$ is attached, and/or $R^2$ and $R^3$ form an unsubstituted or substituted $C_4$-$C_{30}$ alicyclic ring, an unsubstituted or substituted $C_3$-$C_{30}$ hetero alicyclic ring, an unsubstituted or substituted $C_6$-$C_{30}$ aromatic ring or an unsubstituted or substituted $C_3$-$C_{30}$ hetero aromatic ring;

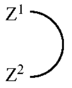

is an auxiliary ligand;

m is an integer of 1 to 3;

n is an integer of 0 to 2; and m+n is an oxidation number of M.

2. The organic metal compound of claim 1, having the following structure of Formula 2:

[Formula 2]

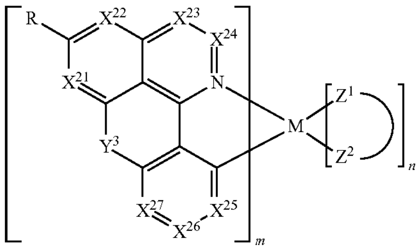

wherein each of M, R,

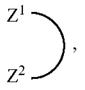

m and n is a same as defined in Formula 1;

each of $X^{21}$ to $X^{27}$ is independently $CR^1$ or N;

$Y^3$ is $BR^2$, $CH_2$, $CR^2R^3$, C═O, $SiR^2R^3$, $GeR^2R^3$, $PR^2$, P═O, O, S, $SO_2$, Se, $SeO_2$, Te or $TeO_2$; each of $R^1$ to $R^3$ is a same as defined in Formula 1.

3. The organic metal compound of claim 1, having the following structure of Formula 3:

[Formula 3]

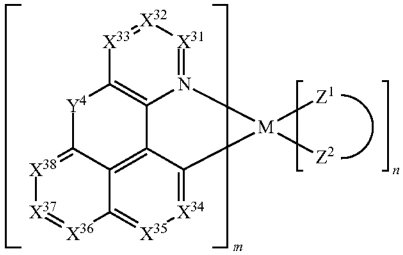

wherein each of M,

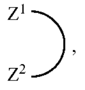

m and n is a same as defined in Formula 1;

each of $X^{31}$ to $X^{38}$ is independently $CR^1$ or N;

$Y^4$ is $BR^2$, C, $CR^2R^3$, C═O, $SiR^2R^3$, $GeR^2R^3$, $PR^2$, P═O, O, S, $SO_2$, Se, $SeO_2$, Te or $TeO_2$; and each of $R^1$ to $R^3$ is a same as defined in Formula 1.

4. The organic metal compound of claim 2, having the following structure of Formula 4 or Formula 5:

[Formula 4]

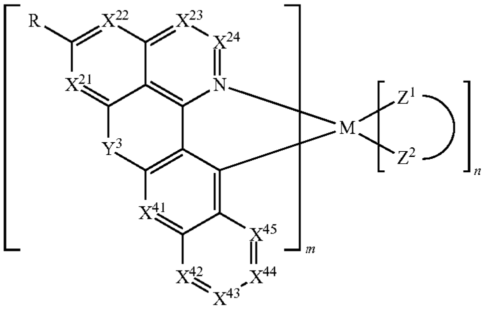

[Formula 5]

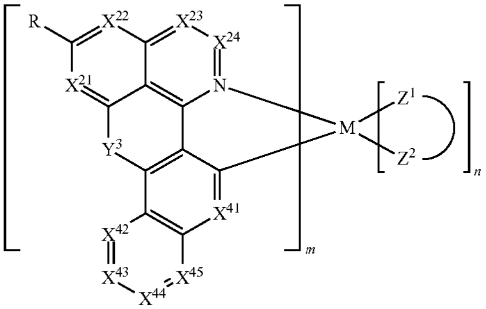

wherein each of M, R,

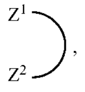

m, n, $X^{21}$ to $X^{24}$ and $Y^3$ is a same as defined in Formula 2;

each of $X^{41}$ to $X^{45}$ is independently $CR^1$ or N; and each of $R^1$ to $R^3$ is a same as defined in Formula 1.

5. The organic metal compound of claim 3, having the following structure of Formula 6 or Formula 7:

[Formula 6]

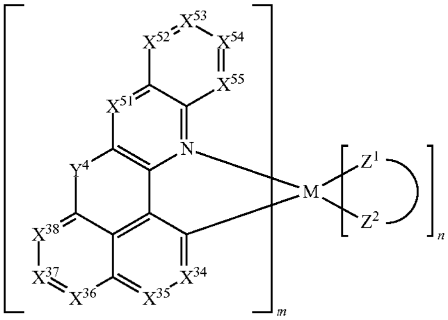

-continued

[Formula 7]

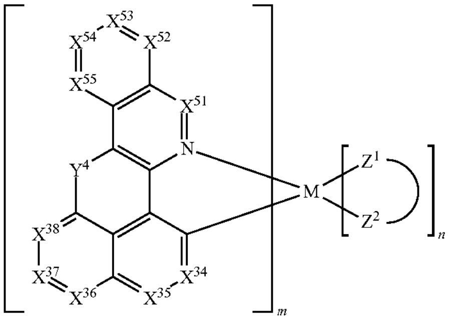

wherein

M,

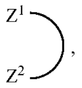

m, n, $X^{34}$ to $X^{38}$ and $Y^4$ is a same as defined in Formula 3;

each of $X^{51}$ to $X^{55}$ is independently $CR^1$ or N;

each of $R^1$ to $R^3$ is a same as defined in Formula 1.

6. The organic metal compound of claim 1, having a structure of any one of Formula 8 to Formula 11:

[Formula 8]

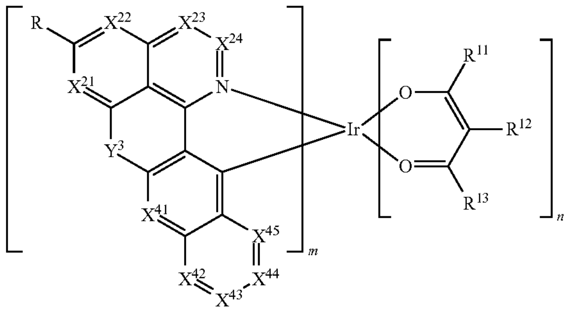

[Formula 9]

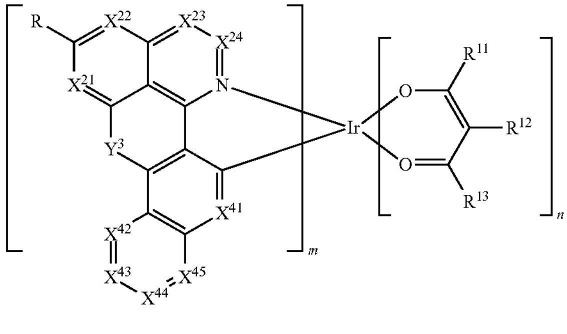

-continued

[Formula 10]

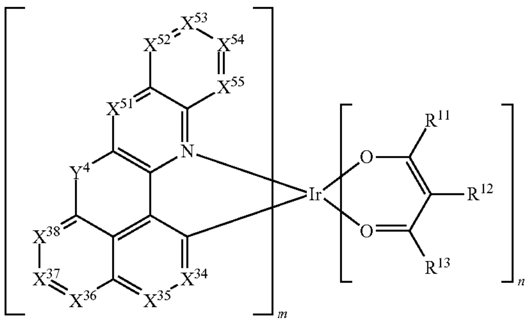

[Formula 11]

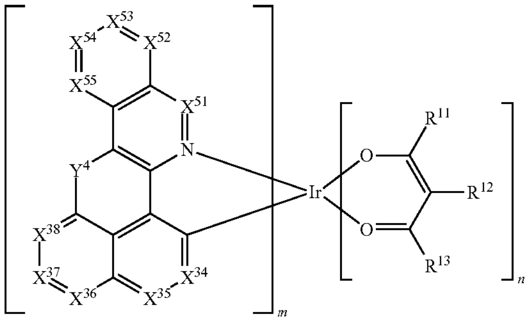

wherein

R is a same as defined in Formula 1;

each of $X^{21}$ to $X^{24}$, $X^{34}$ to $X^{38}$, $X^{41}$ to $X^{45}$ and $X^{51}$ to $X^{55}$ is independently $CR^1$ or N;

each of $Y^3$ and $Y^4$ is independently $BR^2$, $CH_2$, $CR^2R^3$, C═O, $SiR^2R^3$, $GeR^2R^3$, $PR^2$, P═O, O, S, $SO_2$, Se, $SeO_2$, Te or $TeO_2$;

each of $R^1$ to $R^3$ is a same as defined in Formula 1;

each of $R^{11}$ to $R^{13}$ is independently protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

m is an integer of 1 to 3; and n is an integer of 0 to 2;

m+n is 3.

7. The organic metal compound of claim 1, wherein the organic metal compound is selected form the following compounds:

-continued
1
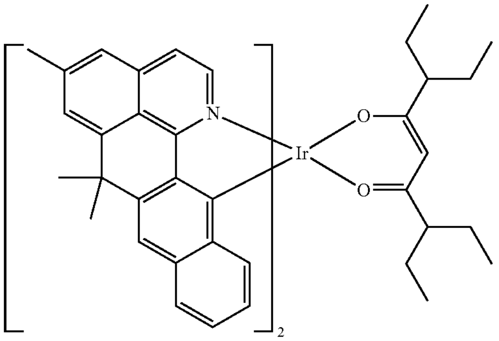
2
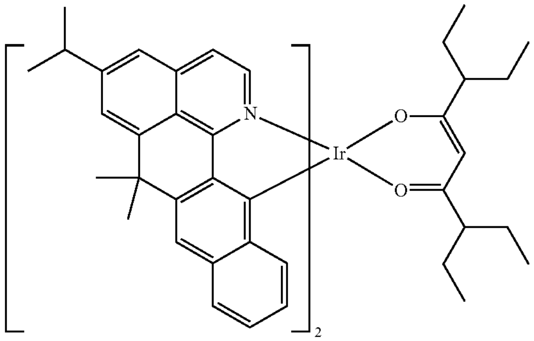
3
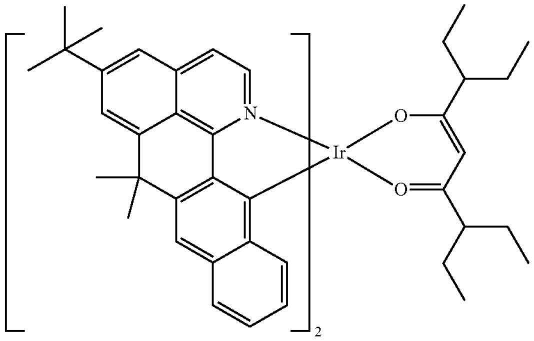
4
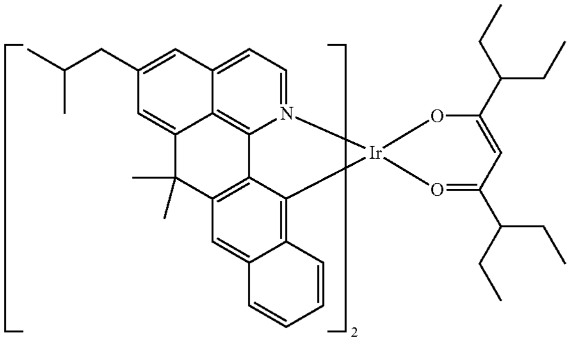
5
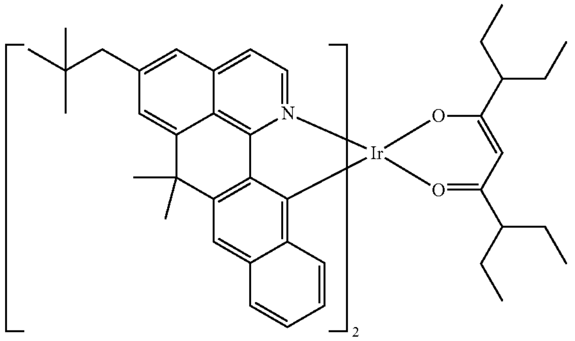
6
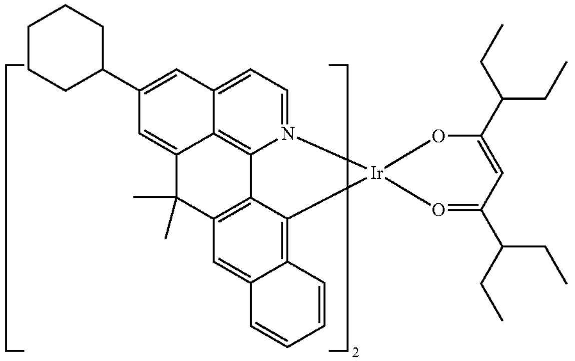
7
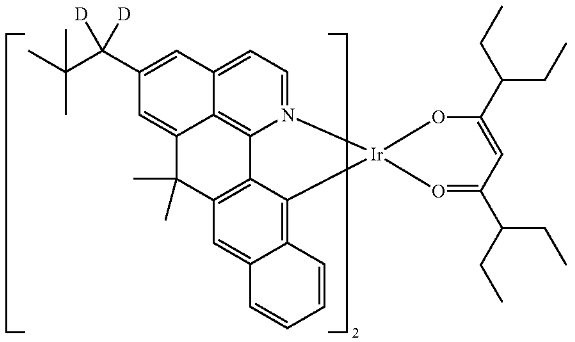
8
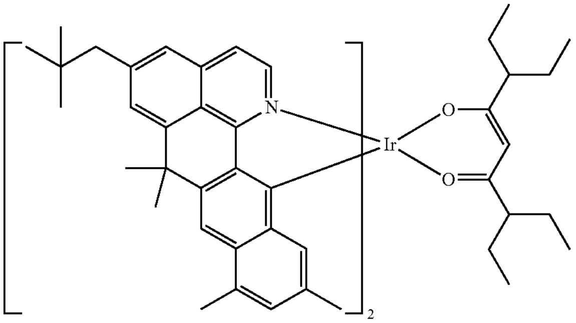

-continued
9
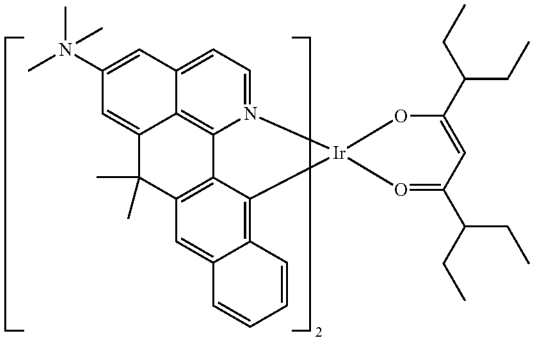
10
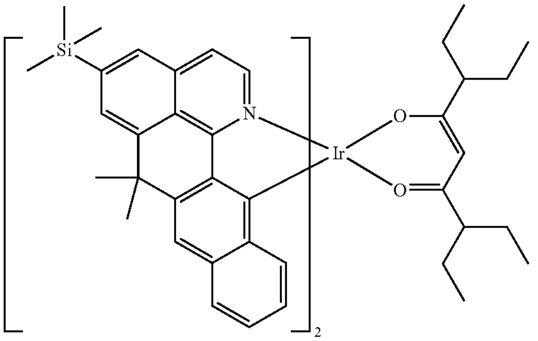
11
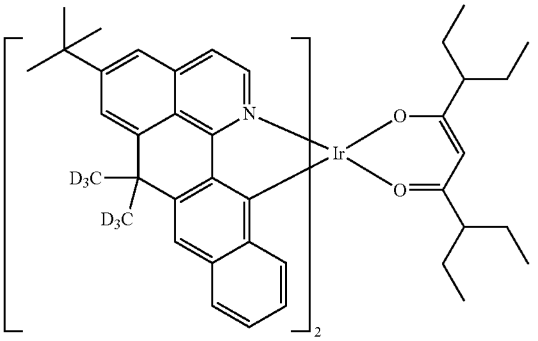
12
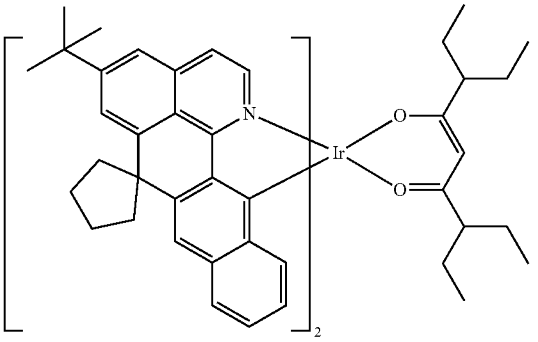
-continued
13
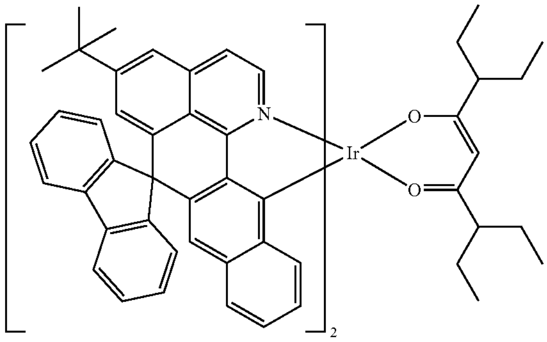
14
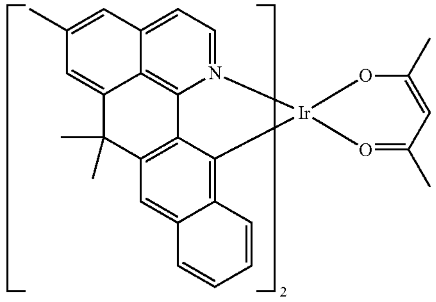
15
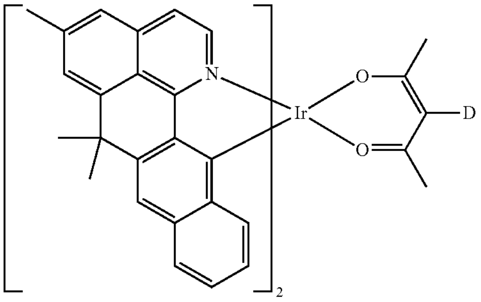
16
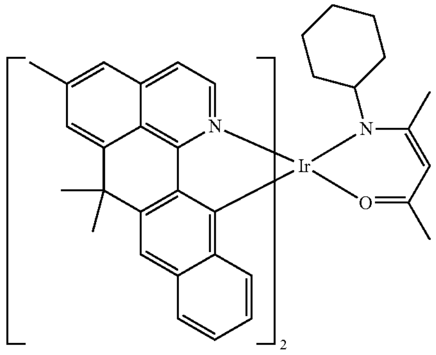

-continued
17
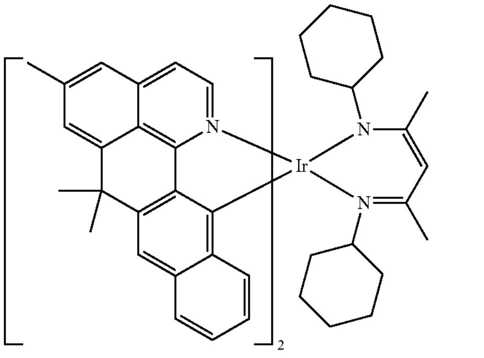
18
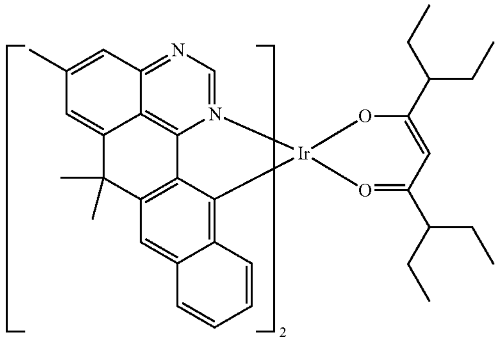
19
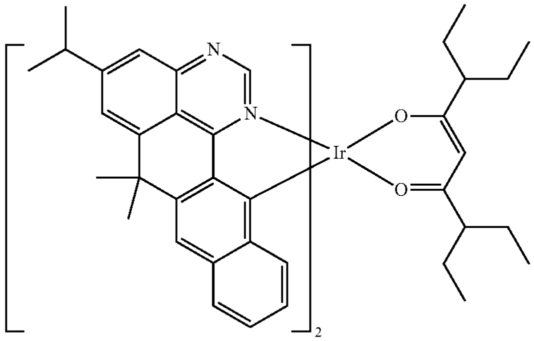
20
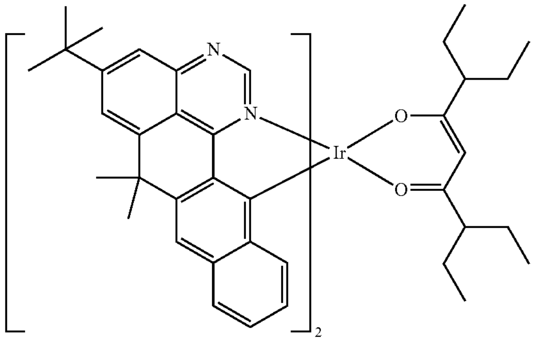
-continued
21
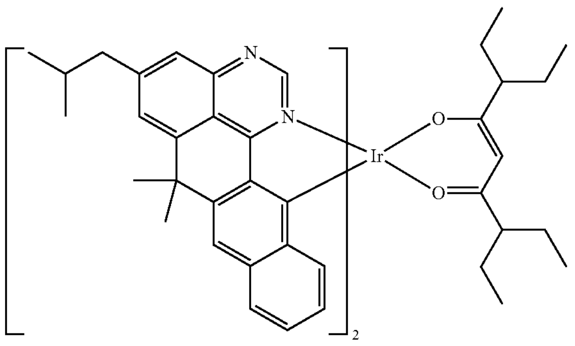
22
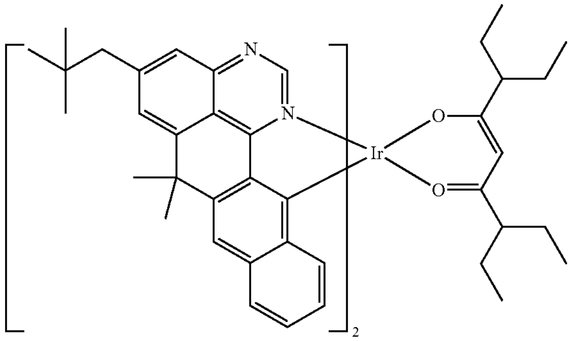
23
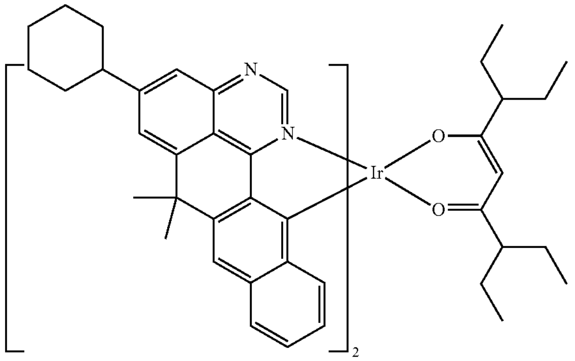
24
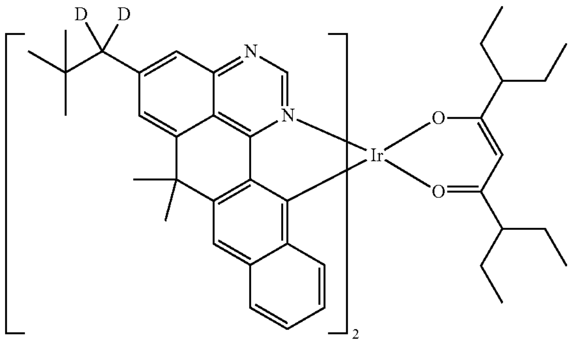

25
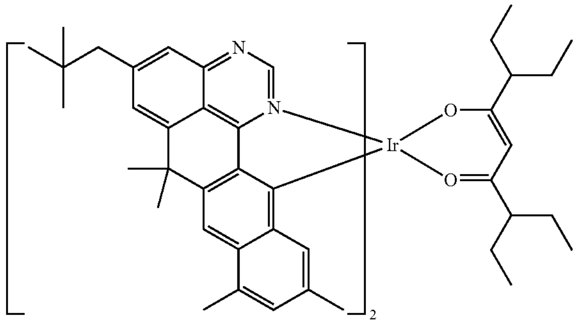
26
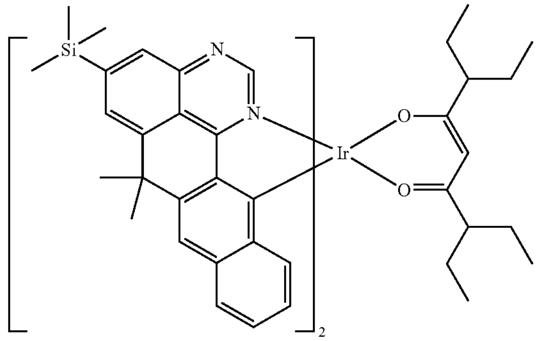
27
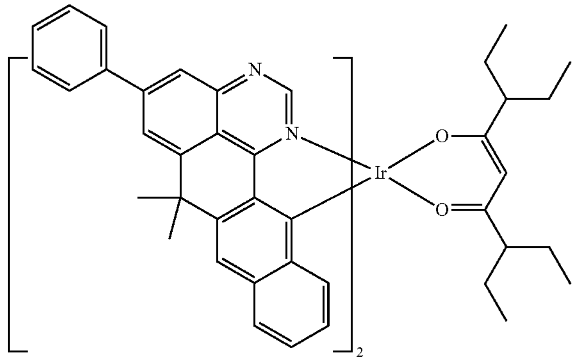
28
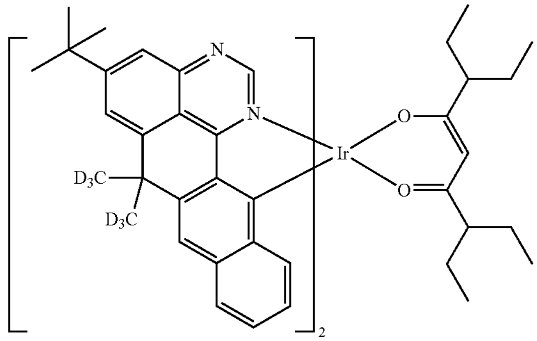
29
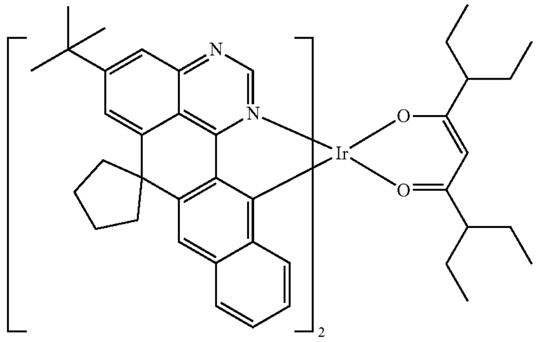
30
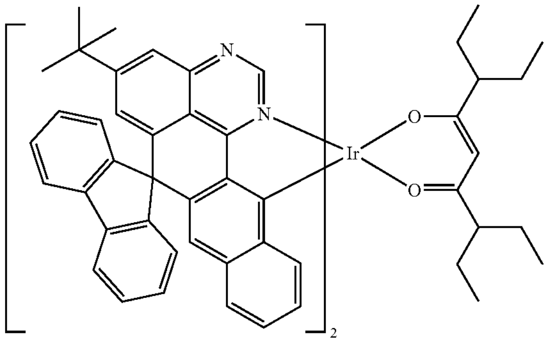
31
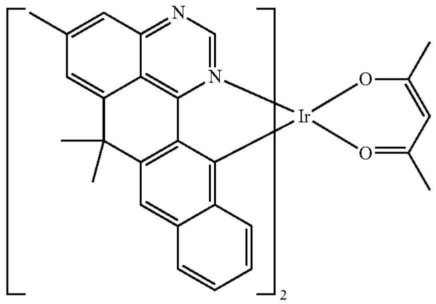
32
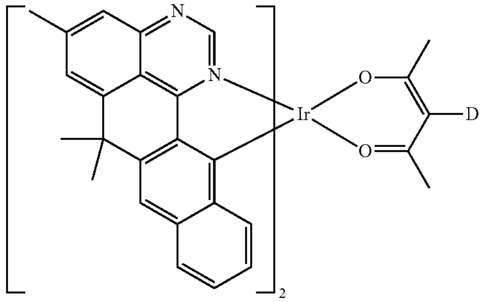

-continued
33
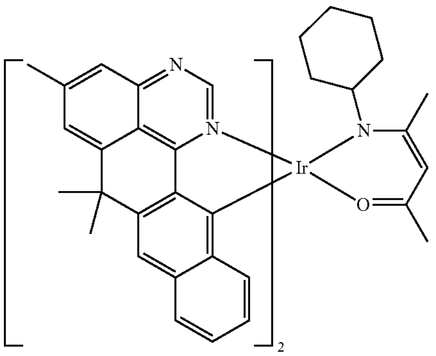
34
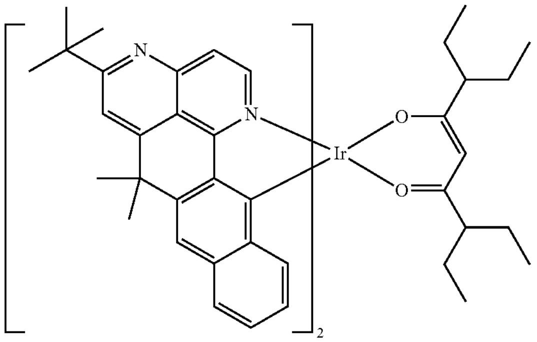
35
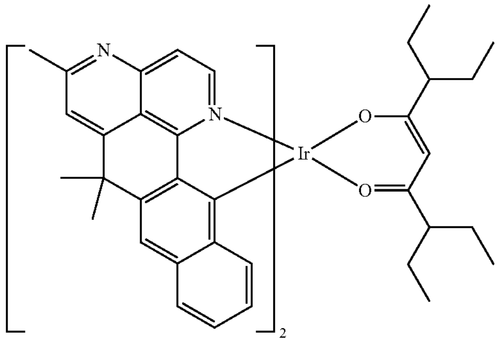
36
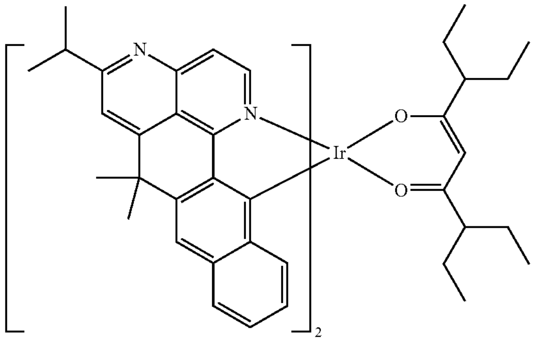
-continued
37
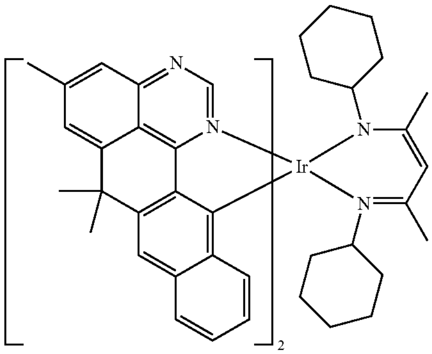
38
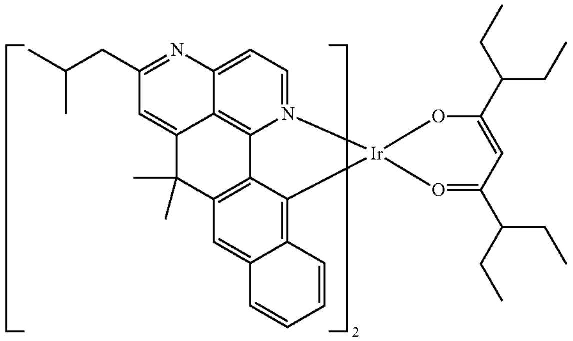
39
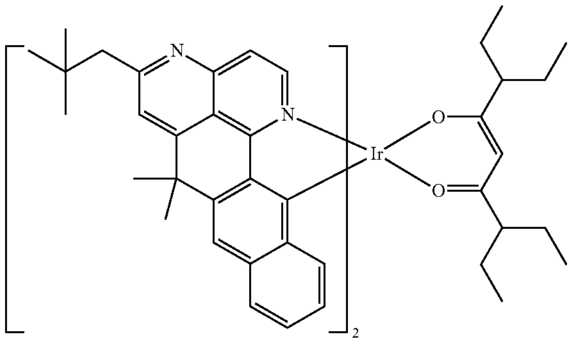
40
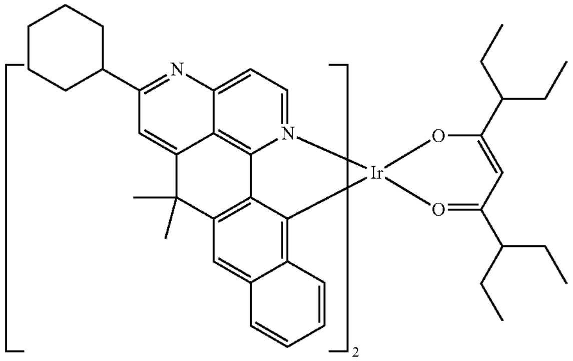

-continued
41
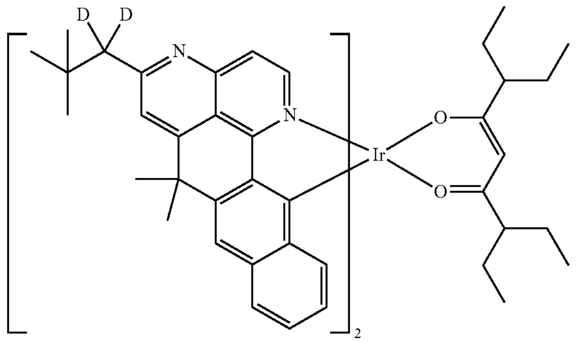
42
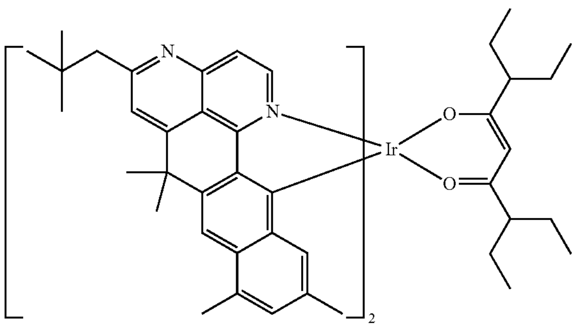
43
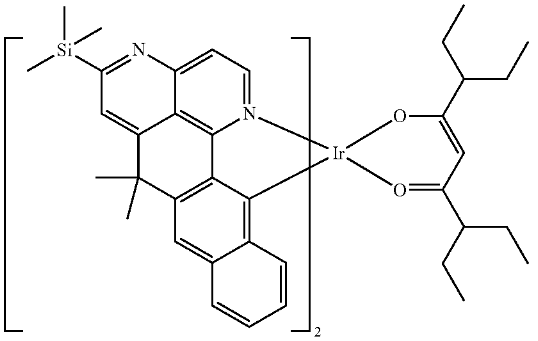
44
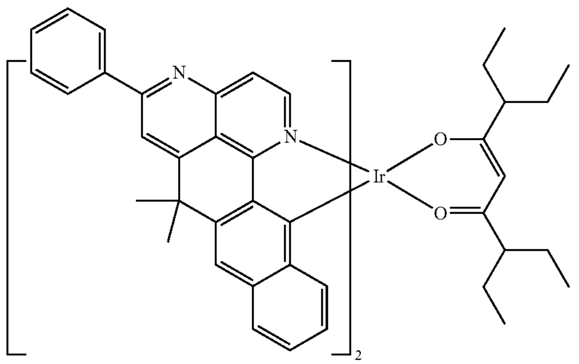
-continued
45
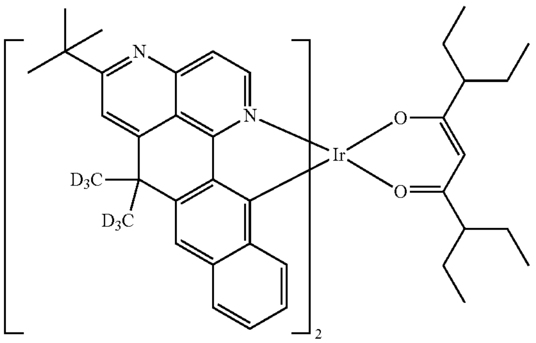
46
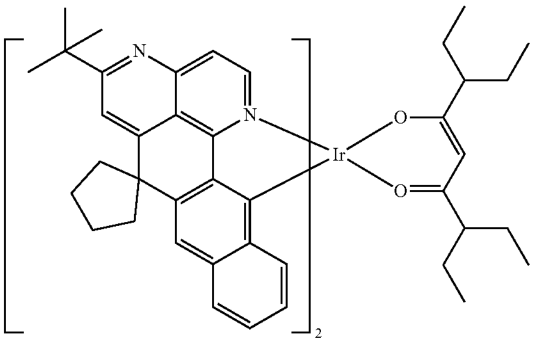
47
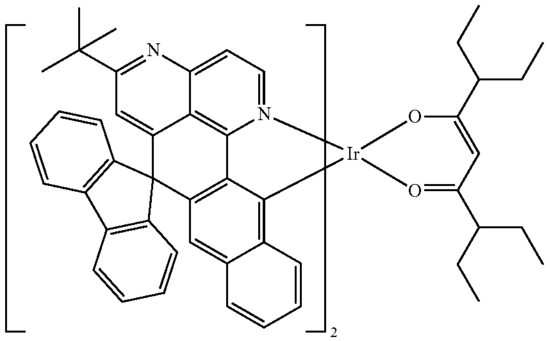
48
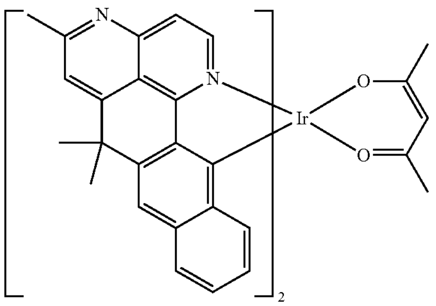

-continued
49
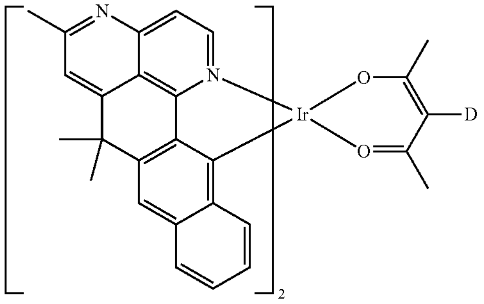
50
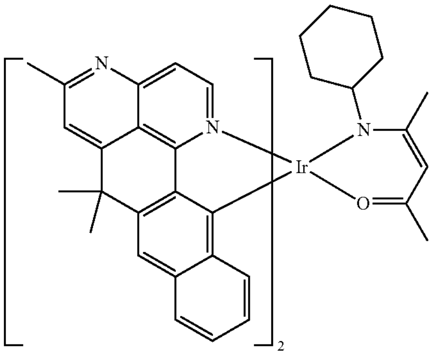
51
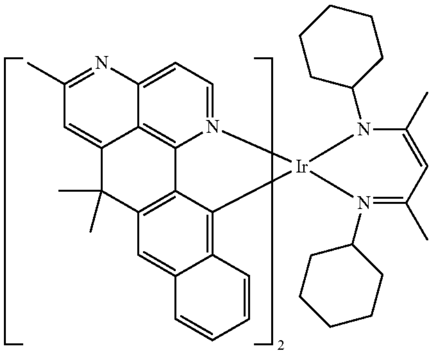
52
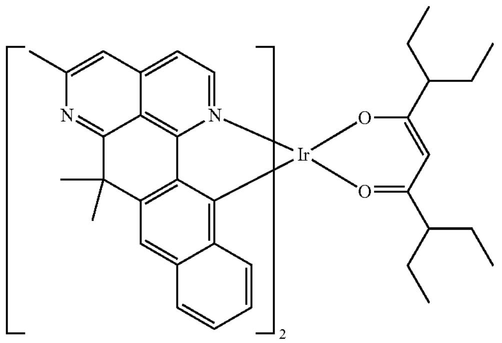
-continued
53
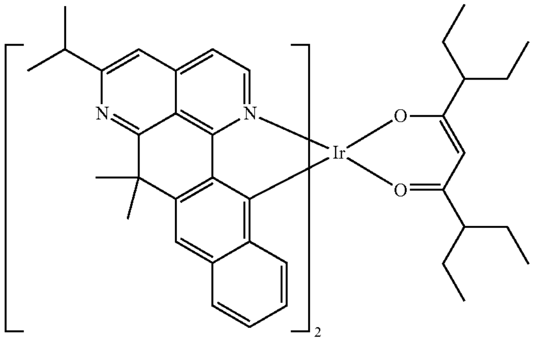
54
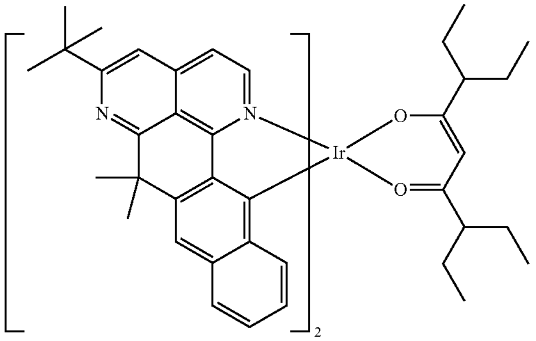
55
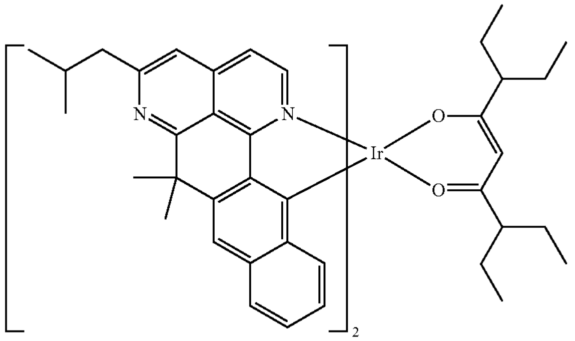
56
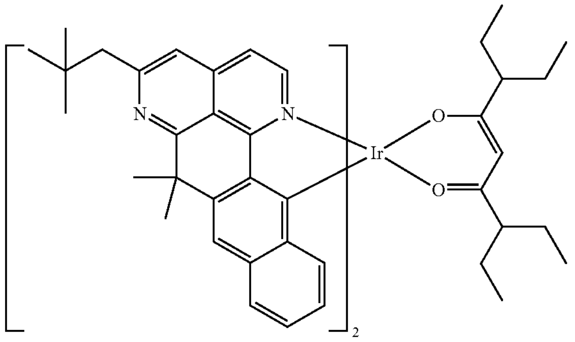

-continued
57
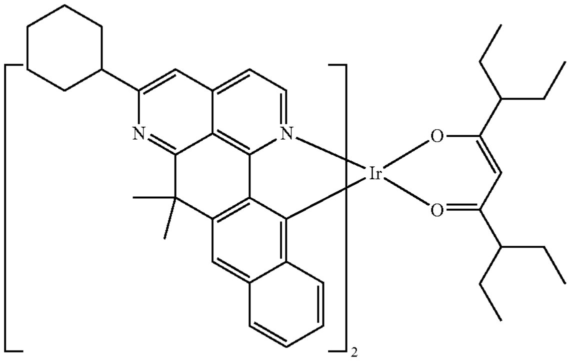
58
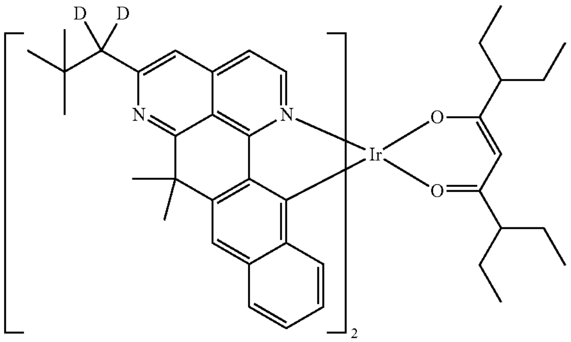
59
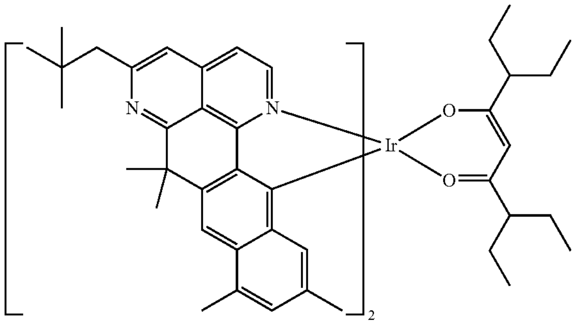
60
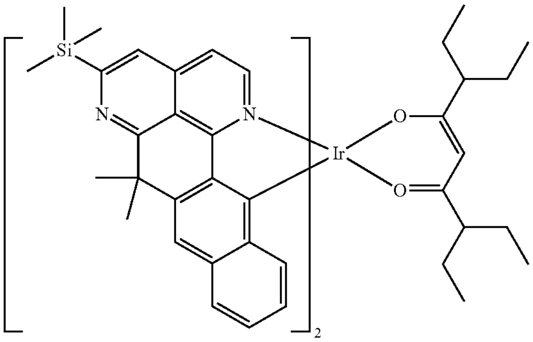
-continued
61
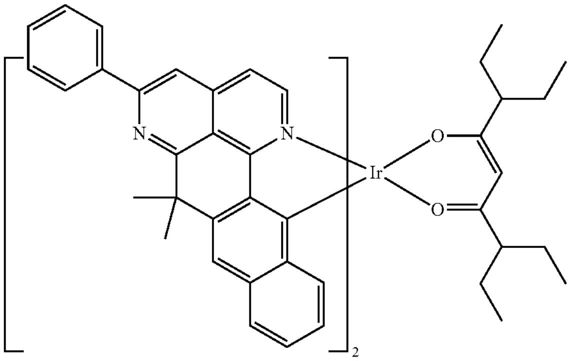
62
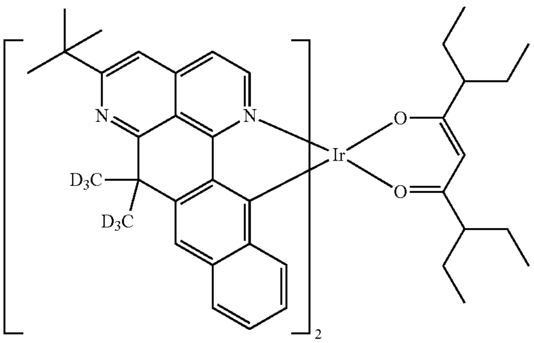
63
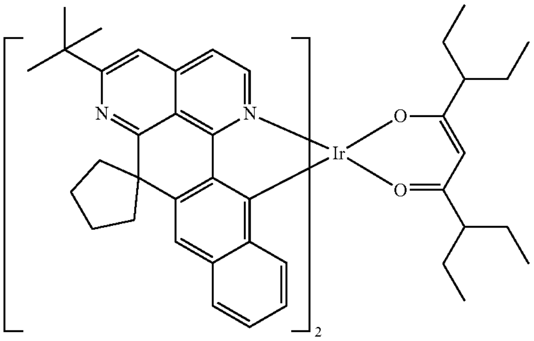
64
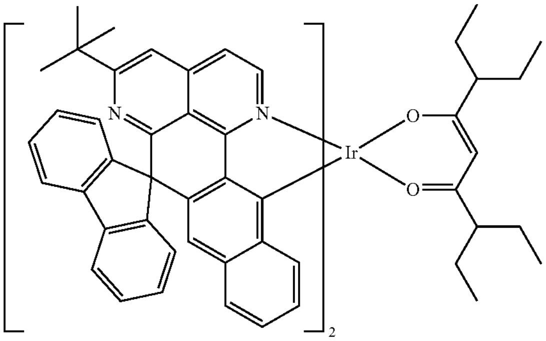

65
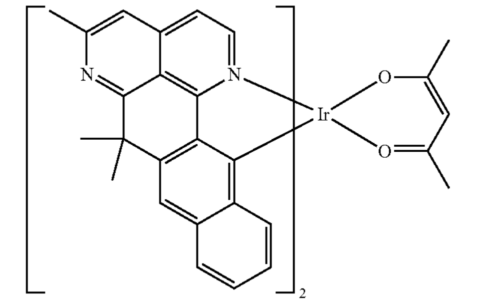
66
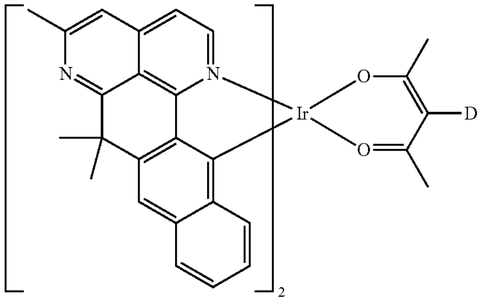
67
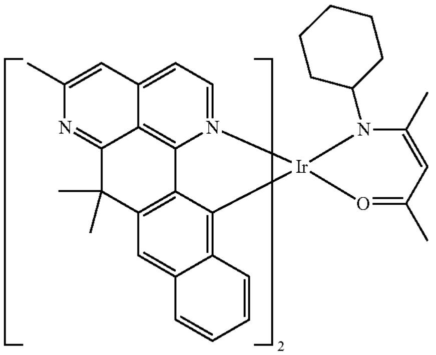
68
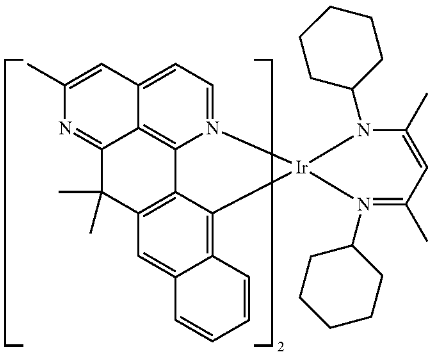
-continued
69
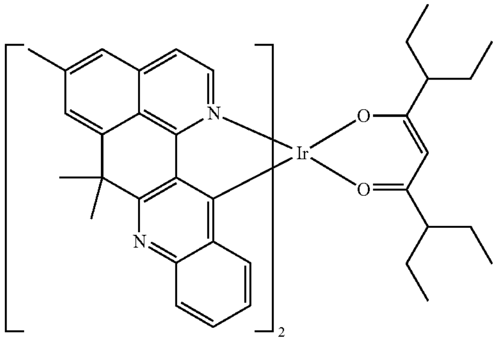
70
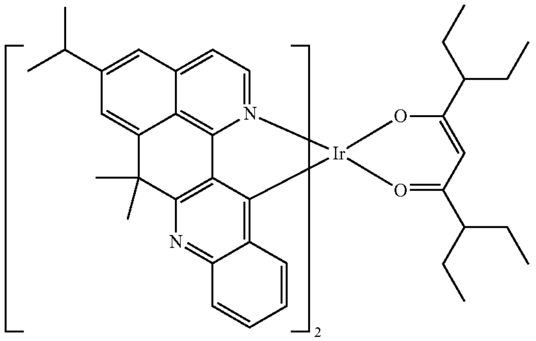
71
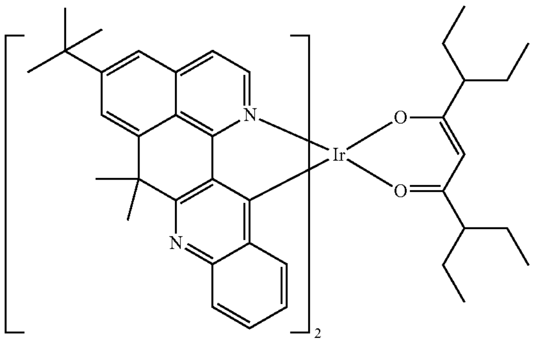
72
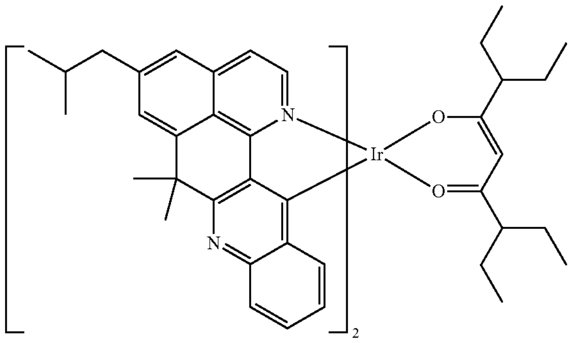

-continued
73
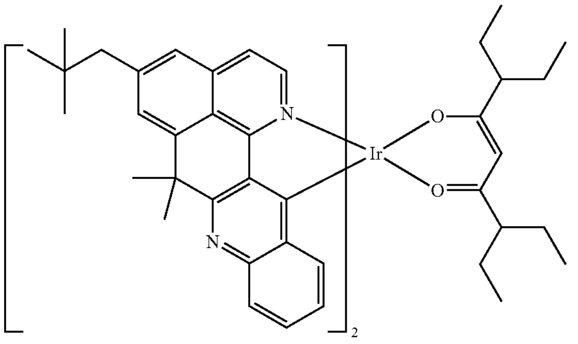
74
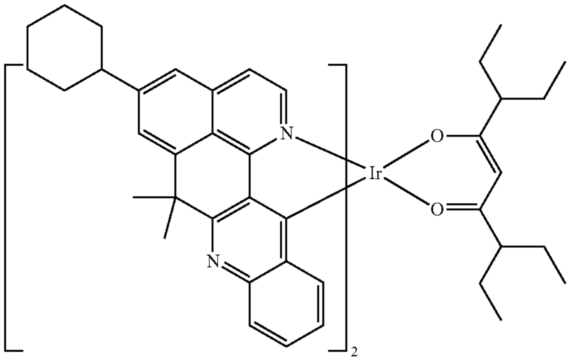
75
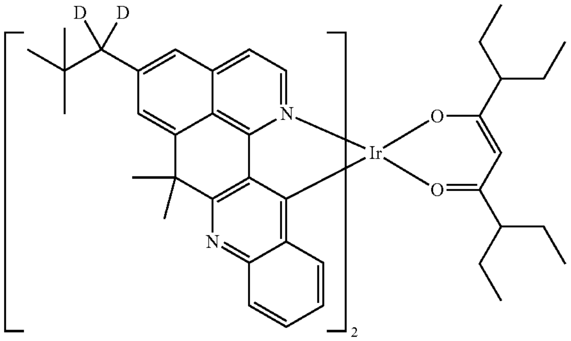
76
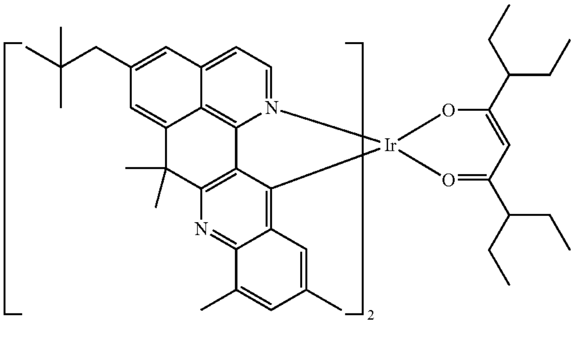
-continued
77
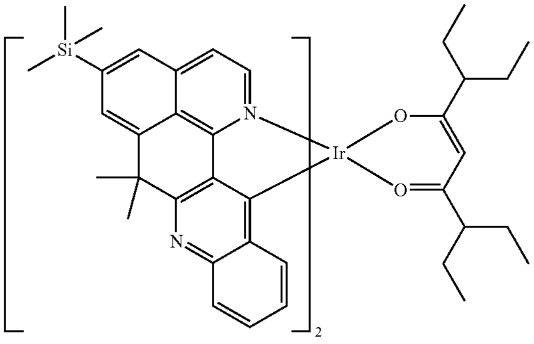
78
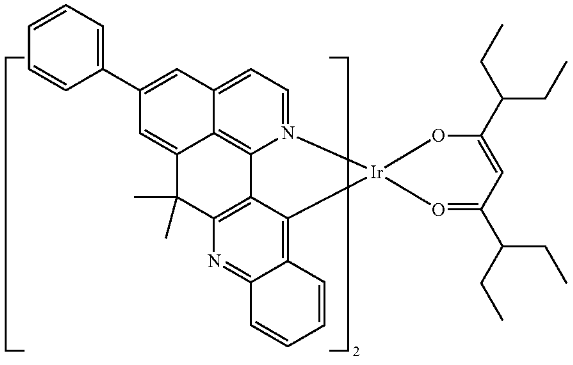
79
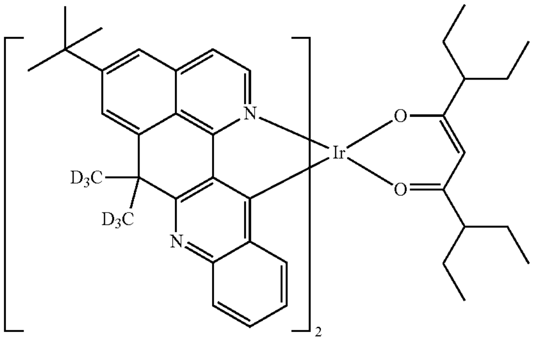
80
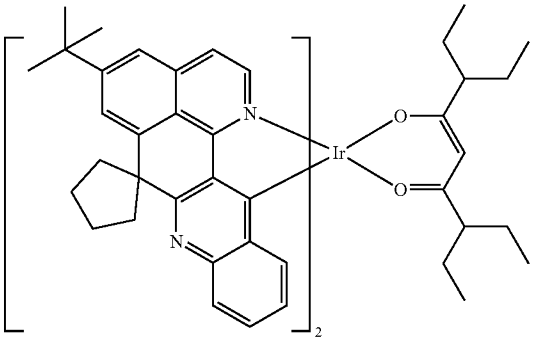

-continued
81
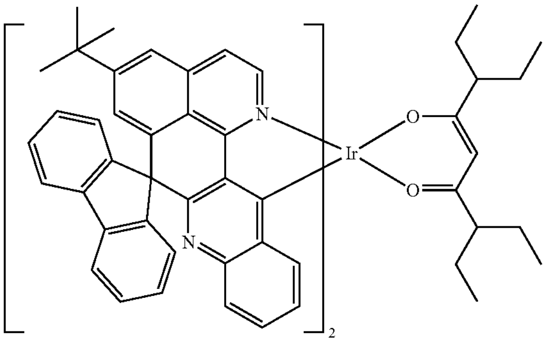
82
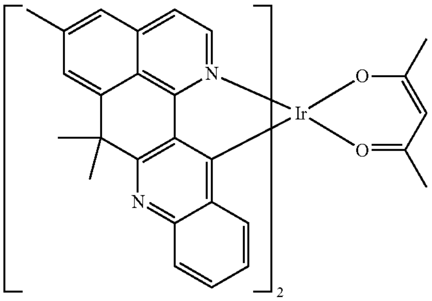
83
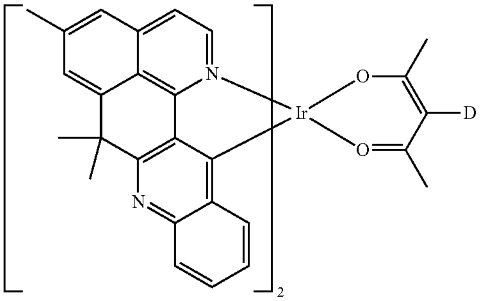
84
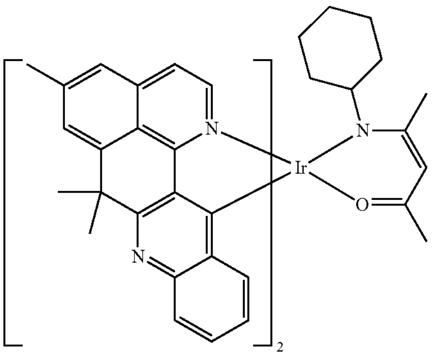
-continued
85
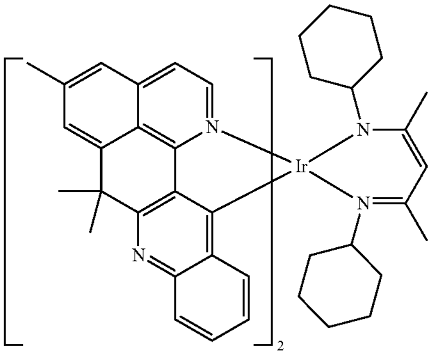
86
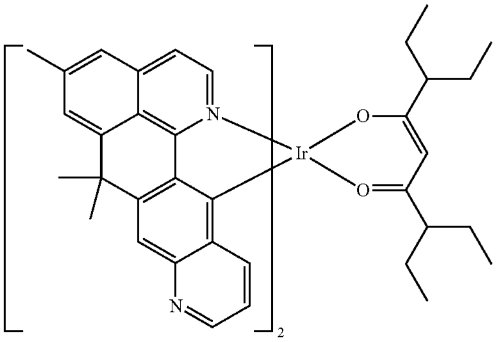
87
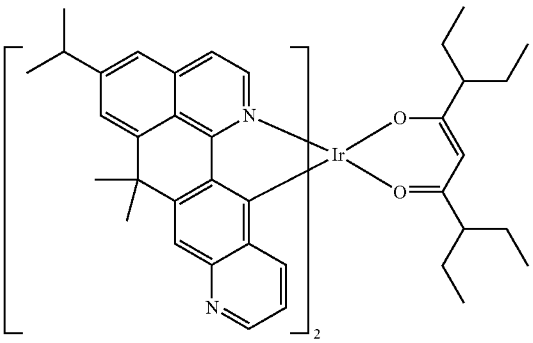
88
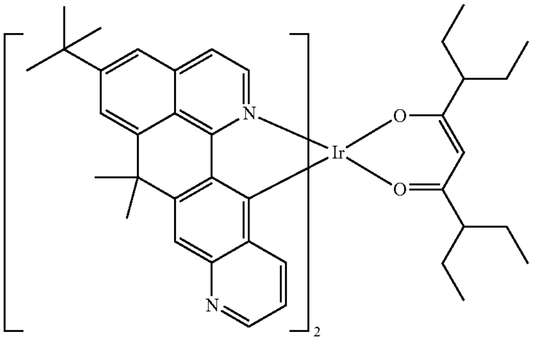

-continued
89
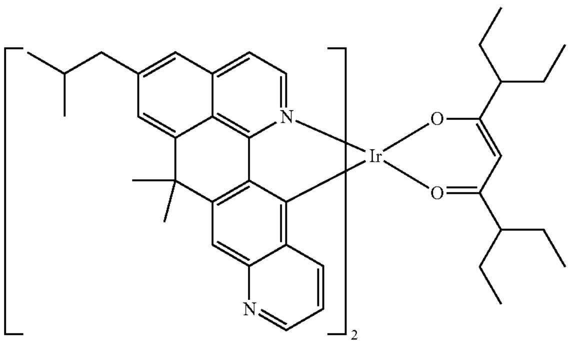
90
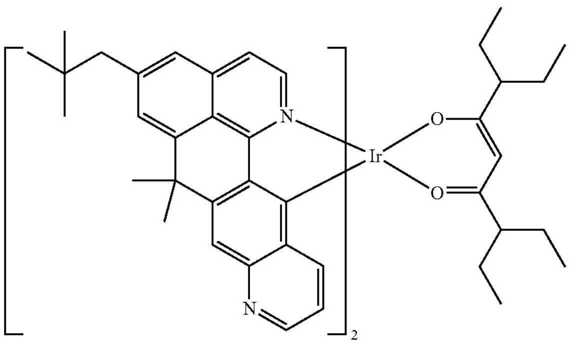
91
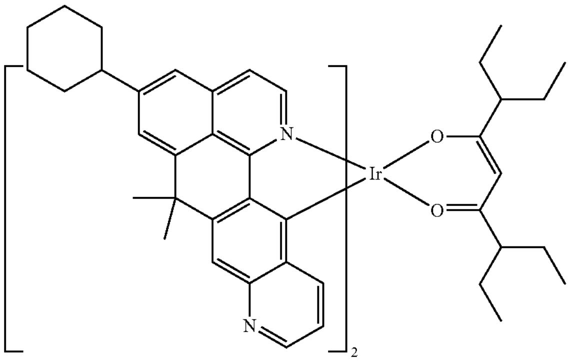
92
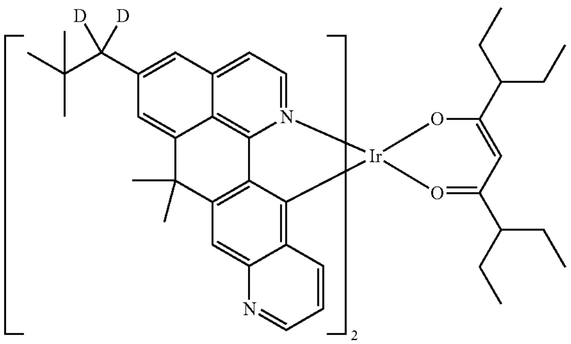
-continued
93
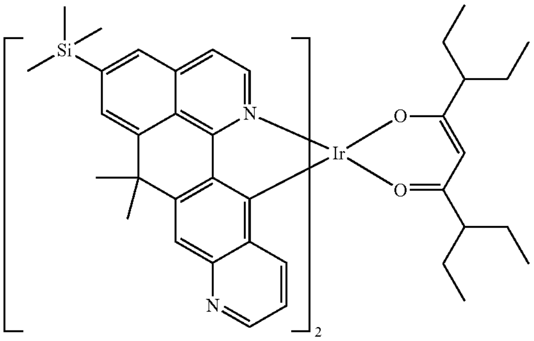
94
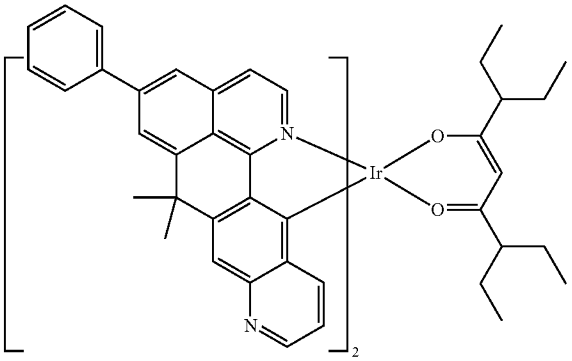
95
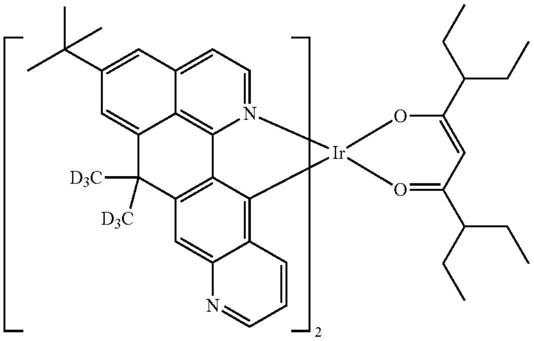
96
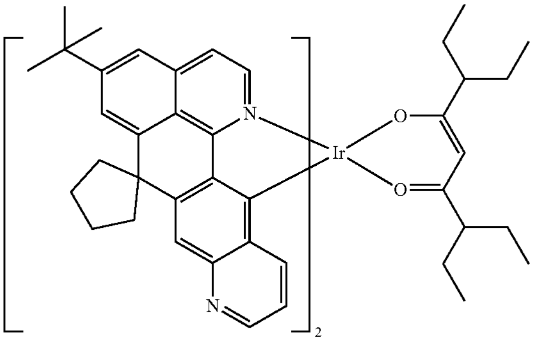

-continued
97
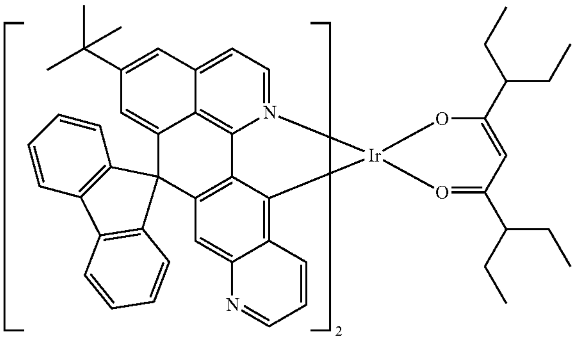
98
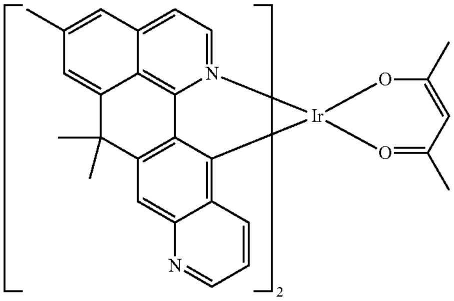
99
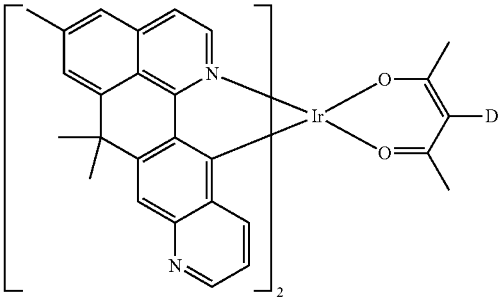
100
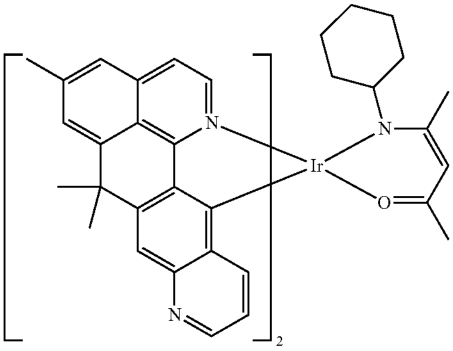
101
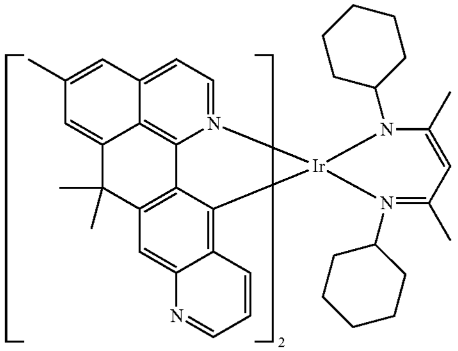
102
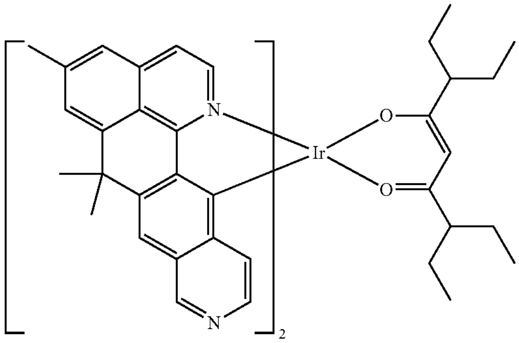
103
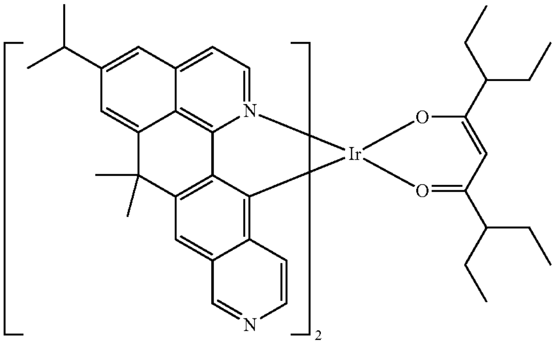
104
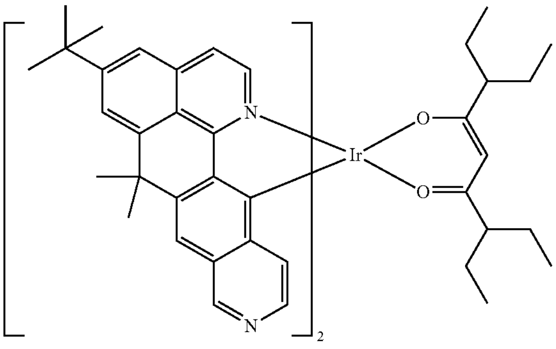

-continued
105
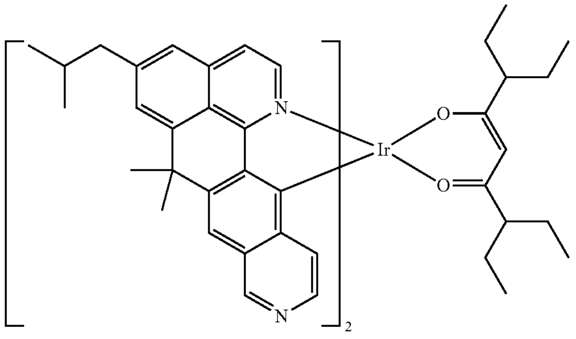
106
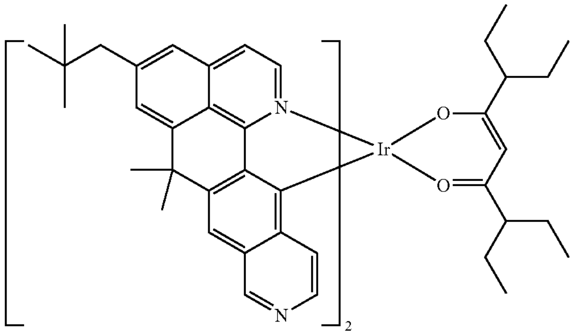
107
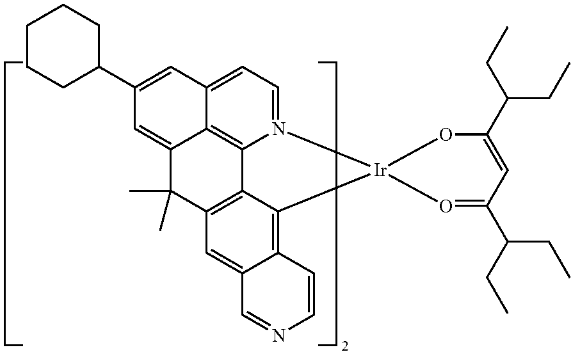
108
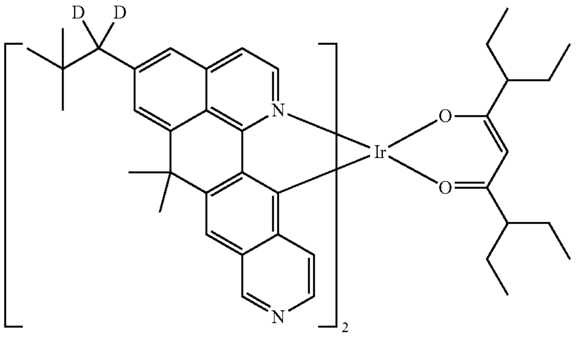
-continued
109
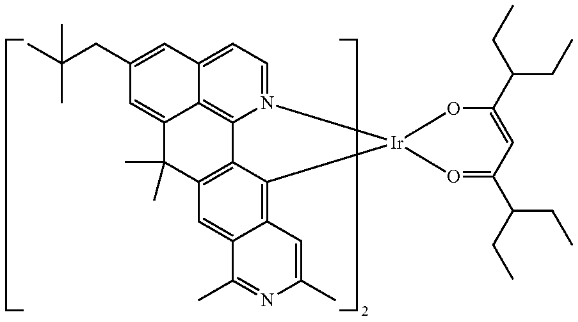
110
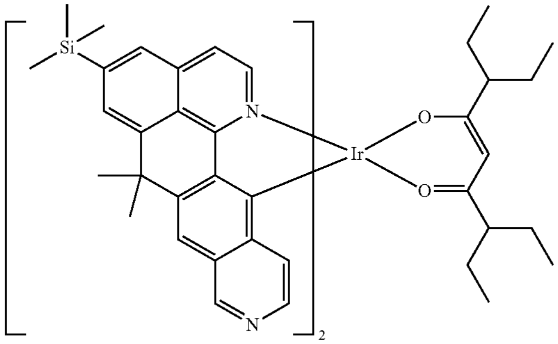
111
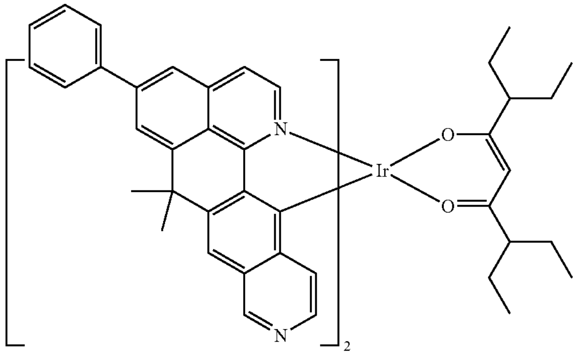
112
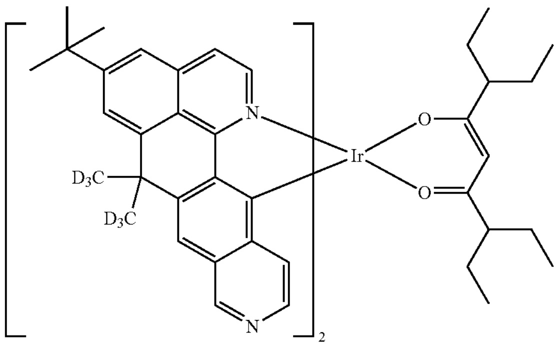

-continued
113
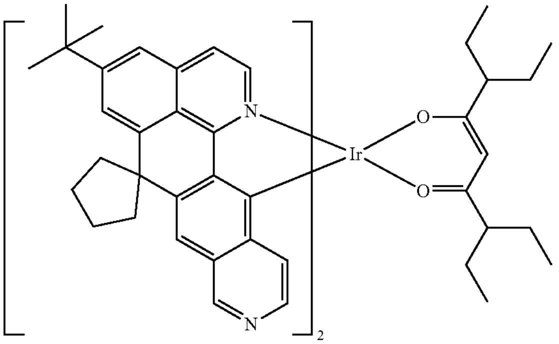
114
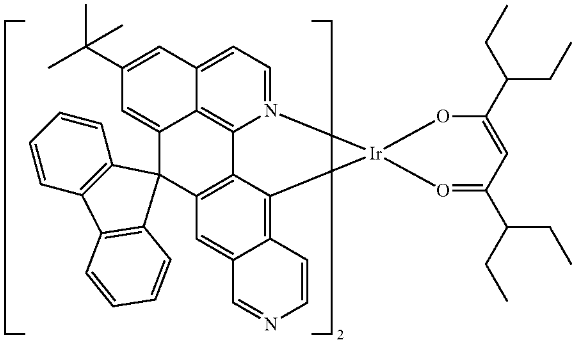
115
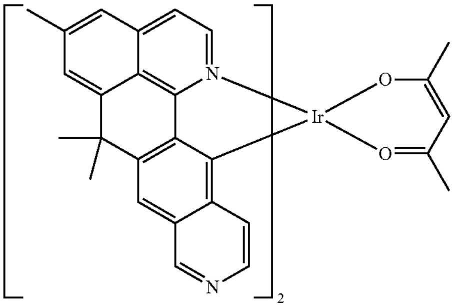
116
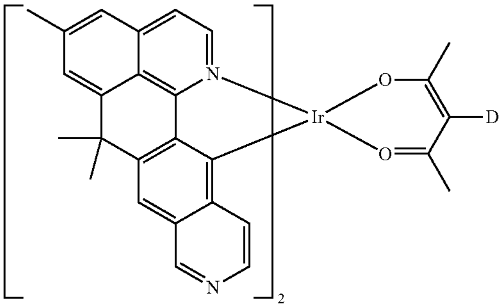
-continued
117
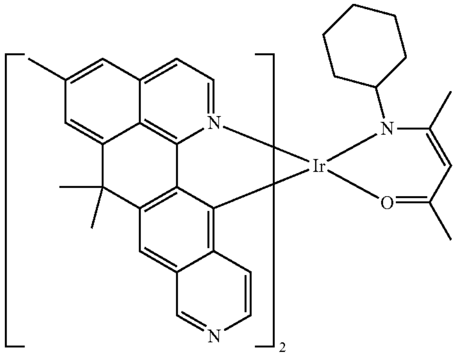
118
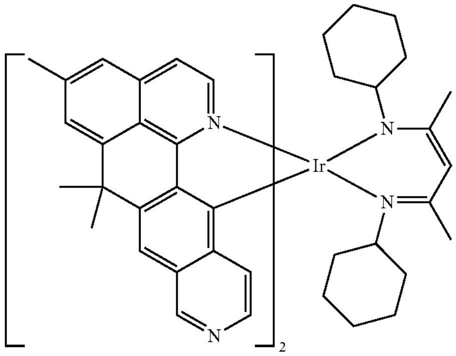
119
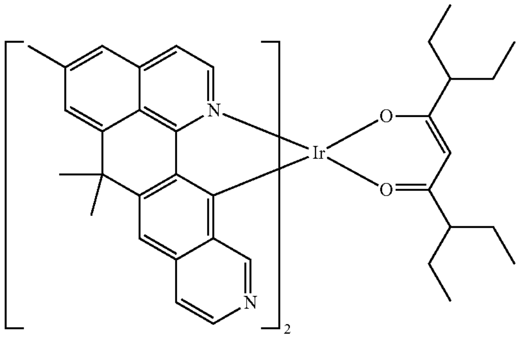
120
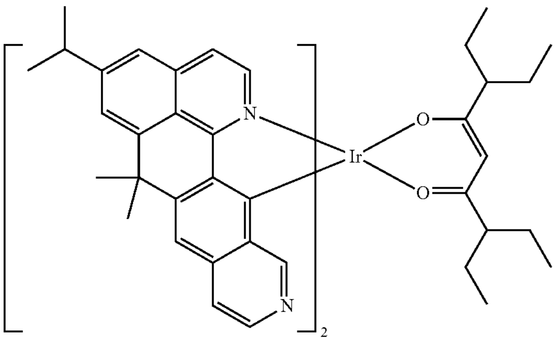

-continued
121
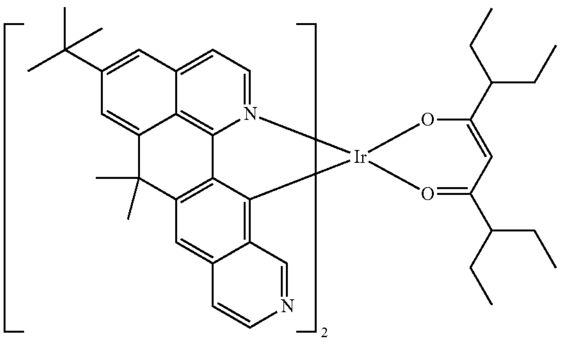
122
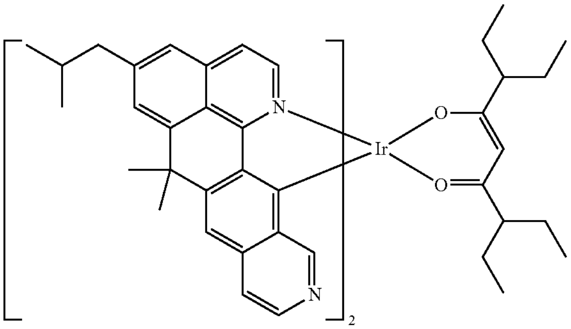
123
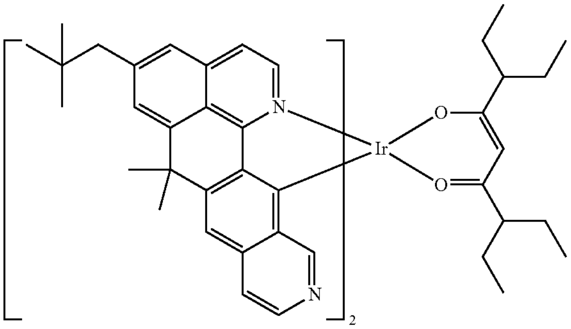
124
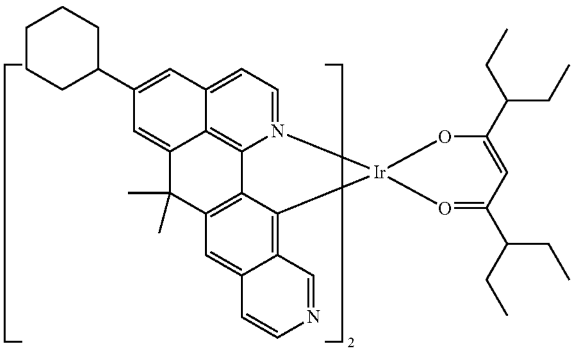
-continued
125
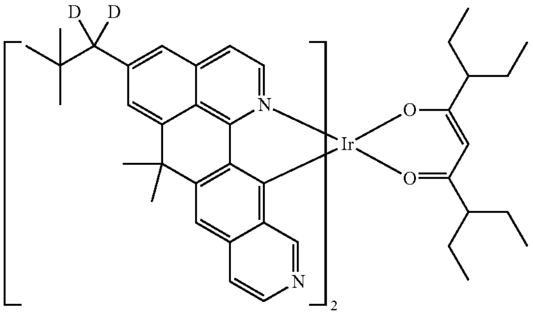
126
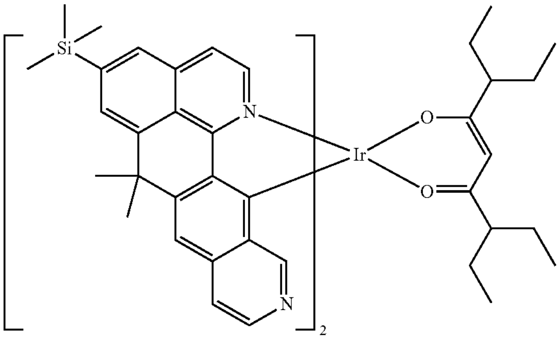
127
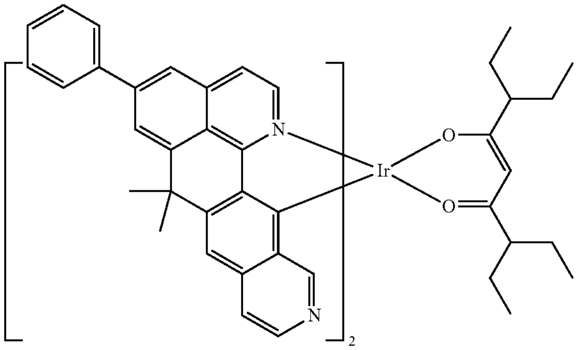
128
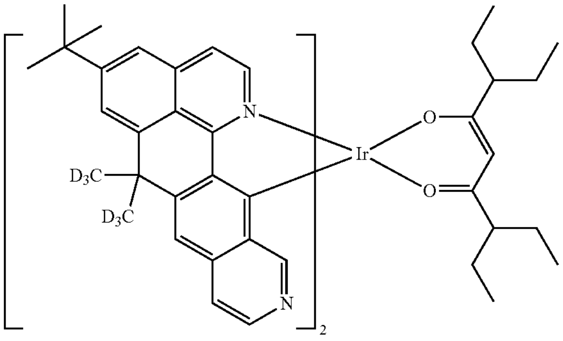

-continued
129
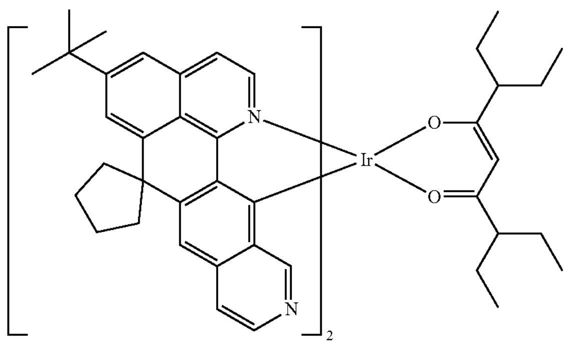
130
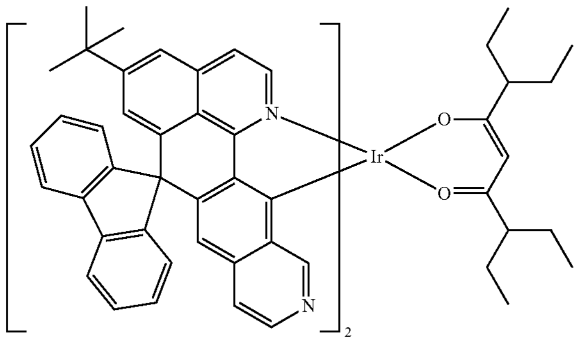
131
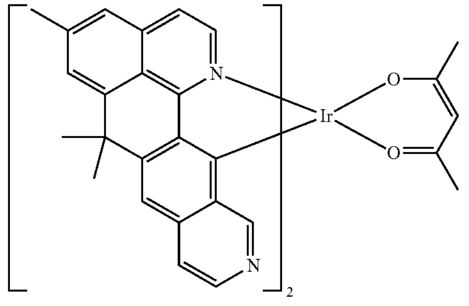
132
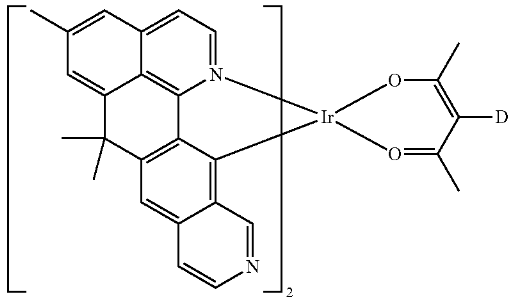
-continued
133
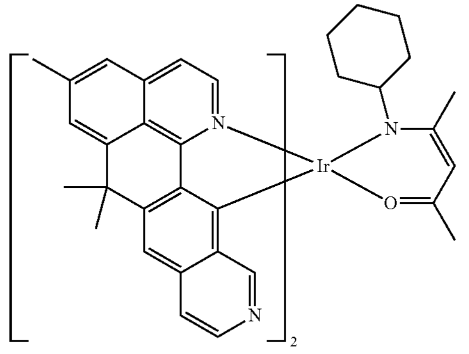
134
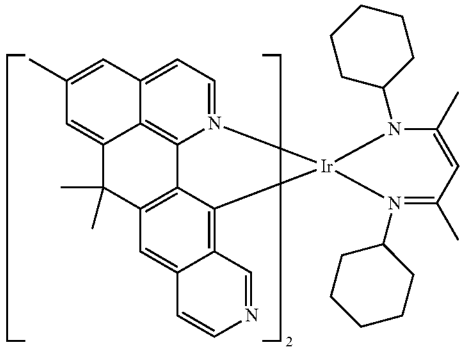
135
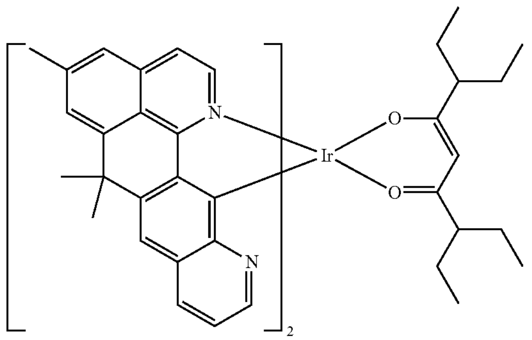
136
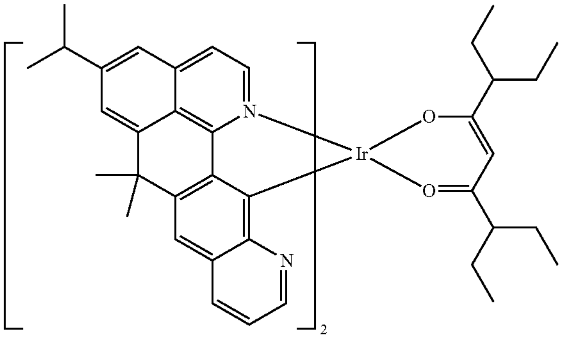

-continued
137
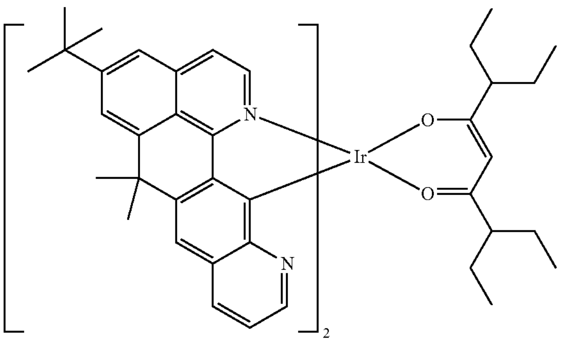
138
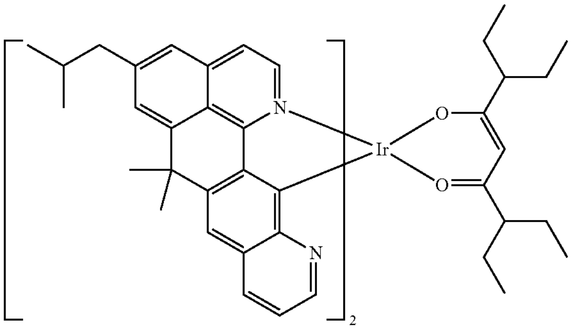
139
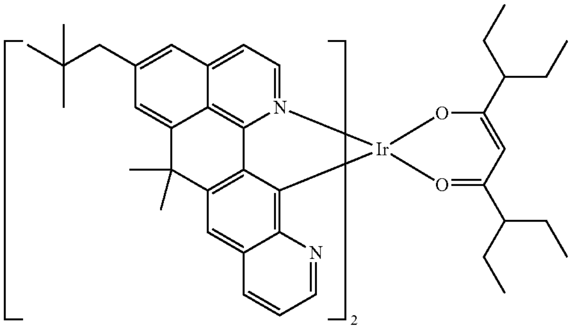
140
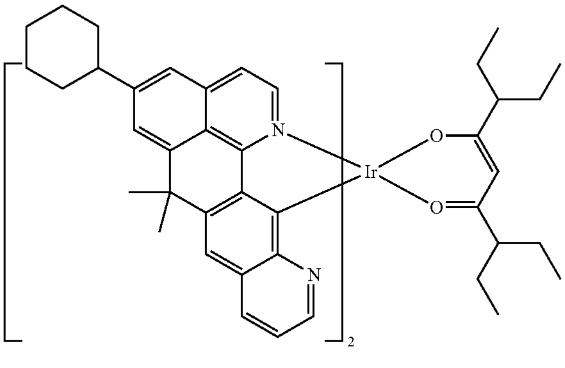
-continued
141
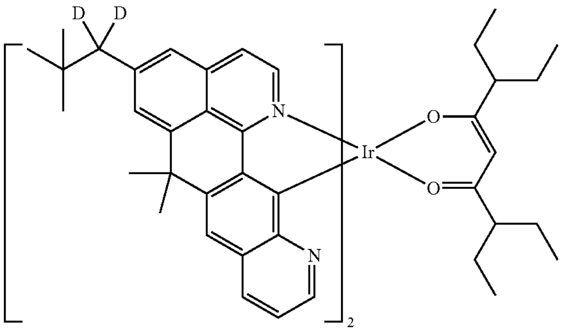
142
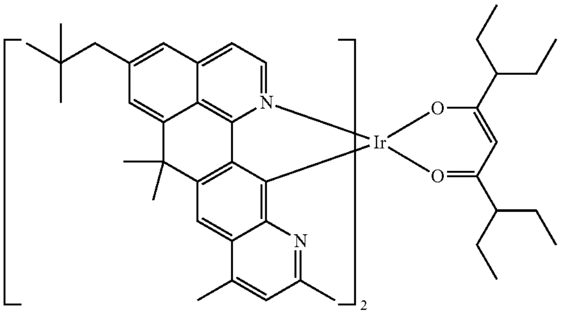
143
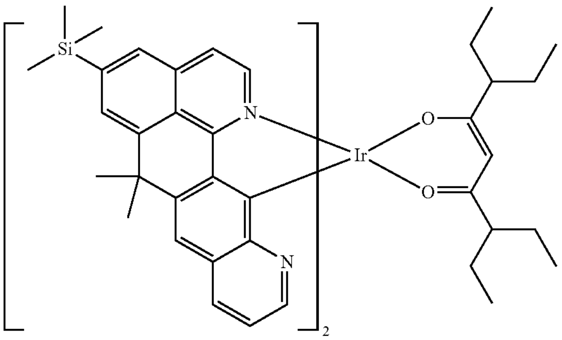
144
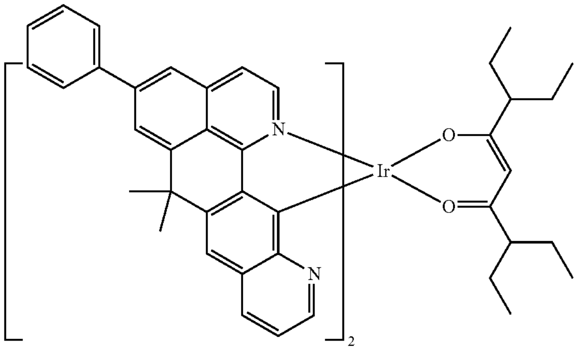

-continued
145
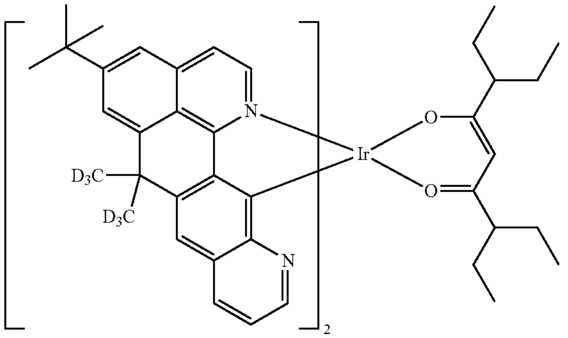
146
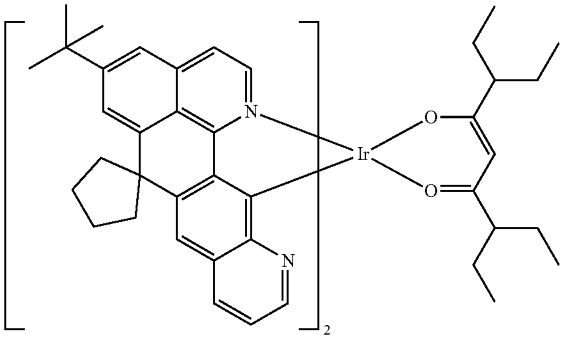
147
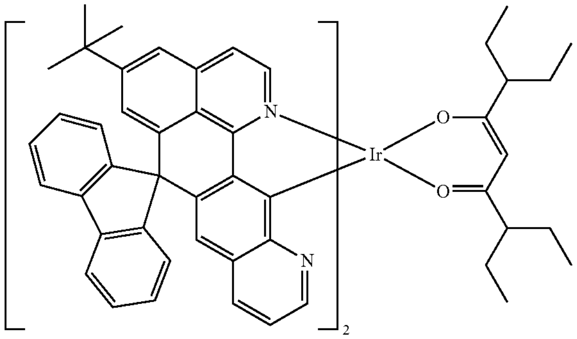
148
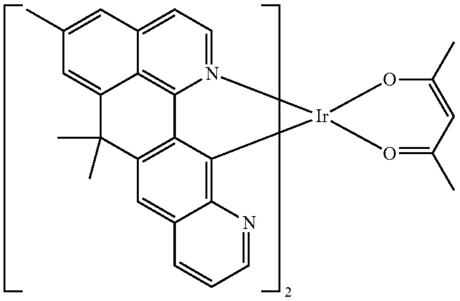
-continued
149
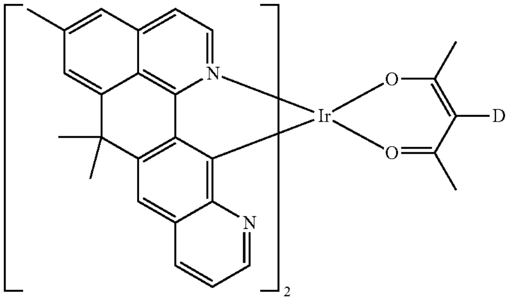
150
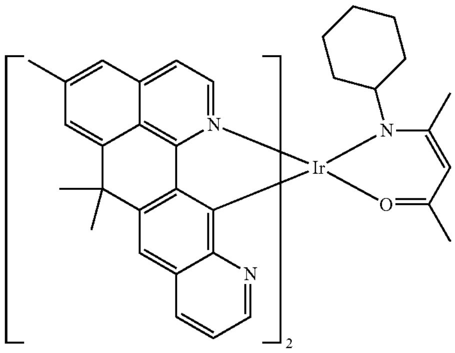
151
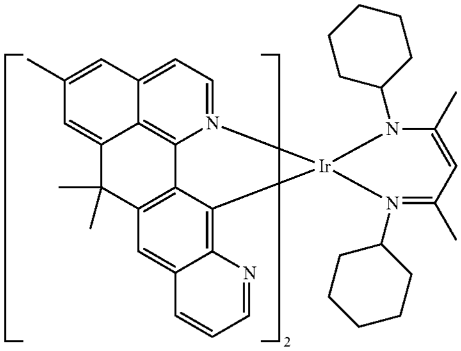
152
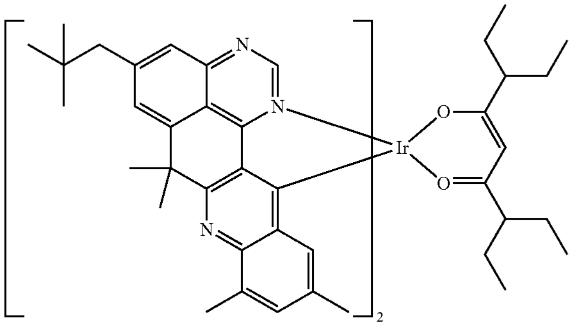

153
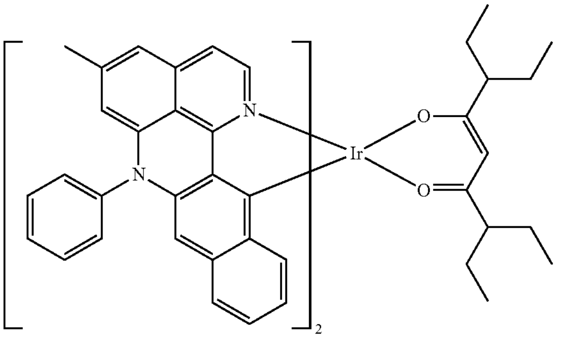
154
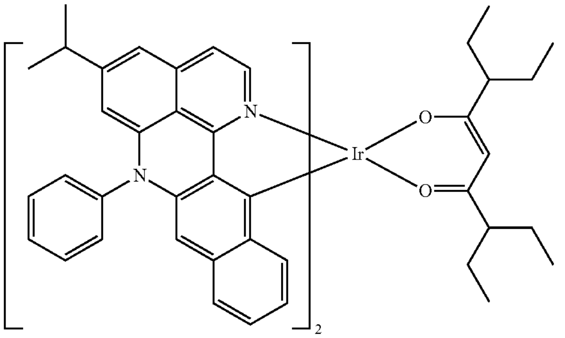
155
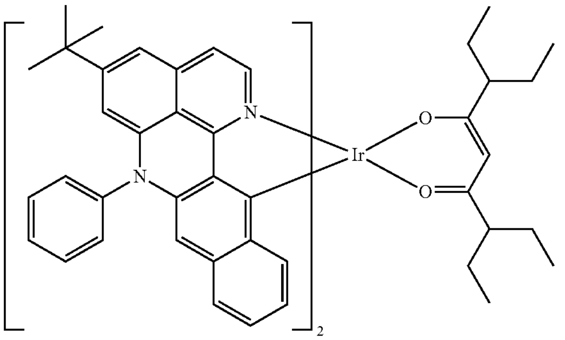
156
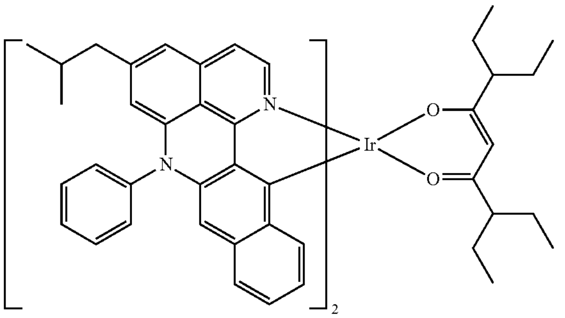
157
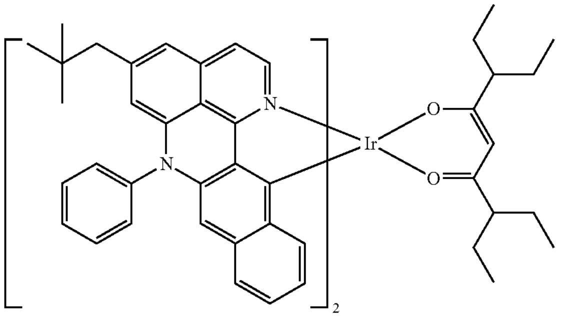
158
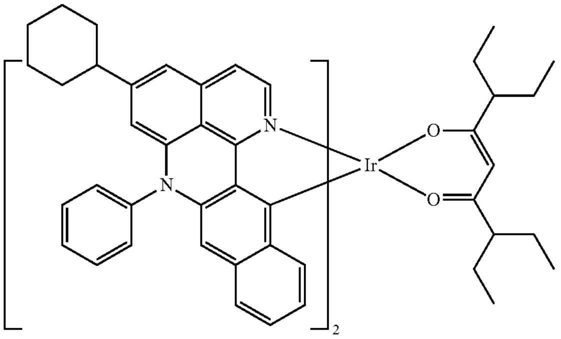
159
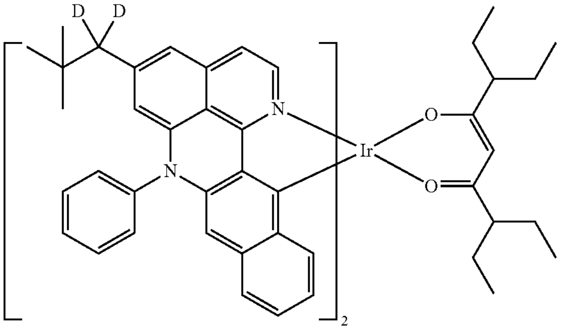
160
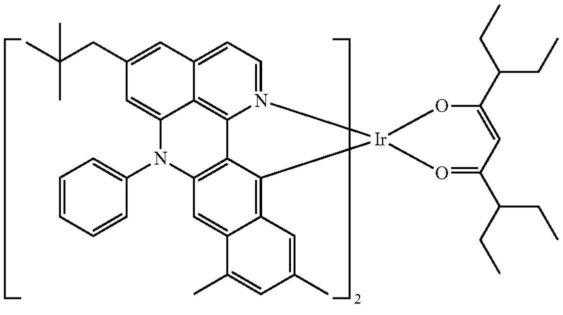

161
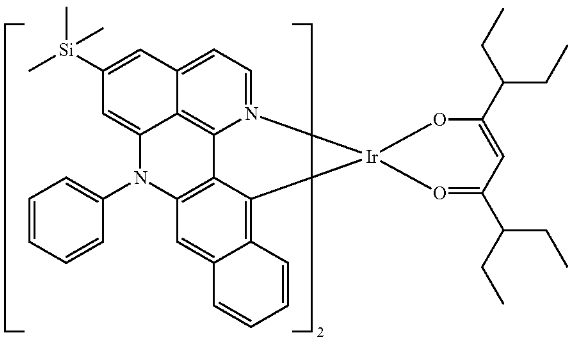
162
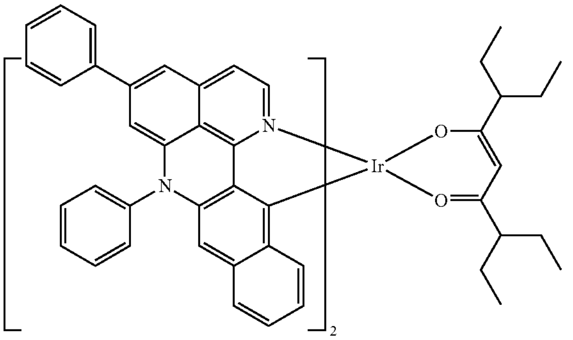
163
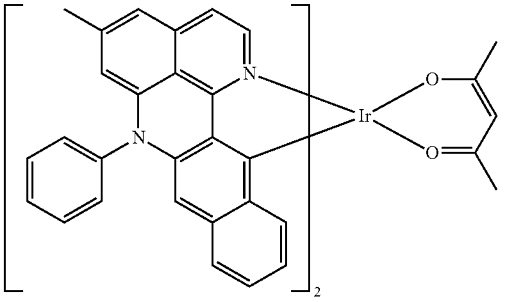
164
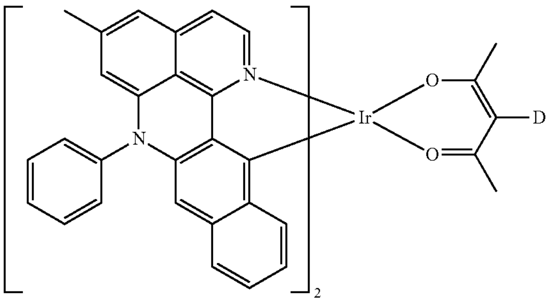
165
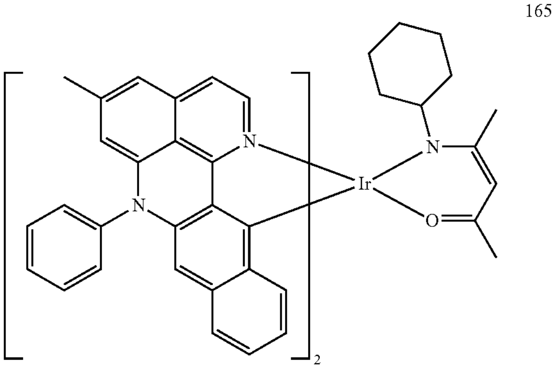
166
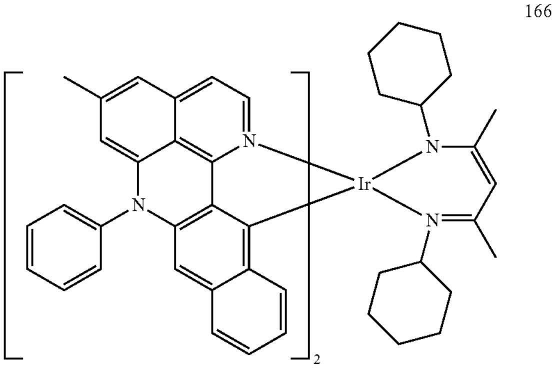
167
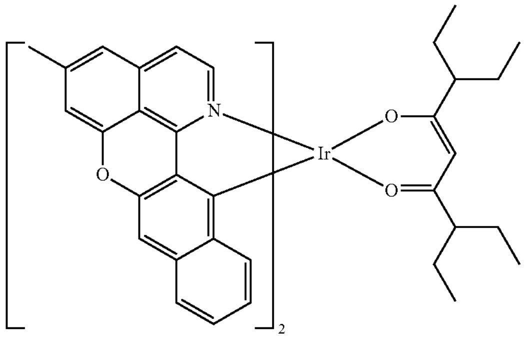
168
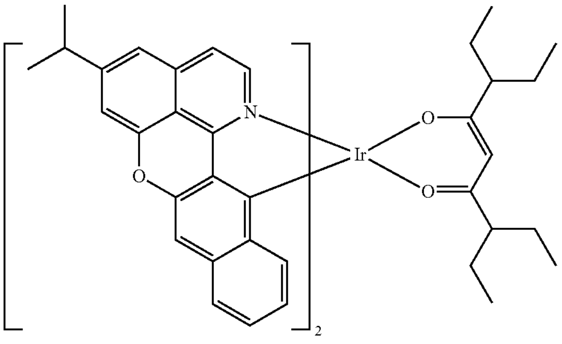

-continued
169
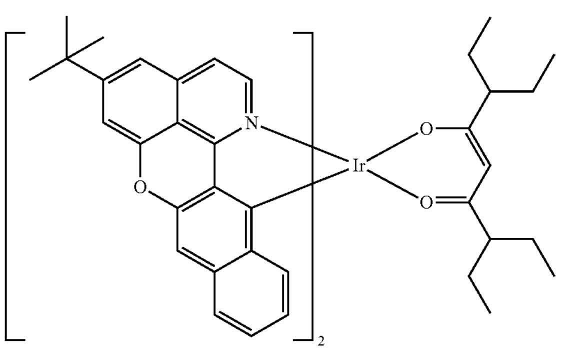
170
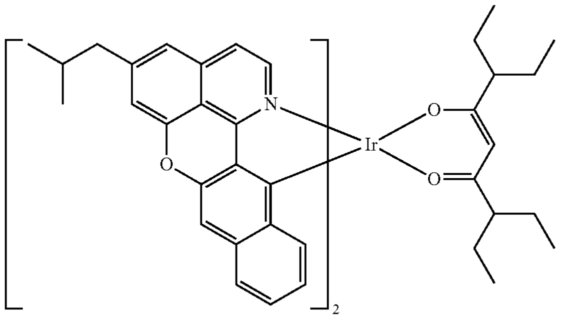
171
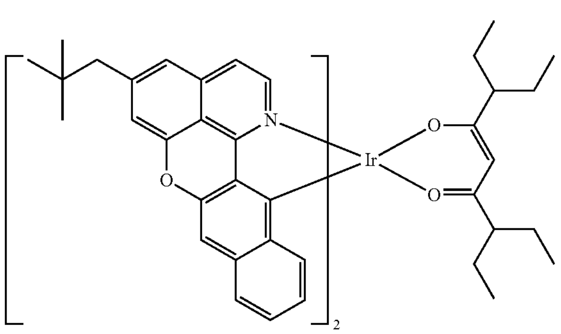
172
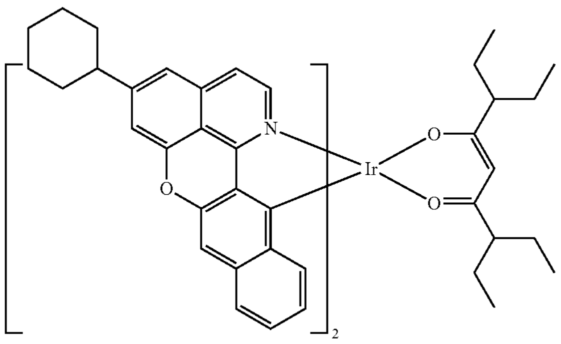
-continued
173
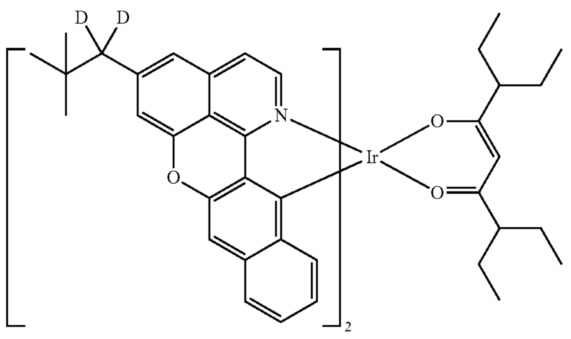
174
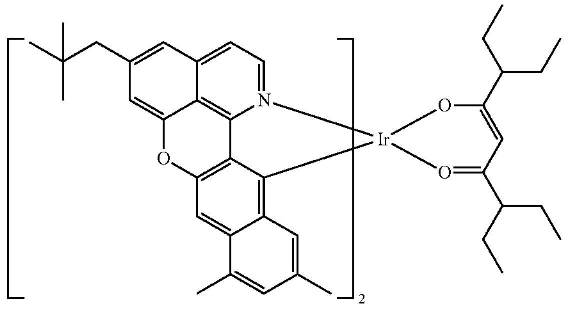
175
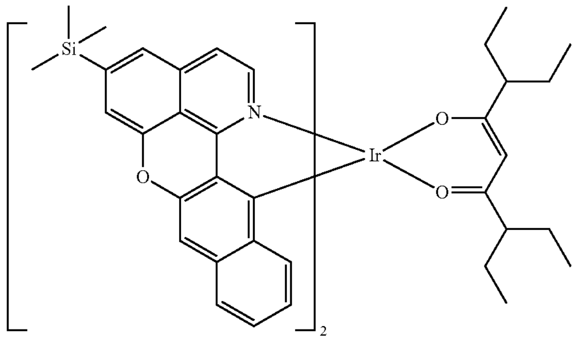
176
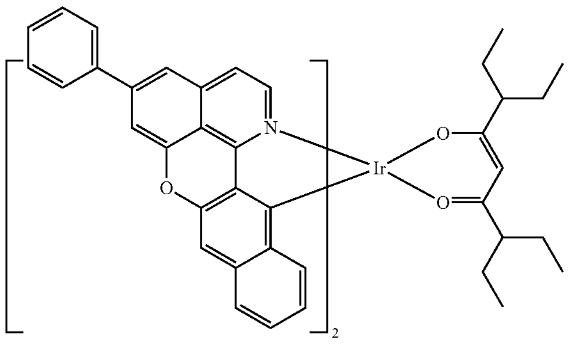

-continued
177
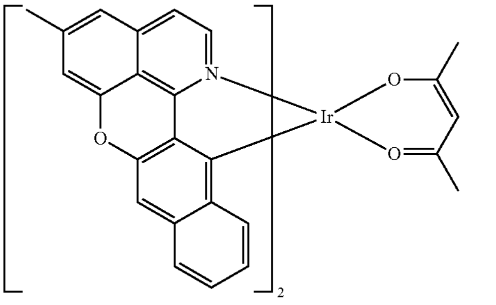
178
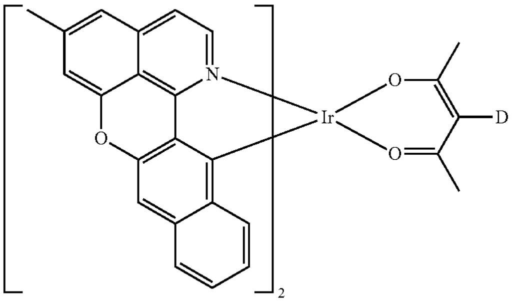
179
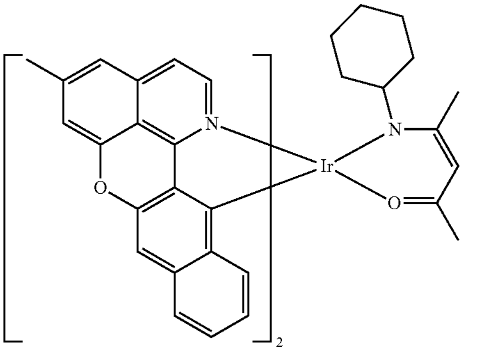
180
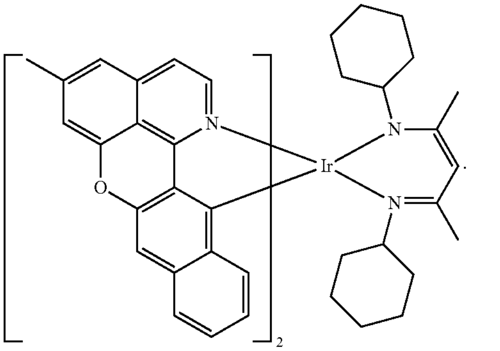
181
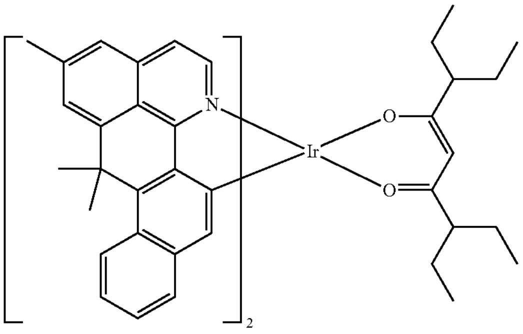
182
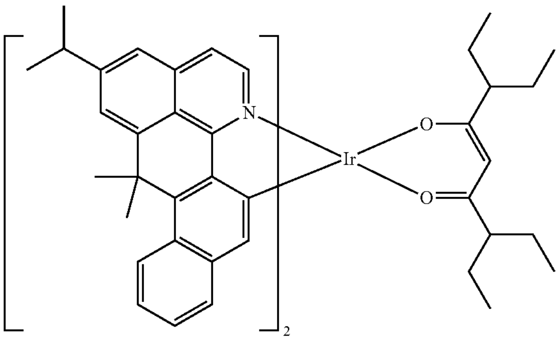
183
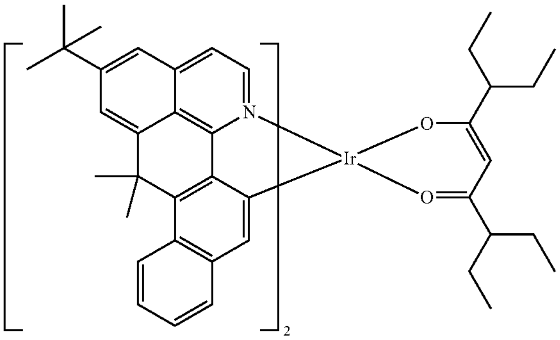
184
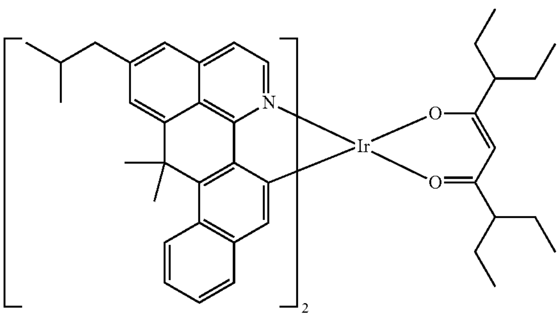
8. The organic metal compound of claim 1, wherein the organic metal compound is selected from the following compounds:

-continued
185
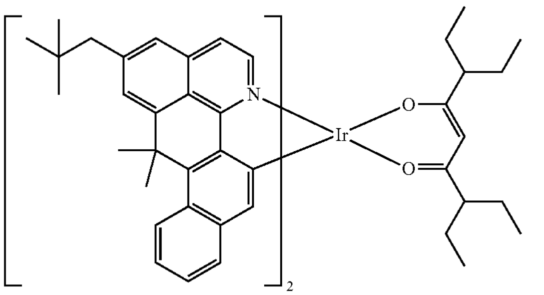
186
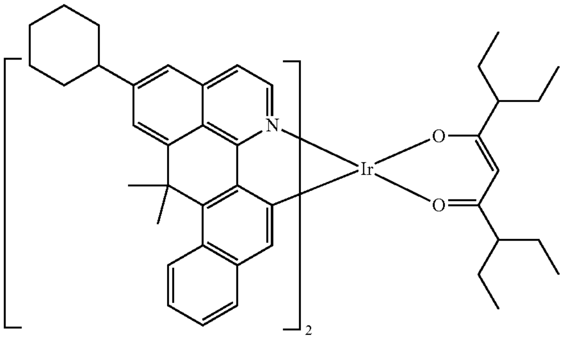
187
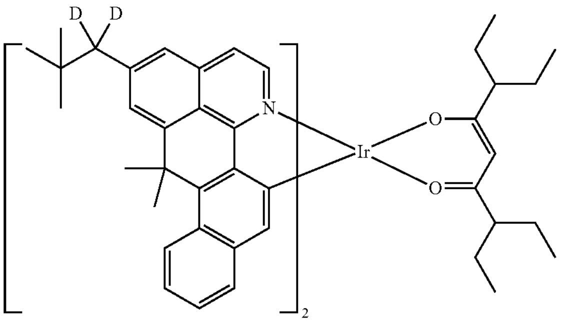
188
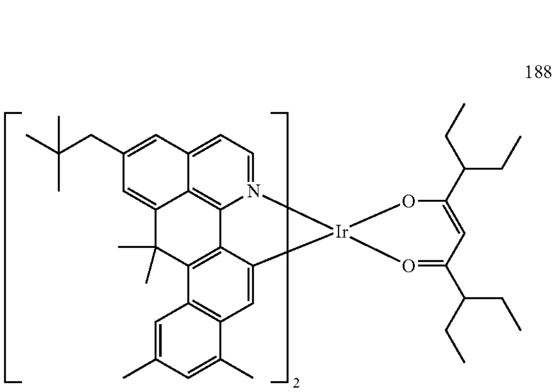
-continued
189
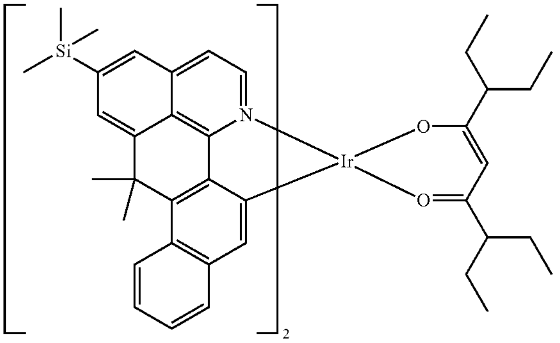
190
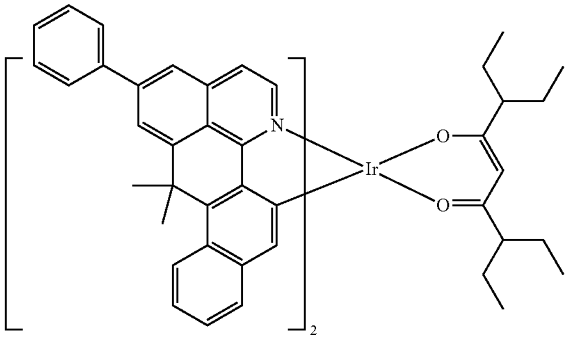
191
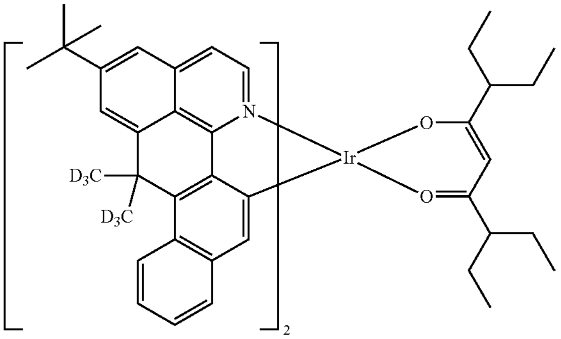
192
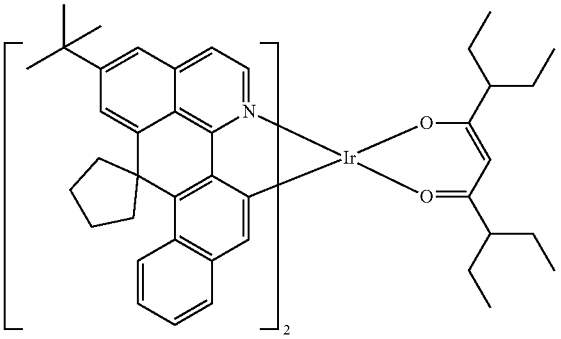

-continued
193
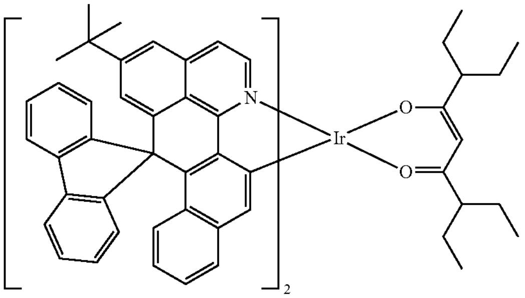
194
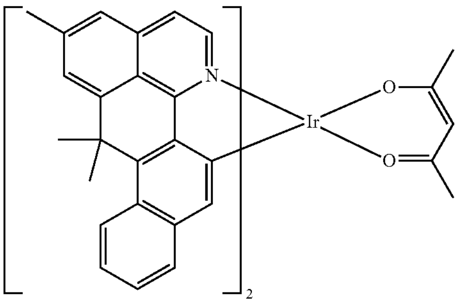
195
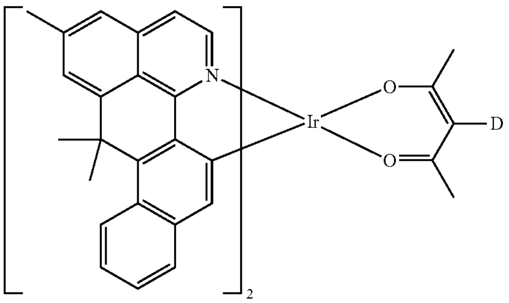
196
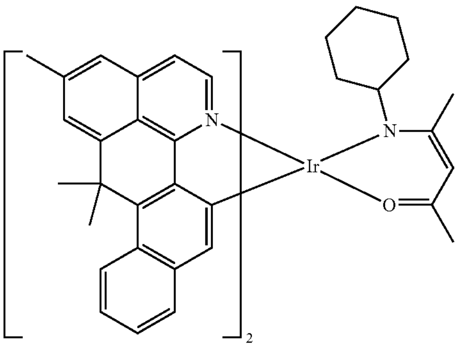
197
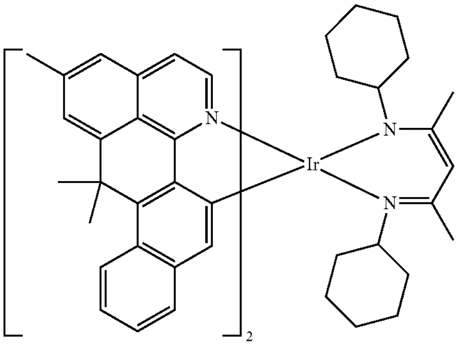
-continued
198
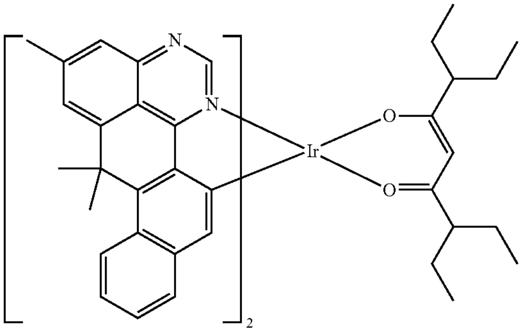
199
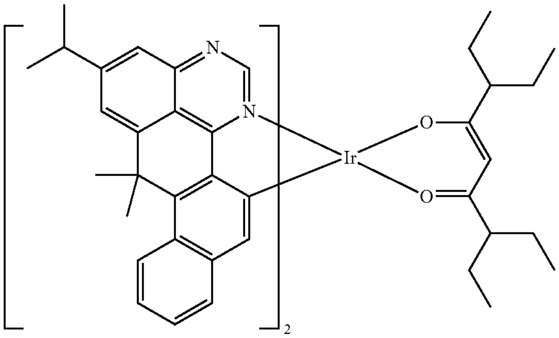
200
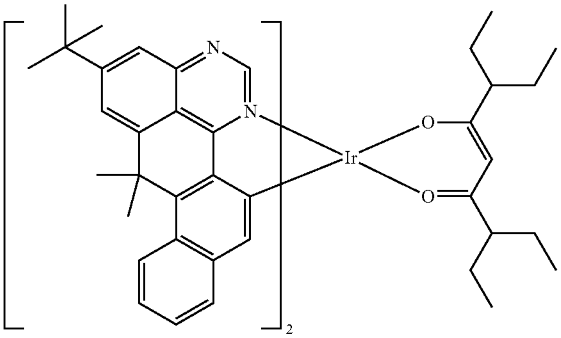
201
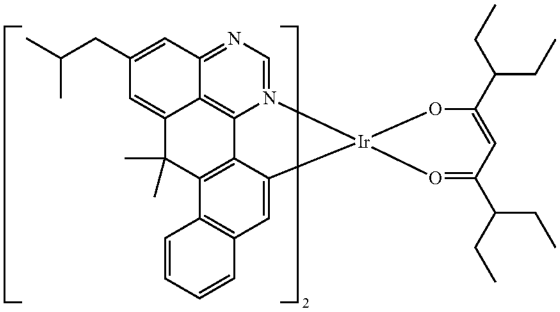

-continued
202
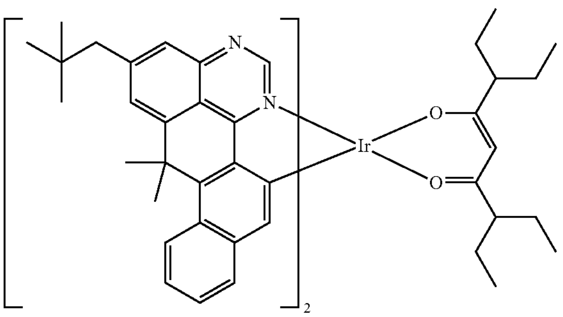
203
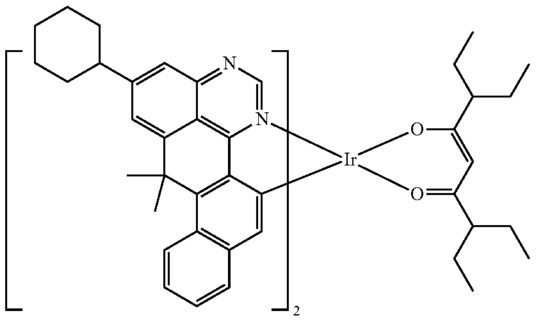
204
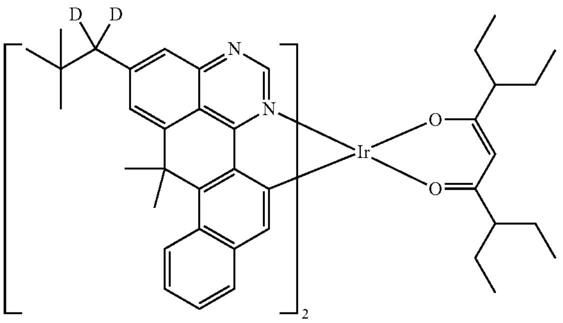
205
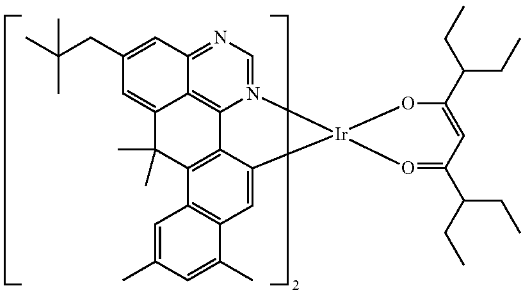
-continued
206
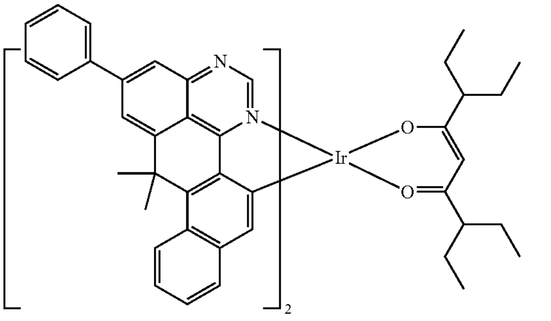
207
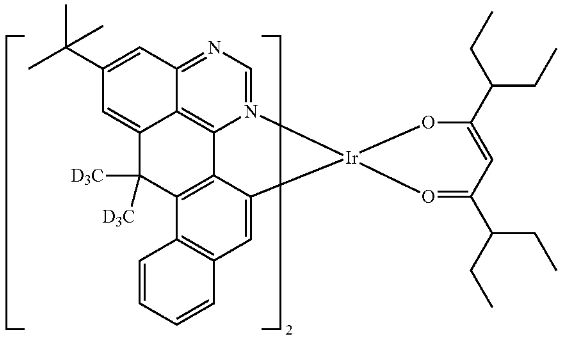
208
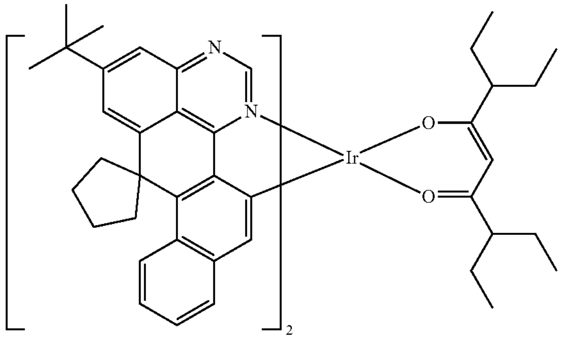
209
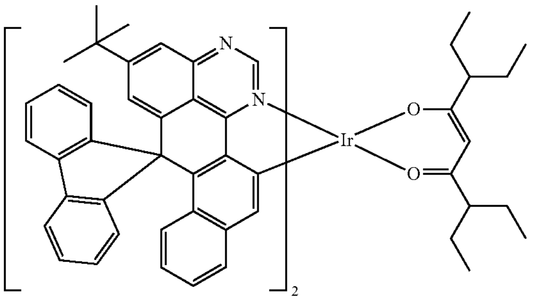

-continued
210
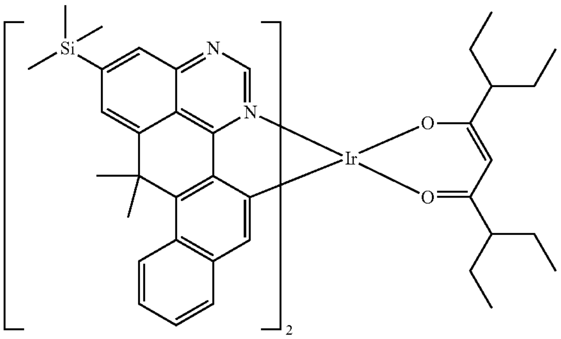
211
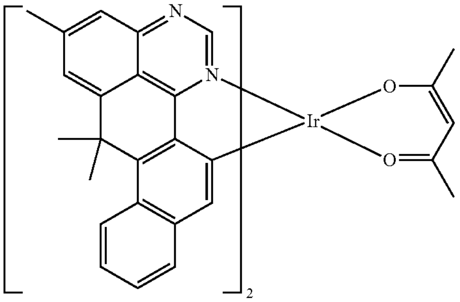
212
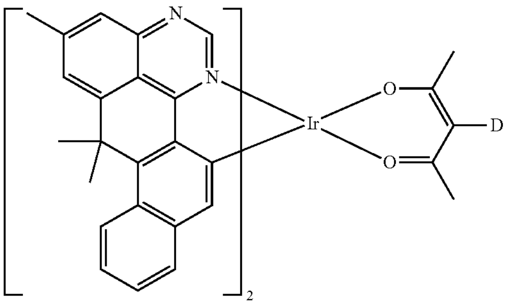
213
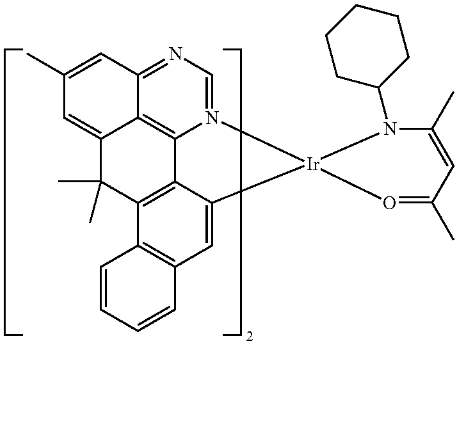
-continued
214
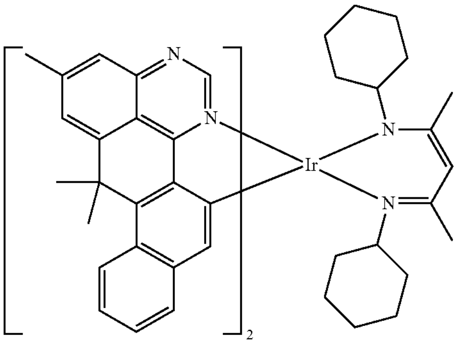
215
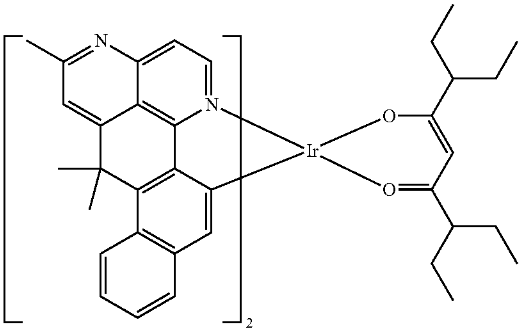
216
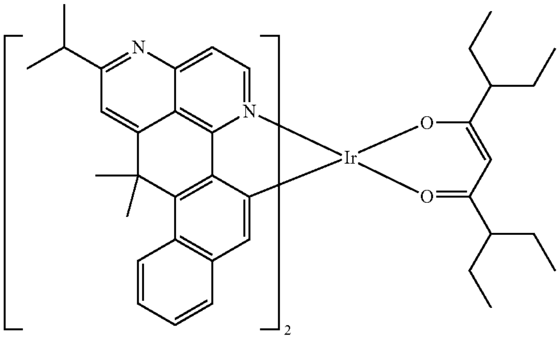
217
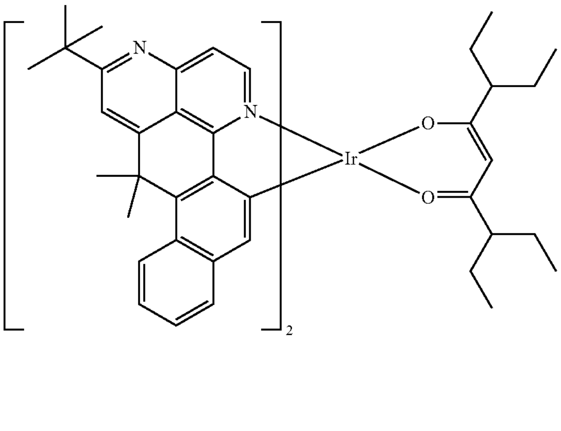

-continued
218
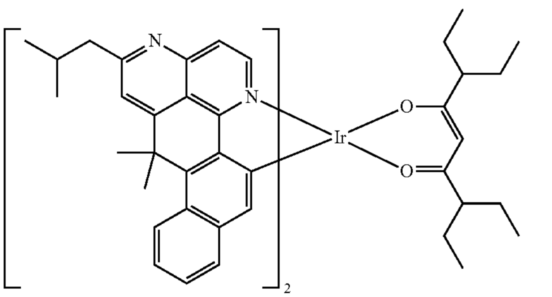
219
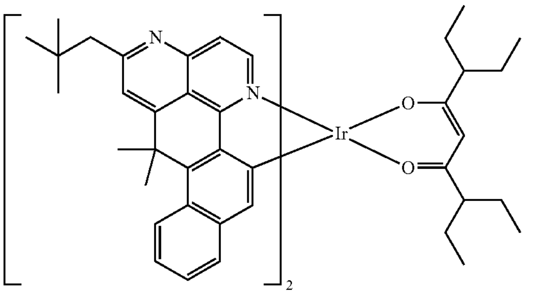
220
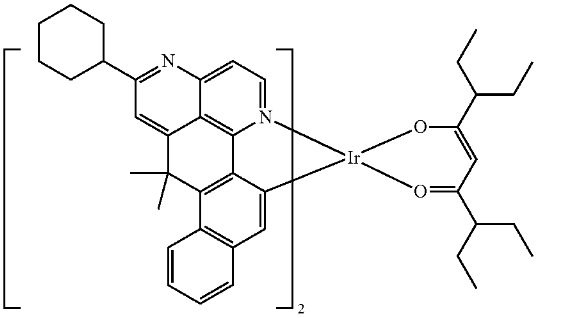
221
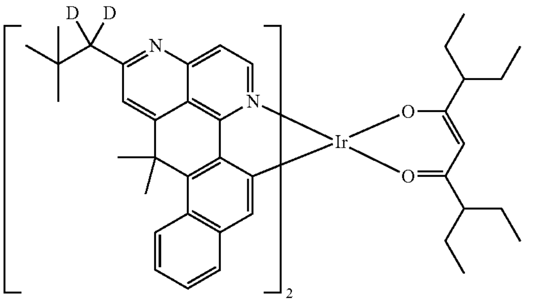
222
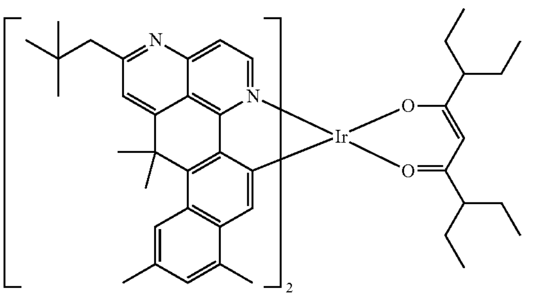
-continued
223
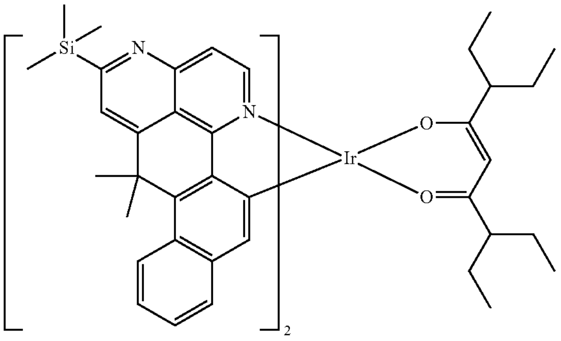
224
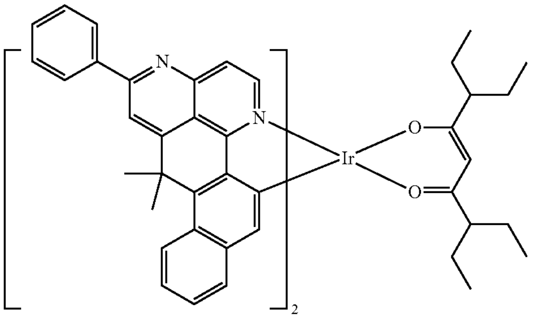
225
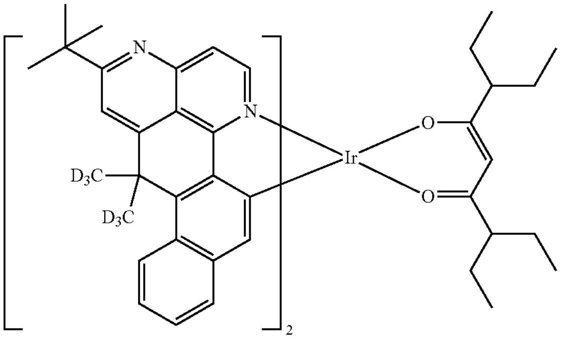
226
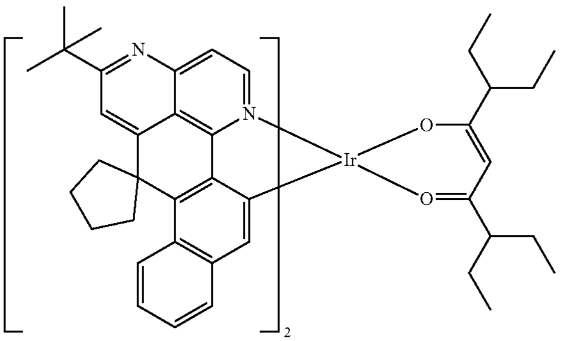

-continued
227
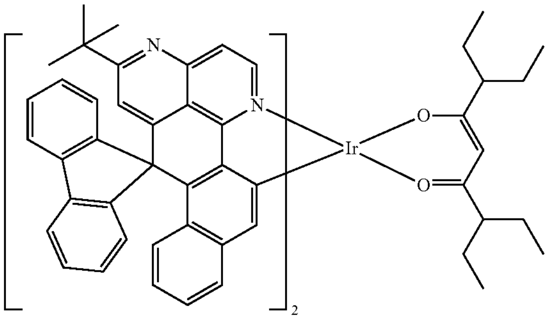
228
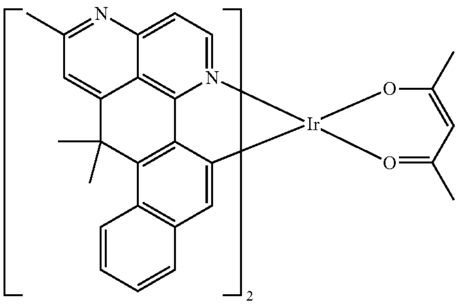
229
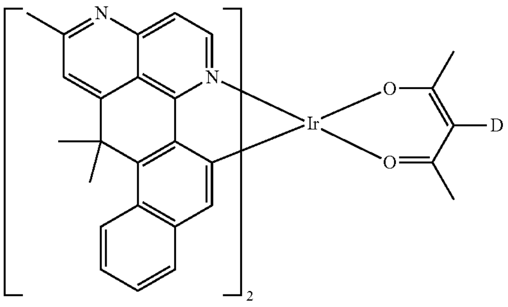
230
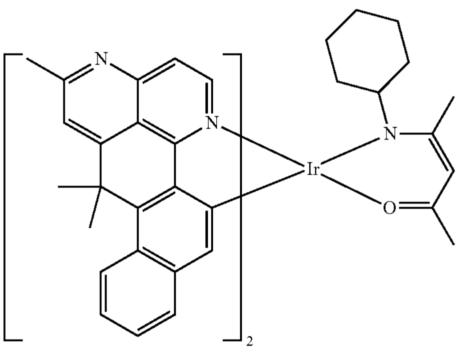
-continued
231
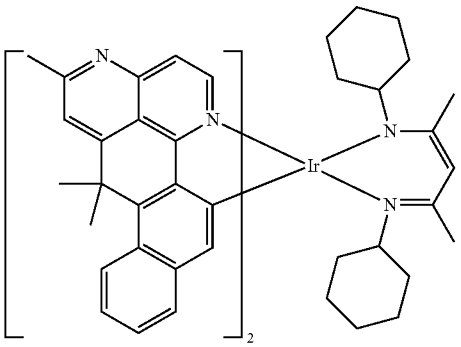
232
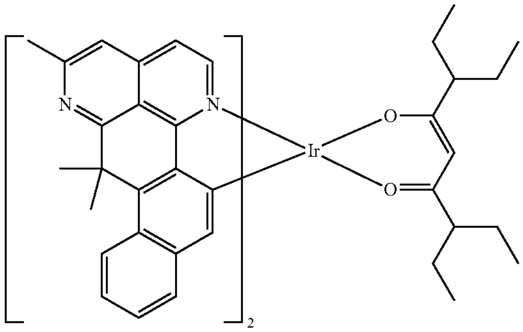
233
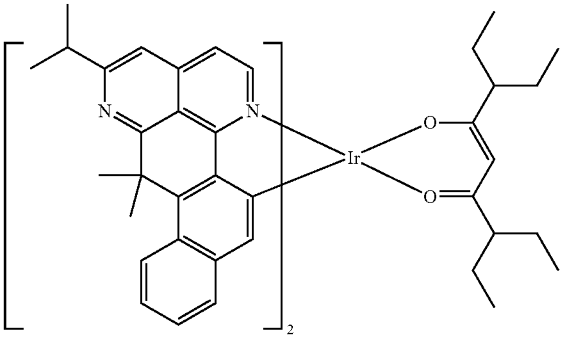
234
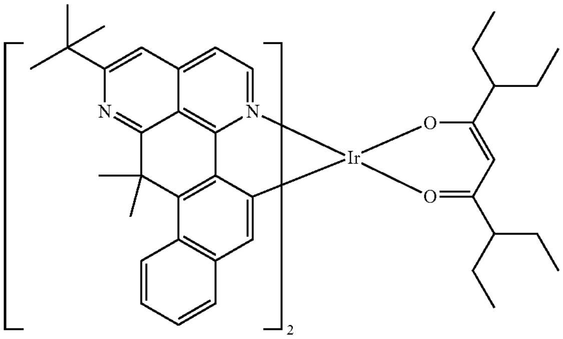

-continued
235
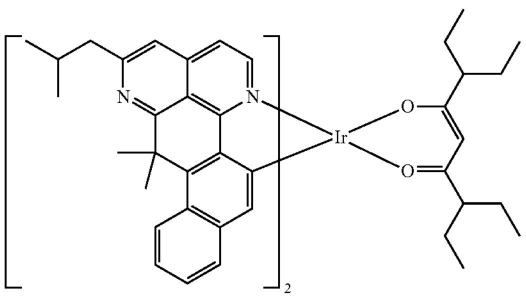
236
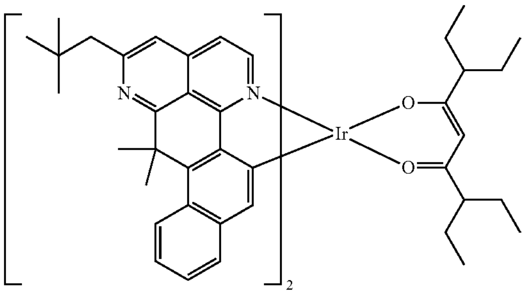
237
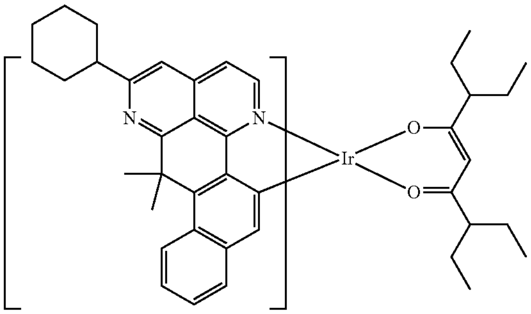
238
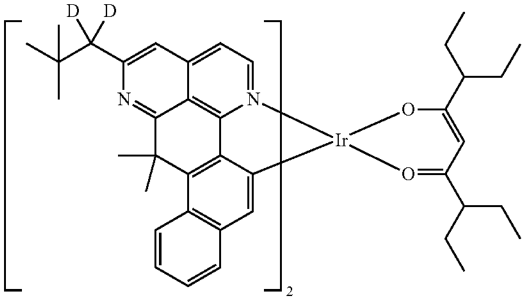
239
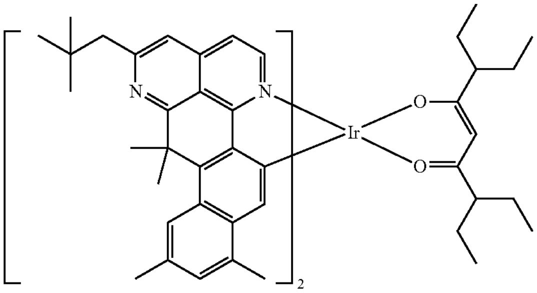
-continued
240
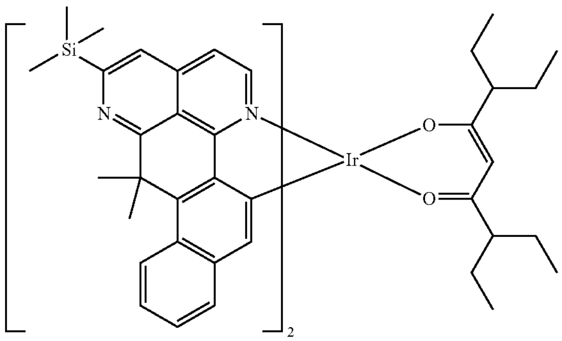
241
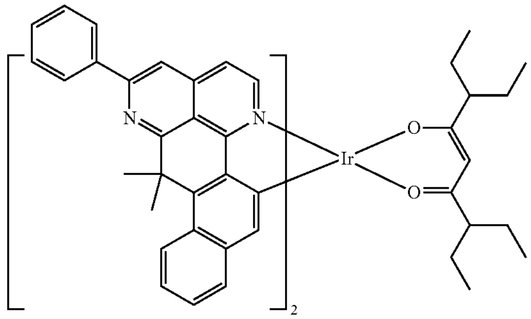
242
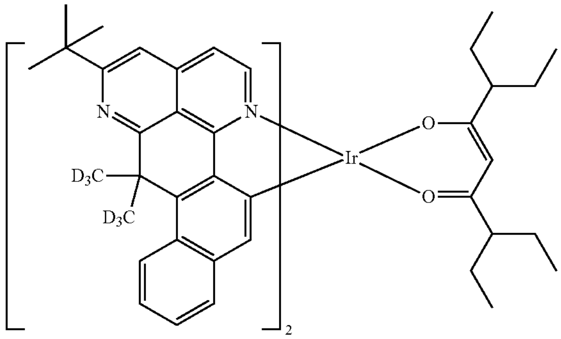
243
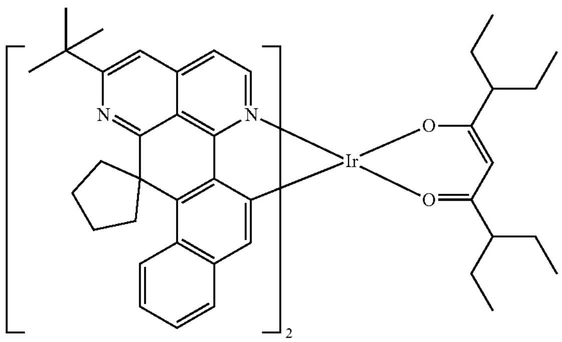

-continued
244
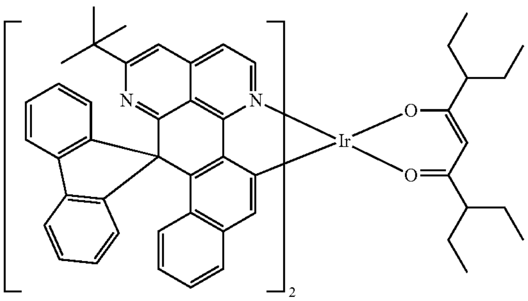
245
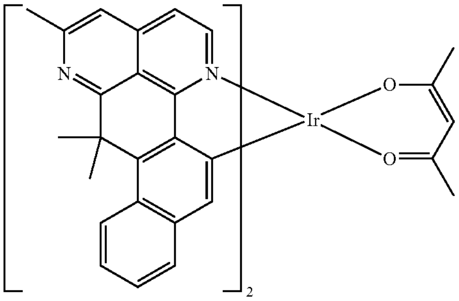
246
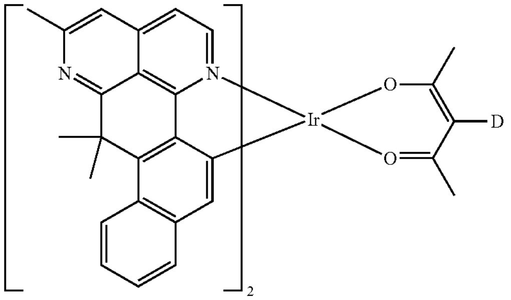
247
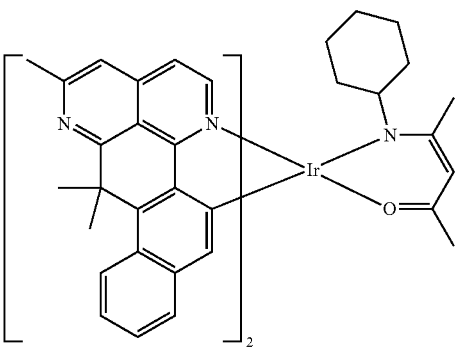
-continued
248
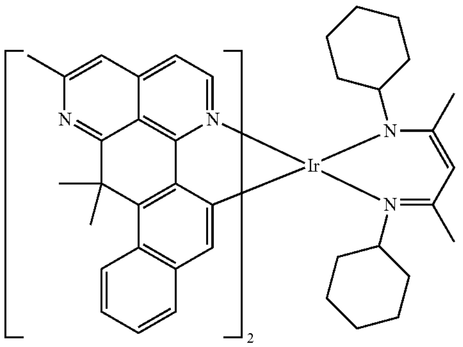
249
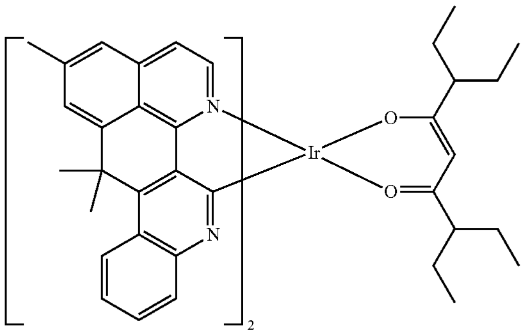
250
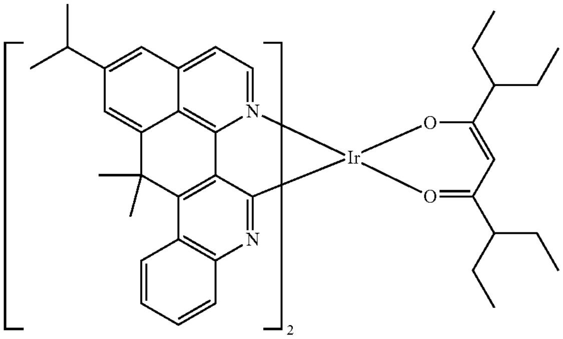
251
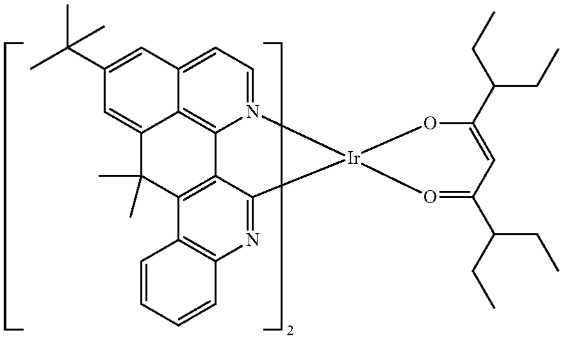

-continued
252
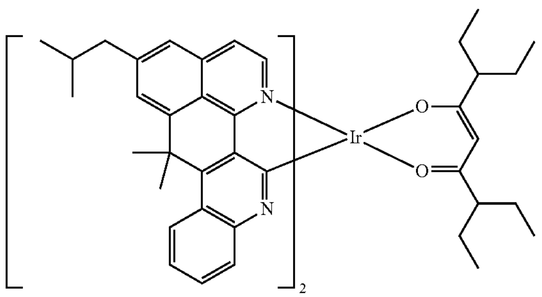
253
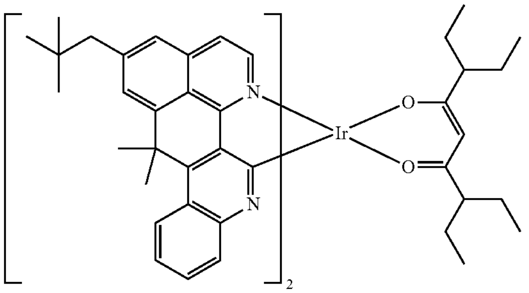
254
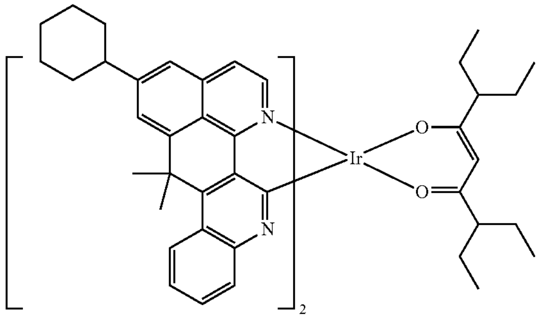
255
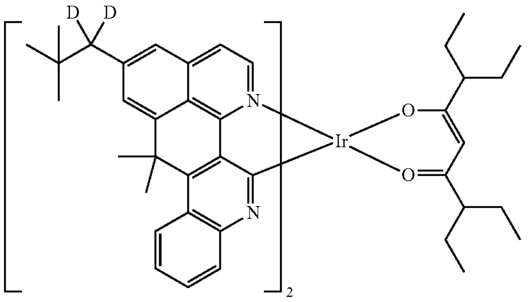
256
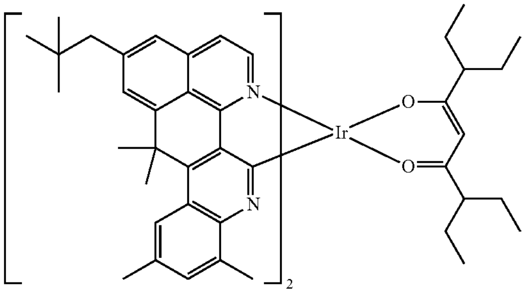
-continued
257
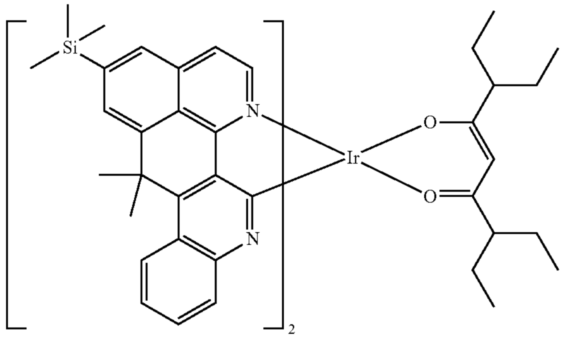
258
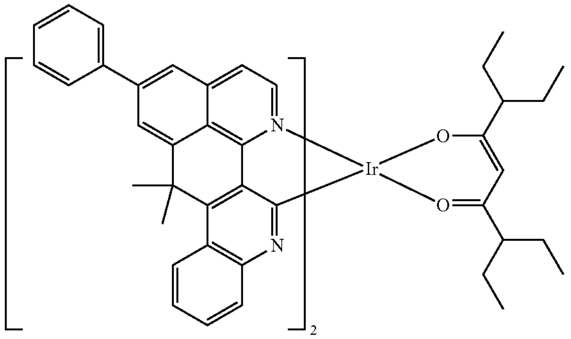
259
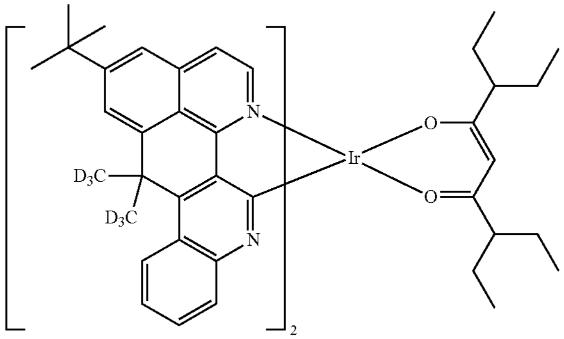
260
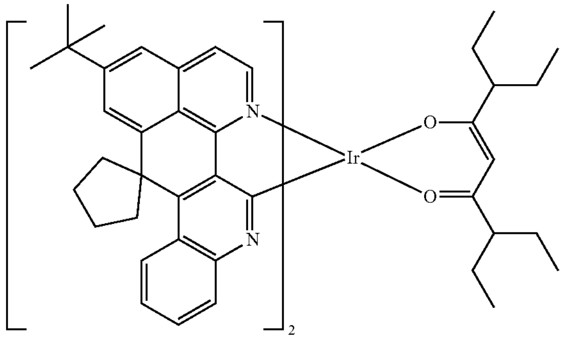

261
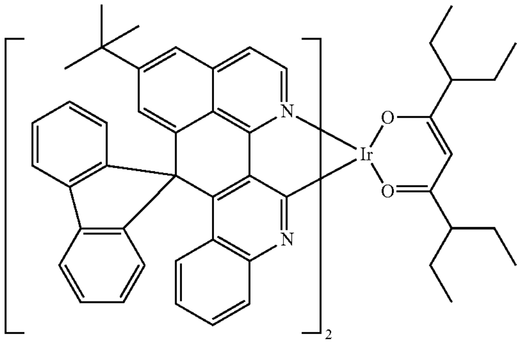
262
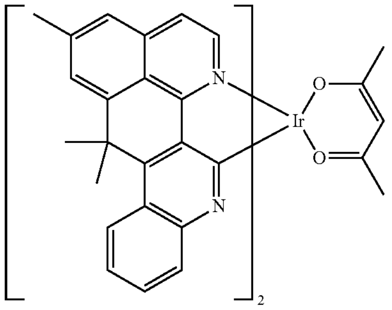
263
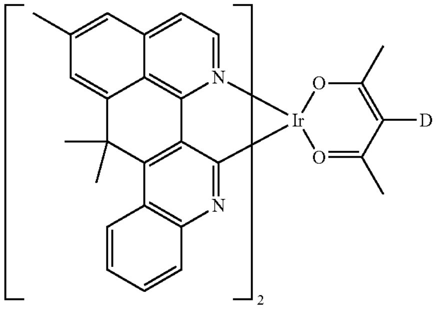
264
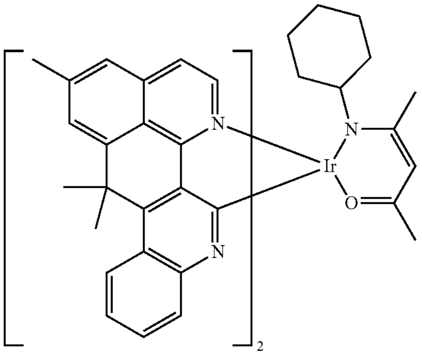
-continued
265
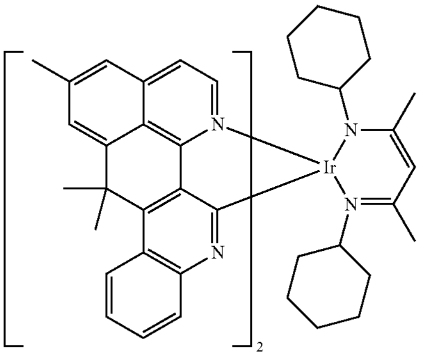
266
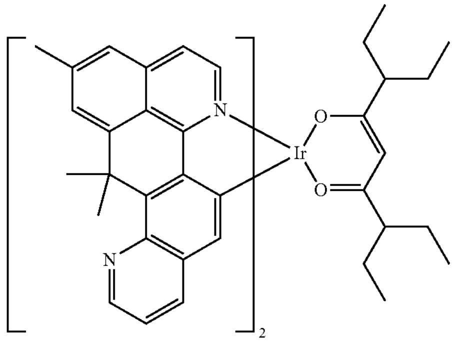
267
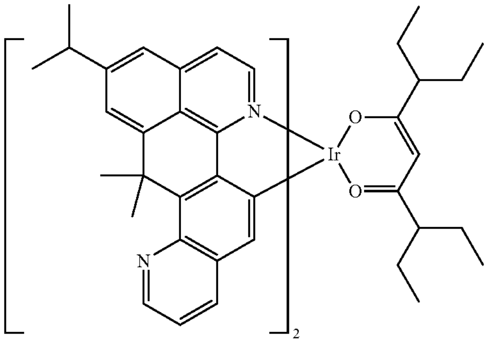
268
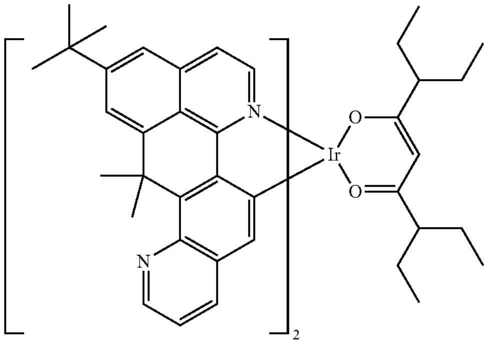

-continued
269
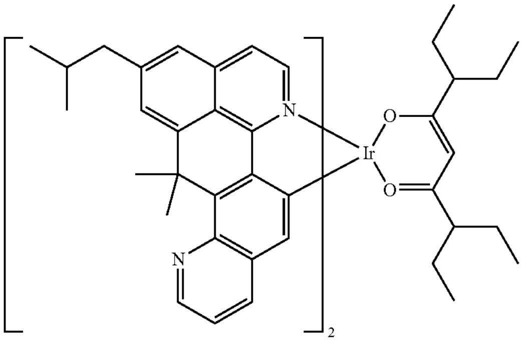
270
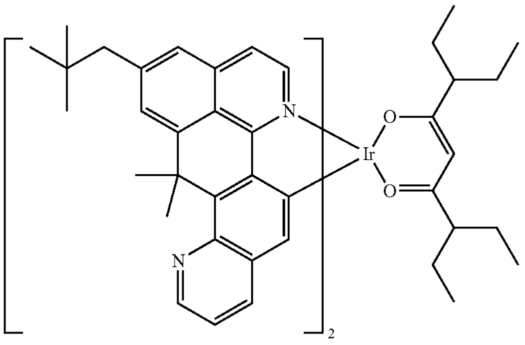
271
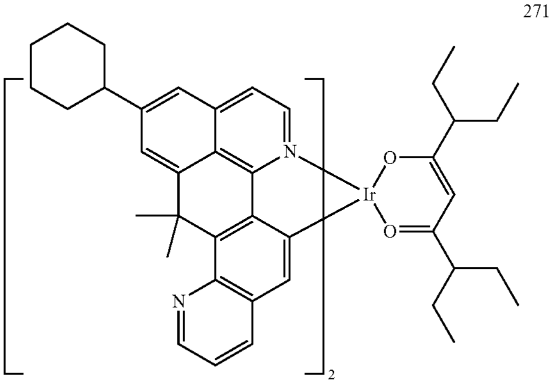
272
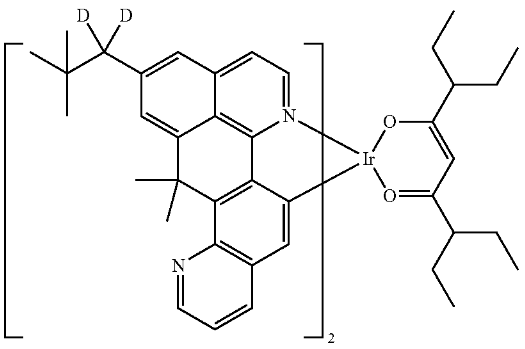
-continued
273
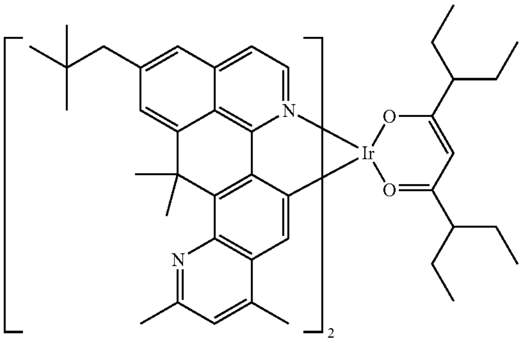
274
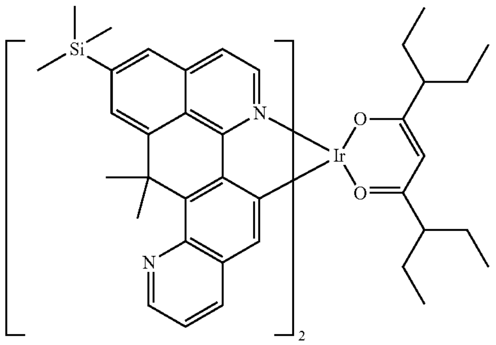
275
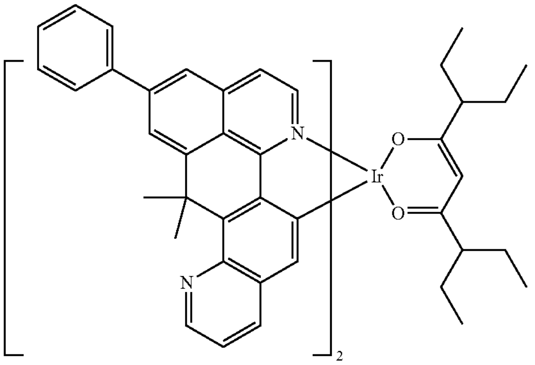
276
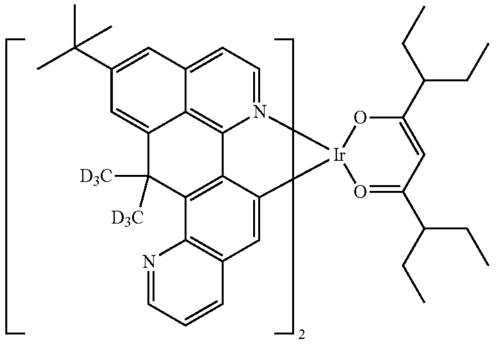

277
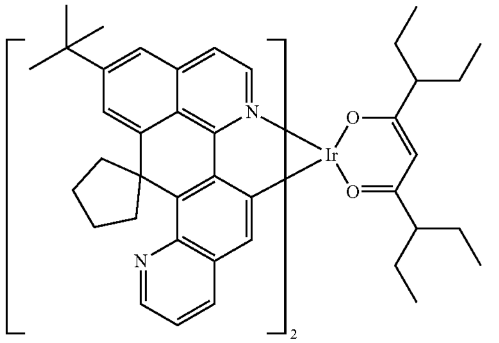
278
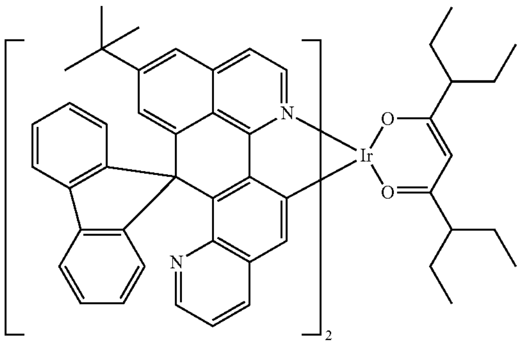
279
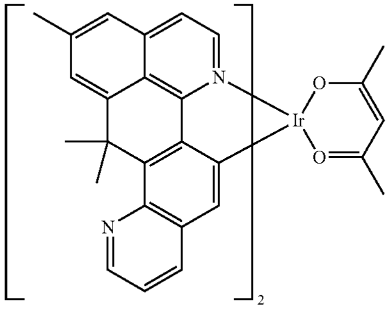
280
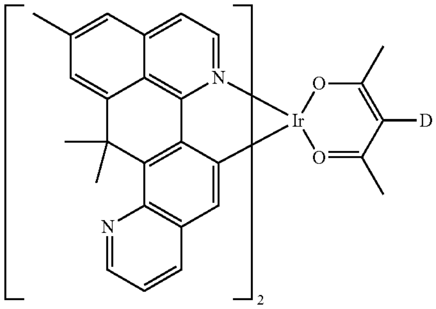
281
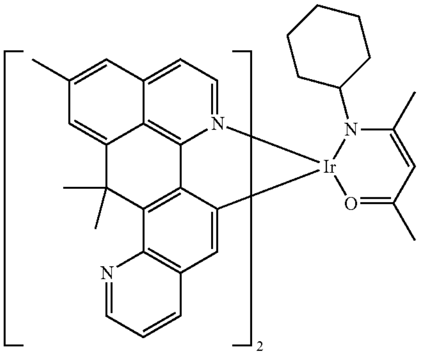
282
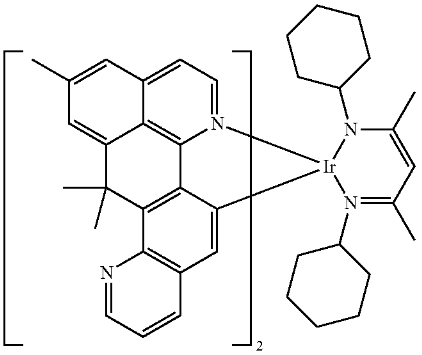
283
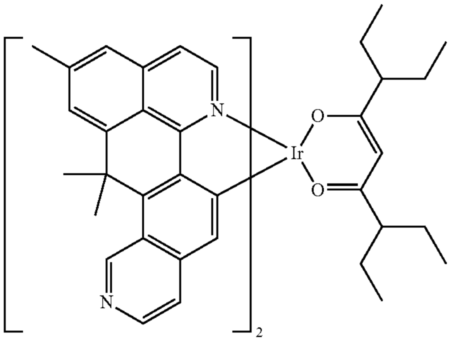
284
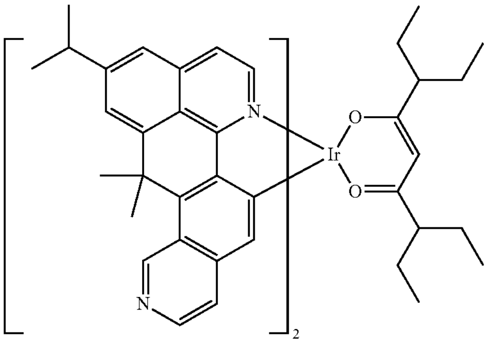

-continued
285
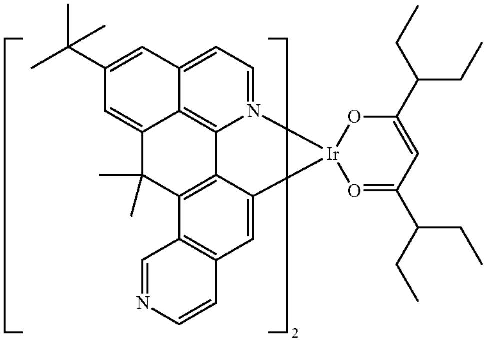
286
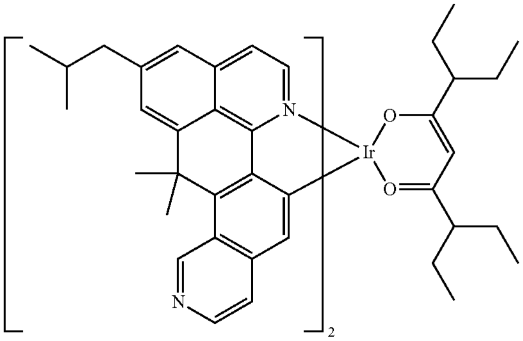
287
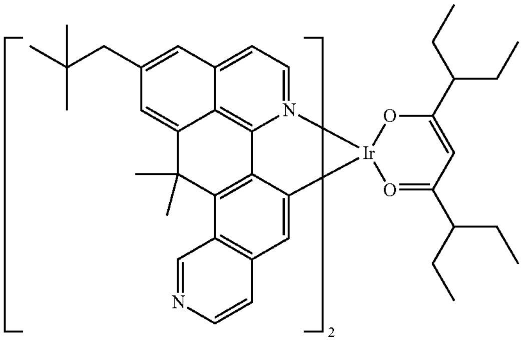
288
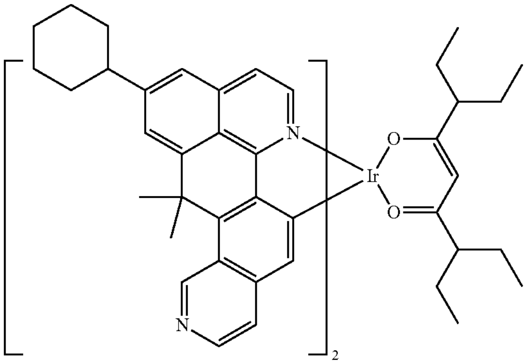
-continued
289
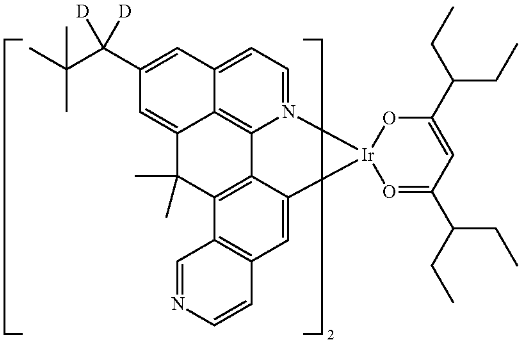
290
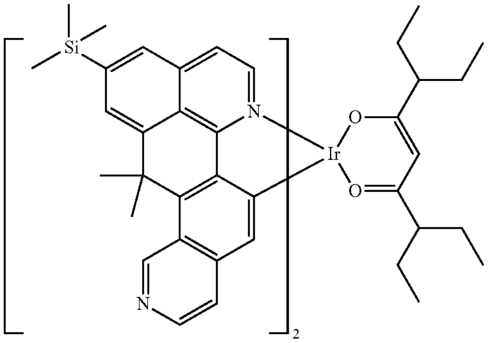
291
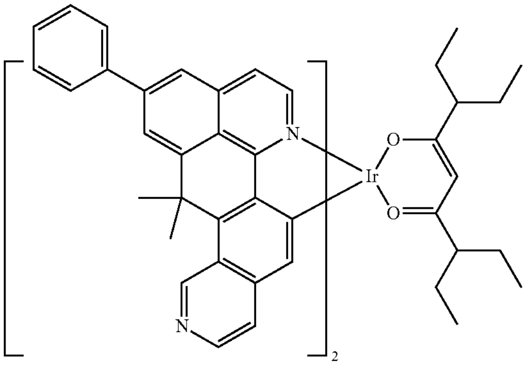
292
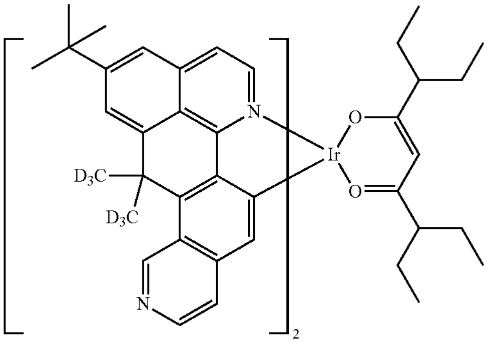

-continued
293
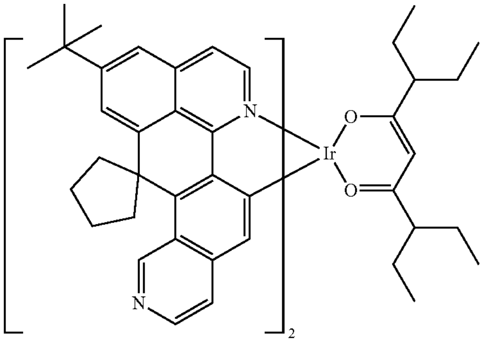
294
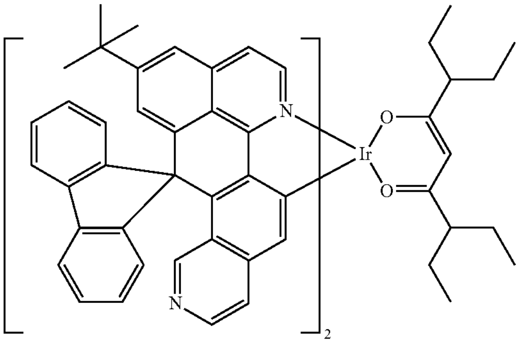
295
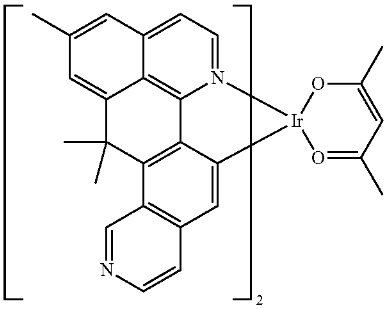
296
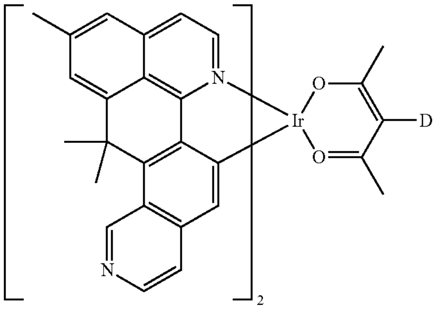
-continued
297
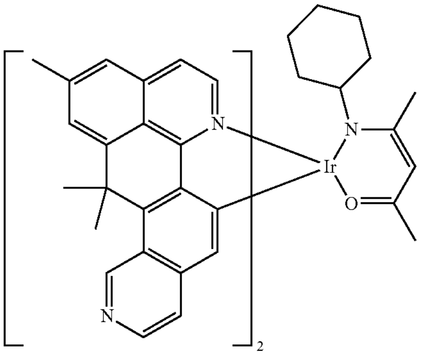
298
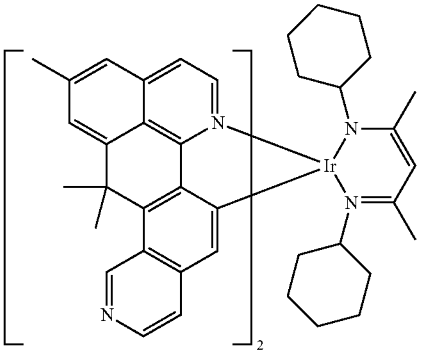
299
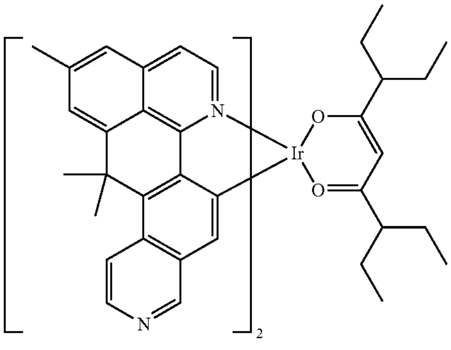
300
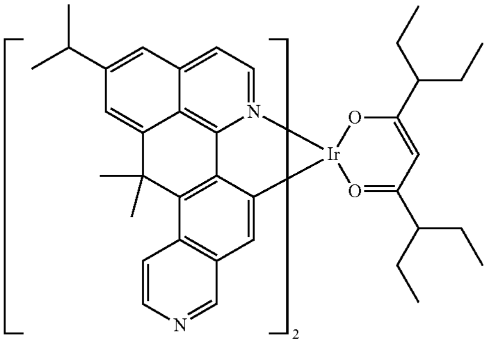

301
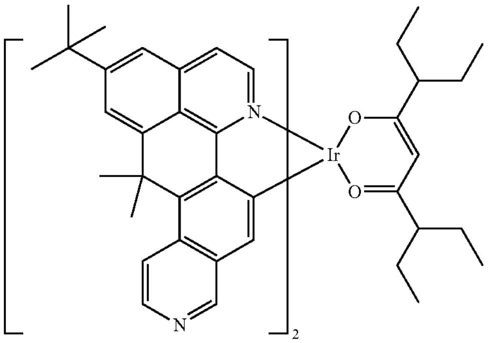
302
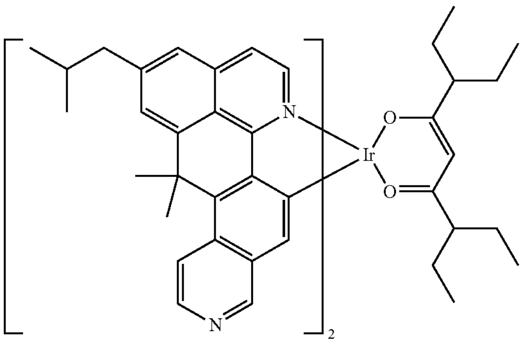
303
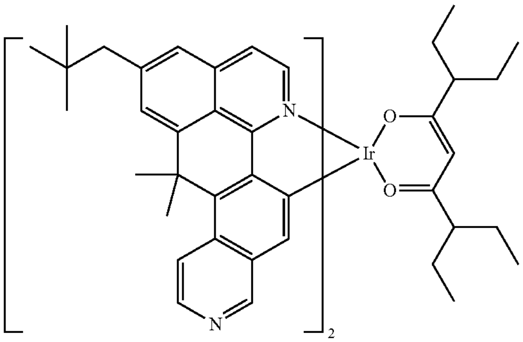
304
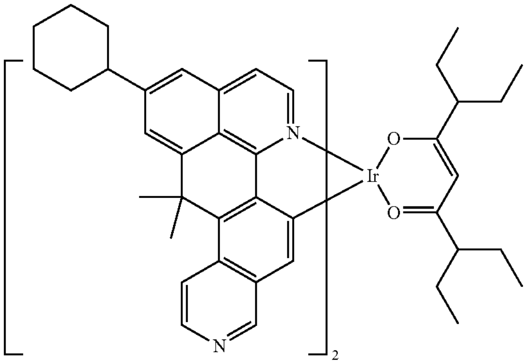
305
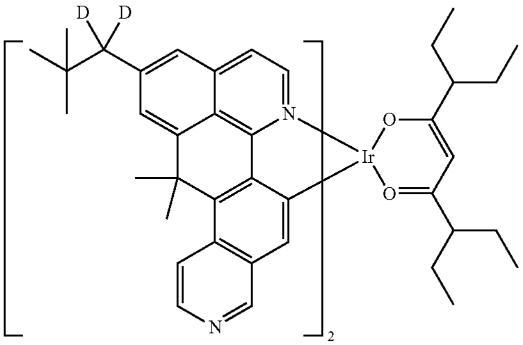
306
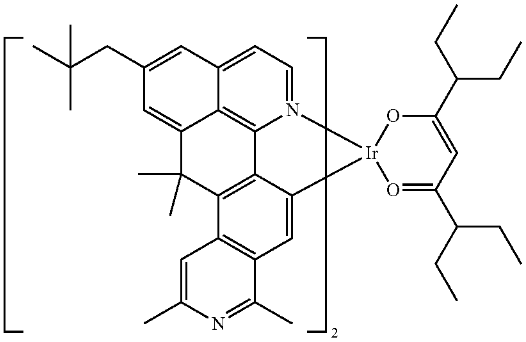
307
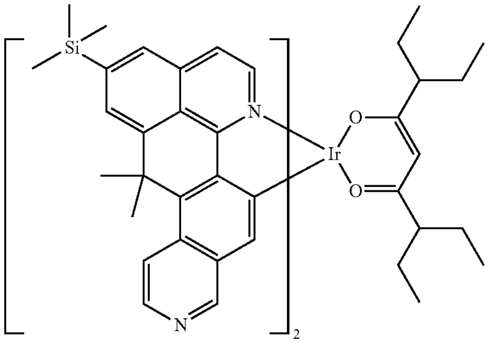
308
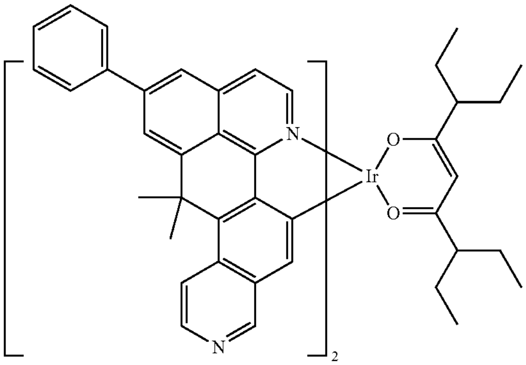

-continued
309
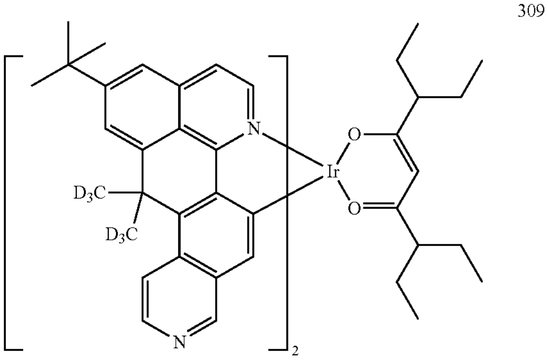
310
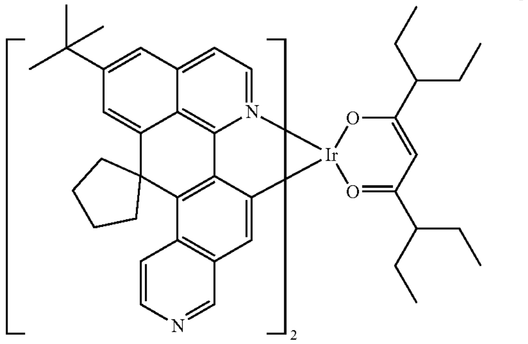
311
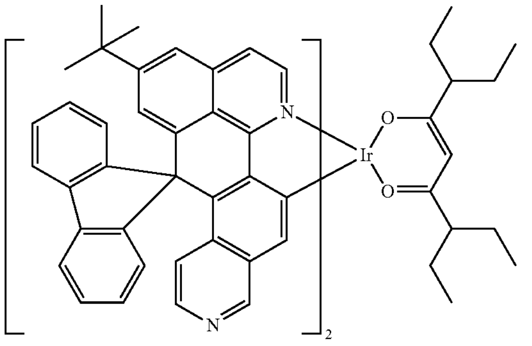
312
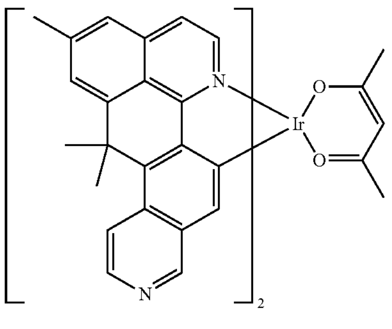
-continued
313
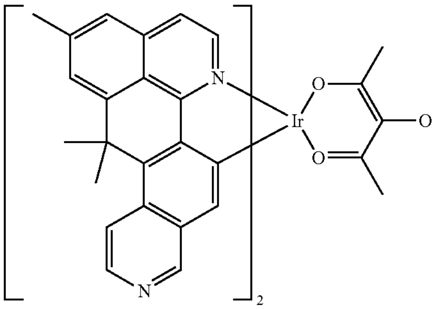
314
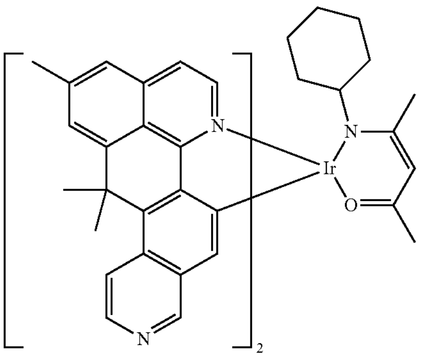
315
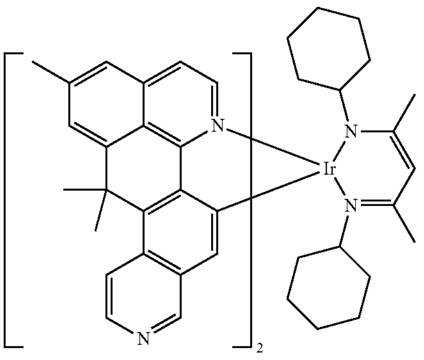
316
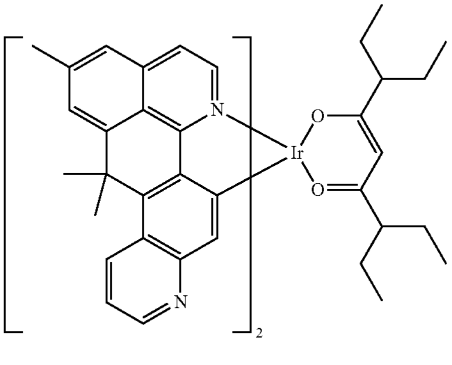

-continued
317
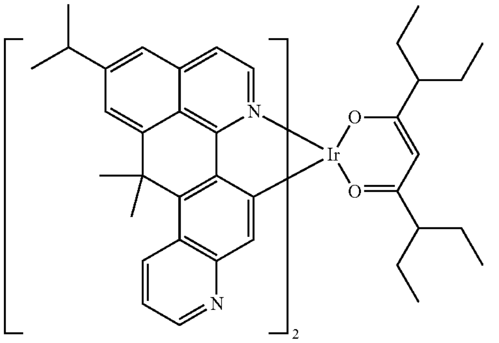
318
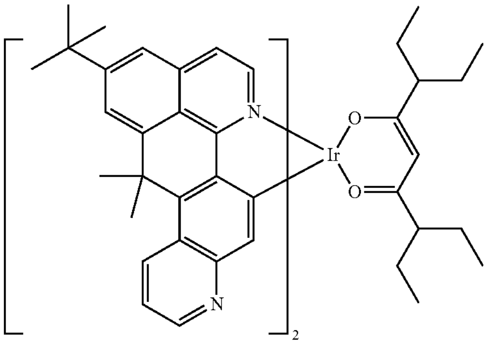
319
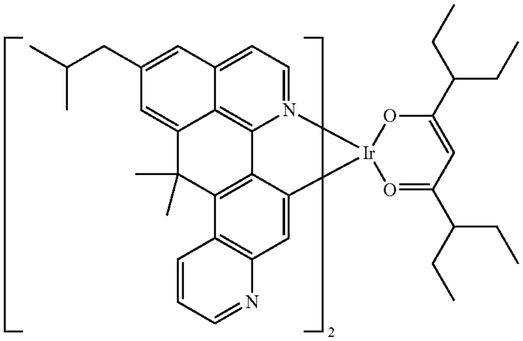
320
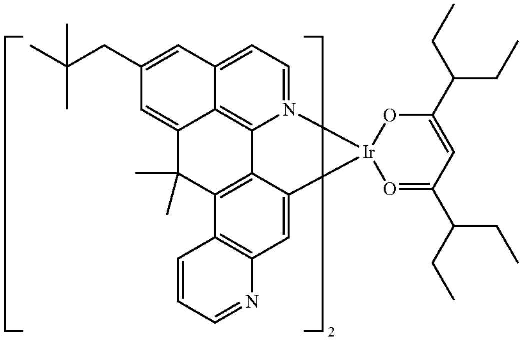
-continued
321
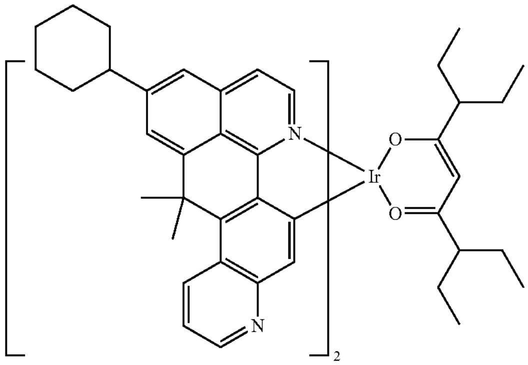
322
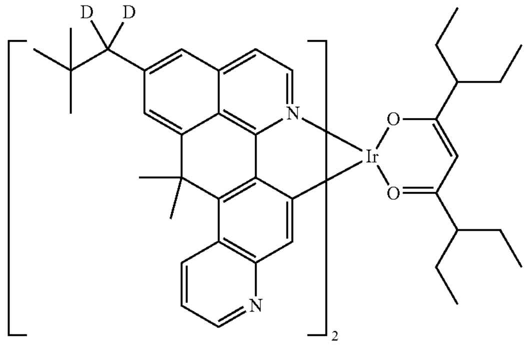
323
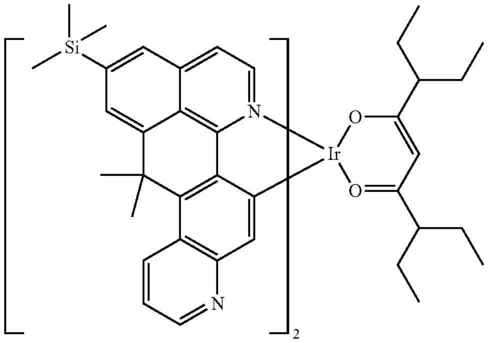
324
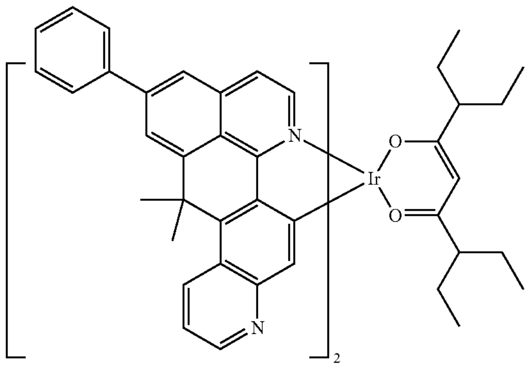

-continued
325
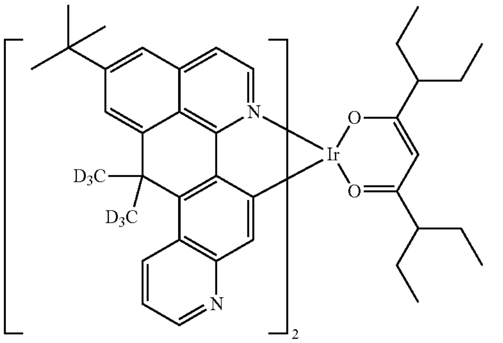
326
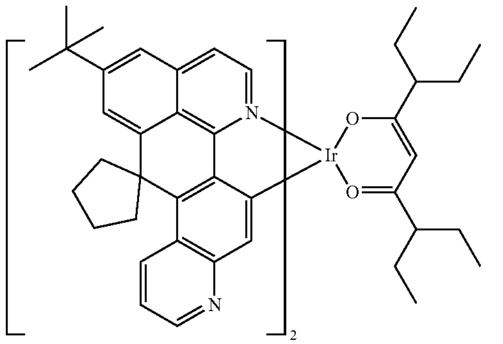
327
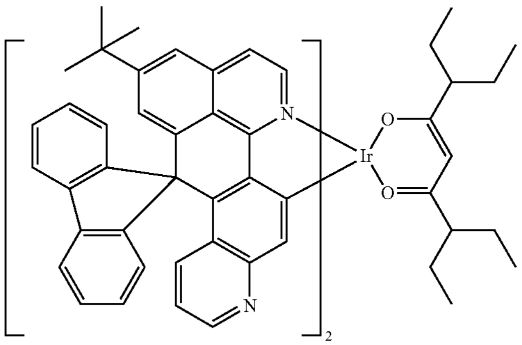
328
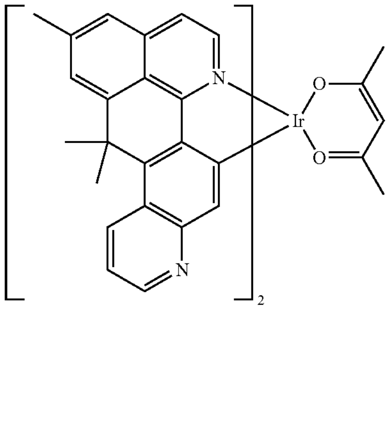
-continued
329
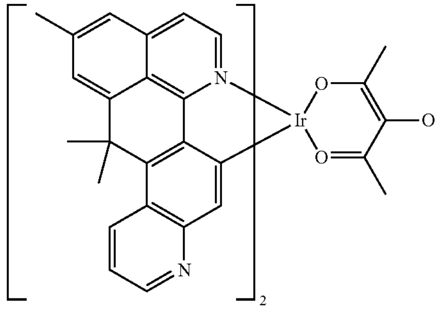
330
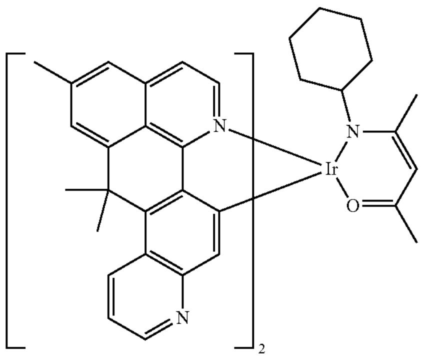
331
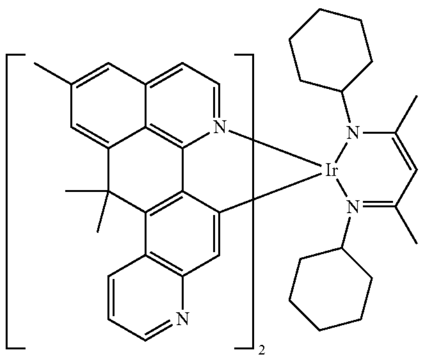
332
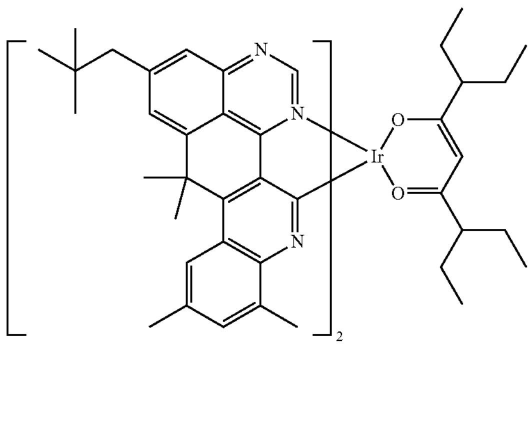

-continued
333
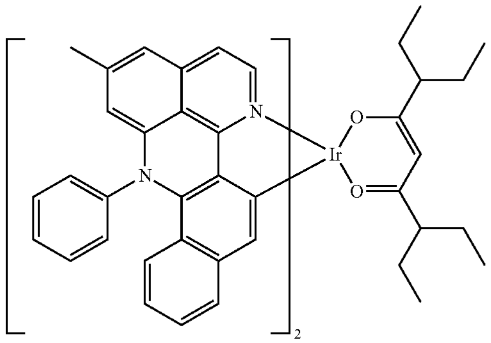
334
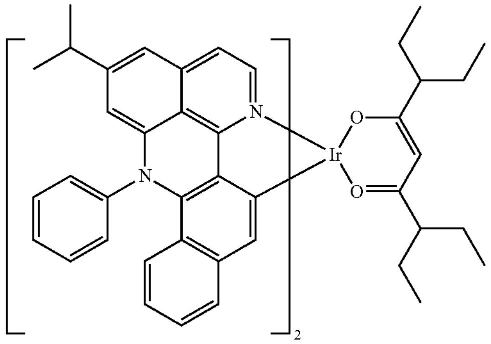
335
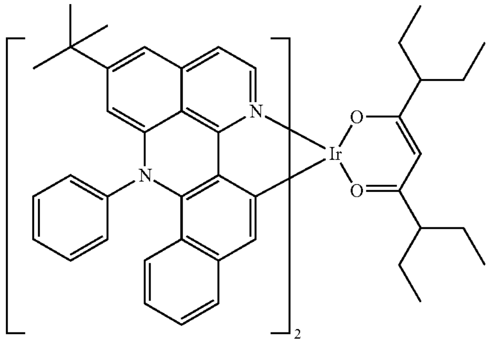
336
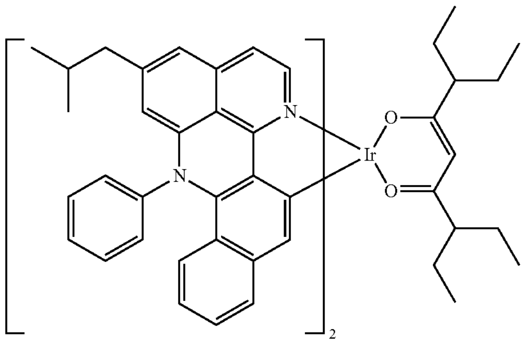
-continued
337
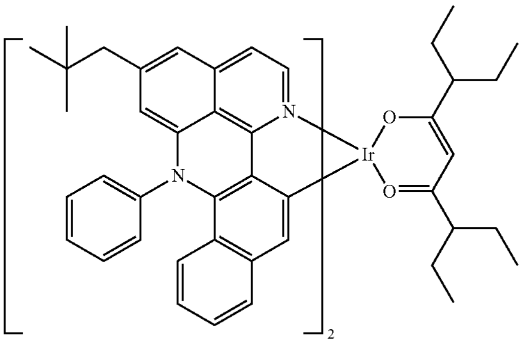
338
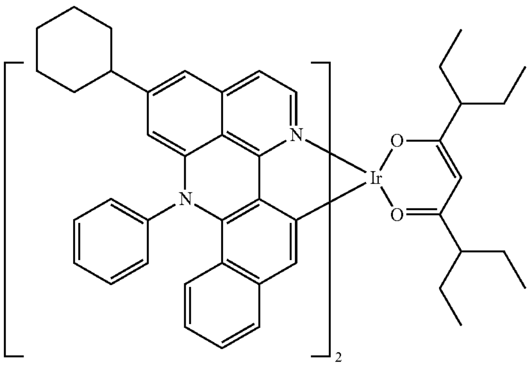
339
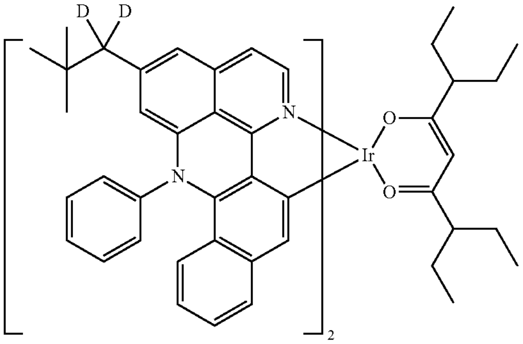
340
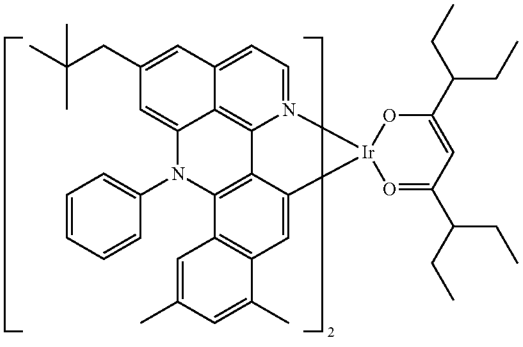

-continued
341
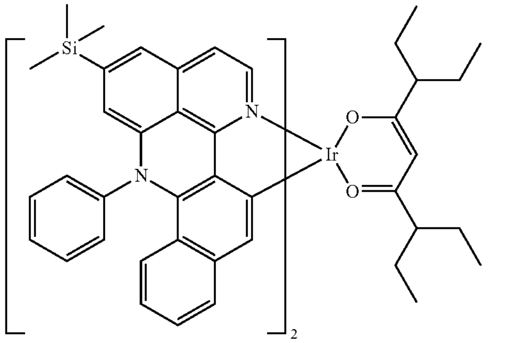
342
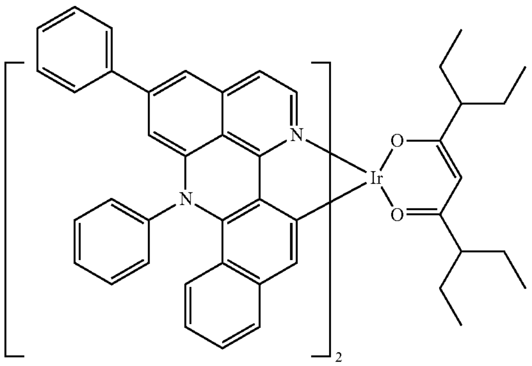
343
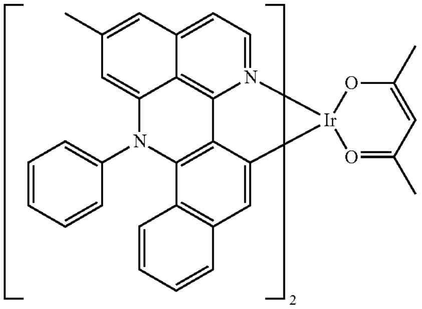
344
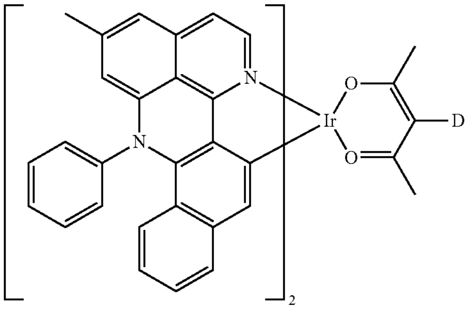
-continued
345
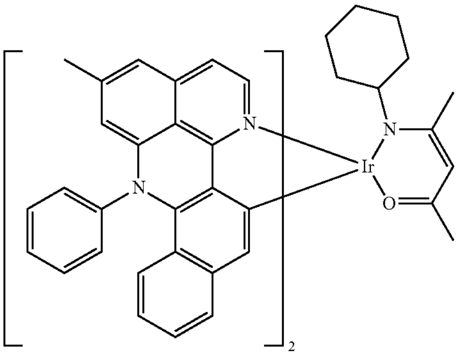
346
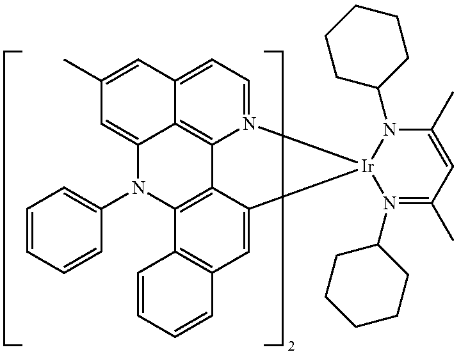
347
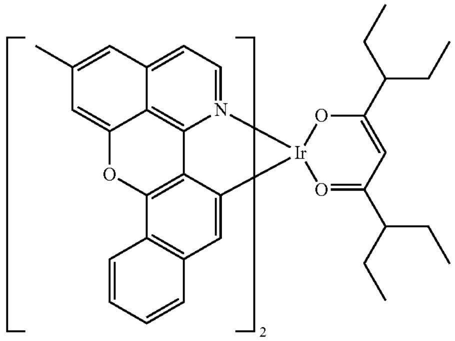
348
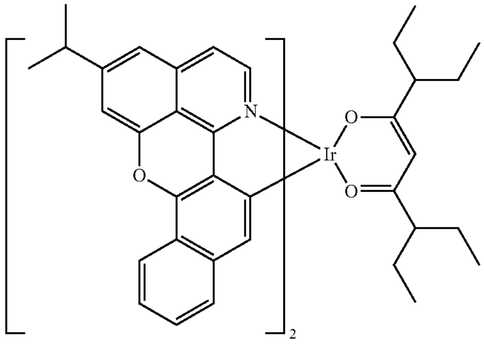

-continued
349
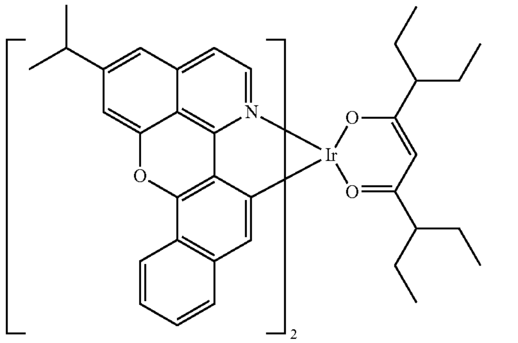
350
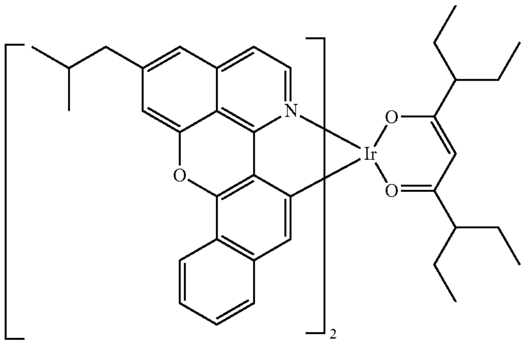
351
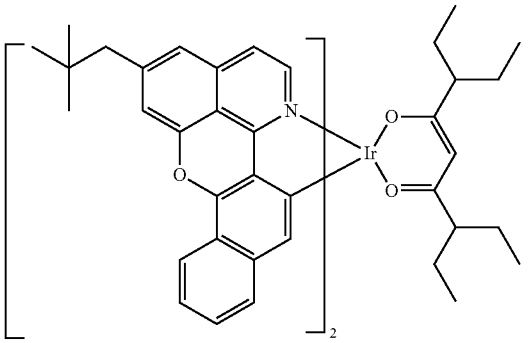
352
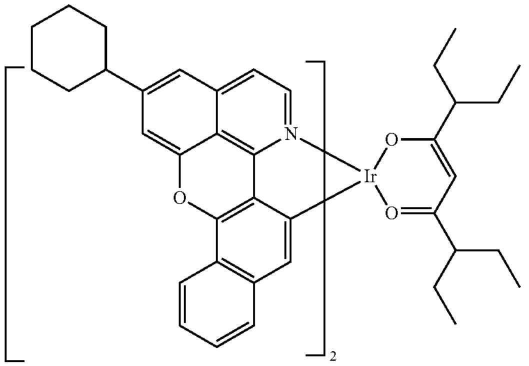
-continued
353
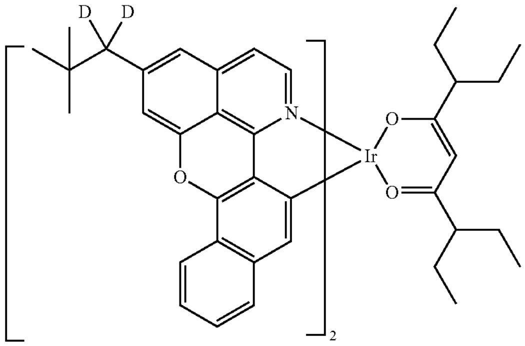
354
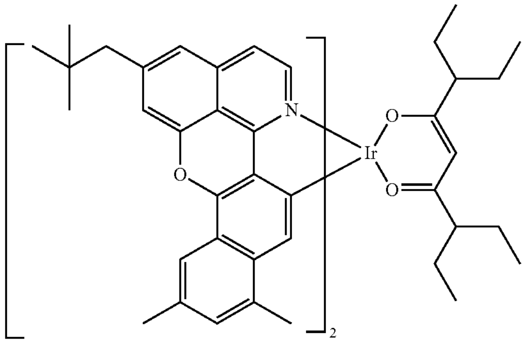
355
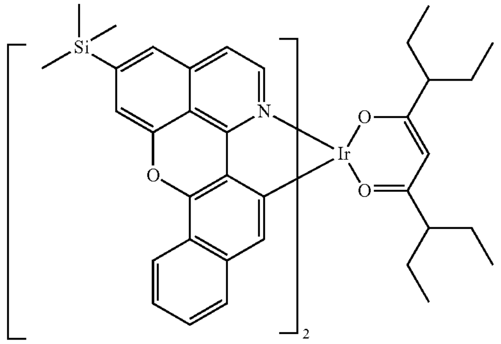
356
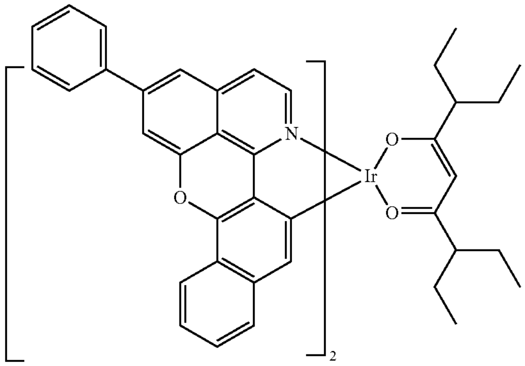

-continued
357
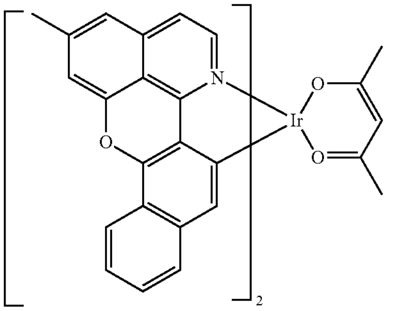
358
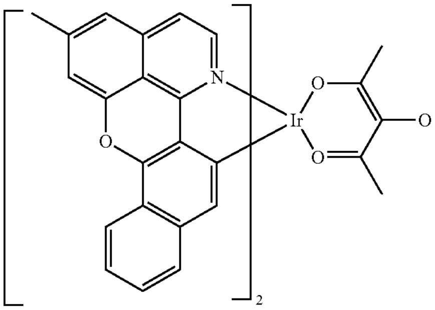
359
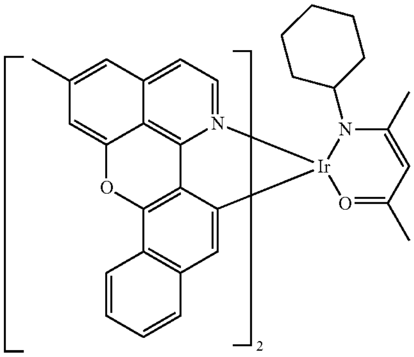
360
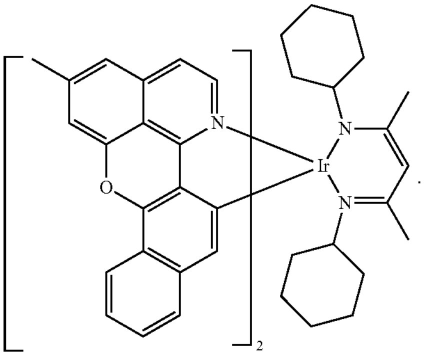
361
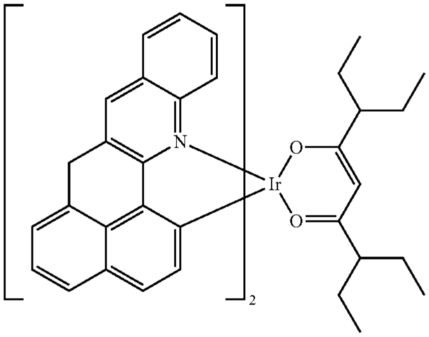
362
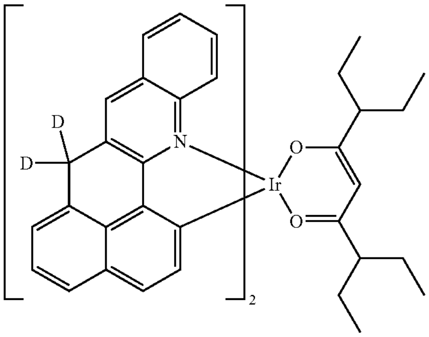
363
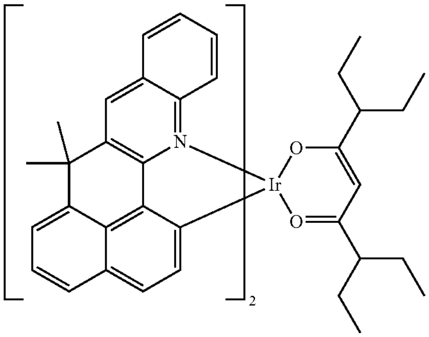
364
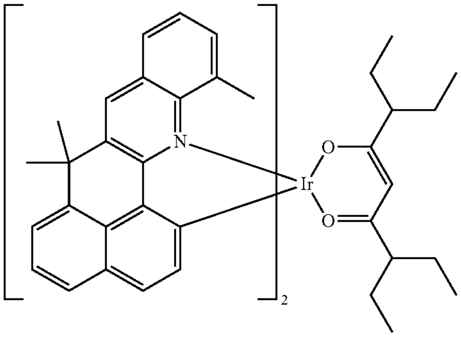
9. The organic metal compound of claim 1, wherein the organic metal compound is selected form the following compounds:

-continued
365
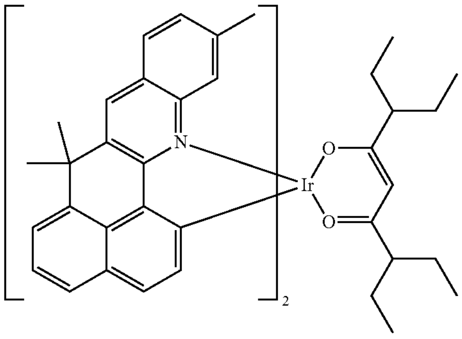
366
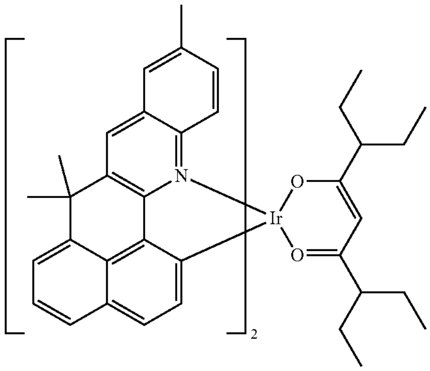
367
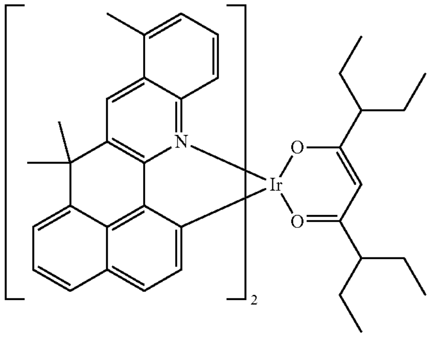
368
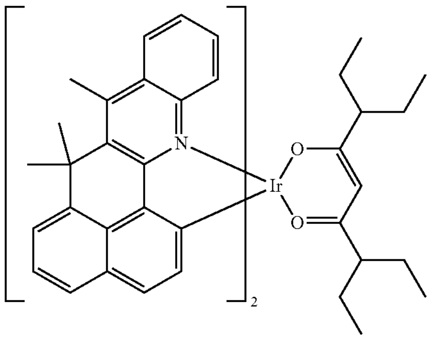
-continued
369
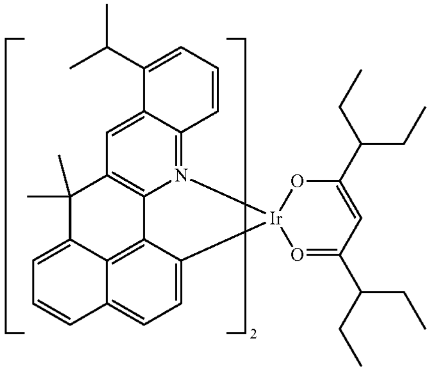
370
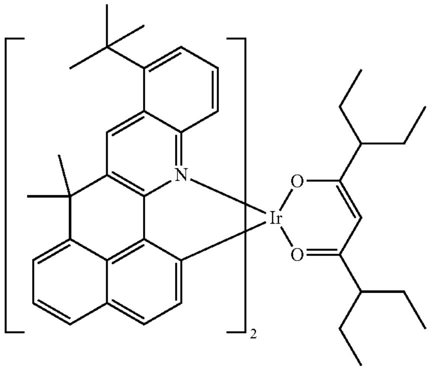
371
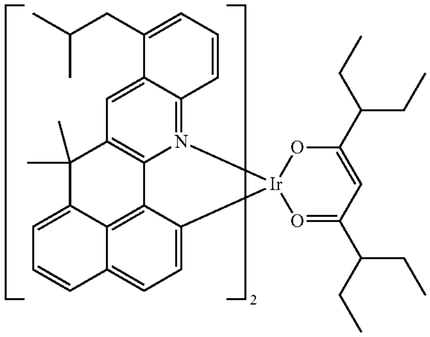
372
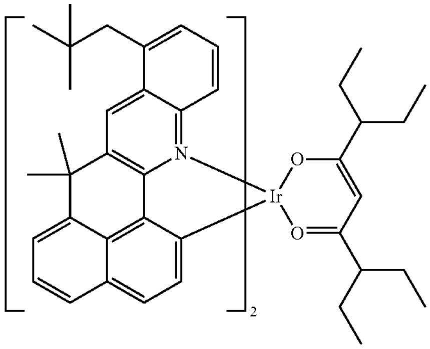

-continued
373
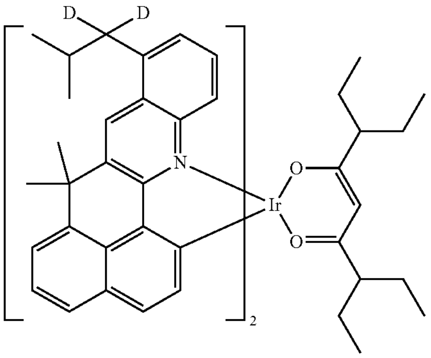
374
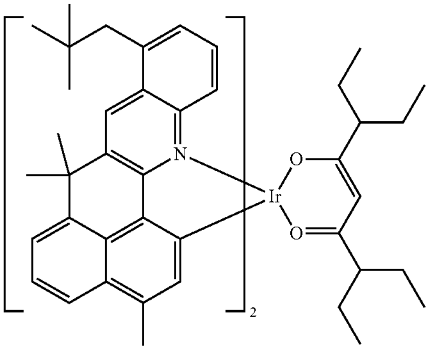
375
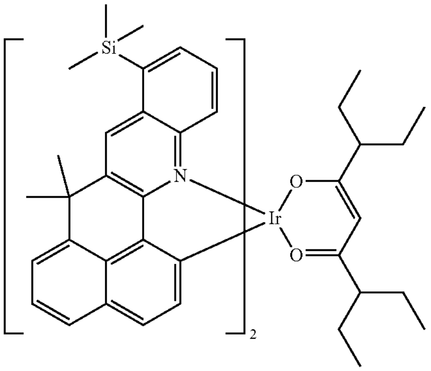
376
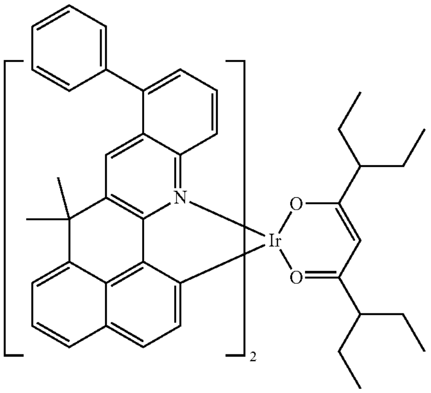
-continued
377
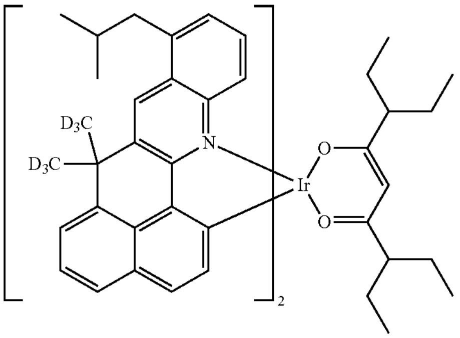
378
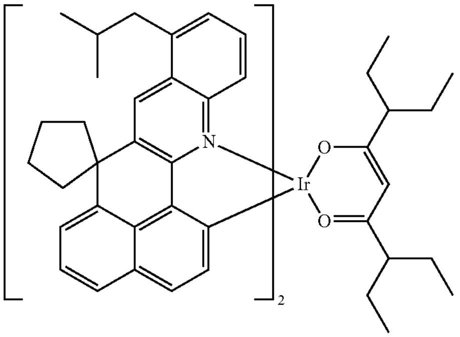
379
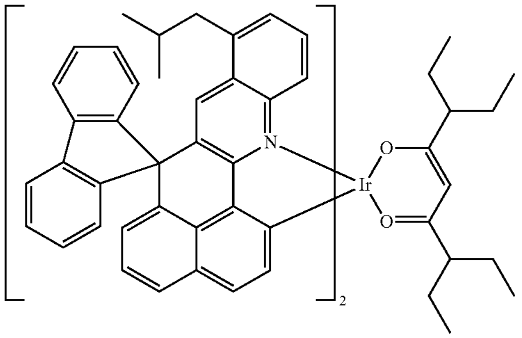
380
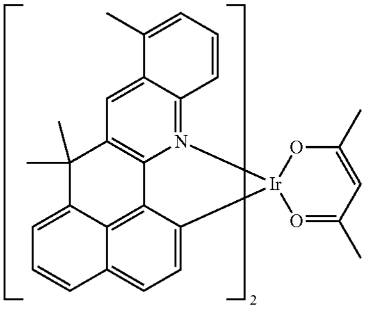

-continued
381
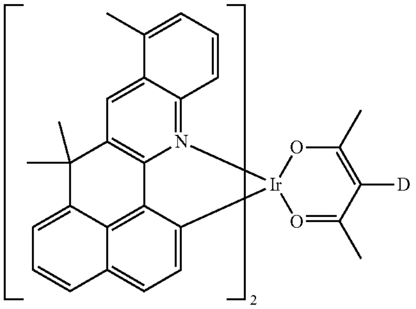
382
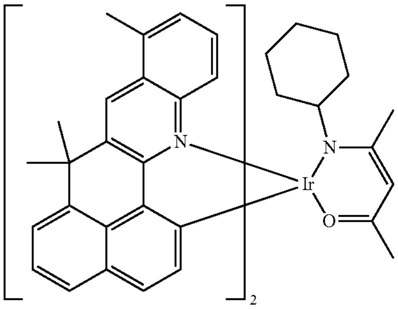
383
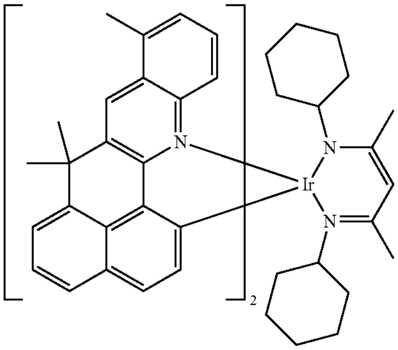
384
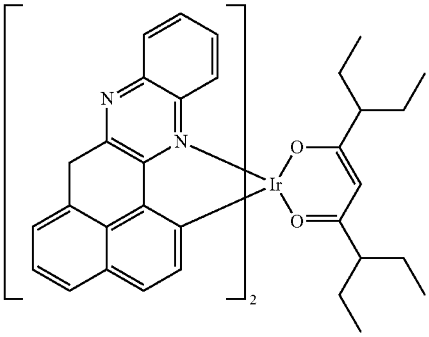
-continued
385
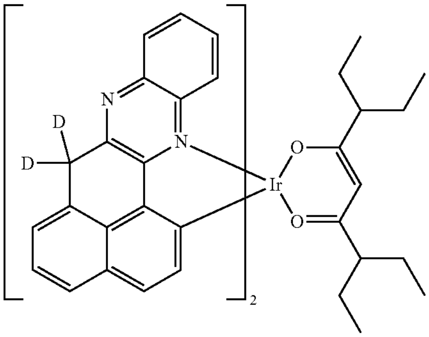
386
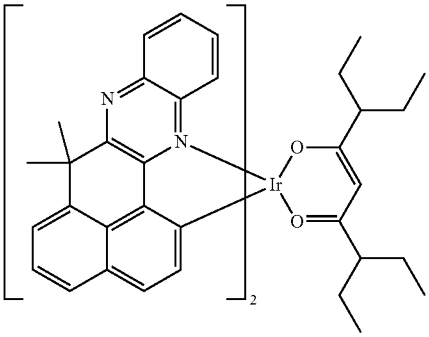
387
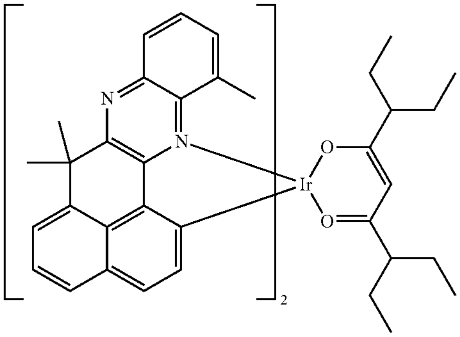
388
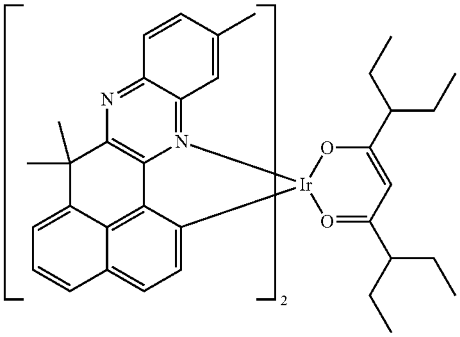

-continued
389
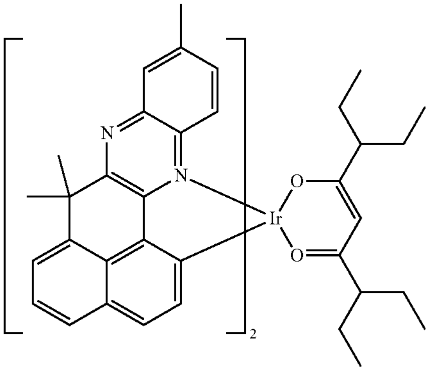
390
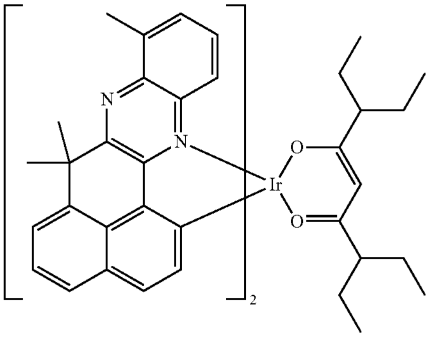
391
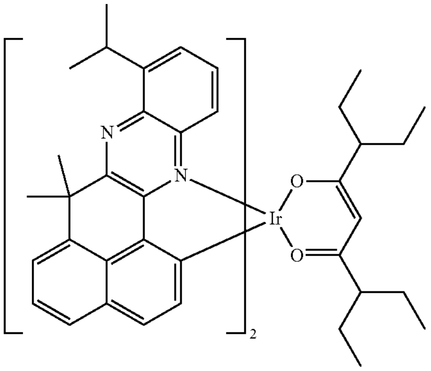
392
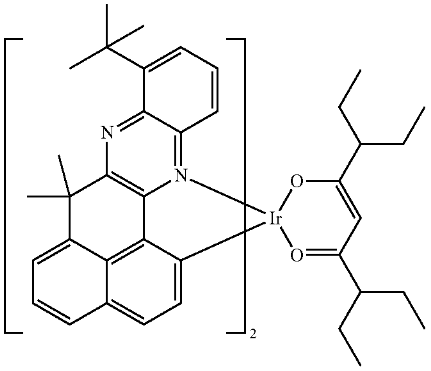
-continued
393
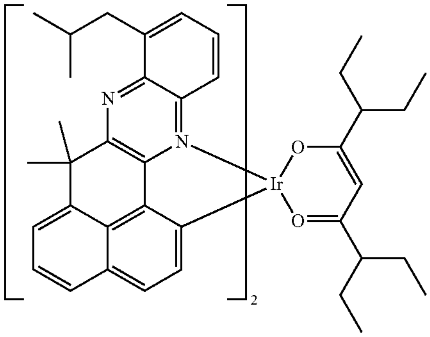
394
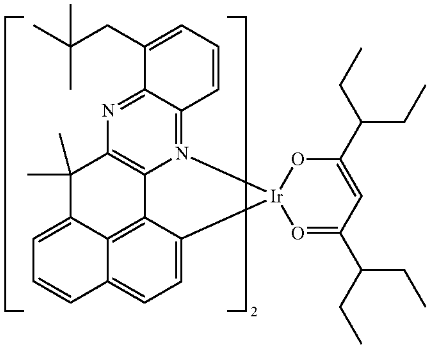
395
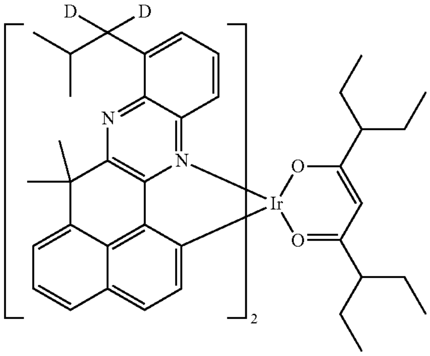
396
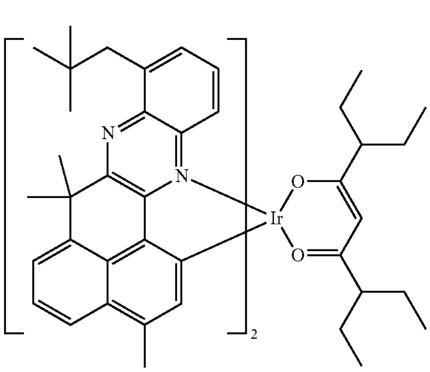

-continued
397
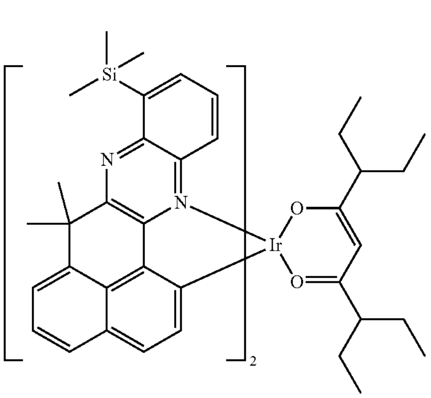
398
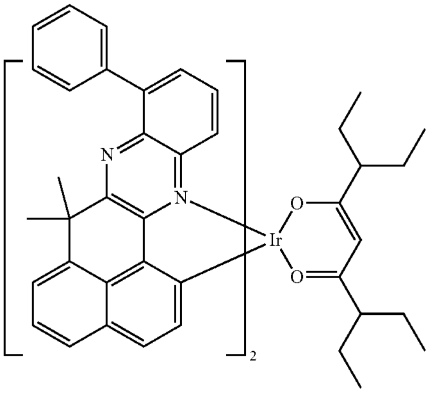
399
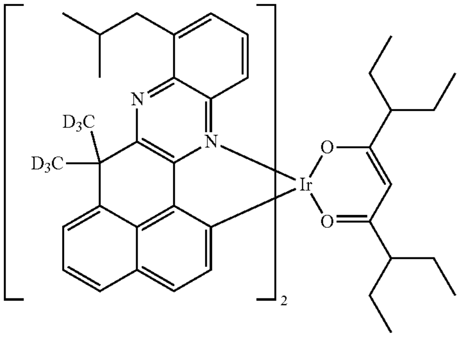
400
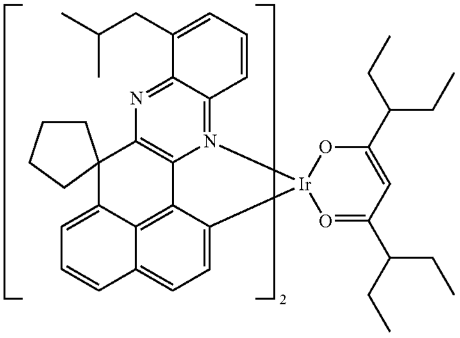
-continued
401
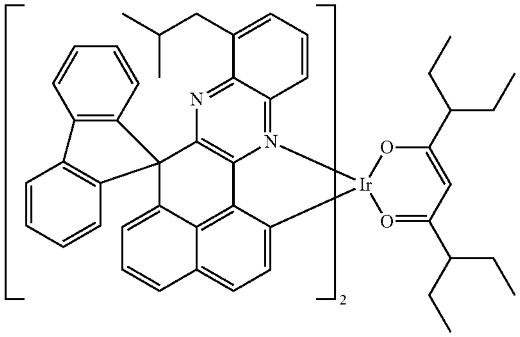
402
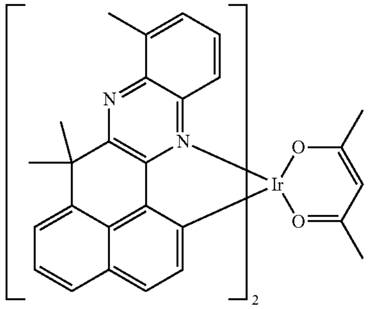
403
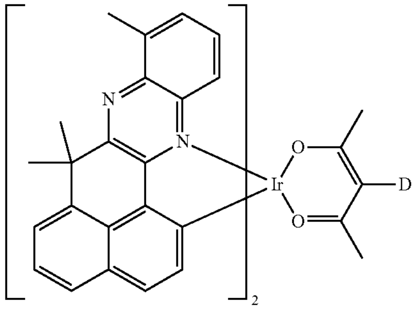
404
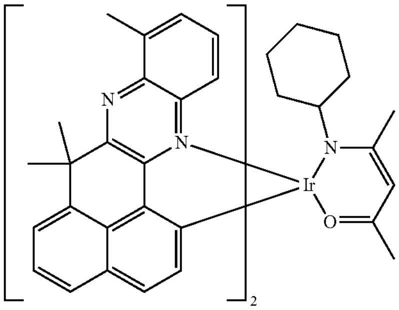
405
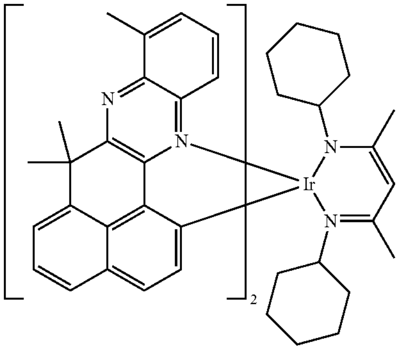

-continued
406
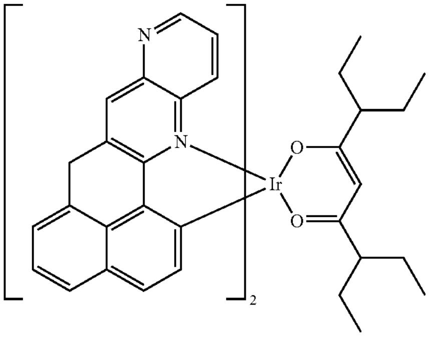
407
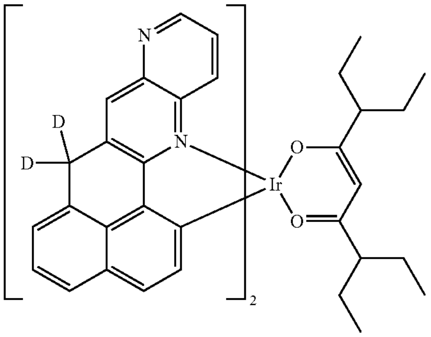
408
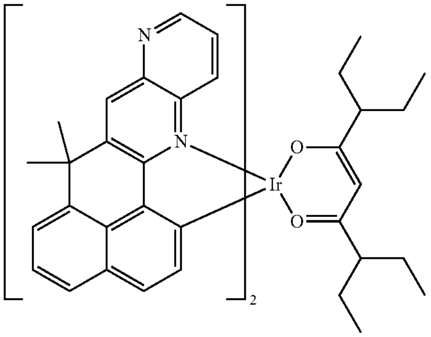
409
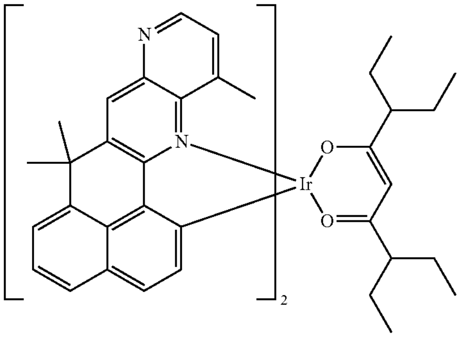
-continued
410
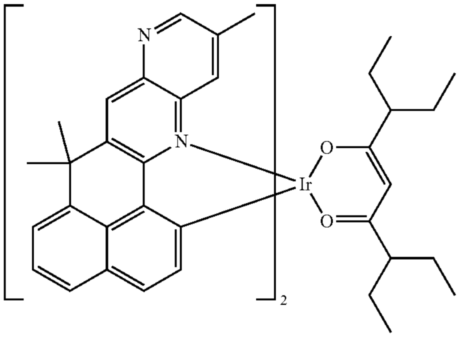
411
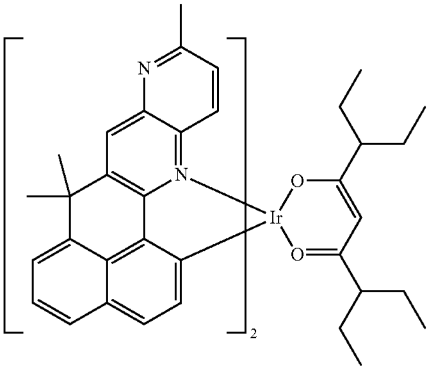
412
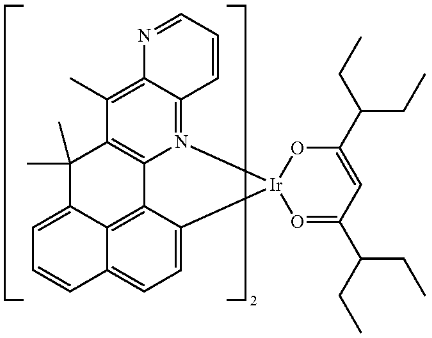
413
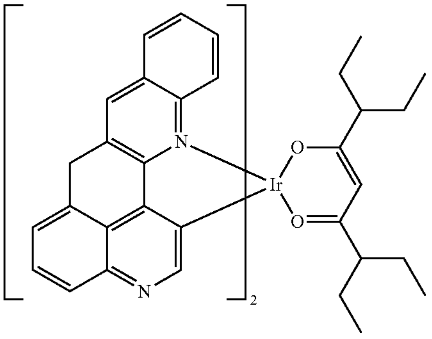

-continued
414
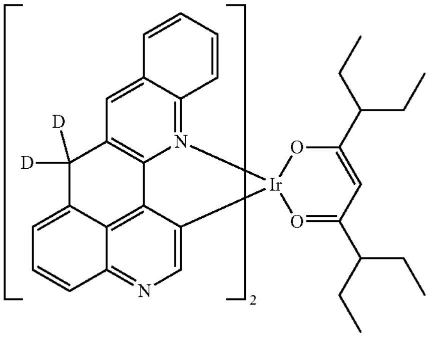
415
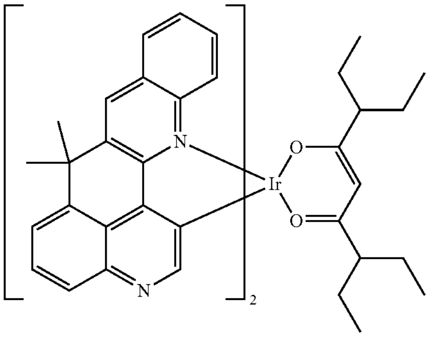
416
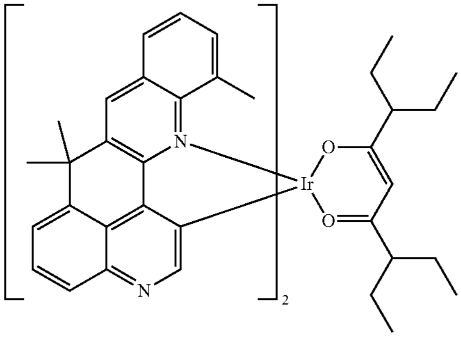
417
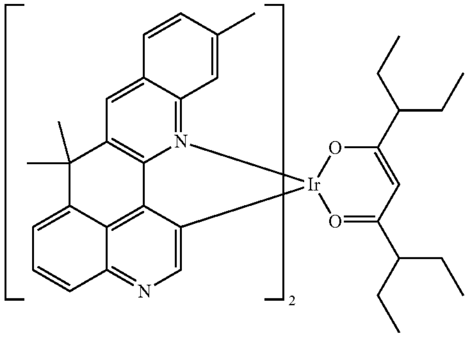
-continued
418
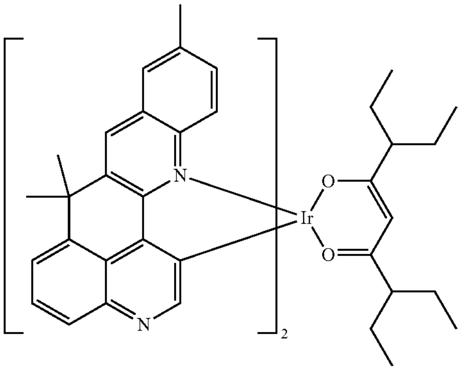
419
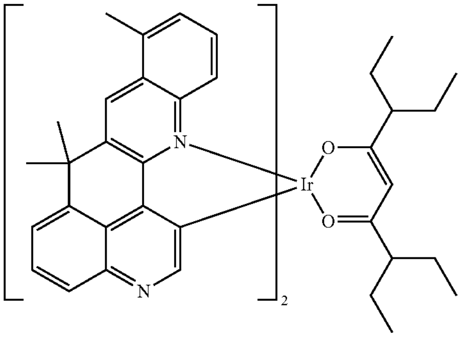
420
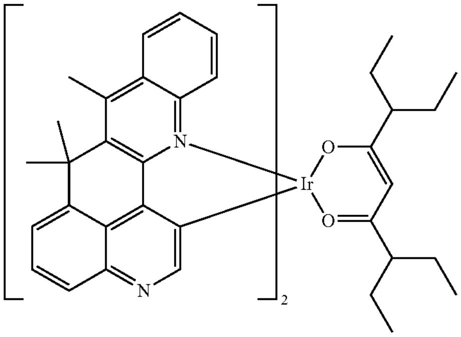
421
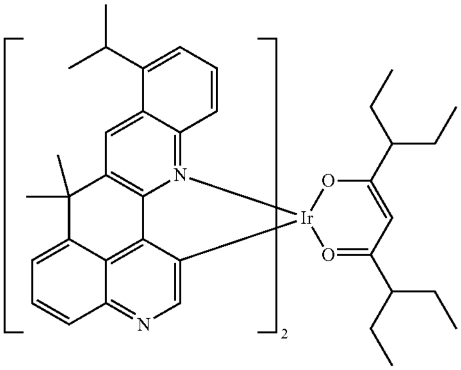

-continued
422
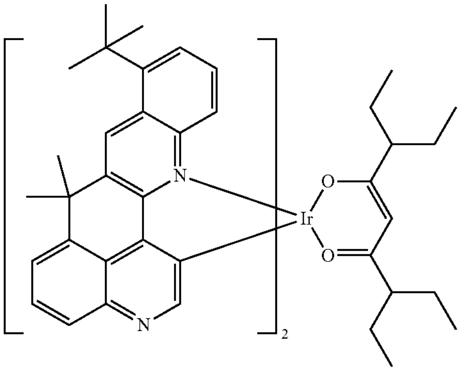
423
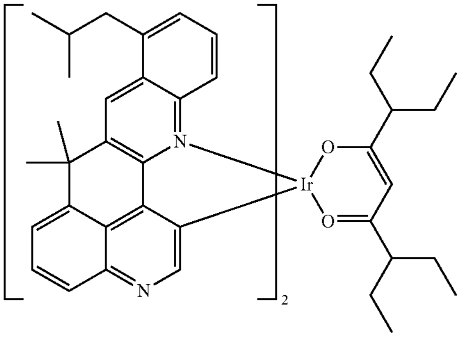
424
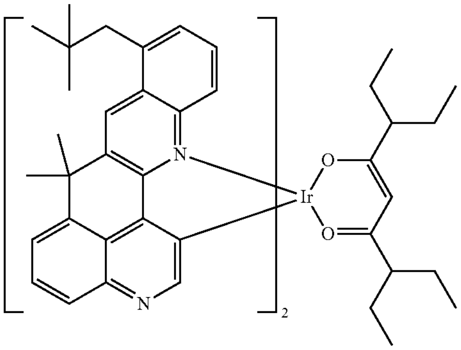
425
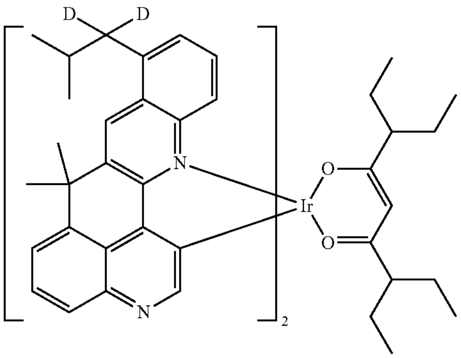
-continued
426
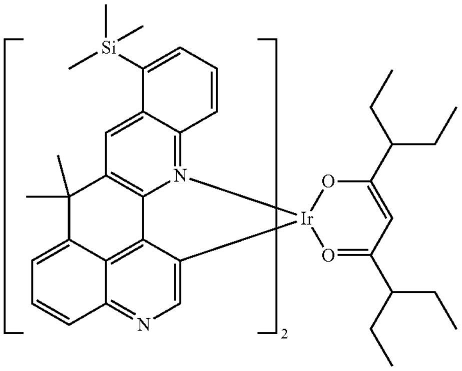
427
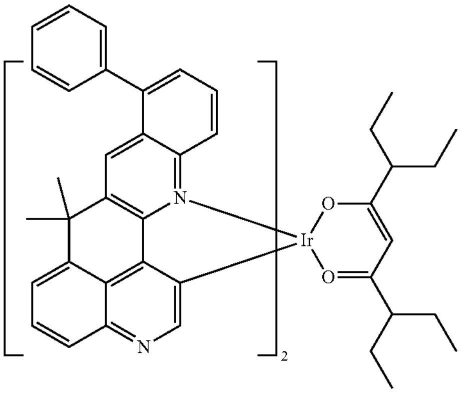
428
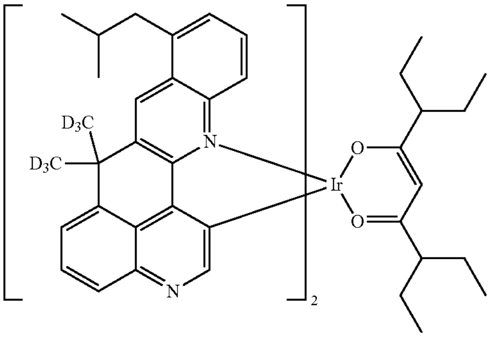
429
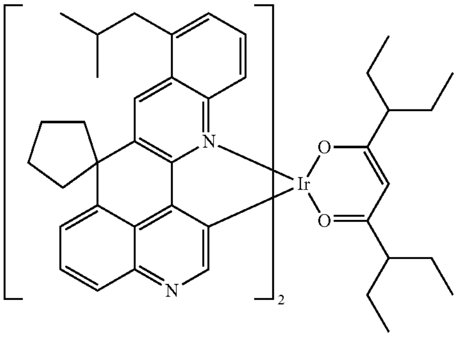

-continued
430
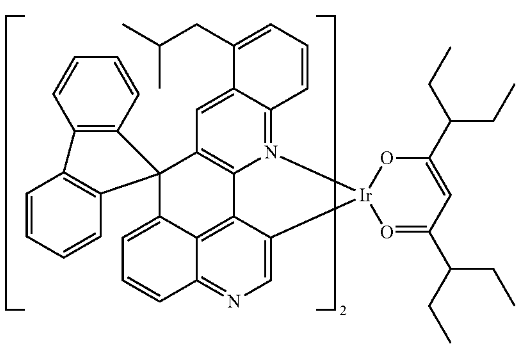
431
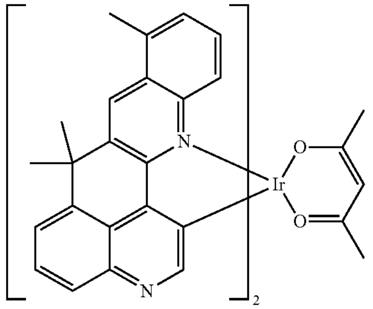
432
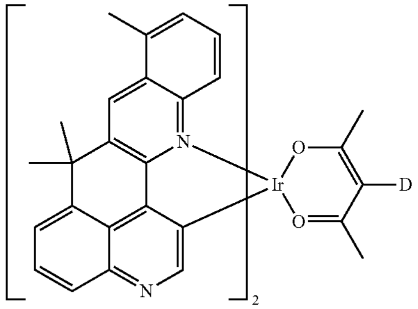
433
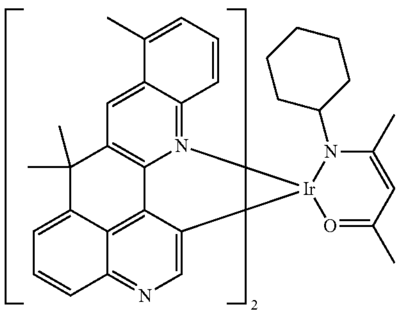
-continued
434
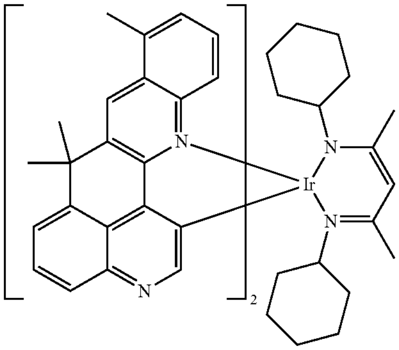
435
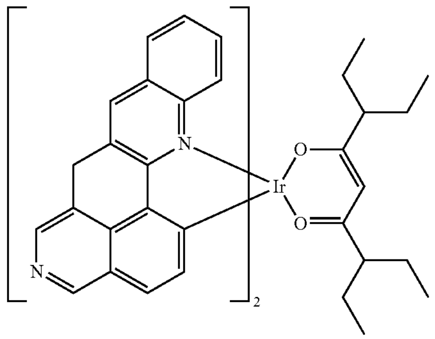
436
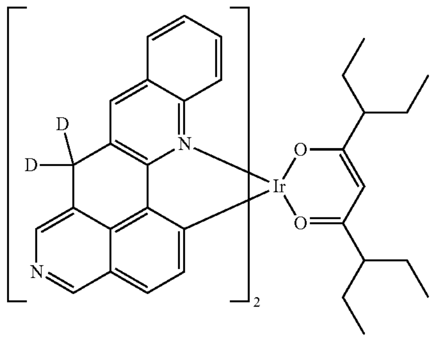
437
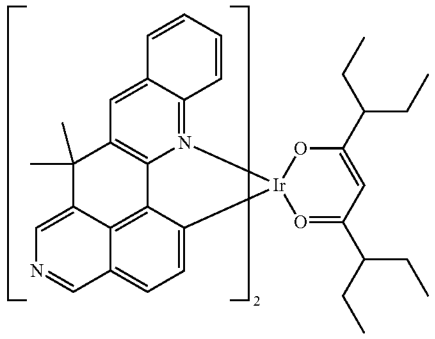

-continued
438
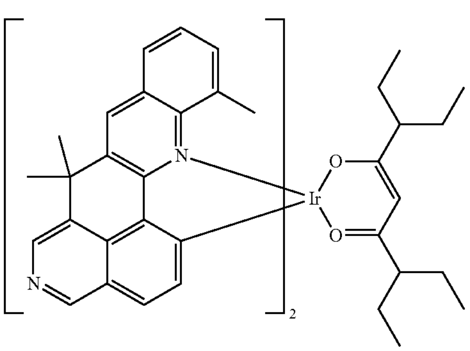
439
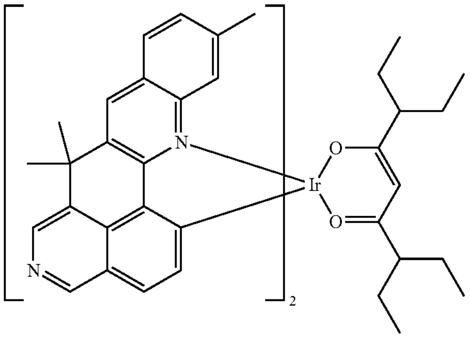
440
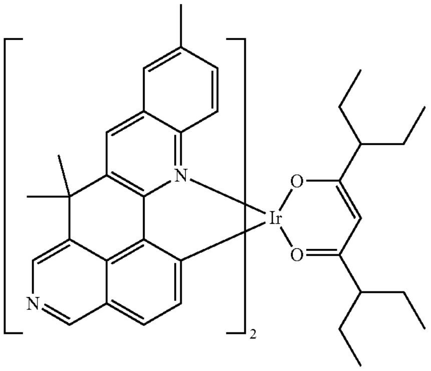
441
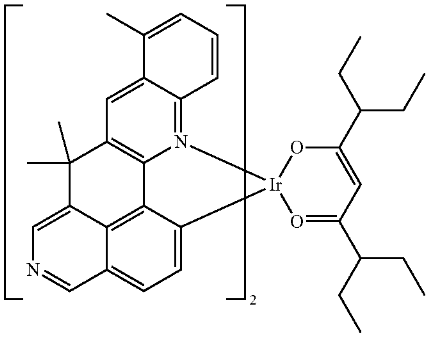
-continued
442
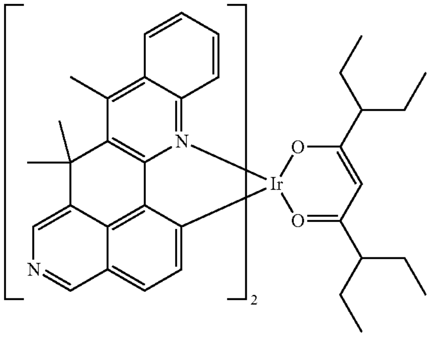
443
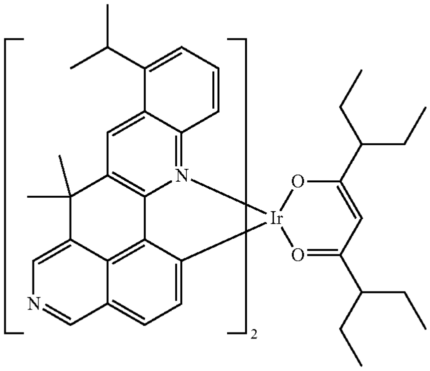
444
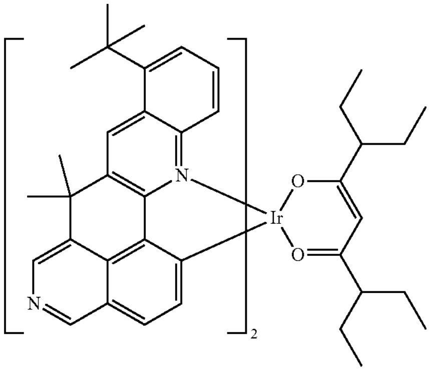
445
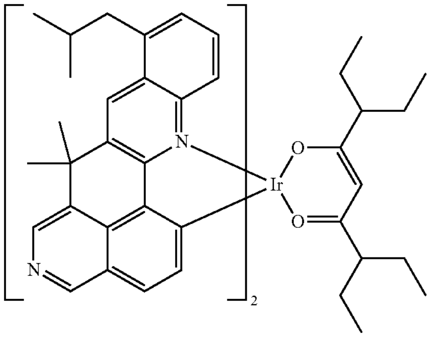

-continued
446
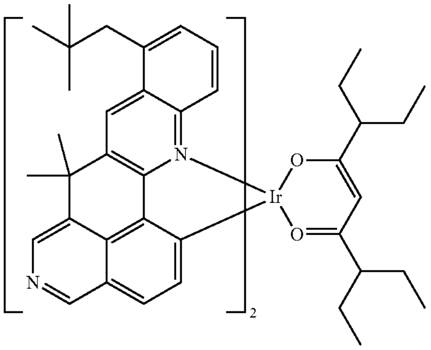
447
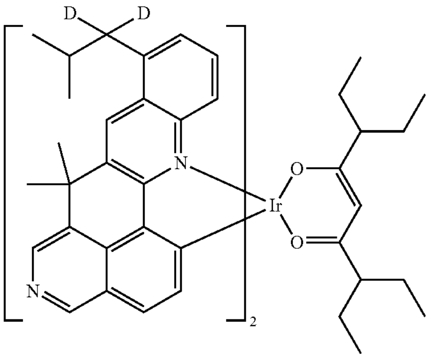
448
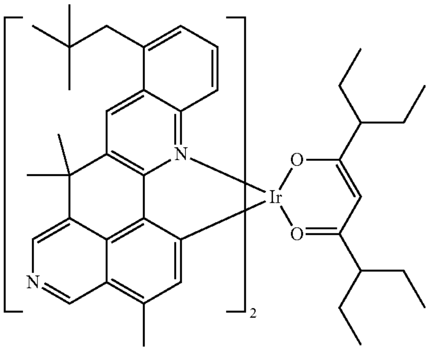
449
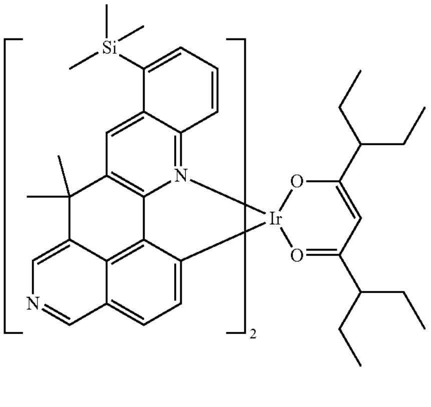
-continued
450
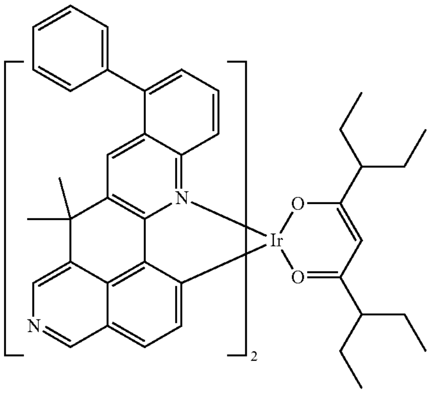
451
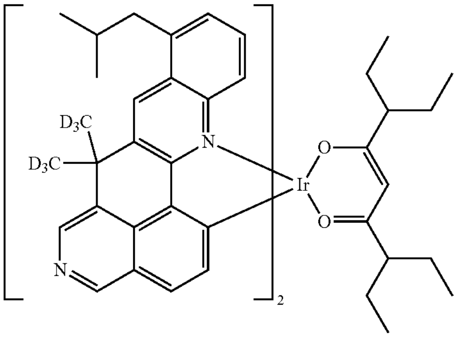
452
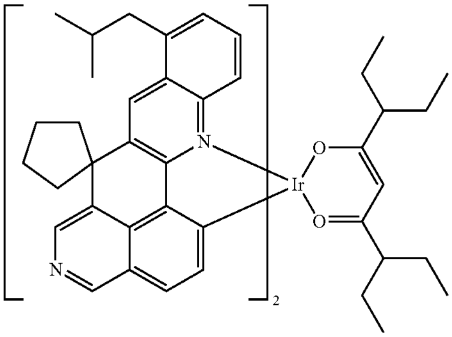
453
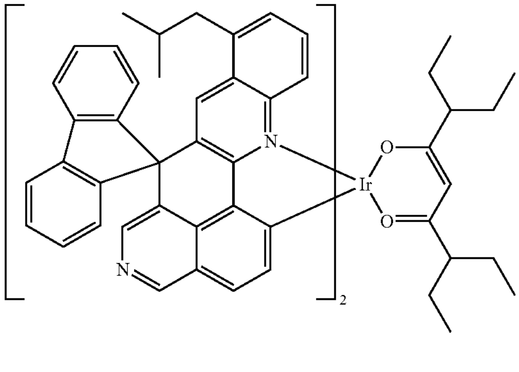

-continued
454
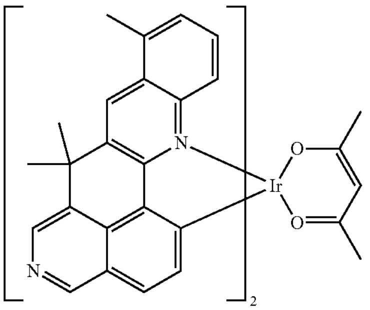
455
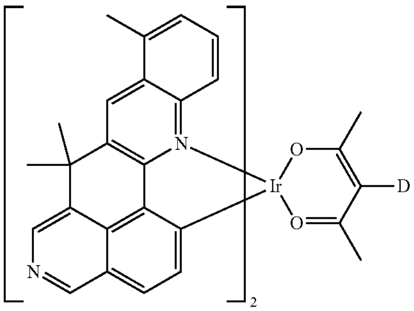
456
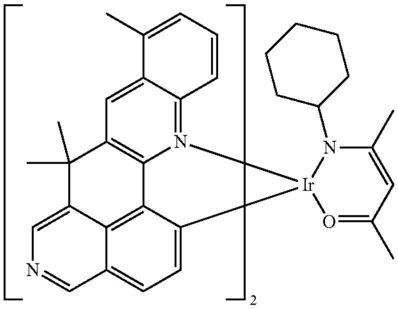
457
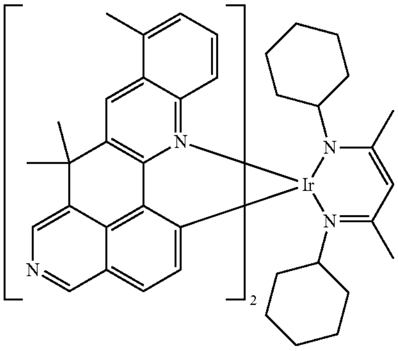
-continued
458
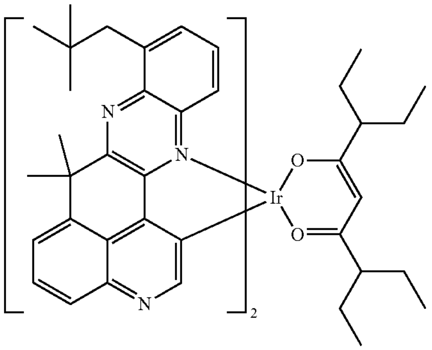
459
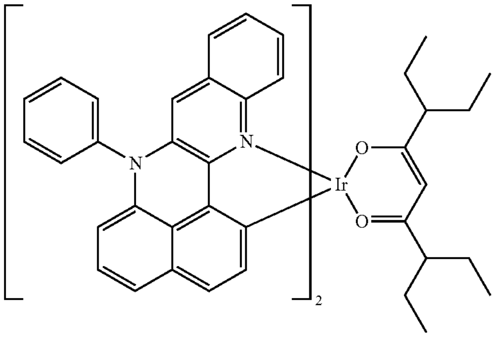
460
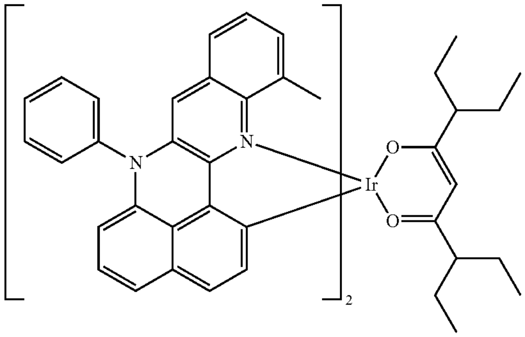
461
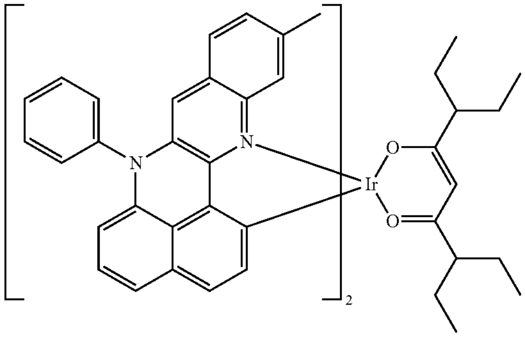

-continued
462
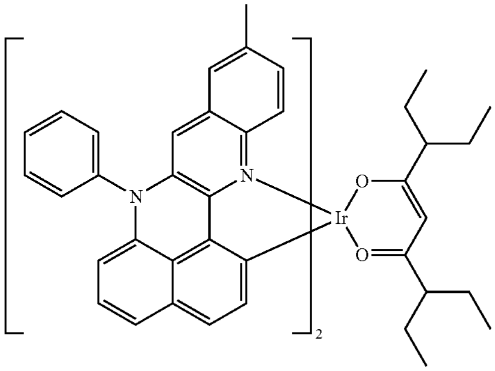
463
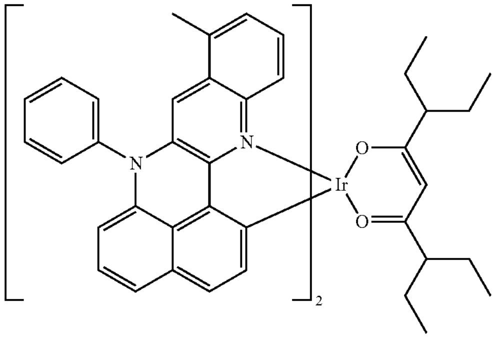
464
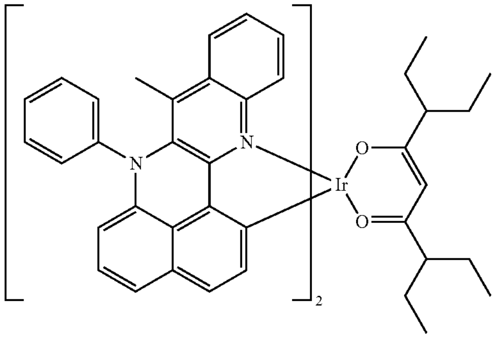
465
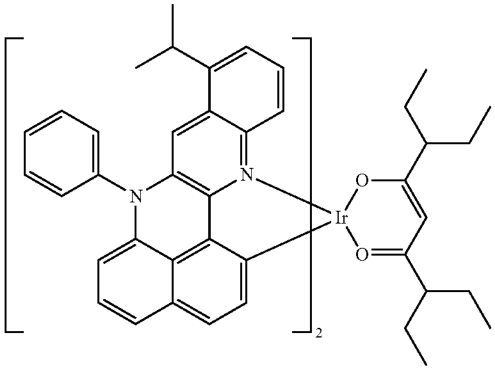
-continued
466
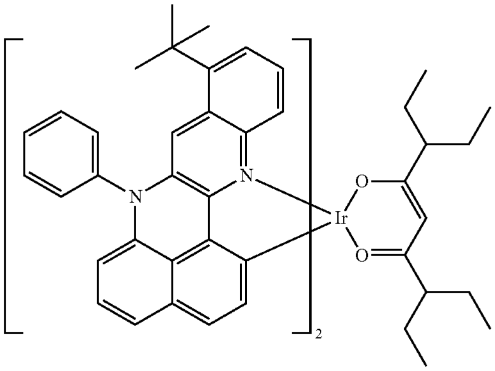
467
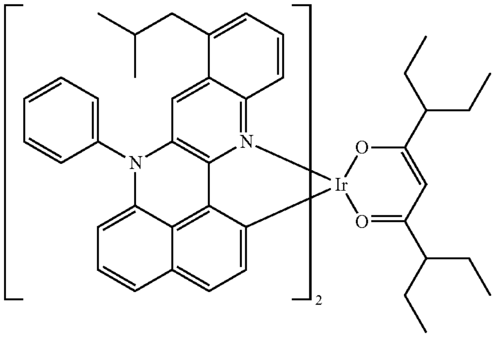
468
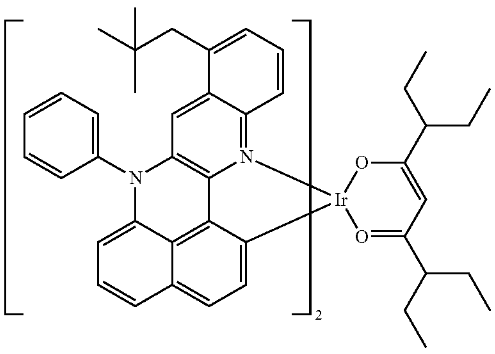
469
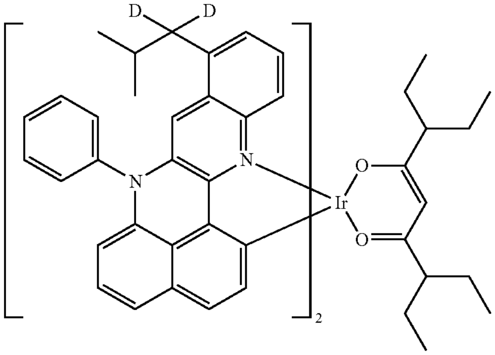

-continued
470
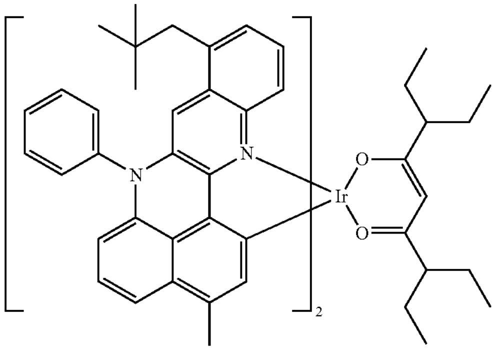
471
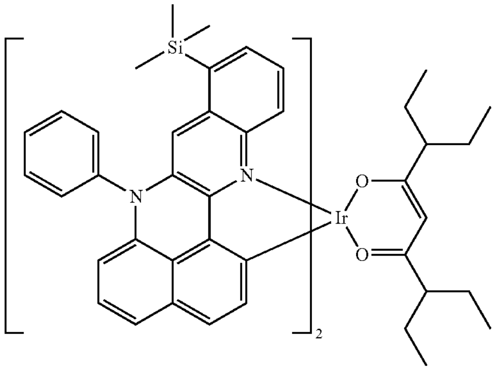
472
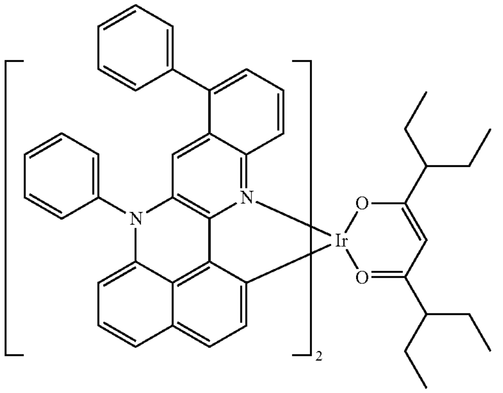
473
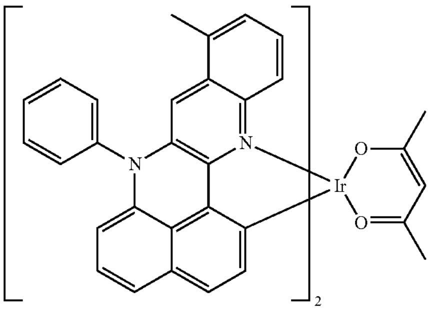
-continued
474
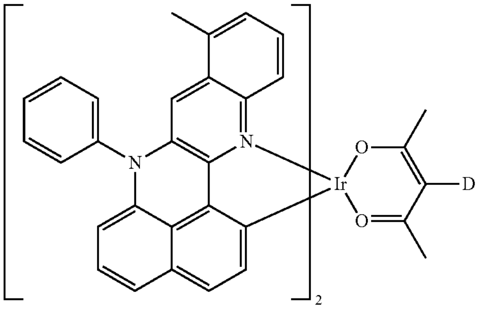
475
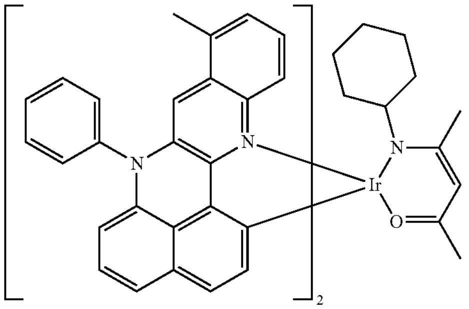
476
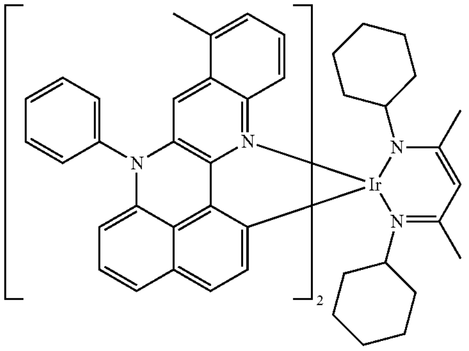
477
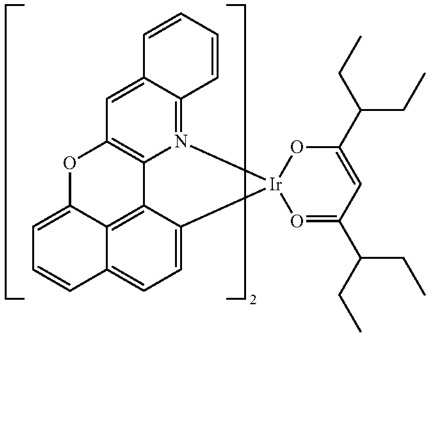

478
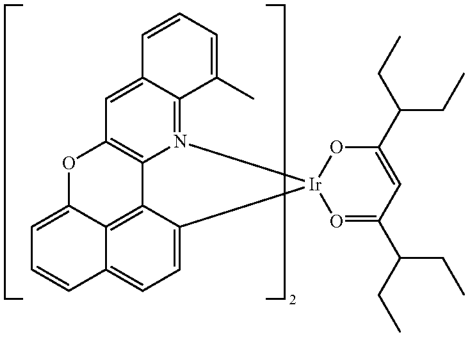
479
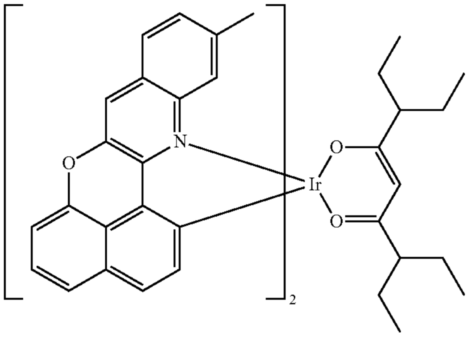
480
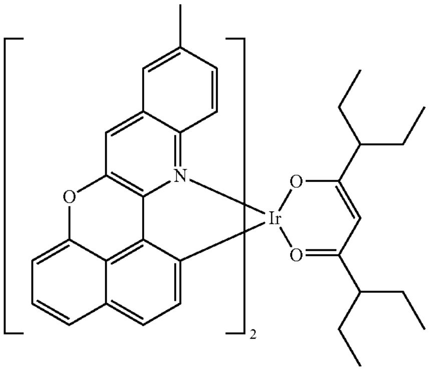
481
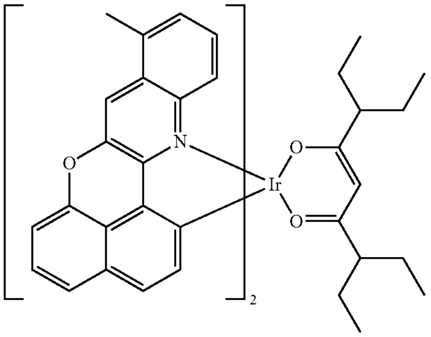
482
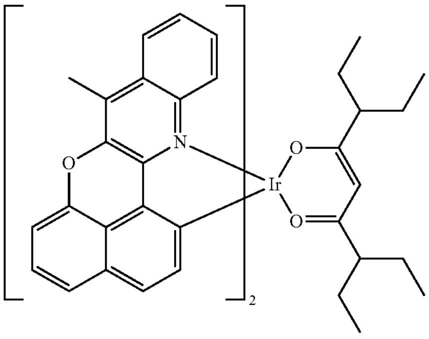
483
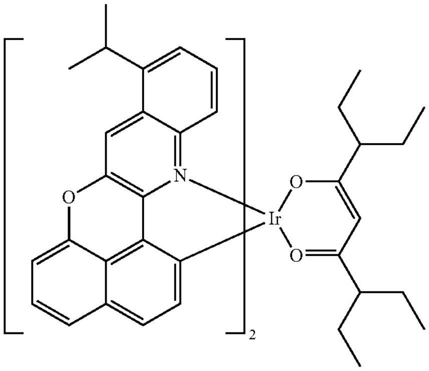
484
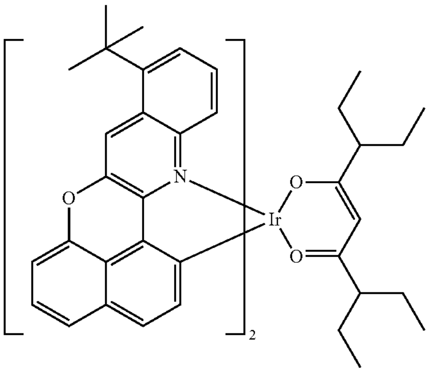
485
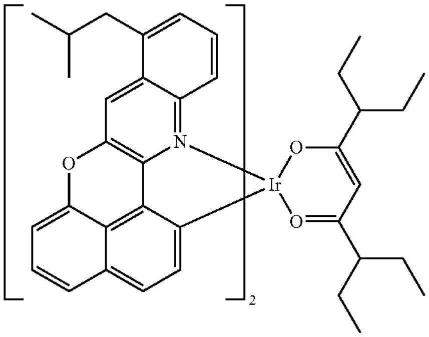

486
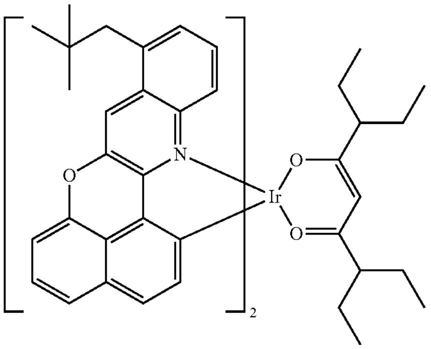
487
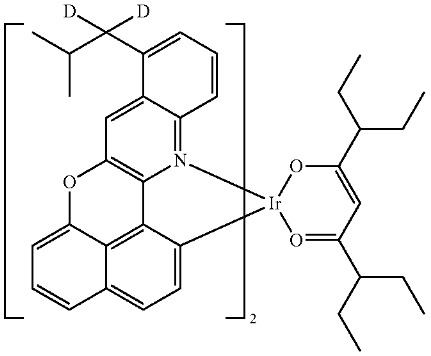
488
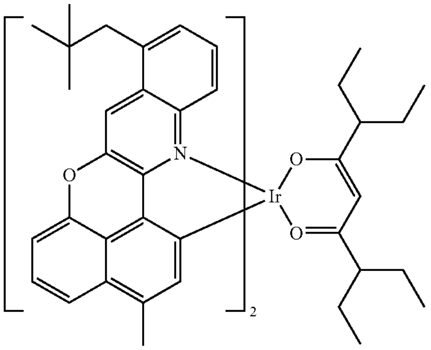
489
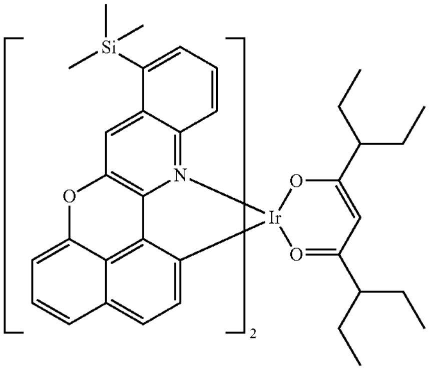
490
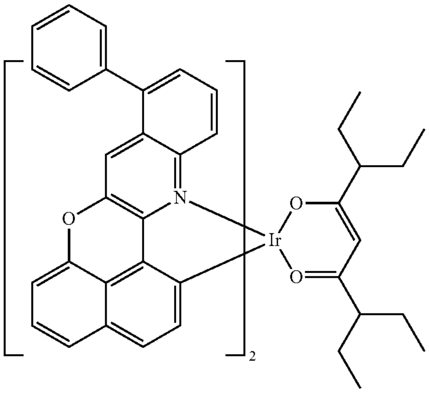
491
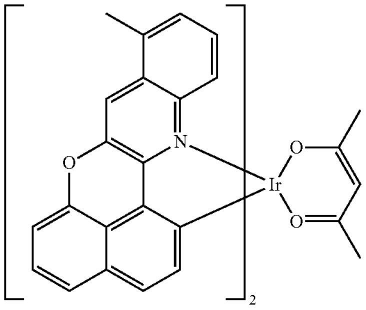
492
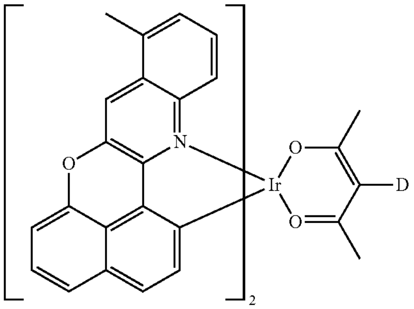
493
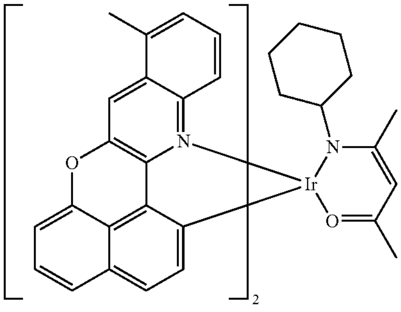

-continued
494
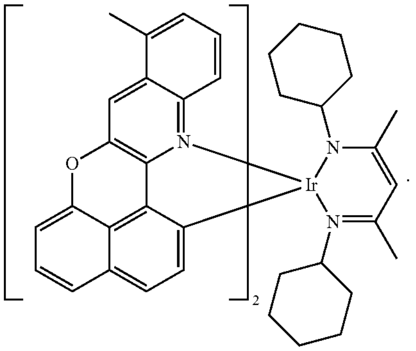
10. The organic metal compound of claim 1, wherein the organic metal compound is selected from the following compounds:
495
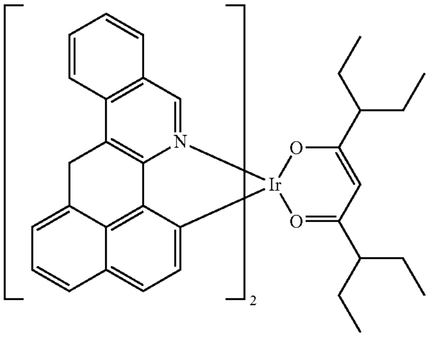
496
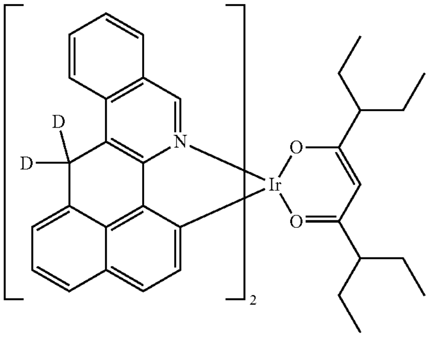
497
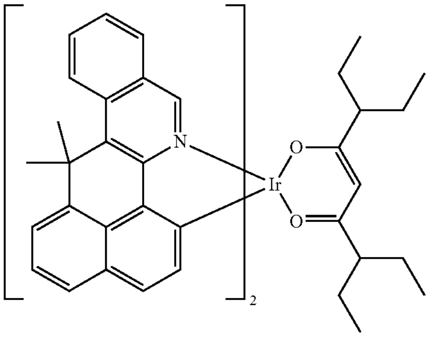
-continued
498
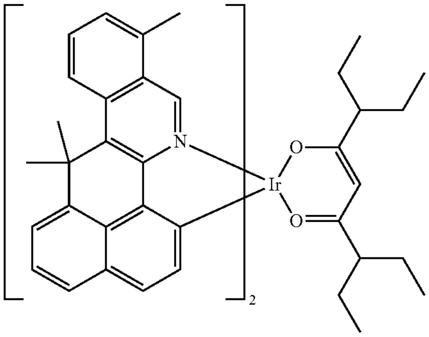
499
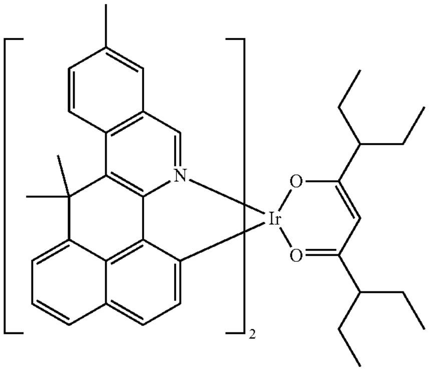
500
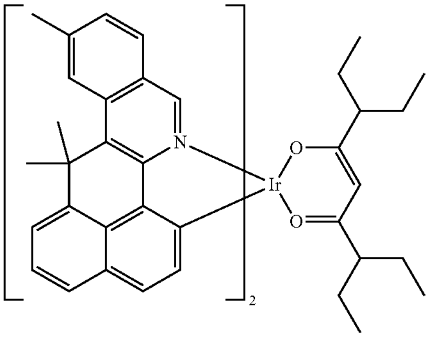
501
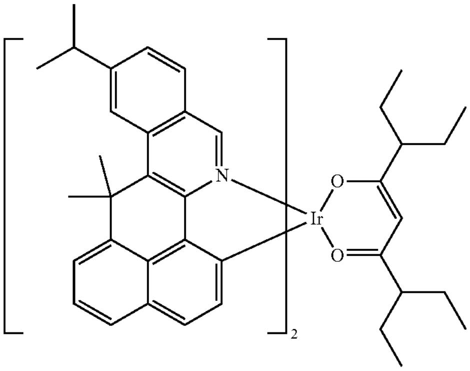

-continued
502
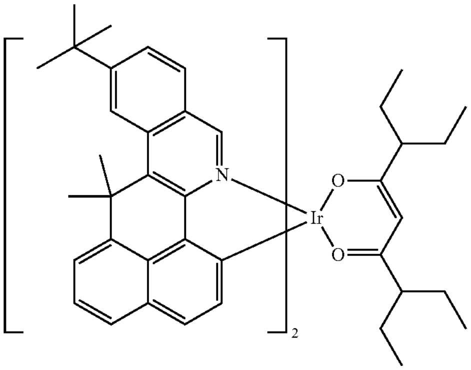
503
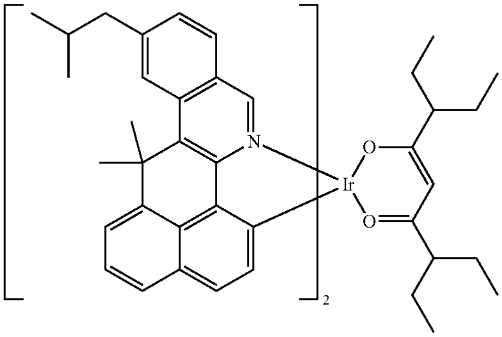
504
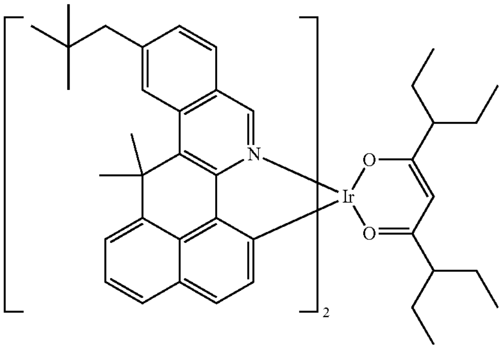
505
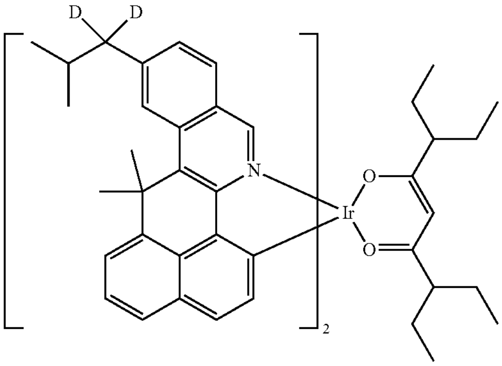
-continued
506
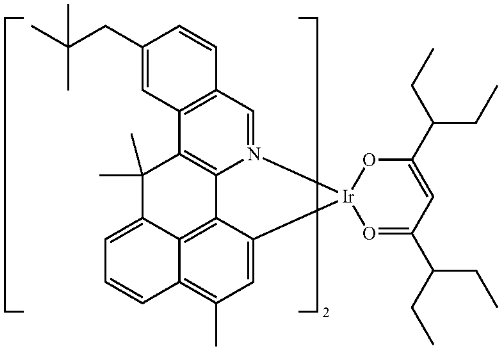
507
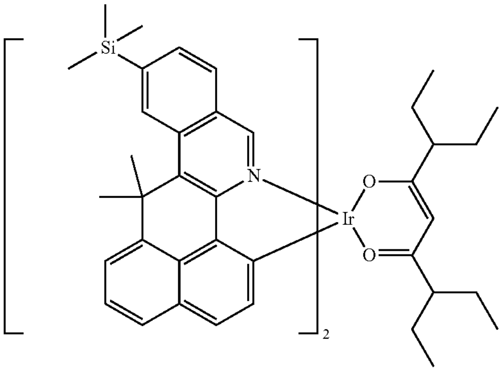
508
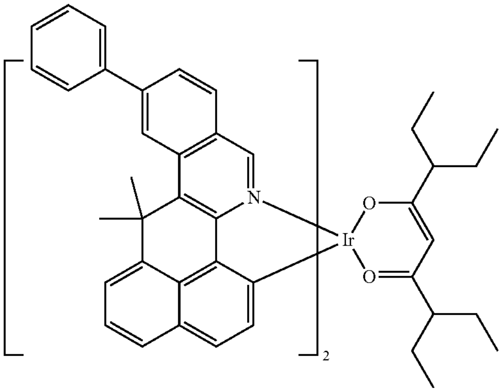
509
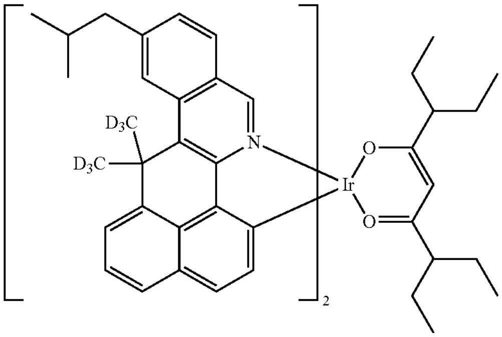

-continued
510
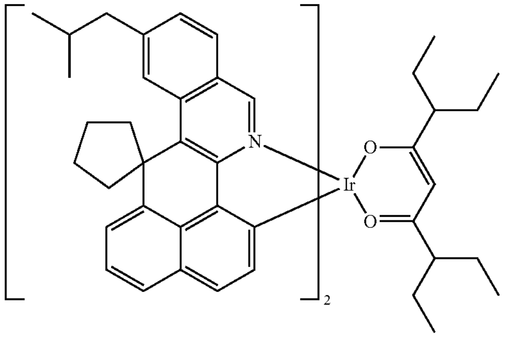
511
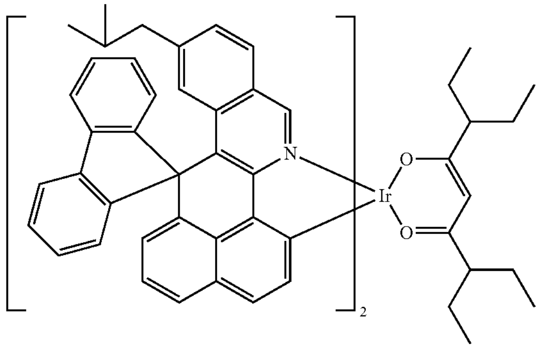
512
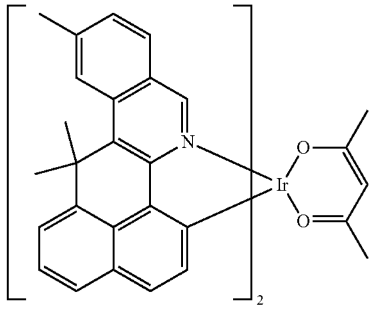
513
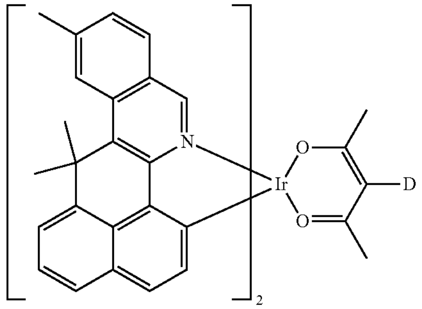
-continued
514
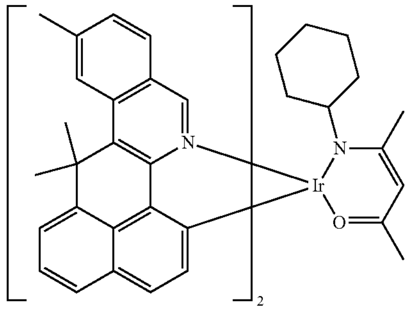
515
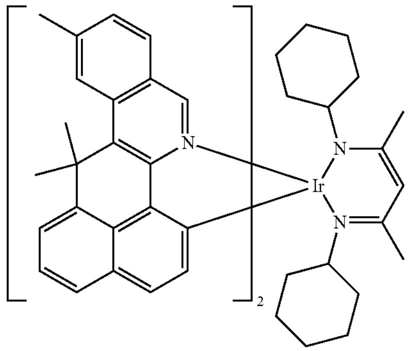
516
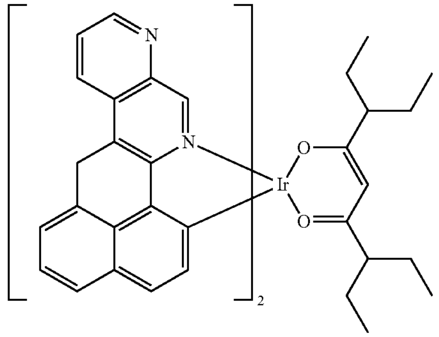
517
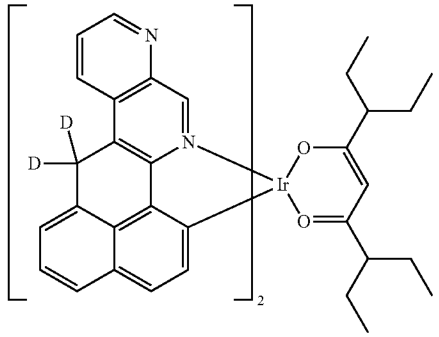

-continued
518
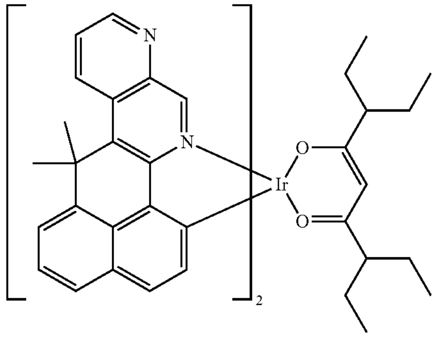
519
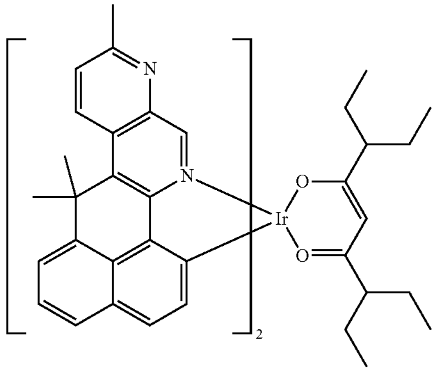
520
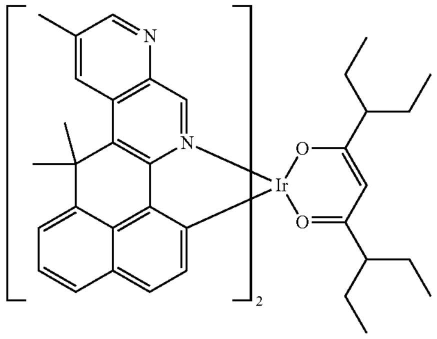
521
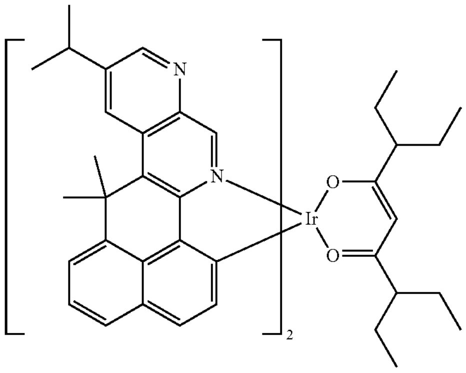
-continued
522
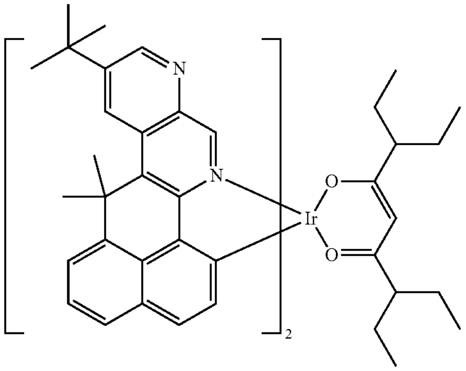
523
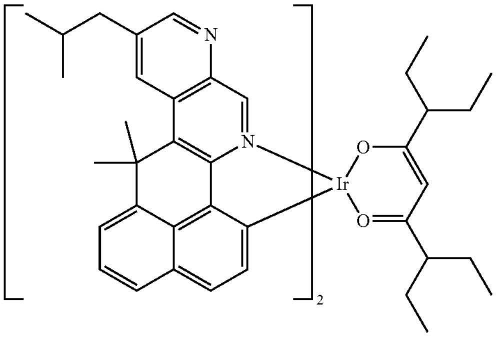
524
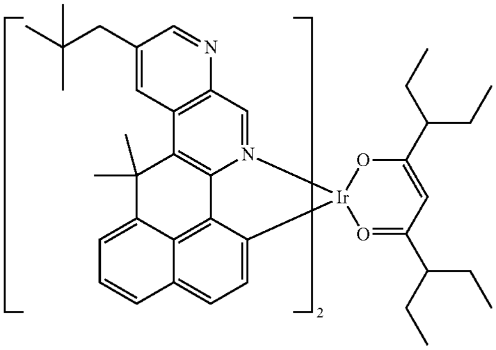
525
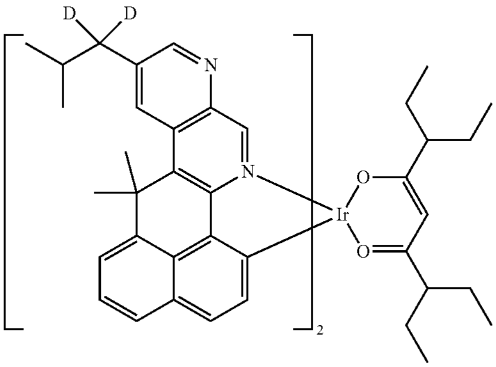

-continued
526
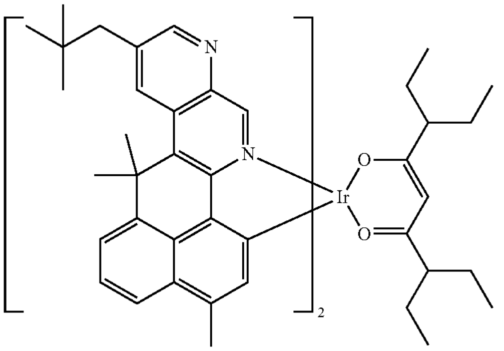
527
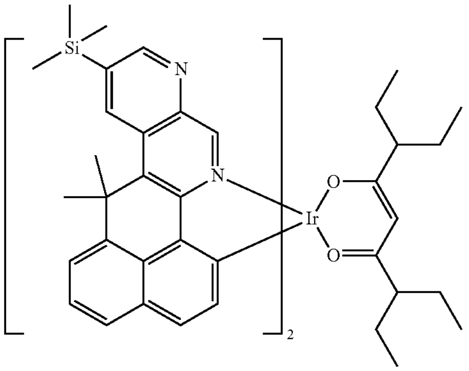
528
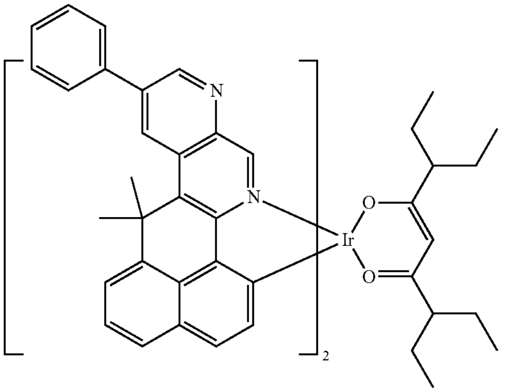
529
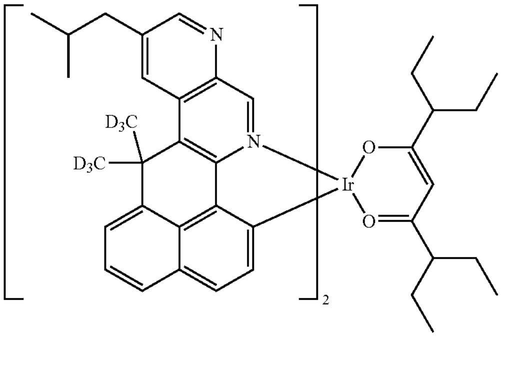
-continued
530
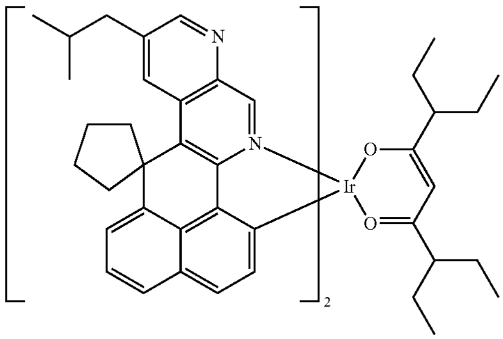
531
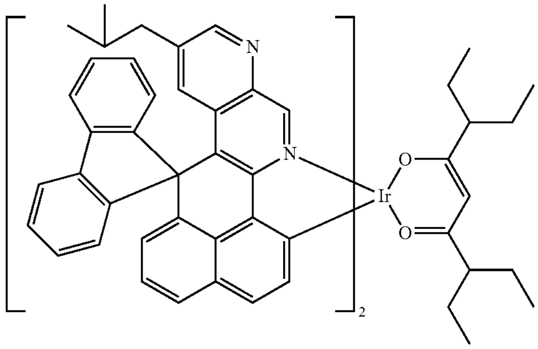
532
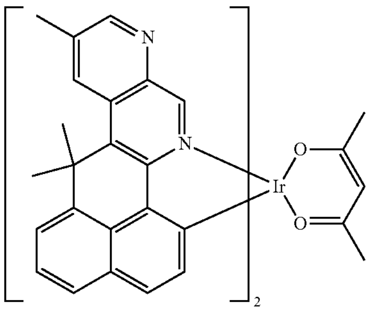
533
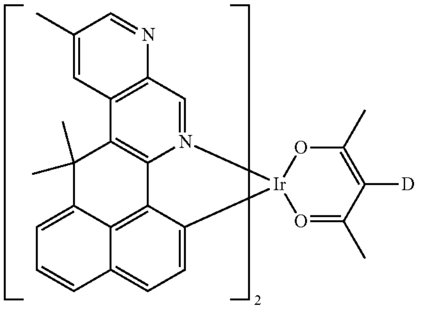

-continued
534
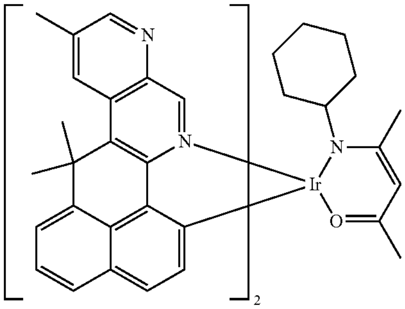
535
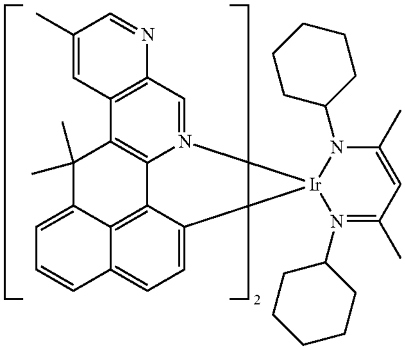
536
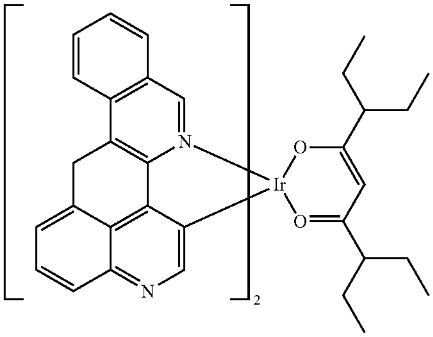
537
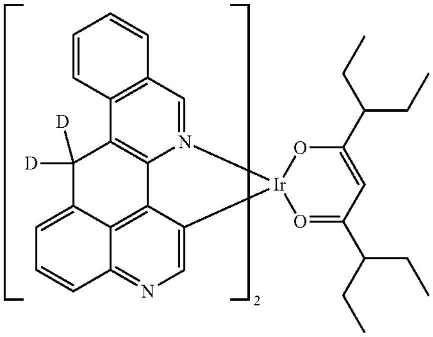
-continued
538
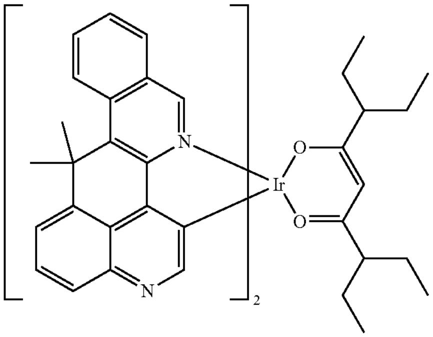
539
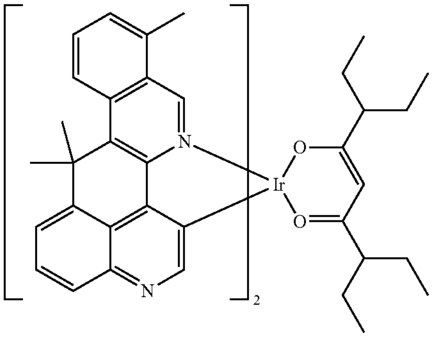
540
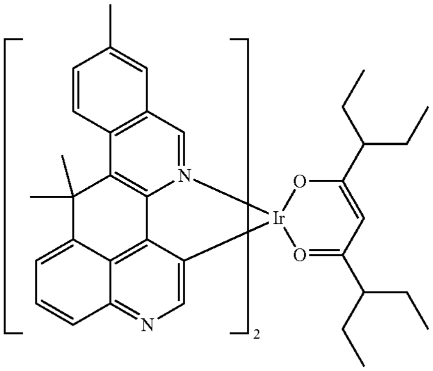
541
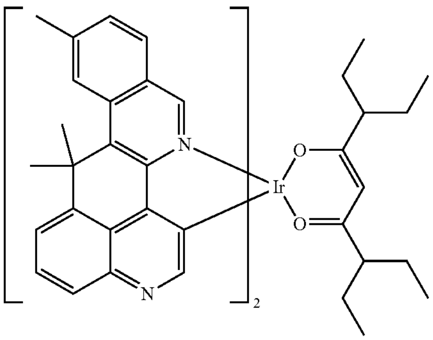

542
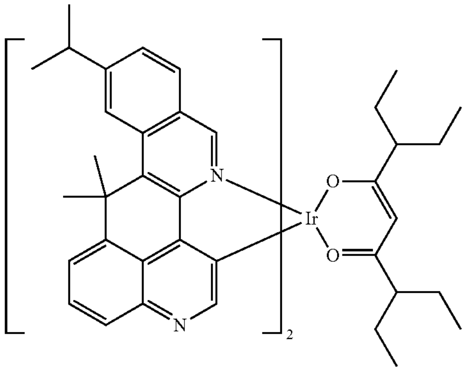
543
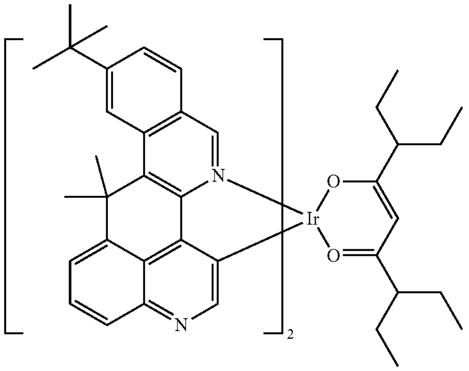
544
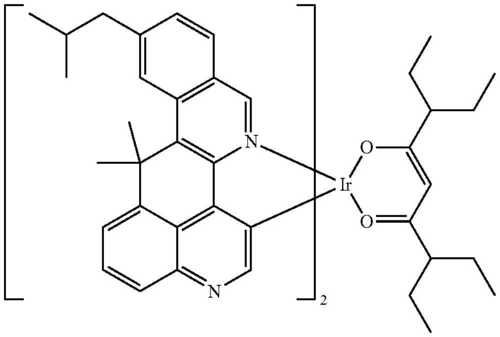
545
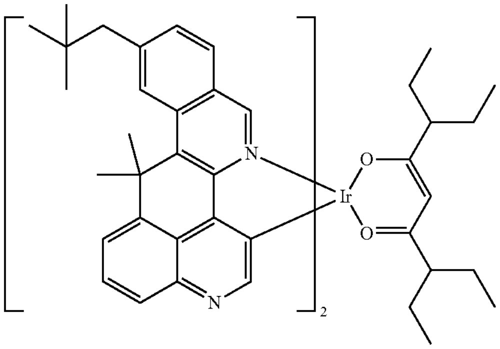
546
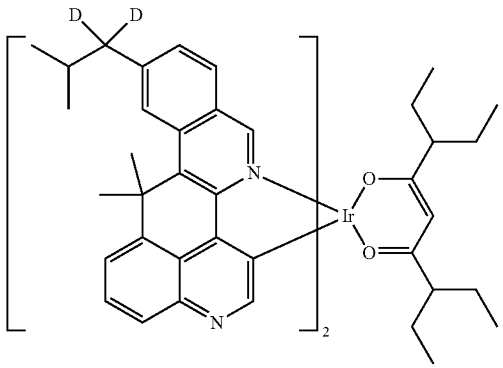
547
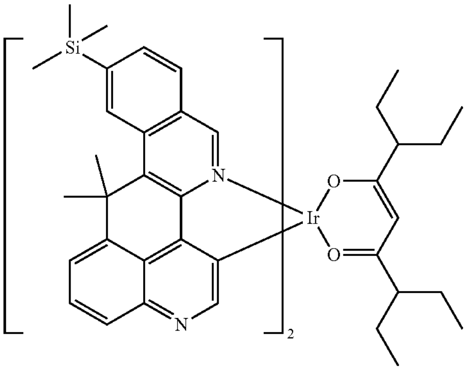
548
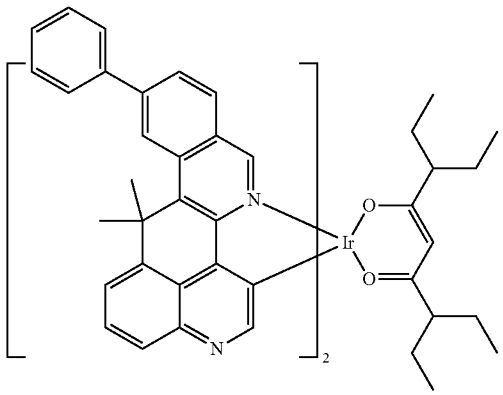
549
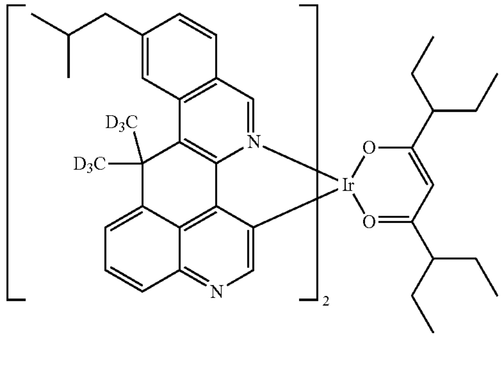

-continued
550
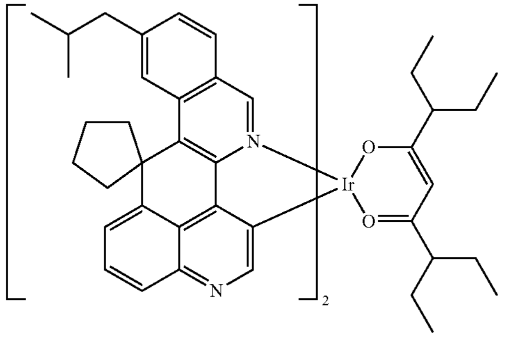
551
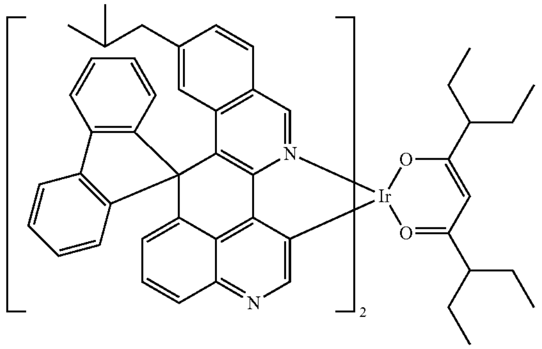
552
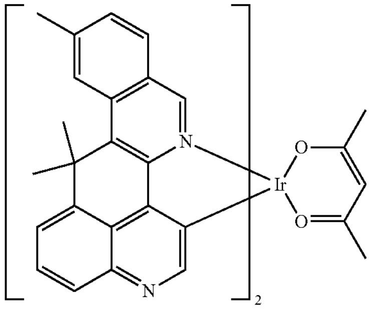
553
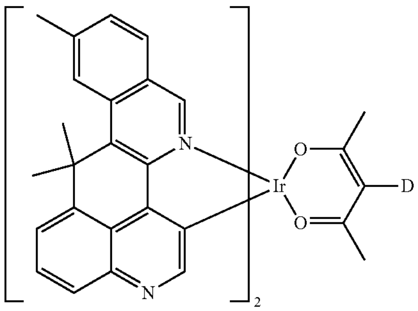
-continued
554
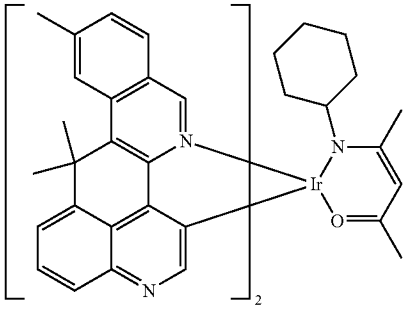
555
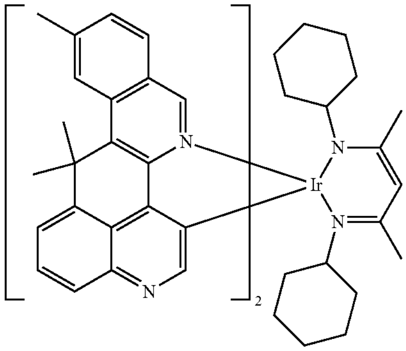
556
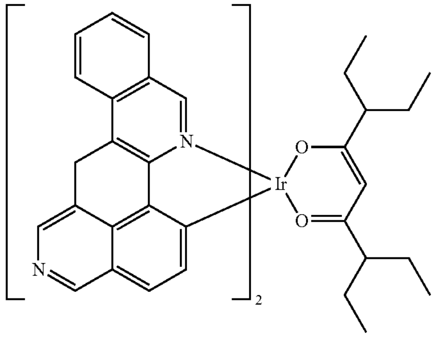
557
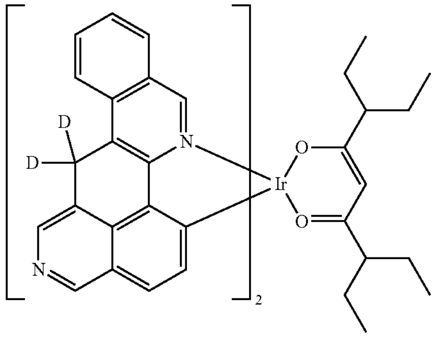

-continued
558
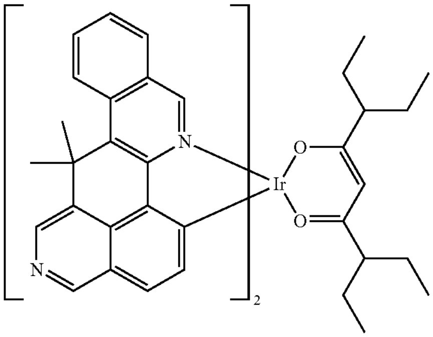
559
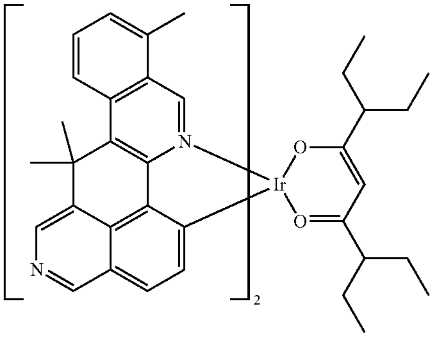
560
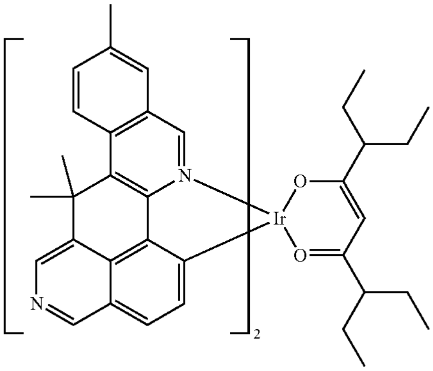
561
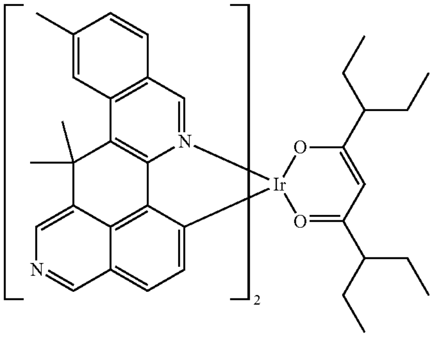
-continued
562
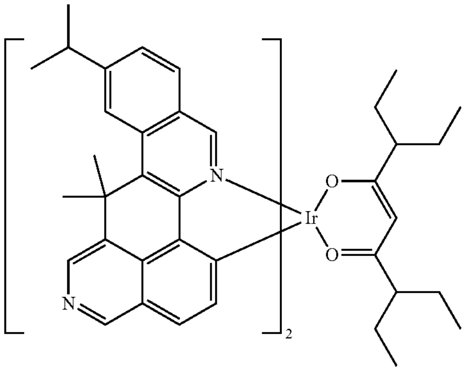
563
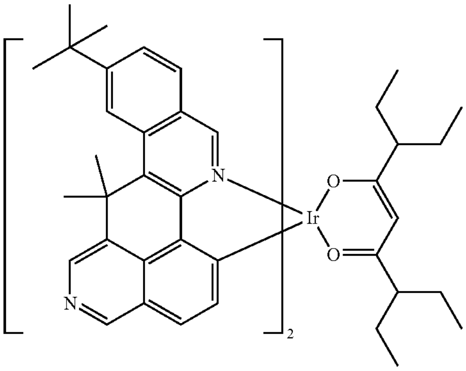
564
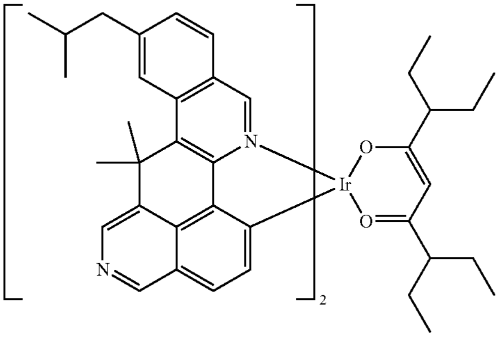
565
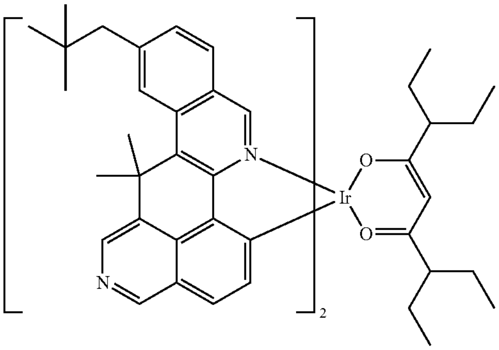

-continued
566
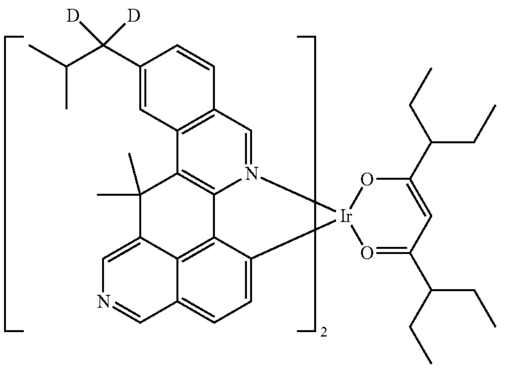
567
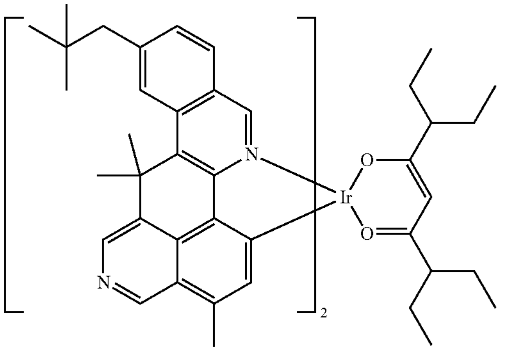
568
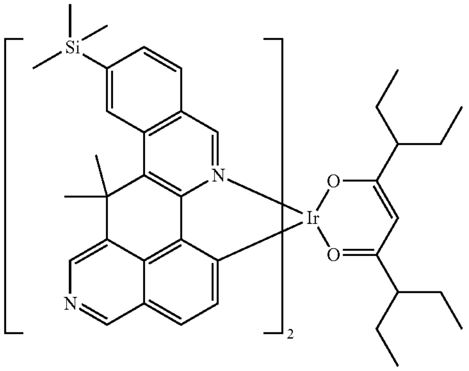
569
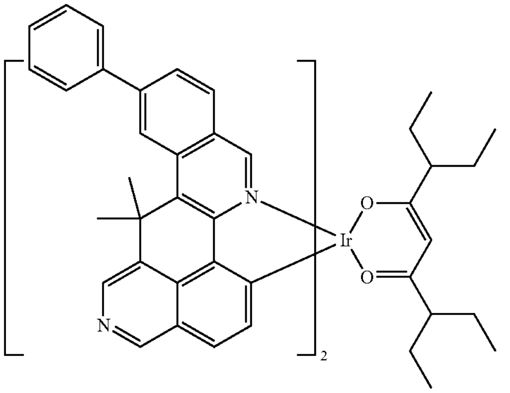
-continued
570
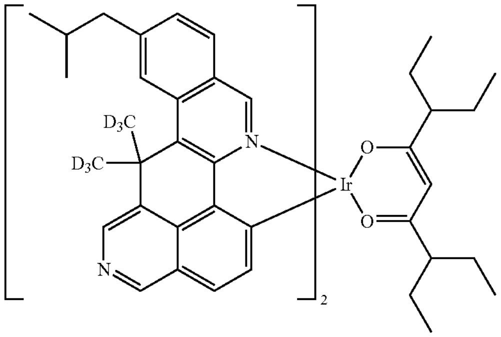
571
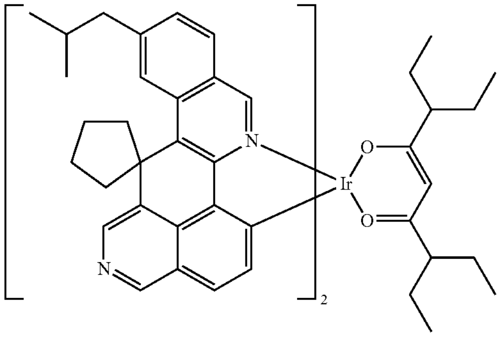
572
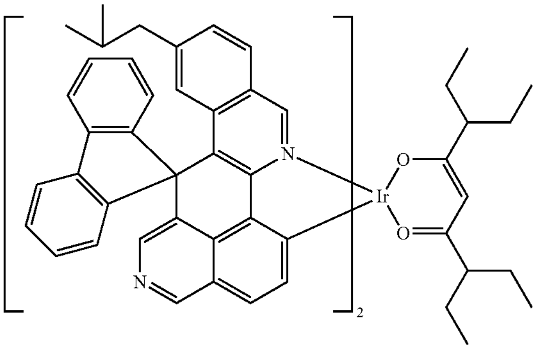
573
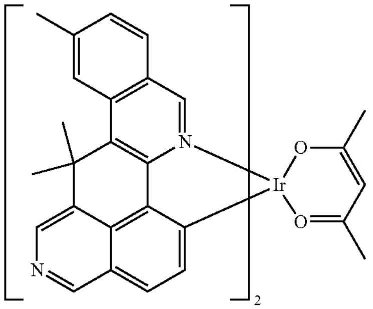

-continued
574
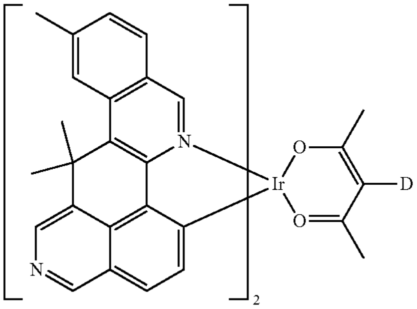
575
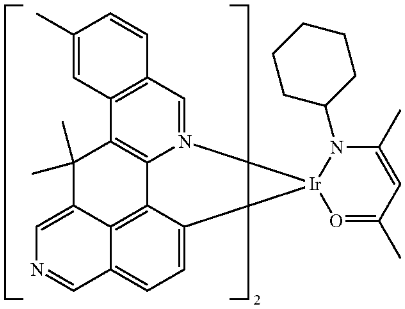
576
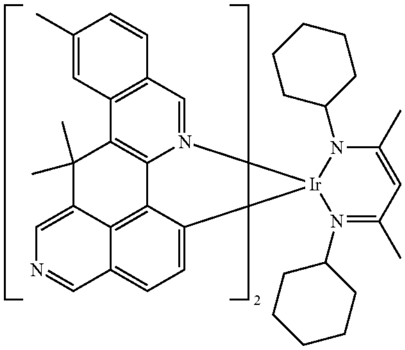
577
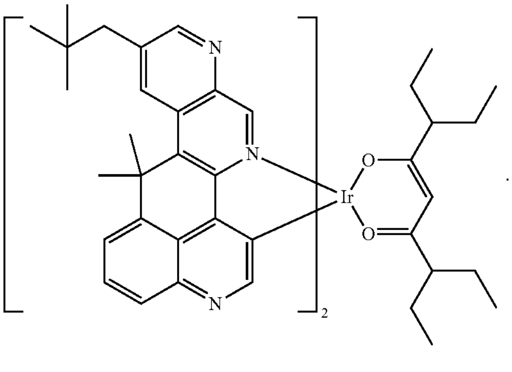
578
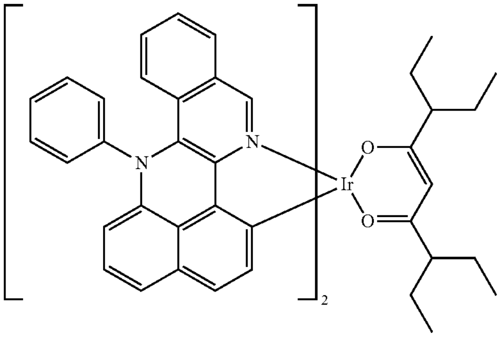
579
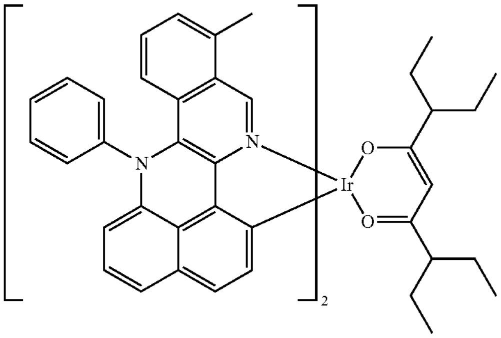
580
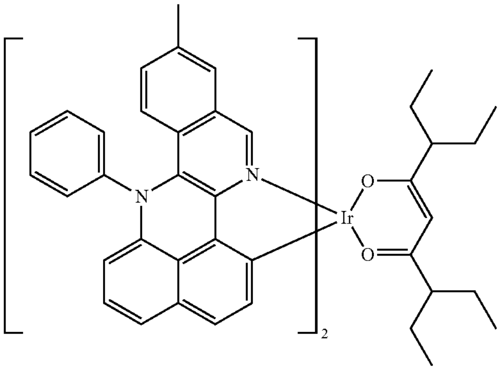
581
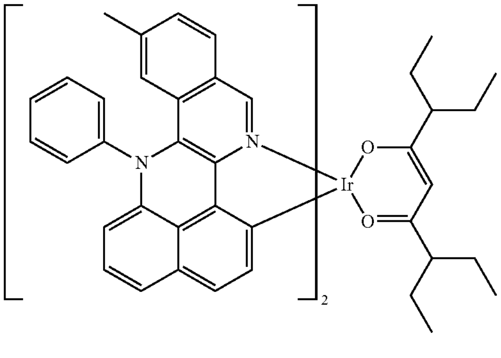
11. The organic metal compound of claim 1, wherein the organic metal compound is selected from the following compounds:

-continued
582
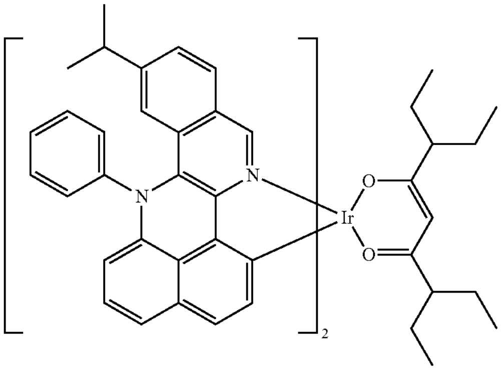
583
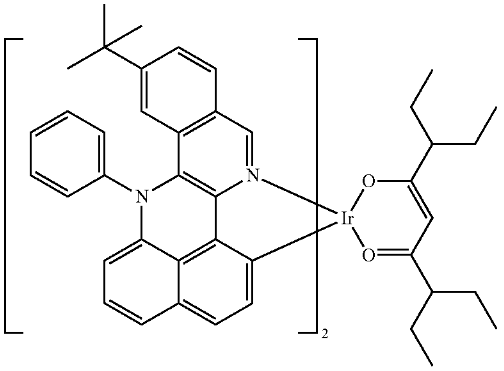
584
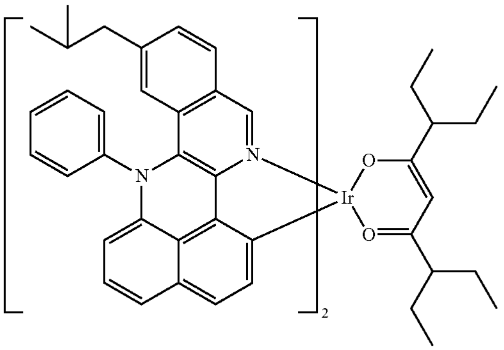
585
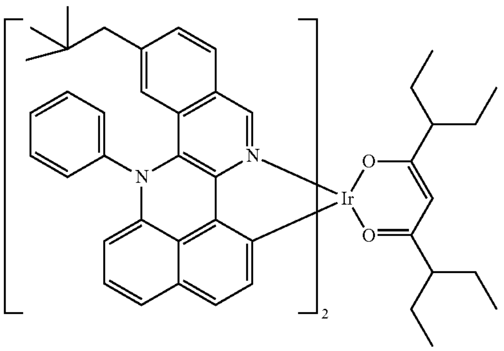
-continued
586
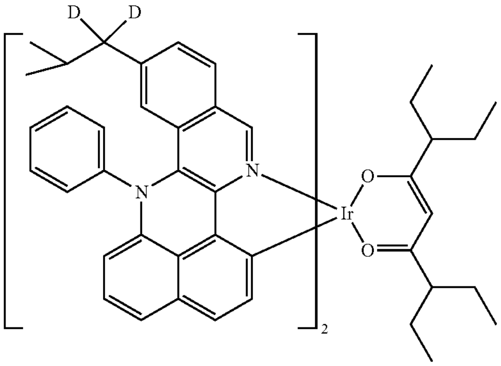
587
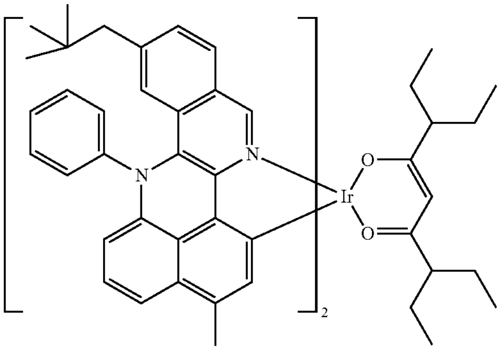
588
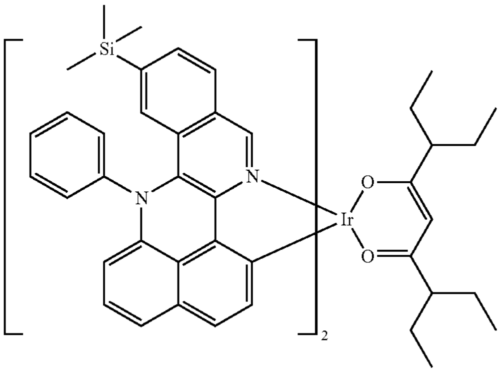
589
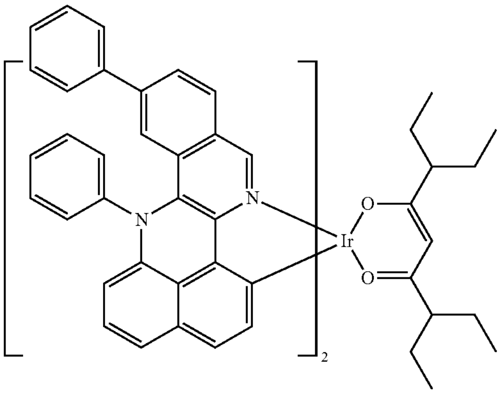

590
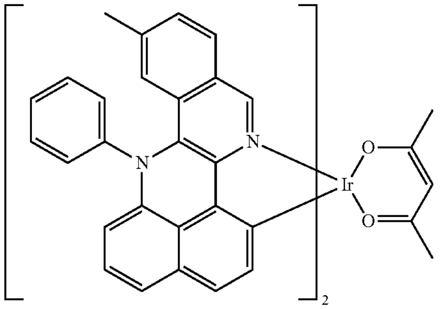
591
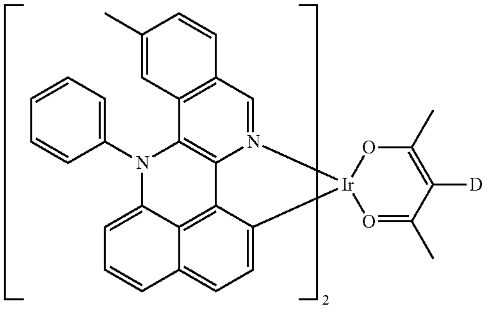
592
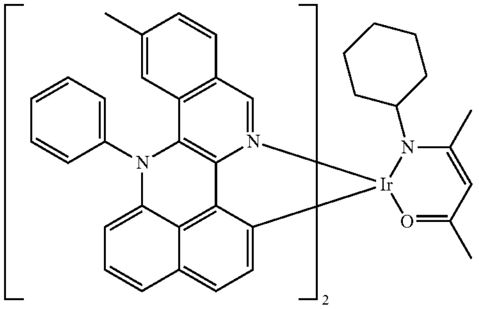
593
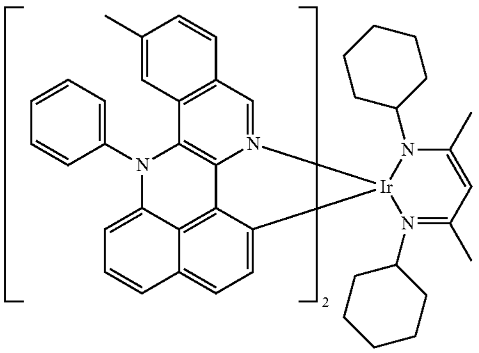
594
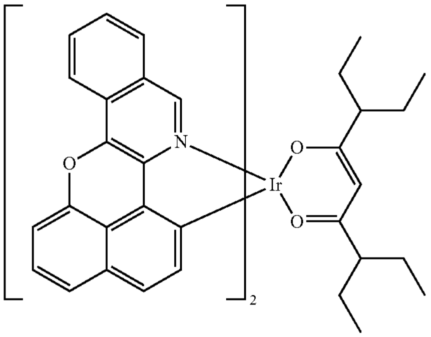
595
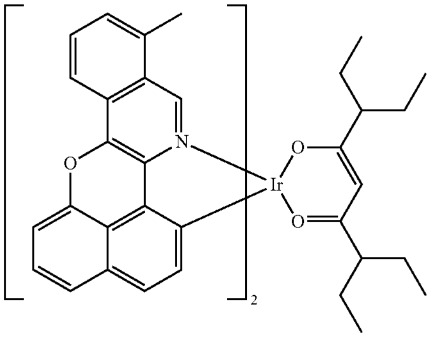
596
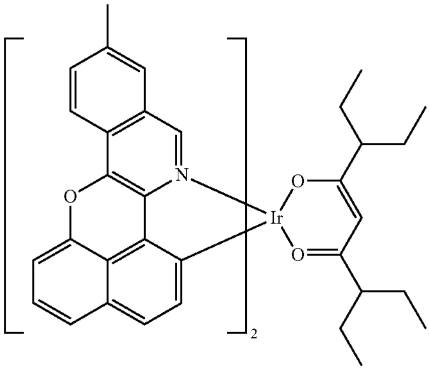
597
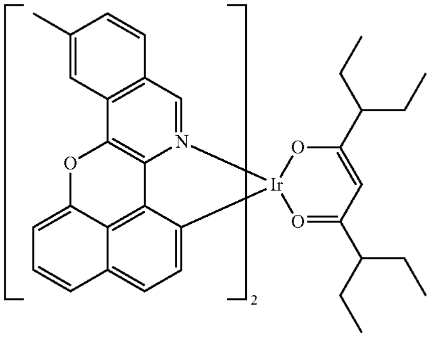
598
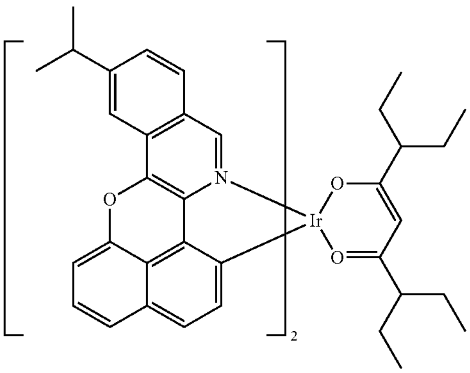

-continued
599
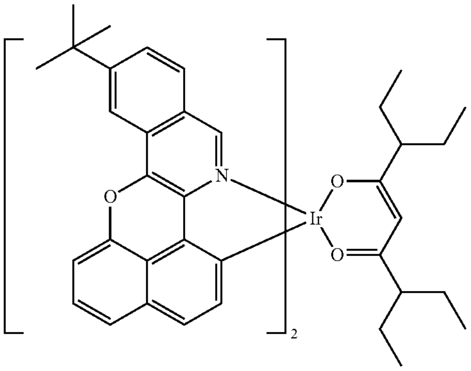
600
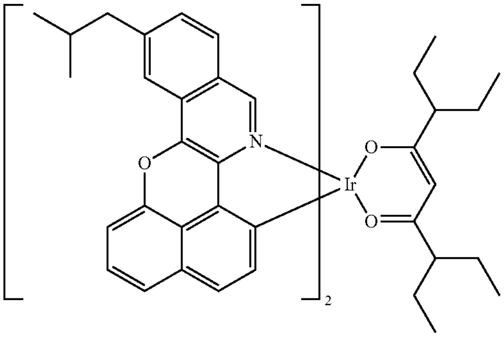
601
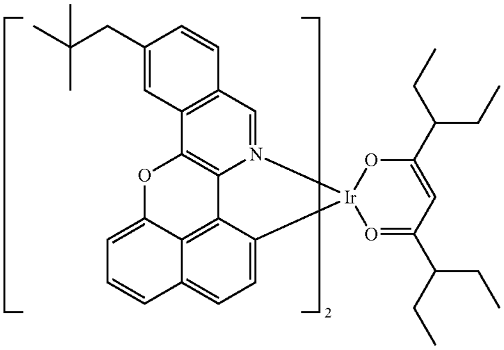
602
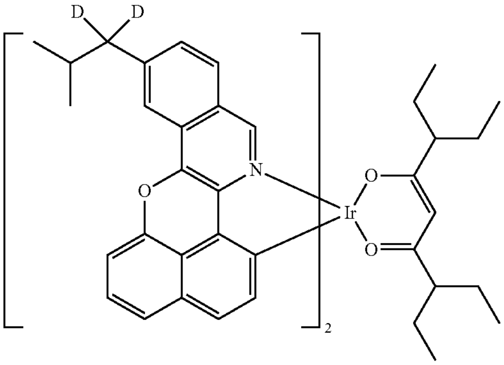
-continued
603
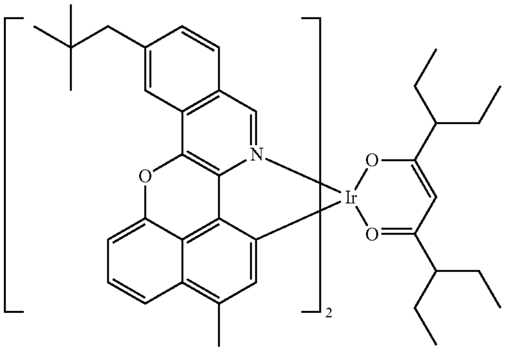
604
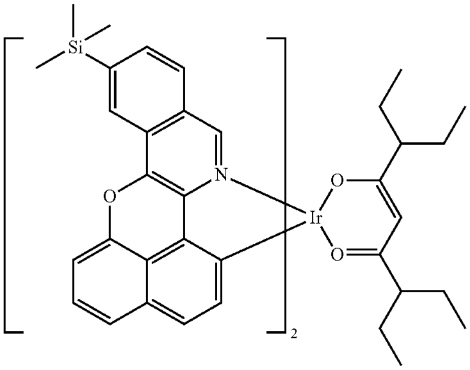
605
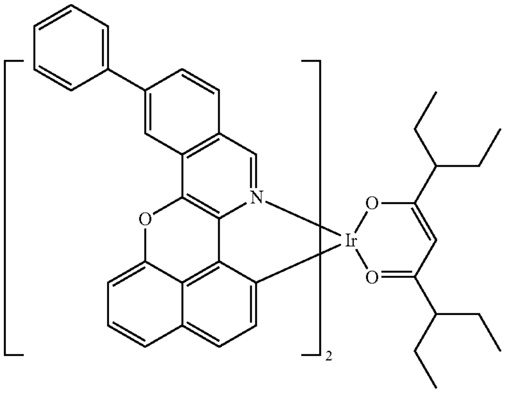
606
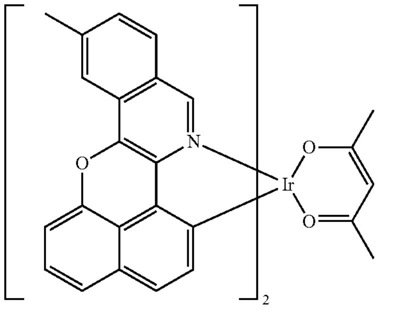

-continued

607

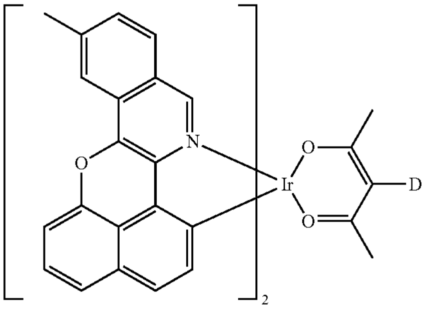

608

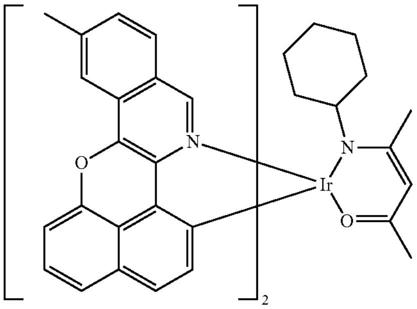

609

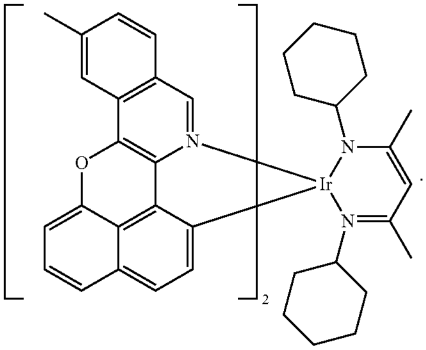

12. An organic light emitting device, comprising:

a substrate; and an organic light emitting diode on the substrate and including:

a first electrode;

a second electrode facing the first electrode; and an emissive layer disposed between the first and second electrodes and including at least one emitting material layer, wherein the at least one emitting material layer includes the organic metal compound having the structure of Formula 1 according to claim 1.

13. The organic light emitting device of claim 12, wherein the organic metal compound has the following structure of Formula 2

[Formula 2]

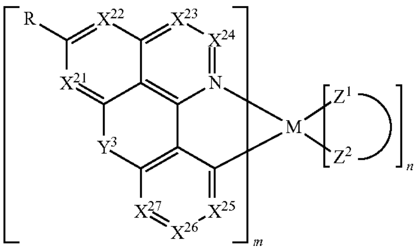

wherein each of M, R,

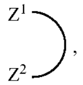

m and n is a same as defined in Formula 1;

each of $X^{21}$ to $X^{27}$ is independently $CR^1$ or N; $Y^3$ is $BR^2$, $CH_2$, $CR^2R^3$, C═O, $SiR^2R^3$, $GeR^2R^3$, $PR^2$, P═O, O, S, $SO_2$, Se, $SeO_2$, Te or $TeO_2$; and each of $R^1$ to $R^3$ is a same as defined in Formula 1.

14. The organic light emitting device of claim 12, wherein the organic metal compound has the following structure of Formula 3:

[Formula 3]

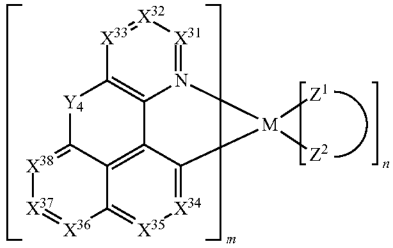

wherein each of M, R,

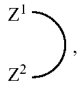

m and n is a same as defined in Formula 1;

each of $X^{31}$ to $X^{38}$ is independently $CR^1$ or N;

$Y^4$ is $BR^2$, C, $CR^2R^3$, C═O, $SiR^2R^3$, $GeR^2R^3$, $PR^2$, P═O, O, S, $SO_2$, Se, $SeO_2$, Te or $TeO_2$; and each of $R^1$ to $R^3$ is a same as defined in Formula 1.

15. The organic light emitting device of claim 13, wherein the organic metal compound has the following structure of Formula 4 or Formula 5:

[Formula 4]

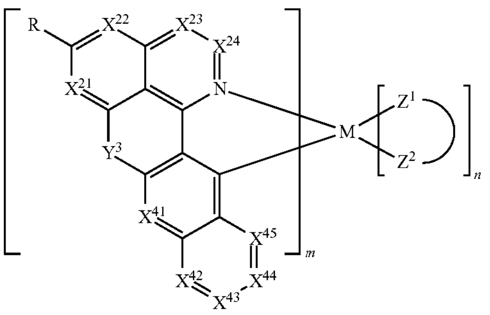

[Formula 5]

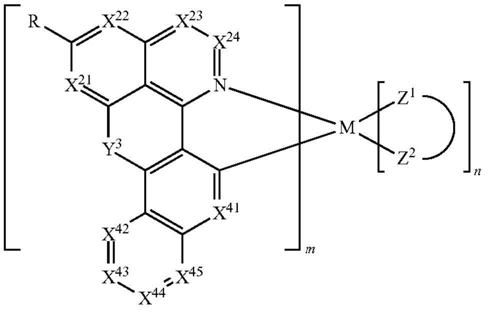

wherein each of M, R,

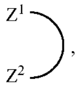

m, n, $X^{21}$ to $X^{24}$ and $Y^3$ is a same as defined in Formula 2;

each of $X^{41}$ to $X^{45}$ is independently $CR^1$ or N; and each of $R^1$ to $R^3$ is a same as defined in Formula 1.

16. The organic light emitting device of claim 14, wherein the organic metal compound has the following structure of Formula 6 or Formula 7:

[Formula 6]

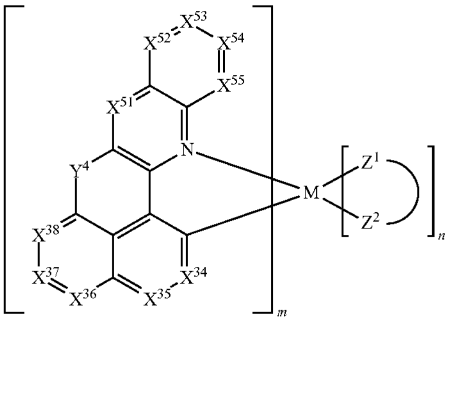

-continued

[Formula 7]

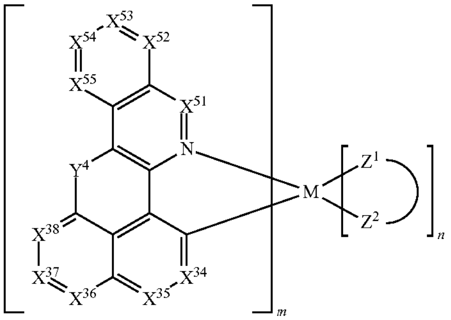

wherein

M, R,

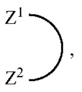

m, n, $X^{34}$ to $X^{38}$ and $Y^4$ is a same as defined in Formula 3;

each of $X^{51}$ to $X^{55}$ is independently $CR^1$ or N; and each of $R^1$ to $R^3$ is a same as defined in Formula 1.

17. The organic light emitting device of claim 12, wherein the organic metal compound has any one of the following structures of Formula 8 to Formula 11:

[Formula 8]

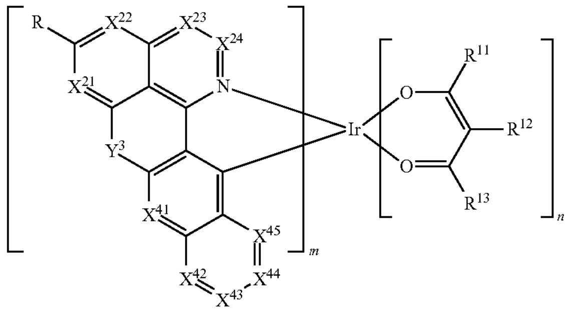

[Formula 9]

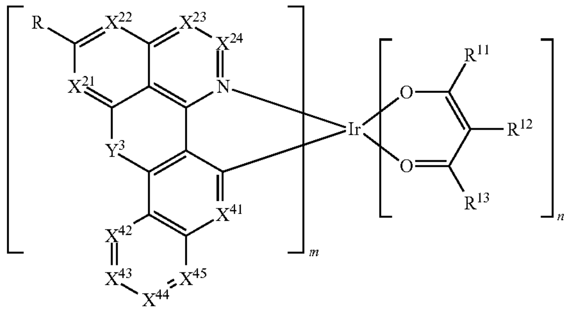

-continued

[Formula 10]

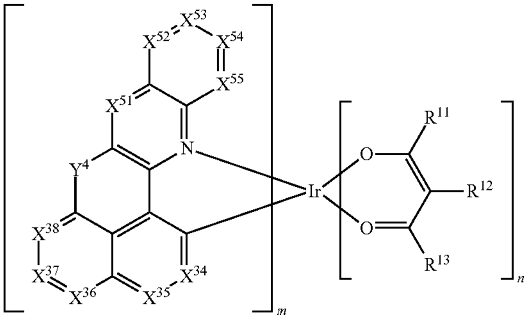

[Formula 11]

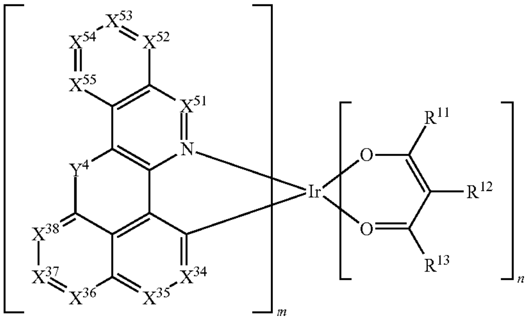

wherein

R is a same as defined in Formula 1;

each of $X^{21}$ to $X^{24}$, $X^{34}$ to $X^{38}$, $X^{41}$ to $X^{45}$ and $X^{51}$ to $X^{55}$ is independently $CR^1$ or N;

each of $Y^3$ and $Y^4$ is independently $BR^2$, $CH_2$, $CR^2R^3$, C═O, $SiR^2R^3$, $GeR^2R^3$, $PR^2$, P═O, O, S, $SO_2$, Se, $SeO_2$, Te or $TeO_2$;

each of $R^1$ to $R^3$ is a same as defined in Formula 1;

each of $R^{11}$ to $R^{13}$ is independently protium, deuterium, tritium, a halogen atom, a hydroxyl group, a cyano group, a nitro group, an amidino group, a hydrazine group, a hydrozone group, an unsubstituted or substituted $C_1$-$C_{20}$ alkyl group, an unsubstituted or substituted $C_2$-$C_{20}$ alkenyl group, an unsubstituted or substituted $C_2$-$C_{20}$ alkynyl group, an unsubstituted or substituted $C_1$-$C_{20}$ alkoxy group, an amino group, an unsubstituted or substituted $C_1$-$C_{20}$ alkyl amino group, an unsubstituted or substituted $C_1$-$C_{20}$ alkyl silyl group, a carboxyl group, a nitrile group, an isonitrile group, a sulfanyl group, a phosphino group, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

m is an integer of 1 to 3; and n is an integer of 0 to 2, m+n is 3.

18. The organic light emitting device of claim 12, wherein the at least one emitting material layer includes a host and a dopant, and the dopant includes the organic metal compound.

19. The organic light emitting device of claim 12, wherein the at least one emitting material layer includes a first emitting material layer and a second emitting material layer;

the emissive layer includes:

a first emitting part disposed between the first and second electrodes, and including the first emitting material layer;

a second emitting part disposed between the first emitting part and the second electrode, and including the second emitting material layer; and a first charge generation layer disposed between the first and second emitting parts, wherein at least one of the first emitting material layer or the second emitting material layer includes the organic metal compound.

20. The organic light emitting device of claim 19, wherein the second emitting material layer includes:

a lower emitting material layer disposed between the first charge generation layer and the second electrode; and an upper emitting material layer disposed between the lower emitting material layer and the second electrode, wherein one of the lower emitting material layer or the upper emitting material layer includes the organic metal compound, and wherein the emissive layer further includes:

a third emitting part disposed between the second emitting part and the second electrode, and including a third emitting material layer; and a second charge generation layer disposed between the second and third emitting parts.

* * * * *